US011625523B2

(12) United States Patent
Lin et al.

(10) Patent No.: US 11,625,523 B2
(45) Date of Patent: Apr. 11, 2023

(54) LOGIC DRIVE BASED ON STANDARD COMMODITY FPGA IC CHIPS

(71) Applicant: iCometrue Company Ltd., Zhubei (TW)

(72) Inventors: Mou-Shiung Lin, Hsinchu (TW); Jin-Yuan Lee, Hsinchu (TW)

(73) Assignee: iCometrue Company Ltd., Hsin-Chu County (TW)

( * ) Notice: Subject to any disclaimer, the term of this patent is extended or adjusted under 35 U.S.C. 154(b) by 104 days.

(21) Appl. No.: 17/187,766

(22) Filed: Feb. 27, 2021

(65) Prior Publication Data

US 2021/0232744 A1 Jul. 29, 2021

Related U.S. Application Data

(63) Continuation-in-part of application No. 16/601,834, filed on Oct. 15, 2019, now Pat. No. 11,093,677, (Continued)

(51) Int. Cl.

| | |
|---|---|
| ***G06F 30/34*** | (2020.01) |
| ***G06F 3/06*** | (2006.01) |

(Continued)

(52) U.S. Cl.

CPC ......... *G06F 30/34* (2020.01); *G05B 19/0423* (2013.01); *G06F 3/0605* (2013.01); *G06F 3/0659* (2013.01); *G11C 7/106* (2013.01); *G11C 7/1012* (2013.01); *G11C 7/1045* (2013.01); *G11C 11/412* (2013.01); *H01L 25/16* (2013.01);

(Continued)

(58) Field of Classification Search

USPC ........................................................ 716/116

See application file for complete search history.

(56) References Cited

U.S. PATENT DOCUMENTS

| | | | |
|---|---|---|---|
| 4,870,302 | A | 9/1989 | Freeman |
| 5,272,368 | A | 12/1993 | Turner et al. |

(Continued)

FOREIGN PATENT DOCUMENTS

| | | |
|---|---|---|
| CN | 103681367 | 3/2014 |
| CN | 104282650 | 1/2015 |

(Continued)

*Primary Examiner* — Bryce M Aisaka

(57) ABSTRACT

A chip package used as a logic drive, includes: multiple semiconductor chips, a polymer layer horizontally between the semiconductor chips; multiple metal layers over the semiconductor chips and polymer layer, wherein the metal layers are connected to the semiconductor chips and extend across edges of the semiconductor chips, wherein one of the metal layers has a thickness between 0.5 and 5 micrometers and a trace width between 0.5 and 5 micrometers; multiple dielectric layers each between neighboring two of the metal layers and over the semiconductor chips and polymer layer, wherein the dielectric layers extend across the edges of the semiconductor chips, wherein one of the dielectric layers has a thickness between 0.5 and 5 micrometers; and multiple metal bumps on a top one of the metal layers, wherein one of the semiconductor chips is a FPGA IC chip, and another one of the semiconductor chips is a NVMIC chip.

28 Claims, 169 Drawing Sheets

Related U.S. Application Data which is a continuation of application No. 15/841,326, filed on Dec. 14, 2017, now Pat. No. 10,489,544.

(60) Provisional application No. 62/983,634, filed on Feb. 29, 2020, provisional application No. 62/545,556, filed on Aug. 15, 2017, provisional application No. 62/533,788, filed on Jul. 18, 2017, provisional application No. 62/448,924, filed on Jan. 20, 2017, provisional application No. 62/433,806, filed on Dec. 14, 2016.

(51) Int. Cl.

| | |
|---|---|
| ***H01L 27/112*** | (2006.01) |
| ***G11C 7/10*** | (2006.01) |
| ***H03K 19/1776*** | (2020.01) |
| ***G05B 19/042*** | (2006.01) |
| ***G11C 11/412*** | (2006.01) |
| ***H03K 19/177*** | (2020.01) |
| ***H01L 25/18*** | (2023.01) |
| ***H01L 25/16*** | (2023.01) |
| ***H01L 27/11524*** | (2017.01) |

(52) U.S. Cl.

CPC ........ *H01L 25/18* (2013.01); *H01L 27/11293* (2013.01); *H01L 27/11524* (2013.01); *H03K 19/177* (2013.01); *H03K 19/1776* (2013.01); *G05B 2219/15057* (2013.01); *H01L 2224/04105* (2013.01); *H01L 2224/12105* (2013.01); *H01L 2224/18* (2013.01); *H01L 2224/24137* (2013.01); *H01L 2224/32225* (2013.01); *H01L 2224/73204* (2013.01); *H01L 2224/73267* (2013.01); *H01L 2924/18162* (2013.01)

(56) References Cited

U.S. PATENT DOCUMENTS

| | | | |
|---|---|---|---|
| 5,587,603 | A | 12/1996 | Kowshik |
| 5,592,102 | A | 1/1997 | Lane |
| 5,689,195 | A | 11/1997 | Cliff et al. |
| 5,796,662 | A | 8/1998 | Kalter et al. |
| 6,020,633 | A | 2/2000 | Erikson |
| 6,167,558 | A | 12/2000 | Trimberger |
| 6,356,478 | B1 | 3/2002 | McCollum |
| 6,388,466 | B1 | 5/2002 | Wittig et al. |
| 6,404,226 | B1 | 6/2002 | Schadt |
| 6,687,167 | B2 | 2/2004 | Guaitini et al. |
| 6,798,240 | B1 | 9/2004 | Pedersen |
| 6,812,086 | B2 | 11/2004 | Murthy et al. |
| 6,828,823 | B1 | 12/2004 | Tsui |
| 6,943,580 | B2 | 9/2005 | Lewis et al. |
| 6,998,872 | B1 | 2/2006 | Chirania et al. |
| 7,030,652 | B1 | 4/2006 | Lewis et al. |
| 7,061,271 | B1 | 6/2006 | Young et al. |
| 7,190,190 | B1 | 3/2007 | Camarota et al. |
| 7,193,433 | B1 | 3/2007 | Young |
| 7,219,237 | B1 | 5/2007 | Trimberger |
| 7,366,306 | B1 | 4/2008 | Trimberger |
| 7,385,417 | B1 | 6/2008 | Agrawal et al. |
| 7,420,390 | B1 | 9/2008 | Hutton et al. |
| 7,550,994 | B1 | 6/2009 | Camarota |
| 7,598,555 | B1 | 10/2009 | Papworth Parkin |
| 7,653,891 | B1 | 1/2010 | Anderson et al. |
| 7,747,025 | B1 | 6/2010 | Trimberger |
| 7,853,799 | B1 | 12/2010 | Trimberger |
| 7,933,140 | B2 | 4/2011 | Wang et al. |
| 7,944,231 | B2 | 5/2011 | Javerliac |
| 7,948,266 | B2 | 5/2011 | Schmit et al. |
| 7,973,556 | B1 | 7/2011 | Noguera Serra et al. |
| 8,064,224 | B2 | 11/2011 | Mahajan et al. |
| 8,081,079 | B1 | 12/2011 | Camarota |
| 8,159,268 | B1 | 4/2012 | Madurawe |
| 8,243,527 | B2 | 8/2012 | Hung et al. |
| 8,354,297 | B2 | 1/2013 | Pagaila et al. |
| 8,378,407 | B2 | 2/2013 | Audzeyeu et al. |
| 8,531,032 | B2 | 9/2013 | Yu et al. |
| 8,546,955 | B1 | 10/2013 | Wu |
| 8,592,886 | B2 | 11/2013 | Hsu et al. |
| 8,709,865 | B2 | 4/2014 | Hu et al. |
| 8,742,579 | B2 | 6/2014 | Pagaila et al. |
| 8,786,060 | B2 | 7/2014 | Yen et al. |
| 8,796,137 | B2 | 8/2014 | Pagaila et al. |
| 8,866,292 | B2 | 10/2014 | Beer et al. |
| 8,872,349 | B2 | 10/2014 | Chiu et al. |
| 8,878,360 | B2 | 11/2014 | Meyer et al. |
| 8,883,561 | B2 | 11/2014 | Park et al. |
| 8,885,334 | B1 | 11/2014 | Baxter |
| 8,895,440 | B2 | 11/2014 | Choi et al. |
| 8,912,822 | B2 | 12/2014 | Yasuda |
| 8,916,421 | B2 | 12/2014 | Gong et al. |
| 8,941,230 | B2 | 1/2015 | Kyozuka et al. |
| 8,952,489 | B2 | 2/2015 | Elian et al. |
| 8,952,521 | B2 | 2/2015 | Wojnowski et al. |
| 8,987,918 | B2 | 3/2015 | Razdan et al. |
| 8,993,377 | B2 | 3/2015 | Koo et al. |
| 9,003,221 | B1 | 4/2015 | Abugharbieh et al. |
| 9,082,806 | B2 | 7/2015 | Lin et al. |
| 9,106,229 | B1 | 8/2015 | Hutton |
| 9,135,185 | B2 | 9/2015 | Loh et al. |
| 9,147,638 | B2 | 9/2015 | Liu et al. |
| 9,224,647 | B2 | 12/2015 | Koo et al. |
| 9,225,512 | B1 | 12/2015 | Trimberger |
| 9,252,127 | B1 | 2/2016 | Shen et al. |
| 9,263,370 | B2 | 2/2016 | Shenoy et al. |
| 9,281,292 | B2 | 3/2016 | Hu et al. |
| 9,324,672 | B2 | 4/2016 | Pagaila et al. |
| 9,331,060 | B2 | 5/2016 | Otremba et al. |
| 9,343,442 | B2 | 5/2016 | Chen et al. |
| 9,349,703 | B2 | 5/2016 | Chiu et al. |
| 9,349,713 | B2 | 5/2016 | Kim et al. |
| 9,362,187 | B2 | 6/2016 | Ossimitz |
| 9,385,006 | B2 | 7/2016 | Lin |
| 9,385,009 | B2 | 7/2016 | Lin et al. |
| 9,385,105 | B2 | 7/2016 | Meyer et al. |
| 9,396,998 | B2 | 7/2016 | Kurita et al. |
| 9,397,050 | B2 | 7/2016 | Shin et al. |
| 9,406,619 | B2 | 8/2016 | Pagaila et al. |
| 9,406,658 | B2 | 8/2016 | Lee et al. |
| 9,437,260 | B2 | 9/2016 | Prenat et al. |
| 9,449,930 | B2 | 9/2016 | Kim et al. |
| 9,455,218 | B2 | 9/2016 | Ooi et al. |
| 9,508,626 | B2 | 11/2016 | Pagaila et al. |
| 9,524,955 | B2 | 12/2016 | Huang et al. |
| 9,543,276 | B2 | 1/2017 | Jee et al. |
| 9,583,431 | B1 | 2/2017 | Rahman |
| 9,593,009 | B2 | 3/2017 | Fuergut et al. |
| 9,607,967 | B1 | 3/2017 | Shih |
| 9,627,365 | B1 | 4/2017 | Yu et al. |
| 9,640,259 | B2 | 5/2017 | Li et al. |
| 9,679,863 | B2 | 6/2017 | Lin et al. |
| 9,704,843 | B2 | 7/2017 | Kilger et al. |
| 9,722,584 | B1 | 8/2017 | Chang et al. |
| 9,735,113 | B2 | 8/2017 | Chi et al. |
| 9,763,329 | B1 | 9/2017 | Mason |
| 9,773,757 | B2 | 9/2017 | Yu et al. |
| 9,806,058 | B2 | 10/2017 | Wei et al. |
| 9,812,337 | B2 | 11/2017 | Chen et al. |
| 9,818,720 | B2 | 11/2017 | Wei et al. |
| 9,831,148 | B2 | 11/2017 | Yu et al. |
| 9,859,896 | B1 | 1/2018 | Gaide et al. |
| 9,881,850 | B2 | 1/2018 | Yu et al. |
| 9,887,206 | B2 | 2/2018 | Su et al. |
| 9,893,732 | B1 | 2/2018 | Lewis |
| 9,899,248 | B2 | 2/2018 | Yu et al. |
| 9,899,355 | B2 | 2/2018 | Yuan et al. |
| 9,935,113 | B2 | 4/2018 | Wu et al. |
| 9,966,325 | B2 | 5/2018 | Beyne |
| 9,997,464 | B2 | 6/2018 | Hsieh et al. |
| 10,015,916 | B1 | 7/2018 | Karp |
| 10,026,681 | B2 | 7/2018 | Ko et al. |

(56) References Cited

U.S. PATENT DOCUMENTS 10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,559 B2 10/2018 Lin et al.
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,290,611 B2 5/2019 Yu et al.
10,325,882 B2 6/2019 Kang et al.
10,333,623 B1 6/2019 Liao et al.
10,340,249 B1 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,476,505 B2 11/2019 Ngai
10,490,521 B2 11/2019 Hu et al.
10,490,540 B2 11/2019 Yu et al.
10,504,835 B1 12/2019 Wang et al.
10,510,634 B2 12/2019 Lin et al.
10,510,650 B2 12/2019 Yu et al.
10,522,449 B2 12/2019 Chen et al.
10,541,227 B2 1/2020 Yeh et al.
10,541,228 B2 1/2020 Chen et al.
10,622,321 B2 4/2020 Yu et al.
10,741,537 B2 8/2020 Lu et al.
10,784,248 B2 9/2020 Yu et al.
10,797,031 B2 10/2020 Liao et al.
10,892,011 B2 1/2021 Lin et al.
11,211,334 B2 12/2021 Lin et al.
2001/0045844 A1 11/2001 New et al.
2002/0092307 A1 7/2002 Ghoshal
2003/0122578 A1 7/2003 Masui et al.
2004/0041584 A1 3/2004 Sunaga et al.
2004/0145850 A1 7/2004 Fukumoto et al.
2004/0222817 A1 11/2004 Madurawe
2005/0185457 A1 8/2005 Kim et al.
2005/0218929 A1 10/2005 Wang et al.
2006/0138509 A1 6/2006 Lee et al.
2007/0164279 A1 7/2007 Lin et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0157669 A1 6/2010 Audzeyeu
2010/0283085 A1 11/2010 Bemanian
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2013/0082399 A1 4/2013 Kim et al.
2013/0257477 A1 10/2013 Yasuda et al.
2013/0285253 A1 10/2013 Aoki et al.
2014/0017882 A1 1/2014 Lei
2014/0070380 A1 3/2014 Chiu et al.
2014/0070403 A1 3/2014 Pan et al.
2014/0112066 A1 4/2014 Chow et al.
2014/0131858 A1 5/2014 Pan et al.
2014/0183731 A1 7/2014 Lin et al.
2014/0185264 A1 7/2014 Chen et al.
2014/0203412 A1* 7/2014 Wang .................... H01L 23/481
257/621
2014/0210097 A1 7/2014 Chen
2014/0254232 A1 9/2014 Wu
2014/0302659 A1 10/2014 Phatak
2015/0008957 A1 1/2015 Olgiati et al.
2015/0014844 A1 1/2015 Wu et al.
2015/0085560 A1 3/2015 Candelier et al.
2015/0116965 A1 4/2015 Kim et al.
2015/0227662 A1 8/2015 Lepercq
2015/0327367 A1 11/2015 Shen
2016/0118390 A1 4/2016 Liaw
2016/0133571 A1 5/2016 Lee et al.
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0071552 A1 3/2017 Harpe et al.
2017/0301650 A1 10/2017 Yu
2018/0053730 A1 2/2018 Shao
2018/0061742 A1 3/2018 Ananiev
2018/0076179 A1 3/2018 Hsu et al.
2018/0102776 A1 4/2018 Chandrasekar et al.
2018/0150667 A1 5/2018 Yu et al.
2018/0151477 A1 5/2018 Yu et al.
2018/0151501 A1 5/2018 Yu et al.
2018/0158746 A1 6/2018 Lin
2018/0165396 A1 6/2018 Lin et al.
2018/0174865 A1 6/2018 Yu et al.
2018/0204810 A1 7/2018 Yu et al.
2018/0204828 A1 7/2018 Yu et al.
2018/0210799 A1 7/2018 Gao et al.
2018/0226349 A1 8/2018 Yu et al.
2018/0247905 A1 8/2018 Yu et al.
2018/0269188 A1 9/2018 Yu et al.
2018/0275193 A1 9/2018 Rouge et al.
2018/0284186 A1 10/2018 Chadha
2018/0286776 A1 10/2018 Yu et al.
2018/0301351 A1 10/2018 Yu et al.
2018/0301376 A1 10/2018 Shih et al.
2018/0350629 A1 12/2018 Liu et al.
2018/0350763 A1 12/2018 Yu et al.
2018/0358312 A1 12/2018 Yu et al.
2018/0374824 A1 12/2018 Yu et al.
2019/0013276 A1 1/2019 Lee et al.
2019/0019756 A1 1/2019 Yu et al.
2019/0020343 A1 1/2019 Lin et al.
2019/0051641 A1 2/2019 Lin et al.
2019/0057932 A1 2/2019 Wu et al.
2019/0097304 A1 3/2019 Hsiao et al.
2019/0129817 A1 5/2019 Zhuo et al.
2019/0221547 A1 7/2019 Drab et al.
2019/0238134 A1 8/2019 Lin et al.
2019/0238135 A1 8/2019 Lin et al.
2019/0245543 A1 8/2019 Lin et al.
2019/0253056 A1 8/2019 Lin et al.
2019/0304803 A1 10/2019 Hu et al.
2019/0333871 A1 10/2019 Chen et al.
2019/0347790 A1 11/2019 Lin et al.
2019/0363715 A1 11/2019 Lin et al.
2019/0372574 A1 12/2019 Lin et al.
2020/0058617 A1 2/2020 Wu et al.
2020/0082885 A1 3/2020 Lin et al.
2020/0111734 A1 4/2020 Lin et al.
2020/0144224 A1 5/2020 Lin et al.
2020/0161242 A1 5/2020 Lin et al.
2020/0373215 A1 11/2020 Wu et al.
2021/0005592 A1 1/2021 Lin et al.
2021/0043557 A1 2/2021 Lin et al.
2021/0050300 A1 2/2021 Lin et al.
2021/0090983 A1 3/2021 Lin et al.
2021/0159180 A1 5/2021 Zhai et al.

(56) References Cited

U.S. PATENT DOCUMENTS

| | | | |
|---|---|---|---|
| 2021/0217702 | A1 | 7/2021 | Dabral et al. |
| 2021/0232744 | A1 | 7/2021 | Lin et al. |
| 2022/0013504 | A1 | 1/2022 | Dabral et al. |

FOREIGN PATENT DOCUMENTS

| | | |
|---|---|---|
| CN | 105745752 | 7/2016 |
| CN | 104078453 | 4/2017 |
| CN | 104064556 | 4/2019 |
| TW | 200623398 | 7/2006 |
| WO | WO00/36748 | 6/2000 |
| WO | WO2005010976 | 2/2005 |
| WO | WO2016160063 | 10/2016 |

* cited by examiner

| Input | | | | Onput |
|---|---|---|---|---|
| A0 | A1 | A2 | A3 | Dout |
| 0 | 0 | 0 | 0 | 1 D0 |
| 0 | 0 | 0 | 1 | 1 D1 |
| 0 | 0 | 1 | 0 | 1 D2 |
| 0 | 0 | 1 | 1 | 1 D3 |
| 0 | 1 | 0 | 0 | 1 D4 |
| 0 | 1 | 0 | 1 | 1 D5 |
| 0 | 1 | 1 | 0 | 1 D6 |
| 0 | 1 | 1 | 1 | 1 D7 |
| 1 | 0 | 0 | 0 | 1 D8 |
| 1 | 0 | 0 | 1 | 1 D9 |
| 1 | 0 | 1 | 0 | 1 D10 |
| 1 | 0 | 1 | 1 | 1 D11 |
| 1 | 1 | 0 | 0 | 0 D12 |
| 1 | 1 | 0 | 1 | 0 D13 |
| 1 | 1 | 1 | 0 | 0 D14 |
| 1 | 1 | 1 | 1 | 1 D15 |

| Input | | | | Output | | | | |
|---|---|---|---|---|---|---|---|---|
| A1 | A0 x | A3 | A2 | Dout C3 | C2 | C1 | C0 | |
| 0 | 0 | 0 | 0 | 0 | 0 | 0 | 0 | D0 |
| 0 | 0 | 0 | 1 | 0 | 0 | 0 | 0 | D1 |
| 0 | 0 | 1 | 0 | 0 | 0 | 0 | 0 | D2 |
| 0 | 0 | 1 | 1 | 0 | 0 | 0 | 0 | D3 |
| 0 | 1 | 0 | 0 | 0 | 0 | 0 | 0 | D4 |
| 0 | 1 | 0 | 1 | 0 | 0 | 0 | 1 | D5 |
| 0 | 1 | 1 | 0 | 0 | 0 | 1 | 0 | D6 |
| 0 | 1 | 1 | 1 | 0 | 0 | 1 | 1 | D7 |
| 1 | 0 | 0 | 0 | 0 | 0 | 0 | 0 | D8 |
| 1 | 0 | 0 | 1 | 0 | 0 | 1 | 0 | D9 |
| 1 | 0 | 1 | 0 | 0 | 1 | 0 | 0 | D10 |
| 1 | 0 | 1 | 1 | 0 | 1 | 1 | 0 | D11 |
| 1 | 1 | 0 | 0 | 0 | 0 | 0 | 0 | D12 |
| 1 | 1 | 0 | 1 | 0 | 0 | 1 | 1 | D13 |
| 1 | 1 | 1 | 0 | 0 | 1 | 1 | 0 | D14 |
| 1 | 1 | 1 | 1 | 1 | 0 | 0 | 1 | D15 |

LOGIC DRIVE BASED ON STANDARD COMMODITY FPGA IC CHIPS

PRIORITY CLAIM

This application claims priority benefits from U.S. provisional application No. 62/983,634, filed on Feb. 29, 2020 and entitled "A Non-volatile Programmable Logic Device Based On Multi-chip Package" and is a continuation-in-part of application Ser. No. 16/601,834, filed Oct. 15, 2019, which is a continuation of application Ser. No. 15/841,326, filed Dec. 14, 2017, now U.S. Pat. No. 10,489,544, which claims priority benefits from U.S. provisional application No. 62/433,806, filed on Dec. 14, 2016 and entitled "Logic Drive"; U.S. provisional application No. 62/448,924, filed on Jan. 20, 2017 and entitled "Logic and Memory Drives and Process for Forming the Same"; U.S. provisional application No. 62/533,788, filed on Jul. 18, 2017 and entitled "Logic Drive Based on Standard Commodity FPGA IC Chips"; and U.S. provisional application No. 62/545,556, filed on Aug. 15, 2017 and entitled "Logic Drive Based on Standard Commodity FPGA IC Chips". The present application incorporates the foregoing disclosures herein by reference.

BACKGROUND OF THE DISCLOSURE

Field of the Disclosure

The present invention relates to a logic package, logic package drive, logic device, logic module, logic drive, logic disk, logic disk drive, logic solid-state disk, logic solid-state drive, Field Programmable Gate Array (FPGA) logic disk, or FPGA logic drive (to be abbreviated as "logic drive" below, that is when "logic drive" is mentioned below, it means and reads as "logic package, logic package drive, logic device, logic module, logic drive, logic disk, logic disk drive, logic solid-state disk, logic solid-state drive, FPGA logic disk, or FPGA logic drive") comprising plural FPGA IC chips, and one or plural non-volatile IC chips for field programming purposes, and more particularly to a standardized commodity logic drive formed by using plural standardized commodity FPGA IC chips and one or plural non-volatile IC chip or chips, and to be used for different specific applications when field programmed.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extend to a certain time period, the semiconductor IC suppliers may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, (3) gives lower performance. When the semiconductor technology nodes or generations migrates, following the Moore's Law, to advanced nodes or generations (for example below 30 nm or 20 nm), the Non-Recurring Engineering (NRE) cost for designing an ASIC or COT chip increases greatly (more than US $5 M or even exceeding US $10 M, US $20

M, US $50 M or US $100 M). The cost of a photo mask set for an ASIC or COT chip at the 16 nm technology node or generation may be over US $2 M, US $5 M, or US $10 M. The high NRE cost in implementing the innovation or application using the advanced IC technology nodes or generations slows down or even stops the innovation or application using advanced and useful semiconductor technology nodes or generations. A new approach or technology is needed to inspire the continuing innovation and to lower down the barrier for implementing the innovation in the semiconductor IC chips.

SUMMARY OF THE DISCLOSURE

One aspect of the disclosure provides a standardized commodity logic drive in a multi-chip package comprising plural FPGA IC chips and one or more non-volatile memory IC chips for use in different applications requiring logic, computing and/or processing functions by field programming. Uses of the standardized commodity logic drive is analogues to uses of a standardized commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

Another aspect of the disclosure provides a method to reduce Non-Recurring Engineering (NRE) expenses for implementing an innovation or an application in semiconductor IC chips by using the standardized commodity logic drive. A person, user, or developer with an innovation or an application concept or idea needs to purchase the standardized commodity logic drive and develops or writes software codes or programs to load into the standardized commodity logic drive to implement his/her innovation or application concept or idea. Compared to the implementation by developing a logic ASIC or COT IC chip, the NRE cost may be reduced by a factor of larger than 2, 5, or 10. For advanced semiconductor technology nodes or generations (for example more advanced than or below 30 nm or 20 nm), the NRE cost for designing an ASIC or COT chip increases greatly, more than US $5 M or even exceeding US $10 M, US $20 M, US $50 M, or US $100 M. The cost of a photo mask set for an ASIC or COT chip at the 16 nm technology node or generation may be over US $2 M, US $5 M, or US $10 M. Implementing the same or similar innovation or application using the logic drive may reduce the NRE cost down to smaller than US $10 M or even less than US $5 M, US $3 M, US $2 M or US $1 M. The aspect of the disclosure inspires the innovation and lowers the barrier for implementing the innovation in IC chips designed and fabricated using an advanced IC technology node or generation, for example, a technology node or generation more advanced than or below 30 nm, 20 nm or 10 nm, FIG. 36.

Another aspect of the disclosure provides a "public innovation platform" again for innovators to easily and cheaply implement or realize their innovation in semiconductor IC chips using advanced IC technology nodes more advanced than 20 nm, for example, using a technology node of 16 nm, 10 nm, 7 nm, 5 nm or 3 nm, by using logic drives; wherein said innovation comprises (i) innovative algorithms or architectures of computing, processing, learning and/or inferencing, and/or (ii) innovative and/or specific applications. In years of 1990's, innovators could implement their innovation by designing IC chips and fabricating the IC chips in a semiconductor manufacturing foundry fab using technology nodes at 1 μm, 0.8 μm, 0.5 μm, 0.35 μm, 0.18 μm or 0.13 μm, at a cost of about several hundred thousand US dollars. The semiconductor manufacturing foundry companies are productless companies and own semiconductor manufacturing fabs. They provide manufacturing services to their customers. The customers are fabless companies, which include (i) IC chip design companies designing and owning the IC chips, (ii) system companies designing and owning the systems, (iii) IC chip designing individuals designing and owning IC chips. The IC manufacturing foundry fab then was the “public innovation platform”. However, when IC technology nodes have migrated to a technology node more advanced than 20 nm, for example to the technology node of 16 nm, 10 nm, 7 nm, 5 nm or 3 nm IC technology nodes, only a few giant system or IC design companies, not the public innovators, can afford to use the semiconductor IC manufacturing foundry fab. It costs about or over 10 million US dollars to develop and implement an IC chip using these advanced technology nodes. The semiconductor IC manufacturing foundry fab is now not the “public innovation platform” anymore, they are becoming a “club innovation platform” for club innovators. The disclosed logic drives, comprising standard commodity FPGA IC chips, provides public innovators the “public innovation platform” to semiconductor IC industry again just as in 1990’s. The innovators can implement or realize their innovation (algorithms, architectures and/or applications) by using the standard commodity of logic drives and writing software programs using common programing languages, for example, C, Java, C++, C#, Scala, Swift, Matlab, Assembly Language, Pascal, Python, Visual Basic, PL/SQL or JavaScript languages, at cost of less than 500 K or 300 K US dollars. The innovators can use their own standard commodity logic drives or they can rent standard commodity logic drives in data centers or clouds through networks, FIG. 36.

Another aspect of the disclosure provides an innovation platform for an innovator, comprising: (a) multiple logic drives in a data center or a cloud, wherein multiple logic drives comprise plural standard commodity FPGA IC chips, in the FPGA/HBM CSPs, fabricated using a semiconductor IC process technology node more advanced than 20 nm technology node; (b) an innovator’s device and multiple users’ devices communicating with the multiple logic drives in the data center or the cloud through an internet or a network, wherein the innovator develops and writes software programs to implement his/her innovation (algorithms, architectures and/or applications) in a common programing language to program, through the internet or the network, the multiple logic drives in the data center or the cloud, wherein the common programing language comprises Java, C++, C#, Scala, Swift, Matlab, Assembly Language, Pascal, Python, Visual Basic, PL/SQL or JavaScript language; (c) after programming the logic drives, the innovator or the multiple users may use the programed logic drives for his/her or their innovations (algorithms, architectures and/or applications) through the internet or the network; wherein said innovations comprise (i) innovative algorithms or architectures of computing, processing, learning and/or inferencing, and/or (ii) innovative and/or specific applications.

Another aspect of the disclosure provides a method to change the current logic ASIC or COT IC chip business into a commodity logic IC chip business, like the current commodity DRAM, or commodity flash memory IC chip business, by using the standardized commodity logic drive. Since the performance, power consumption, and engineering and manufacturing costs of the standardized commodity logic drive may be better or equal to that of the ASIC or COT IC chip for a same innovation or application, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufactures (may be product-less), vertically-integrated IC design, manufacturing and product companies) may become companies in the following business models: (1) designing, manufacturing, and/or selling the standard commodity FPGA IC chips; and/or (2) designing, manufacture, and/or selling the standard commodity logic drives. A person, user, customer, or software developer, or application developer may purchase the standardized commodity logic drive and write software codes to program it for his/her desired applications, for example, in applications of Artificial Intelligence (AI), machine learning, deep learning, big data, Internet Of Things (JOT), Virtual Reality (VR), Augmented Reality (AR), car electronics, Graphic Processing (GP), Digital Signal Processing (DSP), Micro Controlling (MC), and/or Central Processing (CP). The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (JOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current logic ASIC or COT IC chip hardware business into a software business by using the standardized commodity logic drive. Since the performance, power consumption, and engineering and manufacturing costs of the standardized commodity logic drive may be better or equal to that of the ASIC or COT IC chip for a same innovation or application, the standardized commodity logic drive may be used as an alternative for designing an ASIC or COT IC chip. The current ASIC or COT IC chip design companies or suppliers may become software developers or suppliers; they may adapt the following business models: (1) becoming software companies to develop and sell software for their innovation or application, and let their customers or users to install the software in the customers’ or users’ own standard commodity logic drive; and/or (2) still keeping as hardware companies by selling hardware without performing ASIC or COT IC chip design and/or production. They may install their in-house developed software for the innovation or application in the one or plural non-volatile memory IC chip or chips in the purchased standard commodity logic drive; and sell the program-installed logic drive to their customers or users. They may write software codes into the standard commodity logic drive (that is, loading the software codes in the non-volatile memory IC chip or chips in or of the standardized commodity logic drive) for their desired applications, for example, in applications of Artificial Intelligence (AI), machine learning, deep learning, big data, Internet Of Things (JOT), car electronics, Virtual Reality (VR), Augmented Reality (AR), Graphic Processing, Digital Signal Processing, micro controlling, and/or Central Processing. The logic drive may be programed to perform functions like a graphic chip, or a baseband chip, or an Ethernet chip, or a wireless (for example, 802.11ac) chip, or an AI chip. The logic drive may be alternatively programmed to perform functions of all or any combinations of functions of Artificial Intelligence (AI), machine learning, deep learning, big data, Internet Of Things (JOT), car electronics, Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current system design, manufactures and/or product business into a commodity system/product business, like current commodity DRAM, or flash memory business, by using the standardized commodity logic drive. The system, computer, processor, smart-phone, or electronic equipment or device may become a standard commodity hardware comprises mainly a memory drive and a logic drive. The memory drive may be a hard disk drive, a flash drive, and/or a solid-state drive. The logic drive in the aspect of the disclosure may have big enough or adequate number of inputs/outputs (I/Os) to support I/O ports for use in programming all or most applications. The logic drive may have I/Os to support required I/O ports for programming, for example, to perform all or any combinations of functions of Artificial Intelligence (AI), machine learning, deep learning, big data, Internet Of Things (JOT), Virtual Reality (VR), Augmented Reality (AR), car electronics, Graphic Processing (GP), Digital Signal Processing (DSP), Micro Controlling (MC), and/or Central Processing (CP), and etc. The logic drive may comprise (1) programing or configuration I/Os for software or application developers to load application software or program codes to program or configure the logic drive, through I/O ports or connectors connecting or coupling to the I/Os of the logic drive; and (2) execution or user I/Os for the users to execute and perform their instructions, through I/O ports or connectors connecting or coupling to the I/Os of the logic drive; for example, generating a Microsoft Word file, or a PowerPoint presentation file, or an Excel file. The I/O ports or connectors connecting or coupling to the corresponding I/Os of the logic drive may comprise one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The I/O ports or connectors connecting or coupling to the corresponding I/Os of the logic drive may also comprise Serial Advanced Technology Attachment (SATA) ports, or Peripheral Components Interconnect express (PCIe) ports for communicating, connecting or coupling with or to the memory drive. The I/O ports or connectors may be placed, located, assembled, or connected on or to a substrate, film or board; for example, a Printed Circuit Board (PCB), a silicon substrate with interconnection schemes, a metal substrate with interconnection schemes, a glass substrate with interconnection schemes, a ceramic substrate with interconnection schemes, a flexible film with interconnection schemes. The logic drive is assembled on the substrate, film or board using solder bumps, copper pillars or bumps, or gold bumps, on or of the logic drive, similar to the flip-chip assembly of the chip packaging technology, or the Chip-On-Film (COF) assembly technology used in the LCD driver packaging technology. The system, computer, processor, smart-phone, or electronic equipment or device design, manufacturing, and/or product companies may become companies to (1) design, manufacturing and/or sell the standard commodity hardware comprising a memory drive and a logic drive; in this case, the companies are still hardware companies; (2) develop system and application software for users to install in the users' own standard commodity hardware; in this case, the companies become software companies; (3) install the third party's developed system and application software or programs in the standard commodity hardware and sell the software-loaded hardware; and in this case, the companies are still hardware companies.

Another aspect of the disclosure provides a standard commodity FPGA IC chip for use in the standard commodity logic drive. The standard commodity FPGA IC chip is designed, implemented and fabricated using an advanced semiconductor technology node or generation, for example more advanced than or equal to, or below or equal to 30 nm, 20 nm or 10 nm; with a chip size and manufacturing yield optimized with the minimum manufacturing cost for the used semiconductor technology node or generation. The standard commodity FPGA IC chip may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors used in the advanced semiconductor technology node or generation may be a FIN Field-Effect-Transistor (FINFET), a Gate-All-Around Field-Effect-Transistor (GAAFET), a FINFET on Silicon-On-Insulator (FINFET SOI), a GAAFET on Silicon-On-Insulator (GAAFET SOI), a Fully Depleted Silicon-On-Insulator (FDSOI) MOSFET, a Partially Depleted Silicon-On-Insulator (PDSOI) MOSFET or a conventional MOSFET. The standard commodity FPGA IC chip may only communicate directly with other chips in or of the logic drive only; its I/O circuits may require only small I/O drivers or receivers, and small or none Electrostatic Discharge (ESD) devices. The driving capability, loading, output capacitance, or input capacitance of I/O drivers or receivers, or I/O circuits may be between 0.1 pF and 10 pF, 0.1 pF and 5 pF, 0.1 pF and 3 pF or 0.1 pF and 2 pF; or smaller than 10 pF, 5 pF, 3 pF, 2 pF or 1 pF. The size of the ESD device may be between 0.05 pF and 10 pF, 0.05 pF and 5 pF, 0.05 pF and 2 pF or 0.05 pF and 1 pF; or smaller than 5 pF, 3 pF, 2 pF, 1 pF or 0.5 pF. For example, a bi-directional (or tri-state) I/O pad or circuit may comprise an ESD circuit, a receiver, and a driver, and has an input capacitance or output capacitance between 0.1 pF and 10 pF, 0.1 pF and 5 pF or 0.1 pF and 2 pF; or smaller than 10 pF, 5 pF, 3 pF, 2 pF or 1 pF. All or most control and/or Input/Output (I/O) circuits or units (for example, the off-logic-drive I/O circuits, i.e., large I/O circuits, communicating with circuits or components external or outside of the logic drive) are outside of, or not included in, the standard commodity FPGA IC chip, but are included in another dedicated control chip, dedicated I/O chip, or dedicated control and I/O chip, packaged in the same logic drive. None or minimal area of the standard commodity FPGA IC chip is used for the control or I/O circuits, for example, less than 15%, 10%, 5%, 2%, 1%, 0.5% or 0.1% area is used for the control or IO circuits; or, none or minimal transistors of the standard commodity FPGA IC chip are used for the control or I/O circuits, for example, less than 15%, 10%, 5%, 2%, 1%, 0.5% or 0.1% of the total number of transistors are used for the control or I/O circuits; or all or most area of the standard commodity FPGA IC chip is used for (i) logic blocks, cells or elements comprising logic gate arrays, computing units or operators, and/or Look-Up-Tables (LUTs) and multiplexers, and/or (ii) programmable interconnection. For example, greater than 85%, 90%, 95%, 98%, 99%, 99.5% or 99.9% area is used for logic blocks, cells or elements, and/or programmable interconnection; or, all or most transistors of the standard commodity FPGA IC chip are used for logic blocks, cells or elements, and/or programmable interconnection, for example, greater than 85%, 90%, 95%, 98%, 99%, 99.5% or 99.9% of the total number of transistors are used for logic blocks, cells or elements, and/or programmable interconnection.

The logic blocks, cells or elements comprise (i) logic gate arrays comprising Boolean logic operators, for example, NAND, NOR, AND, and/or OR circuits; (ii) computing units comprising, for examples, adder, multiplication, multiplexer, shift register, floating-point circuits, and/or division circuits; (iii) Look-Up-Tables (LUTs) and multiplexers. Alternatively, the Boolean operators, the functions of logic gates, or a certain computing, operation or process may be carried out using, for example, Look-Up-Tables (LUTs) and/or multiplexers. The LUTs store or memorize the processing or computing results of logic gates, computing results of calculations, decisions of decision-making processes, or results of operations, events or activities. The LUTs may store or memorize data or results in, for example, SRAM cells. The SRAM cells may be distributed over all locations in the FPGA chip, and are nearby or close to their corresponding multiplexers in the logic blocks, cells or elements. Alternatively, the SRAM cells may be located in a SRAM array, in a certain area or location of the FPGA chip; wherein the SRAM cell array aggregates or comprises multiple of the SRAM cells of LUTs for the selection multiplexers in logic blocks, cells or elements in the distributed locations. Alternatively, the SRAM cells may be located in one of multiple SRAM arrays, in multiple certain areas of the FPGA chip; each of the SRAM arrays aggregates or comprises multiple of the SRAM cells of LUTs for the selection multiplexers in logic blocks, cells or elements in the distributed locations. The data stored or latched in each of SRAM cells are input to the multiplexer for selection. Each of the SRAM cells may comprise 6 Transistors (6T SRAM), with 2 transfer (write) transistors and 4 data-latch transistors, wherein the two transfer transistors are used for writing the data into the storage or latched nodes of the 4 data-latch transistors. Alternatively, each of the SRAM cells may comprise 5 Transistors (5T SRAM), with 1 transfer (write) transistor and 4 data-latch transistors; wherein the transfer transistor is used for writing the data into the two storage or latched nodes of the 4 data-latch transistors. One of the two latched nodes of the 4 latch transistors in the 5T or 6T SRAM cell is connected or coupled to the multiplexer. The stored data in the 5T or 6T SRAM cell is used for LUTs. When inputting a set of data, requests or conditions, a multiplexer is used to select the corresponding data (or results) stored or memorized in the LUTs, based on the inputted set of data, requests or conditions. As an example, a 4-input NAND gate may be implemented using an operator comprising LUTs and multiplexers as described below: There are 4 inputs for a 4-input NAND gate, and 16 ($2^4$) possible corresponding outputs (results) of the 4-input NAND gate. An operator, used to carry out the 4-input NAND operation using LUTs and multiplexers, comprises (i) 4 inputs, (ii) a LUT for storing and memorizing the 16 possible corresponding outputs (results), (iii) a multiplexer designed and used for selecting the right (corresponding) output, for a given 4-input data set (for example, 1, 0, 0, 1), and (iv) an output. In general, an operator comprises n inputs, a LUT for storing or memorizing $2^n$ corresponding data or results, a multiplexer for selecting the right (corresponding) output for a given n-input data set, and 1 output.

The programmable interconnections of the standard commodity FPGA chip comprise cross-point switches, each in the middle of interconnection metal lines or traces. For example, n metal lines or traces are connected to the input terminals of a cross-point switch, and m metal lines or traces are connected to the output terminals of the cross-point switch, and the cross-point switch is located between the n metal lines or traces and the m metal lines and traces. The cross-point switch is designed such that each of the n metal lines or traces may be programed to connect to anyone of the m metal lines or traces. The cross-point switch may comprise, for example, a pass/no-pass circuit comprising a n-type and a p-type transistor, in pair, wherein one of the n metal lines or traces are connected to the connected source terminals of the n-type and p-type transistor pairs in the pass-no-pass circuit, while one of the m metal lines and traces are connected to the connected drain terminal of the n-type and p-type transistor pairs in the pass-no-pass circuit. The connection or disconnection (pass or no pass) of the cross-point switch is controlled by the data (0 or 1) stored or latched in a SRAM cell. The SRAM cells may be distributed over all locations in the FPGA chip, and each of the 5T or 6T SRAM cells is nearby or close to its corresponding cross-point switch. Alternatively, the SRAM cell may be located in a SRAM array, in a certain area or location of the FPGA chip; wherein the SRAM cell array aggregates or comprises multiple of the SRAM cells for controlling their corresponding cross-point switches in the distributed locations. Alternatively, the SRAM cell may be located in one of multiple SRAM arrays, in multiple certain areas or locations of the FPGA chip; each of the SRAM arrays aggregates or comprises multiple of the SRAM cells for controlling their corresponding cross-point switches in the distributed locations. The (control) gates of both n-type and p-type transistors in the cross-point switch are connected to the two storage or latch nodes, respectively, of the SRAM cell. Each of the SRAM cells may comprise 6 Transistors (6T SRAM), with 2 transfer (write) transistors and 4 data-latch transistors, wherein the two transfer transistors are used for writing the programing code or data into the two storage nodes of the 4 data-latch transistors. Alternatively, each of the SRAM cells may comprise 5 Transistors (5T SRAM), with 1 transfer (write) transistor and 4 data-latch transistors, wherein the transfer transistor is used for writing the programing code or data into the two storage nodes of the 4 data-latch transistors. The two storage nodes of the 4 latch transistors in the 5T or 6T SRAM cell are connected to the gate of the n-type transistor and the gate of the p-type transistor, respectively, in the pass-no-pass switch circuit. The stored (programming) data in the 5T or 6T SRAM cell is used to program the connection or not-connection of the two metal lines or traces connected to the terminals of the cross-point switch. When the data latched in the two storage nodes of the 5T or 6T SRAM cell is programmed at [1, 0], (may be defined as "1" for the data stored in the SRAM cell), the node of 1 is connected to the gate of the n-type transistor, and the node of 0 is connected to the gate of the p-type transistor; therefore, the pass/no-pass circuit is on, and the two metal lines or traces connected to the two terminals of the pass-no-pass switch circuit are connected. While the data latched in the two storage nodes of the 5T or 6T SRAM cell is programmed at [0, 1], (may be defined as "0" for the data stored in the SRAM cell), the node of 0 is connected to the gate of the n-type transistor, and the node of 1 is connected to the gate of the p-type transistor; therefore, the pass/no-pass switch circuit is off, and the two metal lines or traces connected to the two terminals of the pass/no-pass switch circuit are dis-connected. Since the standard commodity FPGA IC chip comprises mainly the regular and repeated gate arrays or blocks, cells or elements, LUTs and multiplexers, or programmable interconnection, just like standard commodity DRAM, or NAND flash IC chips, the manufacturing yield may be very high, for example, greater than 70%, 80%, 90% or 95% for a chip area greater than, for example, 50 $mm^2$, or 80 $mm^2$.

Alternatively, each of the cross-point switches may comprise, for example, a pass/no-pass circuit comprising a switching buffer, wherein the switching buffer comprises two-stages of inverters (buffer), a control N-MOS, and a control P-MOS. Wherein one of the n metal lines or traces is connected to the common (connected) gate terminal of an input-stage inverter of the buffer in the pass-no-pass circuit, while one of the m metal lines and traces is connected to the common (connected) drain terminal of output-stage inverter of buffer in the pass-no-pass circuit. The output-stage inverter is stacked with the control P-MOS at the top (between $V_{cc}$ and the source of the P-MOS of the output-stage inverter) and the control N-MOS at the bottom (between $V_{ss}$ and the source of the N-MOS of the output-stage inverter). The connection or disconnection (pass or no pass) of the cross-point switch is controlled by the data (0 or 1) stored in a 5T or 6T SRAM cell. The 5T or 6T SRAM cells may be distributed over all locations in the FPGA chip, and each of the 5T or 6T SRAM cells is nearby or close to its corresponding cross-point switch. Alternatively, the 5T or 6T SRAM cell may be located in a 5T or 6T SRAM cell array in a certain area or location of the FPGA chip; wherein the 5T or 6T SRAM cell array aggregates or comprises multiple of the 5T or 6T SRAM cells for controlling their corresponding cross-point switches in the distributed locations. Alternatively, the 5T or 6T SRAM cell may be located in one of multiple 5T or 6T SRAM cell arrays, in multiple certain areas or locations of the FPGA chip; each of the 5T or 6T SRAM cell arrays aggregates or comprises multiple of the 5T or 6T SRAM cells for controlling their cross-point switches in the distributed locations. The gates of both control N-MOS and the control P-MOS transistors in the cross-point switch are connected or coupled to the two latched nodes, respectively, of the 5T or 6T SRAM cell. One latched node of the 5T or 6T SRAM cell is connected or coupled to the gate of the control N-MOS transistor in the switching buffer circuit, while the other latched node of the 5T or 6T SRAM cell is connected or coupled to the gate of the control P-MOS transistor in the switch buffer circuit. The stored (programming) data in the 5T or 6T SRAM cell is used to program the connection or not-connection of the two metal lines or traces connected to the terminals of the cross-point switch. When the data stored in the 5T or 6T SRAM cell is programmed at 1, the latched node of 1 is connected to the gate of the control N-MOS transistor, and the other latched node of 0 is connected to the gate of the control P-MOS transistor; therefore, the pass/no-pass circuit (the switching buffer) passes the data from input to the output. In other words, the two metal lines or traces connected to the two terminals of the pass-no-pass switch circuit are (virtually) connected. While the data stored in the 5T or 6T SRAM cell is programmed at 0, the latched node of 0 is connected to the gate of the control N-MOS transistor, and the other latched node of 1 is connected to the gate of the control P-MOS transistor; therefore, both the control N-MOS and control P-MOS transistors are off. The data cannot be transferred from the input to the output, and the two metal lines or traces connected to the two terminals of the pass/no-pass switch circuit are dis-connected.

Alternatively, the cross-point switches may comprise, for example, multiplexers and switch buffers. A multiplexer of a cross-point switch selects one of the n inputting data form the n inputting metal lines based on the data stored in the 5T or 6T SRAM cells; and outputs the selected one of inputs to a switch buffer. The switch buffer passes or does not pass the output data from the multiplexer to one metal line connected to the output of the switch buffer based on the data stored in the 5T or 6T SRAM cells. The switch buffer comprises two-stages of inverters (buffer), a control N-MOS, and a control P-MOS. Wherein the selected data from the multiplexer is connected to the common (connected) gate terminal of input-stage inverter of the buffer, while said one metal line or trace is connected to the common (connected) drain terminal of output-stage inverter of the buffer. The output-stage inverter is stacked with the control P-MOS at the top (between Vcc and the source of the P-MOS of the output-stage inverter) and the control N-MOS at the bottom (between Vss and the source of the N-MOS of the output-stage inverter). The connection or disconnection of the switch buffer is controlled by the data (0 or 1) stored in the 5T or 6T SRAM cell. One latched node of the 5T or 6T SRAM cell is connected or coupled to the gate of the control N-MOS transistor in the switch buffer circuit, and the other latched node of the 5T or 6T SRAM cell is connected or coupled to the gate of the control P-MOS transistor in the switch buffer circuit. For example, two metal lines A and B are crossed at a point, and segmenting metal line A into two segments, $A_1$ and $A_2$, and metal line B into two segments, $B_1$ and $B_2$. The cross-point switch is located at the cross point. The cross-point switch comprises 4 pairs of multiplexers and switch buffers. Each of the multiplexer has 3 inputs and 1 output, that is, each multiplexer selects one from the 3 inputs as the output, based on 2 bits of data stored in two of the 5T or 6T SRAM cells. Each of the switch buffers receives the output data from the corresponding multiplexer and decides to pass or not to pass the selected data, based on the $3^{rd}$ bit of data stored in the $3^{rd}$ 5T or 6T SRAM cell. The cross-point switch is located between segments $A_1$, $A_z$, $B_1$ and $B_2$, and comprises 4 pairs of multiplexers/switch buffers: (1) The 3 inputs of a first multiplexer may be $A_1$, $B_1$ and $B_2$. If the 2 bits stored in the 5T or 6T SRAM cells are 0 and 0 for the multiplexer, the $A_1$ segment is selected by the first multiplexer. The $A_1$ segment is connected to the input of a first switch buffer. If the data bit stored in the 5T or 6T SRAM cell is 1 for the first switch buffer, the data of $A_1$ segment is passing to the $A_2$ segment. If the data bit stored in the 5T or 6T SRAM cell is 0 for the first switch buffer, the data of $A_1$ segment is not passing to the $A_2$ segment. If the 2 bits stored in the 5T or 6T SRAM cells are 1 and 0 for the first multiplexer, the $B_1$ segment is selected by the first multiplexer. The $B_1$ segment is connected to the input of the first switch buffer. If the data bit stored in the 5T or 6T SRAM cell is 1 for the first switch buffer, the data of $B_1$ segment is passing to the $A_2$ segment. If the data bit stored in the 5T or 6T SRAM cell is 0 for the first switch buffer, the data of $B_1$ segment is not passing to the $A_2$ segment. If the 2 bits stored in the 5T or 6T SRAM cells are 0 and 1 for the first multiplexer, the $B_2$ segment is selected by the first multiplexer. The $B_2$ segment is connected to the input of the first switch buffer. If the data bit stored in the 5T or 6T SRAM cell is 1 for the first switch buffer, the data of $B_2$ segment is passing to the $A_2$ segment. If the data bit stored in the 5T or 6T SRAM cell is 0 for the first switch buffer, the data of $B_2$ segment is not passing to the $A_2$ segment. (2) The 3 inputs of a second multiplexer may be $A_2$, $B_1$ and $B_2$. If the 2 bits stored in the 5T or 6T SRAM cells are 0 and 0 for the second multiplexer, the $A_2$ segment is selected by the second multiplexer. The $A_2$ segment is connected to the input of a second switch buffer. If the data bit stored in the 5T or 6T SRAM cell is 1 for the second switch buffer, the data of $A_2$ segment is passing to the $A_1$ segment. If the data bit stored in the 5T or 6T SRAM cell is 0 for the second switch buffer, the data of $A_2$ segment is not passing to the $A_1$ metal segment. If the 2 bits stored in the 5T or 6T SRAM cells are 1 and 0 for the second multiplexer, the $B_1$ segment is selected by the second multiplexer. The $B_1$ segment is connected to the input of the second switch buffer. If the data bit stored in the 5T or 6T SRAM cell is 1 for the second switch buffer, the data of $B_1$ segment is passing to the $A_1$ segment. If the data bit stored in the 5T or 6T SRAM cell is 0 for the second switch buffer, the data of $B_1$ segment is not passing to the $A_1$ metal segment. If the 2 bits stored in the 5T or 6T SRAM cells are 0 and 1 for the second multiplexer, the $B_2$ segment is selected by the second multiplexer. The $B_2$ segment is connected to the input of the second switch buffer. If the data bit stored in the 5T or 6T SRAM cell is 1 for the second switch buffer, the data of $B_2$ segment is passing to the $A_1$ segment. If the data bit stored in the 5T or 6T SRAM cell is 0 for the second switch buffer, the data of $B_2$ segment is not passing to the $A_1$ metal segment. (3) The 3 inputs of a third multiplexer may be $A_1$, $A_2$ and $B_2$. If the 2 bits stored in the 5T or 6T SRAM cells are 0 and 0 for the third multiplexer, the $A_1$ segment is selected by the third multiplexer. The $A_1$ segment is connected to the input of a third switch buffer. If the data bit stored in the 5T or 6T SRAM cell is 1 for the third switch buffer, the data of $A_1$ segment is passing to the $B_1$ segment. If the data bit stored in the 5T or 6T SRAM cell is 0 for the third switch buffer, the data of $A_1$ segment is not passing to the $B_1$ segment. If the 2 bits stored in the 5T or 6T SRAM cells are 1 and 0 for the third multiplexer, the $A_2$ segment is selected by the third multiplexer. The $A_2$ segment is connected to the input of the third switch buffer. If the data bit stored in the 5T or 6T SRAM cell is 1 for the third switch buffer, the data of $A_2$ segment is passing to the $B_1$ segment. If the data bit stored in the 5T or 6T SRAM cell is 0 for the third switch buffer, the data of $A_2$ segment is not passing to the $B_1$ segment. If the 2 bits stored in the 5T or 6T SRAM cells are 0 and 1 for the third multiplexer, the $B_2$ segment is selected by the third multiplexer. The $B_2$ segment is connected to the input of the third switch buffer. If the data bit stored in the 5T or 6T SRAM cell is 1 for the third switch buffer, the data of $B_2$ segment is passing to the $B_1$ segment. If the data bit stored in the 5T or 6T SRAM cell is 0 for the third switch buffer, the data of $B_2$ segment is not passing to the $B_1$ segment. (4) The 3 inputs of a fourth multiplexer may be $A_1$, $A_2$ and $B_1$. If the 2 bits stored in the 5T or 6T SRAM cells are 0 and 0 for the fourth multiplexer, the $A_1$ segment is selected by the fourth multiplexer. The $A_1$ segment is connected to the input of a fourth switch buffer. If the data bit stored in the 5T or 6T SRAM cell is 1 for the fourth switch buffer, the data of $A_1$ segment is passing to the $B_2$ segment. If the data bit stored in the 5T or 6T SRAM cell is 0 for the fourth switch buffer, the data of $A_1$ segment is not passing to the $B_2$ segment. If the 2 bits stored in the 5T or 6T SRAM cells are 1 and 0 for the fourth multiplexer, the $A_2$ segment is selected by the fourth multiplexer. The $A_2$ segment is connected to the input of the fourth switch buffer. If the data bit stored in the 5T or 6T SRAM cell is 1 for the fourth switch buffer, the data of $A_2$ segment is passing to the $B_2$ segment. If the data bit stored in the 5T or 6T SRAM cell is 0 for the fourth switch buffer, the data of $A_2$ segment is not passing to the $B_2$ segment. If the 2 bits stored in the 5T or 6T SRAM cells are 0 and 1 for the fourth multiplexer, the $B_1$ segment is selected by the fourth multiplexer. The $B_1$ segment is connected to the input of the fourth switch buffer. If the data bit stored in the 5T or 6T SRAM cell is 1 for the fourth switch buffer, the data of $B_1$ segment is passing to the $B_2$ segment. If the data bit stored in the 5T or 6T SRAM cell is 0 for the fourth switch buffer, the data of $B_1$ segment is not passing to the $B_2$ segment. In this case, the cross-point switch is bi-directional; there are 4 pairs of multiplexers/switch buffers, each pair of the multiplexers/switch buffers is controlled by 3 bits of the 5T or 6T SRAM cells. Totally, 12 bits of the 5T or 6T SRAM cells are required for the cross-point switch. The 5T or 6T SRAM cells may be distributed over all locations in the FPGA chip, and is nearby or close to the corresponding multiplexers and/or switch buffers of the cross-point switches. Alternatively, the 5T or 6T SRAM cell may be located in a 5T or 6T SRAM cell array, in a certain area or location of the FPGA chip; wherein the 5T or 6T SRAM cell array aggregates or comprises multiple of the 5T or 6T SRAM cells for controlling corresponding multiplexers and/or switch buffers of the cross-point switches in the distributed locations. Alternatively, the 5T or 6T SRAM cell may be located in one of multiple 5T or 6T SRAM cell arrays, in multiple certain areas or locations of the FPGA chip; each of the 5T or 6T SRAM cell arrays aggregates or comprises multiple of the 5T or 6T SRAM cells for controlling multiplexers and/or switch buffers of the cross-point switches in the distributed locations.

The programmable interconnections of the standard commodity FPGA chip comprise a multiplexer in the middle of interconnection metal lines or traces. The multiplexer selects from n metal interconnection lines connected to the n inputs of the multiplexer, and coupled or connected to one metal interconnection line connected to the output of the multiplexer, based on the data stored or programmed in the 5T or 6T SRAM cells. For example, n=16, 4 bits of the 5T or 6T SRAM cells are required to select any one of the 16 metal interconnection lines connected to the 16 inputs of the multiplexer, and couple or connect the selected one to one metal interconnection line connected to the output of the multiplexer. The data from the selected one of 16 inputs is therefore coupled, passed, or connected to the metal line connected to the output of the multiplexer.

Another aspect of the disclosure provides the standard commodity logic drive in a multi-chip package comprising the standard commodity plural FPGA IC chips and one or more non-volatile memory IC chips, for use in different applications requiring logic, computing and/or processing functions by field programming, wherein the standard commodity plural FPGA IC chips, each is in a bare-die format or in a single-chip or multi-chip package. Each of standard commodity plural FPGA IC chips may have standard common features, counts or specifications: (1) logic blocks, cells or elements including (i) system gates with the count greater than or equal to 2 M, 10 M, 20 M, 50 M or 100 M, (ii) logic cells or elements with the count greater than or equal to 64 K, 128 K, 512 K, 1 M, 4 M or 8 M, (iii) The hard macros comprises, for example, digital signal process (DSP) slices, graphic process unit (GPU) macros, microcontroller unit (MCU) macros, multiplexer macros, adder macros, multiplier macros, arithmetic logic unit (ALU) macros, shift circuit macros, comparison circuit macros, floating-point computing macros, register or flip-flop macros, and/or I/O interfacing macros, wherein each of the hard macros is designed, compiled and implemented with fixed hard wiring for circuit, and/or (iv) blocks of memory with the bit count equal to or greater than 1 M, 10 M, 50 M, 100 M, 200 M or 500 M bits; (2) the number of inputs to each of the logic blocks or operators: the number of inputs to each of the logic block, cell or element, or, operator may be greater or equal to 4, 8, 16, 32, 64, 128, or 256; (3) the power supply voltage: the voltage may be between 0.1V and 8V, 0.1V and 6V, 0.1V and 2.5V, 0.1V and 2V, 0.1V and 1.5V, or 0.1V and 1V; (4) the I/O pads, in terms of layout, location, number and function. Since the FPGA chips are standard commodity IC chips, the number of FPGA chip designs or products is reduced to a small number, therefore, the expensive photo masks or mask sets for fabricating the FPGA chips using advanced semiconductor nodes or generations are reduced to a few mask sets. For example, reduced down to between 3 and 20 mask sets, 3 and 10 mask sets, or 3 and 5 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising plural standard commodity FPGA IC chips and one or more non-volatile memory IC chips, for use in different applications requiring logic, computing and/or processing functions by field programming, wherein the plural standard commodity FPGA IC chips, each is in a bare-die format or in a single-chip or multi-chip package format. The standard commodity logic drive may have standard common features, counts or specifications: (1) logic blocks including (i) system gates with the count greater than or equal to 8 M, 40 M, 80 M, 200 M or 400 M, (ii) logic cells or elements with the count greater than or equal to 256 K, 512 K, 2 M, 4 M, 16 M or 32 M, (iii) The hard macros comprises, for example, digital signal process (DSP) slices, graphic process unit (GPU) macros, microcontroller unit (MCU) macros, multiplexer macros, adder macros, multiplier macros, arithmetic logic unit (ALU) macros, shift circuit macros, comparison circuit macros, floating-point computing macros, register or flip-flop macros, and/or I/O interfacing macros, wherein each of the hard macros is designed, compiled and implemented with fixed hard wiring for circuit, and/or (iv) blocks of memory with the bit count equal to or greater than 4 M, 40 M, 200 M, 400 M, 800 M or 2 G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The logic drive may also comprise the I/O pads, metal pillars or bumps connecting or coupling to Serial Advanced Technology Attachment (SATA) ports, or Peripheral Components Interconnect express (PCIe) ports for communicating, connecting or coupling with the memory drive. Since the logic drives are standard commodity products, the product inventory management becomes easy, efficient and effective, therefore resulting in a shorter logic drive delivery time and becoming cost-effective.

Another aspect of the disclosure provides the standard commodity logic drive in a multi-chip package further comprising a dedicated control chip. The dedicated control chip is designed, implemented and fabricated using varieties of semiconductor technology nodes or generations, including old or matured technology node or generations, for example, less advanced than or equal to, or above or equal to 40 nm, 50 nm, 90 nm, 130 nm, 250 nm, 350 nm, or 500 nm. Alternatively, advanced semiconductor technology nodes or generations may be used for the dedicated control chip; for example, a semiconductor node or generation more advanced than or equal to, or below or equal to 40 nm, 20 nm or 10 nm. The semiconductor technology node or generation used in the dedicated control chip is 1, 2, 3, 4, 5 or greater than 5 nodes or generations older, more matured or less advanced than that used in the standard commodity FPGA IC chips packaged in the same logic drive. Transistors used in the dedicated control chip may be a FINFET, a GAAFET, a Fully Depleted Silicon-on-insulator (FDSOI) MOSFET, a Partially Depleted Silicon-on-insulator (PDSOI) MOSFET or a conventional MOSFET. Transistors used in the dedicated control chip may be different from that used in the standard commodity FPGA IC chips packaged in the same logic drive; for example, the dedicated control chip may use the conventional MOSFET, while the standard commodity FPGA IC chips packaged in the same logic drive may use the FINFET or GAAFET; or the dedicated control chip may use the Fully Depleted Silicon-on-insulator (FDSOI) MOSFET, while the standard commodity FPGA IC chips packaged in the same logic drive may use the FINFET, or GAAFET. The dedicated control chip provides control functions of: (1) downloading programing codes, data information, or resulting values from outside (of the logic drive) to the non-volatile IC chips in the logic drive; (2) downloading the programing codes, data, information from the non-volatile IC chips (for example, NAND or NOR flash memory IC chip or chips) in the logic drive to the 5T or 6T SRAM cells of switches (including pass-no-pass switching gates and/or multiplexers) for the programmable interconnection on the standard commodity FPGA IC chips in the logic drive; and/or downloading the programing codes, data, information, or resulting values from the non-volatile IC chips (for example, NAND or NOR flash memory IC chip or chips) in the logic drive to the 5T or 6T SRAM cells of the programmable logic circuits, cells or blocks (including LUTs and/or multiplexers) for the programmable logic operation/function on the standard commodity FPGA IC chips in the logic drive. Alternatively, the programming codes, data, information, or resulting values from the non-volatile IC chips in the logic drive may go through a buffer or driver in or of the dedicated control chip before getting into the 5T or 6T SRAM cells of the programmable interconnection or programmable logic circuits, cells, elements or blocks on the standard commodity FPGA IC chips. The buffer in or of the dedicated control chip may latch the codes, data, information, or resulting values from the non-volatile chips and increase the bit-width of the data. For example, the data bit-width (in a SATA standard) from the non-volatile chips is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chips is 32 bit, the buffer may increase the data bit-width to equal to or greater than 64, 128, or 256 data bit-width. The driver in or of the dedicated control chip may amplify the data signals from the non-volatile chips; (3) inputting/outputting signals for a user application; (4) power management.

Another aspect of the disclosure provides the standard commodity logic drive in a multi-chip package further comprising a dedicated I/O chip. The dedicated I/O chip is designed, implemented and fabricated using varieties of semiconductor technology nodes or generations, including old or matured technology nodes or generations, for example, a semiconductor node or generation less advanced than or equal to, or above or equal to 40 nm, 50 nm, 90 nm, 130 nm, 250 nm, 350 nm, or 500 nm. The semiconductor technology node or generation used in the dedicated I/O chip is 1, 2, 3, 4, 5 or greater than 5 nodes or generations older, more matured or less advanced than that used in the standard commodity FPGA IC chips packaged in the same logic drive. Transistors used in the dedicated I/O chip may be a Fully Depleted Silicon-on-insulator (FDSOI) MOSFET, a Partially Depleted Silicon-on-insulator (PDSOI) MOSFET or a conventional MOSFET. Transistors used in the dedicated I/O chip may be different from that used in the standard commodity FPGA IC chips packaged in the same logic drive; for example, the dedicated I/O chip may use the conventional MOSFET, while the standard commodity FPGA IC chips packaged in the same logic drive may use the FINFET or GAAFET; or the dedicated I/O chip may use the Fully Depleted Silicon-on-insulator (FDSOI) MOSFET, while the standard commodity FPGA IC chips packaged in the same logic drive may use the FINFET or GAAFET. The power supply voltage used in the dedicated I/O chip may be greater than or equal to 1.5V, 2.0 V, 2.5V, 3 V, 3.5V, 4V, or 5V, while the power supply voltage used in the standard commodity FPGA IC chips packaged in the same logic drive may be smaller than or equal to 2.5V, 2V, 1.8V, 1.5V, or 1 V. The power supply voltage used in the dedicated I/O chip may be different from that used in the standard commodity FPGA IC chips packaged in the same logic drive; for example, the dedicated I/O chip may use a power supply of 4V, while the standard commodity FPGA IC chips packaged in the same logic drive may use a power supply voltage of 1.5V; or the dedicated I/O chip may use a power supply of 2.5V, while the standard commodity FPGA IC chips packaged in the same logic drive may use a power supply of 0.75V. The gate oxide (physical) thickness of the Field-Effect-Transistors (FETs) may be thicker than or equal to 5 nm, 6 nm, 7.5 nm, 10 nm, 12.5 nm, or 15 nm, while the gate oxide (physical) thickness of FETs used in the standard commodity FPGA IC chips packaged in the same logic drive may be thinner than 4.5 nm, 4 nm, 3 nm or 2 nm. The gate oxide (physical) thickness of FETs used in the dedicated I/O chip may be different from that used in the standard commodity FPGA IC chips packaged in the same logic drive; for example, the dedicated I/O chip may use a gate oxide (physical) thickness of FETs of 10 nm, while the standard commodity FPGA IC chips packaged in the same logic drive may use a gate oxide (physical) thickness of FETs of 3 nm; or the dedicated I/O chip may use a gate oxide (physical) thickness of FETs of 7.5 nm, while the standard commodity FPGA IC chips packaged in the same logic drive may use a gate oxide (physical) thickness of FETs of 2 nm. The dedicated I/O chip provides inputs and outputs, and ESD protection for the logic drive. The dedicated I/O chip provides (i) large drivers or receivers, or I/O circuits for communicating with external or outside (of the logic drive), and (ii) small drivers or receivers, or I/O circuits for communicating with chips in or of the logic drive. The large drivers or receivers, or I/O circuits for communicating with external or outside (of the logic drive) have driving capability, loading, output capacitance or input capacitance lager or bigger than that of the small drivers or receivers, or I/O circuits for communicating with chips in or of the logic drive. The driving capability, loading, output capacitance, or input capacitance of the large I/O drivers or receivers, or I/O circuits for communicating with external or outside (of the logic drive) may be between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. The driving capability, loading, output capacitance, or input capacitance of the small I/O drivers or receivers, or I/O circuits for communicating with chips in or of the logic drive may be between 0.1 pF and 10 pF, 0.1 pF and 5 pF or 0.1 pF and 2 pF; or smaller than 10 pF, 5 pF, 3 pF, 2 pF or 1 pF. The size of ESD protection device on the dedicated I/O chip is larger than that on other standard commodity FPGA IC chips in the same logic drive. The size of the ESD device in the large I/O circuits may be between 0.5 pF and 20 pF, 0.5 pF and 15 pF, 0.5 pF and 10 pF 0.5 pF and 5 pF or 0.5 pF and 2 pF; or larger than 0.5 pF, 1 pF, 2 pF, 3 pF, 5 pF or 10 pF. For example, a bi-directional (or tri-state) I/O pad or circuit may be used for the large I/O drivers or receivers, or I/O circuits for communicating with external or outside (of the logic drive), and may comprise an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF. For example, a bi-directional (or tri-state) I/O pad or circuit may be used for the small I/O drivers or receivers, or I/O circuits for communicating with chips in or of the logic drive, and may comprise an ESD circuit, a receiver, and a driver, and may have an input capacitance or output capacitance between 0.1 pF and 10 pF, 0.1 pF and 5 pF or 0.1 pF and 2 pF; or smaller than 10 pF, 5 pF, 3 pF, 2 pF or 1 pF.

The dedicated I/O chip (or chips) in the multi-chip package of the standard commodity logic drive may comprise a buffer and/or driver circuits for downloading the programing codes, data, information, or resulting values from the non-volatile IC chips in the logic drive to the 5T or 6T SRAM cells of the programmable interconnection (switches including pass-no-pass switching gates and multiplexers) and/or programmable logic circuits, cells, elements or blocks (including LUTs and multiplexers) on the standard commodity FPGA IC chips. The programming codes, data, information, or resulting values from the non-volatile IC chips in the logic drive may go through a buffer or driver in or of the dedicated I/O chip before getting into the 5T or 6T SRAM cells of the programmable interconnection and/or programmable logic circuits, cells, elements or blocks on the standard commodity FPGA IC chips. The buffer in or of the dedicated I/O chip may latch the data from the non-volatile chips and increase the bit-width of the data. For example, the data bit-width (in a SATA standard) from the non-volatile chips is 1 bit, the buffer may latch the 1 bit data in each of the multiple SRAM cells in the buffer, and output the data stored or latched in the multiple SRAM cells in parallel and simultaneously to increase the data bit-width; for example, equal to or greater than 4, 8, 16, 32, or 64 data bit-width. For another example, the data bit-width (in a PCIe standard) from the non-volatile chips is 32 bit, the buffer may increase the data bit-width to equal to or greater than 64, 128, or 256 data bit-width. The driver in or of the dedicated I/O chip may amplify the data signals from the non-volatile chips.

The dedicated I/O chip (or chips) in the multi-chip package of the standard commodity logic drive may comprise I/O circuits or pads (or micro copper pillars or bumps) for connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. The dedicated I/O chip may also comprise I/O circuits or pads (or micro copper pillars or bumps) for connecting or coupling to Serial Advanced Technology Attachment (SATA) ports, or Peripheral Components Interconnect express (PCIe) ports for communicating, connecting or coupling with the memory drive.

Another aspect of the disclosure provides the standard commodity logic drive in a multi-chip package further comprising a dedicated control and I/O chip. The dedicated control and I/O chip provides the functions of the dedicated control chip and the dedicated I/O chip, as described in the above paragraphs, in one chip. The dedicated control and I/O chip is designed, implemented and fabricated using varieties of semiconductor technology nodes or generations, including old or matured technology nodes or generations, for example, a semiconductor node or generation less advanced than or equal to, or above or equal to 30 nm, 90 nm, 130 nm, 250 nm, 350 nm, or 500 nm. The semiconductor technology node or generation used in the dedicated control and I/O chip is 1, 2, 3, 4, 5 or greater than 5 nodes or generations older, more matured or less advanced than that used in the standard commodity FPGA IC chips packaged in the same logic drive. Transistors used in the dedicated control and I/O chip may be a FINFET, a GAAFET, a Fully Depleted Silicon-on-insulator (FDSOI) MOSFET, a Partially Depleted Silicon-on-insulator (PDSOI) MOSFET or a conventional MOSFET. Transistors used in the dedicated control and I/O chip may be different from that used in the standard commodity FPGA IC chips packaged in the same logic drive; for example, the dedicated control and I/O chip may use the conventional MOSFET, while the standard commodity FPGA IC chips packaged in the same logic drive may use the FINFET or GAAFET; or the dedicated control and I/O chip may use the Fully Depleted Silicon-on-insulator (FDSOI) MOSFET, while the standard commodity FPGA IC chips packaged in the same logic drive may use the FINFET or GAAFET. The above-mentioned specification for the small I/O circuits, i.e., small driver or receiver, and the large I/O circuits, i.e., large driver or receiver, in the I/O chip may be applied to that in the dedicated control and I/O chip.

Another aspect of the disclosure provides the standard commodity logic drive in a multi-chip package comprising plural standard commodity FPGA IC chips and one or more non-volatile IC chips, for use in different applications requiring logic, computing and/or processing functions by field programming; wherein the one or more non-volatile memory IC chips comprises a NAND flash chip or chips and/or a NOR flash chip or chips, in a bare-die format or in a multi-chip flash package format. Each of the one or more NAND flash chips may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. Each of the one or more NOR flash chips may have a standard memory density, capacity or size of greater than or equal to 1 Mb, 4 Mb, 16 Mb, 64 Mb, 128 Mb, 256 Mb, 512 Mb, 1 Gb, 4 Gb, or 16 Gb, wherein "b" is bits. The NAND flash chip may be designed and fabricated using advanced NAND flash technology nodes or generations, for example, more advanced than or equal to 45 nm, 28 nm, 20 nm, 16 nm, and/or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structures may comprise multiple stacked layers or levels of NAND cells, for example, greater than or equal to 4, 8, 16, 32 stacked layers or levels of NAND cells. The one or more non-volatile memory IC chips comprises a NAND flash chip or chips and/or a NOR flash chip or chips, mentioned above or below in this patent application, in the logic drive are used for: (a) storing data or information for configuring the FPGA chip or chips in the logic drive. The NAND and/or NOR chip or chips in the logic drive are used for storing configuration data for a logic circuit (including resulting values for the LUTs and data for configuring the multiplexers of the logic circuit to select resulting values from the corresponding the LUTs) of the FPGA chip or chips in the logic drive, and/or storing programing codes for switches (including data for controlling pass/no-pass gates and multiplexers in the switches) of the FPGA chip or chips in the logic drive; (b) storing data or information for the operation of the FPGA chip or chips in the logic drive, note that the FPGA chip or chips in (b) have been configured for given operations or functions. In an embodiment, the logic drive may comprise the NOR flash chip and the NAND flash chip, wherein the NOR flash chip is used for storing data or information for configuring the FPGA chip or chips, and the NAND flash chip is used for storing data or information for the operation of the FPGA chip or chips.

Another aspect of the disclosure provides the standard commodity logic drive in a multi-chip package comprising plural standard commodity FPGA IC chips and one or more non-volatile IC chips, for use in different applications requiring logic, computing and/or processing functions by field programming; wherein the one or more non-volatile memory IC chips comprises a NAND flash chip or chips, in a bare-die format or in a multi-chip flash package format. The standard commodity logic drive may have a standard non-volatile memory density, capacity or size of greater than or equal to 8 MB, 64 MB, 128 GB, 512 GB, 1 GB, 4 GB, 16 GB, 64 GB, 256 GB, or 512 GB, wherein "B" is bytes, each byte has 8 bits.

Another aspect of the disclosure provides the standard commodity logic drive in a multi-chip package comprising the plural standard commodity FPGA IC chips, the dedicated I/O chip, the dedicated control chip and the one or more non-volatile memory IC chips, for use in different applications requiring logic, computing and/or processing functions by field programming. The communication between the chips of the logic drive and the communication between each chip of the logic drive and the external or outside (of the logic drive) are described as follows: (1) the dedicated I/O chip communicates directly with the other chip or chips of the logic drive, and also communicates directly with the external or outside (circuits) (of the logic drive). The dedicated I/O chip comprises two types of I/O circuits; one type having large driving capability, loading, output capacitance or input capacitance for communicating with the external or outside of the logic drive, and the other type having small driving capability, loading, output capacitance or input capacitance for communicating directly with the other chip or chips of the logic drive; (2) each of the plural FPGA IC chips only communicates directly with the other chip or chips of the logic drive, but does not communicate directly and/or does not communicate with the external or outside (of the logic drive); wherein an I/O circuit of one of the plural FPGA IC chips may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the one of the plural FPGA IC chips, wherein the I/O circuit (for example, the input or output capacitance is smaller than 2 pF) of the one of the plural FPGA IC chips is connected or coupled to the large or big I/O circuit (for example, the input or output capacitance is larger than 3 pF) of the dedicated I/O chip for communicating with the external or outside circuits of the logic drive; (3) the dedicated control chip only communicates directly with the other chip or chips of the logic drive, but does not communicate directly and/or does not communicate with the external or outside (of the logic drive); wherein an I/O circuit of the dedicated control chip may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the dedicated control chip. Alternatively, wherein the dedicated control chip may communicate directly with the other chip or chips of the logic drive, and may also communicate directly with the external or outside (of the logic drive); (4) each of the one or more non-volatile memory IC chips only communicates directly with the other chip or chips of the logic drive, but does not communicates directly and/or does not communicate with the external or outside (of the logic drive); wherein an I/O circuit of the one or more non-volatile memory IC chips may communicate indirectly with the external or outside (of the logic drive) by going through an I/O circuit of the dedicated I/O chip; wherein the driving capability, loading, output capacitance or input capacitance of the I/O circuit of the dedicated I/O chip is significantly larger or bigger than that of the I/O circuit of the one or more non-volatile memory IC chips. Alternatively, wherein the one or more non-volatile memory IC chips may communicate directly with the other chip or chips of the logic drive, and may also communicate directly with the external or outside (of the logic drive). In the above, "Object X communicates directly with Object Y" means the Object X (for example, a first chip of the logic drive) communicates or couples electrically and directly with the Object Y without going through or passing through any other chip or chips of the logic drive. In the above, "Object X does not communicate directly with Object Y" means the Object X (for example, a first chip of or in the logic drive) may communicate or couple electrically but indirectly with the Object Y by going through or passing through any other chip or chips of the logic drive. "Object X does not communicate with Object Y" means the Object X (for example, a first chip of the logic drive) does not communicate or couple electrically and directly, and does not communicate or couple electrically and indirectly with the Object Y.

Another aspect of the disclosure provides the standard commodity logic drive in a multi-chip package comprising the plural standard commodity FPGA IC chips, the dedicated control and I/O chip, and the one or more non-volatile memory IC chips, for use in different applications requiring logic, computing and/or processing functions by field programming. The communication between the chips of the logic drive and the communication between each chip of the logic drive and the external or outside (of the logic drive) are described as follows: (1) the dedicated control and I/O chip communicates directly with the other chip or chips of the logic drive, and also communicates directly with the external or outside (circuits) (of the logic drive); The dedicated control and I/O chip comprises two types of I/O circuits; one type having large driving capability, loading, output capacitance or input capacitance for communicating with the external or outside of the logic drive, and the other type having small driving capability, loading, output capacitance or input capacitance for communicating directly with the other chip or chips of the logic drive; (2) each of the plural FPGA IC chips only communicates directly with the other chip or chips of the logic drive, but does not communicate directly and/or does not communicate with the external or outside (of the logic drive); wherein an I/O circuit of one of the plural FPGA IC chips may communicate indirectly with the external or outside (of the logic drive) by going through an I/O circuit of the dedicated control and I/O chip; wherein the driving capability, loading, output capacitance or input capacitance of the I/O circuit of the dedicated control and I/O chip is significantly larger or bigger than that of the I/O circuit of the one of the plural FPGA IC chips; (3) each of the one or more non-volatile memory IC chips only communicates directly with the other chip or chips in or of the logic drive, but does not communicates directly or does not communicate with the external or outside (of the logic drive); wherein an I/O circuit of the one or more non-volatile memory IC chips may communicate indirectly with the external or outside (of the logic drive) by going through an I/O circuit of the dedicated control and I/O chip, wherein the driving capability, loading, output capacitance or input capacitance of the I/O circuit of the dedicated control and I/O chip is significantly larger or bigger than that of the I/O circuit of the one or more non-volatile memory IC chips. Alternatively, wherein the one or more non-volatile memory IC chips communicates directly with the other chip or chips in the logic drive, and also communicates directly with the external or outside (of the logic drive). The wordings "Object X communicates directly with Object Y", "Object X does not communicate directly with Object Y", and "Object X does not communicate with Object Y" have the same meanings as defined in the previous paragraph.

Another aspect of the disclosure provides a development kit or tool for a user or developer to implement an innovation or an application using the standard commodity logic drive. The user or developer with innovation or application concept or idea may purchase the standard commodity logic drive and use the corresponding development kit or tool to develop or to write software codes, data or programs to load into the non-volatile memory of the standard commodity logic drive for implementing his/her innovation or application concept or idea. The standard commodity logic drive in a multi-chip package comprises plural standard commodity FPGA IC chips and one or more non-volatile IC chips wherein the one or more non-volatile memory IC chips comprises a NAND flash chip or chips and/or a NOR flash chip or chips, in a bare-die format or in a multi-chip flash package format. The user's software codes, data, information, instructions or programs (related to the innovation or application) loaded into and stored in the one or more non-volatile memory IC chips in the standard commodity logic drive may be downloaded or coupled to the 5T or 6T SRAM cells of the programmable interconnection (switches including pass-no-pass switching gates and multiplexers) and/or programmable logic circuits, cells, elements or blocks (including LUTs and multiplexers) on the standard commodity FPGA IC chips in the standard commodity logic drive. By combining the non-volatile IC memory chip and the FPGA chip in a chip package in the standard commodity logic drive provides an alternative for the current ASIC IC chip design, manufacturing, and business. The chip package of the logic drive with the loaded and stored software codes, data, information, instructions or programs (related to the innovation or application) can be sold and used just like an ASIC IC chip.

Another aspect of the disclosure provides a logic drive in a multi-chip package format further comprising an Innovated ASIC or COT (abbreviated as IAC below) chip for Intellectual Property (IP) circuits, Application Specific (AS) circuits, analog circuits, mixed-mode signal circuits, Radio-Frequency (RF) circuits, and/or transmitter, receiver, transceiver circuits, etc. The IAC chip is designed, implemented and fabricated using varieties of semiconductor technology nodes or generations, including old or matured technology nodes or generations, for example, less advanced than or equal to, or above or equal to 40 nm, 50 nm, 90 nm, 130 nm, 250 nm, 350 nm or 500 nm. Alternatively, the advanced semiconductor technology nodes or generations, such as more advanced than or equal to, or below or equal to 40 nm, 20 nm or 10 nm, may be used for the IAC chip. The semiconductor technology node or generation used in the IAC chip is 1, 2, 3, 4, 5 or greater than 5 nodes or generations older, more matured or less advanced than that used in the standard commodity FPGA IC chips packaged in the same logic drive. Transistors used in the IAC chip may be a FINFET, a GAAFET, a Fully Depleted Silicon-on-insulator (FDSOI) MOSFET, a Partially Depleted Silicon-on-insulator (PDSOI) MOSFET or a conventional MOSFET. Transistors used in the IAC chip may be different from that used in the standard commodity FPGA IC chips packaged in the same logic drive; for example, the IAC chip may use the conventional MOSFET, while the standard commodity FPGA IC chips packaged in the same logic drive may use the FINFET or GAAFET; or the IAC chip may use the Fully Depleted Silicon-on-insulator (FDSOI) MOSFET, while the standard commodity FPGA IC chips packaged in the same logic drive may use the FINFET or GAAFET. Since the IAC chip in this aspect of disclosure may be designed and fabricated using older or less advanced technology nodes or generations, for example, less advanced than or equal to, or above or equal to 40 nm, 50 nm, 90 nm, 130 nm, 250 nm, 350 nm, or 500 nm, its NRE cost is cheaper than or less than that of the current or conventional ASIC or COT chip designed and fabricated using an advanced IC technology node or generation, for example, more advanced than or below 30 nm, 20 nm or 10 nm. The NRE cost for designing a current or conventional ASIC or COT chip using an advanced IC technology node or generation, for example, more advanced than or below 30 nm, 20 nm or 10 nm, may be more than US $5 M, US $10 M, US $20 M or even exceeding US $50 M, or US $100 M. The cost of a photo mask set for an ASIC or COT chip at the 16 nm technology node or generation is over US $2 M, US $5 M, or US $10 M. Implementing the same or similar innovation or application using the logic drive including the IAC chip designed and fabricated using older or less advanced technology nodes or generations may reduce NRE cost down to less than US $10 M, US $7 M, US $5 M, US $3 M or US $1 M.

Compared to the implementation by developing the current conventional logic ASIC or COT IC chip, the NRE cost of developing the IAC chip for the same or similar innovation or application may be reduced by a factor of larger than 2, 5, 10, 20, or 30.

Another aspect of the disclosure provides the logic drive in a multi-chip package format may comprises a dedicated control and IAC (abbreviated as DCIAC below) chip by combining the functions of the dedicated control chip and the IAC chip, as described in the above paragraphs, in one single chip. The DCIAC chip now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc. The DCIAC chip is designed, implemented and fabricated using varieties of semiconductor technology nodes or generations, including old or matured technology nodes or generations, for example, less advanced than or equal to, or above or equal to 40 nm, 50 nm, 90 nm, 130 nm, 250 nm, 350 nm or 500 nm. Alternatively, the advanced semiconductor technology nodes or generations, such as more advanced than or equal to, or below or equal to 40 nm, 20 nm or 10 nm, may be used for the DCIAC chip. The semiconductor technology node or generation used in the DCIAC chip is 1, 2, 3, 4, 5 or greater than 5 nodes or generations older, more matured or less advanced than that used in the standard commodity FPGA IC chips packaged in the same logic drive. Transistors used in the DCIAC chip may be a FINFET, a GAAFET, a Fully Depleted Silicon-on-insulator (FDSOI) MOSFET, a Partially Depleted Silicon-on-insulator (PDSOI) MOSFET or a conventional MOSFET. Transistors used in the DCIAC chip may be different from that used in the standard commodity FPGA IC chips packaged in the same logic drive; for example, the DCIAC chip may use the conventional MOSFET, while the standard commodity FPGA IC chips packaged in the same logic drive may use the FINFET or GAAFET; or the DCIAC chip may use the Fully Depleted Silicon-on-insulator (FDSOI) MOSFET, while the standard commodity FPGA IC chips packaged in the same logic drive may use the FINFET or GAAFET. Since the DCIAC chip in this aspect of disclosure may be designed and fabricated using older or less advanced technology nodes or generations, for example, less advanced than or equal to, or above or equal to 40 nm, 50 nm, 90 nm, 130 nm, 250 nm, 350 nm, or 500 nm, its NRE cost is cheaper than or less than that of the current or conventional ASIC or COT chip designed and fabricated using an advanced IC technology node or generation, for example, more advanced than or below 30 nm, 20 nm or 10 nm. The NRE cost for designing a current or conventional ASIC or COT chip using an advanced IC technology node or generation, for example, more advanced than or below 30 nm, 20 nm or 10 nm, may be more than US $5 M, US $10 M, US $20 M or even exceeding US $50 M, or US $100 M. The cost of a photo mask set for an ASIC or COT chip at the 16 nm technology node or generation is over US $2 M, US $5 M or US $10 M. Implementing the same or similar innovation or application using the logic drive including the DCIAC chip designed and fabricated using older or less advanced technology nodes or generations, may reduce NRE cost down to less than US $10 M, US $7 M, US $5 M, US $3 M or US $1 M. Compared to the implementation by developing a logic ASIC or COT IC chip, the NRE cost of developing the DCIAC chip for the same or similar innovation or application may be reduced by a factor of larger than 2, 5, 10, 20, or 30.

Another aspect of the disclosure provides the logic drive in a multi-chip package further comprising a dedicated control, dedicated I/O, and IAC (abbreviated as DCDI/OIAC below) chip by combining the functions of the dedicated control chip, the dedicated I/O chip and the IAC chip, as described in the above paragraphs, in one single chip. The DCDI/OIAC chip comprises the control circuits, I/O circuits, Intellectual Property (IP) circuits, Application Specific (AS) circuits, analog circuits, mixed-mode signal circuits, Radio-Frequency (RF) circuits, and/or transmitter, receiver, transceiver circuits, and etc. The DCDI/OIAC chip is designed, implemented and fabricated using varieties of semiconductor technology nodes or generations, including old or matured technology nodes or generations, for example, less advanced than or equal to, or above or equal to 30 nm, 40 nm, 50 nm, 90 nm, 130 nm, 250 nm, 350 nm, or 500 nm. The semiconductor technology node or generation used in the DCDI/OIAC chip is 1, 2, 3, 4, 5 or greater than 5 nodes or generations older, more matured or less advanced than that used in the standard commodity FPGA IC chips packaged in the same logic drive. Transistors used in the DCDI/OIAC chip may be a Fully Depleted Silicon-on-insulator (FDSOI) MOSFET, a Partially Depleted Silicon-on-insulator (PDSOI) MOSFET or a conventional MOSFET. Transistors used in the DCDI/OIAC chip may be different from that used in the standard commodity FPGA IC chips packaged in the same logic drive; for example, the DCDI/OIAC chip may use the conventional MOSFET, while the standard commodity FPGA IC chips packaged in the same logic drive may use the FINFET or GAAFET; or the DCDI/OIAC chip may use the Fully Depleted Silicon-on-insulator (FDSOI) MOSFET, while the standard commodity FPGA IC chips packaged in the same logic drive may use the FINFET or GAAFET. Since the DCDI/OIAC chip in this aspect of disclosure may be designed and fabricated using older or less advanced technology nodes or generations, for example, less advanced than or equal to, or above or equal to 40 nm, 50 nm, 90 nm, 130 nm, 250 nm, 350 nm, 500 nm, its NRE cost is cheaper than or less than that of the current or conventional ASIC or COT chip designed and fabricated using an advanced IC technology node or generation, for example, more advanced than or below 30 nm, 20 nm or 10 nm. The NRE cost for designing a current or conventional ASIC or COT chip using an advanced IC technology node or generation, for example, more advanced than or below 30 nm, 20 nm or 10 nm may be more than US $5 M, US $10 M, US $20 M or even exceeding US $50 M, or US $100 M. The cost of a photo mask set for an ASIC or COT chip at the 16 nm technology node or generation is over US$2 M, US $5 M or US $10 M. Implementing the same or similar innovation or application using the logic drive including the DCDI/OIAC chip designed and fabricated using older or less advanced technology nodes or generations, may reduce NRE cost down to less than US $10 M, US $7 M, US $5 M, US $3 M or US $1 M. Compared to the implementation by developing a logic ASIC or COT IC chip, the NRE cost of developing the DCDI/OIAC chip for the same or similar innovation or application may be reduced by a factor of larger than 2, 5, 10, 20, or 30.

Another aspect of the disclosure provides a method to change the logic ASIC or COT IC chip hardware business into a mainly software business by using the logic drive. Since the performance, power consumption and engineering and manufacturing costs of the logic drive may be better or equal to the current conventional ASIC or COT IC chip for a same or similar innovation or application, the current ASIC or COT IC chip design companies or suppliers may become software developers, while only designing the IAC chip, the DCIAC chip, or the DCDI/OIAC chip, as described above, using older or less advanced semiconductor technology nodes or generations. In this aspect of disclosure, they may (1) design and own the IAC chip, the DCIAC chip, or the DCDI/OIAC chip; (2) purchase from a third party the standard commodity FPGA IC chips and standard commodity non-volatile memory chips in the bare-die or packaged format; (3) design and fabricate (may outsource the manufacturing to a third party of the manufacturing provider) the logic drive including their own IAC, DCIAC, or DCI/OIAC chip, and the purchased third party's standard commodity FPGA IC chips and standard commodity non-volatile memory chips; (3) install in-house developed software for the innovation or application in the non-volatile memory IC chip or chips in the logic drive; and/or (4) sell the program-installed logic drive to their customers. In this case, they still sell hardware without performing the expensive ASIC or COT IC chip design and production using advanced semiconductor technology nodes, for example, nodes or generations more advanced than or below 30 nm, 20 nm or 10 nm. They may write software codes to program the logic drive comprising the plural of standard commodity FPGA IC chips for their desired applications, for example, in applications of Artificial Intelligence (AI), machine learning, deep learning, big data, Internet Of Things (JOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides the logic drive in a multi-chip package comprising plural standard commodity FPGA IC chips and one or more non-volatile IC chips, further comprising a processing and/or computing IC chip, for example, a Central Processing Unit (CPU) chip, a Graphic Processing Unit (GPU) chip, a Digital Signal Processing (DSP) chip, a Tensor Processing Unit (TPU) chip, and/or an Application Processing Unit (APU) chip, designed, implemented and fabricated using an advanced semiconductor technology node or generation, for example more advanced than or equal to, or below or equal to 30 nm, 20 nm or 10 nm, which may be the same as, one generation or node less advanced than, or one generation or node more advanced than that used for the FPGA IC chips in the same logic drive. The processing and/or computing IC chip may comprise: (1) CPU and DSP unit, (2) CPU and GPU, (3) DSP and GPU or (4) CPU, GPU and DSP unit. Transistors used in the processing and/or computing IC chip may be a FIN Field-Effect-Transistor (FINFET), a Gate-All-Around Field-Effect-Transistor (GAAFET), a FINFET on Silicon-On-Insulator (FINFET SOI), a GAAFET on Silicon-On-Insulator (GAAFET SOI), a Fully Depleted Silicon-On-Insulator (FDSOI) MOSFET, a Partially Depleted Silicon-On-Insulator (PDSOI) MOSFET or a conventional MOSFET. Alternatively, a plurality of the processing and/or computing IC chips may be included, packaged, or incorporated in the logic drive. Alternatively, two processing and/or computing IC chips are included, packaged or incorporated in the logic drive, the combination for the two processing and/or computing IC chips is as below: (1) one of the two processing and/or computing IC chips may be a Central Processing Unit (CPU) chip, and the other one of the two processing and/or computing IC chips may be a Graphic Processing unit (GPU); (2) one of the two processing and/or computing IC chips may be a Central Processing Unit (CPU), and the other one of the two processing and/or computing IC chips may be a Digital Signal Processing (DSP) unit; (3) one of the two processing and/or computing IC chips may be a Central Processing Unit (CPU), and the other one of the two processing and/or computing IC chips may be a Tensor Processing Unit (TPU); (4) one of the two processing and/or computing IC chips may be a Graphic Processing Unit (GPU), and the other one of the two processing and/or computing IC chips may be a Digital Signal Processing (DSP) unit; (5) one of the two processing and/or computing IC chips may be a Graphic Processing Unit (GPU), and the other one of the two processing and/or computing IC chips may be a Tensor Processing Unit (TPU); (6) one of the two processing and/or computing IC chips may be a Digital Signal Processing (DSP) unit, and the other one of the two processing and/or computing IC chips may be a Tensor Processing Unit (TPU). Alternatively, three processing and/or computing IC chips are incorporated in the logic drive, the combination for the three processing and/or computing IC chips is as below: (1) one of the three processing and/or computing IC chips may be a Central Processing Unit (CPU), another one of the three processing and/or computing IC chips may be a graphic Processing Unit (GPU), and the other one of the three processing and/or computing IC chips may be a Digital Signal Processing (DSP) unit; (2) one of the three processing and/or computing IC chips may be a Central Processing Unit (CPU), another one of the three processing and/or computing IC chips may be a Graphic Processing Unit (GPU), and the other one of the three processing and/or computing IC chips may be a Tensor Processing Unit (TPU); (3) one of the three processing and/or computing IC chips may be a Central Processing Unit (CPU), another one of the three processing and/or computing IC chips may be a Digital Signal Processing (DSP) unit, and the other one of the three processing and/or computing IC chips may be a Tensor Processing Unit (TPU); (4) one of the three processing and/or computing IC chips may be a Graphic processing unit (GPU), another one of the three processing and/or computing IC chips may be a Digital Signal Processing (DSP) unit, and the other one of the three processing and/or computing IC chips may be a Tensor Processing Unit (TPU). Alternatively, the combination for the multiple processing and/or computing IC chips may comprise: (1) multiple GPU chips, for example 2, 3, 4 or more than 4 GPU chips, (2) one or more CPU chips and/or one or more GPU chips, (3) one or more CPU chips and/or one or more DSP chips, (3) one or more CPU chips, one or more GPU chips and/or one or more DSP chips, (4) one or more CPU chips and/or one or more TPU chips, or, (5) one or more CPU chips, one or more DSP chips and/or one or more TPU chips. In all of the above alternatives, the logic drive may comprise one or more of the processing and/or computing IC chips, and one or more high speed, high bandwidth cache SRAM chips, DRAM chips or NVM chips for high speed parallel processing and/or computing. The high speed, high bandwidth parallel wide bitwidth data buses are based on a Top Interconnection Scheme in, on or of the logic drive (abbreviated as TISD in below) to be described below. For example, the logic drive may comprise multiple GPU chips, for example 2, 3, 4 or more than 4 GPU chips, and multiple high speed, high bandwidth cache SRAM chips, DRAM chips or NVM chips. The communication between one of GPU chips and one of SRAM chips, DRAM chips or NVM chips may be using metal lines or traces of TISD, and with data bit-width of equal or greater than 64, 128, 256, 512, 1024, 2048, 4096, 8 K, or 16 K. For another example, the logic drive may comprise multiple TPU chips, for example 2, 3, 4 or more than 4 TPU chips, and multiple high speed, high bandwidth cache SRAM chips, DRAM chips or NVM chips. The communication between one of TPU chips and one of SRAM chips, DRAM chips or NVM chips may be using metal lines or traces of TISD, and with data bit-width of equal or greater than 64, 128, 256, 512, 1024, 2048, 4096, 8 K, or 16 K. For another example, the logic drive may comprise multiple FPGA IC chips, for example 2, 3, 4 or more than 4 FPGA IC chips, and multiple high speed, high bandwidth cache SRAM chips, DRAM chips or NVM chips. The communication between one of FPGA IC chips and one of SRAM chips, DRAM chips or NVM chips may be using metal lines or traces of TISD, and with data bit-width of equal or greater than 64, 128, 256, 512, 1024, 2048, 4096, 8 K, or 16 K.

The communication, connection, or coupling between (i) one of FPGA IC chips and/or processing and/or computing chips (for example, CPU, GPU, DSP, APU, TPU, and/or ASIC chips) and (ii) one of high speed, high bandwidth SRAM, DRAM or NVM chips through the TISD of the logic drive described and specified above, may be the same or similar as that between internal circuits in a same chip. Alternatively, the communication, connection, or coupling between (i) one of FPGA IC chips, and/or processing and/or computing chips (for example, CPU, GPU, DSP, APU, TPU, and/or ASIC chips) and (ii) one of high speed, high bandwidth SRAM, DRAM or NVM chips through the TISD of the logic drive described and specified above, may be using small I/O drivers and/or receivers. The driving capability, loading, output capacitance, or input capacitance of the small I/O drivers or receivers, or I/O circuits may be between 0.01 pF and 10 pF, 0.05 pF and 5 pF, 0.01 pF and 2 pF or 0.01 pF and 1 pF; or smaller than 10 pF, 5 pF, 3 pF, 2 pF, 1 pF, 0.5 pF or 0.1 pF. For example, a bi-directional (or tri-state) I/O pad or circuit may be used for the small I/O drivers or receivers, or I/O circuits for communicating between high speed, high bandwidth logic and memory chips in the logic drive, and may comprise an ESD circuit, a receiver, and a driver, and may have an input capacitance or output capacitance between 0.01 pF and 10 pF, 0.05 pF and 5 pF, 0.01 pF and 2 pF or 0.01 pF and 1 pF; or smaller than 10 pF, 5 pF, 3 pF, 2 pF, 1 pF, 0.5 pF or 0.1 pF.

The processing and/or computing IC chip or chips in the logic drive provide fixed-metal-line (non-field-programmable) interconnects for (non-field-programmable) functions, processors and operations. The standard commodity FPGA IC chips provide (1) programmable-metal-line (field-programmable) interconnects for (field-programmable) functions, processors and operations and (2) fixed-metal-line (non-field-programmable) interconnects for (non-field-programmable) functions, processors and operations. Once the programmable-metal-line interconnects in or of the FPGA IC chips are programmed, the FPGA IC chips together with the processing and/or computing IC chip or chips in the same logic drive provide powerful functions and operations in applications, for example, Artificial Intelligence (AI), machine learning, deep learning, big data, Internet Of Things (JOT), Virtual Reality (VR), Augmented Reality (AR), driverless car electronics, Graphic Processing (GP), Digital Signal Processing (DSP), Micro Controlling (MC), and/or Central Processing (CP).

Another aspect of the disclosure provides the standard commodity FPGA IC chip for use in the logic drive. The standard commodity FPGA IC chip is designed, implemented and fabricated using an advanced semiconductor technology node or generation, for example more advanced than or equal to, or below or equal to 30 nm, 20 nm or 10 nm. The standard commodity FPGA IC chips are fabricated by the process steps described in the following paragraphs:

(I) Providing a semiconductor substrate (for example, a silicon substrate), or a Silicon-On-Insulator (SOI) substrate, with the substrate in the wafer form, and with a wafer size, for example 8", 12" or 18" in the diameter. Transistors are formed in the substrate, and/or on or at the surface of the substrate by a wafer process. Transistors formed in the advanced semiconductor technology node or generation may be a FINFET, a GAAFET, a FINFET on Silicon-on-insulator (FINFET SOI), a GAAFET on Silicon-on-insulator (GAAFET SOI), a Fully Depleted Silicon-on-insulator (FD-SOI) MOSFET, a Partially Depleted Silicon-on-insulator (PDSOI) MOSFET or a conventional MOSFET.

(II) Forming a First Interconnection Scheme in, on or of the Chip (FISC) over the substrate and on or over a layer comprising transistors, by a wafer process. The FISC comprises multiple interconnection metal layers, with an inter-metal dielectric layer between each of the multiple interconnection metal layers. The FISC structure may be formed by performing a single damascene copper process and/or a double damascene copper process. As an example, the metal lines and traces of an interconnection metal layer in the multiple interconnection metal layers may be formed by the single damascene copper process as follows: (1) providing a first insulating dielectric layer (may be an inter-metal dielectric layer with the top surfaces of vias or metal pads, lines or traces exposed and formed therein). The top-most layer of the first insulting dielectric layer may be, for example, a low k dielectric layer, for an example, a SiOC layer; (2) depositing, for example, by Chemical Vapor Deposition (CVD) methods, a second insulting dielectric layer on or over the whole wafer, including on or over the first insulating dielectric layer, and on or over the exposed vias or metal pads in the first insulating dielectric layer. The second insulting dielectric layer is formed by (a) depositing a bottom differentiate etch-stop layer, for example, a Silicon Carbon Nitride layer (SiCN), on or over the top-most layer of the first insulting dielectric layer and on the exposed top surfaces of the vias or metal pads in the first insulating dielectric layer; (b) then depositing a low k dielectric layer, for example, a SiOC layer, on or over the bottom differentiate etch-stop layer. The low k dielectric material has a dielectric constant smaller than that of the $SiO_2$ material. The SiCN and SiOC layers may be deposited by CVD methods. The material used for the first and second insulating dielectric layers of the FISC comprises inorganic material, or material compounds comprising silicon, nitrogen, carbon, and/or oxygen; (3) then forming trenches or openings in the second insulting dielectric layer by (a) coating, exposing, developing a photoresist layer to form trenches or openings in the photoresist layer, and then (b) forming trenches or openings in the second insulating dielectric layer by etching methods, and then removing the photoresist layer; (4) followed by depositing an adhesion layer on or over the whole wafer including in the trenches or openings in the second insulating dielectric layer, for example, sputtering or Chemical Vapor Depositing (CVD) a titanium (Ti) or titanium nitride (TiN) layer (with thickness for example, between 1 nm and 50 nm); (5) then depositing an electroplating seed layer on or over the adhesion layer, for example, sputtering or CVD depositing a copper seed layer (with a thickness, for example, between 3 nm and 200 nm); (6) then electroplating a copper layer (with a thickness, for example, between 10 nm and 3,000 nm, 10 nm and 1,000 nm or 10 nm and 500 nm) on or over the copper seed layer; (7) then applying a Chemical-Mechanical Process (CMP) to remove the un-wanted metals (Ti or TiN)/Seed Cu/electroplated Cu) outside the trenches or openings in the second insulating dielectric layer, until the top surface of the second insulating dielectric layer is exposed. The metals left or remained in trenches or openings in or of the second insulating dielectric layer are used as metal vias, lines or traces for the interconnection metal layer of the FISC.

As another example, the metal lines and traces of an interconnection metal layer of the FISC, and the vias in an inter-metal dielectric layer of the FISC may be form by a double damascene copper process as follows: (1) providing a first insulating dielectric layer with top surfaces of metal lines or traces or metal pads (in the first insulating dielectric layer) exposed. The top-most layer of the first insulting dielectric layer may be, for example, a Silicon Carbon Nitride layer (SiCN) or Silicon Nitride (SiN) layer; (2) depositing a dielectric stack layer comprising multiple insulating dielectric layers on the top-most layer of the first insulting dielectric layer and the exposed top surfaces of metal lines and traces in the first insulating dielectric layer. The dielectric stack layer comprises, from bottom to top, (a) a bottom low k dielectric layer, for example, a SiOC layer (to be used as the via layer or the inter-metal dielectric layer), (b) a middle differentiate etch-stop layer, for example, a Silicon Carbon Nitride layer (SiCN) or Silicon Nitride layer (SiN), (c) a top low k SiOC layer (to be used as the insulating dielectrics between metal lines or traces in or of the same interconnection metal layer), and (d) a top differentiate etch-stop layer, for example, a Silicon Carbon Nitride layer (SiCN) or Silicon Nitride (SiN) layer. All insulating dielectric layers, (SiCN, SiN, SiOC) may be deposited by CVD methods; (3) forming trenches, openings or holes in the dielectric stack: (a) coating, exposing and developing a first photoresist layer to form trenches or openings in the first photoresist layer; and then (b) etching the exposed top differentiate etch-stop layer (SiCN or SiN), and the top low k SiOC layer, and stopping at the middle differentiate etch-stop layer, (SiCN or SiN), forming trenches or top openings in the top portion of the dielectric stack layer for the later double-damascene copper process to from metal lines or traces of the interconnection metal layer; (c) then coating, exposing and developing a second photoresist layer to form openings or holes in the second photoresist layer; (d) etching the exposed middle differentiate etch-stop layer (SiCN or SiN), and the bottom low k SiOC layer, and stopping at the metal lines and traces in the first insulating dielectric layer, forming bottom openings or holes in the bottom portion of the dielectric stack layer for the later double-damascene copper process to form the vias in the inter-metal dielectric layer. The trenches or top openings in the top portion of the dielectric stack layer overlap the bottom openings or holes in the bottom portion of the dielectric stack layer, and have a size larger than that of the bottom openings or holes. In other words, the bottom openings or holes in the bottom portion of the dielectric stack layer, are inside or enclosed by the trenches or top openings in the top portion of the dielectric stack layer form a top view; (4) forming metal lines or traces and vias: (a) depositing an adhesion layer on or over the whole wafer, including on or over the dielectric stack layer, and in the etched trenches or top openings in the top portion of the dielectric stack layer, and in the bottom openings or holes in the bottom portion of the dielectric stack layer. For example, sputtering or CVD depositing a titanium (Ti) or titanium nitride (TiN) layer (with a thickness, for example, between 1 nm and 50 nm), (b) then depositing an electroplating seed layer on or over the adhesion layer, for example, sputtering or CVD depositing a copper seed layer (with a thickness, for example, between 3 nm and 200 nm); (c) then electroplating a copper layer (with a thickness, for example, between 20 nm and 6,000 nm, 10 nm and 3,000 nm, or between 10 nm and 1,000 nm) on or over the copper seed layer; (d) then applying a Chemical-Mechanical Process (CMP) to remove the un-wanted metals (Ti (or TiN)/Seed Cu/electroplated Cu) outside the trenches or top openings, and the bottom openings or holes in the dielectric stack layer, until the top surface of the dielectric stack layer is exposed. The metals left or remained in the trenches or top openings are used as metal lines or traces for the interconnection metal layer, and the metals left or remained in the bottom openings or holes are used as vias in the inter-metal dielectric layer for coupling the metal lines or traces below and above the vias. In the single-damascene process, the copper electroplating process step and the CMP process step are performed for the metal lines or traces of an interconnection metal layer, and are then performed sequentially again for vias in an inter-metal dielectric layer on the interconnection metal layer. In other words, in the single damascene copper process, the copper electroplating process step and the CMP process step are performed two times for forming the metal lines or traces of an interconnection metal layer, and vias in an inter-metal dielectric layer on the interconnection metal layer. In the double-damascene process, the copper electroplating process step and the CMP process step are performed only one time for forming the metal lines or traces of an interconnection metal layer, and vias in an inter-metal dielectric layer under the interconnection metal layer. The processes for forming metal lines or traces of the interconnection metal layer and vias in the inter-metal dielectric layer using the single damascene copper process or the double damascene copper process may be repeated multiple times to form metal lines or traces of multiple interconnection metal layers and vias in inter-metal dielectric layers of the FISC. The FISC may comprise 4 to 15 layers, or 6 to 12 layers of interconnection metal layers.

The metal lines or traces in the FISC are coupled or connected to the underlying transistors. The thickness of the metal lines or traces of the FISC, either formed by the single-damascene process or by the double-damascene process, is, for example, between 3 nm and 500 nm, or between 10 nm and 1,000 nm, or, thinner than or equal to 5 nm, 10 nm, 30 nm, 50 nm, 100 nm, 200 nm, 300 nm, 500 nm, or 1,000 nm. The width of the metal lines or traces of the FISC is, for example, between 3 nm and 500 nm, or between 10 nm and 1,000 nm, or, narrower than 5 nm, 10 nm, 20 nm, 30 nm, 70 nm, 100 nm, 300 nm, 500 nm or 1,000 nm. The thickness of the inter-metal dielectric layer has a thickness, for example, between 3 nm and 500 nm, or between 10 nm and 1,000 nm, or thinner than 5 nm, 10 nm, 30 nm, 50 nm, 100 nm, 200 nm, 300 nm, 500 nm or 1,000 nm. The metal lines or traces of the FISC may be used for the programmable interconnection.

(III) Depositing a passivation layer on or over the whole wafer and on or over the FISC structure. The passivation is used for protecting the transistors and the FISC structure from water moisture or contamination from the external environment, for example, sodium mobile ions. The passivation comprises a mobile ion-catching layer or layers, for example, SiN, SiON, and/or SiCN layer or layers. The total thickness of the mobile ion catching layer or layers is thicker than or equal to 100 nm, 150 nm, 200 nm, 300 nm, 450 nm, or 500 nm. Openings in the passivation layer may be formed to expose the top surface of the top-most interconnection metal layer of the FISC, and for forming vias in the passivation openings in the following processes later.

(IV) Forming a Second Interconnection Scheme in, on or of the Chip (SISC) on or over the FISC structure. The SISC comprises multiple interconnection metal layers, with an inter-metal dielectric layer between each of the multiple interconnection metal layers, and may optionally comprise an insulating dielectric layer on or over the passivation layer, and between the bottom-most interconnection metal layer of the SISC and the passivation layer. The insulating dielectric layer is then deposited on or over the whole wafer, including passivation layer and in the passivation openings. The insulating dielectric layer may have planarization function. A polymer material may be used for the insulating dielectric layer, for example, polyimide, BenzoCycloButene (BCB), parylene, epoxy-based material or compound, photo epoxy SU-8, elastomer or silicone. The material used for the insulating dielectric layer of SISC comprises organic material, for example, a polymer, or material compounds comprising carbon. The polymer layer may be deposited by methods of spin-on coating, screen-printing, dispensing, or molding. The polymer material may be photosensitive, and may be used as photoresist as well for patterning openings in it for forming metal vias in it by following processes to be performed later; that is, the photosensitive polymer layer is coated, and exposed to light through a photomask, and then developed and etched to form openings in it. The opening in the photosensitive insulating dielectric layer overlaps the opening in the passivation layer, exposing the top surfaces of the top-most metal layer of the FISC. In some applications or designs, the size of opening in the polymer layer is larger than that of the opening in the passivation layer, and the top surface of the passivation layer is exposed in the opening of the polymer layer. The photosensitive polymer layer (the insulating dielectric layer) is then cured at a temperature, for example, equal to or higher than 100° C., 125° C., 150° C., 175° C., 200° C., 225° C., 250° C., 275° C. or 300° C. A copper emboss process is then performed on or over the cured polymer layer and on or over the exposed top surfaces of the top-most interconnection metal layer of the FISC in openings in the cured polymer layer, or, on or over the exposed surface of the passivation layer in the openings of the cured polymer layer for some cases: (a) first depositing the whole wafer an adhesion layer on or over the cured polymer layer and on or over the exposed top surfaces of the top-most interconnection metal layer of the FISC in openings in the cured polymer layer, or, on or over the exposed surface of the passivation layer in the openings of the cured polymer layer for some cases, for example, sputtering or CVD depositing a titanium (Ti) or titanium nitride (TiN) layer (with a thickness, for example, between 1 nm and 50 nm); (b) then depositing an electroplating seed layer on or over the adhesion layer, for example, sputtering or CVD depositing a copper seed layer (with a thickness, for example, between 3 nm and 200 nm); (c) coating, exposing and developing a photoresist layer on or over the copper seed layer; forming trenches or openings in the photoresist layer for forming metal lines or traces of the interconnection metal layer of SISC by following processes to be performed later, wherein portion of the trench (opening) in the photoresist layer may overlap the whole area of opening in the cured polymer layer for forming vias in the openings of the cured polymer layer by following processes to be performed later; exposing the copper seed layer at the bottom of the trenches or openings; (d) then electroplating a copper layer (with a thickness, for example, between 0.3 μm and 20 μm, 0.5 μm and 5 μm, 1 μm and 10 μm, or 2 μm and 10 μm) on or over the copper seed layer at the bottom of the patterned trenches or openings in the photoresist layer; (e)

removing the remained photoresist; (f) removing or etching the copper seed layer and the adhesion layer not under the electroplated copper. The emboss metals (Ti (or TiN)/seed Cu/electroplated Cu) left or remained in the openings of the cured polymer layer are used for vias in the insulating dielectric layer and vias in the passivation layer; and the emboss metals (Ti (or TiN)/seed Cu/electroplated Cu) left or remained in the locations of trenches or openings in the photoresist, (noted: the photoresist is removed after copper electroplating) are used for the metal lines or traces of the interconnection metal layer. The processes of forming the insulating dielectric layer and openings in it, and the emboss copper processes for forming the vias in the insulting dielectric layer and the metal lines or traces of the interconnection metal layer, may be repeated to form multiple interconnection metal layers in or of the SISC; wherein the insulating dielectric layer is used as the inter-metal dielectric layer between two interconnection metal layers of the SISC, and the vias in the insulating dielectric layer (now in the inter-metal dielectric layer) are used for connecting or coupling metal lines or traces of the two interconnection metal layers. The top-most interconnection metal layer of the SISC is covered with a top-most insulating dielectric layer of SISC. The top-most insulating dielectric layer has openings in it to expose top surface of the top-most interconnection metal layer. The SISC may comprise 2 to 6, or 3 to 5 layers of interconnection metal layers. The metal lines or traces of the interconnection metal layers of the SISC have the adhesion layer (Ti or TiN, for example) and the copper seed layer only at the bottom, but not at the sidewalls of the metal lines or traces. The metal lines or traces of the interconnection metal layers of FISC have the adhesion layer (Ti or TiN, for example) and the copper seed layer at both the bottom and the sidewalls of the metal lines or traces.

The SISC interconnection metal lines or traces are coupled or connected to the FSIC interconnection metal lines or traces, or to transistors in the chip, through vias in openings of the passivation layer. The thickness of the metal lines or traces of SISC is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISC is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISC may be used for the programmable interconnection.

(V) Forming micro copper pillars or bumps (i) on the top surface of the top-most interconnection metal layer of SISC, exposed in openings in the insulating dielectric layer of the SISC, and/or (ii) on or over the top-most insulating dielectric layer of the SISC. An emboss copper process, as described in above paragraphs, is performed to form the micro copper pillars or bumps as follows: (a) depositing whole wafer an adhesion layer on or over the top-most dielectric layer of the SISC structure, and in the openings of the top-most insulating dielectric layer, for example, sputtering or CVD depositing a titanium (Ti) or titanium nitride (TiN) layer (with thickness for example, between 1 nm and 50 nm); (b) then depositing an electroplating seed layer on or over the adhesion layer, for example, sputtering or CVD depositing a copper seed layer (with a thickness between, for example, 3 nm and 300 nm, or 3 nm and 200 nm); (c) coating, exposing and developing a photoresist layer; forming openings or holes in the photoresist layer for forming the micro pillars or bumps in later processes, exposing (i) a top surface of the top-most interconnection metal layer at the bottom of the openings in the top-most insulating layer of the SISC, and (ii) exposing an area or a ring of the top-most insulating dielectric layer (of the SISC) around the opening in the top-most insulating dielectric layer; (d) then electroplating a copper layer (with a thickness, for example, between 3 μm and 60 μm, 5 μm and 50 μm, 5 μm and 40 μm, 5 μm and 30 μm, 5 μm and 20 μm, or 5 μm and 15 μm) on or over the copper seed layer in the patterned openings or holes in the photoresist layer; (e) removing the remained photoresist; (f) removing or etching the copper seed layer and the adhesion layer not under the electroplated copper. The metals left or remained are used as the micro copper pillars or bumps.

The copper micro pillars or bumps are coupled or connected to the SISC and FISC interconnection metal lines or traces, and to transistors in or of the chip, through vias in openings in the top-most insulating dielectric layer of the SISC. The height of the micro pillars or bumps is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The largest dimension in a cross-section of the micro pillars or bumps (for example, the diameter of a circle shape, or the diagonal length of a square or rectangle shape) is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm. The space between a micro pillar or bump to its nearest neighboring pillar or bump is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

(VI) Cutting or dicing the wafer to obtain separated standard commodity FPGA IC chips. The standard commodity FPGA IC chips comprise, from bottom to top: (i) a layer comprising transistors, (ii) the FISC, (iii) a passivation layer, (iv) the SISC and (v) micro copper pillars or bumps, above a level of the top surface of the top-most insulating dielectric layer of the SISC by a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm.

Another aspect of the disclosure provides a Fan-Out Interconnection Technology (FOIT) for making or fabricating the logic drive based on a multi-chip packaging technology and process. The process steps are described as below:

(I) Providing a chip carrier, holder, molder or substrate, and IC chips or packages; then placing, fixing or attaching the IC chips or packages to and on the carrier, holder or substrate. The carrier, holder, molder or substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the chip carrier, holder, molder or substrate may be silicon, metal, ceramics, glass, steel, plastics, polymer, epoxy-based polymer, or epoxy-based compound. The IC chips or packages to be placed, fixed or attached to the carrier, holder, molder or substrate include the chips or packages mentioned, described and specified above: the standard commodity FPGA IC chips, the non-volatile chips or packages, the dedicated control chip, the dedicated I/O chip, the dedicated control and I/O chip, IAC, DCIAC, and/or DCDI/OIAC chip. All chips to be packaged in the logic drives comprise micro copper pillars or bumps on the top surface of the chips. The top surfaces of micro copper pillars or bumps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The chips are placed, held, fixed or attached on or to the carrier, holder, molder or substrate with the side or surface of the chip with transistors faced up. The backside of the silicon substrate of the chips (the side or surface without transistors) is faced down and is placed, fixed, held or attached on or to the carrier, holder, molder or substrate.

(II) Applying a material, resin, or compound to fill the gaps between chips and cover the surfaces of chips by methods, for example, spin-on coating, screen-printing, dispensing or molding in the wafer or panel format. The molding method includes the compress molding (using top and bottom pieces of molds) or the casting molding (using a dispenser). The material, resin, or compound used may be a polymer material includes, for example, polyimide, BenzoCycloButene (BCB), parylene, epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan. The material, resin or compound is applied (by coating, printing, dispensing or molding) on or over the carrier, holder, molder or substrate and on or over the chips to a level to: (i) fill gaps between chips, (ii) cover the top-most surface of the chips, (iii) fill gaps between micro copper pillars or bumps on or of the chips, (iv) cover top surfaces of the micro copper pillars or bumps on or of the chips. The material, resin or compound may be cured or cross-linked by raising a temperature to a certain temperature degree, for example, equal to or higher than or equal to 50° C., 70° C., 90° C., 100° C., 125° C., 150° C., 175° C., 200° C., 225° C., 250° C., 275° C. or 300° C. The material may be polymer or molding compound. Applying a CMP process to planarize the surface of the applied material, resin or compound to a level where the top surfaces of all micro bumps or pillars on or of the chips are fully exposed. The chip carrier, holder, molder or substrate may be then (i) removed after the CMP process, and before forming the Top Interconnection Scheme in, on or of the logic drive (TISD) to be described below; (ii) kept during the following fabrication process steps to be performed later, and removed after all fabrication process steps for making or fabricating the logic drive at the wafer or panel format are finished; or (iii) kept as part of the separated finished final logic drive product. A process, for example, a CMP process, a polishing process, or a wafer backside grinding process, may be performed for removing the chip carrier, holder, molder or substrate. Alternatively, a wafer or panel thinning process, for example, a CMP process, a polishing process or a wafer backside grinding process, may be performed to remove portion of the wafer or panel to make the wafer or panel thinner, in a wafer or panel process, after the wafer or panel process steps are all finished, and before the wafer or panel is separated, cut or diced into individual unit of the logic drive.

(III) Forming the Top Interconnection Scheme in, on or of the logic drive (TISD) on or over the planarized material, resin or compound and on or over the exposed top surfaces of the micro pillars or bumps by a wafer or panel processing. The TISD comprises multiple metal layers, with inter-metal dielectric layers between each of the multiple metal layers, and may, optionally, comprise an insulating dielectric layer on the planarized material, resin or compound layer, and between the bottom-most interconnection metal layer of the TISD and the planarized material, resin or compound layer. The metal lines or traces of the interconnection metal layers of the TISD are over the chips and extend horizontally across the edges of the chips, in other words, the metal lines or traces are running through gaps between chips of the logic drive. The metal lines or traces of the interconnection metal layers of the TISD are connecting or coupling circuits of two or more chips of the logic drive. The TISD is formed as follows: an insulating dielectric layer of the TISD is then deposited on or over the whole wafer, including the planarized material, resin or compound layer and the exposed top surfaces of the micro copper pillars or bumps. The insulating dielectric layer may have planarization function. A polymer material may be used for the insulating dielectric layer of the TISD, for example, polyimide, BenzoCycloButene (BCB), parylene, epoxy-based material or compound, photo epoxy SU-8, elastomer, or silicone. The material used for the insulating dielectric layer of the TISD comprises organic material, for example, a polymer, or material compounds comprising carbon. The polymer layer may be deposited by methods of spin-on coating, screen-printing, dispensing, or molding. The polymer material may be photosensitive, and may be used as photoresist as well for patterning openings in it for forming metal vias in it by following processes to be performed later; that is the photosensitive polymer layer is coated, and exposed to light through a photomask, and then developed and etched to form openings in it. The opening in the photosensitive insulating dielectric layer overlaps the exposed top surface of the micro copper pillar or bump, exposing the top surfaces of the micro copper pillars or bumps on or of the chips of the logic drive. In some applications or designs, the size of opening in the polymer layer is smaller than that of the top surface of the micro copper or bump. In other applications or designs, the size of opening in the polymer layer is larger than that of the top surface of the micro copper pillar or bump, and the top surface of the planarized material, resin or compound layer is exposed in the opening of the polymer layer. The photosensitive polymer layer (the insulating dielectric layer) is then cured at a temperature, for example, equal to or higher than 100° C., 125° C., 150° C., 175° C., 200° C., 225° C., 250° C., 275° C. or 300° C. A copper emboss process is then performed on or over the insulating dielectric layer of the TISD and on or over the exposed top surfaces of the micro copper pillars or bumps in openings in the cured polymer layer, and, for some cases, on or over the exposed surface of the planarized material, resin or compound layer in the openings of the cured polymer layer: (a) first depositing the whole wafer an adhesion layer on or over the cured polymer layer and on or over the exposed top surfaces of the micro copper pillars or bumps in openings in the cured polymer layer, and, in some cases, on or over the exposed planarized material, resin or compound layer in the openings of the cured polymer layer, for example, sputtering or CVD depositing a titanium (Ti) or titanium nitride (TiN) layer (with a thickness, for example, between 1 nm and 50 nm); (b) then depositing an electroplating seed layer on or over the adhesion layer, for example, sputtering or CVD depositing a copper seed layer (with a thickness, for example, between 3 nm and 400 nm, or 3 nm and 200 nm); (c) coating, exposing and developing a photoresist layer on or over the copper seed layer; forming trenches or openings in the photoresist layer for forming metal lines or traces of the interconnection metal layer of the TISD by following processes to be performed later, wherein portion of the trench (opening) in the photoresist layer may overlap the whole area of opening in the cured polymer layer for forming vias in the openings of the cured polymer layer by following processes to be performed later, exposing the copper seed layer at the bottom of the trenches or openings; (d) then electroplating a copper layer (with a thickness, for example, between 0.3 μm and 20 μm, 0.5 μm and 5 μm, 1 μm and 10 μm, or 2 μm and 10 μm) on or over the copper seed layer at the bottom of the patterned trenches or openings in the photoresist layer; (e) removing the remained photoresist; (f) removing or etching the copper seed layer and the adhesion layer not under the electroplated copper. The emboss metals (Ti (or TiN)/seed Cu/electroplated Cu) left or remained in the openings of the cured polymer layer are used for vias in the insulating dielectric layer; and the emboss metals (Ti (or TiN)/seed Cu/electroplated Cu) left or remained in the locations of trenches or openings in the photoresist, (noted: the photoresist is removed after copper electroplating) are used for the metal lines or traces of the interconnection metal layer of the TISD. The processes of forming the insulating dielectric layer and openings in it; and the emboss copper processes for forming the vias in the insulting dielectric layer and the metal lines or traces of the interconnection metal layer, may be repeated to form multiple interconnection metal layers in or of the TISD; wherein the insulating dielectric layer is deposited on or over and between the interconnection metal lines or traces in the interconnection metal layer, wherein the top portion of the insulating dielectric layer is used as the inter-metal dielectric layer between two interconnection metal layers of the TISD, and the vias in the top portion of the insulating dielectric layer (now in the inter-metal dielectric layer) are used for connecting or coupling metal lines or traces of the two interconnection metal layers of the TISD. The bottom portion of insulating dielectric layer is used as the dielectric layer between interconnection metal lines or traces in the same interconnection metal layer of the TISD, that is, the interconnection metal lines or traces are in the bottom portion of insulating dielectric layer. The top-most interconnection metal layer of the TISD is covered with a top-most insulating dielectric layer of the TISD. The top-most insulating dielectric layer has openings in it to expose top surface of the top-most interconnection metal layer. The TISD may comprise 2 to 6 layers, or 3 to 5 layers of interconnection metal layers. The interconnection metal lines or traces of the TISD have the adhesion layer (Ti or TiN, for example) and the copper seed layer only at the bottom, but not at the sidewalls of the metal lines or traces. The interconnection metal lines or traces of FISC have the adhesion layer (Ti or TiN, for example) and the copper seed layer at both the bottom and the sidewalls of the metal lines or traces.

The TISD interconnection metal lines or traces are coupled or connected to the SISC interconnection metal lines or traces, the FISC interconnection metal lines or traces, and/or transistors on, in or of the chips of the logic drive, through the micro bumps or pillars on or of the chips. The chips are surrounded by the material, resin, or compound filled in the gaps between chips, and the chips are also covered by the material, resin, or compound on the surfaces of the chips. The thickness of the metal lines or traces of the TISD is between, for example, 0.3 μm and 30 μm, 0.5 μm and 20 μm, 1 μm and 10 μm, or 0.5 μm to 5 μm, or thicker than or equal to 0.3 μm, 0.5 μm, 0.7 μm, 1 μm, 1.5 μm, 2 μm, 3 μm or 5 μm. The width of the metal lines or traces of the TISD is between, for example, 0.3 μm and 30 μm, 0.5 μm and 20 μm, 1 μm and 10 μm, or 0.5 μm to 5 μm, or wider than or equal to 0.3 μm, 0.5 μm, 0.7 μm, 1 μm, 1.5 μm, 2 μm, 3 μm or 5 μm. The thickness of the inter-metal dielectric layer of the TISD is between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The metal lines or traces of interconnection metal layers of the TISD may be used for the programmable interconnection.

(IV) Forming copper pillars or bumps on or over the top-most insulating dielectric layer of the TISD, and the exposed top surfaces of the top-most interconnection metal layer of the TISD in openings of the top-most insulating dielectric layer of the TISD, by performing an emboss copper process, as described above, in the following process steps: (a) depositing whole wafer or panel an adhesion layer on or over the top-most insulating dielectric layer of the TISD, and the exposed top surfaces of the top-most interconnection metal layer of the TISD in openings of the top-most insulating dielectric layer of the TISD, for example, sputtering or CVD depositing a titanium (Ti) or titanium nitride (TiN) layer (with a thickness, for example, between 1 nm and 200 nm, or 5 nm and 50 nm); (b) then depositing an electroplating seed layer on or over the adhesion layer, for example, sputtering or CVD depositing a copper seed layer (with a thickness, for example, between 3 nm and 400 nm or 10 nm and 200 nm); (c) patterning openings or holes in a photoresist layer for the copper pillars or bumps by coating, exposing and developing the photoresist layer, exposing the copper seed layer at the bottom of the openings in the photoresist layer. The opening in the photoresist layer overlaps the opening in the top-most insulating dielectric layer of the TISD; and may extend out of the opening in the top-most insulating dielectric layer, to an area or a ring of the top-most insulating dielectric layer of the TISD around the opening in the top-most insulating dielectric layer of the TISD; (d) then electroplating a copper layer (with a thickness, for example, between 5 μm and 120 μm, 10 μm and 100 μm, 10 μm and 60 μm, 10 μm and 40 μm, or 10 μm and 30 μm) on or over the copper seed layer in the patterned openings in the photoresist layer; (e) removing the remained photoresist; (f) removing or etching the copper seed layer and the adhesion layer not under the electroplated copper. The metals left or remained are used as the copper pillars or bumps. The copper pillars or bumps are used for connecting or coupling the chips, for example the dedicated I/O chip, of the logic drive to the external circuits or components external or outside of the logic drive. The height of the copper pillars or bumps is, for example, between 5 μm and 120 μm, 10 μm and 100 μm, 10 μm and 60 μm, 10 μm and 40 μm, or 10 μm and 30 μm, or greater or taller than or equal to 50 μm, 30 μm, 20 μm, 15 μm, or 5 μm. The largest dimension in a cross-section of the copper pillars or bumps (for example, the diameter of a circle shape or the diagonal length of a square or rectangle shape) is, for example, between 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm, or 10 μm. The smallest space between a copper pillar or bump and its nearest neighboring copper pillar or bump is, for example, between 5 μm and 120 μm, 10 jam and 100 μm, 10 μm and 60 μm, 10 μm and 40 μm, or 10 μm and 30 μm;

or greater than or equal to 60 μm, 50 μm, 40 μm, 30 μm, 20 μm, 15 μm or 10 μm. The copper bumps or pillars may be used for flip-package assembling the logic drive on or to a substrate, film or board, similar to the flip-chip assembly of the chip packaging technology, or similar to the Chip-On-Film (COF) assembly technology used in the LCD driver packaging technology. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The substrate, film or board may comprise metal bonding pads or bumps at its surface; and the metal bonding pads or bumps may have a layer of solder on their top surface for use in the solder reflow or thermal compressing bonding process for bonding to the copper pillars or bumps on or of the logic drive package. The copper pillars or bumps may be located at the front surface of the logic drive package with a layout of Bump or Pillar Grid-Array, with the pillars or bumps at the peripheral area used for the signal I/Os, and the pillars or bumps at or near the central area used for the Power/Ground (P/G) I/Os. The signal pillars or bumps at the peripheral area may form 1 ring, or 2, 3, 4, 5, or 6 rings along the edges of the logic drive package. The pitches of the signal I/Os at the peripheral area may be smaller than that of the P/G I/Os at or near the central area of the logic drive package.

Alternatively, solder bumps may be formed on or over the top-most insulating dielectric layer of the TISD, and the exposed top surfaces of the top-most interconnection metal layer of the TISD in openings of the top-most insulating dielectric layer of the TISD, by performing an emboss copper/solder process in the following process steps: (a) depositing whole wafer or panel an adhesion layer on or over the top-most insulating dielectric layer of the TISD, and the exposed top surfaces of the top-most interconnection metal layer of the TISD in openings of the top-most insulating dielectric layer of the TISD, for example, sputtering or CVD depositing a titanium (Ti) or titanium nitride (TiN) layer (with a thickness, for example, between 1 nm and 200 nm, or 5 nm and 50 nm); (b) then depositing an electroplating seed layer on or over the adhesion layer, for example, sputtering or CVD depositing a copper seed layer (with a thickness, for example, between 3 nm and 400 nm, or 10 nm and 200 nm); (c) patterning openings or holes in a photoresist layer for forming the solder bumps later, by coating, exposing and developing the photoresist layer, exposing the copper seed layer at the bottom of the openings in the photoresist layer. The opening in the photoresist layer overlaps the opening in the top-most insulating dielectric layer of the TISD; and may extend out of the opening of the top-most insulating dielectric layer, to an area or a ring of the top-most insulating dielectric layer of the TISD around the opening in the top-most insulating dielectric layer of the TISD; (d) then electroplating a copper barrier layer (with a thickness, for example, between 1 μm and 50 μm, 1 μm and 40 μm, 1 μm and 30 μm, 1 μm and 20 μm, 1 μm and 10 μm, 1 μm and 5 μm, or 1 μm and 3 μm) on or over the copper seed layer in the openings of the photoresist layer; (e) then electroplating a solder layer (with a thickness, for example, between 1 μm and 150 μm, 1 μm and 120 μm, 5 μm and 120 μm, 5 μm and 100 μm, 5 μm and 75 μm, 5 μm and 50 μm, 5 μm and 40 μm, 5 μm and 30 μm, 5 μm and 20 μm, 5 μm and 10 μm, 1 μm and 5 μm, or 1 μm and 3 μm) on or over the electroplated copper barrier layer in the openings of the photoresist; (f) removing the remained photoresist; (g) removing or etching the copper seed layer and the adhesion layer not under the electroplated copper barrier layer and the electroplated solder layer; (h) reflowing solder to form the solder bumps. The metals (Ti (or TiN)/seed Cu/barrier Cu/solder) left or remained and solder-reflowed are used as the solder bumps. The solder material used may be a lead-free solder. Lead-free solders in commercial use may contain tin, copper, silver, bismuth, indium, zinc, antimony, and traces of other metals. For example, the lead-free solder may be Sn—Ag—Cu (SAC) solder, Sn—Ag solder, or Sn—Ag—Cu—Zn solder. The solder bumps are used for connecting or coupling the chips, for example, the dedicated I/O chip, of the logic drive to the external circuits or components external or outside of the logic drive. The height of the solder bumps is, for example, between 5 μm and 150 μm, 5 μm and 120 μm, 10 μm and 100 μm, 10 μm and 60 μm, 10 μm and 40 μm, or 10 μm and 30 μm, or greater or taller than or equal to 75 μm, 50 μm, 30 μm, 20 μm, 15 μm, or 10 μm. The solder bump height is measured from the level of the surface of the top-most insulating dielectric layer of TISD to the level of the top surface of the solder bump. The largest dimension in cross-sections of the solder bumps (for example, the diameter of a circle shape or the diagonal length of a square or rectangle shape) is, for example, between 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 100 μm, 60 μm, 50 μm, 40 μm, 30 μm, 20 μm, 15 μm, or 10 μm. The smallest space between a solder bump and its nearest neighboring solder bump is, for example, between 5 μm and 150 μm, 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm. The solder bumps may be used for flip-package assembling the logic drive on or to the substrate, film or board, similar to the flip-chip assembly of the chip packaging technology, or the Chip-On-Film (COF) assembly technology used in the LCD driver packaging technology. The solder bump assembly process may comprise a solder flow or reflow process using solder flux or without using solder flux. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes. The solder bumps may be located at the front surface of the logic drive package with a layout in a Ball-Grid-Array (BGA) with the bumps at the peripheral area used for the signal I/Os, and the bumps at or near the central area used for the Power/Ground (P/G) I/Os. The signal bumps at the peripheral area may form ring or rings at the peripheral area near the edges of the logic drive package, with 1 ring, or 2, 3, 4, 5, 6 rings. The pitches of the signal I/Os at the peripheral area may be smaller than that of the P/G I/Os at or near the central area of the logic drive package.

Alternatively, gold bumps may be formed on or over the top-most insulating dielectric layer of the TISD, and the exposed top surfaces of the top-most interconnection metal layer of the TISD in openings of the top-most insulating dielectric layer of the TISD, by performing an emboss gold process, in the following process steps: (a) depositing whole wafer or panel an adhesion layer on or over the top-most insulating dielectric layer of the TISD, and the exposed top surfaces of the top-most interconnection metal layer of the TISD in openings of the top-most insulating dielectric layer of the TISD, for example, sputtering or CVD depositing a titanium (Ti) or titanium nitride (TiN) layer (with a thickness, for example, between 1 nm and 200 nm, or 5 nm and 50 nm); (b) then depositing an electroplating seed layer on or over the adhesion layer, for example, sputtering or CVD depositing a gold seed layer (with a thickness, for example, between 1 nm and 300 nm, or 1 nm and 50 nm); (c) patterning openings or holes in a photoresist layer for forming gold bumps in later processes, by coating, exposing and developing the photoresist layer, exposing the gold seed layer at the bottom of the openings in the photoresist layer. The opening in the photoresist layer overlaps the opening in the top-most insulating dielectric layer of the TISD, and may extend out of the opening in the top-most insulating dielectric layer, to an area or a ring of the top-most insulating dielectric layer of the TISD around the opening in the top-most insulating dielectric layer of the TISD; (d) then electroplating a gold layer (with a thickness, for example, between 3 μm and 40 μm, 3 μm and 30 μm, 3 μm and 20 μm, 3 μm and 15 μm, or 3 μm and 10 μm) on or over the gold seed layer in the patterned openings of the photoresist layer; (f) removing the remained photoresist; (g) removing or etching the gold seed layer and the adhesion layer not under the electroplated gold layer. The metals (Ti (or TiN)/seed Au/Electroplated Au) left or remained are used as the gold bumps. The gold bumps are used for connecting or coupling the chips, for example, the dedicated I/O chip, of the logic drive to the external circuits or components external or outside of the logic drive. The height of the gold bumps is, for example, between 3 μm and 40 μm, 3 μm and 30 μm, 3 μm and 20 μm, 3 μm and 15 μm, or 3 μm and 10 μm, or smaller or shorter than or equal to 40 μm, 30 μm, 20 μm, 15 μm, or 10 μm. The largest dimension in cross-sections of the gold bumps (for example, the diameter of a circle shape or the diagonal length of a square or rectangle shape) is, for example, between 3 μm and 40 μm, 3 μm and 30 μm, 3 μm and 20 μm, 3 μm and 15 μm, or 3 μm and 10 μm, or smaller than or equal to 30 μm, 20 μm, 15 μm, or 10 μm. The smallest space between a gold bump and its nearest neighboring gold bump is, for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 μm. The gold bumps may be used for flip-package assembling the logic drive on or to the substrate, film or board, similar to the flip-chip assembly of the chip packaging technology, or similar to the Chip-On-Film (COF) assembly technology used in the LCD driver packaging technology. The substrate, film or board used may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film or tape with interconnection schemes. When the gold bumps are used for the COF technology, the gold bumps are thermal compress bonded to a flexible circuit film or tape. The COF assembly using gold bumps may provide very high I/Os in a small area. The current COF assembly technology using gold bumps may provide gold bumps with pitches smaller than 20 The number of I/Os or gold bumps used for signal inputs or outputs at the peripheral area along 4 edges of a logic drive package, for example, for a square shaped logic drive package with 10 mm width and having two rings (or two rows) along the 4 edges, may be, for example, greater or equal to 5,000 (with 15 μm gold bump pitch), 4,000 (with 20 μm gold bump pitch), or 2,500 (with 15 μm gold bump pitch). The reason that 2 rings or rows are designed along the edges is for the easy fan-out from the logic drive package when a single-layer film with one-sided metal lines or traces is used. The metal pads on the flexible circuit film or tape have a gold layer or a solder layer at the top-most surfaces of the metal pads. The gold-to-gold thermal compressing bonding method is used for the COF assembly technology when the metal pad on the flexible circuit film or tape has a gold layer at its top surface; while the gold-to-solder thermal compressing bonding method is used for the COF assembly technology when the metal pad on the flexible circuit film or tape has a solder layer at its top surface. The gold bumps may be located at the front surface of the logic drive package with a layout in a Ball-Grid-Array (BGA), having the gold bumps at the peripheral area used for the signal I/Os, and the gold bumps at or near the central area used for the Power/Ground (P/G) I/Os. The signal bumps at the peripheral area may form ring or rings along the edges of the logic drive package, with 1 ring, or 2, 3, 4, 5, 6 rings. The pitches of the signal I/Os in the peripheral area may be smaller than that of the P/G I/Os at or near the central area of the logic drive package.

The TISD interconnection metal lines or traces of the single-layer-packaged logic drive may: (a) comprise an interconnection net or scheme of metal lines or traces in or of the TISD of the (this) single-layer-packaged logic drive for connecting or coupling the transistors, the FISC, the SISC and/or the micro copper pillars or bumps of an FPGA IC chip of the (this) single-layer-packaged logic drive to the transistors, the FISC, the SISC and/or the micro copper pillars or bumps of another FPGA IC chip packaged in the (this) same single-layer-packaged logic drive. This interconnection net or scheme of metal lines or traces in or of the TISD may be connected to the circuits or components outside or external to the (this) single-layer-packaged logic drive through metal pillars or bumps (copper pillars or bumps, solder bumps, or gold bumps on the TISD). This interconnection net or scheme of metal lines or traces in or of the TISD may be a net or scheme for the power or ground supply; (b) comprise an interconnection net or scheme of metal lines or traces in or of the TISD of the (this) single-layer-packaged logic drive connecting to multiple micro copper pillars or bumps of an IC chip in or of the (this) single-layer-packaged logic drive. This interconnection net or scheme of metal lines or traces in or of the TISD may be connected to the circuits or components outside or external to the (this) single-layer-packaged logic drive through metal pillars or bumps (copper pillars or bumps, solder bumps, or gold bumps on the TISD). This interconnection net or scheme of metal lines or traces in or of the TISD may be a net or scheme for the power or ground supply; (c) comprise interconnection metal lines or traces in or of the TISD of the (this) single-layer-packaged logic drive for connecting or coupling to the circuits or components outside or external to the (this) single-layer-packaged logic drive, through the metal bumps or pillars (copper pillars or bumps solder bumps, or gold bumps on the TISD) of the single-layer-packaged logic drive. The interconnection metal lines or traces in or of the TISD may be used for signals, power or ground supplies. In this case, for example, the metal pillars or bumps may be connected to the I/O circuits of, for example, the dedicated I/O chip of the (this) single-layer-packaged logic drive. The I/O circuits in this case may be a large I/O circuit, for example, a bi-directional (or tri-state) I/O pad or circuit, comprising an ESD circuit, a receiver, and a driver, and may have an input capacitance or output capacitance between 2 pF and 100 pF, 2 pF and 50 pF, 2 pF and 30 pF, 2 pF and 20 pF, 2 pF and 15 pF, 2 pF and 10 pF, or 2 pF and 5 pF; or larger than 2 pF, 5 pF, 10 pF, 15 pF or 20 pF; (d) comprise an interconnection net or scheme of metal lines or traces in or of the TISD of the (this) single-layer-packaged logic drive used for connecting the transistors, the FISC, the SISC and/or the micro copper pillars or bumps of an FPGA IC chip of the (this) single-layer-packaged logic drive to the transistors, the FISC, the SISC and/or the micro copper pillars or bumps of another FPGA IC chip packaged in the (this) same single-layer-packaged logic drive; but not connected to the circuits or components outside or external to the (this) single-layer-packaged logic drive. That is, no metal pillars or bumps (copper pillars or bumps solder bumps, or gold bumps) of the single-layer-packaged logic drive is connected to the interconnection net or scheme of metal lines or traces in or of the TISD. In this case, the interconnection net or scheme of metal lines or traces in or of the TISD may be connected or coupled to the I/O circuits of the FPGA IC chips packaged in the (this) single-layer-packaged logic drive. The I/O circuit in this case may be a small I/O circuit, for example, a bi-directional (or tri-state) I/O pad or circuit, comprising an ESD circuit, a receiver, and/or a driver, and may have an input capacitance or output capacitance between 0.1 pF and 10 pF, 0.1 pF and 5 pF or 0.1 pF and 2 pF; or smaller than 10 pF, 5 pF, 3 pF, 2 pF or 1 pF; (e) comprise an interconnection net or scheme of metal lines or traces in or of the TISD of the (this) single-layer-packaged logic drive used for connecting or coupling to multiple micro copper pillars or bumps of a IC chip in or of the (this) single-layer-packaged logic drive; but not connecting to the circuits or components outside or external to the (this) single-layer-packaged logic drive. That is, no metal pillars or bumps (copper pillars or bumps solder bumps, or gold bumps) of the (this) single-layer-packaged logic drive is connected to the interconnection net or scheme of metal lines or traces in or of the TISD. In this case, the interconnection net or scheme of metal lines or traces in or of the TISD may be connected or coupled to the transistors, the FISC, the SISC and/or the micro copper pillars or bumps of the FPGA IC chip of the (this) single-layer-packaged logic drive, without going through any I/O circuit of the FPGA IC chip.

(V) Separating, cutting or dicing the finished wafer or panel, including separating, cutting or dicing through materials or structures between two neighboring logic drives. The material (for example, polymer) filling gaps between chips of two neighboring logic drives is separated, cut or diced to form individual unit of logic drives.

The above FOIT with TISD is formed by having the chips faced up (the front side with transistors of the chips are facing up), while applying a material, resin, or compound to fill the gaps between chips and cover the surfaces of chips. Alternatively, the FOIT with TISD may be formed by having the chips faced down while applying a material, resin, or compound to fill the gaps between chips and cover the surfaces of chips. In the step (I) of forming the FOIT with TISD above, the chips are placed, held, fixed or attached on or to the carrier, holder, molder or substrate with the side or surface of the chip with transistors faced down. Then, applying a material, resin, or compound to fill the gaps between chips and cover the surfaces of chips, as in the step (II) above. The carrier, holder, molder or substrate is then removed to expose the top surfaces (front surfaces with transistors) of the chip (the top surfaces of micro metal pads, pillars or bumps of the IC chips are exposed). The TISD is then formed on or over the top surfaces of the chips and on or over the exposed top surfaces of the micro metal pads, pillars or bumps by a wafer or panel processing. The TISD are the same as described and specified above.

Another aspect of the disclosure provides the logic drive comprising plural single-layer-packaged logic drives; and each of single-layer-packaged logic drives in a multiple-chip package is as described and specified above. The multiple single-layer-packaged logic drive, for example, comprising 2, 3, 4, 5, 6, 7, 8 or greater than 8 single-layer-packaged logic drives, may be, for example, (1) flip-package assembled on a printed circuit board (PCB), high-density fine-line PCB, Ball-Grid-Array (BGA) substrate, or flexible circuit film or tape; or (2) stack assembled using the Package-on-Package (POP) assembling technology; that is assembling one single-layer-packaged logic drive on top of the other single-layer-packaged logic drive. The POP assembling technology may apply, for example, the Surface Mount Technology (SMT).

Another aspect of the disclosure provides a method for a single-layer-packaged logic drive suitable for the stacked POP assembling technology. The single-layer-packaged logic drive for use in the POP package assembling is fabricated as the same as the process steps and specifications of the FOIT described in the above paragraphs, except for forming Through-Package-Vias, or Through Polymer Vias (TPVs) in the gaps between chips in or of the logic drive, and/or in the peripheral area of the logic drive package and outside the edges of chips in or of the logic drive. The TPVs are used for connecting or coupling circuits or components at the topside of the logic drive to that at the backside of the logic drive package. The single-layer-packaged logic drive with TPVs for use in the stacked logic drive may be in a standard format or having standard sizes. For example, the single-layer-packaged logic drive may be in a shape of square or rectangle, with a certain widths, lengths and thicknesses. An industry standard may be set for the shape and dimensions of the single-layer-packaged logic drive. For example, the standard shape of the single-layer-packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the single-layer-packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The logic drive with TPVs is formed by forming copper pillars or bumps on the provided chip carrier, holder, molder or substrate for use in placing, fixing or attaching the IC chips or packages to and on it as described in Process Step (I) of the FOIT in forming the logic drive package. The process steps for forming the copper pillars or bumps (used as TPVs) on or over the chip carrier, holder, molder or substrate are: (a) providing a chip carrier, holder, molder or substrate and the IC chips or packages. The carrier, holder, molder or substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the chip carrier, holder, molder or substrate may be silicon, metal, ceramics, glass, steel, plastics, polymer, epoxy-based polymer, or epoxy-based compound. The wafer or panel has a base insulating layer on it. The base insulating layer may comprise a silicon oxide layer, a silicon nitride layer, and/or a polymer layer;

(b) depositing an insulting dielectric layer, whole wafer or panel, on the base insulating layer. The insulting dielectric layer may be a polymer material includes, for example, polyimide, BenzoCycloButene (BCB), parylene, epoxy-based material or compound, photo epoxy SU-8, elastomer, or silicone. The polymer layer of the insulating dielectric layer may be deposited by methods of spin-on coating, screen-printing, dispensing, or molding. The insulating dielectric layer may be formed (A): by a non-photosensitive material or a photosensitive material, and no openings in the polymer insulating dielectric layer are formed; or (B): alternatively, the polymer material may be photosensitive, and may be used as photoresist as well for patterning openings in it for forming metal vias (to be used as a bottom portion of the copper pillars or bumps, that is the bottom portion of the TPVs) in it by following processes to be performed later; that is the photosensitive polymer layer is coated, and exposed to light through a photomask, and then developed and etched to form openings in it. The openings in the photosensitive insulating dielectric layer expose the top surfaces of the base insulating layer. The non-photosensitive polymer or the photosensitive polymer layer used for the insulating dielectric layer in (A) or (B) is then cured at a temperature, for example, at or higher than 100° C., 125° C., 150° C., 175° C., 200° C., 225° C., 250° C., 275° C. or 300° C. The thickness of the cured polymer is between, for example, 2 μm and 50 μm, 3 μm and 50 μm, 3 μm and 30 μm, 3 μm and 20 μm, or 3 μm and 15 μm; or thicker than or equal to 2 μm, 3 μm, 5 μm, 10 μm, 20 μm, or 30 μm; (c) performing an emboss copper process to form the copper pillars or bumps for use as the TPVs, for alternative (A) or (B): (i) depositing whole wafer or panel an adhesion layer on or over the insulting dielectric layer (for (A) and (B)) and the exposed top surfaces of the base insulating layer at the bottom of the openings in the cured polymer layer (for (B)), for example, sputtering or CVD depositing a titanium (Ti) or titanium nitride (TiN) layer (with a thickness, for example, between 1 nm and 200 nm, or 5 nm and 50 nm); (ii) then depositing an electroplating seed layer on or over the adhesion layer, for example, sputtering or CVD depositing a copper seed layer (with a thickness, for example, between 3 nm and 300 nm, or 10 nm and 120 nm); (iii) patterning openings or holes in a photoresist layer for forming the copper pillars or bumps later by coating, exposing and developing the photoresist layer, exposing the copper seed layer at the bottom of the openings or holes in the photoresist layer. For the alternative (B), the opening or hole in the photoresist layer overlaps the opening in the insulating dielectric layer; and may extend out of the opening of the insulating dielectric layer, to an area or a ring of the insulating dielectric layer around the opening in the insulating dielectric layer; the width of the ring is between 1 μm and 15 μm, 1 μm and 10 μm, or 1 μm and 5 μm. For alternative (A) or (B), the locations of the openings or holes in the photoresist layer are in the gaps between chips in or of the logic drive, and/or in peripheral area of the logic drive package and outside the edges of chips in or of the logic drive, (the chips are to be placed, attached or fixed in latter processes); (iv) then electroplating a copper layer (with a thickness, for example, between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm) on or over the copper seed layer in the patterned openings or holes of the photoresist layer; (e) removing the remained photoresist; (f) removing or etching the copper seed layer and the adhesion layer not under the electroplated copper. For alternative (A), the metals (Ti (or TiN)/seed Cu/electroplated Cu) left or remained in the locations of openings or holes in the photoresist layer (noticed the photoresist is removed now) are used as the copper pillars or bumps (TPVs). For alternative (B), the metals (Ti (or TiN)/seed Cu/electroplated Cu) left or remained in the locations of openings or holes in the photoresist layer (noticed the photoresist is removed now) are used as the main portion of the copper pillars or bumps (TPVs); and the metals (Ti (or TiN)/seed Cu/electroplated Cu) left or remained in the openings of the insulting dielectric layer are used as the bottom portion of copper pillars or bumps (TPVs). For alternative (A) and (B), the height of the copper pillars or bumps (from the level of top surface of the insulating dielectric layer to the level of the top surface of the copper pillars or bumps) is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm, or greater than or taller than or equal to 50 μm, 30 μm, 20 μm, 15 μm, or 5 μm. The largest dimension in a cross-section of the copper pillars or bumps (for example, the diameter of a circle shape or the diagonal length of a square or rectangle shape) is between, for example, 5 μm and 300 μm, 5 μm and 200 μm, 5 μm and 150 μm, and 120 μm, 10 μm and 100 μm, 10 μm and 60 μm, 10 and 40 μm, or 10 μm and 30 μm; or greater than or equal to 150 μm, 100 μm, 60 μm, 50 μm, 40 μm, 30 μm, 20 μm, 15 μm, or 10 μm. The smallest space between a copper pillar or bump and its nearest neighboring copper pillar or bump is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm.

The wafer or panel with the insulating dielectric layer and the copper pillars or bumps (TPVs) are then used as the carrier, holder, molder or substrate for forming a logic drive as described and specified above. All processes of forming the logic drive are the same as described and specified above. Some process steps are mentioned again below: in the Process Step (II) for forming the logic drive described above, a material, resin, or compound is applied to (i) fill gaps between chips, (ii) cover the top surfaces of chips, (iii) fill gaps between micro copper pillars or bumps on or of chips, (iv) cover top surfaces of the micro copper pillars or bumps on or of chips, (v) filling gaps between copper pillars or bumps (TPVs) on or over the wafer or panel, (vi) cover the top surfaces of the copper pillars or bumps (TPVs) on or over the wafer or panel. Applying a CMP process to planarize the surface of the applied material, resin or compound to a level where (i) all top surfaces of micro bumps or pillars on chips and (ii) all top surfaces of copper pillars or bumps (TPVs) on or over the wafer or panel, are fully exposed. The TISD structure is then formed on or over the planarized surface of the applied material, resin or compound, and connecting or coupling to the exposed top surfaces of micro bumps or pillars on chips and/or the top surfaces of copper pillars or bumps (TPVs) on or over the wafer or panel, as described and specified above. The copper pillars or bumps, solder bumps, gold bumps on or over the TISD are then formed for connecting or coupling to the metal lines or traces in the multiple interconnection metal layers of the TISD, as described and specified above. The copper pillars or bumps on or over the wafer or panel and in the cured, or cross-linked applied material, resin or compound are used for vias (Through Package Vias, TPVs) for connecting or coupling circuits, interconnection metal schemes (for example, the TISD), copper pillars or bumps, solder bumps, gold bumps, and/or metal pads at the front side of the logic drive package to circuits, interconnection metal schemes, metal pads, metal pillars or bumps, and/or components at backside of the logic drive package. The chip carrier, holder, molder or substrate may be (i) removed after the CMP process, and before forming the Top Interconnection Scheme in, on or of the logic drive (TISD); (ii) kept during the fabrication process steps, and removed after all fabrication process steps are finished. The chip carrier, holder, molder or substrate is removed by a peeling process, a CMP process, a backside grinding or a polishing process. After the chip carrier, holder, molder or substrate is removed, for the alternative (A), the insulating dielectric layer (assuming the front-sides with transistors of the IC chips are facing up) and the adhesion layer at bottom surfaces of the TPVs may be removed by a CMP process or a backside grinding or a polishing process to expose the bottom surface of copper seed layer or electroplated copper layer of the copper pillar or bump (that means, the whole layer of the insulating dielectric layer is removed). For the alternative (B), After the chip carrier, holder, molder or substrate is removed, the bottom portion of the insulating dielectric layer (assuming the front-sides with transistors of the IC chips are facing up) and the adhesion layer at bottom surfaces of the TPVs may be removed by a CMP process or a backside grinding or a polishing process to expose the bottom portion of the copper pillar or bump (note that the bottom portion of the copper pillar or bump is the metal via in the opening of the insulating dielectric layer); that is, the removing process of the insulating dielectric layer is performed until the copper seed layer or the electroplated copper at the bottom of the copper pillar or bump (in the opening of the insulating dielectric layer) is exposed. In the alternative (B), the remained portion of the insulating dielectric layer becomes a part of the finished logic drive, and is at the bottom of the logic drive package, and the surface of the seed copper layer or the electroplated copper layer in the opening of the remained insulation dielectric layer is exposed. For the alternative (A) or (B), the exposed bottom surfaces of copper seed layer or electroplated copper layer of the copper pillars or bumps (TPVs) are formed copper pads at the backside of the logic drive for use in making connection or coupling to transistors, circuits, interconnection metal schemes, metal pads, metal pillars or bumps, and/or components at the frontside (or topside, still assuming the IC chips having the side with transistors is facing up) of the logic drive package.

The stacked logic drive may be formed, for an example, by in the following process steps: (i) providing a first single-layer-packaged logic drive, either separated or still in the wafer or panel format, with TPVs and with its copper pillars or bumps, solder bumps, or gold bumps faced down, and with the exposed copper pads of TPVs on its upside; (ii) Package-On-Package (POP) stacking assembling, by surface-mounting and/or flip-package methods, a second separated single-layer-packaged logic drive on top of the provided first single-layer-packaged logic drive. The surface-mounting process is similar to the Surface-Mount Technology (SMT) used in the assembly of components on or to the Printed Circuit Boards (PCB), by first printing solder or solder cream, or flux on the copper pads of the TPVs, and then flip-package assembling, connecting or coupling the copper pillars or bumps, solder bumps, or gold bumps on or of the second separated single-layer-packaged logic drive to the solder or solder cream or flux printed copper pads of TPVs of the first single-layer-packaged logic drive. The flip-package process is performed, similar to the Package-On-Package technology (POP) used in the IC stacking-package technology, by flip-package assembling, connecting or coupling the copper pillars or bumps, solder bumps, or gold bumps on or of the second separated single-layer-packaged logic drive to the copper pads of TPVs of the first single-layer-packaged logic drive. An underfill material may be filled in the gaps between the first and the second single-layer-packaged logic drives. A third separated single-layer-packaged logic drive may be flip-package assembled, connected or coupled to the exposed copper pads of TPVs of the second single-layer-packaged logic drive. The Package-On-Package stacking assembling process may be repeated for assembling more separated single-layer-packaged logic drives (for example, up to more than or equal to a nth separated single-layer-packaged logic drive, wherein n is greater than or equal to 2, 3, 4, 5, 6, 7, 8) to form the finished stacking logic drive. When the first single-layer-packaged logic drives are in the separated format, they may be first flip-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged logic drives are still in the wafer or panel format, the wafer or panel may be used directly as the carrier or substrate for performing POP stacking processes, in the wafer or panel format, for forming the stacked logic drives. The wafer or panel is then cut or diced to obtain the separated stacked finished logic drives.

Another aspect of the disclosure provides a method for a single-layer-packaged logic drive suitable for the stacked POP assembling technology. The single-layer-packaged logic drive for use in the POP package assembling is fabricated as the same process steps and specifications of the FOIT described in the above paragraphs, except for forming a Bottom metal Interconnection Scheme at the bottom of the single-layer-packaged logic Drive (abbreviated as BISD in below) and Through-Package-Vias, or Through Polymer Vias (TPVs) in the gaps between chips in or of the logic drive, and/or in the peripheral area of the logic drive package and outside the edges of chips in or of the logic drive. The BISD may comprise metal lines, traces, or planes in multiple interconnection metal layers, and is formed on or over the chip carrier, holder, molder or substrate, before pacing, attaching or fixing the IC chips the chip carrier, holder, molder or substrate, using the same or similar process steps as in forming the TISD as described above. The TPVs are formed on or over the BISD, and are formed using the same or similar process steps as in forming metal pillars or bumps (copper pillars or bumps, solder bumps or gold bumps) on the TISD. The BISD provides additional interconnection metal layer or layers at the bottom or the backside of the logic drive package, and provides exposed metal pads or copper pads in an area array at the bottom of the single-layer-packaged logic drive, including at locations directly under the IC chips of the logic drive. The TPVs are used for connecting or coupling circuits or components (for example, the TISD) at the topside of the logic drive to that (for example, the BISD) at the backside of the logic drive package. The single-layer-packaged logic drive with TPVs for use in the stacked logic drive may be in a standard format or having standard sizes. For example, the single-layer-packaged logic drive may be in a shape of square or rectangle, with a certain widths, lengths and thicknesses; and/or with a standard layout of the locations of the copper pads. An industry standard may be set for the shape and dimensions of the single-layer-packaged logic drive. For example, the standard shape of the single-layer-packaged logic drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the single-layer-packaged logic drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The logic drive with the BISD and TPVs is formed by first forming metal lines, traces, or planes on multiple interconnection metal layers on the provided chip carrier, holder, molder or substrate for use in placing, fixing or attaching the IC chips or packages to and on it; and then forming copper pillars or bumps (TPVs) on the BISD. The chip carrier, holder, molder or substrate with the BISD and TPVs on or over it is used for the FOIT processes, as described in Process Step (I) of forming the FOIT in or of the logic drive package. The process steps for forming the BISD and the copper pillars or bumps (used as TPVs) on or over the chip carrier, holder, molder or substrate are: (a) providing a chip carrier, holder, molder or substrate and the IC chips or packages. The carrier, holder, molder or substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the chip carrier, holder, molder or substrate may be silicon, metal, ceramics, glass, steel, plastics, polymer, epoxy-based polymer, or epoxy-based compound. The wafer or panel has a base insulating layer on it. The base insulating layer may comprise a silicon oxide layer, a silicon nitride layer, and/or a polymer layer; (b) depositing a bottom-most insulting dielectric layer, whole wafer or panel, on the base insulating layer. The bottom-most insulting dielectric layer may be a polymer material includes, for example, polyimide, BenzoCycloButene (BCB), parylene, epoxy-based material or compound, photo epoxy SU-8, elastomer, or silicone. The bottom-most polymer insulating dielectric layer may be deposited by methods of spin-on coating, screen-printing, dispensing, or molding. The polymer material may be photosensitive, and may be used as photoresist as well for patterning openings in it for forming metal vias in it by following processes to be performed later; that is, the photosensitive polymer layer is coated, and exposed to light through a photomask, and then developed and etched to form openings in it. The openings in the photosensitive bottom-most insulating dielectric layer expose the top surfaces of the base insulating layer. The photosensitive bottom-most polymer layer (the insulating dielectric layer) is then cured at a temperature, for example, at or higher than 100° C., 125° C., 150° C., 175° C., 200° C., 225° C., 250° C., 275° C. or 300° C. The thickness of the cured bottom-most polymer is between, for example, 3 μm and 50 μm, 3 μm and 30 μm, 3 μm and 20 μm, or 3 μm and 15 μm; or thicker than or equal to 3 μm, 5 μm, 10 μm, 20 μm, or 30 μm; (c) performing an emboss copper process to form the metal vias in the openings of the cured bottom-most polymer insulating dielectric layer, and to form metal lines, traces or planes of an bottom-most interconnection metal layer of the BISD: (i) depositing whole wafer or panel an adhesion layer on or over the bottom-most insulting dielectric layer and the exposed top surfaces of the base insulating layer at the bottom of the openings in the cured bottom-most polymer layer, for example, sputtering or CVD depositing a titanium (Ti) or titanium nitride (TiN) layer (with a thickness, for example, between 1 nm and 200 nm, or 5 nm and 50 nm); (ii) then depositing an electroplating seed layer on or over the adhesion layer, for example, sputtering or CVD depositing a copper seed layer (with a thickness, for example, between 3 nm and 300 nm, or 10 nm and 120 nm); (iii) patterning trenches, openings or holes in a photoresist layer for forming metal lines, traces or planes of the bottom-most interconnection metal layer later by coating, exposing and developing the photoresist layer, exposing the copper seed layer at the bottom of the trenches, openings or holes in the photoresist layer. The trench, opening or hole in the photoresist layer overlaps the opening in the bottom-most insulating dielectric layer; and may extend out of the opening of the bottom-most insulating dielectric layer; (iv) then electroplating a copper layer (with a thickness, for example, between 5 μm and 80 μm, 5 μm and 50 μm, 5 μm and 40 μm, 5 μm and 30 μm, 3 μm and 20 μm, 3 μm and 15 μm, or 3 μm and 10 μm) on or over the copper seed layer in the patterned trenches, openings or holes of the photoresist layer; (e) removing the remained photoresist; (f) removing or etching the copper seed layer and the adhesion layer not under the electroplated copper. The metals (Ti (or TiN)/seed Cu/electroplated Cu) left or remained in the locations of trenches, openings or holes in the photoresist layer (note that the photoresist is removed now) are used as the metal lines, traces or planes of the bottom-most interconnection metal layer of the BISD; and the metals (Ti (or TiN)/seed Cu/electroplated Cu) left or remained in the openings of the bottom-most insulting dielectric layer are used as the metal vias in the bottom-most insulating dielectric layer of the BISD. The processes of forming the bottom-most insulating dielectric layer and openings in it; and the emboss copper processes for forming the metal vias in the bottom-most insulting dielectric layer and the metal lines, traces, or planes of the bottom-most interconnection metal layer, may be repeated to form a metal layer of multiple interconnection metal layers in or of the BISD; wherein the repeated bottom-most insulating dielectric layer is used as the inter-metal dielectric layer between two interconnection metal layers of the BISD, and the metal vias in the bottom-most insulating dielectric layer (now in the inter-metal dielectric layer) are used for connecting or coupling metal lines, traces, or planes of the two interconnection metal layers, above and below the metal vias, of the BISD. The top-most interconnection metal layer of the BISD is covered with a top-most insulating dielectric layer of the BISD. The top-most insulating dielectric layer has openings in it to expose top surface of the top-most interconnection metal layer of the BISD. The locations of the openings in the top-most insulating dielectric layer are in the gaps between chips in or of the logic drive, and/or in peripheral area of the logic drive package and outside the edges of chips in or of the logic drive, (the chips are to be placed, attached or fixed in latter processes). A CMP process may be then performed to planarize the top surface of the BISD (that is to planarize the cured top-most insulating dielectric layer) before the following process in forming copper pillars or bumps for TPVs. The BISD may comprise 1 to 6 layers, or 2 to 5 layers of interconnection metal layers. The interconnection metal lines, traces or planes of the BISD have the adhesion layer (Ti or TiN, for example) and the copper seed layer only at the bottom, but not at the sidewalls of the metal lines or traces. The interconnection metal lines or traces of FISC have the adhesion layer (Ti or TiN, for example) and the copper seed layer at both the bottom and the sidewalls of the metal lines or traces.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The thickness or height of metal vias in the bottom-most insulating dielectric layer of the BISD is between, for example, 3 μm and 50 μm, 3 μm and 30 μm, 3 μm and 20 μm, or 3 μm and 15 μm; or thicker than or equal to 3 μm, 5 μm, 10 μm, 20 μm, or 30 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

After the BISD is formed, forming copper pillars or bumps (to be used as TPVs) on or over the top-most insulating dielectric layer of the BISD on or of the a chip carrier, holder, molder or substrate, and the exposed top surfaces of the top-most interconnection metal layer of the BISD in openings of the top-most insulating dielectric layer of the BISD, by performing an emboss copper process, as described above, in the following process steps: (a) depositing whole wafer or panel an adhesion layer on or over the top-most insulating dielectric layer of the BISD, and the exposed top surfaces of the top-most interconnection metal layer of the BISD in openings of the top-most insulating dielectric layer of the BISD, for example, sputtering or CVD depositing a titanium (Ti) or titanium nitride (TiN) layer (with a thickness, for example, between 1 nm and 200 nm, or 5 nm and 50 nm); (b) then depositing an electroplating seed layer on or over the adhesion layer, for example, sputtering or CVD depositing a copper seed layer (with a thickness, for example, between 3 nm and 400 nm or 10 nm and 200 nm); (c) patterning openings or holes in a photoresist layer for forming the copper pillars or bumps (TPVs) by coating, exposing and developing the photoresist layer, exposing the copper seed layer at the bottom of the openings or holes in the photoresist layer. The opening or holes in the photoresist layer overlaps the opening in the top-most insulating dielectric layer of the BISD; and may extend out of the opening in the top-most insulating dielectric layer, to an area or a ring of the top-most insulating dielectric layer of the BISD around the opening in the top-most insulating dielectric layer of the BISD. The width of the ring is between 1 μm and 15 μm, 1 μm and 10 μm, or 1 μm and 5 μm. The locations of the openings or holes in the photoresist layer are in the gaps between chips in or of the logic drive, and/or in the peripheral area of the logic drive package and outside the edges of chips in or of the logic drive, (the chips are to be placed, attached or fixed in latter processes); (d) then electroplating a copper layer (with a thickness, for example, between 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm) on or over the copper seed layer in the patterned openings or holes of the photoresist layer; (e) removing the remained photoresist; (f) removing or etching the copper seed layer and the adhesion layer not under the electroplated copper. The metals (Ti (or TiN)/seed Cu/electroplated Cu) left or remained in the locations of openings or holes in the photoresist layer (noticed the photoresist is removed now) are used as the copper pillars or bumps (TPVs). The height of the copper pillars or bumps (from the level of top surface of the insulating dielectric layer to the level of the top surface of the copper pillars or bumps) is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm, or greater than or taller than or equal to 50 μm, 30 μm, 20 μm, 15 μm, or 5 μm. The largest dimension in a cross-section of the copper pillars or bumps (for example, the diameter of a circle shape or the diagonal length of a square or rectangle shape) is between, for example, 5 μm and 300 μm, 5 μm and 200 μm, 5 μm and 150 μm, and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm. The smallest space between a copper pillar or bump and its nearest neighboring copper pillar or bump is between, for example, 5 μm and 300 μm, 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 150 μm, 100 μm, 60 μm, 50 μm, 40 μm, 30 μm, 20 μm, 15 μm, or 10 μm.

The wafer or panel with the BISD and the copper pillars or bumps (TPVs) are then used as the carrier, holder, molder or substrate for forming a logic drive as described and specified above. All processes of forming the logic drive are the same as described and specified above. Some process steps are mentioned again below: in the Process Step (II) for forming the logic drive described above, a material, resin, or compound is applied to (i) fill gaps between chips, (ii) cover the top surfaces of chips, (iii) fill gaps between micro copper pillars or bumps on or of chips, (iv) cover top surfaces of the micro copper pillars or bumps on or of chips, (v) filling gaps between copper pillars or bumps (TPVs) on or over the wafer or panel, (vi) cover the top surfaces of the copper pillars or bumps (TPVs) on or over the wafer or panel. Applying a CMP process to planarize the surface of the applied material, resin or compound to a level where (i) all top surfaces of micro bumps or pillars on chips and (ii) all top surfaces of copper pillars or bumps (TPVs) on or over the wafer or panel, are fully exposed. The copper pillars or bumps on or over the wafer or panel and in the cured, or cross-linked applied material, resin or compound are used for Through Package Vias or Through Polymer Vias (TPVs) for connecting or coupling circuits, interconnection metal schemes (for example, TISD), copper pillars or bumps, solder bumps, gold bumps, and/or metal pads at the front side of the logic drive package to circuits, interconnection metal schemes (for example, BISD), copper pads, metal pillars or bumps, and/or components at backside of the logic drive package. The chip carrier, holder, molder or substrate may be (i) removed after the CMP process (for planarizing the surface of the applied material, resin or compound), and before forming the Top Interconnection Scheme in, on or of the logic drive (the TISD); (ii) kept during the fabrication process steps, and removed after all fabrication process steps (in wafer or panel format) are finished. When the chip carrier, holder, molder or substrate is removed, a bottom portion of the bottom-most insulating dielectric layer (assuming the frontside with transistors of the IC chips are facing up) may be removed by a CMP process or a backside grinding or polishing process to expose the metal vias in the openings of the bottom-most insulating dielectric layer; that is, the removing process of the bottom-most insulating dielectric layer is performed until the copper seed layer or the electroplated copper layer of the metal vias in the openings of the bottom-most insulating dielectric layer is exposed. The remained portion of the bottom-most insulating dielectric layer becomes a part of the finished logic drive, and is at the bottom of the logic drive package, and the surface of the seed copper layer or the electroplated copper layer in the opening of the remained bottom-most insulation dielectric layer is exposed. The exposed surfaces of the seed copper layer or the electroplated copper layer in the openings of the remained bottom-most insulation dielectric layer may be designed or layout as a pad area array at the bottom surface or the backside surface of the logic drive package; with the pads at the peripheral area used for the signal pads, and pads at or near the central area are used for the Power/Ground (P/G) pads. The pads may be located directly under locations where IC chips are placed or attached on the carrier, holder, molder or substrate. The signal pads at the peripheral area may form 1 ring, or 2, 3, 4, 5, or 6 rings along the edges at the bottom of the logic drive package. The pitches of the signal pads at the peripheral area may be smaller than that of the P/G pads at or near the central area of the backside of logic drive package. The exposed copper pads at the bottom surface or the backside surface of the logic drive package are connected to TPVs, and therefore the copper pads and TPVs are used for connection or coupling between the transistors, circuits, interconnection metal schemes (for example, TISD), metal pads, metal pillars or bumps, and/or components at the frontside (or topside, still assuming the IC chips having the side with transistors is facing up) of the logic drive package, and interconnection metal schemes (for example, BISD), metal pads and/or components at the backside (or bottom side) of the logic drive package.

The BISD interconnection metal lines or traces of the single-layer-packaged logic drive are used: (a) for connecting or coupling the copper pads at the bottom (backside) surface of the single-layer-packaged logic drive to their corresponding TPVs; and through the corresponding TPVs, the copper pads at the bottom surface of the single-layer-packaged logic drive are connected or coupled to the metal lines or traces of the TISD at the topside (or frontside) of the single-layer-packaged logic drive, therefore connecting or coupling the copper pads to the transistors, the FISC, the SISC and micro copper pillars or bumps of the IC chips at the topside of the single-layer-packaged logic drive; (b) for connecting or coupling the copper pads at the bottom surface of the single-layer-packaged logic drive to their corresponding TPVs, and through the corresponding TPVs, the copper pads at the bottom surface of the single-layer-packaged logic drive are connected or coupled to the metal lines or traces of the TISD at the topside (or frontside) of the single-layer-packaged logic drive; and the TISD may be connected or coupled to the metal pillars or bumps on the TISD. Therefore, the copper pads at the backside of the single-layer-packaged logic drive are connected or coupled to the metal pillars or bumps at the frontside of the single-layer-packaged logic drive; (c) for connecting or coupling copper pads directly under a first FPGA IC chip of the single-layer-packaged logic drive to copper pads directly under a second FPGA IC chip of the single-layer-packaged logic drive by using an interconnection net or scheme of metal lines or traces in or of the BISD. The interconnection net or scheme may be connected or coupled to TPVs of the single-layer-packaged logic drive; (d) for connecting or coupling a copper pad directly under a FPGA IC chip of the single-layer-packaged logic drive to another copper pad or multiple other copper pads directly under the same FPGA IC chip by using an interconnection net or scheme of metal lines or traces in or of the BISD. The interconnection net or scheme may be connected or coupled to the TPVs of the single-layer-packaged logic drive; (e) for the power or ground planes and/or heat dissipaters or spreaders.

Another aspect of the disclosure provides a nonvolatile programmable logic device (a nonvolatile programmable logic drive) based on the logic drive described and specified above. The nonvolatile programmable logic device in a multi-chip package (based on the FOIT package described and specified above) comprises plural standard commodity FPGA IC chips and one or more non-volatile IC chips, wherein the one or more non-volatile memory IC chips comprises a NAND flash chip or chips and/or a NOR flash chip or chips, in a bare-die format or in a multi-chip package format. In an embodiment, the nonvolatile programmable logic device in the multi-chip package (based on the FOIT package described and specified above) comprises only one standard commodity FPGA IC chip and only one non-volatile memory IC chip, wherein the only one non-volatile memory IC chip comprises a NAND flash chip or a NOR flash chip, in a bare-die format or in a package format. The user or developer with innovation or application concept or idea may purchase the nonvolatile programmable logic device, and develop or write software codes, data or programs to load into the non-volatile memory chip (or chips) of the nonvolatile programmable logic device for implementing his/her innovation or application concept or idea. The user's software codes, data, information, instructions or programs (related to the innovation or application) loaded into and stored in the one or more non-volatile memory IC chip or chips in the nonvolatile programmable logic device may be downloaded to the 5T or 6T SRAM cells of the programmable interconnection (switches including pass-no-pass switching gates and multiplexers) and/or programmable logic circuits, cells, elements or blocks (including LUTs and multiplexers) on the standard commodity FPGA IC chip or chips in the nonvolatile programmable logic device, through the TISD of the FOIT package.

The non-volatile programmable logic device (the non-volatile programmable logic drive) may comprise the dedicated I/O chip or the dedicated control and I/O chip together with the FPGA chip and the non-volatile memory IC chip, wherein the dedicated I/O chip or the dedicated control and I/O chip, is as described and specified above. The communication or electrical coupling between the dedicated I/O chip or the dedicated control and I/O chip, the FPGA chip and the non-volatile memory IC chip in the non-volatile programmable logic device is as described and specified above. The communication or electrical coupling between non-volatile programmable logic device and the external circuits outside the non-volatile programmable logic device is as described and specified above. As described and specified above, the dedicated the dedicated I/O chip or the dedicated control and I/O chip comprises the large I/O circuit for communication or coupling with the external circuits outside the non-volatile programmable logic device, and the small I/O circuit for communication or coupling with the small I/O circuits of the FPGA IC and the non-volatile memory IC chip. The large I/O circuit and the small I/O circuit are as described and specified above.

The non-volatile programmable logic device (the non-volatile programmable logic drive) may comprise the HBM memory chip (for example, a HBM DRAM, SRAM, MRAM or RRAM IC chip), together with the dedicated I/O chip or dedicated control and I/O chip, the FPGA chip and the non-volatile memory IC chip, wherein the HBM memory chip (for example, a HBM DRAM, SRAM, MRAM or RRAM IC chip) is as described and specified above. The communication or electrical coupling between the dedicated I/O chip or the dedicated control and I/O chip, the HBM memory chip, the FPGA chip and the non-volatile memory IC chip in the non-volatile programmable logic device is as described and specified above. The communication or electrical coupling between non-volatile programmable logic device and the external circuits outside the non-volatile programmable logic device is as described and specified above. As described and specified above, the dedicated the dedicated I/O chip or the dedicated control and I/O chip comprises the large I/O circuit for communication or coupling with the external circuits outside the non-volatile programmable logic device, and the small I/O circuit for communication or coupling with the small I/O circuits of the FPGA IC chip, the non-volatile memory IC chip and the HBM memory chip. The large I/O circuit and the small I/O circuit are as described and specified above.

The FPGA IC chip in the non-volatile programmable logic device (the non-volatile programmable logic drive) may comprise an on-chip security circuit for design security. The on-chip security circuit is used for preventing from the unintended copy, use or reverse engineering. The on-chip security circuit on the FPGA IC chip in the non-volatile programmable logic device provides the on-chip bitstream decryption based on a decryption key stored in the dedicated memory cells on the FPGA IC chip. The encrypted bitstream are stored in the non-volatile memory chip of the non-volatile programmable logic device, and to be used for configuring the FPGA IC chip of the non-volatile programmable logic device. The encrypted bitstream from the non-volatile memory chip are input into the FPGA IC chip for the programmable interconnection (switches including pass-no-pass switching gates and multiplexers) and/or programmable logic circuits, cells, elements or blocks (including LUTs and multiplexers) on the FPGA IC chip, wherein the input encrypted bitstream are decrypted by the on-chip security circuit based on a decryption key stored in the dedicated memory cells. A user-generated key may be created from a truly random source The FPGA IC chip in the non-volatile programmable logic device stores the encryption key internally in non-volatile memory cells on the FPGA IC chip, wherein the on-chip non-volatile memory cells may comprise a floating gate MOS transistor, MRAM, or RRAM. Alternatively, the FPGA IC chip in the non-volatile programmable logic device stores the encryption key internally in dedicated RAM cells on the FPGA IC chip, wherein the dedicated RAM cells may be backed up by a small externally connected battery. Alternatively, an e-fuse or anti-fuse on the FPGA IC chip may be used to store the encryption key. The e-fuse or the anti-fuse is programmed to non-volatily store encryption key. The e-fuse comprises fuses, each fuse has a narrow neck in a metal trace or line of the interconnection metal lines or traces in the FISC or the SISC of the FPGA IC chip, as described and specified above. In the programming for non-volatile storage, selected fuses are cut and broken by applying high currents through the fuses. The anti-fuse comprises fuses, each fuse has a thin oxide window between two terminals or electrodes. In the programming for non-volatile storage, selected fuses are connected, wherein the oxide in the oxide window are broken down by applying high voltage between two terminals or electrodes. The encryption key can only be programmed onto the device through a special port. The on-chip security circuit performs the operation for decrypting the incoming bitstream during configuration. The non-volatile programmable logic device has the encryption logic (based on the on-chip security circuit) uses a 128, 256, 512 or 1024-bit encryption key.

Comprising the non-volatile IC memory chip and the FPGA IC chip in a chip package of the nonvolatile programmable logic device provides an alternative for the current ASIC IC chip design, manufacturing, and business. The chip package of the logic drive (the nonvolatile programmable logic device) with (i) the loaded and stored software codes, data, information, instructions or programs (related to the innovation or application) in the non-volatile IC memory chip, and (ii) with the on-chip encryption/decryption function (based on the on-chip security circuit) of the FPGA IC chip, can be sold and used just like an ASIC IC chip.

The stacked logic drive using the single-layer-packaged logic drive with the BISD and TPVs may be formed using the same or similar process steps, as described and specified above; for an example, by the following process steps: (i) providing a first single-layer-packaged logic drive with both TPVs and the BISD, either separated or still in the wafer or panel format, and with its copper pillars or bumps, solder bumps, or gold bumps faced down, and with the exposed copper pads on its upside; (ii) Package-On-Package (POP) stacking assembling, by surface-mounting and/or flip-package methods, a second separated single-layer-packaged logic drive (also with both TPVs and the BISD) on top of the provided first single-layer-packaged logic drive. The surface-mounting process is similar to the Surface-Mount Technology (SMT) used in the assembly of components on or to the Printed Circuit Boards (PCB), by first printing solder or solder cream, or flux on the surfaces of the exposed copper pads, and then flip-package assembling, connecting or coupling the copper pillars or bumps, solder bumps, or gold bumps on or of the second separated single-layer-packaged logic drive to the solder or solder cream or flux printed surfaces of the exposed copper pads of the first single-layer-packaged logic drive. The flip-package process is performed, similar to the Package-On-Package technology (POP) used in the IC stacking-package technology, by flip-package assembling, connecting or coupling the copper pillars or bumps, solder bumps, or gold bumps on or of the second separated single-layer-packaged logic drive to the surfaces of copper pads of the first single-layer-packaged logic drive. Note that the copper pillars or bumps, solder bumps, or gold bumps on or of the second separated single-layer-packaged logic drive bonded to the surfaces of copper pads of the first single-layer-packaged logic drive may be located directly over or above locations where IC chips are placed in the first single-layer-packaged logic drive. An underfill material may be filled in the gaps between the first and the second single-layer-packaged logic drives. A third separated single-layer-packaged logic drive (also with both TPVs and the BISD) may be flip-package assembled, connected or coupled to the exposed surfaces of copper pads of the second single-layer-packaged logic drive. The Package-On-Package stacking assembling process may be repeated for assembling more separated single-layerpackaged logic drives (for example, up to more than or equal to a nth separated single-layer-packaged logic drive, wherein n is greater than or equal to 2, 3, 4, 5, 6, 7, 8) to form the finished stacking logic drive. When the first single-layer-packaged logic drives are in the separated format, they may be first flip-package assembled to a carrier or substrate, for example a PCB, or a BGA (Ball-Grid-Array) substrate, and then performing the POP processes, in the carrier or substrate format, to form stacked logic drives, and then cutting, dicing the carrier or substrate to obtain the separated finished stacked logic drives. When the first single-layer-packaged logic drives are still in the wafer or panel format, the wafer or panel may be used directly as the carrier or substrate for performing POP stacking processes, in the wafer or panel format, for forming the stacked logic drives. The wafer or panel is then cut or diced to obtain the separated stacked finished logic drives.

Another aspect of the disclosure provides varieties of interconnection alternatives for the TPVs of a single-layer-packaged logic drive: (a) the TPV is used as a through via for connecting a single-layer-packaged logic drive above the single-layer-packaged logic drive, and a single-layer-packaged logic drive below the single-layer-packaged logic drive; without connecting or coupled to the FISC, the SISC or micro copper pillars or bumps on or of any IC chip of the single-layer-packaged logic drive. In this case, a stacked structure is formed, from bottom to top: (i) copper pad (metal via in the bottom-most insulating dielectric layer of the BISD); (ii) stacked interconnection layers and metal vias in the dielectric layer of the BISD; (iii) the TPV; (iv) stacked interconnection layers and metal vias in the dielectric layer of the TISD; and (v) the metal pillar or bump; (b) the TPV is stacked as a through TPV in (a), but is connected or coupled to the FISC, the SISC or micro copper pillars or bumps on or of one or more IC chips of the single-layer-packaged logic drive, through the metal lines or traces of the TISD; (c) the TPV is only stacked at the bottom portion, but not at the top portion. In this case, a structure for the TPV connection is formed, from bottom to top: (i) copper pad (metal via in the bottom-most insulating dielectric layer of the BISD); (ii) stacked interconnection layers and metal vias in the dielectric layer of the BISD; (iii) the TPV; (iv) the top of the TPV is connected or coupled to the FISC, the SISC or micro copper pillars or bumps on or of one or more IC chips of the single-layer-packaged logic drive, through the interconnection metal layers and metal vias in the dielectric layer of the TISD; no metal pillar or bump, directly over the top of the TPV, is connected or coupled to the TPV; (v) a metal pillar or bump (on the TISD) connected or coupled to the top of the TPV and at a location not directly over the top of the TPV; (d) a structure for the TPV connection is formed, from bottom to top: (i) a copper pad (metal via in the bottom-most insulating dielectric layer of the BISD) directly under an IC chip of the single-layer-packaged logic drive; (ii) the copper pad is connected or coupled to the bottom of the TPV (which is located between the gaps of chips or at the peripheral area where no chip is placed) through the interconnection metal layers and metal vias in the dielectric layer of the BISD; (iii) the TPV; (iv) the top of the TPV is connected or coupled to the FISC, the SISC or micro copper pillars or bumps on or of one or more IC chips of the single-layer-packaged logic drive through the interconnection metal layers and metal vias in the dielectric layer of the TISD; (v) a metal pillar or bump (on the TISD) connected or coupled to the top of the TPV, and may be at a location not directly over the top of the TPV; (e) a structure for the TPV connection is formed, from bottom to top: (i) a copper pad (metal via in the bottom-most insulating dielectric layer of the BISD) directly under an IC chip of the single-layer-packaged logic drive; (ii) the copper pad is connected or coupled to the bottom of the TPV (which is located between the gaps of chips or at the peripheral area where no chip is placed) through the interconnection metal layers and metal vias in the dielectric layer of the BISD; (iii) the TPV; (iv) the top of the TPV is connected or coupled to the FISC, the SISC or micro copper pillars or bumps on or of one or more IC chips of the single-layer-packaged logic drive through the interconnection metal layers and metal vias in the dielectric layer of the TISD. The interconnection metal layers and metal vias in the dielectric layer of the TISD may comprise an interconnection net or scheme of metal lines or traces in or of the TISD of the (this) single-layer-packaged logic drive used for connecting or coupling the transistors, the FISC, the SISC and/or the micro copper pillars or bumps of an FPGA IC chip or multiple FPGA IC chips packaged in the (this) single-layer-packaged logic drive, but the interconnection net or scheme is not connected or coupled to the circuits or components outside or external to the (this) single-layer-packaged logic drive. That is, no metal pillars or bumps (copper pillars or bumps solder bumps, or gold bumps) of the single-layer-packaged logic drive is connected to the interconnection net or scheme of metal lines or traces in or of the TISD, and therefore, no metal pillars or bumps (copper pillars or bumps solder bumps, or gold bumps) of the single-layer-packaged logic drive is connected or coupled to the top of the TPV.

Another aspect of the disclosure provides the logic drive in a multi-chip package format further comprising one or plural dedicated programmable SRAM (DPSRAM) chip or chips. The DPSRAM chip comprises 5T or 6T SRAM cells and cross-point switches, and is used for programming the interconnection between circuits or interconnections of the standard commodity FPGA IC chips. The programmable interconnections comprise interconnection metal lines or traces of the TISD between the standard commodity FPGA IC chips, with cross-point switch circuits in the middle of interconnection metal lines or traces of the TISD. For example, n metal lines or traces of the TISD are input to a cross-point switch circuit, and m metal lines or traces of the TISD are output from the switch circuit. The cross-point switch circuit is designed such that each of the n metal lines or traces of the TISD can be programed to connect to anyone of the m metal lines or traces of the TISD. The cross-point switch circuit may be controlled by the programming code stored in, for example, an SRAM cell in or of the DPSRAM chip. The SRAM cell may comprise 6-Transistors (6T), with two transfer (write) transistors and 4 data-latch transistors. The two transfer (write) transistors are used for writing the programing code or data into the two storage or latch nodes of the 4 data-latch transistors. Alternatively, the SRAM cell may comprise 5-Transistors (5T), with a transfer (write) transistor and 4 data-latch transistors. The transfer (write) transistor is used for writing the programing code or data into the two storage or latch nodes of the 4 data-latch transistors. The stored (programming) data in the 5T or 6T SRAM cell is used to program the connection or not-connection of metal lines or traces of the TISD. The cross-point switches are the same as that described in the standard commodity FPGA IC chips. The details of various types of cross-point switches are as specified or described in the paragraphs of FPGA IC chips. The cross-point switches may comprise: (1) n-type and p-type transistor pair circuits; or (2) multiplexers and switch buffers. When the data latched in the 5T or 6T SRAM cell is programmed at 1, a pass/no-pass circuit comprising a n-type and p-type transistor pair is on, and the two metal lines or traces of the TISD connected to two terminals of the pass-no-pass circuit (the source and drain of the transistor pair, respectively), are connected; while the data latched in the 5T or 6T SRAM cell is programmed at 0, a pass/no-pass circuit comprising a n-type and p-type transistor pair circuit is off, and the two metal lines or traces of the TISD connected to two terminals of the pass/no-pass circuit (the source and drain of the transistor pair, respectively), are dis-connected. Alternatively, when the data latched in the 5T or 6T SRAM cell is programmed at 1, the control N-MOS transistor and the control P-MOS transistor in the switch buffer are on, the data on the input metal line is passing to the output metal line of the cross-point switch, and the two metal lines or traces of the TISD connected to two terminals of the cross-point switch are coupled or connected; while the data latched in the 5T or 6T SRAM cell is programmed at 0, the control N-MOS transistor and the control P-MOS transistor in the switch buffer are off, the data on the input metal line is not passing to the output metal line of the cross-point switch, and the two metal lines or traces of the TISD connected to two terminals of the cross-point switch are not coupled or dis-connected. The DPSRAM chip comprises 5T or 6T SRAM cells and cross-point switches used for programmable interconnection of metal lines or traces of the TISD between the standard commodity FPGA IC chips in the logic drive. Alternatively, the DPSRAM chip comprising 5T or 6T SRAM cells and cross-point switches may be used for programmable interconnection of metal lines or traces of the TISD between the standard commodity FPGA IC chips and the TPVs (for example, the top surfaces of the TPVs) in the logic drive, in the same or similar method as described above. The stored (programming) data in the 5T or 6T SRAM cell is used to program the connection or not-connection between (i) a first metal line, trace, or net of the TISD, connecting to one or more micro copper pillars or bumps on or over one or more the IC chips of the logic drive, and/or to one or more metal pillars or bumps on or over the TISD of the logic drive, and (ii) a second metal line, trace or net of the TISD, connecting or coupling to TPV (for example, the top surface of the TPV), in a same or similar method described above. With this aspect of disclosure, TPVs are programmable; in other words, this aspect of disclosure provides programmable TPVs. The programmable TPVs may, alternatively, use the programmable interconnection, comprising 5T or 6T SRAM cells and cross-point switches, on or of the FPGA IC chips in or of the logic drive. The programmable TPV may be, by (software) programming, (i) connected or coupled to one or more micro copper pillars or bumps of one or more IC chips (therefor to the metal lines or traces of the SISC and/or the FISC, and/or the transistors) of the logic drive, and/or (ii) connected or coupled to one or more metal pillars or bumps on or over the TISD of the logic drive. When a copper pad (the bottom surface of the TPV, the bottom surface of the metal via in the polymer layer at the bottom portion of the TPV, or the bottom surface of the metal via in the bottom-most polymer layer of the BISD) at the backside of the logic drive is connected to the programmable TPV, the copper pad becomes a programmable coper pad. The programmable copper pad at the backside of the logic drive may be connected or coupled to, by programming and through the programmable TPV, (i) one or more micro copper pillars or bumps of one or more IC chips (therefor to the metal lines or traces of the SISC and/or the FISC, and/or the transistors) at the frontside of the logic drive, and/or (ii) one or more metal pillars or bumps on or over the TISD at the frontside of the logic drive. Alternatively, the DPSRAM chip comprises 5T or 6T SRAM cells and cross-point switches may be used for programmable interconnection of metal lines or traces of the TISD between the metal pillars or bumps (copper pillars or bumps, solder bumps or gold bumps) on or over the TISDs of the logic drive and one or more micro copper pillars or bumps on or of one or more IC chips of the logic drive, in a same or similar method as described above. The stored (programming) data in the 5T or 6T SRAM cell is used to program the connection or not-connection between (i) a first metal line, trace or net of the TISD, connecting to one or more micro copper pillars or bumps on or of one or more IC chips of the logic drive, and/or to the metal pillars or bumps on the TISD) and (ii) a second metal line, trace or net of the TISD, connecting or coupling to the metal pillar or bump, in a same or similar method described above. With this aspect of disclosure, metal pillars or bumps on or over the TISD are programmable; in other words, this aspect of disclosure provides programmable metal pillars or bumps on or over the TISD. The programmable metal pillar or bump may, alternatively, use the programmable interconnection, comprising 5T or 6T SRAM cells and cross-point switches, on or of the FPGA IC chips in or of the logic drive. The programmable metal pillar or bump may be connected or coupled, by programming, to one or more micro copper pillars or bumps of one or more IC chips (therefor to the metal lines or traces of the SISC and/or the FISC, and/or the transistors) of the logic drive.

The DPSRAM chip is designed, implemented and fabricated using varieties of semiconductor technology nodes or generations, including old or matured technology nodes or generations, for example, a semiconductor node or generation less advanced than or equal to, or above or equal to 35 nm, 40 nm, 50 nm, 90 nm, 130 nm, 250 nm, 350 nm, 500 nm, or alternatively including advanced semiconductor technology nodes or generations, for example, a semiconductor node or generation more advanced than or equal to, or below or equal to 30 nm, 20 nm or 10 nm. The semiconductor technology node or generation used in the DPSRAM chip is 1, 2, 3, 4, 5 or greater than 5 nodes or generations older, more matured or less advanced than that used in the standard commodity FPGA IC chips packaged in the same logic drive. Transistors used in the DPSRAM chip may be a FINFET, a GAAFET, a Fully Depleted Silicon-on-insulator (FDSOI) MOSFET, a Partially Depleted Silicon-on-insulator (PDSOI) MOSFET or a conventional MOSFET. Transistors used in the DPSRAM chip may be different from that used in the standard commodity FPGA IC chips packaged in the same logic drive; for example, the DPSRAM chip may use the conventional MOSFET, while the standard commodity FPGA IC chips packaged in the same logic drive may use the FINFET or GAAFET; or the DPSRAM chip may use the Fully Depleted Silicon-on-insulator (FDSOI) MOSFET, while the standard commodity FPGA IC chips packaged in the same logic drive may use the FINFET or GAAFET.

Another aspect of the disclosure provides the logic drive in a multi-chip package format further comprising one or plural dedicated programmable interconnection and Cache SRAM (DPCSRAM) chip or chips. The DPCSRAM chip comprises (i) 5T or 6T SRAM cells and cross-point switches used for programming interconnection of the metal lines or traces of the TISD, and therefore programming the interconnection between circuits or interconnections of the standard commodity FPGA IC chips in or of the logic drive, and (ii) the conventional 6T SRAM cells used for cache memory. The programmable interconnections of the 5T or 6T cells and cross-point switches are described and specified above. Alternatively, the DPCSRAM chip comprising 5T or 6T SRAM cells and cross-point switches may be used for programmable interconnection of metal lines or traces of the TISD between the standard commodity FPGA IC chips and the TPVs (for example, the top surfaces of the TPVs) in the logic drive, in the same or similar method as described above. The stored (programming) data in the 5T or 6T SRAM cell is used to program the connection or not-connection between (i) a first metal line, trace, or net of the TISD, connecting to one or more micro copper pillars or bumps on or over one or more the IC chips of the logic drive, and/or to one or more metal pillars or bumps on or over the TISD of the logic drive, and (ii) a second metal line, trace or net of the TISD, connecting or coupling to TPV (for example, the top surface of the TPV), in a same or similar method described above. With this aspect of disclosure, TPVs are programmable; in other words, this aspect of disclosure provides programmable TPVs. The programmable TPVs may, alternatively, use the programmable interconnection, comprising 5T or 6T SRAM cells and cross-point switches, on or of the FPGA IC chips in or of the logic drive. The programmable TPV may be, by (software) programming, (i) connected or coupled to one or more micro copper pillars or bumps of one or more IC chips (therefor to the metal lines or traces of the SISC and/or the FISC, and/or the transistors) of the logic drive, and/or (ii) connected or coupled to one or more metal pillars or bumps on or over the TISD of the logic drive. When a copper pad (the bottom surface of the TPV, the bottom surface of the metal via in the polymer layer at the bottom portion of the TPV, or the bottom surface of the metal via in the bottom-most polymer layer of the BISD) at the backside of the logic drive is connected to the programmable TPV, the copper pad becomes a programmable coper pad. The programmable copper pad at the backside of the logic drive may be connected or coupled to, by programming and through the programmable TPV, (i) one or more micro copper pillars or bumps of one or more IC chips (therefor to the metal lines or traces of the SISC and/or the FISC, and/or the transistors) at the frontside of the logic drive, and/or (ii) one or more metal pillars or bumps on or over the TISD at the frontside of the logic drive. Alternatively, the DPCSRAM chip comprises 5T or 6T SRAM cells and cross-point switches may be used for programmable interconnection of metal lines or traces of the TISD between the metal pillars or bumps (copper pillars or bumps, solder bumps or gold bumps) on or over the TISDs of the logic drive and one or more micro copper pillars or bumps on or of one or more IC chips of the logic drive, in a same or similar method as described above. The stored (programming) data in the 5T or 6T SRAM cell is used to program the connection or not-connection between (i) a first metal line, trace or net of the TISD, connecting to one or more micro copper pillars or bumps on or of one or more IC chips of the logic drive, and/or to the metal pillars or bumps on the TISD) and (ii) a second metal line, trace or net of the TISD, connecting or coupling to the metal pillar or bump, in a same or similar method described above. With this aspect of disclosure, metal pillars or bumps on or over the TISD are programmable; in other words, this aspect of disclosure provides programmable metal pillars or bumps on or over the TISD. The programmable metal pillar or bump may, alternatively, use the programmable interconnection, comprising 5T or 6T SRAM cells and cross-point switches, on or of the FPGA IC chips in or of the logic drive. The programmable metal pillar or bump may be connected or coupled, by programming, to one or more micro copper pillars or bumps of one or more IC chips (therefor to the metal lines or traces of the SISC and/or the FISC, and/or the transistors) of the logic drive.

The 6T SRAM cell used as cache memory for data latch or storage comprises 2 transistors for bit and bit-bar data transfer, and 4 data-latch transistors for a data latch or storage node. The 6T SRAM cache memory cells provide the 2 transfer transistors for writing data into them and reading data stored in them. A sense amplifier is required for reading (amplifying or detecting) data from the cache memory cells. In comparison, the 5T or 6T SRAM cells used for the programmable interconnection or for the LUTs may not require the reading step, and no sense amplifier is required for sensing the data from the SRAM cell. The DPCSRAM chip comprises 6T SRAM cells for use as cache memory to store data during the processing or computing of the chips of the logic drive. The DPCSRAM chip is designed, implemented and fabricated using varieties of semiconductor technology nodes or generations, including old or matured technology nodes or generations, for example, a semiconductor node or generation less advanced than or equal to, or above or equal to 35 nm, 40 nm, 50 nm, 90 nm, 130 nm, 250 nm, 350 nm, 500 nm, or alternatively including advanced semiconductor technology nodes or generations, for example, a semiconductor node or generation more advanced than or equal to, or below or equal to 30 nm, 20 nm or 10 nm. The semiconductor technology node or generation used in the DPCSRAM chip is 1, 2, 3, 4, 5 or greater than 5 nodes or generations older, more matured or less advanced than that used in the standard commodity FPGA IC chips packaged in the same logic drive. Transistors used in the DPCRAM chip may be a FINFET, a GAAFET, a Fully Depleted Silicon-on-insulator (FDSOI) MOSFET, a Partially Depleted Silicon-on-insulator (PDSOI) MOSFET or a conventional MOSFET. Transistors used in the DPCSRAM chip may be different from that used in the standard commodity FPGA IC chips packaged in the same logic drive; for example, the DPCSRAM chip may use the conventional MOSFET, while the standard commodity FPGA IC chips packaged in the same logic drive may use the FINFET or GAAFET; or the DPCSRAM chip may use the Fully Depleted Silicon-on-insulator (FDSOI) MOSFET, while the standard commodity FPGA IC chips packaged in the same logic drive may use the FINFET or GAAFET.

Another aspect of the disclosure provides a standardized carrier, holder, molder or substrate, in the wafer form or panel form in the stock or in the inventory for use in the later processing in forming the standard commodity logic drive, as described and specified above. The standardized carrier, holder, molder or substrate comprises a fixed physical layout or design of copper pads at the backside of the carrier, holder, molder or substrate and the TPVs; and a fixed layout or design of the BISD if included in the carrier, holder, molder or substrate. The locations or coordinates of the copper pads and the TPVs in the carrier, holder, molder or substrate are the same; and, if there is the BISD, the design or interconnection of the BISD, for example, connection schemes between copper pads and the TPVs are the same for each of the standard commodity carrier, holder, molder or substrate. The standard commodity carrier, holder, molder or substrate in the stock or inventory is then used for forming the standard commodity logic drive by the process described and specified above, including process steps: (I) placing, holding, fixing or attaching the IC chips on or to the carrier, holder, molder or substrate with the side or surface of the chip with transistors faced up; (II) Applying a material, resin, or compound to fill the gaps between chips and cover the surfaces of chips by methods, for example, spin-on coating, screen-printing, dispensing or molding in the wafer or panel format. Applying a CMP process to planarize the surface of the applied material, resin or compound to a level where the top surfaces of all micro bumps or pillars on or of the chips are fully exposed; (III) forming the TISD; and (IV) forming the metal pillars or bumps on the TISD. The standard commodity carriers, holders, molder or substrates with a fixed layout or design may be used, customized for different applications by different designs or layouts of the TISD. The standard commodity carriers, holders, molders or substrates with a fixed layout or design may be used or customized, by software coding or programming, using the programmable TPVs, as described and specified above, for different applications. As described above, the data installed or programed in the 5T or 6T SRAM cells of the DPSRAM or DCPRAM chips may be used for programmable TPVs. The data installed or programed in the 5T or 6T SRAM cells of the FPGA IC chips may be alternatively used for programmable TPVs.

Another aspect of the disclosure provides the standardized commodity logic drive (for example, the single-layer-packaged logic drive) with a fixed design, layout or footprint of (i) the metal pillars or bumps (copper pillars or bumps, solder bumps or gold bumps) on the frontside, and (ii) copper pads (the bottom surface of the TPV, the bottom surface of the metal via in the polymer layer at the bottom portion of the TPV, or the bottom surface of the metal via in the bottom-most polymer layer of the BISD) on the backside of the standard commodity logic drive. The standardized commodity logic drive may be used, customized for different applications by software coding or programming, using the programmable metal pillars or bumps, and/or programmable copper pads (through programmable TPVs), as described and specified above, for different applications. As described above, the codes of the software programs are loaded, installed or programed in the 5T or 6T SRAM cells of the DPSRAM or DCPRAM chip for controlling cross-point switches of the same DPSRAM or DCPRAM chip in or of the standard commodity logic drive for different varieties of applications. Alternatively, the codes of the software programs are loaded, installed or programed in the 5T or 6T SRAM cells of one of the FPGA IC chips, in or of the logic drive in or of the standard commodity logic drive, for controlling cross-point switches of the same one FPGA IC chip for different varieties of applications. Each of the standard commodity logic drives with the same design, layout or footprint of the metal pillars or bumps, and the copper pads may be used for different applications, purposes or functions, by software coding or programming, using the programmable metal pillars or bumps, and/or programmable copper pads (through programmable TPVs) of the logic drive.

Another aspect of the disclosure provides the logic drive, either in the single-layer-packaged or in a stacked format, comprising IC chips, logic blocks, cells or elements (comprising LUTs, multiplexers, logic circuits, logic gates, and/or computing circuits) and/or memory cells or arrays, immersing in a super-rich interconnection scheme or environment. The logic blocks, cells or elements (comprising LUTs, multiplexers, logic circuits, logic gates, and/or computing circuits) and/or memory cells or arrays of each of the multiple standard commodity FPGA IC chips are immersed in a programmable 3D Immersive IC Interconnection Environment (IIIE); wherein (1) the FISC, the SISC, micro copper pillars or bumps on the SISC, the TISD, and metal pillars or bumps on the TISD are over them; (2) the BISD and the copper pads are under them; and (3) TPVs are surrounding them along the four edges of the FPGA IC chip, in which they are. The programmable 3D IIIE provides the super-rich interconnection scheme or environment, comprising the FISC, the SISC and micro copper pillars or bumps on, in or of the IC chips, and the TISD, the BISD, TPVs, copper pillars or bumps, solder bumps or gold bumps (at the TISD side), and/or copper pads (at the BISD side) on, in, or of the logic drive package. The programmable 3D IIIE provides a programmable 3-Dimension (3D) super-rich interconnection scheme or system: (1) the FISC, the SISC, the TISD, and/or the BISD provide the interconnection scheme or system in the x-y directions for interconnecting or coupling the logic blocks, cells or elements and/or memory cells or arrays in or of a same FPGA IC chip, or in or of different FPGA IC chips in or of the single-layer-packaged logic drive. The interconnection of metal lines or traces in the interconnection scheme or system in the x-y directions is programmable; (2) The metal structures including micro pillars or bumps on the SISC, copper pillars or bumps, solder bumps or gold bumps on the TISD, TPVs, and/or copper pads at the BISD provide the interconnection scheme or system in the z direction for interconnecting or coupling the logic blocks, cells or elements, and/or memory cells or arrays in or of different FPGA IC chips in or of different single-layer-packaged logic drives stacking-packaged in the stacked logic drive. The interconnection of the metal structures in the interconnection scheme or system in the z direction is also programmable. The programmable 3D IIIE provides an almost unlimited number of the transistors or logic blocks, cells or elements, interconnection metal lines or traces, and memory cells/switches at an extremely low cost. The programmable 3D IIIE similar or analogous to the human brain: (i) transistors and/or logic blocks, cells or elements (comprising logic gates, logic circuits, computing operators, computing circuits, LUTs, and/or multiplexers) are similar or analogous to the neurons (cell bodies) or the nerve cells; (ii) the metal lines or traces of the FISC and/or the SISC are similar or analogous to the dendrites connecting to the neurons (cell bodies) or nerve cells. The micro pillars or bumps connecting to the receivers for the inputs of the logic blocks, cells or elements (comprising, for example, logic gates, logic circuits, computing operators, computing circuits, LUTs, and/or multiplexers) in or of the FPGA IC chips are similar or analogous to the post-synaptic cells at the ends of the dendrites; (iii) the long distance connects formed by metal lines or traces of the FISC, the SISC, the TISD and/or the BISD, and the metal pillars or bumps, including the micro copper pillars or bumps on the SISC, metal pillars or bumps on TISD, TPVs, copper pads on or at BISD, are similar or analogous to the axons connecting to the neurons (cell bodies) or nerve cells. The micro pillars or bumps connecting the drivers or transmitters for the outputs of the logic blocks, cells or elements (comprising, for example, logic gates, logic circuits, computing operators, computing circuits, LUTs, and/or multiplexers) in or of the FPGA IC chips are similar or analogous to the pre-synaptic cells at the axons' terminals.

Another aspect of the disclosure provides the programmable 3D IIIE with similar or analogous connections, interconnection and/or functions of a human brain: (1) transistors and/or logic blocks, cells or elements (comprising, for example, logic gates, logic circuits, computing operators, computing circuits, LUTs, and/or multiplexers) are similar or analogous to the neurons (cell bodies) or the nerve cells; (2) The interconnection schemes and/or structures of the logic drives are similar or analogous to the axons or dendrites connecting or coupling to the neurons (cell bodies) or the nerve cells. The interconnection schemes and/or structures of the logic drives comprise (i) metal lines or traces of the FISC, the SISC, the TISD and/or BISD and/or (ii) micro copper pillars or bumps, metal pillars or bumps on the TISD, TPVs and/or copper pads at the backside. An axon-like interconnection scheme and/or structure of the logic drive is connected to the driving or transmitting output (a driver) of a logic unit or operator; and having a structure scheme or structure like a tree, comprising: (i) a trunk or stem connecting to the logic unit or operator; (ii) multiple branches branching from the stem, and the terminal of each branch may be connected or coupled to other logic units or operators. Programmable cross-point switches (5T or 6T SRAM cells/switches of the FPGA IC chips and/or of the DPSRAMs or DPCSRAMs) are used to control the connection or not-connection between the stem and each of the branches; (iii) sub-branches branching form the branches, and the terminal of each sub-branch may be connected or coupled to other logic units or operators. Programmable cross-point switches (5T or 6T SRAM cells/switches of the FPGA IC chips and/or of the DPSRAMs or DPCSRAMs) are used to control the connection or not-connection between a branch and each of its sub-branches. A dendrite-like interconnection scheme and/or structure of the logic drive is connected to the receiving or sensing input (a receiver) of a logic unit or operator; and having a structure scheme or structure like a shrub or bush comprising: (i) a short stem connecting to the logic unit or operator; (ii) multiple branches branching from the stem. Programmable switches (5T or 6T SRAM cells/switches of the FPGA IC chips and/or of the DPSRAMs or DPCSRAMs) are used to control the connection or not-connection between the stem and each of its branches. There are multiple dendrite-like interconnection scheme or structures connecting or coupling to the logic unit or operator. The end of each branch of the dendrite-like interconnection scheme or structure is connected or coupled to the terminal of a branch or sub-branch of the axon-like interconnection scheme or structure. The dendrite-like interconnection scheme and/or structure of the logic drive may comprise the FISCs and SISCs of the FPGA IC chips.

Another aspect of the disclosure provides a standard commodity memory drive, package, package drive, device, module, disk, disk drive, solid-state disk, or solid-state drive (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity non-volatile memory IC chips for use in data storage. The data stored in the standard commodity non-volatile memory drive are kept even if the power supply of the drive is turned off. The plural non-volatile memory IC chips comprise NAND or NOR flash chips, in a bare-die format or in a package format. Alternatively, the plural non-volatile memory IC chips may comprise Non-Volatile Radom-Access-Memory (NVRAM) IC chips, in a bare-die format or in a package format. The NVRAM may be a Ferroelectric RAM (FRAM), Magnetoresistive RAM (MRAM), or Phase-change RAM (PRAM). The standard commodity memory drive is formed by the FOIT, using same or similar process steps of the FOIT in forming the standard commodity logic drive, as described and specified in the above paragraphs. The process steps of the FOIT are highlighted below: (I) Providing non-volatile memory IC chips, for example, standard commodity NAND or NOR flash IC chips, and a chip carrier, holder, molder or substrate; and then placing, fixing or attaching the IC chips to and on the carrier, holder or substrate. Each of the plural NAND flash chips may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. Each of the one or more NOR flash chips may have a standard memory density, capacity or size of greater than or equal to 1 Mb, 4 Mb, 16 Mb, 64 Mb, 128 Mb, 256 Mb, 512 Mb, 1 Gb, 4 Gb, or 16 Gb, wherein "b" is bits. The NAND flash chip may be designed and fabricated using advanced NAND flash technology nodes or generations, for example, more advanced than or equal to 45 nm, 28 nm, 20 nm, 16 nm, and/or 10 nm, wherein the advanced NAND flash technology may comprise Single Level Cells (SLC) or multiple level cells (MLC) (for example, Double Level Cells DLC, or triple Level cells TLC), and in a 2D-NAND or a 3D NAND structure. The 3D NAND structures may comprise multiple stacked layers or levels of NAND cells, for example, greater than or equal to 4, 8, 16, 32 stacked layers or levels of NAND cells. Each of the plural NAND flash chips to be packaged in the memory drives may comprise micro copper pillars or bumps on the top surfaces of the chips. The top surfaces of micro copper pillars or bumps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 jam, 5 μm or 3 μm. The chips are placed, held, fixed or attached on or to the carrier, holder, molder or substrate with the side or surface of the chip with transistors faced up; (II) Applying a material, resin, or compound to fill the gaps between chips and cover the surfaces of chips by methods, for example, spin-on coating, screen-printing, dispensing or molding in the wafer or panel format. Applying a CMP process to planarize the surface of the applied material, resin or compound to a level where the top surfaces of all micro bumps or pillars on or of the chips are fully exposed; (III) Forming a Top Interconnection Scheme in, on or of the memory drive (TISD) on or over the planarized material, resin or compound and on or over the exposed top surfaces of the micro pillars or bumps by a wafer or panel processing; (IV) Forming copper pillars or bumps, solder bumps, or gold bumps on or over the TISD, (V) Separating, cutting or dicing the finished wafer or panel, including separating, cutting or dicing through the material, resin or compound between two neighboring memory drives. The material, resin or compound (for example, polymer) filling gaps between chips of two neighboring memory drives is separated, cut or diced to from individual unit of memory drives.

Another aspect of the disclosure provides a standard commodity memory drive in a multi-chip package comprising plural standard commodity non-volatile memory IC chips may further comprise the dedicated control chip, the dedicated I/O chip, or the dedicated control and I/O chip; for use in data storage. The data stored in the standard commodity non-volatile memory drive are kept even if the power supply of the drive is turned off. The plural non-volatile memory IC chips comprise NAND or NOR flash chips, in a bare-die format or in a package format. Alternatively, the plural non-volatile memory IC chips may comprise Non-Volatile Radom-Access-Memory (NVRAM) IC chips, in a bare-die format or in a package format. The NVRAM may be a Ferroelectric RAM (FRAM), Magnetoresistive RAM (MRAM), or Phase-change RAM (PRAM). The functions of the dedicated control chip, the dedicated I/O chip, or the dedicated control and I/O chip are for the memory control and/or inputs/outputs, and are the same or similar to that described and specified in the above paragraphs for the logic drive. The communication, connection or coupling between the non-volatile memory IC chips, for example the NAND or NOR flash chips, and the dedicated control chip, the dedicated I/O chip, or the dedicated control and I/O chip in a same memory drive is the same or similar to that described and specified in the above paragraphs for the logic drive. The standard commodity NAND or NOR flash IC chips may be fabricated using an IC manufacturing technology node or generation different from that used for manufacturing the dedicated control chip, the dedicated I/O chip, or the dedicated control and I/O chip used in the same memory drive. The standard commodity NAND or NOR flash IC chips comprise small I/O circuits, while the dedicated control chip, the dedicated I/O chip, or the dedicated control and I/O chip used in the memory drive may comprise large I/O circuits, as descried and specified for the logic drive. The standard commodity memory drive comprising the dedicated control chip, the dedicated I/O chip, or the dedicated control and I/O chip is formed by the FOIT, using same or similar process steps of the FOIT in forming the logic drive, as described and specified in the above paragraphs.

Another aspect of the disclosure provides the stacked non-volatile (for example, NAND or NOR flash) memory drive comprising plural single-layer-packaged non-volatile memory drives, as described and specified above, each in a multiple-chip package. The single-layer-packaged non-volatile memory drive with TPVs for use in the stacked non-volatile memory drive may be in a standard format or having standard sizes. For example, the single-layer-packaged non-volatile memory drive may be in a shape of square or rectangle, with a certain widths, lengths and thicknesses. An industry standard may be set for the shape and dimensions of the single-layer-packaged non-volatile memory drive. For example, the standard shape of the single-layer-packaged non-volatile memory drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the non-volatile memory drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The stacked non-volatile memory drive may comprise, for example 2, 3, 4, 5, 6, 7, 8 or greater than 8 single-layer-packaged non-volatile memory drives, and may be formed by the similar or the same process steps as described and specified in forming the stacked logic drive. The single-layer-packaged non-volatile memory drives comprise TPVs for the stacking assembly purpose. The process steps for forming TPVs, and the specifications of TPVs are as described and specified in the above paragraphs for use in the stacked logic drive. The stacking methods (for example, POP) using TPVs are as described and specified in above paragraphs for the stacked logic drive.

Another aspect of the disclosure provides a standard commodity memory drive in a multi-chip package comprising plural standard commodity volatile memory IC chips for use in data storage; wherein the plural volatile memory IC chips comprise DRAM chips, in a bare-die format or in a package format. The standard commodity DRAM memory drive is formed by the FOIT, using same or similar process steps of the FOIT in forming the logic drive, as described and specified in the above paragraphs. The process steps are highlighted below: (I) Providing standard commodity DRAM IC chips, and a chip carrier, holder, molder or substrate; and then placing, fixing or attaching the IC chips to and on the carrier, holder or substrate. Each of the plural DRAM chips may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. The DRAM chip may be designed and fabricated using advanced DRAM technology nodes or generations, for example, more advanced than or equal to 45 nm, 28 nm, 20 nm, 16 nm, and/or 10 nm. All DRAM chips to be packaged in the memory drives may comprise micro copper pillars or bumps on the top surfaces of the chips. The top surfaces of micro copper pillars or bumps are at a level above the level of the top surface of the top-most insulating dielectric layer of the chips with a height of, for example, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. The chips are placed, held, fixed or attached on or to the carrier, holder, molder or substrate with the side or surface of the chip with transistors faced up; (II) Applying a material, resin, or compound to fill the gaps between chips and cover the surfaces of chips by methods, for example, spin-on coating, screen-printing, dispensing or molding in the wafer or panel format. Applying a CMP process to planarize the surface of the applied material, resin or compound to a level where the top surfaces of all micro bumps or pillars on or of the chips are fully exposed; (III) Forming a Top Interconnection Scheme in, on or of the memory drive (TISD) on or over the planarized material, resin or compound and on or over the exposed top surfaces of the micro pillars or bumps by a wafer or panel processing; (IV) Forming copper pillars or bumps, solder bumps, or gold bumps on or over the TISD, (V) Separating, cutting or dicing the finished wafer or panel, including separating, cutting or dicing through the material, resin or compound between two neighboring memory drives. The material, resin or compound (for example, polymer) filling gaps between chips of two neighboring memory drives is separated, cut or diced to from individual unit of memory drives.

Another aspect of the disclosure provides a standard commodity memory drive in a multi-chip package comprising plural standard commodity volatile IC chips may further comprise the dedicated control chip, the dedicated I/O chip, or the dedicated control and I/O chip; for use in data storage; wherein the plural volatile memory IC chips comprise DRAM chips, in a bare-die format or in a DRAM package format. The functions of the dedicated control chip, the dedicated I/O chip, or the dedicated control and I/O chip used in the memory drive are for the memory control and/or inputs/outputs, and are the same or similar to that described and specified in the above paragraphs for the logic drive. The communication, connection or coupling between the DRAM chips and the dedicated control chip, the dedicated I/O chip, or the dedicated control and I/O chip in a same memory drive is the same or similar to that described and specified in the above paragraphs for the logic drive. The standard commodity DRAM IC chips may be fabricated using an IC manufacturing technology node or generation different from that used for manufacturing the dedicated control chip, the dedicated I/O chip, or the dedicated control and I/O chip. The standard commodity DRAM chips comprise small I/O circuits, while the dedicated control chip, the dedicated I/O chip, or the dedicated control and I/O chip used in the memory drive may comprise large I/O circuits, as descried and specified above for the logic drive. The standard commodity memory drive is formed by the same or similar process steps as that in forming the logic drive, as described and specified in the above paragraphs.

Another aspect of the disclosure provides the stacked volatile (for example, DRAM) memory drive comprising plural single-layer-packaged volatile memory drives, as described and specified above, each in a multiple-chip package. The single-layer-packaged volatile memory drive with TPVs for use in the stacked volatile memory drive may be in a standard format or having standard sizes. For example, the single-layer-packaged volatile memory drive may be in a shape of square or rectangle, with a certain widths, lengths and thicknesses. An industry standard may be set for the shape and dimensions of the single-layer-packaged volatile memory drive. For example, the standard shape of the single-layer-packaged volatile memory drive may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm, or 5 mm. Alternatively, the standard shape of the volatile memory drive may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm, or 5 mm. The stacked volatile memory drive may comprise, for example 2, 3, 4, 5, 6, 7, 8 or greater than 8 single-layer-packaged volatile memory drives, and may be formed by the similar or the same process steps as described and specified in forming the stacked logic drive. The single-layer-packaged volatile memory drives may comprise TPVs for the stacking assembly purpose. The process steps for forming TPVs, and the specifications of TPVs are described and specified in the above paragraphs for use in the stacked logic drive. The stacking methods (for example, POP) using TPVs are as described and specified in above paragraphs for the stacked logic drive.

Another aspect of the disclosure provides the stacked logic and volatile (for example, DRAM) memory drive comprising plural single-layer-packaged logic drives and plural single-layer-packaged volatile memory drives, each in a multiple-chip package, as described and specified above. Each of plural single-layer-packaged logic drives and each of plural single-layer-packaged volatile memory drives may be in a same standard format or having a same standard shape, size and dimension, as described and specified in above. The stacked logic and volatile-memory drive may comprise, for example 2, 3, 4, 5, 6, 7, 8 or greater than 8 single-layer-packaged logic drives or volatile-memory drives (in total), and may be formed by the similar or the same process steps as described and specified in forming the stacked logic drive. The stacking sequence, from bottom to top, may be: (a) all single-layer-packaged logic drives at the bottom and all single-layer-packaged volatile memory drives at the top, or (b) single-layer-packaged logic drives and single-layer-packaged volatile drives are stacked interlaced or interleaved layer over layer, from bottom to top, in sequence: (i) single-layer-packaged logic drive, (ii) single-layer-packaged volatile memory drive, (iii) single-layer-packaged logic drive, (iv) single-layer-packaged volatile memory, and so on. The single-layer-packaged logic drives and single-layer-packaged volatile memory drives used in the stacked logic and volatile-memory drives, each comprises TPVs for the stacking assembly purpose. The process steps for forming TPVs, and the specifications of TPVs are described and specified in the above paragraphs. The stacking methods (POP) using TPVs are as described and specified in above paragraphs.

Another aspect of the disclosure provides the stacked non-volatile (for example, NAND or NOR flash) and volatile (for example, DRAM) memory drive comprising plural single-layer-packaged non-volatile drives and plural single-layer-packaged volatile memory drives, each in a multiple-chip package, as described and specified in above paragraphs. Each of plural single-layer-packaged non-volatile drives and each of plural single-layer-packaged volatile memory drives may be in a same standard format or having a same standard shape, size and dimension, as described and specified above. The stacked non-volatile and volatile-memory drive may comprise, for example 2, 3, 4, 5, 6, 7, 8 or greater than 8 single-layer-packaged non-volatile memory drives or single-layer-packaged volatile-memory drives (in total), and may be formed by the similar or the same process steps as described and specified in forming the stacked logic drive. The stacking sequence, from bottom to top, may be: (a) all single-layer-packaged volatile memory drives at the bottom and all single-layer-packaged non-volatile memory drives at the top, (b) all single-layer-packaged non-volatile memory drives at the bottom and all single-layer-packaged volatile memory drives at the top, or (c) single-layer-packaged non-volatile memory drives and single-layer-packaged volatile drives are stacked interlaced or interleaved layer over layer, from bottom to top, in sequence: (i) single-layer-packaged volatile memory drive, (ii) single-layer-packaged non-volatile memory drive, (iii) single-layer-packaged volatile memory drive, (iv) single-layer-packaged non-volatile memory, and so on. The single-layer-packaged non-volatile drives and single-layer-packaged volatile memory drives used in the stacked non-volatile and volatile-memory drives, each comprises TPVs for the stacking assembly purpose. The process steps for forming TPVs, and the specifications of TPVs are described and specified in the above paragraphs for use in the stacked logic drive. The stacking methods (POP) using TPVs are as described and specified in above paragraphs for forming the stacked logic drive.

Another aspect of the disclosure provides the stacked logic, non-volatile (for example, NAND or NOR flash) memory and volatile (for example, DRAM) memory drive comprising plural single-layer-packaged logic drives, plural single-layer-packaged non-volatile memory drives and plural single-layer-packaged volatile memory drives, each in a multiple-chip package, as described and specified above. Each of plural single-layer-packaged logic drives, each of plural single-layer-packaged non-volatile memory drives and each of plural single-layer-packaged volatile memory drives may be in a same standard format or having a same standard shape, size and dimension, as described and specified above. The stacked logic, non-volatile (NAND or NOR flash) memory and volatile (DRAM) memory drive may comprise, for example 2, 3, 4, 5, 6, 7, 8 or greater than 8 single-layer-packaged logic drives, single-layer-packaged non-volatile-memory drives or single-layer-packaged volatile-memory drives (in total), and may be formed by the similar or the same process steps as described and specified in forming the stacked logic drive. The stacking sequence is, from bottom to top, for example: (a) all single-layer-packaged logic drives at the bottom, all single-layer-packaged volatile memory drives in the middle, and all single-layer-packaged non-volatile memory drives at the top, or, (b) single-layer-packaged logic drives, single-layer-packaged volatile memory drives, and single-layer-packaged non-volatile memory drives are stacked interlaced or interleaved layer over layer, from bottom to top, in sequence: (i) single-layer-packaged logic drive, (ii) single-layer-packaged volatile memory drive, (iii) single-layer-packaged non-volatile memory drive, (iv) single-layer-packaged logic drive, (v) single-layer-packaged volatile memory, (vi) single-layer-packaged non-volatile memory drive, and so on. The single-layer-packaged logic drives, single-layer-packaged volatile memory drives, and single-layer-packaged volatile memory drives used in the stacked logic, non-volatile-memory and volatile-memory drives, each comprises TPVs for the stacking assembly purpose. The process steps for forming TPVs, and the specifications of TPVs are described and specified in the above paragraphs for use in the stacked logic drive. The stacking methods (POP) using TPVs are as described and specified in above paragraphs for forming the stacked logic drive. The single-layer-packaged non-volatile memory drive in the stacked logic drive comprises non-volatile memory IC chips comprising a NAND flash chip or chips and/or a NOR flash chip or chips. The NAND flash chip or chips and/or a NOR flash chip or chips in the single-layer-packaged non-volatile memory drive in the stacked logic drive are used for: (a) storing data, information, programming codes or resulting values for configuring the FPGA chip or chips in the in the single-layer-packaged logic drive in the stacked logic drive. The NAND and/or NOR chip or chips in the single-layer-packaged non-volatile memory drive in the stacked logic drive are used for storing configuration data for a logic circuit (including resulting values for the LUTs and data for configuring the multiplexers of the logic circuit to select resulting values from the corresponding the LUTs) of the FPGA chip or chips in the single-layer-packaged logic drive in the stacked logic drive, and/or storing programing codes for switches (including pass/no-pass gates and multiplexers of the switches) of the FPGA chip or chips in the single-layer-packaged logic drive in the stacked logic drive; (b) storing data or information for the operation of the FPGA chip or chips in the single-layer-packaged logic drive in the stacked logic drive, note that the FPGA chip or chips in (b) have been configured for given operations or functions. In an embodiment, the stacked logic drive may comprise a single-layer-packaged non-volatile memory drive comprising the NOR flash chip and the NAND flash chip, wherein the NOR flash chip is used for storing data or information for configuring the FPGA chip or chips in the single-layer-packaged logic drive in the stacked logic drive, and the NAND flash chip is used for storing data or information for the operation of the FPGA chip or chips in the single-layer-packaged logic drive in the stacked logic drive.

Another aspect of the disclosure provides a system, hardware, electronic device, computer, processor, mobile phone, communication equipment, and/or robot comprising the logic drive, the non-volatile (for example, NAND or NOR flash) memory drive, and/or the volatile (for example, DRAM) memory drive. The logic drive may be the single-layer-packaged logic drive or the stacked logic drive, as described and specified above; the non-volatile flash memory drive may be the single-layer-packaged non-volatile flash memory drive or the stacked non-volatile flash memory drive as described and specified above; and the volatile DRAM memory drive may be the single-layer-packaged DRAM memory drive or the stacked volatile DRAM memory drive as described and specified above. The logic drive, the non-volatile flash memory drive, and/or the volatile DRAM memory drive are flip-package assembled on a Printed Circuit Board (PCB), a Ball-Grid-Array (BGA) substrate, a flexible circuit film or tape, or a ceramic circuit substrate.

Another aspect of the disclosure provides a logic and memory drive in a stacked package or device comprising the single-layer-packaged logic drive and the single-layer-packaged memory drive. The single-layer-packaged logic drive is as described and specified above, and is comprising one or more FPGA IC chips, one or more non-volatile NAND or NOR flash memory chips, the DPSRAMs or DPCSRAMs, dedicated control chip, the dedicated I/O chip, and/or the dedicated control and I/O chip. The single-layer-packaged logic drive may be further comprising one or more of the processing and/or computing IC chips, for example, one or more CPU chips, GPU chips, DSP chips, and/or TPU chips. The single-layer-packaged memory drive is as described and specified above, and is comprising one or more high speed, high bandwidth cache SRAM chips, one or more DRAM chips, or one or more NVM chips for high speed parallel processing and/or computing. The one or more high speed, high bandwidth NVMs may comprise MRAM or RRAM. The single-layer-packaged logic drive, as described and specified above, is formed using the FOIT technology. For high speed, high bandwidth communications with the memory chips of the single-layer-packaged memory drive, stacked vias (in or of the TISD) directly and vertically on or over the micro copper pillars or bumps on or over the SISC and/or FISC of the IC chips are formed, and metal pillars or bumps on the front side of the logic drive (the side of the IC chips with transistors are facing up) are formed directly and vertically on or over the stacked vias of the TISD. Multiple stacked structures in or of the logic drive, each for a bit data of the high speed, wide bit-width buses, are formed, from top to the bottom, comprise: (i) metal pillars or bumps on or over the TISD; (ii) stacked vias by stacking metal vias and metal layers of the TISD; (iii) micro copper pillars or bumps on or over the SISC and/or FISC. The number of stacked structures for each IC chip (that is the data bit-width between each logic chip and each high speed, high bandwidth memory chip) is equal or greater than 64, 128, 256, 512, 1024, 2048, 4096, 8 K, or 16 K for high speed, high bandwidth parallel processing and/or computing. Similarly, multiple stacked structures are formed in the single-layer-packaged memory drive. The single-layer-packaged logic drive is the flip-package assembled or packaged on or to the single-layer-packaged memory chip, with the side with transistor of IC chips in the logic drive faced down, and the side with transistor of IC chips in the memory drive faced up. Therefore, a micro copper/solder pillar or bump on or of a FPGA IC, CPU, GPU, DSP and/or TPU chip can be connected or coupled, with the shortest distance, to a micro copper/solder pillar or bump on a memory chip, for example, DRAM, SRAM or NVM, through: (i) micro copper pads, pillars or bumps on or under the SISC and/or FISC of the single-layer-packaged logic drive; (ii) stacked vias by stacking metal vias and metal layers of the TISD of the single-layer-packaged logic drive; (iii) metal pads, pillars, or bumps on or under the TISD of the single-layer-packaged logic drive; (iv) metal pads, pillars, or bumps on or over the TISD of the single-layer-packaged memory drive; (v) stacked vias by stacking metal vias and metal layers of the TISD of the single-layer-packaged memory drive; (vi) micro copper pads, pillars or bumps on or over the SISC and/or FISC of the single-layer-packaged logic drive. With the TPVs and/or BISDs for both the single-layer-packaged logic drive and the single-layer-packaged memory drive, the stacked logic and memory drive or device can communicate, connect or couple to the external circuits or components from the top side (the backside of the single-layer-packaged logic drive, with the side with transistor of IC chips in the single-layer-packaged logic drive faced down) and the bottom side (the backside of the single-layer-packaged memory drive, the side with transistor of IC chips in the single-layer-packaged memory drive faced up) of the stacked logic and memory drive or device. Alternatively, the TPVs and/or BISDs for the single-layer-packaged logic drive may be omitted; and the stacked logic and memory drive or device can communicate, connect or couple to the external circuits or components from the bottom side (the backside of the single-layer-packaged memory drive, the side with transistor of IC chips in the single-layer-packaged memory drive faced up) of the stacked the stacked logic and memory drive or device, through the TPVs and/or BISD of the single-layer-packaged memory drive. Alternatively, the TPVs and/or BISDs for the single-layer-packaged memory drive may be omitted; and the stacked logic and memory drive or device can communicate, connect or couple to the external circuits or components from the top side (the backside of the single-layer-packaged logic drive, the side with transistor of IC chips in the single-layer-packaged logic drive faced up) of the stacked logic and memory drive or device, through the TPVs and/or BISD of the single-layer-packaged logic drive.

In all of the above alternatives for the logic and memory drive or device, the single-layer-packaged logic drive may comprise one or more of the processing and/or computing IC chips, and the single-layer-packaged memory drive may comprise one or more high speed, high bandwidth cache SRAM chips, DRAM chips, or NVM chips (for example, MRAM or RRAM) for high speed parallel processing and/or computing. For example, the single-layer-packaged logic drive may comprise multiple GPU chips, for example 2, 3, 4 or more than 4 GPU chips, and the single-layer-packaged memory drive may comprise multiple high speed, high bandwidth cache SRAM chips, DRAM chips, or NVM chips. The communication between one of GPU chips and one of SRAM, DRAM or NVM chips through the stacked structures described and specified above, may be with data bit-width equal or greater than 64, 128, 256, 512, 1024, 2048, 4096, 8 K, or 16 K. For another example, the logic drive may comprise multiple TPU chips, for example 2, 3, 4 or more than 4 TPU chips, and the single-layer-packaged memory drive may comprise multiple high speed, high bandwidth cache SRAM chips, DRAM chips or NVM chips. The communication between one of TPU chips and one of SRAM chips, DRAM chips or NVM chips through the stacked structures described and specified above, may be with data bit-width equal or greater than 64, 128, 256, 512, 1024, 2048, 4096, 8 K, or 16 K. For another example, the logic drive may comprise multiple FPGA IC chips, for example 2, 3, 4 or more than 4 FPGA IC chips, and the single-layer-packaged memory drive may comprise multiple high speed, high bandwidth cache SRAM chips, DRAM chips or NVM chips. The communication between one of FPGA IC chips and one of SRAM chips, DRAM chips or NVM chips through the stacked structures described and specified above, may be with data bit-width equal or greater than 64, 128, 256, 512, 1024, 2048, 4096, 8 K, or 16 K.

The communication, connection, or coupling between one of FPGA IC chips, and/or processing and/or computing chips (for example, CPU, GPU, DSP, APU, TPU, and/or ASIC chips) and one of high speed, high bandwidth SRAM, DRAM or NVM chips through the stacked structures described and specified above, may be the same or similar as that between internal circuits in a same chip. Alternatively, the communication, connection, or coupling between (i) one of FPGA IC chips, and/or processing and/or computing chips (for example, CPU, GPU, DSP, APU, TPU, and/or ASIC chips) and (ii) one of high speed, high bandwidth SRAM, DRAM or NVM chips through the stacked structures described and specified above, may be using small I/O drivers and/or receivers. The driving capability, loading, output capacitance, or input capacitance of the small I/O drivers or receivers, or I/O circuits may be between 0.01 pF and 10 pF, 0.05 pF and 5 pF, 0.01 pF and 2 pF or 0.01 pF and 1 pF; or smaller than 10 pF, 5 pF, 3 pF, 2 pF, 1 pF, 0.5 pF or 0.1 pF. For example, a bi-directional (or tri-state) I/O pad or circuit may be used for the small I/O drivers or receivers, or I/O circuits for communicating between high speed, high bandwidth logic and memory chips in the logic and memory stacked drive, and may comprise an ESD circuit, a receiver, and a driver, and may have an input capacitance or output capacitance between 0.01 pF and 10 pF, 0.05 pF and 5 pF, 0.01 pF and 2 pF or 0.01 pF and 1 pF; or smaller than 10 pF, 5 pF, 3 pF, 2 pF, 1 pF, 0.5 pF or 0.1 pF.

Another aspect of the disclosure provides a Fan-Out Interconnection Technology (FOIT) with the TISD and TPVs for making or fabricating a single-chip package, wherein the single-chip package may be used as a chiplet. The single-chip package (chiplet) is formed using the same or similar process steps as forming the multichip package with the TISD and the TPVs as described and specified above, except:

(A) In Step (I), the semiconductor IC chips placed, fixed or attached to the carrier, holder, molder or substrate for a process batch may be of a same product or device of the semiconductor IC chip. For example, the semiconductor chips used in one wafer or panel process batch may be of only one of following products or devices: a standard commodity FPGA chip, a dedicated control chip, a dedicated I/O chip, a dedicated control and I/O chip, a CPU chip, a GPU chip, a DSP chip, an APU chip, a TPU chip, an IAC chip, an ASIC chip, a NAND or NOR non-volatile flash memory chip, a High-Bandwidth Memory (HBM) chip comprising a DRAM memory chip, a SRAM memory chip, a MRAM memory chip or a RRAM memory chip, an analog IC chip, a mixed mode IC chip or an RF IC chip.

(B) In Step (V), separating, cutting or dicing the finished wafer or panel, to form a unit of single-chip package, wherein the unit of the single-chip package comprises only one semiconductor IC chip, the TISD and TPVs.

The single-chip package has metal pads, bumps or pillars in an area array at the bottom side and under the TISD of the single-chip package (the side which the frontside of semiconductor IC chip with transistors is facing), wherein the metal pads, bumps or pillars connecting or coupling to the semiconductor IC chip may be vertically under the semiconductor IC chip. The top surfaces of the TPVs of the single-chip package are used as metal pads for package-on-package assembly, wherein the metal pads are in the peripheral area and at the top side (the side which the backside of semiconductor IC chip without transistors is facing) of the single chip package. In an embodiment, the single-chip package or chiplet has solder bumps (with height between 20 μm and 100 μm) or copper pillars with solder caps (with height between 20 μm and 100 μm) in an area array at the bottom side, wherein the solder bumps or copper pillars with solder caps connecting or coupling to the semiconductor IC chip may be vertically under the semiconductor IC chip. The single-chip package or chiplet has metal pads (the exposed top surfaces of the TPVs) in the peripheral area at the top side. Alternatively, the metal pads (with a thickness between 1 μm and 10 μm) may be formed at the top side of the single-chip package or chiplet in area array, wherein the metal pads are at the tops of the TPVs, and at the area vertically over the semiconductor IC chip, wherein metal pads vertically over the semiconductor IC chip are dummy and not connecting or coupling to the semiconductor IC chip.

The disclosed single-chip package or chiplet may be used for the multi-chip packages or for the heterogeneous integration. The single-chip package or chiplet may have a standard in the design, layout or locations of the solder bumps (with height between 20 μm and 100 μm) or copper pillars with solder caps (with height between 20 μm and 100 μm) under the TISD, and the metal pads (the exposed top surfaces of the TPVs) in the peripheral area. Alternatively, the single-chip package or chiplet may have a standard in the design, layout or locations of the solder bumps (with height between 20 μm and 100 μm) or copper pillars with solder caps (with height between 20 μm and 100 μm) under the TISD, and the metal pads (with height between 1 μm and 10 μm) in the area array, with some dummy metal pads vertically over the semiconductor IC chip in the chiplet.

Another aspect of the disclosure provides a Fan-Out Interconnection Technology (FOIT) with the TISD, BISD and TPVs for making or fabricating a single-chip package, wherein the single-chip package may be used as a chiplet. The single-chip package (chiplet) is formed using the same or similar process steps as forming the multichip package with the TISD, BISD and TPVs as described and specified above, except:

(A) In Step (I), the semiconductor IC chips placed, fixed or attached to the carrier, holder, molder or substrate for a process batch may be of a same product or device of the semiconductor IC chip. For example, the semiconductor chips used in one wafer or panel process batch may be of only one of following products or devices: a standard commodity FPGA chip, a dedicated control chip, a dedicated I/O chip, a dedicated control and I/O chip, a CPU chip, a GPU chip, a DSP chip, an APU chip, a TPU chip, an IAC chip, an ASIC chip, a NAND or NOR non-volatile flash memory chip, a High-Bandwidth Memory (HBM) chip comprising a DRAM memory chip, a SRAM memory chip, a MRAM memory chip or a RRAM memory chip, an analog IC chip, a mixed mode IC chip or an RF IC chip.

(B) In Step (V), separating, cutting or dicing the finished wafer or panel, to form a unit of single-chip package, wherein the unit of the single-chip package comprises only one semiconductor IC chip, the TISD, BISD and TPVs.

The single-chip package or chiplet has the metal pads, bumps or pillars in an area array at the bottom side and under the TISD (the side which the frontside of semiconductor IC chip with transistors is facing), and the metal pads, bumps or pillars also in an area array over the BISD (the side which the backside of semiconductor IC chip without transistors is facing). The metal pads, bumps or pillars under the TISD may be at locations vertically under the semiconductor IC chip, and the metal pads, bumps or pillars over the BISD may be at locations vertically over the semiconductor IC chip. The metal pads, bumps or pillars under the TISD may couple to the semiconductor IC chip. The metal pads, bumps or pillars over the BISD and vertically over the semiconductor IC chip may couple to the transistors of the semiconductor IC chip at the front side through the TPVs. The metal pads, bumps or pillars under the TISD may couple to the metal pads, bumps or pillars over the BISD through the TPVs. In an embodiment, the single-chip package or chiplet may have solder bumps (with height between 20 μm and 100 μm) or copper pillars with solder caps (with height between 20 μm and 100 μm) in an area array under the TISD, wherein the solder bumps or copper pillars with solder caps connecting or coupling to the semiconductor IC chip may be vertically under the semiconductor IC chip. The single-chip package or chiplet may have metal pads (with a thickness between 1 μm and 10 μm) in an area over the BISD, wherein the metal pads connecting or coupling to the semiconductor IC chip through the TPVs may be vertically over the semiconductor IC chip. The metal pads over the BISD may couple to the solder bumps or copper pillars with solder caps under the TISD through the TPVs.

The disclosed single-chip package or chiplet may be used for the multi-chip packages or for the heterogeneous integration. The single-chip package or chiplet may have a standard in the design, layout or locations of the solder bumps (with height between 20 μm and 100 μm) or copper pillars with solder caps (with height between 20 μm and 100 μm) under the TISD, and metal pads (with a thickness between 1 μm and 10 μm) over the BISD.

Another aspect of the disclosure provides a chip package used as a non-volatile programmable device (a non-volatile programmable stacked logic drive) comprising (a) a first chiplet (a single-chip package) comprising a FPGA IC chip, and (b) a second chiplet (a single-chip package) comprising a non-volatile memory chip, wherein the first and second chiplets are formed as described and specified above. The second chiplet may be stacked assembled over and on the first chiplet using a package-on-package (POP) assembly method, wherein the package-on-package assembly method is the same as described and specified above. Alternatively, the first chiplet may be stacked assembled over and on the second chiplet using the package-on-package assembly method. The first chiplet and the second chiplet may be one of the chiplets (the single-chip packages) described and specified above: (a1) the chiplet or single-chip package with TISD and TPVs and having the solder bumps or copper pillars with solder caps under the TISD, and metal pads in the peripheral area at the tops of the TPVs; (a2) the chiplet or single-chip package with TISD and TPVs and having the solder bumps or copper pillars with solder caps under the TISD, and metal pads over the tops of the TPVs and the backside of the chip (dummy metal pads); (b) the chiplet or single-chip package with TISD, BISD and TPVs and having the solder bumps or copper pillars with solder caps under the TISD, and metal pads over the BISD. In the case that the second chiplet is over and on the first chiplet, the solder bumps or copper pillars with solder caps of the second chiplet is assembled and bonded to the metal pads of the first chiplet. In the case that the first chiplet is over and on the second chiplet, the solder bumps or copper pillars with solder caps of the first chiplet is assembled and bonded to the metal pads of the second chiplet. The solder bumps or copper pillars with solder caps under the TISD, and metal pads over the TPVs or the BISD are described and specified above.

The non-volatile memory IC chip in the second chiplet of the chip package (the package-on-package chip package) comprises a NAND flash chip or a NOR flash chip. The NAND flash chip or the NOR flash chip in the second chiplet is used for: (a) storing data or information for configuring the FPGA IC chip in the first chiplet of the chip package. The NAND and/or NOR chip or chips in the second chiplet is used for storing resulting values for the LUTs and configuration data for multiplexers associated with the LUTs of the FPGA chip in the first chiplet of the chip package, and/or storing programing codes for switches (including pass/no-pass gates and multiplexers associated with the switches) of the FPGA IC chip in the first chiplet of the chip package; (b) storing data or information for the operation of the FPGA IC chip in the first chiplet of the chip package, note that the FPGA IC chip in (b) have been configured for given operations or functions.

In an embodiment, the stacked logic drive may comprise a chiplet comprising a NOR flash chip, a chiplet comprising a NAND flash chip, and a chiplet comprising a FPGA IC chip, wherein the NOR flash chiplet is over the FPGA chiplet, and the NAND flash chiplet is over the NOR flash chiplet. The NOR flash chip is used for storing data or information for configuring the FPGA IC chip in the stacked logic drive, and the NAND flash chip is used for storing data or information for the operation of the FPGA chip in the stacked logic drive.

Another aspect of the disclosure provides a nonvolatile programmable logic device (the nonvolatile programmable stacked logic drive) based on the logic drive described and specified above. The nonvolatile programmable stacked logic device in a stacked multi-chip package (based on the FOIT package with TISD, TPVs and/or BISD described and specified above) comprises a standard commodity FPGA IC chip (in the chiplet format as described and specified above) and a non-volatile memory IC chip (in the chiplet format as described and specified above), wherein the non-volatile memory IC chip comprises a NAND flash chip or a NOR flash chip. Alternatively, the non-volatile memory IC chip may be a bare-die format, or in a conventional package, wherein the conventional package may be a (wirebonding or flip-chip bonding) BGA package, a TSOP (a thin small outline package with leadframe) or a CSP (chip-scale package). The non-volatile memory chip or package is stacked over the FPGA chiplet. Alternatively, the non-volatile memory chip or package is stacked under the FPGA chiplet. The nonvolatile memory IC chip in the nonvolatile programmable logic device is used for storing data for configuring the FPGA chip and/or for the operation of the FPGA chip in the nonvolatile programmable logic device.

The non-volatile programmable logic device (the non-volatile programmable stacked logic drive) may comprise a chiplet of the dedicated I/O chip or the dedicated control and I/O chip stacked together with the FPGA chiplet and the non-volatile memory IC chiplet, wherein the dedicated I/O chip or the dedicated control and I/O chip is as described and specified above. The chiplet of the dedicated I/O chip or the dedicated control and I/O chip is formed by the method same as that of forming the FPGA chiplet or the non-volatile memory chiplet. The non-volatile programmable logic device is formed by package-on-package stacking method, for example, from the bottom to top, (i) The FPGA chiplet, (ii) the chiplet of the dedicated I/O chip or the dedicated control and I/O chip, (iii) the non-volatile memory chiplet. The communication or electrical coupling between the dedicated I/O chip or the dedicated control and I/O chip, the FPGA chip and the non-volatile memory IC chip in the non-volatile programmable logic device is as described and specified for the logic drive above. The communication or electrical coupling between non-volatile programmable logic device and the external circuits outside the non-volatile programmable logic device is as described and specified for the logic drive above. As described and specified for the logic drive above, the dedicated the dedicated I/O chip or the dedicated control and I/O chip, comprises the large I/O circuit for communication or coupling with the external circuits outside the non-volatile programmable logic device, and the small I/O circuit for communication or coupling with the small I/O circuits of the FPGA IC chip and the non-volatile memory IC chip. The large I/O circuit and the small I/O circuit are as described and specified for the logic drive above.

The non-volatile programmable logic device (the non-volatile programmable stacked logic drive) may comprise a HBM memory chiplet (for example, comprising a HBM DRAM, SRAM, MRAM or RRAM IC chip) stacked together with the chiplet of the dedicated I/O chip or the dedicated control and I/O chip, the FPGA chiplet and the non-volatile memory IC chiplet, wherein the HBM memory chip (for example, a HBM DRAM, SRAM, MRAM, or RRAM IC chip) is as described and specified above. The HBM memory chiplet (for example, comprising an HBM DRAM, SRAM, MRAM or RRAM IC chip) is formed by the method same as that of forming the FPGA chiplet or the non-volatile IC memory chiplet. The non-volatile programmable logic device is formed by the package-on-package stacking method, for example, from the bottom to top, (i) The FPGA chiplet, (ii) the HBM memory chiplet, (iii) the chiplet of the dedicated I/O chip or the dedicated control and I/O chip, (iv) the non-volatile memory chiplet. The communication or electrical coupling between the dedicated I/O chip or the dedicated control and I/O chip, the HBM memory chip, the FPGA chip and the non-volatile memory IC chip in the non-volatile programmable logic device is as described and specified for the logic drive above. The communication or electrical coupling between non-volatile programmable logic device and the external circuits outside the non-volatile programmable logic device is as described and specified for the logic drive above. As described and specified for the logic drive above, the dedicated the dedicated I/O chip or the dedicated control and I/O chip, comprises the large I/O circuit for communication or coupling with the external circuits outside the non-volatile programmable logic device, and the small I/O circuit for communication or coupling with the small I/O circuits of the FPGA IC chip, the HBM memory chip, and the non-volatile memory IC chip. The large I/O circuit and the small I/O circuit are as described and specified for the logic drive above.

The FPGA IC chip in the non-volatile programmable logic device (the non-volatile programmable stacked logic drive) may comprise an on-chip security circuit for design security. The on-chip security circuit is used for preventing from the unintended copy, use or reverse engineering. The on-chip security circuit on the FPGA IC chip in the non-volatile programmable logic device provides the on-chip bitstream decryption based on a decryption key stored in the dedicated memory cells on the FPGA IC chip. The encrypted bitstream are stored in the non-volatile memory chip of the non-volatile programmable logic device, and to be used for configuring the FPGA IC chip of the non-volatile programmable logic device. The encrypted bitstream from the non-volatile memory chip are input into the FPGA IC chip for the programmable interconnection (switches including pass-no-pass switching gates and multiplexers) and/or programmable logic circuits, cells or blocks, cells or elements (including LUTs and multiplexers) on the FPGA IC chip, wherein the input encrypted bitstream are decrypted by the on-chip security circuit based on a decryption key stored in the dedicated memory cells. A user-generated key may be created from a truly random source The FPGA IC chip in the non-volatile programmable logic device stores the encryption key internally in non-volatile memory cells on the FPGA IC chip, wherein the on-chip non-volatile memory cells may comprise a floating gate MOS transistor, MRAM, or RRAM. Alternatively, the FPGA IC chip in the non-volatile programmable logic device stores the encryption key internally in dedicated RAM cells on the FPGA IC chip, wherein the dedicated RAM cells may be backed up by a small externally connected battery. Alternatively, an e-fuse or an anti-fuse on the FPGA IC chip may be used to store the encryption key. The e-fuse or the anti-fuse is programmed to non-volatily store encryption key. The e-fuse comprises fuses, each fuse has a narrow neck in a metal trace or line of the interconnection metal lines or traces in the FISC or the SISC of the FPGA IC chip, as described and specified above. In the programming for non-volatile storage, selected fuses are cut and broken by applying high currents through the fuses. The anti-fuse comprises fuses, each fuse has a thin oxide window between two terminals or electrodes. In the programming for non-volatile storage, selected fuses are connected, wherein the oxide in the oxide window are broken down by applying a high voltage between two terminals or electrodes. The encryption key can only be programmed onto the device through a special port. The on-chip security circuit performs the operation for decrypting the incoming bitstream during configuration. The non-volatile programmable logic device has the encryption logic (based on the on-chip security circuit) uses a 128, 256, 512 or 1024-bit encryption key.

The user or developer with innovation or application concept or idea may purchase the nonvolatile programmable logic device, and develop or write software codes, data or programs to load into the non-volatile memory of the nonvolatile programmable logic device for implementing his/her innovation or application concept or idea. The user's software codes, data, information, instructions or programs (related to the innovation or application) loaded into and stored in the non-volatile memory IC chip in the nonvolatile programmable logic device may be downloaded to the 5T or 6T SRAM cells of the programmable interconnection (including pass-no-pass switching gates and multiplexers associated with the programmable interconnection) and/or programmable logic circuits, cells, elements or blocks (including LUTs and multiplexers associated with the programmable logic circuits, cells, elements or blocks) on the standard commodity FPGA IC chips in the nonvolatile programmable logic device, through the TISD and TPVs (in some cases also through BISD).

The chip package of the nonvolatile programmable logic device, comprising the non-volatile IC memory chip and the FPGA IC chip, provides an alternative for the current ASIC IC chip design, manufacturing, and business. The chip package of the logic drive (the nonvolatile programmable logic device) with (i) the loaded and stored software codes, data, information, instructions or programs (related to the innovation or application) in the non-volatile IC memory chip, and (ii) with the on-chip encryption/decryption function (based on the on-chip security circuit) of the FPGA IC chip, can be sold and used just like an ASIC IC chip.

Another aspect of the disclosure provides a programmable, configurable and reconfigurable semiconductor IC chip based on a Coarse-Grained Reconfigurable Architecture (CGRA) for use in the nonvolatile programmable logic device (the nonvolatile programmable 2D-horizontal or 3D-stacked logic drive) based on the logic drive described and specified in this patent application. The CGRA semiconductor IC chip is programmable, configurable and reconfigurable by: (i) programming software or codes comprising operation instructions in a instruction set stored in the on-chip instruction memory cells, wherein the operation instructions in the instruction set are written in assembly language, or based on machine language or code. The on-chip memory cells may be on-chip volatile memory cells (for example, SRAM cells) or on-chip non-volatile memory cells (for example, floating-gate non-volatile memory cells, resistive RAM (RRAM) cells, Magnetoresistive RAM (MRAM) cells, Ferroelectric RAM (FRAM) cells); or (ii) same as the FPGA IC chip described and specified in this patent application, using the configuration data stored in the on-chip volatile memory cells (for example, SRAM cells) or on-chip non-volatile memory cells (for example, floating-gate non-volatile memory cells, resistive RAM (RRAM) cells, Magnetoresistive RAM (MRAM) cells, Ferroelectric RAM (FRAM) cells).

The CGRA IC chip comprises an array of a large number of function unit blocks, cells or elements (FUBs), each FUB comprises (i) a function unit (FU). The function unit (FU) is designed, compiled and implemented with fixed hard wires (metal lines or traces) for circuits therein. The FU is programmed, configured or reconfigured using programming software or codes comprising the operation instructions in the instruction set stored in the on-chip instruction memory cells. The operation instructions in the instruction set may be written in assembly language (for example, MOV, ADD or SUB), and the assembly language is then converted, using an assembler, to machine language or code in binary digits (ones or zeros). The machine language or code in binary digits (ones or zeros) are stored in the on-chip instruction memory cells. The on-chip memory cells may be on-chip volatile memory cells (for example, SRAM cells) or on-chip non-volatile memory cells, for example, floating-gate non-volatile memory cells, resistive RAM (RRAM) cells, Magnetoresistive RAM (MRAM) cells, Ferroelectric RAM (FRAM) cells. The FU is programmed, configured or reconfigured for different functions or applications depending on different instruction sets stored in the on-chip volatile or non-volatile memory cells of the instruction memory cells, respectively. A FU is programmed, configured or reconfigured using a first specific instruction set stored in the on-chip volatile or non-volatile memory cells of the instruction memory cells for a first specific function or application. When a second specific instruction set is loaded and stored in the on-chip volatile or non-volatile memory cells of the instruction memory cells, the FU is programmed, configured or reconfigured to perform a second specific function or application. The hardware or circuit of the function unit (FU) may be one or more than one of the hard macros described and specified above for the FPGA IC chip. The hard macros comprises, for example, digital signal process (DSP) slices, graphic process unit (GPU) macros, micro-controller unit (MCU) macros, multiplexer macros, adder macros, multiplier macros, arithmetic logic unit (ALU) macros, shift circuit macros, comparison circuit macros, floating-point computing macros, register or flip-flops macros, and/or I/O interfacing macros, wherein each of the hard macros is designed, compiled and implemented with fixed hard wiring for circuits; (ii) a register or flip-flop for temporarily storing the computing or processing output or result of the FU. The data stored in the register may be distributed to or accessed by only a certain (not all) FUBs in the FUB array within a certain clock cycles using control circuits with artificial intelligence; (iii) a register files for temporarily storing, updating, recycling or looping the computing or processing output data or result of the FU for use as input data at the FU input points. The register files may be further used for storing, updating and preparing in advance the data or results required for the computing or processing of the FU for use as input data at the FU input points, so that the FU has data nearby and ready in-time for executing an instruction of computing and processing. Therefor the speed and performance of the FU is greatly improved; (iv) the instruction memory section comprising a plurality of volatile (for example, SRAM) or non-volatile memory cells for storing programming software or codes comprising operation instructions for the FU. The instruction memory section is in the same FUB comprising the FU, that is the instruction memory cells are distributed in each FUB of the FUB array for programming, configuring or reconfiguring the FU, wherein the instruction memory cells are used for storing the machine language or code in binary digits (ones or zeros) for the FU. The instruction memory cells may be on-chip volatile memory cells (for example, SRAM cells) or on-chip non-volatile memory cells, for example, floating-gate non-volatile memory cells, resistive RAM (RRAM) cells, Magnetoresistive RAM (MRAM) cells, Ferroelectric RAM (FRAM) cells; (v) a program counter (PC) used as an instruction address or an address pointer, wherein the program counter (PC) contains the address (location) of the instruction in the instruction memory section. The program (PC) is used for controlling the execution sequence of the instructions stored in the memory cells in the instruction memory section. As each instruction gets fetched, the program counter increases its stored value by 1. After each instruction is fetched, the program counter points to the next instruction in the sequence.

Each FUB in the FUB array is interconnected or not interconnected using a mesh style network comprising configurable and reconfigurable interconnection circuits, same as described and specified in the FPGA IC chip or chips. The FUs can execute common word-level operations, including addition, subtraction, and multiplication. In contrast to FPGAs, CGRAs have short reconfiguration times, low delay characteristics, and low power consumption as the CGRAs are constructed from standard cell implementations. Thus, gate-level reconfigurability is sacrificed, but the result is a large increase in hardware efficiency.

The CGRA IC chip comprises the configurable and reconfigurable interconnection circuits, and volatile (for example, SRAMs) or non-volatile memory cells for storing data therein, wherein the data is used for configuring or reconfiguring the configurable and reconfigurable interconnection circuits. The interconnection (connecting or not-connecting) between each of FUBs in the FUB array is configured or reconfigured by the data stored in the volatile or non-volatile memory cells. When FUs in the FUB array of the CGRA IC chip are configured or reconfigured for a specific function and application, the configurable and reconfigurable interconnection circuits may be meanwhile configured or reconfigured by changing the corresponding configuration or reconfiguration interconnection data stored in the volatile or non-volatile memory cells. When FUs in the FUB array of the CGRA IC chip are configured or reconfigured for a first specific function and application, their corresponding configurable and reconfigurable interconnection circuits may be configured or reconfigured using a first specific configuration or reconfiguration interconnection data stored in the on-chip volatile or non-volatile memory cells; the CGRA IC chip is then configured or reconfigured to perform the first specific function or application. When the FUs in the FUB array of the CGRA IC chip are configured or reconfigured for a second specific function or application, a second specific configuration or reconfiguration interconnection data are loaded and stored in the on-chip volatile or non-volatile memory cells for the corresponding configurable and reconfigurable interconnection circuit, the CGRA IC chip is configured or reconfigured to perform the second specific function or application.

Same as the FPGA IC chip or chips, the CGRA IC chips comprises a programmable, configurable and reconfigurable interconnection circuit and a first volatile memory cell for storing first data therein, wherein the first data is used for configuring the programmable, configurable and reconfigurable interconnection circuit, wherein the programmable, configurable and reconfigurable interconnection circuit comprises first and second conductive interconnects and a programmable, configurable and reconfigurable switch circuit having a first input point coupling to the first conductive interconnect, a first output point coupling to the second conductive interconnect, and a second input point for input data associated with the first data, wherein the programmable, configurable and reconfigurable switch circuit is programmed, configured or reconfigured to control, in accordance with the input data at the second input point, coupling between the first and second conductive interconnects. The programmable, configurable and reconfigurable interconnection circuit is programmed, configured or reconfigured using a first specific data stored in the on-chip volatile or non-volatile memory cells of the instruction memory cells for a first specific function. When a second specific instruction set is loaded and stored in the on-chip volatile or non-volatile memory cells of the instruction memory cells, the FU is programmed, configured or reconfigured to perform a second specific function.

Same as the FPGA IC chip, the CGRA IC chip further comprises a second volatile memory cell for storing second data therein, wherein the programmable, configurable and reconfigurable interconnection circuit further comprises a programmable, configurable and reconfigurable selection circuit coupling to the programmable, configurable and reconfigurable switch circuit through the first conductive interconnect, wherein the programmable, configurable and reconfigurable selection circuit comprises third and fourth conductive interconnects, a third input point coupling to the third conductive interconnect, a fourth input point coupling to the fourth conductive interconnect, a second output point coupling to the first conductive interconnect, and a fifth input point for input data associated with the second data, wherein the programmable, configurable and reconfigurable selection circuit is programmed, configured or reconfigured to select, in accordance with the input data at the fifth input point, one of the third and fourth conductive interconnects to couple with the second output point.

All description and/or specification related to the FPGA IC chip or chips in this patent application are applied to the CGRA IC chip or chips.

All the 2D-horizontal and/or 3D-stacked chip package or logic drive, or, multichip package or logic drive, comprising the FPGA IC chip or chips, described and/or specified in this patent application are applied to the CGRA IC chip or chips, including using the nonvolatile memory IC chip or chips in the same chip package or multichip to store the programing, configuration or reconfiguration data for programing, configuring or reconfiguring the FPGA IC chip or chips. The nonvolatile memory IC chip or chips in the same chip package or multichip package comprising the CGRA IC chip is used to store and backup: (i) programming software or codes, comprising operation instructions for each FU of the FUB array on the CGRA IC chip, stored in the on-chip volatile memory cells (for example, SRAMs) in the instruction memory section in each FUB of the FUB array on the CGRA IC chip; and (ii) programing, configuration or reconfiguration interconnection data for programing, configuring or reconfiguring the programmable, configurable and reconfigurable interconnection circuit of the CGRA IC chip. The non-volatile memory IC chip may be a NAND flash memory chip or NOR flash memory chip. The non-volatile memory IC chip may be used to store a plurality of instruction sets for a plurality of functions or applications of the CGRA IC chip. For example, the FU is programmed, configured or reconfigured using a first specific instruction set stored in the on-chip volatile memory cells of the instruction memory cells for a first specific function or application. When a second specific instruction set is loaded and stored in the on-chip volatile memory cells of the instruction memory cells, the FU is programmed, configured or reconfigured to perform a second specific function or application. The first and second specific instruction sets stored in the volatile memory cells of the CGRA IC chip may be downloaded from those stored and backed up in a plurality of non-volatile memory cells in the non-volatile memory IC chip in the same chip package or multichip package comprising the CGRA IC chip. A user may program, configure or reconfigure the CGRA IC chip for performing the first or second specific function or application by selecting the first or second specific instruction set respectively stored in the non-volatile memory cells of the non-volatile memory IC chip and loading it to the volatile memory cells of the CGRA IC chip.

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 6C shows a look-up table for a logic operator in FIG. 6B.

FIG. 6D shows a look-up table for a computation operator in FIG. 6E.

Figure 1A:
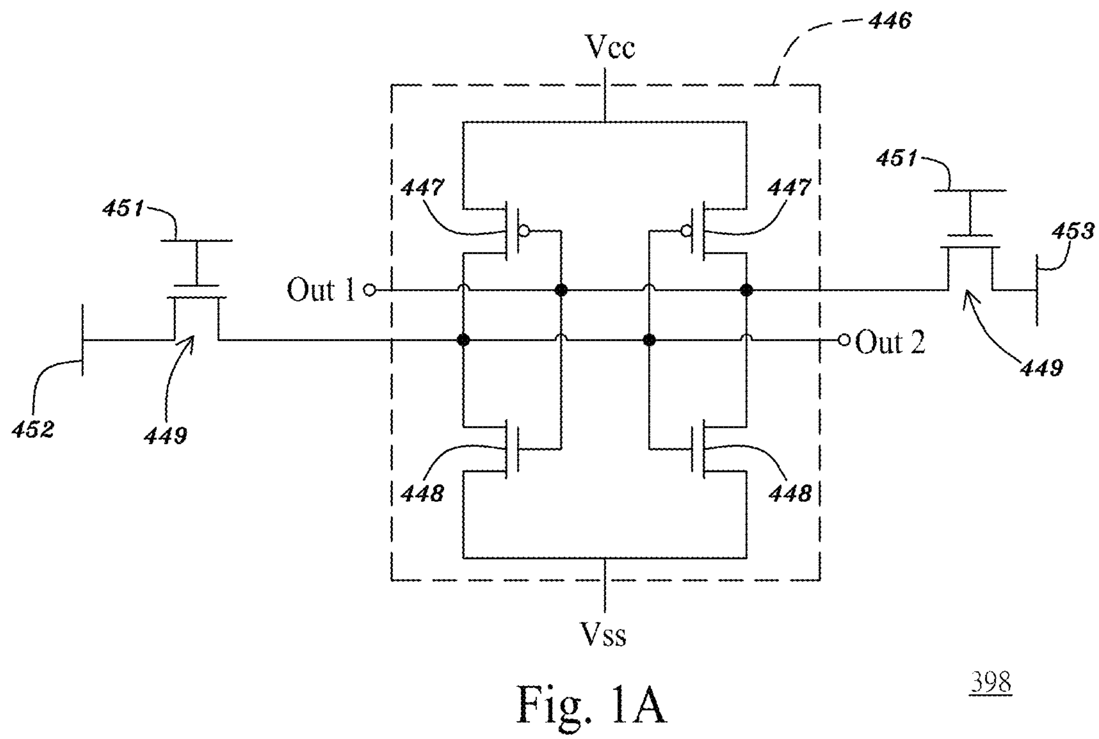
FIGS. 1A and 1B are circuit diagrams illustrating various types of memory cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) Cells (1) First Type of SRAM Cell (6T SRAM Cell)

FIG. 1A is a circuit diagram illustrating a 6T SRAM cell in accordance with an embodiment of the present application. Referring to FIG. 1A, a first type of static random-access memory (SRAM) cell 398, i.e., 6T SRAM cell, may have a memory unit 446 composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to a power supply at a voltage (Vcc) and to a ground reference at a voltage (Vss). The gate terminals of the P-type and N-type MOS transistors 447 and 448 in the left pair are coupled to the drain terminals of the P-type and N-type MOS transistors 447 and 448 in the right pair, acting as an output Out1 of the memory unit 446. The gate terminals of the P-type and N-type MOS transistors 447 and 448 in the right pair are coupled to the drain terminals of the P-type and N-type MOS transistors 447 and 448 in the left pair, acting as an output Out2 of the memory unit 446.

Referring to FIG. 1A, the first type of SRAM cell 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second Type of SRAM Cell (5T SRAM Cell)

Figure 1B:
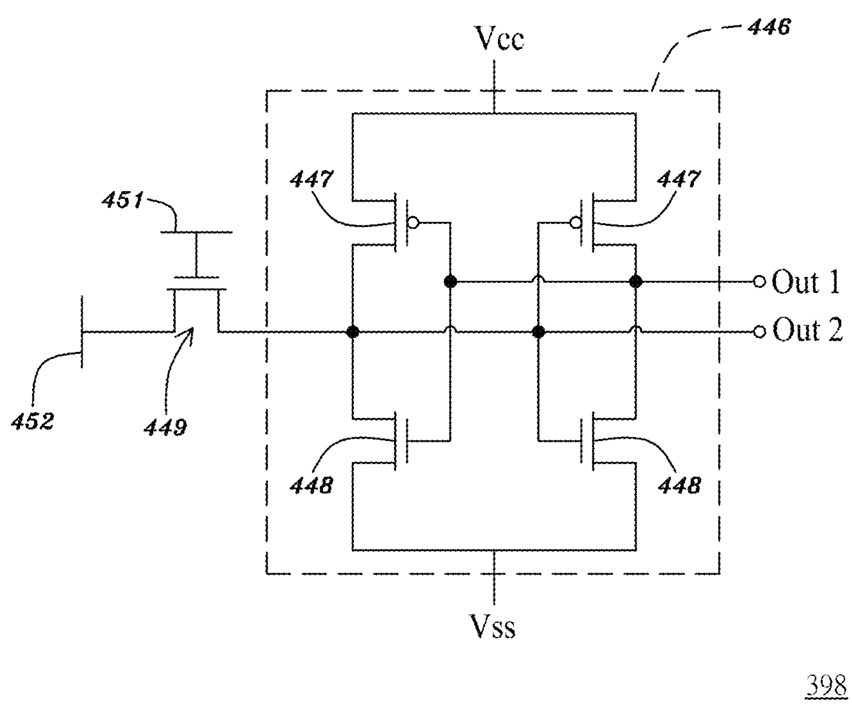

FIG. 1B is a circuit diagram illustrating a 5T SRAM cell in accordance with an embodiment of the present application. Referring to FIG. 1B, a second type of static random-access memory (SRAM) cell 398, i.e., 5T SRAM cell, may have the memory unit 446 as illustrated in FIG. 1A. The second type of static random-access memory (SRAM) cell 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Pass/No-Pass Switches (1) First Type of Pass/No-Pass Switch

Figure 2A:
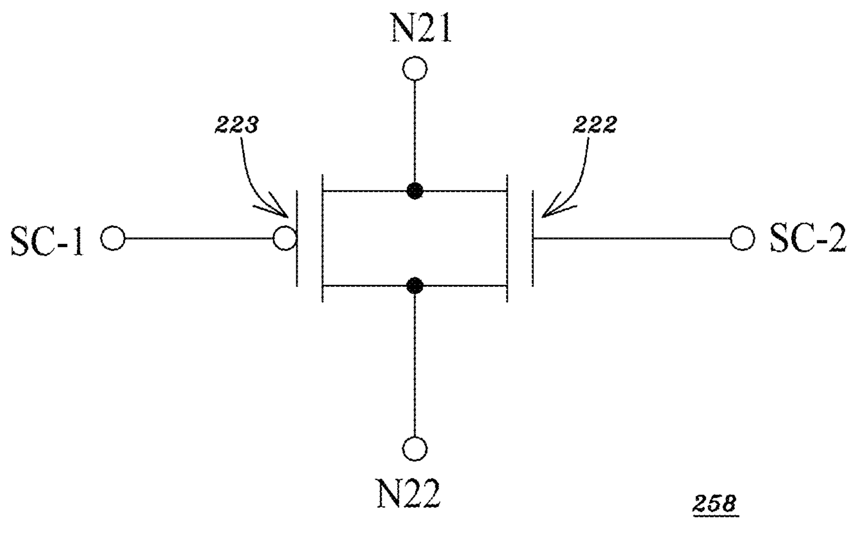
FIGS. 2A-2F are circuit diagrams illustrating various types of pass/no-pass switch in accordance with an embodiment of the present application.

FIG. 2A is a circuit diagram illustrating a first type of pass/no-pass switch in accordance with an embodiment of the present application. Referring to FIG. 2A, a first type of pass/no-pass switch 258 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of the pass/no-pass switch 258 of the first type may be provided with a channel having an end coupling to a node N21 and the other opposite end coupling to a node N22. Thereby, the first type of pass/no-pass switch 258 may be set to turn on or off connection between the nodes N21 and N22. The P-type MOS transistor 223 of the pass/no-pass switch 258 of the first type may have a gate terminal coupling to a node SC-1. The N-type MOS transistor 222 of the pass/no-pass switch 258 of the first type may have a gate terminal coupling to a node SC-2.

(2) Second Type of Pass/No-Pass Switch

Figure 2B:
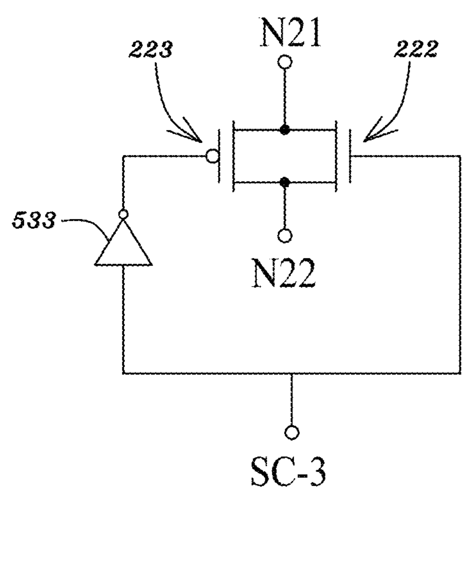

FIG. 2B is a circuit diagram illustrating a second type of pass/no-pass switch in accordance with an embodiment of the present application. Referring to FIG. 2B, a second type of pass/no-pass switch 258 may include the N-type MOS transistor 222 and the P-type MOS transistor 223 that are the same as those of the pass/no-pass switch 258 of the first type as illustrated in FIG. 2A. The second type of pass/no-pass switch 258 may further include an inverter 533 configured to invert its input coupling to a gate terminal of the N-type MOS transistor 222 and a node SC-3 into an output coupling to a gate terminal of the P-type MOS transistor 223.

(3) Third Type of Pass/No-Pass Switch

Figure 2D:
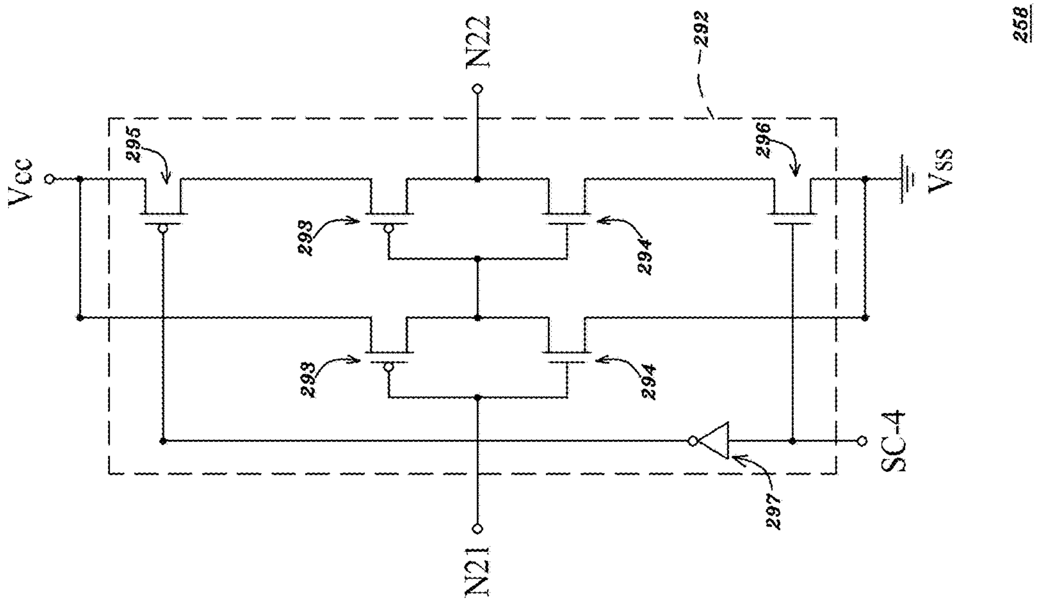
Figure 2C:
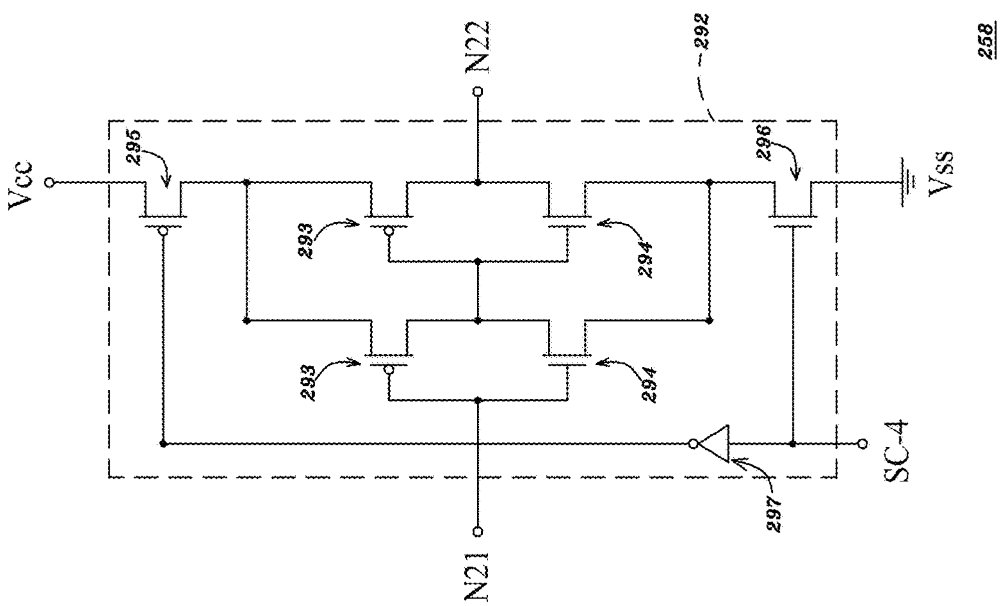

FIG. 2C is a circuit diagram illustrating a third type of pass/no-pass switch in accordance with an embodiment of the present application. Referring to FIG. 2C, a third type of pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to a power supply at a voltage (Vcc) and to a ground reference at a voltage (Vss). In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. A node N21 may couple to gate terminals of the P-type MOS and N-type MOS transistors 293 and 294 in the pair in the first stage. The drain terminals of the P-type MOS and N-type MOS transistors 293 and 294 in the pair in the first stage may couple to gate terminals of the P-type MOS and N-type MOS transistors 293 and 294 in the pair in the second stage. The drain terminals of the P-type MOS and N-type MOS transistors 293 and 294 in the pair in the second stage may couple to a node N22.

Referring to FIG. 2C, the multi-stage tri-state buffer 292 may further include a switching mechanism configured to enable or disable the multi-stage tri-state buffer 292, wherein the switching mechanism may be composed of (1) a P-type MOS transistor 295 having a source terminal coupling to the power supply at the voltage (Vcc) and a drain terminal coupling to the source terminals of the P-type MOS transistors 293 in the first and second stages, (2) a N-type MOS transistor 296 having a source terminal coupling to the ground reference at the voltage (Vss) and a drain terminal coupling to the source terminals of the N-type MOS transistors 294 in the first and second stages and (3) an inverter 297 configured to invert its input coupling to a gate terminal of the N-type MOS transistor 296 and a node SC-4 into its output coupling to a gate terminal of the P-type MOS transistor 295.

For example, referring to FIG. 2C, when a logic level of "1" couples to the node SC-4 to turn on the multi-stage tri-state buffer 292, a signal may be transmitted from the node N21 to the node N22. When a logic level of "0" couples to the node SC-4 to turn off the multi-stage tri-state buffer 292, no signal transmission may occur between the nodes N21 and N22.

(4) Fourth Type of Pass/No-Pass Switch

FIG. 2D is a circuit diagram illustrating a fourth type of pass/no-pass switch in accordance with an embodiment of the present application. Referring to FIG. 2D, a fourth type of pass/no-pass switch 258 may be a multi-stage tri-state buffer, i.e., switch buffer, that is similar to the one 292 as illustrated in FIG. 2C. For an element indicated by the same reference number shown in FIGS. 2C and 2D, the specification of the element as seen in FIG. 2D may be referred to that of the element as illustrated in FIG. 2C. The difference between the circuits illustrated in FIG. 2C and the circuits illustrated in FIG. 2D is mentioned as below. Referring to FIG. 2D, the drain terminal of the P-type MOS transistor 295 may couple to the source terminal of the P-type MOS transistor 293 in the second stage but does not couple to the source terminal of the P-type MOS transistor 293 in the first stage; the source terminal of the P-type MOS transistor 293 in the first stage may couple to the power supply at the voltage (Vcc) and the source terminal of the P-type MOS transistor 295. The drain terminal of the N-type MOS transistor 296 may couple to the source terminal of the N-type MOS transistor 294 in the second stage but does not couple to the source terminal of the N-type MOS transistor 294 in the first stage; the source terminal of the N-type MOS transistor 294 in the first stage may couple to the ground reference at the voltage (Vss) and the source terminal of the N-type MOS transistor 296.

(5) Fifth Type of Pass/No-Pass Switch

Figure 2F:
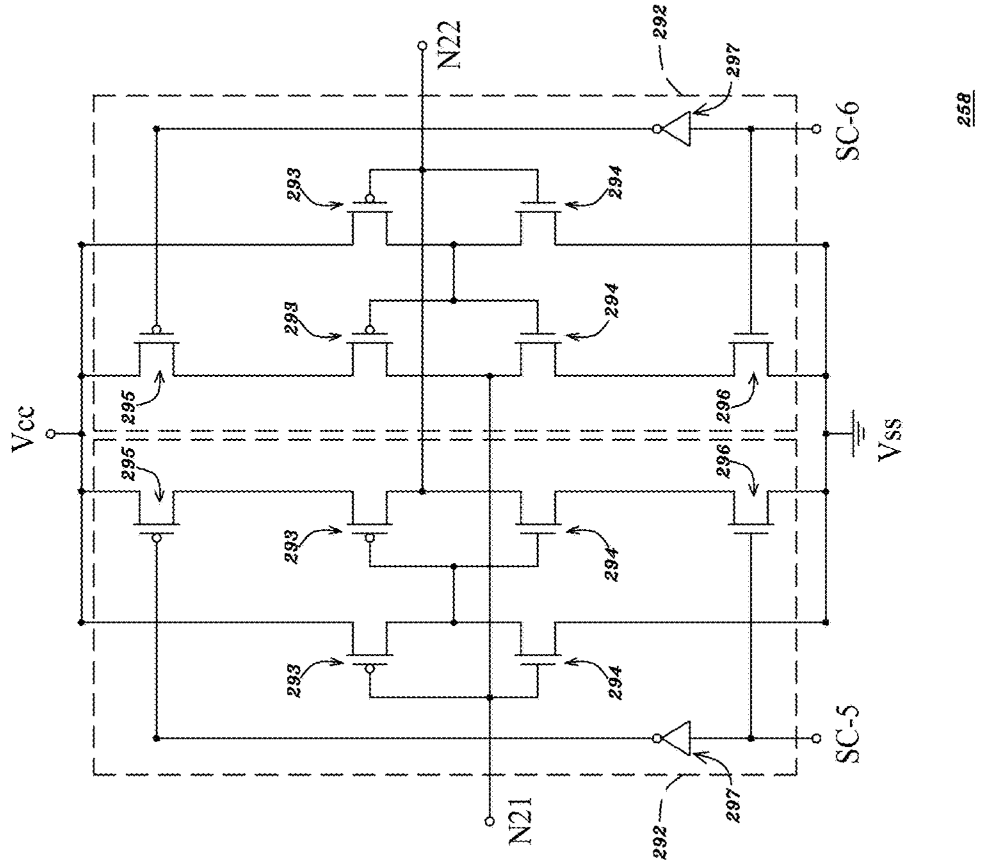
Figure 2E:
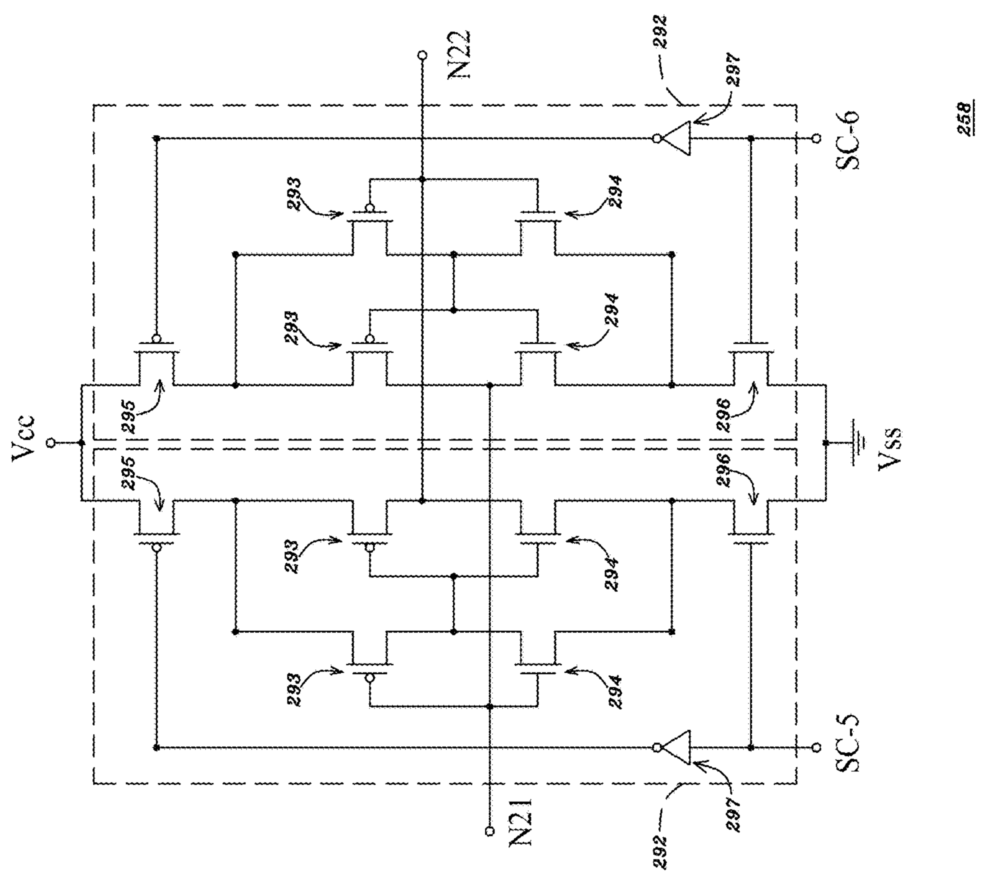

FIG. 2E is a circuit diagram illustrating a fifth type of pass/no-pass switch in accordance with an embodiment of the present application. For an element indicated by the same reference number shown in FIGS. 2C and 2E, the specification of the element as seen in FIG. 2E may be referred to that of the element as illustrated in FIG. 2C. Referring to FIG. 2E, a fifth type of pass/no-pass switch 258 may include a pair of the multi-stage tri-state buffers 292, i.e., switch buffers, as illustrated in FIG. 2C. The gate terminals of the P-type and N-type MOS transistors 293 and 294 in the first stage in the left one of the multi-stage tri-state buffers 292 in the pair may couple to the drain terminals of the P-type and N-type MOS transistors 293 and 294 in the second stage in the right one of the multi-stage tri-state buffers 292 in the pair and to a node N21. The gate terminals of the P-type and N-type MOS transistors 293 and 294 in the first stage in the right one of the multi-stage tri-state buffers 292 in the pair may couple to the drain terminals of the P-type and N-type MOS transistors 293 and 294 in the second stage in the left one of the multi-stage tri-state buffers 292 in the pair and to a node N22. For the left one of the multi-stage tri-state buffers 292 in the pair, its inverter 297 is configured to invert its input coupling to the gate terminal of its N-type MOS transistor 296 and a node SC-5 into its output coupling to the gate terminal of its P-type MOS transistor 295. For the right one of the multi-stage tri-state buffers 292 in the pair, its inverter 297 is configured to invert its input coupling to the gate terminal of its N-type MOS transistor 296 and a node SC-6 into its output coupling to the gate terminal of its P-type MOS transistor 295.

For example, referring to FIG. 2E, when a logic level of "1" couples to the node SC-5 to turn on the left one of the multi-stage tri-state buffers 292 in the pair and a logic level of "0" couples to the node SC-6 to turn off the right one of the multi-stage tri-state buffers 292 in the pair, a signal may be transmitted from the node N21 to the node N22. When a logic level of "0" couples to the node SC-5 to turn off the left one of the multi-stage tri-state buffers 292 in the pair and a logic level of "1" couples to the node SC-6 to turn on the right one of the multi-stage tri-state buffers 292 in the pair, a signal may be transmitted from the node N22 to the node N21. When a logic level of "0" couples to the node SC-5 to turn off the left one of the multi-stage tri-state buffers 292 in the pair and a logic level of "0" couples to the node SC-6 to turn off the right one of the multi-stage tri-state buffers 292 in the pair, no signal transmission may occur between the nodes N21 and N22.

(6) Sixth Type of Pass/No-Pass Switch

FIG. 2F is a circuit diagram illustrating a sixth type of pass/no-pass switch in accordance with an embodiment of the present application. Referring to FIG. 2F, a sixth type of pass/no-pass switch 258 may be composed of a pair of multi-stage tri-state buffers, i.e., switch buffers, which is similar to the ones 292 as illustrated in FIG. 2E. For an element indicated by the same reference number shown in FIGS. 2E and 2F, the specification of the element as seen in FIG. 2F may be referred to that of the element as illustrated in FIG. 2E. The difference between the circuits illustrated in FIG. 2E and the circuits illustrated in FIG. 2F is mentioned as below. Referring to FIG. 2F, for each of the multi-stage tri-state buffers 292 in the pair, the drain terminal of its P-type MOS transistor 295 may couple to the source terminal of its P-type MOS transistor 293 in the second stage but does not couple to the source terminal of its P-type MOS transistor 293 in the first stage; the source terminal of its P-type MOS transistor 293 in the first stage may couple to the power supply at the voltage (Vcc) and the source terminal of its P-type MOS transistor 295. For each of the multi-stage tri-state buffers 292 in the pair, the drain terminal of its N-type MOS transistor 296 may couple to the source terminal of its N-type MOS transistor 294 in the second stage but does not couple to the source terminal of its N-type MOS transistor 294 in the first stage; the source terminal of its N-type MOS transistor 294 in the first stage may couple to the ground reference at the voltage (Vss) and the source terminal of its N-type MOS transistor 296.

Figure 3B:
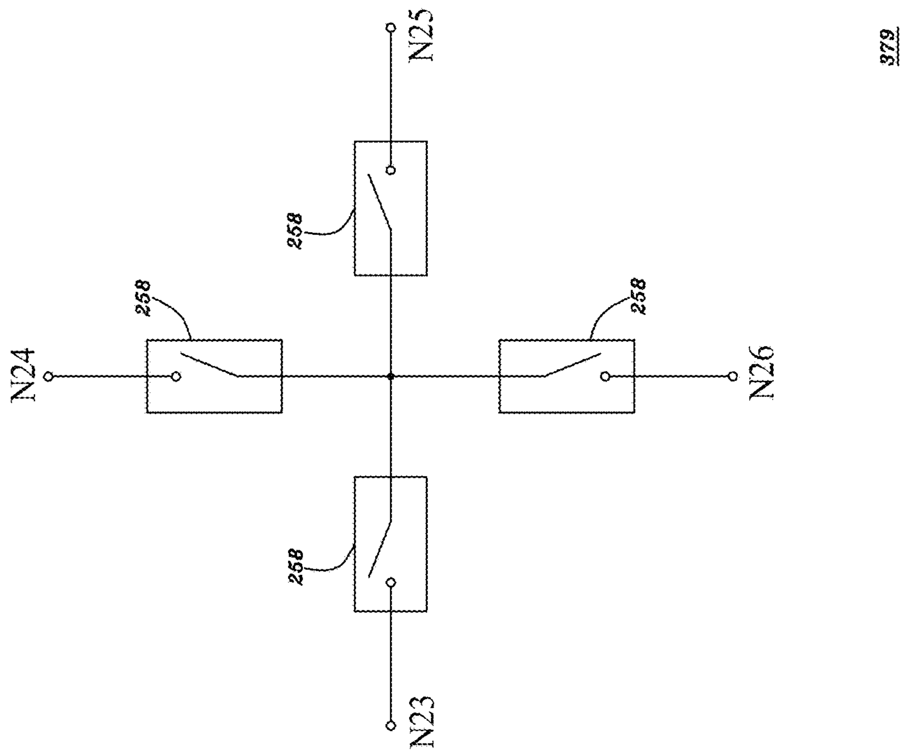
FIGS. 3A-3D are block diagrams illustrating various types of cross-point switches in accordance with an embodiment of the present application.
Figure 3A:
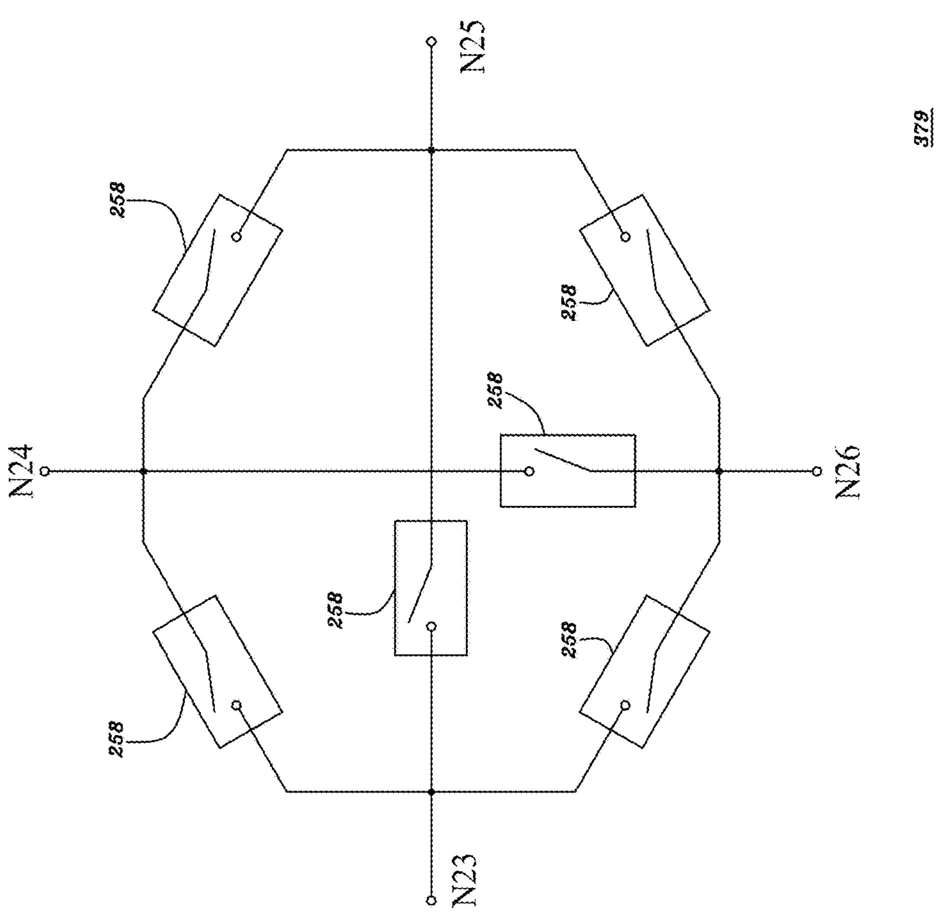

Specification for Cross-Point Switches Constructed from Pass/No-Pass Switches (1) First Type of Cross-Point Switch FIG. 3A is a circuit diagram illustrating a first type of cross-point switch composed of six pass/no-pass switches in accordance with an embodiment of the present application. Referring to FIG. 3A, six pass/no-pass switches 258, each of which may be any one of the first through sixth types of pass/no-pass switches as illustrated in FIGS. 2A-2F respectively, may compose a first type of cross-point switch 379. The first type of cross-point switch 379 may have four terminals N23-N26 each configured to be switched to couple to another one of its four terminals N23-N26 via one of its six pass/no-pass switches 258. One of the first through sixth types of pass/no-pass switches for said each of the pass/no-pass switches 258 may have one of its nodes N21 and N22 coupling to one of the four terminals N23-N26 and the other one of its nodes N21 and N22 coupling to another one of the four terminals N23-N26. For example, the first type of cross-point switch 379 may have its terminal N23 configured to be switched to couple to its terminal N24 via a first one of its six pass/no-pass switches 258 between its terminals N23 and N24, to its terminal N25 via a second one of its six pass/no-pass switches 258 between its terminals N23 and N25 and/or to its terminal N26 via a third one of its six pass/no-pass switches 258 between its terminals N23 and N26.

(2) Second Type of Cross-Point Switch

FIG. 3B is a circuit diagram illustrating a second type of cross-point switch composed of four pass/no-pass switches in accordance with an embodiment of the present application. Referring to FIG. 3B, four pass/no-pass switches 258, each of which may be any one of the first through sixth types of pass/no-pass switches as illustrated in FIGS. 2A-2F respectively, may compose a second type of cross-point switch 379. The second type of cross-point switch 379 may have four terminals N23-N26 each configured to be switched to couple to another one of its four terminals N23-N26 via two of its four pass/no-pass switches 258. The second type of cross-point switch 379 may have a central node configured to couple to its four terminals N23-N26 via its four respective pass/no-pass switches 258. One of the first through sixth types of pass/no-pass switches for said each of the pass/no-pass switches 258 may have one of its nodes N21 and N22 coupling to one of the four terminals N23-N26 and the other one of its nodes N21 and N22 coupling to the central node of the cross-point switch 379 of the second type. For example, the second type of cross-point switch 379 may have its terminal N23 configured to be switched to couple to its terminal N24 via left and top ones of its four pass/no-pass switches 258, to its terminal N25 via left and right ones of its four pass/no-pass switches 258 and/or to its terminal N26 via left and bottom ones of its four pass/no-pass switches 258.

Specification for Multiplexer (MUXER)

(1) First Type of Multiplexer

Figure 4A:
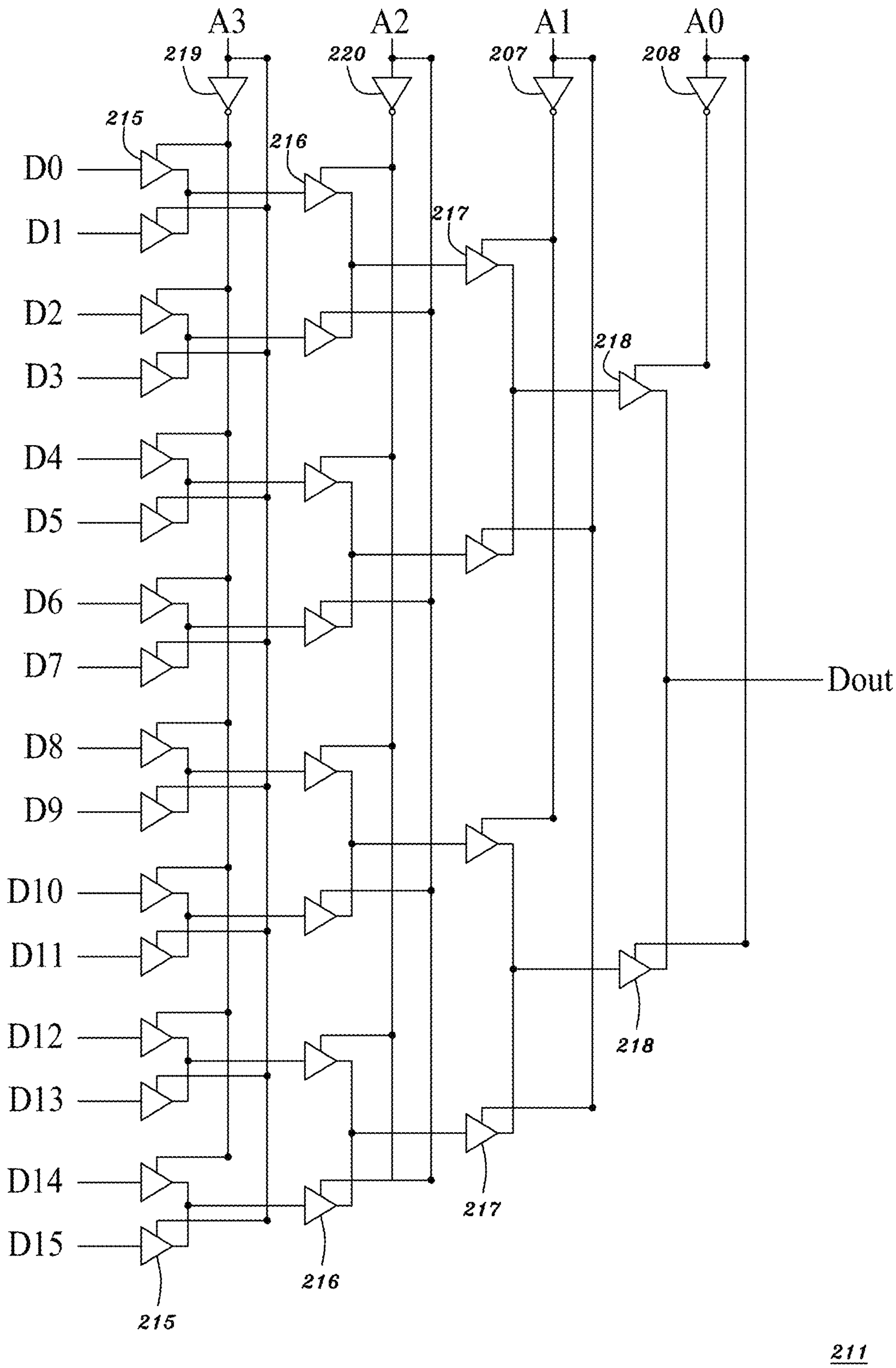
FIGS. 4A and 4C-4J are circuit diagrams illustrating various types of multiplexers in accordance with an embodiment of the present application.

FIG. 4A is a circuit diagram illustrating a first type of multiplexer in accordance with an embodiment of the present application. Referring to FIG. 4A, a first type of multiplexer (MUXER) 211 may select one from its first set of inputs arranged in parallel into its output based on a combination of its second set of inputs arranged in parallel. For example, the first type of multiplexer (MUXER) 211 may have sixteen inputs D0-D15 arranged in parallel to act as its first set of inputs and four inputs A0-A3 arranged in parallel to act as its second set of inputs. The first type of multiplexer (MUXER) 211 may select one from its first set of sixteen inputs D0-D15 into its output Dout based on a combination of its second set of four inputs A0-A3.

Referring to FIG. 4A, the first type of multiplexer 211 may include multiple stages of tri-state buffers, e.g., four stages of tri-state buffers 215, 216, 217 and 218, coupling to one another stage by stage. For more elaboration, the first type of multiplexer 211 may include sixteen tri-state buffers 215 in eight pairs in the first stage, arranged in parallel, each having a first input coupling to one of the sixteen inputs D0-D15 in the first set and a second input associated with the input A3 in the second set. Each of the sixteen tri-state buffers 215 in the first stage may be switched on or off to pass or not to pass its first input into its output in accordance with its second input. The first type of multiplexer 211 may include an inverter 219 configured to invert its input coupling to the input A3 in the second set into its output. One of the tri-state buffers 215 in each pair in the first stage may be switched on in accordance with its second input coupling to one of the input and output of the inverter 219 to pass its first input into its output; the other one of the tri-state buffers 215 in said each pair in the first stage may be switched off in accordance with its second input coupling to the other one of the input and output of the inverter 219 not to pass its first input into its output. The outputs of the tri-state buffers 215 in said each pair in the first stage may couple to each other. For example, a top one of the tri-state buffers 215 in a topmost pair in the first stage may have its first input coupling to the input D0 in the first set and its second input coupling to the output of the inverter 219; a bottom one of the tri-state buffers 215 in the topmost pair in the first stage may have its first input coupling to the input D1 in the first set and its second input coupling to the input of the inverter 219. The top one of the tri-state buffers 215 in the topmost pair in the first stage may be switched on in accordance with its second input to pass its first input into its output; the bottom one of the tri-state buffers 215 in the topmost pair in the first stage may be switched off in accordance with its second input not to pass its first input into its output.

Thereby, each of the eight pairs of tri-state buffers 215 in the first stage may be switched in accordance with its two second inputs coupling to the input and output of the inverter 219 respectively to pass one of its two first inputs into its output coupling to a first input of one of the tri-state buffers 216 in the second stage.

Referring to FIG. 4A, the first type of multiplexer 211 may include eight tri-state buffers 216 in four pairs in the second stage, arranged in parallel, each having a first input coupling to the output of one of the eight pairs of tri-state buffers 215 in the first stage and a second input associated with the input A2 in the second set. Each of the eight tri-state buffers 216 in the second stage may be switched on or off to pass or not to pass its first input into its output in accordance with its second input. The first type of multiplexer 211 may include an inverter 220 configured to invert its input coupling to the input A2 in the second set into its output. One of the tri-state buffers 216 in each pair in the second stage may be switched on in accordance with its second input coupling to one of the input and output of the inverter 220 to pass its first input into its output; the other one of the tri-state buffers 216 in said each pair in the second stage may be switched off in accordance with its second input coupling to the other one of the input and output of the inverter 220 not to pass its first input into its output. The outputs of the tri-state buffers 216 in said each pair in the second stage may couple to each other. For example, a top one of the tri-state buffers 216 in a topmost pair in the second stage may have its first input coupling to the output of a topmost one of the eight pairs of tri-state buffers 215 in the first stage and its second input coupling to the output of the inverter 220; a bottom one of the tri-state buffers 216 in the topmost pair in the second stage may have its first input coupling to the output of a second top one of the eight pairs of tri-state buffers 215 in the first stage and its second input coupling to the input of the inverter 220. The top one of the tri-state buffers 216 in the topmost pair in the second stage may be switched on in accordance with its second input to pass its first input into its output; the bottom one of the tri-state buffers 216 in the topmost pair in the second stage may be switched off in accordance with its second input not to pass its first input into its output. Thereby, each of the four pairs of tri-state buffers 216 in the second stage may be switched in accordance with its two second inputs coupling to the input and output of the inverter 220 respectively to pass one of its two first inputs into its output coupling to a first input of one of the tri-state buffers 217 in the third stage.

Referring to FIG. 4A, the first type of multiplexer 211 may include four tri-state buffers 217 in two pairs in the third stage, arranged in parallel, each having a first input coupling to the output of one of the four pairs of tri-state buffers 216 in the second stage and a second input associated with the input A1 in the second set. Each of the four tri-state buffers 217 in the third stage may be switched on or off to pass or not to pass its first input into its output in accordance with its second input. The first type of multiplexer 211 may include an inverter 207 configured to invert its input coupling to the input A1 in the second set into its output. One of the tri-state buffers 217 in each pair in the third stage may be switched on in accordance with its second input coupling to one of the input and output of the inverter 207 to pass its first input into its output; the other one of the tri-state buffers 217 in said each pair in the third stage may be switched off in accordance with its second input coupling to the other one of the input and output of the inverter 207 not to pass its first input into its output. The outputs of the tri-state buffers 217 in said each pair in the third stage may couple to each other. For example, a top one of the tri-state buffers 217 in a top pair in the third stage may have its first input coupling to the output of a topmost one of the four pairs of tri-state buffers 216 in the second stage and its second input coupling to the output of the inverter 207; a bottom one of the tri-state buffers 217 in the top pair in the third stage may have its first input coupling to the output of a second top one of the four pairs of tri-state buffers 216 in the second stage and its second input coupling to the input of the inverter 207. The top one of the tri-state buffers 217 in the top pair in the third stage may be switched on in accordance with its second input to pass its first input into its output; the bottom one of the tri-state buffers 217 in the top pair in the third stage may be switched off in accordance with its second input not to pass its first input into its output. Thereby, each of the two pairs of tri-state buffers 217 in the third stage may be switched in accordance with its two second inputs coupling to the input and output of the inverter 207 respectively to pass one of its two first inputs into its output coupling to a first input of one of the tri-state buffers 218 in the fourth stage.

Referring to FIG. 4A, the first type of multiplexer 211 may include a pair of two tri-state buffers 218 in the fourth stage, arranged in parallel, each having a first input coupling to the output of one of the two pairs of tri-state buffers 217 in the third stage and a second input associated with the input A0 in the second set. Each of the two tri-state buffers 218 in the pair in the fourth stage may be switched on or off to pass or not to pass its first input into its output in accordance with its second input. The first type of multiplexer 211 may include an inverter 208 configured to invert its input coupling to the input A0 in the second set into its output. One of the two tri-state buffers 218 in the pair in the fourth stage may be switched on in accordance with its second input coupling to one of the input and output of the inverter 208 to pass its first input into its output; the other one of the two tri-state buffers 218 in the pair in the fourth stage may be switched off in accordance with its second input coupling to the other one of the input and output of the inverter 208 not to pass its first input into its output. The outputs of the two tri-state buffers 218 in the pair in the fourth stage may couple to each other. For example, a top one of the two tri-state buffers 218 in the pair in the fourth stage may have its first input coupling to the output of a top one of the two pairs of tri-state buffers 217 in the third stage and its second input coupling to the output of the inverter 208; a bottom one of the two tri-state buffers 218 in the pair in the fourth stage may have its first input coupling to the output of a bottom one of the two pairs of tri-state buffers 217 in the third stage and its second input coupling to the input of the inverter 208. The top one of the two tri-state buffers 218 in the pair in the fourth stage may be switched on in accordance with its second input to pass its first input into its output; the bottom one of the two tri-state buffers 218 in the pair in the fourth stage may be switched off in accordance with its second input not to pass its first input into its output. Thereby, the pair of the two tri-state buffers 218 in the fourth stage may be switched in accordance with its two second inputs coupling to the input and output of the inverter 208 respectively to pass one of its two first inputs into its output acting as the output Dout of the multiplexer 211 of the first type.

Figure 4B:
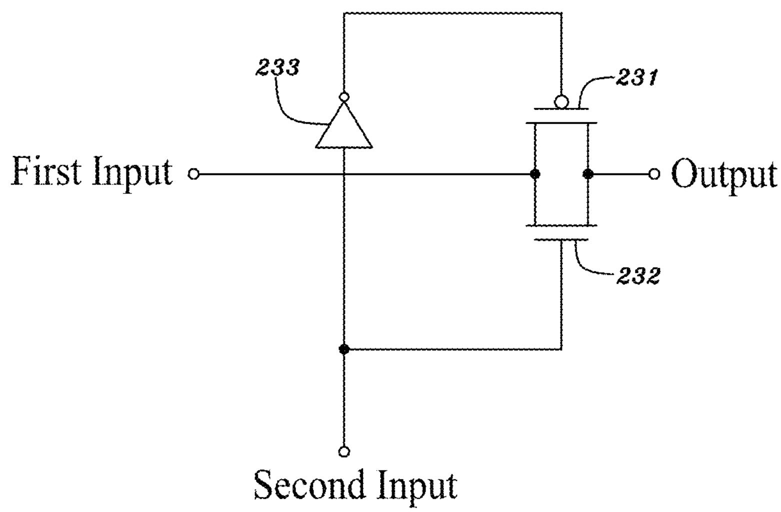
FIG. 4B is a circuit diagram illustrating a tri-state buffer of a multiplexer in accordance with an embodiment of the present application.

FIG. 4B is a circuit diagram illustrating a tri-state buffer of a multiplexer of a first type in accordance with an embodiment of the present application. Referring to FIGS. 4A and 4B, each of the tri-state buffers 215, 216, 217 and 218 may include (1) a P-type MOS transistor 231 configured to form a channel with an end at the first input of said each of the tri-state buffers 215, 216, 217 and 218 and the other opposite end at the output of said each of the tri-state buffers 215, 216, 217 and 218, (2) a N-type MOS transistor 232 configured to form a channel with an end at the first input of said each of the tri-state buffers 215, 216, 217 and 218 and the other opposite end at the output of said each of the tri-state buffers 215, 216, 217 and 218, and (3) an inverter 233 configured to invert its input, at the second input of said each of the tri-state buffers 215, 216, 217 and 218, coupling to a gate terminal of the N-type MOS transistor 232 into its output coupling to a gate terminal of the P-type MOS transistor 231. For each of the tri-state buffers 215, 216, 217 and 218, when its inverter 233 has its input at a logic level of "1", each of its P-type and N-type MOS transistors 231 and 232 may be switched on to pass its first input to its output via the channels of its P-type and N-type MOS transistors 231 and 232; when its inverter 233 has its input at a logic level of "0", each of its P-type and N-type MOS transistors 231 and 232 may be switched off not to form any channel therein such that its first input may not be passed to its output. For the two tri-state buffers 215 in each pair in the first stage, their two respective inverters 233 may have their two respective inputs coupling respectively to the output and input of the inverter 219, which are associated with the input A3 in the second set. For the two tri-state buffers 216 in each pair in the second stage, their two respective inverters 233 may have their two respective inputs coupling respectively to the output and input of the inverter 220, which are associated with the input A2 in the second set. For the two tri-state buffers 217 in each pair in the third stage, their two respective inverters 233 may have their two respective inputs coupling respectively to the output and input of the inverter 207, which are associated with the input A1 in the second set. For the two tri-state buffers 218 in the pair in the fourth stage, their two respective inverters 233 may have their two respective inputs coupling respectively to the output and input of the inverter 208, which are associated with the input A0 in the second set.

The first type of multiplexer (MUXER) 211 may select one from its first set of sixteen inputs D0-D15 into its output Dout based on a combination of its second set of four inputs A0-A3.

(2) Second Type of Multiplexer

Figure 4C:
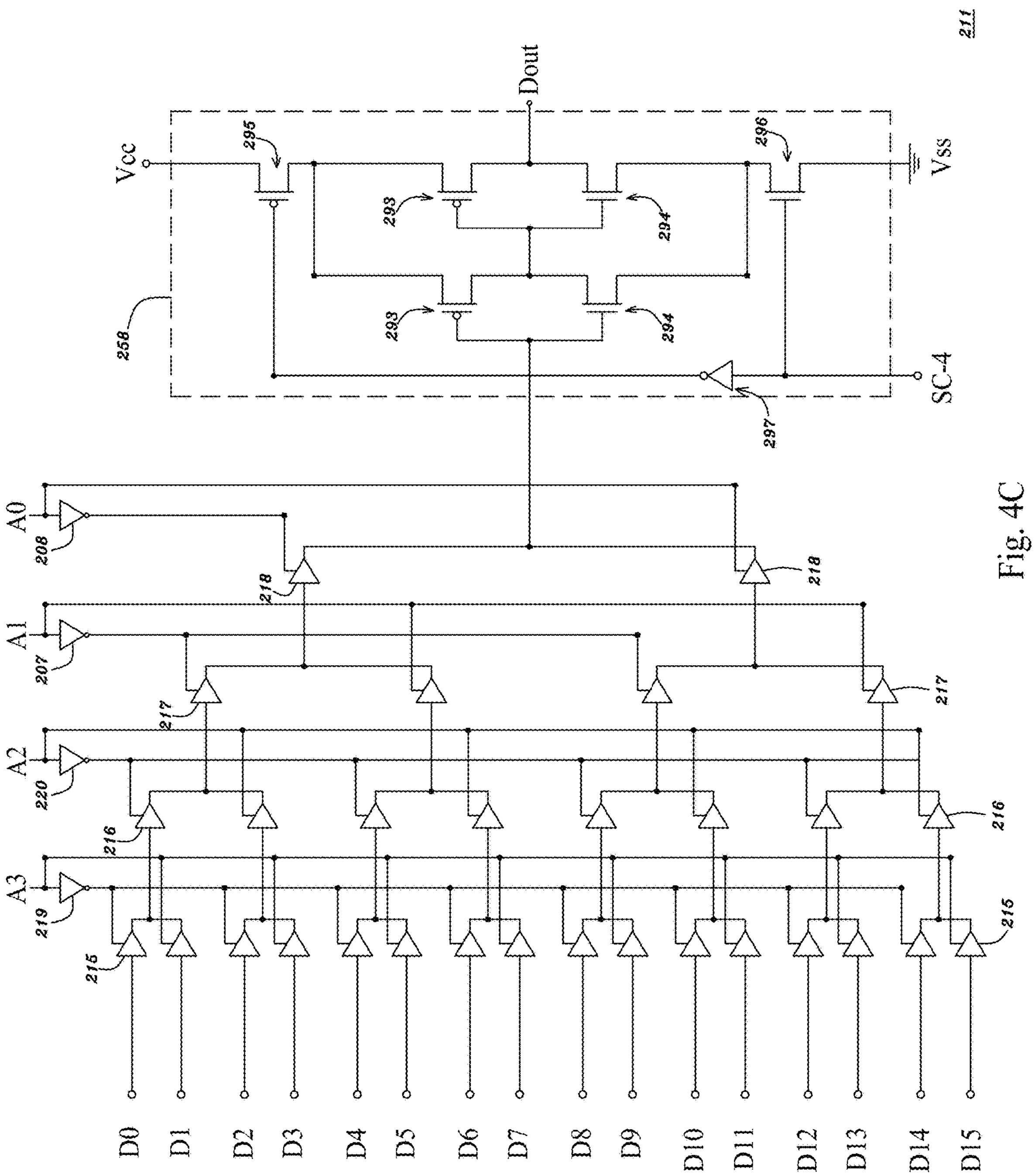

FIG. 4C is a circuit diagram of a second type of multiplexer in accordance with an embodiment of the present application. Referring to FIG. 4C, a second type of multiplexer 211 is similar to the first type of multiplexer 211 as illustrated in FIGS. 4A and 4B but may further include the third type of pass/no-pass switch or switch buffer 292 as seen in FIG. 2C having its input at the node N21 coupling to the output of the pair of tri-state buffers 218 in the last stage, e.g., in the fourth stage in this case. For an element indicated by the same reference number shown in FIGS. 2C, 4A, 4B and 4C, the specification of the element as seen in FIG. 4C may be referred to that of the element as illustrated in FIG. 2C, 4A or 4B. Accordingly, referring to FIG. 4C, the third type of pass/no-pass switch 258 may amplify its input at the node N21 into its output at the node N22 acting as an output Dout of the multiplexer 211 of the second type.

The second type of multiplexer (MUXER) 211 may select one from its first set of sixteen inputs D0-D15 into its output Dout based on a combination of its second set of four inputs A0-A3.

(3) Third Type of Multiplexer

Figure 4D:
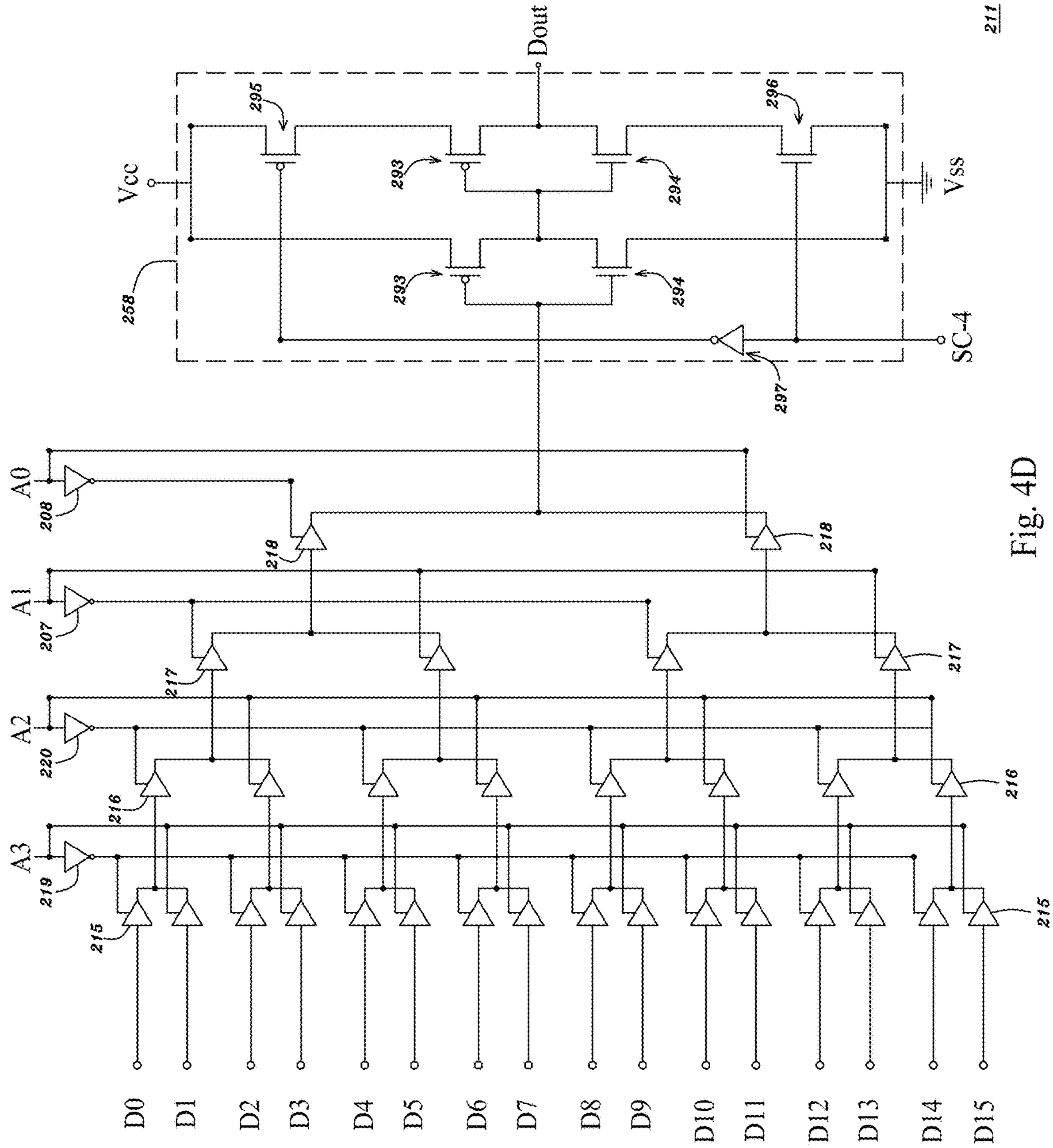

FIG. 4D is a circuit diagram of a third type of multiplexer in accordance with an embodiment of the present application. Referring to FIG. 4D, a third type of multiplexer 211 is similar to the first type of multiplexer 211 as illustrated in FIGS. 4A and 4B but may further include the fourth type of pass/no-pass switch 258 or switch buffer as seen in FIG. 2D having its input at the node N21 coupling to the output of the pair of tri-state buffers 218 in the last stage, e.g., in the fourth stage in this case. For an element indicated by the same reference number shown in FIGS. 2C, 2D, 4A, 4B, 4C and 4D, the specification of the element as seen in FIG. 4D may be referred to that of the element as illustrated in FIG. 2C, 2D, 4A, 4B or 4C. Accordingly, referring to FIG. 4D, the fourth type of pass/no-pass switch 258 may amplify its input at the node N21 into its output at the node N22 acting as an output Dout of the multiplexer 211 of the third type.

The third type of multiplexer (MUXER) 211 may select one from its first set of sixteen inputs D0-D15 into its output Dout based on a combination of its second set of four inputs A0-A3.

Figure 4E:
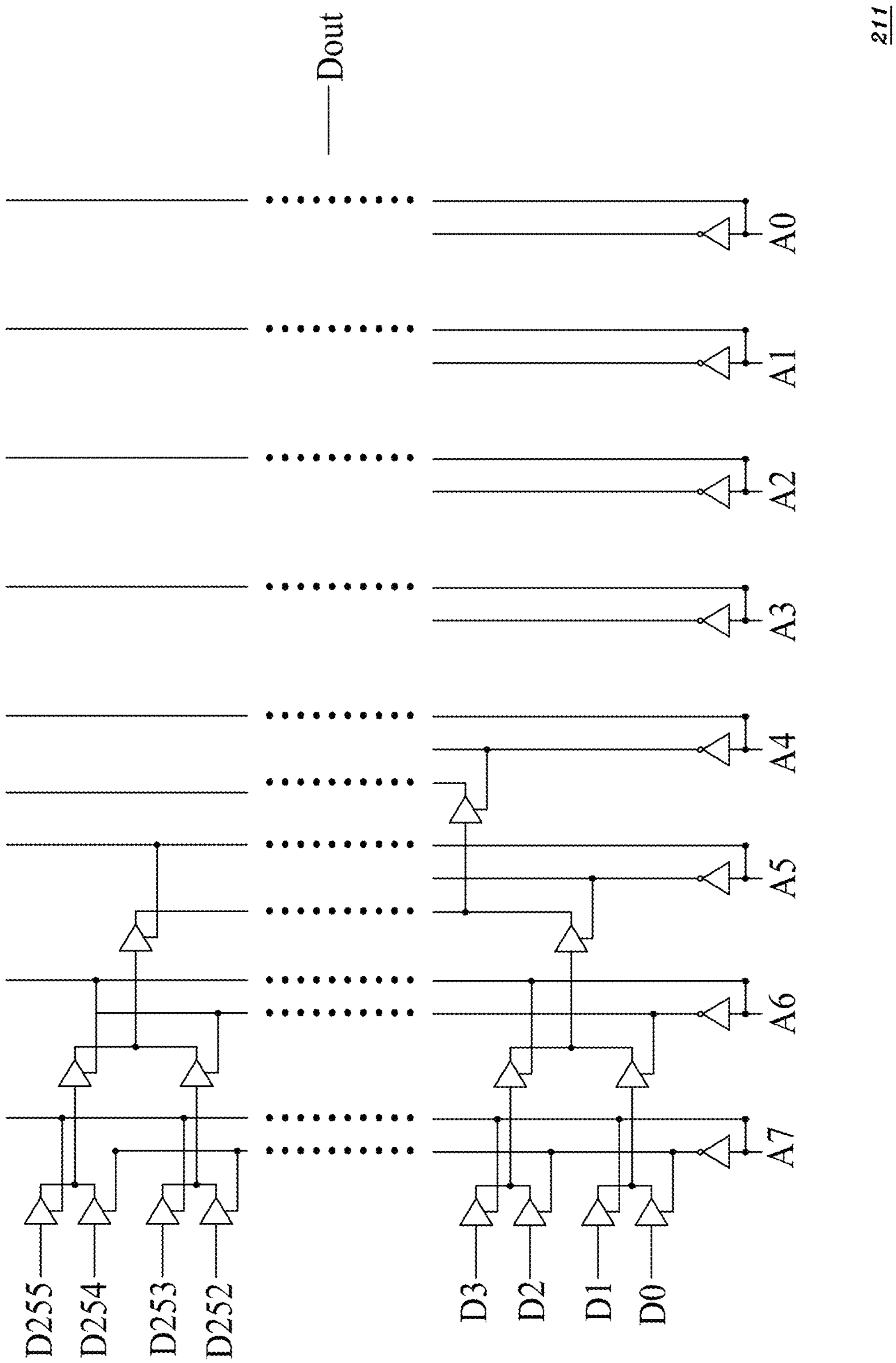

Alternatively, the first, second or third type of multiplexer (MUXER) 211 may have the first set of inputs, arranged in parallel, having the number of 2 to the power of n and the second set of inputs, arranged in parallel, having the number of n, wherein the number n may be any integer greater than or equal to 2, such as between 2 and 64. FIG. 4E is a schematic view showing a circuit diagram of a multiplexer in accordance with an embodiment of the present application. In this example, referring to FIG. 4E, each of the multiplexers 211 of the first through third types as illustrated in FIGS. 4A, 4C and 4D may be modified with its second set of inputs A0-A7, having the number of n equal to 8, and its first set of 256 inputs D0-D255, i.e. the resulting values or programming codes for all combinations of its second set of inputs A0-A7, having the number of 2 to the power of n equal to 8. Each of the multiplexers 211 of the first through third types may include eight stages of tri-state buffers or switch buffers, each having the same architecture as illustrated in FIG. 4B, coupling to one another stage by stage. The tri-state buffers or switch buffers in the first stage, arranged in parallel, may have the number of 256 each having its first input coupling to one of the 256 inputs D0-D255 of the first set of said each of the multiplexers 211 and each may be switched on or off to pass or not to pass its first input into an output in accordance with its second input associated with the input A7 of the second set of said each of the multiplexers 211. The tri-state buffers or switch buffers in each of the second through seventh stages, arranged in parallel, each may have its first input coupling to an output of one of multiple pairs of tri-state buffers or switch buffers in a stage previous to said each of the second through seventh stages and may be switched on or off to pass or not to pass its first input into an output in accordance with its second input associated with one of the respective inputs A6-A1 of the second set of said each of the multiplexers 211. Each of the tri-state buffers or switch buffers in a pair in the eighth stage may have its first input coupling to an output of one of multiple pairs of tri-state buffers or switch buffers in the seventh stage and may be switched on or off to pass or not to pass its first input into an output, which may act as an output Dout of the multiplexer 211, in accordance with its second input associated with the input A0 of the second set of said each of the multiplexers 211. Alternatively, one of the pass/no-pass switches or switch buffers 292 as seen in FIGS. 4C and 4D may be incorporated to amplify its input coupling to the output of the tri-state buffers or switch buffers in the pair in the eighth stage into an output Dout, which may act as an output of the multiplexer 211.

Figure 4F:
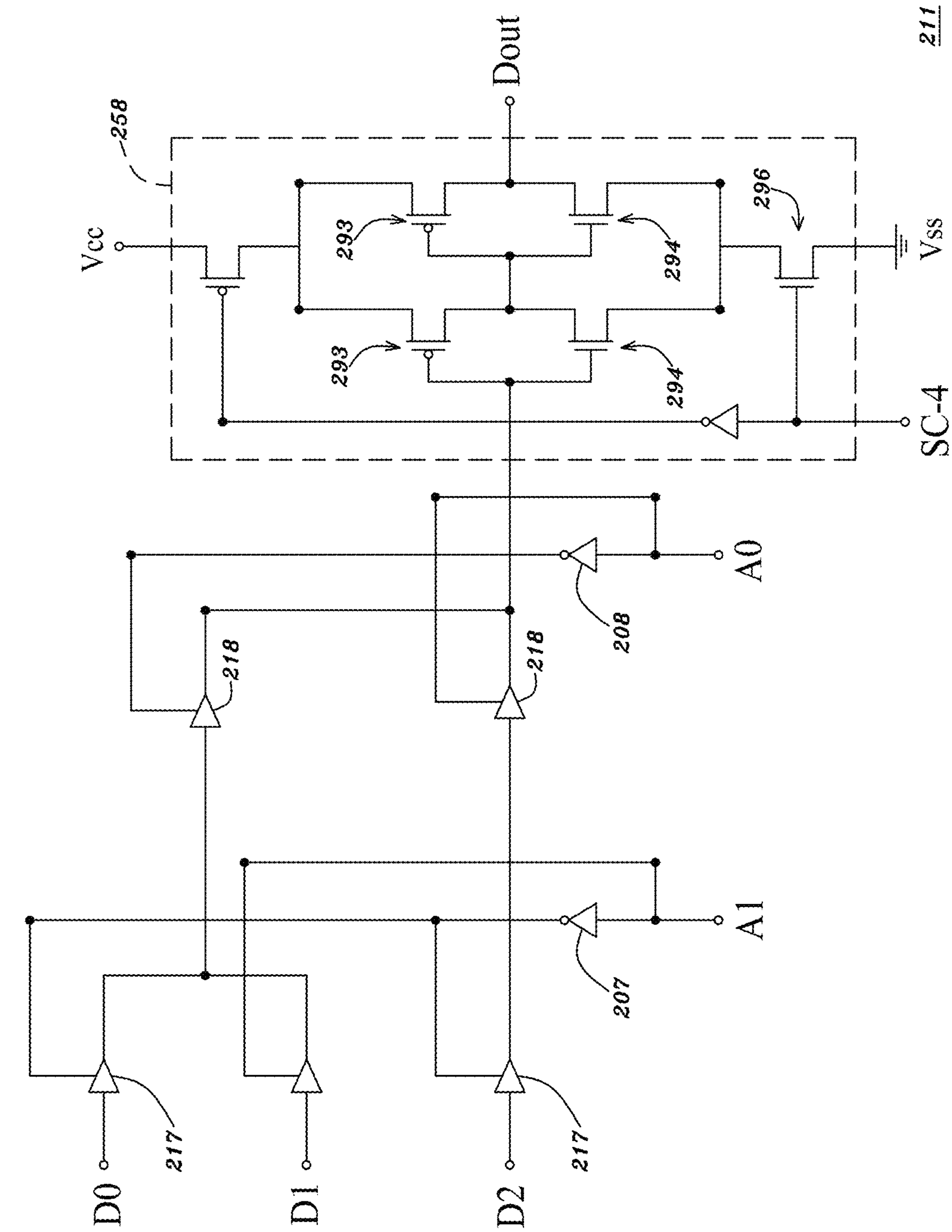

For example, FIG. 4F is a schematic view showing a circuit diagram of a multiplexer in accordance with an embodiment of the present application. Referring to FIG. 4F, the second type of multiplexer 211 may have the first set of inputs D0, D1 and D3 arranged in parallel and the second set of inputs A0 and A1 arranged in parallel. The second type of multiplexer 211 may include two stages of tri-state buffers 217 and 218 coupling to each other stage by stage. For more elaboration, the second type of multiplexer 211 may include three tri-state buffers 217 in the first stage, arranged in parallel, each having a first input coupling to one of the third inputs D0-D2 in the first set and a second input associated with the input A1 in the second set. Each of the three tri-state buffers 217 in the first stage may be switched on or off to pass or not to pass its first input into its output in accordance with its second input. The second type of multiplexer 211 may include the inverter 207 configured to invert its input coupling to the input A1 in the second set into its output. One of the top two tri-state buffers 217 in a pair in the first stage may be switched on in accordance with its second input coupling to one of the input and output of the inverter 207 to pass its first input into its output; the other one of the top two tri-state buffers 217 in the pair in the first stage may be switched off in accordance with its second input coupling to the other one of the input and output of the inverter 207 not to pass its first input into its output. The outputs of the top two tri-state buffers 217 in the pair in the first stage may couple to each other. Thereby, the pair of top two tri-state buffers 217 in the first stage may be switched in accordance with its two second inputs coupling to the input and output of the inverter 207 respectively to pass one of its two first inputs into its output coupling to a first input of one of the tri-state buffers 218 in the second stage. The bottom one of the tri-state buffers 217 in the first stage may be switched on or off in accordance with its second input coupling to the output of the inverter 207 to or not to pass its first input into its output coupling to a first input of another one of the tri-state buffers 218 in the second stage.

Referring to FIG. 4F, the second type of multiplexer 211 may include a pair of two tri-state buffers 218 in the second stage, arranged in parallel, a top one of which has a first input coupling to the output of the pair of top two tri-state buffers 217 in the first stage and a second input associated with the input A0 in the second set, and a bottom one of which has a first input coupling to the output of the bottom one of the tri-state buffers 217 in the first stage and a second input associated with the input A0 in the second set. Each of the two tri-state buffers 218 in the pair in the second stage may be switched on or off to pass or not to pass its first input into its output in accordance with its second input. The second type of multiplexer 211 may include the inverter 208 configured to invert its input coupling to the input A0 in the second set into its output. One of the two tri-state buffers 218 in the pair in the second stage may be switched on in accordance with its second input coupling to one of the input and output of the inverter 208 to pass its first input into its output; the other one of the two tri-state buffers 218 in the pair in the second stage may be switched off in accordance with its second input coupling to the other one of the input and output of the inverter 208 not to pass its first input into its output. The outputs of the two tri-state buffers 218 in the pair in the second stage may couple to each other. Thereby, the pair of the two tri-state buffers 218 in the second stage may be switched in accordance with its two second inputs coupling to the input and output of the inverter 208 respectively to pass one of its two first inputs into its output. The second type of multiplexer 211 may further include the third type of pass/no-pass switch 258 as seen in FIG. 2C having its input at the node N21 coupling to the output of the pair of tri-state buffers 218 in the second stage. The third type of pass/no-pass switch 252 may amplify its input at the node N21 into its output at the node N22 acting as an output Dout of the multiplexer 211 of the second type.

Figure 4G:
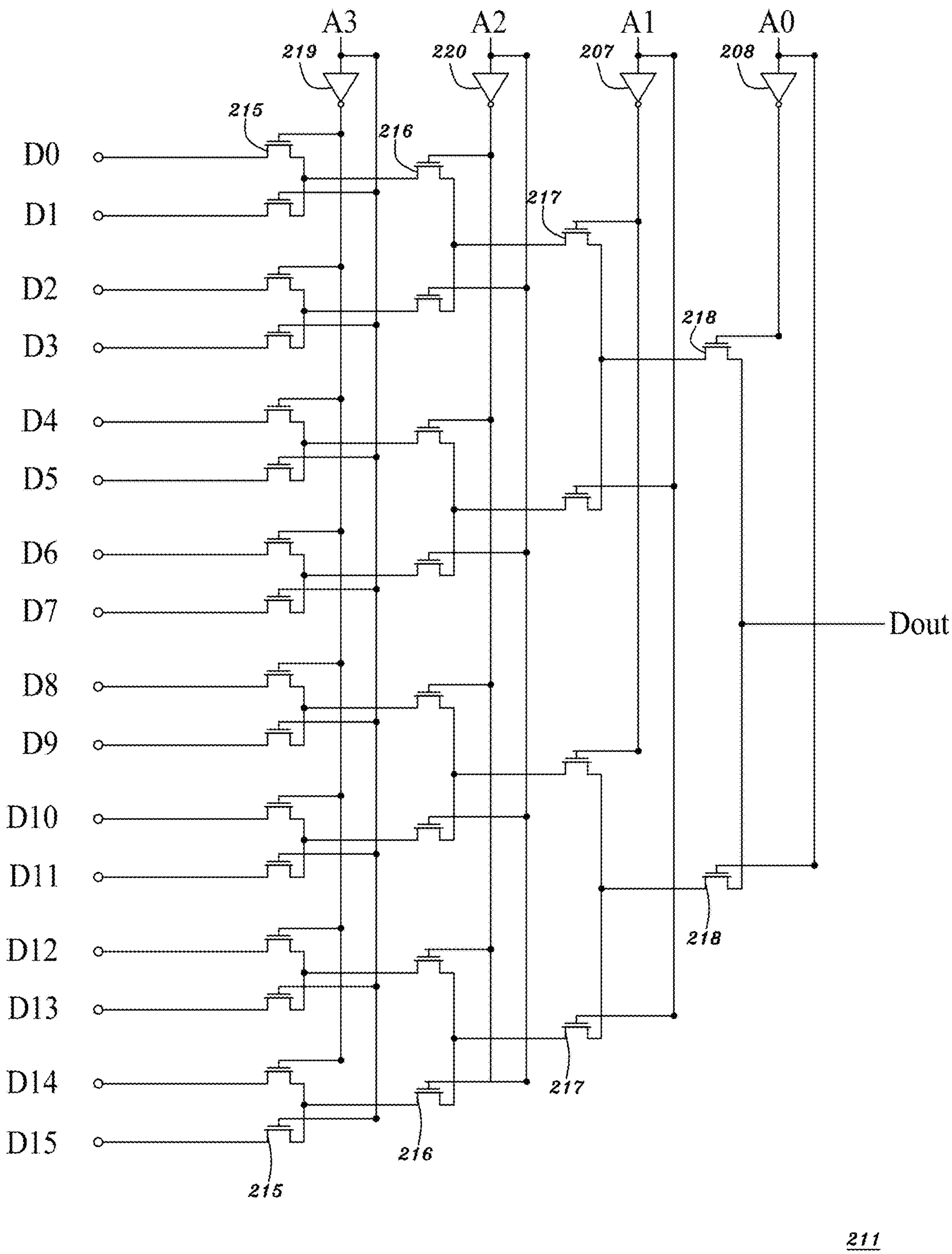
Figure 4H:
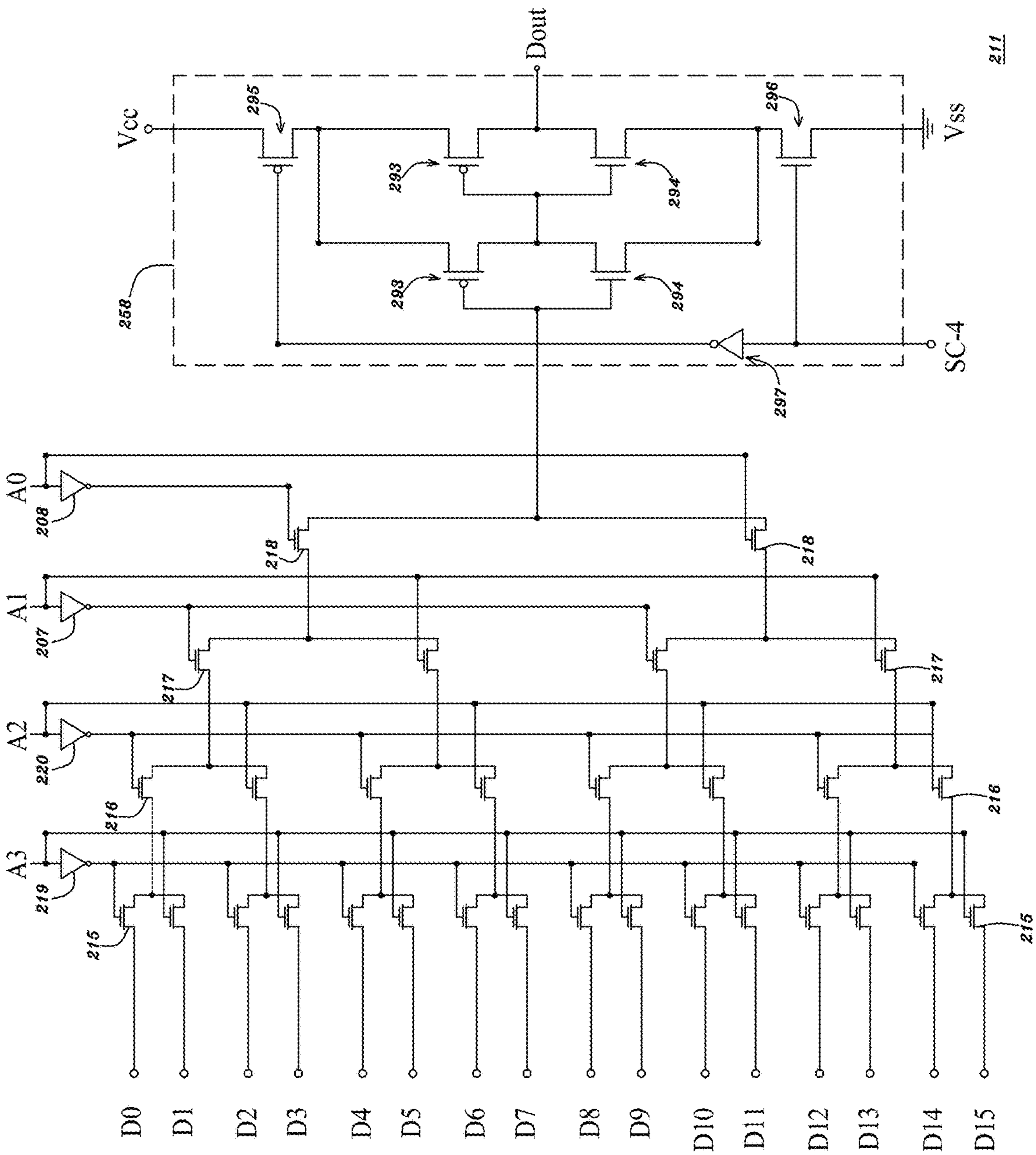
Figure 4I:
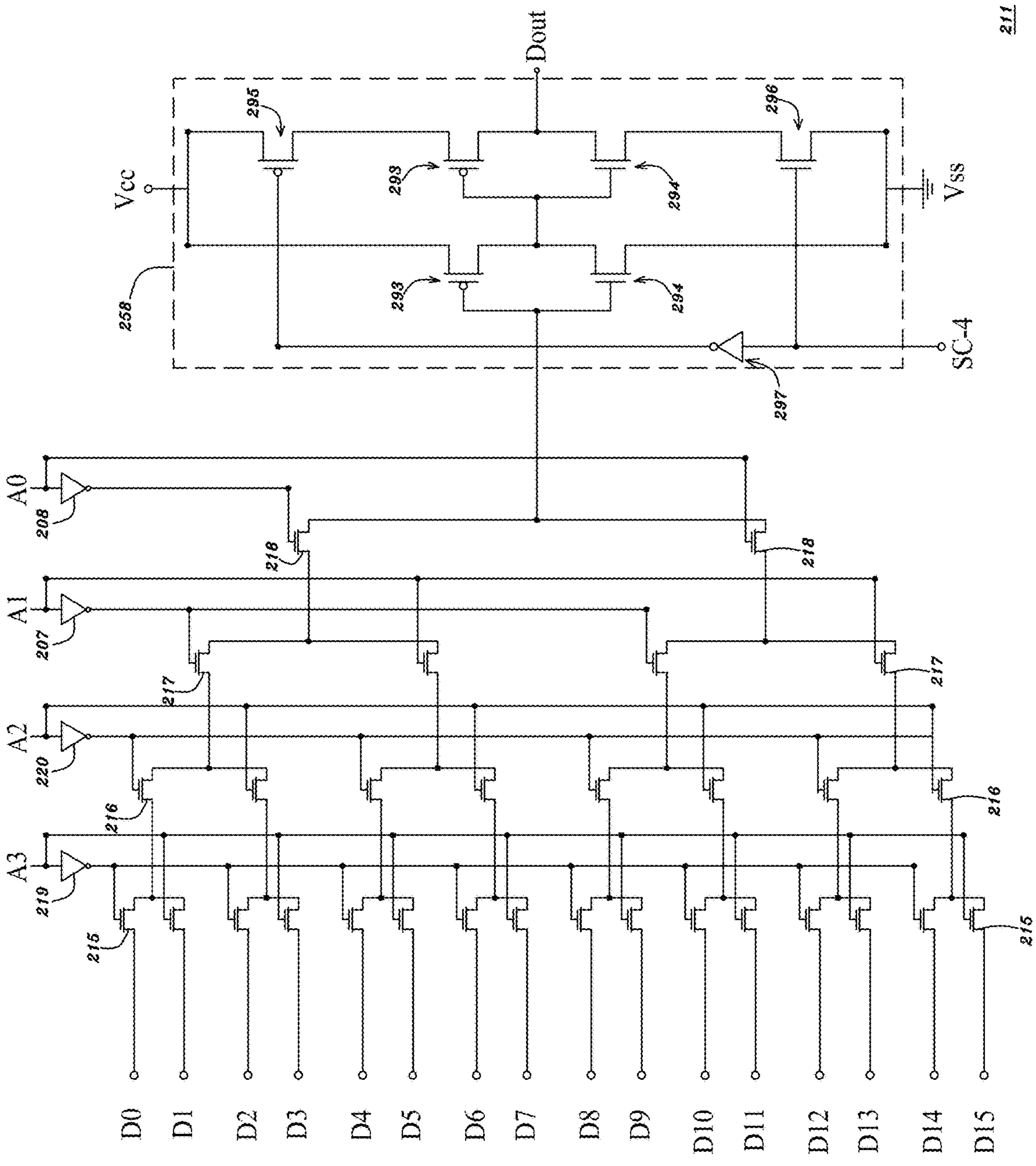
Figure 4J:
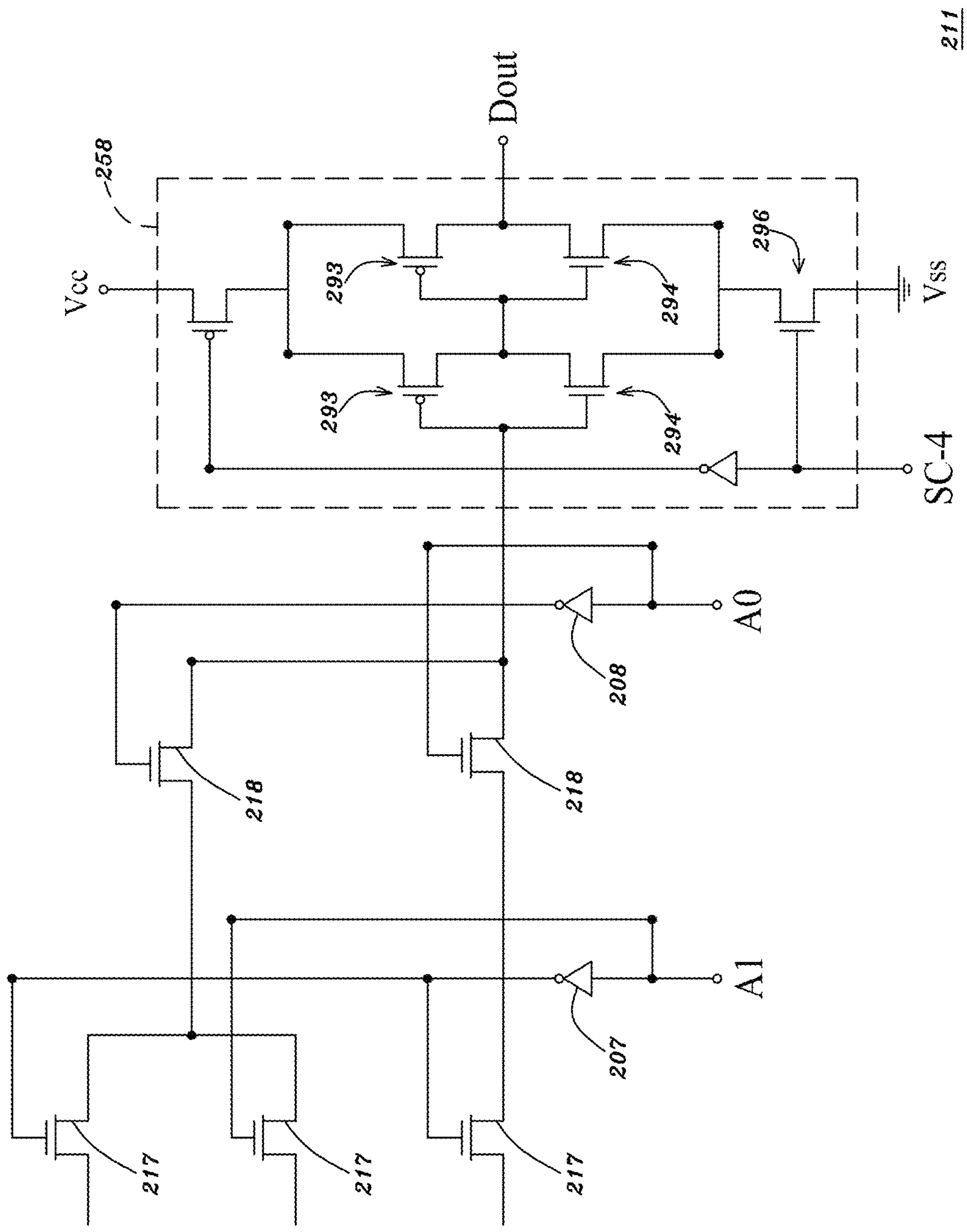

Alternatively, referring to FIGS. 4A-4F, each of the tri-state buffers 215, 216, 217 and 218 may be replaced with a transistor, such as N-type MOS transistor or P-type MOS transistor, as seen in FIGS. 4G-4J. FIGS. 4G-4J are schematic views showing circuit diagrams of multiplexers in accordance with an embodiment of the present application. For more elaboration, the first type of multiplexer 211 as seen in FIG. 4G is similar to that as seen in FIG. 4A, but the difference therebetween is that each of the tri-state buffers 215, 216, 217 and 218 is replaced with a transistor, such as N-type MOS transistor or P-type MOS transistor. The second type of multiplexer 211 as seen in FIG. 4H is similar to that as seen in FIG. 4C, but the difference therebetween is that each of the tri-state buffers 215, 216, 217 and 218 is replaced with a transistor, such as N-type MOS transistor or P-type MOS transistor. The third type of multiplexer 211 as seen in FIG. 4I is similar to that as seen in FIG. 4D, but the difference therebetween is that each of the tri-state buffers 215, 216, 217 and 218 is replaced with a transistor, such as N-type MOS transistor or P-type MOS transistor. The second type of multiplexer 211 as seen in FIG. 4J is similar to that as seen in FIG. 4F, but the difference therebetween is that each of the tri-state buffers 215, 216, 217 and 218 is replaced with a transistor, such as N-type MOS transistor or P-type MOS transistor.

Referring to FIGS. 4G-4J, each of the transistors 215 may be configured to form a channel with an input terminal coupling to what the first input of replaced one of the tri-state buffers 215 seen in FIGS. 4A-4F couples, and an output terminal coupling to what the output of the replaced one of the tri-state buffers 215 seen in FIGS. 4A-4F couples, and may have a gate terminal coupling to what the second input of the replaced one of the tri-state buffers 215 seen in FIGS. 4A-4F couples. Each of the transistors 216 may be configured to form a channel with an input terminal coupling to what the first input of replaced one of the tri-state buffers 216 seen in FIGS. 4A-4F couples, and an output terminal coupling to what the output of the replaced one of the tri-state buffers 216 seen in FIGS. 4A-4F couples, and may have a gate terminal coupling to what the second input of the replaced one of the tri-state buffers 216 seen in FIGS. 4A-4F couples. Each of the transistors 217 may be configured to form a channel with an input terminal coupling to what the first input of replaced one of the tri-state buffers 217 seen in FIGS. 4A-4F couples, and an output terminal coupling to what the output of the replaced one of the tri-state buffers 217 seen in FIGS. 4A-4F couples, and may have a gate terminal coupling to what the second input of the replaced one of the tri-state buffers 217 seen in FIGS. 4A-4F couples. Each of the transistors 218 may be configured to form a channel with an input terminal coupling to what the first input of replaced one of the tri-state buffers 218 seen in FIGS. 4A-4F couples, and an output terminal coupling to what the output of the replaced one of the tri-state buffers 218 seen in FIGS. 4A-4F couples, and may have a gate terminal coupling to what the second input of the replaced one of the tri-state buffers 218 seen in FIGS. 4A-4F couples.

Specification for Cross-Point Switches Constructed from Multiplexers

The first and second types of cross-point switches 379 as illustrated in FIGS. 3A and 3B are fabricated from a plurality of the pass/no-pass switches 258 seen in FIGS. 2A-2F. Alternatively, cross-point switches 379 may be fabricated from either of the first through third types of multiplexers 211, mentioned as below.

(1) Third Type of Cross-Point Switch

Figure 3D:
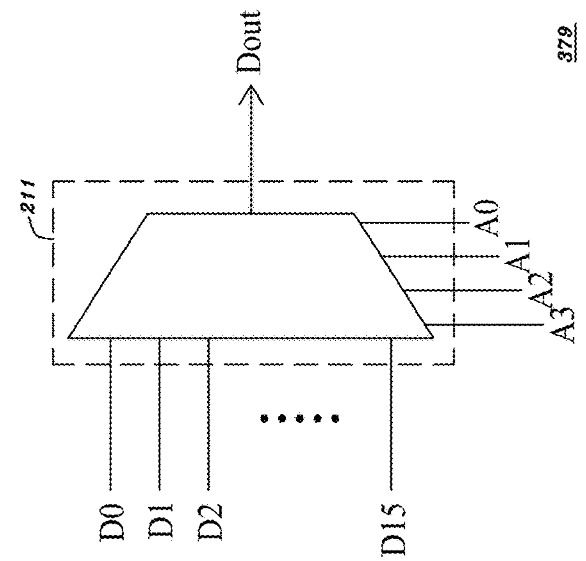
Figure 3C:
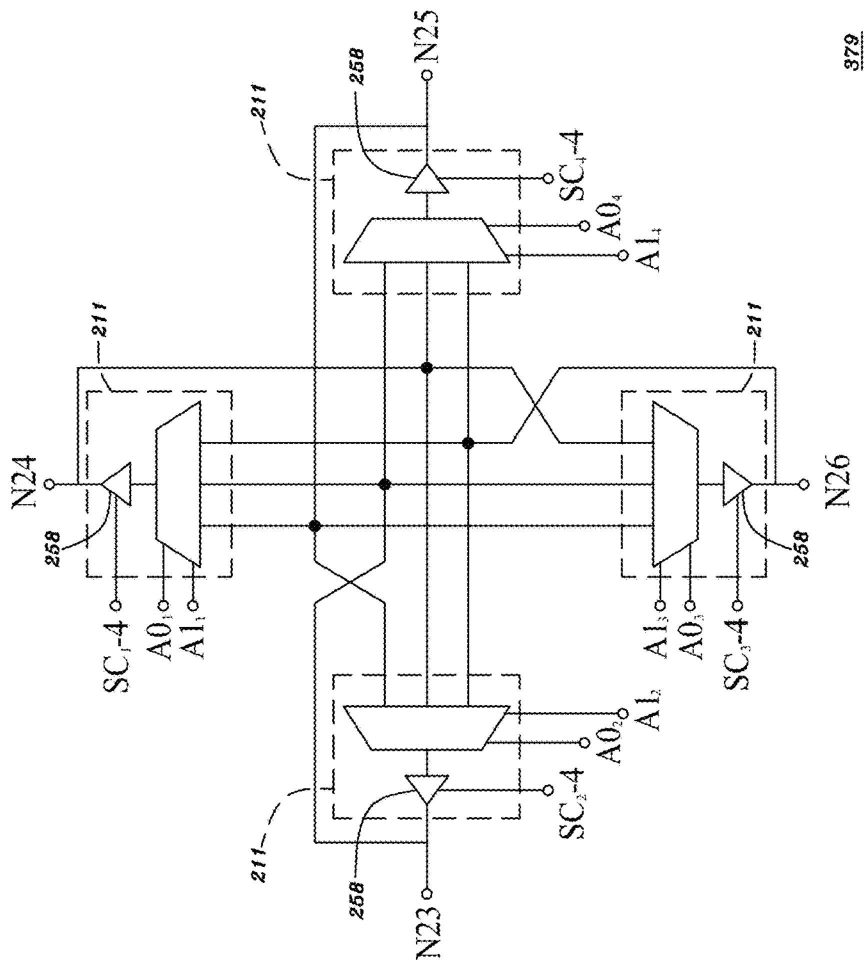

FIG. 3C is a circuit diagram illustrating a third type of cross-point switch composed of multiple multiplexers in accordance with an embodiment of the present application. Referring to FIG. 3C, the third type of cross-point switch 379 may include four multiplexers 211 of the first, second or third type as seen in FIGS. 4A-4J each having three inputs in the first set and two inputs in the second set and being configured to pass one of its three inputs in the first set into an output in accordance with a combination of its two inputs in the second set. Particularly, the second type of the multiplexer 211 employed in the third type of cross-point switch 379 may be referred to that illustrated in FIGS. 4F and 4J. Each of the three inputs D0-D2 of the first set of one of the four multiplexers 211 may couple to one of its three inputs D0-D2 of the first set of another two of the four multiplexers 211 and to an output Dout of the other one of the four multiplexers 211. Thereby, each of the four multiplexers 211 may pass one of its three inputs D0-D2 in the first set coupling to three respective metal lines extending in three different directions to the three outputs Dout of the other three of the four multiplexers 211 into its output Dout in accordance with a combination of its two inputs A0 and A1 in the second set. Each of the four multiplexers 211 may include the pass/no-pass switch or switch buffer 258 configured to be switched on or off in accordance with its input SC-4 to pass or not to pass one of its three inputs D0-D2 in the first set, passed in accordance with the second set of its inputs A0 and A1, into its output Dout. For example, the top one of the four multiplexers 211 may pass one of its three inputs in the first set coupling to the three outputs Dout at nodes N23, N26 and N25 of the left, bottom and right ones of the four multiplexers 211 into its output Dout at a node N24 in accordance with a combination of its two inputs $A\mathbf{0}_1$ and $A\mathbf{1}_1$ in the second set. The top one of the four multiplexers 211 may include the pass/no-pass switch or switch buffer 258 configured to be switched on or off in accordance with the second set of its input $SC_1$-4 to pass or not to pass one of its three inputs in the first set, passed in accordance with the second set of its inputs $A\mathbf{0}_1$ and $A\mathbf{1}_1$, into its output Dout at the node N24.

(2) Fourth Type of Cross-Point Switch

FIG. 3D is a circuit diagram illustrating a fourth type of cross-point switch composed of a multiplexer in accordance with an embodiment of the present application. Referring to FIG. 3D, the fourth type of cross-point switch 379 may be provided from any of the multiplexers 211 of the first through third types as illustrated in FIGS. 4A-4J. When the fourth type of cross-point switch 379 is provided by one of the multiplexers 211 as illustrated in FIGS. 4A, 4C, 4D and 4G-4I, it is configured to pass one of its 16 inputs D0-D15 in the first set into its output Dout in accordance with a combination of its four inputs A0-A3 in the second set.

Specification for Large I/O Circuits

Figure 5A:
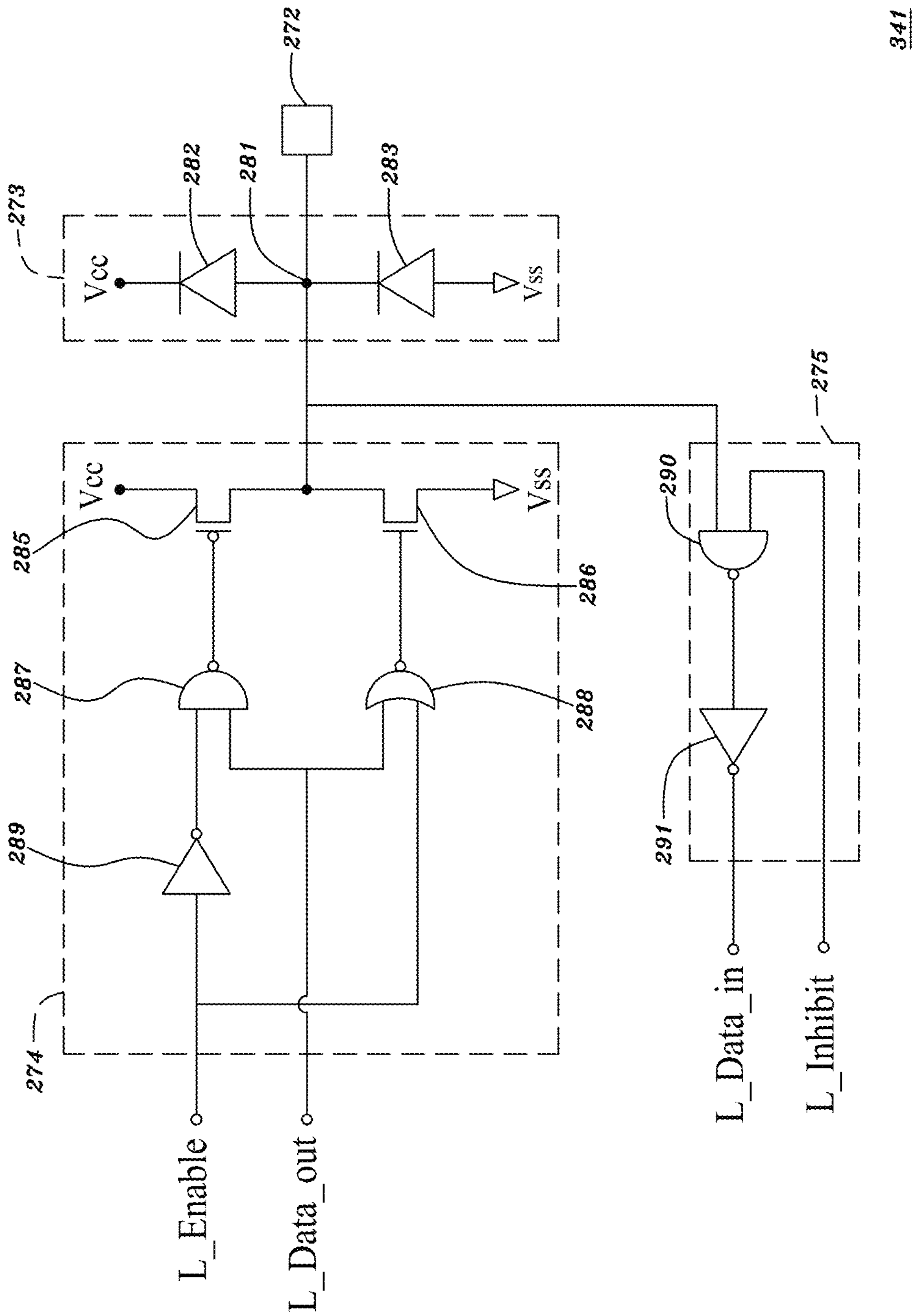
FIG. 5A is a circuit diagram of a large I/O circuit in accordance with an embodiment of the present application.

FIG. 5A is a circuit diagram of a large I/O circuit in accordance with an embodiment of the present application. Referring to FIG. 5A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to a power supply at a voltage of Vcc and an anode coupling to a node 281 and a diode 283 having a cathode coupling to the node 281 and an anode coupling to a ground reference at a voltage of Vss. The node 281 couples to one of the I/O pads 272.

Referring to FIG. 5A, the large driver 274 may have a first input coupling to an L_Enable signal for enabling the large driver 274 and a second input coupling to data of L_Data_out for amplifying or driving the data of L_Data_out into its output at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output at the node 281 and respective source terminals coupling to the power supply at the voltage of Vcc and to the ground reference at the voltage of Vss. The large driver 274 may have a NAND gate 287 having an output coupling to a gate terminal of the P-type MOS transistor 285 and a NOR gate 288 having an output coupling to a gate terminal of the N-type MOS transistor 286. The large driver 274 may include the NAND gate 287 having a first input coupling to an output of its inverter 289 and a second input coupling to the data of L_Data_out to perform a NAND operation on its first and second inputs into its output coupling to a gate terminal of its P-type MOS transistor 285. The large driver 274 may include the NOR gate 288 having a first input coupling to the data of L_Data_out and a second input coupling to the L_Enable signal to perform a NOR operation on its first and second inputs into its output coupling to a gate terminal of the N-type MOS transistor 286. The inverter 289 may be configured to invert its input coupling to the L_Enable signal into its output coupling to the first input of the NAND gate 287.

Referring to FIG. 5A, when the L_Enable signal is at a logic level of "1", the output of the NAND gate 287 is always at a logic level of "1" to turn off the P-type MOS transistor 285 and the output of the NOR gate 288 is always at a logic level of "0" to turn off the N-type MOS transistor 286. Thereby, the large driver 274 may be disabled by the L_Enable signal and the data of L_Data_out may not be passed to the output of the large driver 274 at the node 281.

Referring to FIG. 5A, the large driver 274 may be enabled when the L_Enable signal is at a logic level of "0". Meanwhile, if the data of L_Data_out is at a logic level of "0", the outputs of the NAND and NOR gates 287 and 288 are at logic level of "1" to turn off the P-type MOS transistor 285 and on the N-type MOS transistor 286, and thereby the output of the large driver 274 at the node 281 is at a logic level of "0" to be passed to said one of the I/O pads 272. If the data of L_Data_out is at a logic level of "1", the outputs of the NAND and NOR gates 287 and 288 are at logic level of "0" to turn on the P-type MOS transistor 285 and off the N-type MOS transistor 286, and thereby the output of the large driver 274 at the node 281 is at a logic level of "1" to be passed to said one of the I/O pads 272. Accordingly, the large driver 274 may be enabled by the L_Enable signal to amplify or drive the data of L_Data_out into its output at the node 281 coupling to one of the I/O pads 272.

Referring to FIG. 5A, the large receiver 275 may have a first input coupling to said one of the I/O pads 272 to be amplified or driven by the large receiver 275 into its output of L_Data_in and a second input coupling to an L_Inhibit signal to inhibit the large receiver 275 from generating its output of L_Data_in associated with data at its first input. The large receiver 275 may include a NAND gate 290 having a first input coupling to said one of the I/O pads 272 and a second input coupling to the L_Inhibit signal to perform a NAND operation on its first and second inputs into its output coupling to its inverter 291. The inverter 291 may be configured to invert its input coupling to the output of the NAND gate 290 into its output acting as the output of L_Data_in of the large receiver 275.

Referring to FIG. 5A, when the L_Inhibit signal is at a logic level of "0", the output of the NAND gate 290 is always at a logic level of "1" and the output L_Data_in of the large receiver 275 is always at a logic level of "0". Thereby, the large receiver 275 is inhibited from generating its output of L_Data_in associated with its first input at said one of the I/O pads 272.

Referring to FIG. 5A, the large receiver 275 may be activated when the L_Inhibit signal is at a logic level of "1". Meanwhile, if data from circuits outside the chip to said one of the I/O pads 272 is at a logic level of "1", the NAND gate 290 has its output at a logic level of "0", and thereby the large receiver 275 may have its output of L_Data_in at a logic level of "1". If data from circuits outside the chip to said one of the I/O pads 272 is at a logic level of "0", the NAND gate 290 has its output at a logic level of "1", and thereby the large receiver 275 may have its output of L_Data_in at a logic level of "0". Accordingly, the large receiver 275 may be activated by the L_Inhibit signal to amplify or drive data from circuits outside the chip to said one of the I/O pads 272 into its output of L_Data_in.

Referring to FIG. 5A, said one of the I/O pads 272 may have an input capacitance, provided by the large ESD protection circuit or device 273 and large receiver 275 for example, between 2 pF and 100 pF, between 2 pF and 50 pF, between 2 pF and 30 pF, or greater than 2 pF, 5 pF, 10 pF, 15 pF or 20 pF. The large driver 274 may have an output capacitance or driving capability or loading, for example, between 2 pF and 100 pF, between 2 pF and 50 pF, between 2 pF and 30 pF, or greater than 2 pF, 5 pF, 10 pF, 15 pF or 20 pF. The size of the large ESD protection circuit or device 273 may be between 0.5 pF and 20 pF, 0.5 pF and 15 pF, 0.5 pF and 10 pF 0.5 pF and 5 pF or 0.5 pF and 2 pF, or larger than 0.5 pF, 1 pF, 2 pF, 3 pF, 5 pF or 10 pF.

Specification for Small I/O Circuits

Figure 5B:
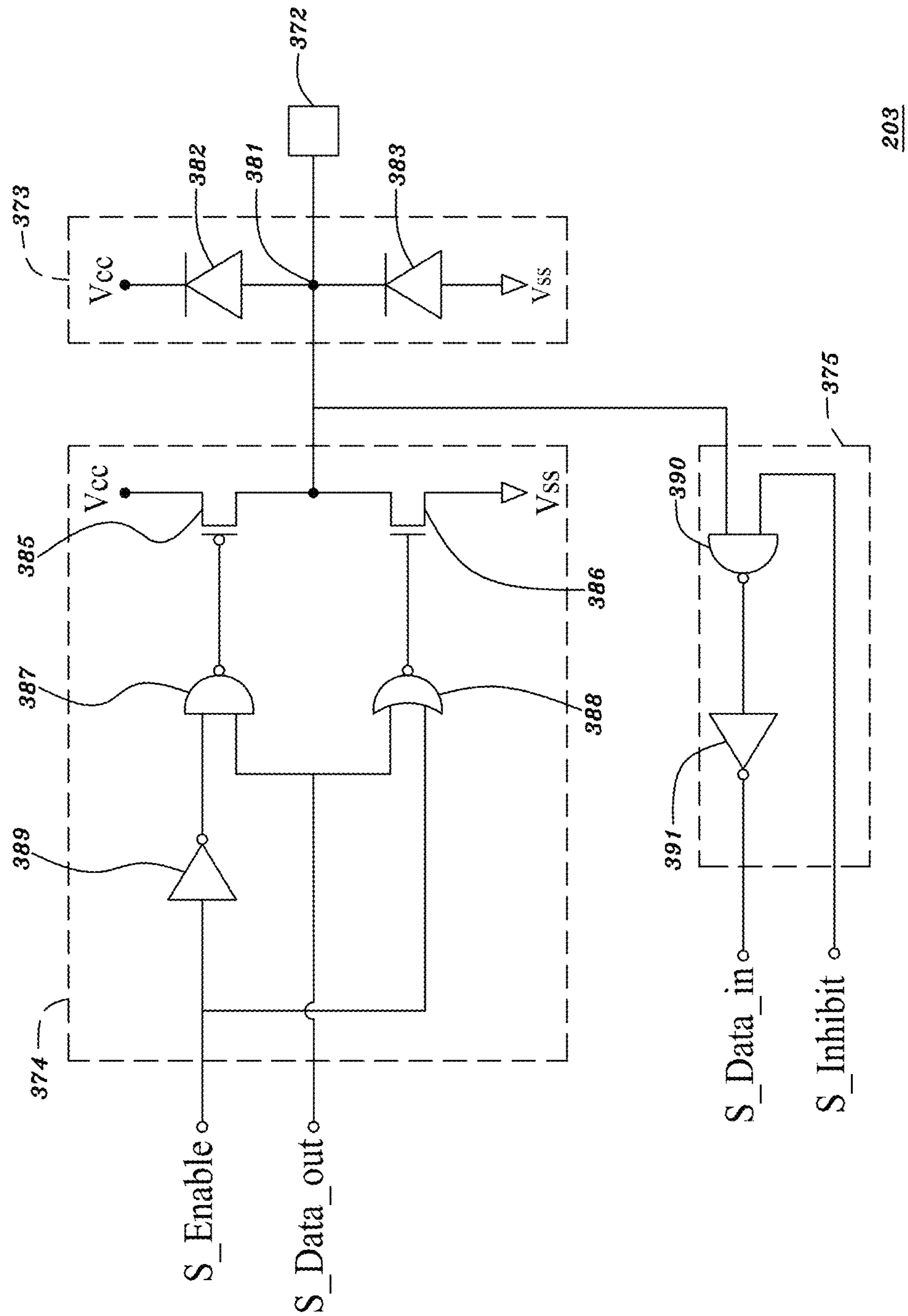
FIG. 5B is a circuit diagram of a small I/O circuit in accordance with an embodiment of the present application.

FIG. 5B is a circuit diagram of a small I/O circuit in accordance with an embodiment of the present application. Referring to FIG. 5B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to a power supply at a voltage of Vcc and an anode coupling to a node 381 and a diode 383 having a cathode coupling to the node 381 and an anode coupling to a ground reference at a voltage of Vss. The node 381 couples to one of the I/O pads 372.

Referring to FIG. 5B, the small driver 374 may have a first input coupling to an S_Enable signal for enabling the small driver 374 and a second input coupling to data of S_Data_out for amplifying or driving the data of S_Data_out into its output at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output at the node 381 and respective source terminals coupling to the power supply at the voltage of Vcc and to the ground reference at the voltage of Vss. The small driver 374 may have a NAND gate 387 having an output coupling to a gate terminal of the P-type MOS transistor 385 and a NOR gate 388 having an output coupling to a gate terminal of the N-type MOS transistor 386. The small driver 374 may include the NAND gate 387 having a first input coupling to an output of its inverter 389 and a second input coupling to the data of S_Data_out to perform a NAND operation on its first and second inputs into its output coupling to a gate terminal of its P-type MOS transistor 385. The small driver 374 may include the NOR gate 388 having a first input coupling to the data of S_Data_out and a second input coupling to the S_Enable signal to perform a NOR operation on its first and second inputs into its output coupling to a gate terminal of the N-type MOS transistor 386. The inverter 389 may be configured to invert its input coupling to the S_Enable signal into its output coupling to the first input of the NAND gate 387.

Referring to FIG. 5B, when the S_Enable signal is at a logic level of "1", the output of the NAND gate 387 is always at a logic level of "1" to turn off the P-type MOS transistor 385 and the output of the NOR gate 388 is always at a logic level of "0" to turn off the N-type MOS transistor 386. Thereby, the small driver 374 may be disabled by the S_Enable signal and the data of S_Data_out may not be passed to the output of the small driver 374 at the node 381.

Referring to FIG. 5B, the small driver 374 may be enabled when the S_Enable signal is at a logic level of "0". Meanwhile, if the data of S_Data_out is at a logic level of "0", the outputs of the NAND and NOR gates 387 and 388 are at logic level of "1" to turn off the P-type MOS transistor 385 and on the N-type MOS transistor 386, and thereby the output of the small driver 374 at the node 381 is at a logic level of "0" to be passed to said one of the I/O pads 372. If the data of S_Data_out is at a logic level of "1", the outputs of the NAND and NOR gates 387 and 388 are at logic level of "0" to turn on the P-type MOS transistor 385 and off the N-type MOS transistor 386, and thereby the output of the small driver 374 at the node 381 is at a logic level of "1" to be passed to said one of the I/O pads 372. Accordingly, the small driver 374 may be enabled by the S_Enable signal to amplify or drive the data of S_Data_out into its output at the node 381 coupling to one of the I/O pads 372.

Referring to FIG. 5B, the small receiver 375 may have a first input coupling to said one of the I/O pads 372 to be amplified or driven by the small receiver 375 into its output of S_Data_in and a second input coupling to an S_Inhibit signal to inhibit the small receiver 375 from generating its output of S_Data_in associated with its first input. The small receiver 375 may include a NAND gate 390 having a first input coupling to said one of the I/O pads 372 and a second input coupling to the S_Inhibit signal to perform a NAND operation on its first and second inputs into its output coupling to its inverter 391. The inverter 391 may be configured to invert its input coupling to the output of the NAND gate 390 into its output acting as the output of S_Data_in of the small receiver 375.

Referring to FIG. 5B, when the S_Inhibit signal is at a logic level of "0", the output of the NAND gate 390 is always at a logic level of "1" and the output S_Data_in of the small receiver 375 is always at a logic level of "0". Thereby, the small receiver 375 is inhibited from generating its output of S_Data_in associated with its first input at said one of the I/O pads 372.

Referring to FIG. 5B, the small receiver 375 may be activated when the S_Inhibit signal is at a logic level of "1". Meanwhile, if data from circuits outside the semiconductor chip to said one of the I/O pads 372 is at a logic level of "1", the NAND gate 390 has its output at a logic level of "0", and thereby the small receiver 375 may have its output of S_Data_in at a logic level of "1". If data from circuits outside the chip to said one of the I/O pads 372 is at a logic level of "0", the NAND gate 390 has its output at a logic level of "1", and thereby the small receiver 375 may have its output of S_Data_in at a logic level of "0". Accordingly, the small receiver 375 may be activated by the S_Inhibit signal to amplify or drive data from circuits outside the chip to said one of the I/O pads 372 into its output of S_Data_in.

Referring to FIG. 5B, said one of the I/O pads 372 may have an input capacitance, provided by the small ESD protection circuit or device 373 and small receiver 375 for example, between 0.1 pF and 10 pF, between 0.1 pF and 5 pF, between 0.1 pF and 3 pF or between 0.1 pF and 2 pF, or smaller than 10 pF, 5 pF, 3 pF, 2 pF or 1 pF. The small driver 374 may have an output capacitance or driving capability or loading, for example, between 0.1 pF and 10 pF, between 0.1 pF and 5 pF, between 0.1 pF and 3 pF or between 0.1 pF and 2 pF, or smaller than 10 pF, 5 pF, 3 pF, 2 pF or 1 pF. The size of the small ESD protection circuit or device 373 may be between 0.05 pF and 10 pF, 0.05 pF and 5 pF, 0.05 pF and 2 pF or 0.05 pF and 1 pF; or smaller than 5 pF, 3 pF, 2 pF, 1 pF or 0.5 pF.

Specification for Programmable Logic Blocks

Figure 6A:
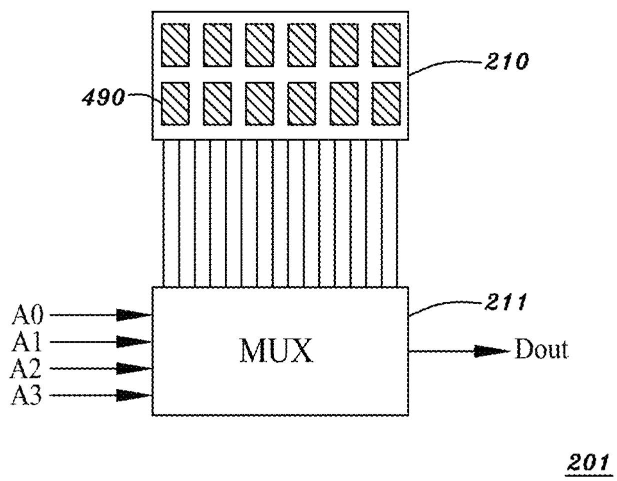
FIG. 6A is a schematic view showing a block diagram of a programmable logic block in accordance with an embodiment of the present application.

FIG. 6A is a schematic view showing a block diagram of a programmable logic block in accordance with an embodiment of the present application. Referring to FIG. 6A, a programmable logic block (LB) 201 may be of various types, including a look-up table (LUT) 210 and a multiplexer 211, i.e. configurable or reconfigurable logic circuit or selection circuit, having its first set of inputs, e.g., D0-D15 as illustrated in FIG. 4A, 4C, 4D or 4G-4I or D0-D255 as illustrated in FIG. 4E, each coupling to one of resulting values or programming codes stored in the look-up table (LUT) 210 and its second set of inputs, e.g., four-digit inputs of A0-A3 as illustrated in FIG. 4A, 4C, 4D or 4G-4I or eight-digit inputs of A0-A7 as illustrated in FIG. 4E, configured to determine one of the inputs in its first set into its output, e.g., Dout as illustrated in FIG. 4A, 4C-4E or 4G-4I, acting as an output of the programmable logic block (LB) 201. The inputs, e.g., A0-A3 as illustrated in FIG. 4A, 4C, 4D or 4G-4I or A0-A7 as illustrated in FIG. 4E, of the second set of the multiplexer 211 may act as inputs of the programmable logic block (LB) 201. For a case, the multiplexer 211 of the programmable logic block (LB) 201 may have (1) a first set of input points for a first input data set for a logic operation associated with its second set of inputs, e.g., four-digit inputs of A0-A3 as illustrated in FIG. 4A, 4C, 4D or 4G-4I or eight-digit inputs of A0-A7 as illustrated in FIG. 4E, and (2) a second set of input points for a second input data set associated with its first set of inputs, e.g., D0-D15 as illustrated in FIG. 4A, 4C, 4D or 4G-4I or D0-D255 as illustrated in FIG. 4E, each coupling to one of resulting values or programming codes stored in the look-up table (LUT) 210. The multiplexer 211 of the programmable logic block (LB) 201 is configured to select, in accordance with the first input data set, a resulting value from the second input data set associated with the resulting values of the look-up table (LUT) as an output data for the logic operation at an output point of the multiplexer 211.

Referring to FIG. 6A, the look-up table (LUT) 210 of the programmable logic block (LB) 201 may be composed of multiple memory cells 490 each configured to save or store one of the resulting values, i.e., programming codes. Each of the memory cells 490 may be an on-chip volatile memory cell referred to one 398 as illustrated in FIG. 1A or 1B or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell. Its multiplexer 211 may have its first set of inputs, e.g., D0-D15 as illustrated in FIG. 4A, 4C, 4D or 4G-4I or D0-D255 as illustrated in FIG. 4E, each coupling to one of the outputs of one of the memory cells 490, i.e., one of the outputs Out1 and Out2 of the memory cell 398, for the look-up table (LUT) 210. Thus, each of the resulting values or programming codes stored in the respective memory cells 490 may couple to one of the inputs of the first set of the multiplexer 211 of the programmable logic block (LB) 201.

Furthermore, the programmable logic block (LB) 201 may be composed of another memory cell 490 configured to save or store a programming code, wherein the another memory cell 490 may have an output coupling to the input SC-4 of the multi-stage tri-state buffer 292 as seen in FIG. 4C, 4D, 4H or 4I of the multiplexer 211 of the second or third type for the programmable logic block (LB) 201. Each of the another memory cells 490 may be an on-chip volatile memory cell referred to one 398 as illustrated in FIG. 1A or 1B or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell. For its multiplexer 211 of the second or third type as seen in FIG. 4C, 4D, 4H or 4I for the programmable logic block (LB) 201, its multi-stage tri-state buffer 292 may have the input SC-4 coupling to one of the outputs Out1 and Out2 of one of the another memory cells 398 as illustrated in FIG. 1A or 1B configured to save or store a programming code to switch on or off it. Alternatively, for the multiplexer 211 of the second or third type as seen in FIG. 4C, 4D, 4H or 4I for the programmable logic block (LB) 201, its multi-stage tri-state buffer 292 may be provided with the P-type and N-type MOS transistors 295 and 296 having gate terminals coupling respectively to the outputs Out1 and Out2 of one of the another memory cells 398 as illustrated in FIG. 1A or 1B configured to save or store a programming code to switch on or off it, wherein its inverter 297 as seen in FIG. 4C, 4D, 4H or 4I may be removed from it.

Figure 6B:
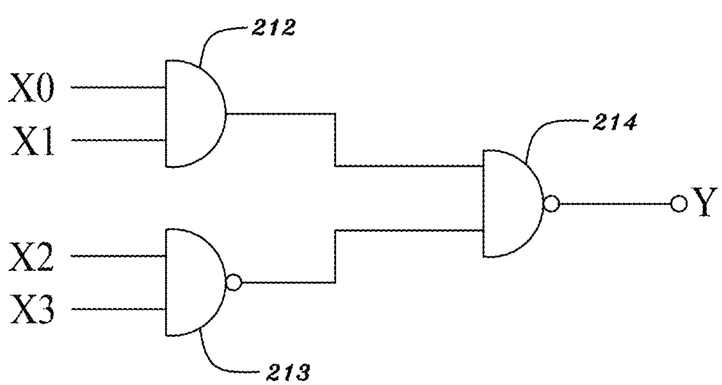
FIG. 6B is a circuit diagram of a logic operator in accordance with an embodiment of the present application.

The programmable logic block 201 may be programed to perform logic operation or Boolean operation, such as AND, NAND, OR or NOR operation. For example, the look-up table 210 may be programed to lead the programmable logic block 201 to achieve the same logic operation as a logic operator as shown in FIG. 6B performs. Referring to FIG. 6B, the logic operator may be provided with an AND gate 212 and NAND gate 213 arranged in parallel, wherein the AND gate 212 is configured to perform an AND operation on its two inputs X0 and X1, i.e. two inputs of the logic operator, into an output and the NAND gate 213 is configured to perform an NAND operation on its two inputs X2 and X3, i.e. the other two inputs of the logic operator, into an output, and with an NAND gate 214 having two inputs coupling to the outputs of the AND gate 212 and NAND gate 213 respectively. The NAND gate 214 is configured to perform an NAND operation on its two inputs into an output Y acting as an output of the logic operator. The programmable logic block (LB) 201 as seen in FIG. 6A may achieve the same logic operation as the logic operator as illustrated in FIG. 6B performs. For this case, the programmable logic block 201 may have four inputs, e.g., A0-A3, a first one A0 of which may be equivalent to the input X0, a second one A1 of which may be equivalent to the input X1, a third one A2 of which may be equivalent to the input X2, and a fourth one A3 of which may be equivalent to the input X3. The programmable logic block 201 may have an output, e.g., Dout, which may be equivalent to the output Y of the logic operator.

FIG. 6C shows the look-up table 210 configured for achieving the same logic operation as the logic operator as illustrated in FIG. 6B performs. Referring to FIG. 6C, the look-up table 210 records or stores each of sixteen resulting values or programming codes of the logic operator as illustrated in FIG. 6B that are generated respectively in accordance with sixteen combinations of its inputs X0-X3. The look-up table 210 may be programmed with the sixteen resulting values or programming codes respectively stored in the sixteen memory cells 490, each of which may be an on-chip volatile memory cell referred to one 398 as illustrated in FIG. 1A or 1B, having their outputs Out1 or Out2 coupling to the respective sixteen inputs D0-D15 of the first set of the multiplexer 211, as illustrated in FIG. 4A, 4C, 4D or 4G-4I, for the programmable logic block (LB) 201, or each of which may be an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell. The multiplexer 211 may be configured to determine one of its sixteen inputs, e.g., D0-D15, of the first set into its output, e.g., Dout as illustrated in FIG. 4A, 4C, 4D or 4G-4I, in accordance with one of the combinations of its inputs A0-A3 of the second set. The output Dout of the multiplexer 211 as seen in FIG. 6A may act as the output of the programmable logic block (LB) 201.

Alternatively, the programmable logic block 201 may be substituted with multiple programmable logic gates to be programmed to perform logic operation or Boolean operation as illustrated in FIG. 6B.

Alternatively, a plurality of the programmable logic block 201 may be programed to be integrated into a computation operator to perform computation operation, such as addition, subtraction, multiplication or division operation. The computation operator may be an adder, a multiplier, a multiplexer, a shift register, floating-point circuits and/or division circuits. For example, the computation operator may be configured to multiply two two-binary-digit numbers, i.e., [A1, A0] and [A3, A2], into a four-binary-digit output, i.e., [C3, C2, C1, C0], as seen in FIG. 6D. Four programmable logic blocks 201, as illustrated in FIG. 6A, may be programed to be integrated into the computation operator. Each of the programmable logic blocks 201 may generate one of the four binary digits, i.e., C0-C3, based on a combination of its inputs [A1, A0, A3, A2]. In the multiplication of the two-binary-digit number, i.e., [A1, A0], by the two-binary-digit number, i.e., [A3, A2], the four programmable logic blocks 201 may generate their four respective outputs, i.e., the four binary digits C0-C3, based on a common combination of their inputs [A1, A0, A3, A2]. The four programmable logic blocks 201 may be programed with four respective look-up tables 210, i.e., Table-0, Table-1, Table-2 and Table-3.

For example, referring to FIGS. 6A and 6D, multiple of the memory cells 490, each of which may be an on-chip volatile memory cell referred to one 398 as illustrated in FIG. 1A or 1B or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell, may be composed for each of the four look-up tables 210, i.e., Table-0, Table-1, Table-2 and Table-3, and each of the memory cells 490 for said each of the four look-up tables may be configured to store one of the resulting values, i.e., programming codes, for one of the four binary digits C0-C3. A first one of the four programmable logic blocks 201 may have its multiplexer 211 provided with its first set of inputs, e.g., D0-D15, each coupling to one of the outputs Out1 and Out2 of one of the memory cells 490 for the look-up table (LUT) of Table-0 and its second set of inputs, e.g., A0-A3, configured to determine one of its inputs, e.g., D0-D15, of the first set into its output, e.g., Dout, acting as an output C0 of the first one of the programmable logic block (LB) 201. A second one of the four programmable logic blocks 201 may have its multiplexer 211 provided with its first set of inputs, e.g., D0-D15, each coupling to one of the outputs Out1 and Out2 of one of the memory cells 490 for the look-up table (LUT) of Table-1 and its second set of inputs, e.g., A0-A3, configured to determine one of its inputs, e.g., D0-D15, of the first set into its output, e.g., Dout, acting as an output C1 of the second one of the programmable logic block (LB) 201. A third one of the four programmable logic blocks 201 may have its multiplexer 211 provided with its first set of inputs, e.g., D0-D15, each coupling to one of the outputs Out1 and Out2 of one of the memory cells 490 for the look-up table (LUT) of Table-2 and its second set of inputs, e.g., A0-A3, configured to determine one of its inputs, e.g., D0-D15, of the first set into its output, e.g., Dout, acting as an output C2 of the third one of the programmable logic block (LB) 201. A fourth one of the four programmable logic blocks 201 may have its multiplexer 211 provided with its first set of inputs, e.g., D0-D15, each coupling to one of the outputs Out1 and Out2 of one of the memory cells 490 for the look-up table (LUT) of Table-3 and its second set of inputs, e.g., A0-A3, configured to determine one of its inputs, e.g., D0-D15, of the first set into its output, e.g., Dout, acting as an output C3 of the fourth one of the programmable logic block (LB) 201.

Thereby, referring to FIG. 6D, the four programmable logic blocks 201 composing the computation operator may generate their four respective outputs, i.e., the four binary digits C0-C3, based on a common combination of their inputs [A1, A0, A3, A2]. In this case, the inputs A0-A3 of the four programmable logic blocks 201 may act as inputs of the computation operator and the outputs C0-C3 of the four programmable logic blocks 201 may act as an output of the computation operator. The computation operator may generate a four-binary-digit output, i.e., [C3, C2, C1, C0], based on a combination of its four-binary-digit input, i.e., [A1, A0, A3, A2].

Referring to FIG. 6D, in a particular case for multiplication of 3 by 3, each of the four programmable logic blocks 201 may have a combination of its inputs, i.e., [A1, A0, A3, A2]=[1, 1, 1, 1], to determine one of the four binary digits, i.e., [C3, C2, C1, C0]=[1, 0, 0, 1]. The first one of the four programmable logic blocks 201 may generate the binary digit C0 at a logic level of "1" based on the combination of its inputs, i.e., [A1, A0, A3, A2]=[1, 1, 1, 1]; the second one of the four programmable logic blocks 201 may generate the binary digit C1 at a logic level of "0" based on the combination of its inputs, i.e., [A1, A0, A3, A2]=[1, 1, 1, 1]; the third one of the four programmable logic blocks 201 may generate the binary digit C2 at a logic level of "0" based on the combination of its inputs, i.e., [A1, A0, A3, A2]=[1, 1, 1, 1]; the fourth one of the four programmable logic blocks 201 may generate the binary digit C3 at a logic level of "1" based on the combination for its inputs, i.e., [A1, A0, A3, A2]=[1, 1, 1, 1].

Figure 6E:
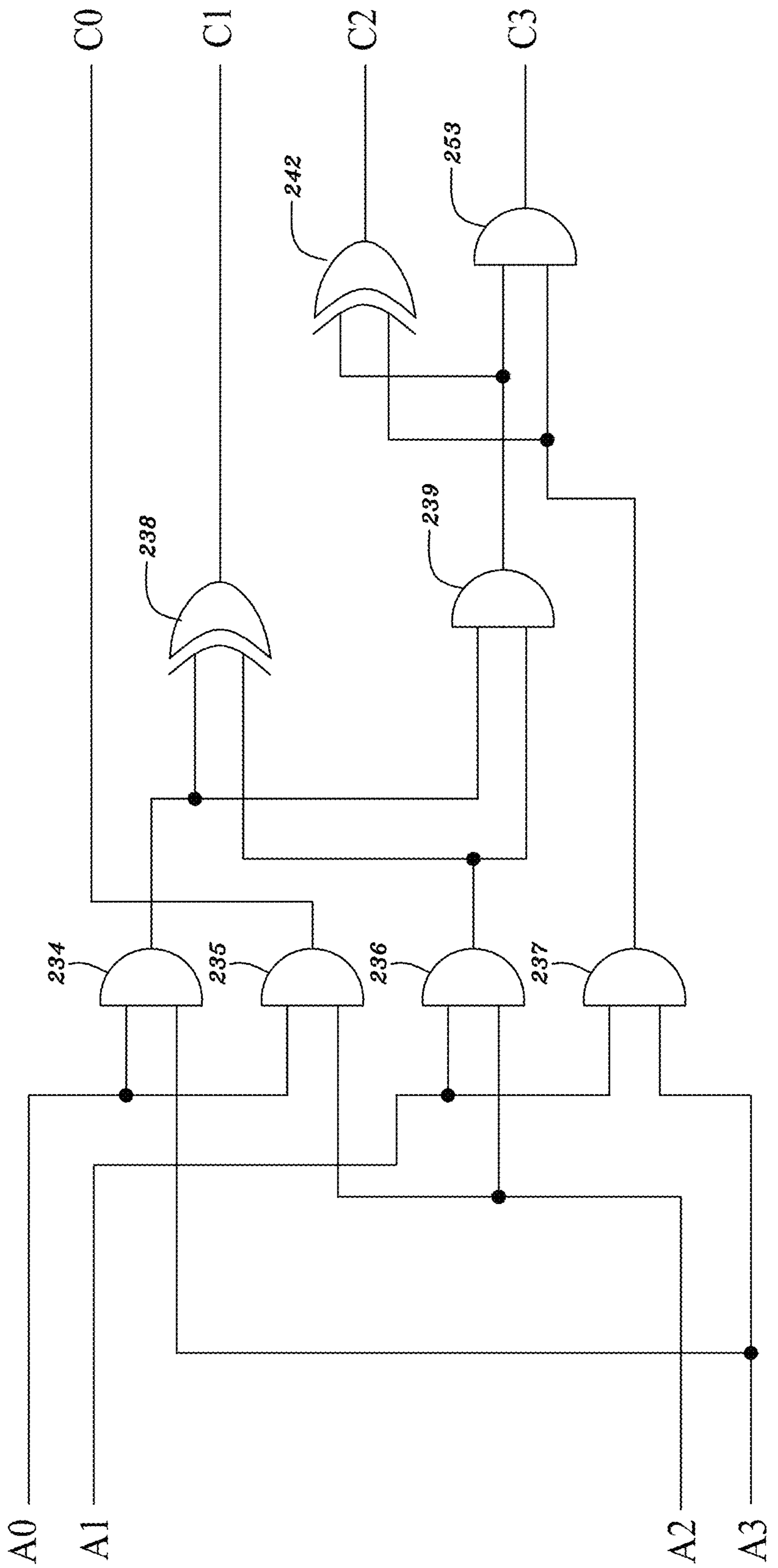
FIG. 6E is a circuit diagram of a computation operator in accordance with an embodiment of the present application.

Alternatively, the four programmable logic blocks 201 may be substituted with multiple programmable logic gates as illustrated in FIG. 6E to be programmed for a computation operator performing the same computation operation as the four programmable logic blocks 201. Referring to FIG. 6E, the computation operator may be programed to perform multiplication on two numbers each expressed by two binary digits, e.g., [A1, A0] and [A3, A2] as illustrated in FIG. 6D, into a four-binary-digit output, e.g., [C3, C2, C1, C0] as illustrated in FIG. 6D. The computation operator may be programed with an AND gate 234 configured to perform AND operation on its two inputs respectively at the inputs A0 and A3 of the computation operator into an output. The programmable logic gates may be programed with an AND gate 235 configured to perform AND operation on its two inputs respectively at the inputs A0 and A2 of the computation operator into an output acting as the output C0 of the computation operator. The computation operator may be programed with an AND gate 236 configured to perform AND operation on its two inputs respectively at the inputs A1 and A2 of the computation operator into an output. The computation operator may be programed with an AND gate 237 configured to perform AND operation on its two inputs respectively at the inputs A1 and A3 of the computation operator into an output. The computation operator may be programed with an ExOR gate 238 configured to perform Exclusive-OR operation on its two inputs coupling respectively to the outputs of the AND gates 234 and 236 into an output acting as the output C1 of the computation operator. The computation operator may be programed with an AND gate 239 configured to perform AND operation on its two inputs coupling respectively to the outputs of the AND gates 234 and 236 into an output. The computation operator may be programed with an ExOR gate 242 configured to perform Exclusive-OR operation on its two inputs coupling respectively to the outputs of the AND gates 239 and 237 into an output acting as the output C2 of the computation operator. The computation operator may be programed with an AND gate 253 configured to perform AND operation on its two inputs coupling respectively to the outputs of the AND gates 239 and 237 into an output acting as the output C3 of the computation operator.

To sum up, the programmable logic block 201 may be provided with the memory cells 490, having the number of 2 to the power of n, for the look-up table 210 to be programed respectively to store the resulting values or programming codes, having the number of 2 to the power of n, for each combination of its inputs having the number of n. For example, the number of n may be any integer greater than or equal to 2, such as between 2 and 64. For the example as illustrated in FIGS. 6C and 6D, each of the programmable logic blocks 201 may be provided with its inputs having the number of n equal to 4, and thus the number of resulting values or programming codes for all combinations of its inputs is 16, i.e., the number of 2 to the power of n equal to 4.

Accordingly, the programmable logic blocks (LB) 201 as seen in FIG. 6A may perform logic operation on its inputs into an output, wherein the logic operation may include Boolean operation such as AND, NAND, OR or NOR operation. Besides, the programmable logic blocks (LB) 201 as seen in FIG. 6A may perform computation operation on its inputs into an output, wherein the computation operation may include addition, subtraction, multiplication or division operation.

Specification for Programmable Interconnect

Figure 7A:
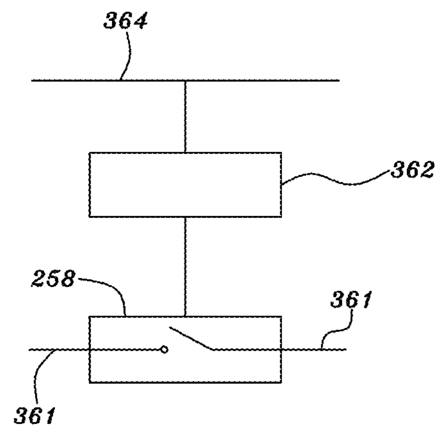
FIGS. 7A-7C are block diagrams illustrating programmable interconnects programmed by a pass/no-pass switch or cross-point switch in accordance with an embodiment of the present application.

FIG. 7A is a block diagram illustrating a programmable interconnect programmed by a pass/no-pass switch in accordance with an embodiment of the present application. Referring to FIG. 7A, two programmable interconnects 361 may be controlled, by the pass/no-pass switch 258, i.e., configurable or reconfigurable interconnection circuit, of either of the first through sixth types as seen in FIGS. 2A-2F, to couple to each other. One of the programmable interconnects 361 may couple to the node N21 of the pass/no-pass switch 258, and another of the programmable interconnects 361 may couple to the node N22 of the pass/no-pass switch 258. Accordingly, the pass/no-pass switch 258 may be switched on to connect said one of the programmable interconnects 361 to said another of the programmable interconnects 361; the pass/no-pass switch 258 may be switched off to disconnect said one of the programmable interconnects 361 from said another of the programmable interconnects 361.

Referring to FIG. 7A, a memory cell 362 may couple to the pass/no-pass switch 258 to turn on or off the pass/no-pass switch 258, wherein the memory cell 362 may be an on-chip volatile memory cell referred to one 398 as illustrated in FIG. 1A or 1B or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell. For the first type of pass/no-pass switch 258 as illustrated in FIG. 2A used to program the programmable interconnects 361, the first type of pass/no-pass switch 258 may have its nodes SC-1 and SC-2 coupling to two outputs of one of memory cells 362, i.e., the two outputs Out1 and Out2 of the memory cell 398, and accordingly receiving the two outputs of the memory cell 362 associated with the programming code stored or saved in the memory cell 362 to switch on or off the first type of pass/no-pass switch 258 to couple or decouple two of the programmable interconnects 361 coupling to the two nodes N21 and N22 of the pass/no-pass switch 258 of the first type respectively. For the second type of pass/no-pass switch 258 as illustrated in FIG. 2B used to program the programmable interconnects 361, the second type of pass/no-pass switch 258 may have its node SC-3 coupling to an output of a memory cell 362, i.e., the output Out1 or Out2 of the memory cell 398, and accordingly receiving the output of the memory cell 362 associated with the programming code stored or saved in the memory cell 362 to switch on or off the second type of pass/no-pass switch 258 to couple or decouple two of the programmable interconnects 361 coupling to the two nodes N21 and N22 of the pass/no-pass switch 258 of the second type respectively. For the third or fourth type of pass/no-pass switch 258 as illustrated in FIG. 2C or 2D used to program the programmable interconnects 361, the third or fourth type of pass/no-pass switch 258 may have its node SC-4 coupling to an output of a memory cell 362, i.e., the output Out1 or Out2 of the memory cell 398, and accordingly receiving the output of the memory cell 362 associated with the programming code stored or saved in the memory cell 362 to switch on or off the third or fourth type of pass/no-pass switch 258 to couple or decouple two of the programmable interconnects 361 coupling to the two nodes N21 and N22 of the pass/no-pass switch 258 of the third or fourth type respectively. Alternatively, its P-type and N-type MOS transistors 295 and 296 may have gate terminals coupling respectively to two outputs of a memory cell 362, i.e., the two outputs Out1 and Out2 of the memory cell 398, and accordingly receiving the two outputs of the memory cell 362 associated with the programming code stored or saved in the memory cell 362 to switch on or off the third or fourth type of pass/no-pass switch 258 to couple or decouple two of the programmable interconnects 361 coupling to the two nodes N21 and N22 of the pass/no-pass switch 258 of the third or fourth type respectively, wherein its inverter 297 may be removed from the pass/no-pass switch 258 of the third or fourth type. For the fifth or sixth type of pass/no-pass switch 258 as illustrated in FIG. 2E or 2F used to program the programmable interconnects 361, the fifth or sixth type of pass/no-pass switch 258 may have its nodes SC-5 and SC-6 coupling to two outputs of two respective memory cells 362, i.e., the two outputs Out1 or Out2 of the two memory cells 398, and accordingly receiving the two outputs of the two memory cells 362 associated with two programming codes stored or saved in the two memory cells 362 respectively to switch on or off the fifth or sixth type of pass/no-pass switch 258 to couple or decouple two of the programmable interconnects 361 coupling to the two nodes N21 and N22 of the pass/no-pass switch 258 of the fifth or sixth type respectively. Alternatively, (1) its P-type and N-type MOS transistors 295 and 296 at its left side may have gate terminals coupling respectively to two outputs of one of the memory cells 362, i.e., the two outputs Out1 and Out2 of one of the memory cells 398, and accordingly receiving the two outputs of said one of the memory cell 362 associated with the programming code stored or saved in said one of the memory cell 362, and (2) its P-type and N-type MOS transistors 295 and 296 at its right side may have gate terminals coupling respectively to two outputs of another of the memory cells 362, i.e., the two outputs Out1 and Out2 of another of the memory cells 398, and accordingly receiving the two outputs of said another of the memory cell 362 associated with the programming code stored or saved in said another of the memory cell 362, to switch on or off the fifth or sixth type of pass/no-pass switch 258 to couple or decouple two of the programmable interconnects 361 coupling to the two nodes N21 and N22 of the pass/no-pass switch 258 of the fifth or sixth type respectively, wherein its inverters 297 may be removed from the pass/no-pass switch 258 of the fifth or sixth type. Before the memory cell(s) 362 are programmed or when the memory cell(s) 362 are being programmed, the programmable interconnects 361 may not be used for signal transmission. The memory cell(s) 362 may be programmed to have the pass/no-pass switch 258 switched on to couple the programmable interconnects 361 for signal transmission or to have the pass/no-pass switch 258 switched off to decouple the programmable interconnects 361. Similarly, each of the first and second types of cross-point switches 379 as seen in FIGS. 3A and 3B may be composed of a plurality of the pass/no-pass switch 258 of any type, wherein each of the pass/no-pass switches 258 may have the node(s) (SC-1 and SC-2), SC-3, SC-4 or (SC-5 and SC-6) coupling to the output(s) of the memory cell(s) 362, i.e., the output(s) Out1 or Out2 of the memory cell(s) 398, and accordingly receiving the output(s) of the memory cell(s) 362 associated with the programming code(s) stored or saved in the memory cell(s) 362 to switch on or off said each of the pass/no-pass switches 258 to couple or decouple two of the programmable interconnects 361 coupling to the two nodes N21 and N22 of said each of the pass/no-pass switches 258 respectively.

Figure 7B:
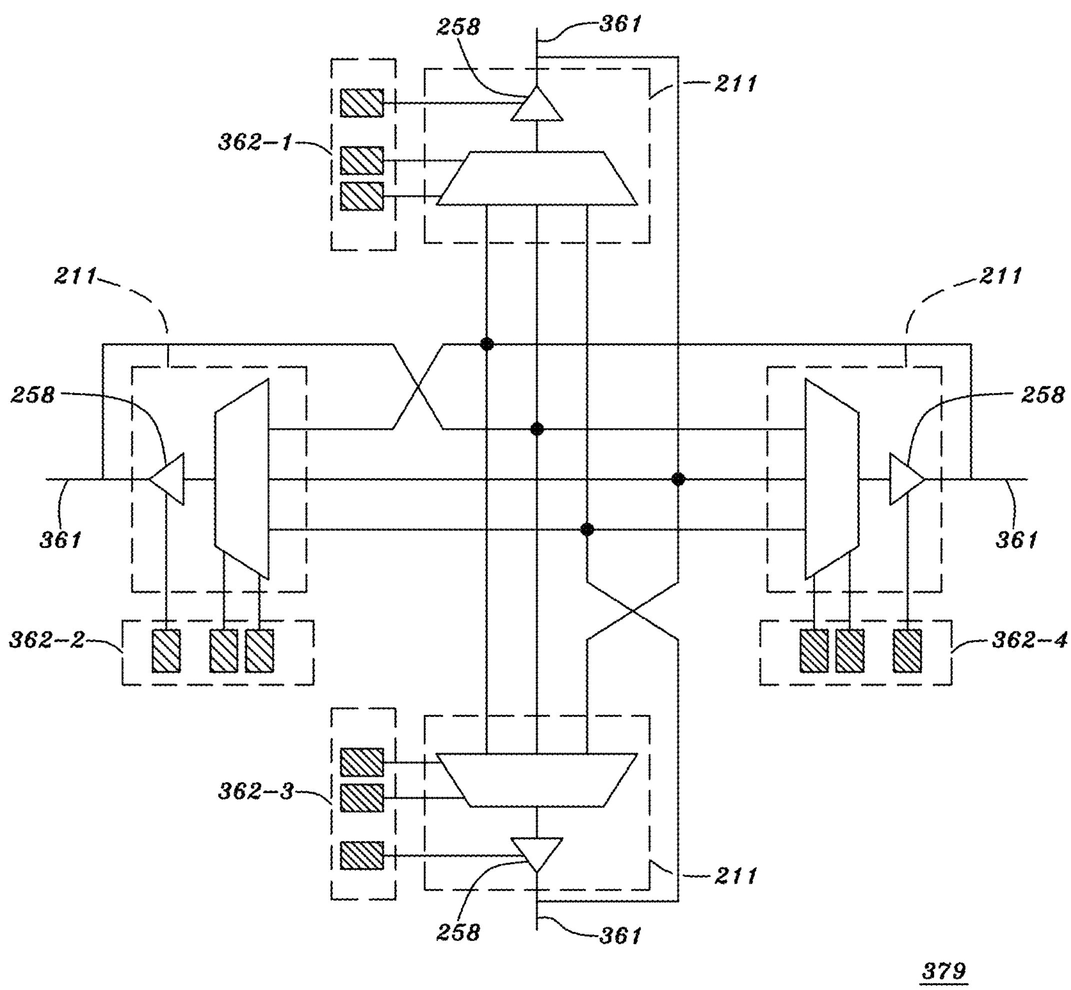

FIG. 7B is a circuit diagram illustrating programmable interconnects programmed by a cross-point switch in accordance with an embodiment of the present application. Referring to FIG. 7B, four programmable interconnects 361 may couple to the respective four nodes N23-N26 of the cross-point switch 379 of the third type as seen in FIG. 3C, i.e., configurable or reconfigurable interconnection circuit. Thereby, one of the four programmable interconnects 361 may be switched by the cross-point switch 379 of the third type to couple to another one, two or three of the four programmable interconnects 361. For the cross-point switch 379 composed of four of the multiplexers 211 of the first type, each of the multiplexers 211, i.e., configurable or reconfigurable selection circuit, may have its second set of two inputs A0 and A1 coupling respectively to the outputs of two of the memory cells 362. For the cross-point switch 379 composed of four of the multiplexers 211 of the second or third type as seen in FIG. 4F or 4J for the second type, each of its multiplexers 211 may have the second set of two inputs A0 and A1 coupling respectively to the outputs of two of the three memory cells 362, i.e., the outputs Out1 or Out2 of the two memory cells 398, and each of its pass/no-pass switch 258, i.e., configurable or reconfigurable switch circuit, may have the node SC-4 coupling to the output of another of the memory cells 362, i.e., the output Out1 or Out2 of the memory cell 398. Alternatively, its P-type and N-type MOS transistors 295 and 296 may have gate terminals coupling respectively to two outputs of a memory cell 362, i.e., the two outputs Out1 and Out2 of the memory cell 398, and accordingly receiving the two outputs of the memory cell 362 associated with the programming code stored or saved in the memory cell 362 to switch on or off its pass/no-pass switch 258 of the third or fourth type to couple or decouple the input and output Dout of its pass/no-pass switch 258 of the third or fourth type, wherein its inverter 297 may be removed from the pass/no-pass switch 258 of the third or fourth type. Accordingly, each of the multiplexers 211 may pass its first set of three inputs coupling to three of the four programmable interconnects 361 into its output coupling to the other one of the four programmable interconnects 361 in accordance with its second set of two inputs A0 and A1 and alternatively further in accordance with a logic level at the node SC-4 or logic levels at gate terminals of its P-type and N-type MOS transistors 295 and 296.

For example, referring to FIGS. 3C and 7B, the following description takes the cross-point switch 379 composed of four of the multiplexers 211 of the second or third type as an example. For programming the programmable interconnects 361, the top one of the multiplexers 211 may have its second set of inputs $A0_1$, $A1_1$ and $SC_1$-4 coupling to the outputs of the three memory cells 362-1, i.e., the outputs Out1 or Out2 of the three memory cells 398, respectively, the left one of the multiplexers 211 may have its second set of inputs $A0_2$, $A1_e$ and $SC_2$-4 coupling to the outputs of the three memory cells 362-2, i.e., the outputs Out1 or Out2 of the three memory cells 398, respectively, the bottom one of the multiplexers 211 may have its second set of inputs $A0_3$, $A1_a$ and $SC_3$-4 coupling to the outputs of the three memory cells 362-3, i.e., the outputs Out1 or Out2 of the three memory cells 398, respectively, and the right one of the multiplexers 211 may have its second set of inputs $A0_4$, $A1_4$ and $SC_4$-4 coupling to the outputs of the three memory cells 362-4, i.e., the outputs Out1 or Out2 of the three memory cells 398, respectively. Before the memory cells 362-1, 362-2, 362-3 and 362-4 are programmed or when the memory cells 362-1, 362-2, 362-3 and 362-4 are being programmed, the four programmable interconnects 361 may not be used for signal transmission. The memory cells 362-1, 362-2, 362-3 and 362-4 may be programmed to have each of the multiplexers 211 of the second or third type pass one of its three inputs of the first set into its output such that one of the four programmable interconnects 361 may couple to another, another two or another three of the four programmable interconnects 361 for signal transmission in operation.

Figure 7C:
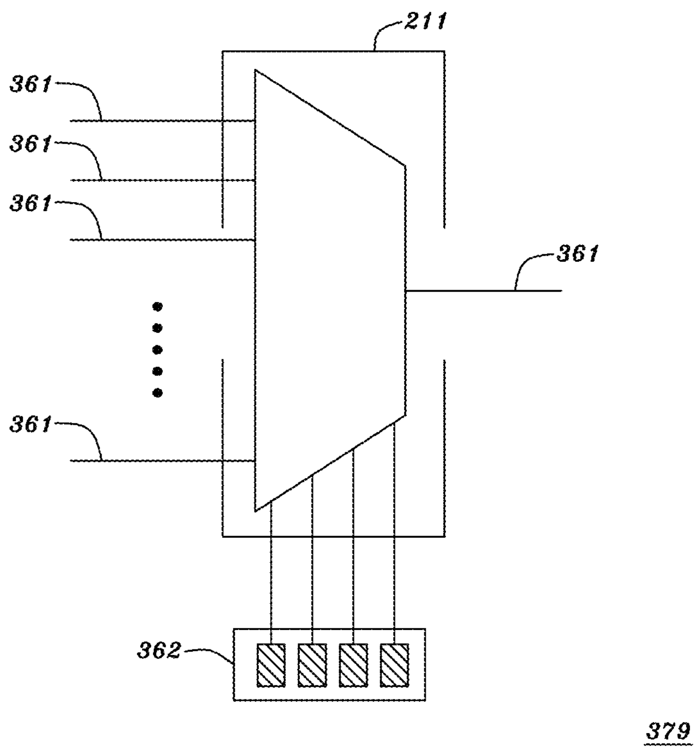

FIG. 7C is a circuit diagram illustrating a programmable interconnect programmed by a cross-point switch in accordance with an embodiment of the present application. Referring to FIG. 7C, the fourth type of cross-point switch 379 illustrated in FIG. 3D may have the first set of its inputs, e.g., 16 inputs D0-D15, coupling respectively to multiple of the programmable interconnects 361, e.g., sixteen of the programmable interconnects 361, and its output, e.g., Dout, coupling to another of the programmable interconnects 361. Thereby, said multiple of the programmable interconnects 361 may have one to be switched by the fourth type of cross-point switch 379 to associate with said another of the programmable interconnects 361. The fourth type of cross-point switch 379 may have its second set of multiple inputs A0-A3 coupling respectively to the outputs of four of the memory cells 362, i.e., the outputs Out1 or Out2 of the four memory cells 398, and accordingly receiving the outputs of the four respective memory cells 362 associated with the four programming codes stored or saved in the four respective memory cells 362 to pass one of its inputs of the first set, e.g., D0-D15 coupling to the sixteen of the programmable interconnects 361, into its output, e.g., Dout coupling to said another of the programmable interconnects 361. Before the memory cells 362 are programmed or when the memory cells 362 are being programmed, said multiple of the programmable interconnects 361 and said another of the programmable interconnects 361 may not be used for signal transmission. The memory cells 362 may be programmed to have the fourth type of cross-point switch 379 pass one of its inputs of the first set into its output such that one of said multiple of the programmable interconnects 361 may couple to said another of the programmable interconnects 361 for signal transmission in operation.

Specification for Fixed Interconnect

Before the memory cells 490 for the look-up table (LUT) 210 as seen in FIG. 6A and the memory cells 362 for the programmable interconnects 361 as seen in FIGS. 7A-7C are programmed or when the memory cells 490 for the look-up table (LUT) 210 and the memory cells 362 for the programmable interconnects 361 are being programmed, multiple fixed interconnects 364 that are not field programmable may be provided for signal transmission or power/ground delivery to (1) the memory cells 490 of the look-up table (LUT) 210 of the programmable logic block (LB) 201 as seen in FIG. 6A for programming the memory cells 490 and/or (2) the memory cells 362 as seen in FIGS. 7A-7C for the programmable interconnects 361 for programming the memory cells 362. After the memory cells 490 for the look-up table (LUT) 210 and the memory cells 362 for the programmable interconnects 361 are programmed, the fixed interconnects 364 may be used for signal transmission or power/ground delivery in operation.

Figure 8A:
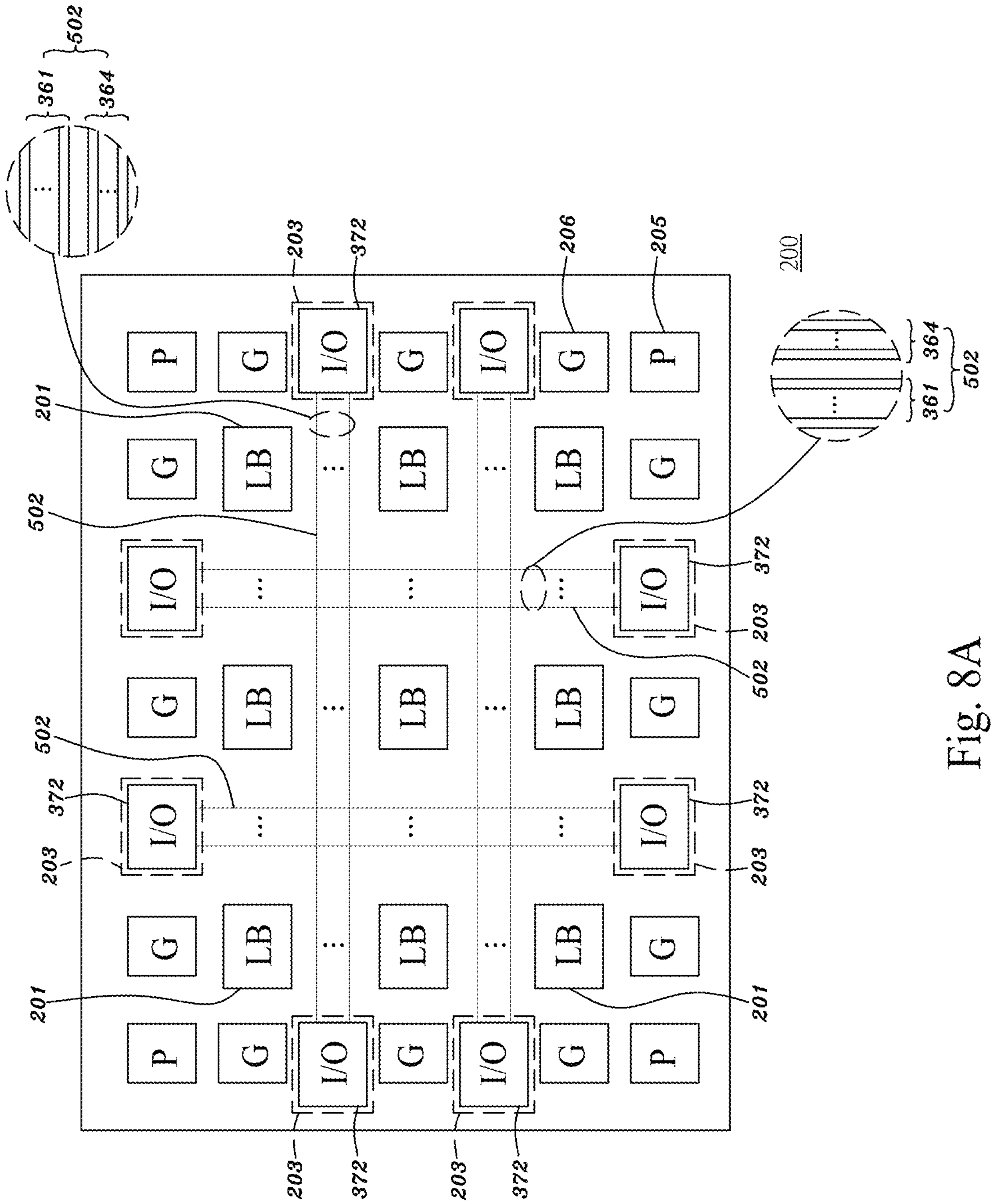
FIGS. 8A-8H are schematically top views showing various arrangements for a standard commodity FPGA IC chip in accordance with an embodiment of the present application.

Specification for Standard Commodity Field-Programmable-Gate-Array (FPGA) Integrated-Circuit (IC) Chip FIG. 8A is a schematically top view showing a block diagram of a standard commodity FPGA IC chip in accordance with an embodiment of the present application. Referring to FIG. 8A, a standard commodity FPGA IC chip 200 is designed, implemented and fabricated using an advanced semiconductor technology node or generation, for example more advanced than or equal to, or below or equal to 30 nm, 20 nm or 10 nm; with a chip size and manufacturing yield optimized with the minimum manufacturing cost for the used semiconductor technology node or generation. The standard commodity FPGA IC chip 200 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the standard commodity FPGA IC chip 200 used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

Referring to FIG. 8A, since the standard commodity FPGA IC chip 200 is a standard commodity IC chip, the number of types of products for the standard commodity FPGA IC chip 200 may be reduced to a small number, and therefore expensive photo masks or mask sets for fabricating the standard commodity FPGA IC chip 200 using advanced semiconductor nodes or generations may be reduced to a few mask sets. For example, the mask sets for a specific technology node or generation may be reduced down to between 3 and 20, 3 and 10, or 3 and 5. Its NRE and production expenses are therefore greatly reduced. With the few types of products for the standard commodity FPGA IC chip 200, the manufacturing processes may be optimized to achieve very high manufacturing chip yields. Furthermore, the chip inventory management becomes easy, efficient and effective, therefore resulting in a relatively short chip delivery time and becoming very cost-effective.

Referring to FIG. 8A, the standard commodity FPGA IC chip 200 may be of various types, including (1) multiple of the programmable logic blocks (LB) 201 as illustrated in FIGS. 6A-6E arranged in an array in a central region thereof, (2) multiple intra-chip interconnects 502 each extending over spaces between neighboring two of the programmable logic blocks 201, and (3) multiple of the small input/output (I/O) circuits 203, as illustrated in FIG. 5B, each having its output S_Data_in coupling to one or more of the intra-chip interconnects 502 and its input S_Data_out, S_Enable or S_Inhibit coupling to another one or more of intra-chip interconnects 502

Referring to FIG. 8A, each of the intra-chip interconnects 502 may be the programmable interconnect 361 or fixed interconnect 364 as illustrated in FIG. 7A-7C. For the standard commodity FPGA IC chip 200, each of the small input/output (I/O) circuits 203, as illustrated in FIG. 5B, may have its output S_Data_in coupling to one or more of the programmable interconnects 361 and/or one or more of the fixed interconnects 364 and its input S_Data_out, S_Enable or S_Inhibit coupling to another one or more of the programmable interconnects 361 and/or another one or more of the fixed interconnects 364.

Referring to FIG. 8A, each of the programmable logic blocks (LB) 201 as illustrated in FIGS. 6A-6E may have its inputs, e.g., A0-A3, each coupling to one or more of the programmable interconnects 361 and/or one or more of the fixed interconnects 364 and may be configured to perform logic operation or computation operation on its inputs into an output, e.g., Dout, coupling to another one or more of the programmable interconnects 361 and/or another one or more of the fixed interconnects 364. The computation operation may include an addition, subtraction, multiplication or division operation; alternatively, the logic operation may include a Boolean operation such as AND, NAND, OR or NOR operation.

Referring to FIG. 8A, the standard commodity FPGA IC chip 200 may include multiple of the I/O pads 372 as seen in FIG. 5B, each vertically over one of its small input/output (I/O) circuits 203, coupling to the node 381 of said one of the small input/output (I/O) circuits 203. In a first clock, the output Dout of one of the programmable logic blocks 201 as illustrated in FIG. 6A may be transmitted to the input S_Data_out of the small driver 374 of one of the small input/output (I/O) circuits 203 through one or more of the programmable interconnects 361, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the standard commodity FPGA IC chip 200. In a second clock, a signal from circuits outside the standard commodity FPGA IC chip 200 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the inputs A0-A3 of another of the programmable logic blocks 201 as illustrated in FIG. 6A through another one or more of the programmable interconnects 361.

Referring to FIG. 8A, the standard commodity FPGA IC chip 200 may further include (1) multiple power pads 205 for applying the power supply voltage, i.e., Vcc, to the memory cells 490 for the look-up tables (LUT) 210 of the programmable logic blocks (LB) 201 as illustrated in FIG. 6A and/or the memory cells 362 for the cross-point switches 379 as illustrated in FIGS. 7A-7C through one or more of the fixed interconnects 364, wherein the power supply voltage, i.e., Vcc, may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing ground reference voltage, i.e., Vss, to the memory cells 490 for the look-up tables (LUT) 210 of the programmable logic blocks (LB) 201 as illustrated in FIG. 6A and/or the memory cells 362 for the cross-point switches 379 as illustrated in FIGS. 7A-7C through one or more of the fixed interconnects 364.

Figure 8B:
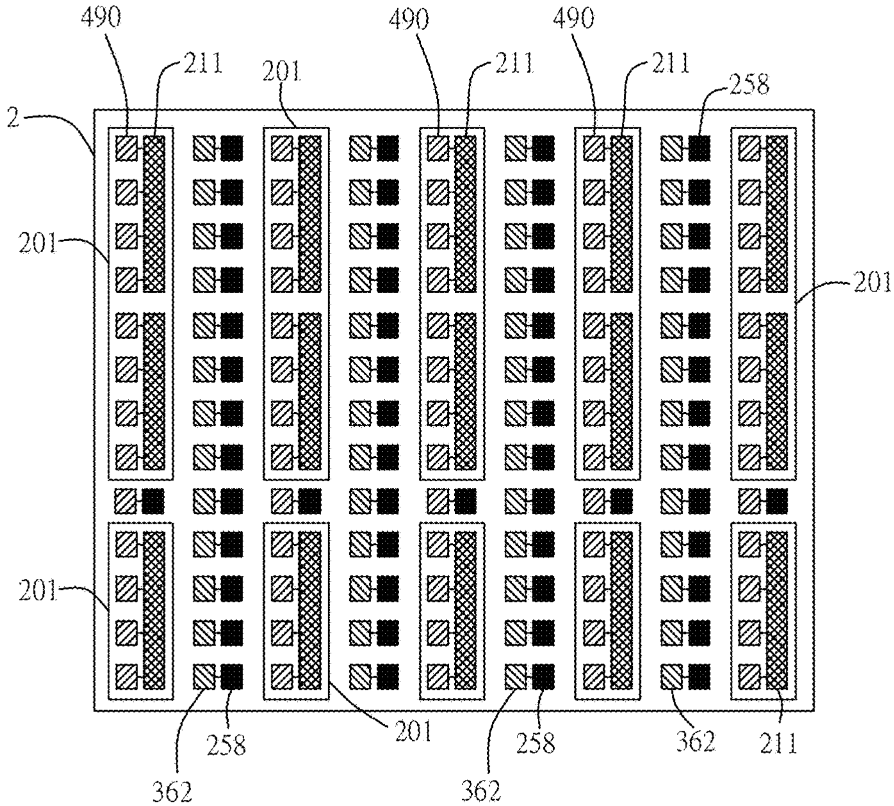

I. Arrangements for Memory Cells, Multiplexers and Pass/No-Pass Switches for Standard Commodity FPGA IC Chip FIGS. 8B through 8E are schematic views showing various arrangements for (1) the memory cells 490, employed for the look-up tables 210, and the multiplexers 211 for the programmable logic blocks 201 and (2) the memory cells 362 and the pass/no-pass switches 258 for the programmable interconnects 361 in accordance with an embodiment of the present application. The pass/no-pass switches 258 may compose the first and second types of cross-point switches 379 as illustrated in FIGS. 3A and 3B respectively. The various arrangements are mentioned as below:

(1) First Arrangement for Memory Cells, Multiplexers and Pass/No-Pass Switches for Standard Commodity FPGA IC Chip Referring to FIG. 8B, for each of the programmable logic blocks 201 of the standard commodity FPGA IC chip 200, the memory cells 490 for one of its look-up tables 210 may be distributed on and/or over a first area of a semiconductor substrate 2 of the standard commodity FPGA IC chip 200, and one of its multiplexers 211 coupling to the memory cells 490 for said one of its look-up tables 210 may be distributed on and/or over a second area of the semiconductor substrate 2 of the standard commodity FPGA IC chip 200, wherein the first area is nearby or close to the second area. Each of the programmable logic blocks 201 may include one or more of multiplexers 211 and one or more groups of memory cells 490 employed for one or more of look-up tables 210 respectively and coupled to the first set of inputs, e.g., D0-D15, of said one or more of multiplexers 211 respectively, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211.

Referring to FIG. 8B, a group of memory cells 362 employed for the programmable interconnects 361 as seen in FIG. 7A may be distributed in one or more lines between neighboring two of the programmable logic blocks 201. Also, a group of pass/no-pass switches 258 employed for the programmable interconnects 361 as seen in FIG. 7A may be distributed in one or more lines between said neighboring two of the programmable logic blocks 201. The group of pass/no-pass switches 258 and the group of memory cells 362 compose the cross-point switch 379 as seen in FIG. 3A or 3B. Each of the pass/no-pass switches 258 in the group may couple one or more of the memory cells 362 in the group.

Figure 8C:
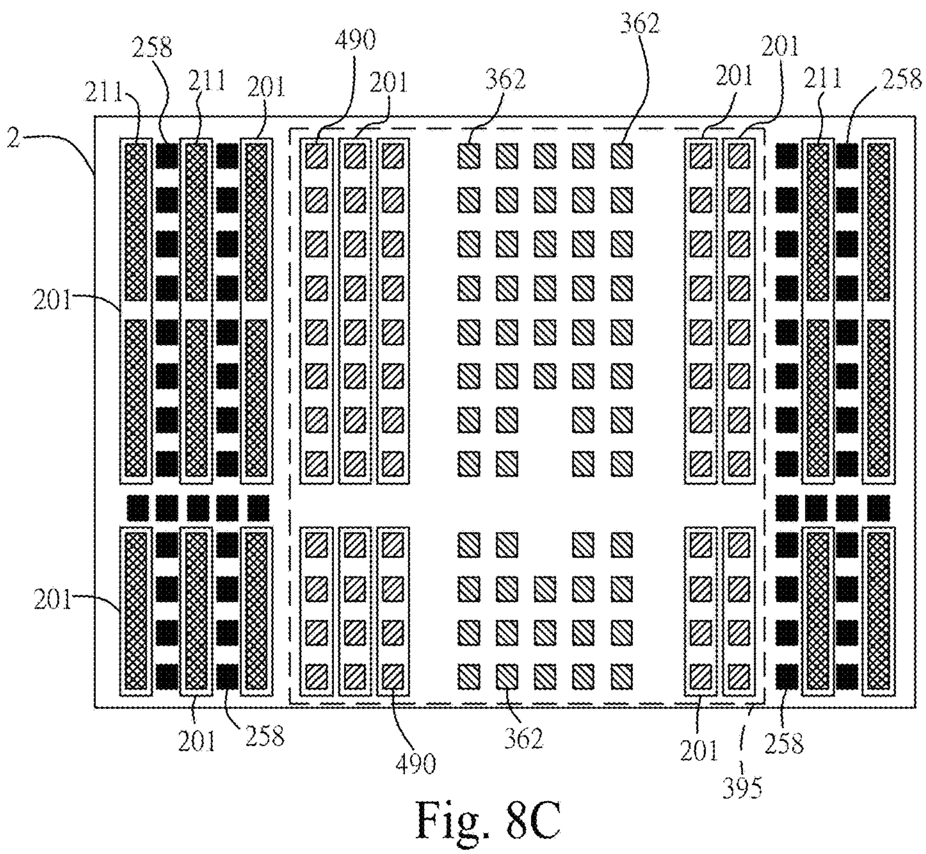

(2) Second Arrangement for Memory Cells, Multiplexers and Pass/No-Pass Switches for Standard Commodity FPGA IC Chip Referring to FIG. 8C, for the standard commodity FPGA IC chip 200, the memory cells 490 employed for all of its look-up tables 210 and the memory cells 362 employed for all of its programmable interconnects 361 may be aggregately distributed in a memory-array block 395 in a certain area of its semiconductor substrate 2. For more elaboration, for the same programmable logic block 201, the memory cells 490 employed for its one or more look-up tables (LUTs) 210 and its one or more multiplexers 211 may be arranged in two separate areas, in one of which are the memory cells 490 employed for its one or more look-up tables (LUTs) 210 and in the other one of which are its one or more multiplexers 211. The pass/no-pass switches 258 employed for programmable interconnects 361 may be distributed in one or more lines between the multiplexers 211 of neighboring two of the programmable logic blocks 201.

Figure 8D:
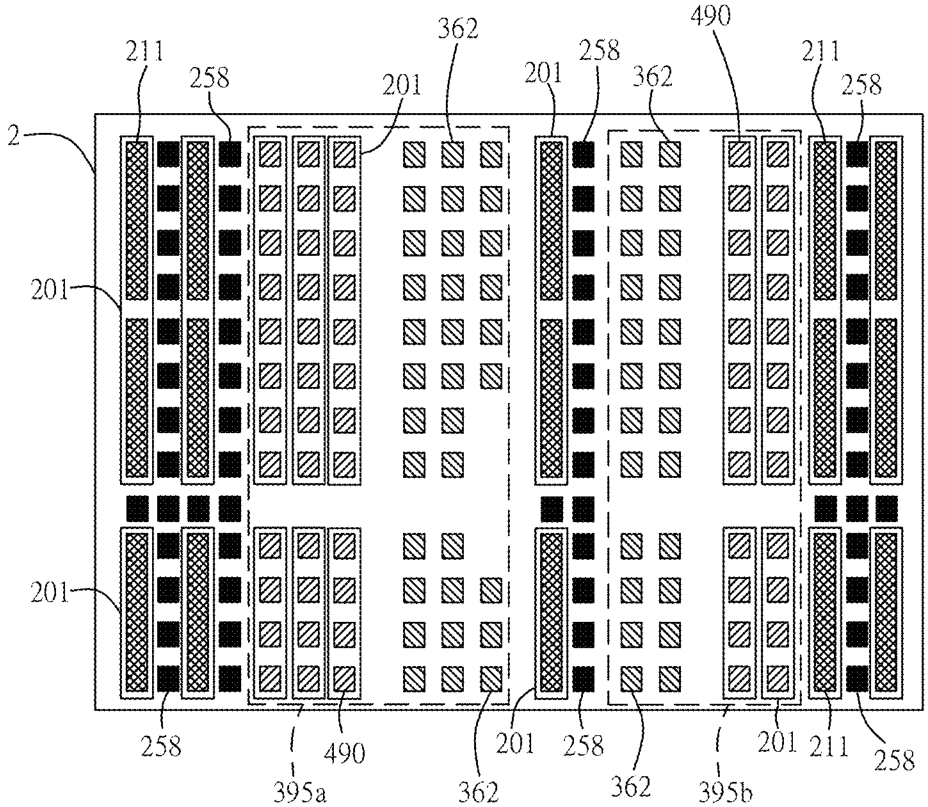

(3) Third Arrangement for Memory Cells, Multiplexers and Pass/No-Pass Switches for Standard Commodity FPGA IC Chip Referring to FIG. 8D, for the standard commodity FPGA IC chip 200, the memory cells 490 employed for all of its look-up tables 210 and the memory cells 362 employed for all of its programmable interconnects 361 may be aggregately distributed in multiple separate memory-array blocks 395*a* and 395*b* in multiple certain areas of its semiconductor substrate 2. For more elaboration, for the same programmable logic block 201, the memory cells 490 employed for its one or more look-up tables (LUTs) 210 and its one or more multiplexers 211 may be arranged in two separate areas, in one of which are the memory cells 490 employed for its one or more look-up tables (LUTs) 210 and in the other one of which are its one or more multiplexers 211. The pass/no-pass switches 258 employed for programmable interconnects 361 may be distributed in one or more lines between the multiplexers 211 of neighboring two of the programmable logic blocks 201. For the standard commodity FPGA IC chip 200, some of its multiplexers 211 and some of the pass/no-pass switches 258 may be arranged between the memory-array blocks 395*a* and 395*b*.

Figure 8E:
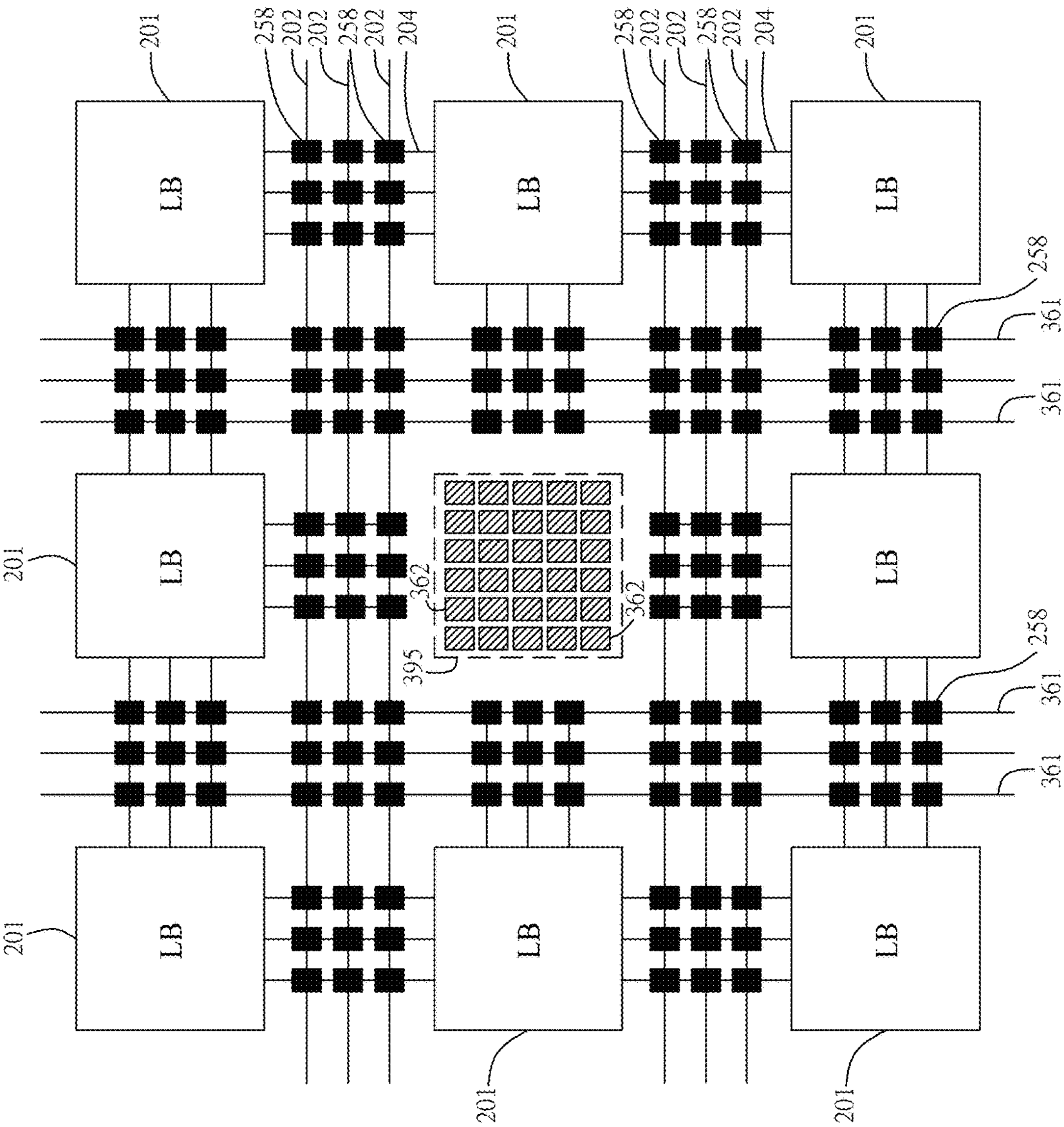

(4) Fourth Arrangement for Memory Cells, Multiplexers and Pass/No-Pass Switches for Standard Commodity FPGA IC Chip Referring to FIG. 8E, for the standard commodity FPGA IC chip 200, the memory cells 362 employed for its programmable interconnects 361 may be aggregately arranged in a memory-array block 395 in a certain area of the semiconductor substrate 2 and coupled to (1) multiple first groups of its pass/no-pass switches 258 arranged on or over its semiconductor substrate 2, wherein each of its pass/no-pass switches 258 in the first groups may be between neighboring two of its programmable logic blocks 201 in the same row or between the memory-array block 395 and one of its programmable logic blocks 201 in the same row, (2) multiple second groups of its pass/no-pass switches 258 arranged on or over its semiconductor substrate 2, wherein each of its pass/no-pass switches 258 in the second groups may be between neighboring two of its programmable logic blocks 201 in the same column or between the memory-array block 395 and one of its programmable logic blocks 201 in the same column, and (3) multiple third groups of the pass/no-pass switches 258 arranged on or over the semiconductor substrate 2, wherein each of its pass/no-pass switches 258 in the third groups may be between neighboring two of the first groups of the pass/no-pass switches 258 in the same column and between neighboring two of the second groups of the pass/no-pass switches 258 in the same row. For the standard commodity FPGA IC chip 200, each of its programmable logic blocks 201 may include one or more multiplexers 211 and one or more groups of memory cells 490 employed for one or more of look-up tables 210 respectively and coupled to the first set of inputs, e.g., D0-D15, of said one or more of multiplexers 211 respectively, as illustrated in FIG. 8B, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211.

Figure 8F:
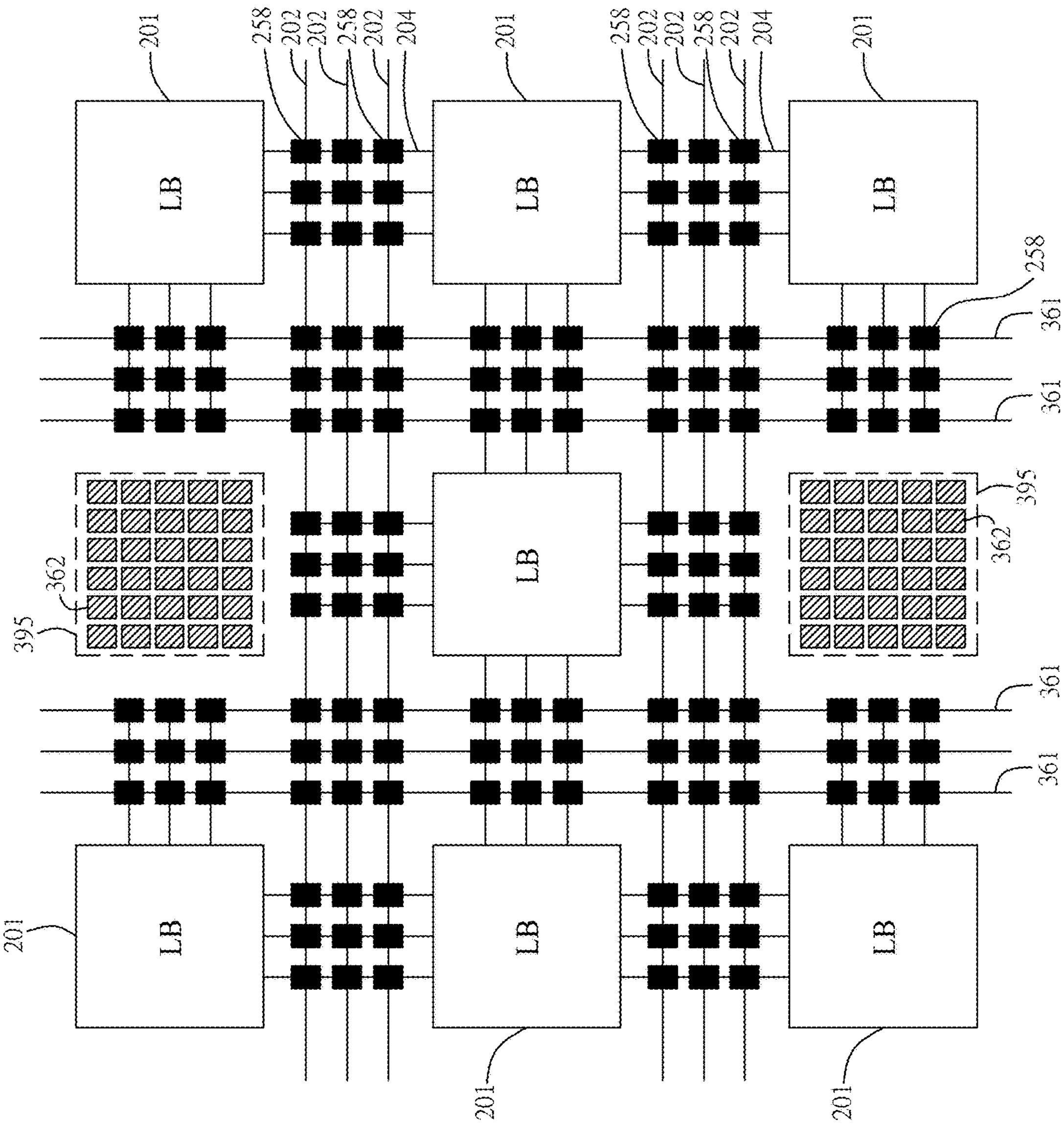

(5) Fifth Arrangement for Memory Cells, Multiplexers and Pass/No-Pass Switches for Standard Commodity FPGA IC Chip Referring to FIG. 8F, for the standard commodity FPGA IC chip 200, the memory cells 262 for the programmable interconnects 361 may be aggregately distributed in multiple memory-array blocks 395 on or over its semiconductor substrate 2 and coupled to (1) multiple first groups of its pass/no-pass switches 258 arranged on or over its semiconductor substrate 2, wherein each of its pass/no-pass switches 258 in the first groups may be between neighboring two of its programmable logic blocks 201 in the same row or between one of the memory-array blocks 395 and one of its programmable logic blocks 201 in the same row, (2) multiple second groups of its pass/no-pass switches 258 arranged on or over its semiconductor substrate 2, wherein each of its pass/no-pass switches 258 in the second groups may be between neighboring two of its programmable logic blocks 201 in the same column or between one of the memory-array blocks 395 and one of its programmable logic blocks 201 in the same column, and (3) multiple third groups of the pass/no-pass switches 258 arranged on or over the semiconductor substrate 2, wherein each of its pass/no-pass switches 258 in the third groups may be between neighboring two of the first groups of the pass/no-pass switches 258 in the same column and between neighboring two of the second groups of the pass/no-pass switches 258 in the same row. For the standard commodity FPGA IC chip 200, each of its programmable logic blocks 201 may include one or more multiplexers 211 and one or more groups of memory cells 490 employed for one or more of look-up tables 210 respectively, as illustrated in FIG. 8B, wherein each of the memory cells 490 in said one or more groups may store one of the resulting values or programming codes for said one or more of look-up tables 210 and may have an output coupling to one of the inputs of the first set, e.g., D0-D15, of said one or more of multiplexers 211. One or more of the programmable logic blocks 201 may be positioned between the memory-array blocks 395.

(6) Memory Cells for First Through Fifth Arrangements

Referring to FIGS. 8B-8F, for the standard commodity FPGA IC chip 200, each of the memory cells 490 for its look-up tables (LUTs) 210 may be an on-chip volatile memory cell referred to one 398 as illustrated in FIG. 1A or 1B, each of which may generate an output Out1 or Out2 coupling to one of the inputs D0-D15 of the first set of its multiplexer 211 as illustrated in FIGS. 6A-6E, or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell, wherein its multiplexer 211 may be one of the first through third types as illustrated in FIGS. 4A-4J. The memory cells 362 for its programmable interconnects 361 may be referred to one 398 as illustrated in FIG. 1A or 1B, each of which may generate (an) output(s) Out1 and/or Out2 coupling to its pass/no-pass switch 258 as illustrated in FIG. 7A, wherein its pass/no-pass switch 258 may be one of the first through sixth types as illustrated in FIGS. 2A-2F.

II. Arrangement for by-Pass Interconnects for Standard Commodity FPGA IC Chip

Figure 8G:
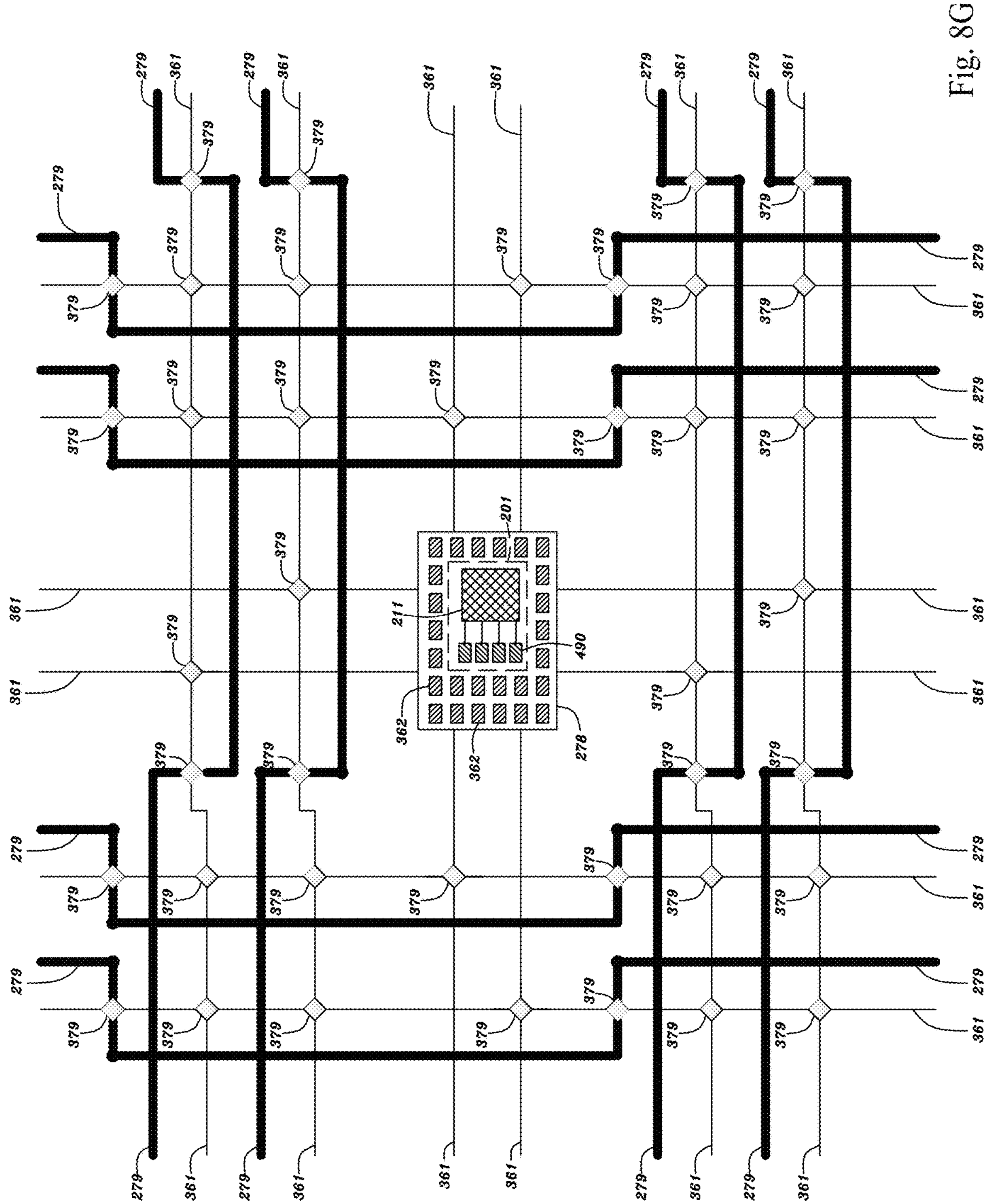

FIG. 8G is a top view showing programmable interconnects serving as by-pass interconnects in accordance with an embodiment of the present application. Referring to FIG. 8G, the standard commodity FPGA IC chip 200 may include (1) a first group of programmable interconnects 361 to serve as by-pass interconnects 279 each coupling one of the cross-point switches 379 to another far one of the cross-point switches 379 by-passing another one or more of the cross-point switches 379, each of which may be one of the cross-point switches 379 as illustrated in FIGS. 3A-3D, and (2) a second group of programmable interconnects 361 not by-passing any of the cross-point switches 379, but each of the by-pass interconnects 279 may be arranged in parallel with an aggregate of multiple of the programmable interconnects 361 in the second group configured to be coupled to each other or one another via one or more of the cross-point switches 379.

For connection between one of the by-pass interconnects 279 and one the programmable interconnects 361 in the second group, one of the cross-point switches 379 as seen in FIGS. 3A-3C may have the nodes N23 and N25 coupling respectively to two of the programmable interconnects 361 in the second group and the nodes N24 and N26 coupling respectively to two of the by-pass interconnects 279. Thereby, said one of the cross-point switches 379 may switch one selected from two of the programmable interconnects 361 in the second group and two of the by-pass interconnects 279 to be coupled to the other one or more selected from them. For example, said one of the cross-point switches 379 may switch the programmable interconnect 361 in the second group coupling to its node N23 to be coupled to the by-pass interconnect 279 coupling to its node N24. Alternatively, said one of the cross-point switches 379 may switch the programmable interconnect 361 in the second group coupling to its node N23 to be coupled to the programmable interconnect 361 in the second group coupling to its node N25. Alternatively, said one of the cross-point switches 379 may switch the by-pass interconnect 279 coupling to its node N24 to be coupled to the by-pass interconnect 279 coupling to its node N26.

For connection between two of the programmable interconnects 361 in the second group, one of the cross-point switches 379 as seen in FIGS. 3A-3C may have its four nodes N23-N26 coupling to four of the programmable interconnects 361 in the second group respectively. Thereby, said one of the cross-point switches 379 may switch one selected from said four of the programmable interconnects 361 in the second group to be coupled to another one selected from them.

Referring to FIG. 8G, multiple of the cross-point switches 379 surrounds a region 278, in which multiple of the memory cells 362, which may be an on-chip volatile memory cell referred to one 398 as illustrated in FIG. 1A or 1B, each having (an) output(s) Out1 and/or Out2 coupling to one of said multiple of the cross-point switches 379 as illustrated in FIGS. 7A-7C, or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell. In the region 278 are further multiple of the memory cells 490 for the look-up table (LUT) 210 of the programmable logic block 201, each of which may be an on-chip volatile memory cell referred to one 398 as illustrated in FIG. 1A or 1B and may have an output Out1 or Out2 coupling to one of the inputs D0-D15 in the first set of the multiplexer 211, in the region 278, of the programmable logic block 201, as illustrated in FIGS. 6A-6E, or each of which may be an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell. The memory cells 362 for the cross-point switches 379 may be arranged in one or more rings around the programmable logic block 201. Multiple of the programmable interconnects 361 in the second group around the region 278 may couple the second set of inputs, e.g., A0-A3, of the multiplexer 211 of the programmable logic blocks 201 to multiple of the cross-point switches 379 around the region 278 respectively. One of the programmable interconnects 361 in the second group around the region 278 may couple the output, e.g., Dout, of the multiplexer 211 of the programmable logic blocks 201 to one of the cross-point switches 379 around the region 278.

Accordingly, referring to FIG. 8G, the output, e.g., Dout, of the multiplexer 211 of one of the programmable logic blocks 201 may (1) pass to one of the by-pass interconnects 279 alternately through one or more of the programmable interconnects 361 in the second group and one or more of the cross-point switches 379, (2) subsequently pass from said one of the by-pass interconnects 279 to another of the programmable interconnects 361 in the second group alternately through one or more of the cross-point switches 379 and one or more of the by-pass interconnects 279, and (3) finally pass from said another of the programmable interconnects 361 in the second group to one of the inputs in the second set, e.g., A0-A3, of the multiplexer 211 of another of the programmable logic blocks 201 alternately through one or more of the cross-point switches 379 and one or more of the programmable interconnects 361 in the second group.

III. Arrangement for Cross-Point Switches for Standard Commodity FPGA IC Chip

Figure 8H:
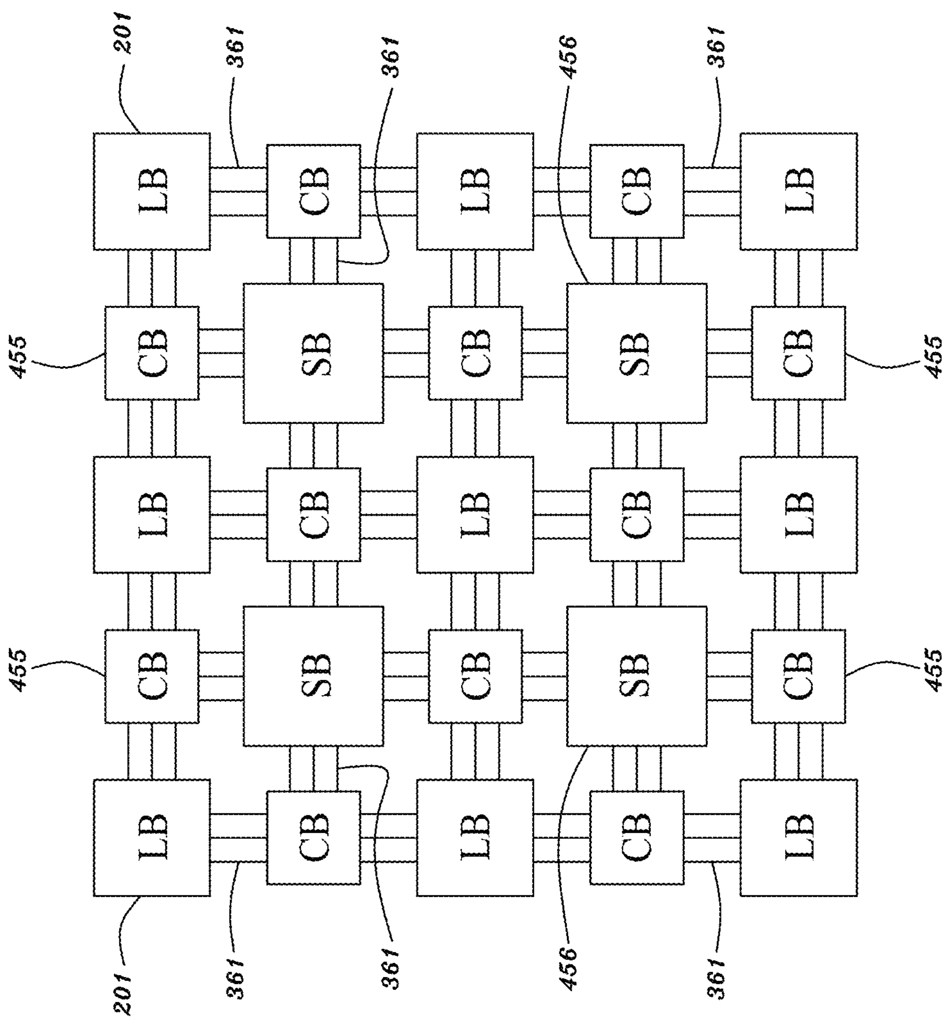

FIG. 8H is a top view showing arrangement for cross-point switches for a standard commodity FPGA IC chip in accordance with an embodiment of the present application. Referring to FIG. 8H, the standard commodity FPGA IC chip 200 may include the programmable logic blocks (LB) 201 arranged in an array, multiple connection blocks (CB) 455 each arranged between neighboring two of the logic blocks (LB) 201 in the same column or row, and multiple switch blocks (SB) 456 each arranged between neighboring two of the connection blocks (CB) 455 in the same column or row. Each of the connection blocks (CB) 455 may be composed of multiple of the cross-point switches 379 of the fourth type as seen in FIGS. 3D and 7C. Each of the switch blocks (SB) 456 may be composed of multiple of the cross-point switches 379 of the third type as seen in FIGS. 3C and 7B.

Referring to FIG. 8H, for each of the connection blocks (CB) 455, each of its cross-point switches 379 of the fourth type may have its inputs, e.g., D0-D15, each coupling to one of the programmable interconnects 361 and its output, e.g., Dout, coupling to another of the programmable interconnects 361. Said one of the programmable interconnects 361 may couple one of the inputs, e.g., D0-D15, of one of the cross-point switches 379 of one of the connection blocks (CB) 455 as illustrated in FIGS. 3D and 7C to (1) the output, e.g., Dout, of one of the programmable logic blocks (LB) 201 as illustrated in FIG. 6A or (2) one of nodes N23-N26 of one of the cross-point switches 379 of one of the switch blocks (SB) 456 as illustrated in FIGS. 3C and 7B. Alternatively, said another of the programmable interconnects 361 may couple the output, e.g., Dout, of one of the cross-point switches 379 of one of the connection blocks (CB) 455 as illustrated in FIGS. 3D and 7C to (1) one of the inputs, e.g., A0-A3 of one of the logic blocks (LB) 201 as illustrated in FIG. 6A or (2) one of the nodes N23-N26 of one of the cross-point switches 379 of one of the switch blocks (SB) 456 as illustrated in FIGS. 3C and 7B.

For example, referring to FIG. 8H, one or more of the inputs, e.g., D0-D15, of the cross-point switch 379 as illustrated in FIGS. 3D and 7C for said one of the connection blocks (CB) 455 may couple to the output Dout of the programmable logic block (LB) 201 as illustrated in FIG. 6A at its first side through one or more of the programmable interconnects 361. Another one or more of the inputs, e.g., D0-D15, of the cross-point switch 379 as illustrated in FIGS. 3D and 7C for said one of the connection blocks (CB) 455 may couple to the output Dout of the programmable logic block (LB) 201 as illustrated in FIG. 6A at its second side opposite to its first side through one or more of the programmable interconnects 361. Another one or more of the inputs, e.g., D0-D15, of the cross-point switch 379 as illustrated in FIGS. 3D and 7C for said one of the connection blocks (CB) 455 may couple to one of the nodes N23-N26 of the cross-point switch 379 as illustrated in FIGS. 3C and 7B for the switch blocks (SB) 456 at its third side through one or more of the programmable interconnects 361. Another one or more of the inputs, e.g., D0-D15, of the cross-point switch 379 as illustrated in FIGS. 3D and 7C for said one of the connection blocks (CB) 455 may couple to one of the nodes N23-N26 of the cross-point switch 379 as illustrated in FIGS. 3C and 7B for the switch block (SB) 456 at its fourth side opposite to its third side through one or more of the programmable interconnects 361. The output, e.g., Dout, of the cross-point switch 379 as illustrated in FIGS. 3D and 7C for said one of the connection blocks (CB) 455 may couple to one of the nodes N23-N26 of the cross-point switch 379 as illustrated in FIGS. 3C and 7B for the switch block (SB) 456 at its third or fourth side through one or more of the programmable interconnects 361 or to one of the inputs A0-A3 of the programmable logic block (LB) 201 as illustrated in FIG. 6A at its first or second side through one or more of the programmable interconnects 361.

Referring to FIG. 8H, for each of the switch blocks (SB) 456, its cross-point switch 379 of the third type as illustrated in FIGS. 3C and 7B may have its four nodes N23-N26 coupling respectively to four of the programmable interconnects 361 in four different directions. For example, the cross-point switch 379 as illustrated in FIGS. 3C and 7B for said each of the switch blocks (SB) 456 may have its node N23 coupling to one of the inputs D0-D15 and output Dout of the cross-point switch 379 as seen in FIGS. 3D and 7C for the connection block (CB) 455 at its left side through one of said four of the programmable interconnects 361, the cross-point switch 379 as illustrated in FIGS. 3C and 7B for said each of the switch blocks (SB) 456 may have its node N24 coupling to one of the inputs D0-D15 and output Dout of the cross-point switch 379 as seen in FIGS. 3D and 7C for the connection block (CB) 455 at its top side through another of said four of the programmable interconnects 361, the cross-point switch 379 as illustrated in FIGS. 3C and 7B for said each of the switch blocks (SB) 456 may have its node N25 coupling to one of the inputs D0-D15 and output Dout of the cross-point switch 379 as seen in FIGS. 3D and 7C for the connection block (CB) 455 at its right side through another of said four of the programmable interconnects 361, and the cross-point switch 379 as illustrated in FIGS. 3C and 7B for said each of the switch blocks (SB) 456 may have its node N26 coupling to one of the inputs D0-D15 and output Dout of the cross-point switch 379 as seen in FIGS. 3D and 7C for the connection block (CB) 455 at its bottom side through the other of said four of the programmable interconnects 361.

Thereby, referring to FIG. 8H, signal transmission may be built from one of the programmable logic blocks (LB) 201 to another of the programmable logic blocks (LB) 201 through multiple of the switch blocks (SB) 456, wherein between each neighboring two of said multiple of the switch blocks (SB) 456 may be arranged one of the connection blocks (CB) 455 for the signal transmission, between said one of the programmable logic blocks (LB) 201 and one of said multiple of the switch blocks (SB) 456 may be arranged one of the connection blocks (CB) 455 for the signal transmission, and between said another of the programmable logic blocks (LB) 201 and one of said multiple of the switch blocks (SB) 456 may be one of the connection blocks (CB) 455 for the signal transmission. For example, a signal may be transmitted from an output, e.g., Dout, of said one of the programmable logic blocks (LB) 201 as seen in FIG. 6A to one of the inputs, e.g., D0-D15, of the cross-point switches 379 of the fourth type as seen in FIGS. 3D and 7C for a first one of the connection blocks (CB) 455 through one of the programmable interconnects 361. Next, the cross-point switches 379 of the fourth type for the first one of the connection blocks (CB) 455 may pass the signal from said one of its inputs, e.g., D0-D15, to its output, e.g., Dout, to be transmitted to a node N23 of one of the cross-point switches 379 of the third type as seen in FIGS. 3C and 7B for one of the switch blocks (SB) 456 through another of the programmable interconnects 361. Next, said one of the cross-point switches 379 of the third type for one of the switch blocks (SB) 456 may pass the signal from its node N23 to its node N25 to be transmitted to one of the inputs, e.g., D0-D15, of the cross-point switches 379 of the fourth type as seen in FIGS. 3D and 7C for a second one of the connection blocks (CB) 455 through another of the programmable interconnects 361. Next, the cross-point switches 379 of the fourth type for the second one of the connection blocks (CB) 455 may pass the signal from said one of its inputs, e.g., D0-D15, to its output, e.g., Dout, to be transmitted to one of the inputs, e.g., A0-A3, of said another of the programmable logic blocks (LB) 201 as seen in FIG. 6A through another of the programmable interconnects 361.

IV. Repair for Standard Commodity FPGA IC Chip

Figure 8I:
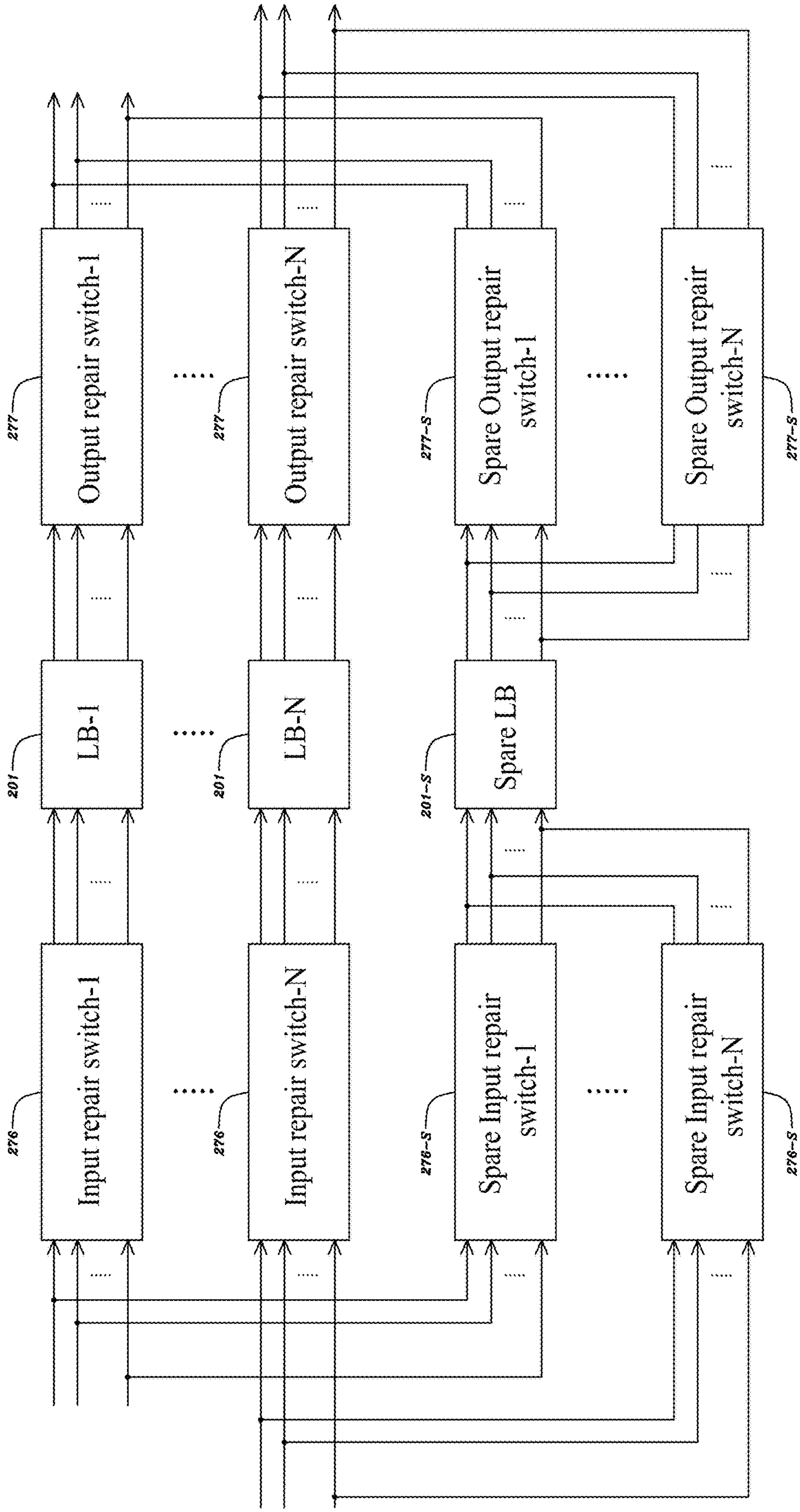
FIGS. 8I and 8J are block diagrams showing various repair algorithms in accordance with an embodiment of the present application.

FIG. 8I is a block diagram showing a repair for a standard commodity FPGA IC chip in accordance with an embodiment of the present application. Referring to FIG. 8I, the standard commodity FPGA IC chip 200 may have a spare 201-*s* for the programmable logic blocks 201 configured to replace a broken one of the programmable logic blocks 201. The standard commodity FPGA IC chip 200 may include (1) multiple input repair switch matrixes 276 each having multiple outputs each coupling in series to one of the inputs A0-A3 of one of the programmable logic blocks 201 as illustrated in FIG. 6A and (2) multiple output repair switch matrixes 277 each having one or more input(s) coupling in series to the one or more output(s) Dout of one of the programmable logic blocks 201 as illustrated in FIG. 6A. Furthermore, the standard commodity FPGA IC chips 200 may include (1) multiple spare input repair switch matrixes 276-*s* each having multiple outputs each coupling in parallel to one of the outputs of each of the others of the spare input repair switch matrixes 276-*s* and coupling in series to one of the inputs A0-A3 of the spare 201-*s* for the programmable logic blocks 201 as illustrated in FIG. 6A, and (2) multiple spare output repair switch matrixes 277-*s* each having one or more input(s) coupling respectively in parallel to the one or more input(s) of each of the others of the spare output repair switch matrixes 277-*s* and coupling respectively in series to the one or more output(s) Dout of the spare 201-*s* for the programmable logic blocks 201 as illustrated in FIG. 6A. Each of the spare input repair switch matrixes 276-*s* may have multiple inputs each coupling in parallel to one of the inputs of one of the input repair switch matrixes 276. Each of the spare output repair switch matrixes 277-*s* may have one or more outputs coupling respectively in parallel to the one or more outputs of one of the output repair switch matrixes 277.

Thereby, referring to FIG. 8I, when one of the programmable logic blocks 201 is broken, one of the input repair switch matrixes 276 and one of the output repair switch matrixes 277 coupling to the inputs and output(s) of said one of the programmable logic blocks 201 respectively may be turned off; one of the spare input repair switch matrixes 276-*s* having its inputs coupling respectively in parallel to the inputs of said one of the input repair switch matrixes 276 and one of the spare output repair switch matrixes 277-*s* having its output(s) coupling respectively in parallel to the output(s) of said one of the output repair switch matrixes 277 may be turned on; the others of the spare input repair switch matrixes 276-*s* and the others of the spare output repair switch matrixes 277-*s* may be turned off. Accordingly, the broken one of the programmable logic blocks 201 may be replaced with the spare 201-*s* for the programmable logic blocks 201.

Figure 8J:
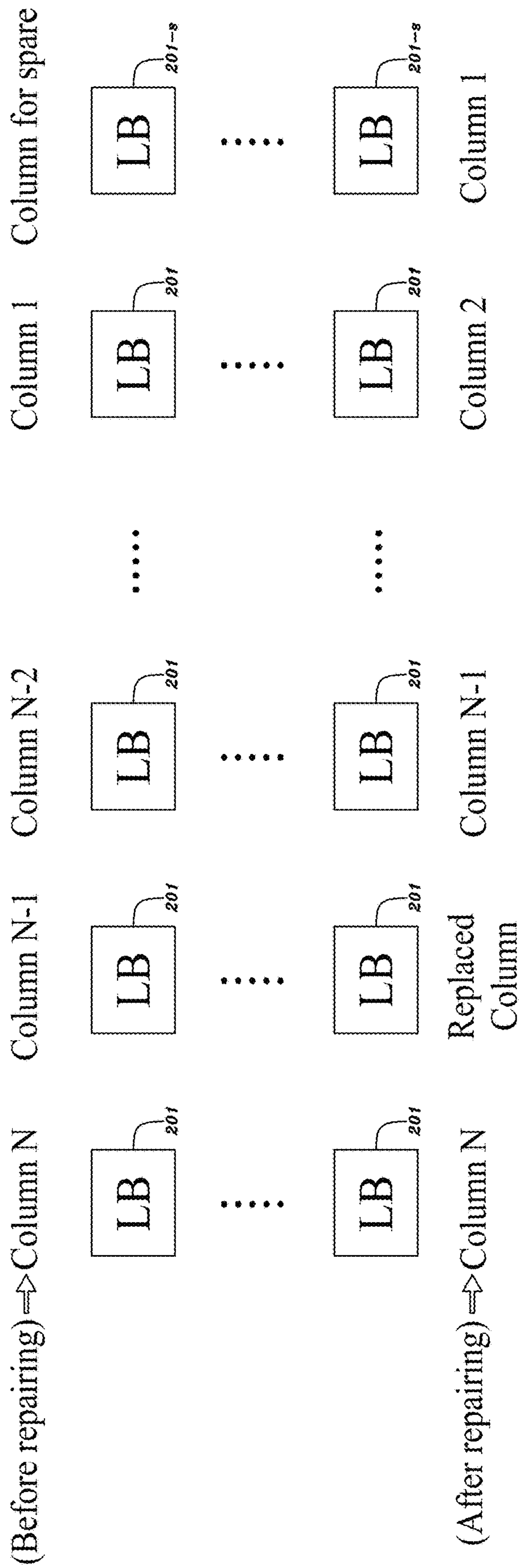

FIG. 8J is a block diagram showing a repair for a standard commodity FPGA IC chip in accordance with an embodiment of the present application. Referring to FIG. 8J, the programmable logic blocks (LB) 201 may be arranged in an array. When one of the programmable logic blocks (LB) 201 arranged in a column is broken, all of the programmable logic blocks (LB) 201 arranged in the column may be turned off and multiple spares 201-*s* for the programmable logic blocks (LB) 201 arranged in a column may be turned on. Next, the columns for the programmable logic blocks (LB) 201 and the spares 201-*s* for the programmable logic blocks (LB) 201 may be renumbered, and each of the programmable logic blocks 201 after repaired in a renumbered column and in a specific row may perform the same operations as one of the programmable logic blocks (LB) 201 before repaired in a column having the same number as the renumbered column and in the specific row. For example, when one of the programmable logic blocks (LB) 201 arranged in the column N-1 is broken, all of the programmable logic blocks (LB) 201 arranged in the column N-1 may be turned off and the spares 201-*s* for the programmable logic blocks (LB) 201 arranged in the rightmost column may be turned on. Next, the columns for the programmable logic blocks (LB) 201 and the spares 201-*s* for the programmable logic blocks (LB) 201 may be renumbered such that the rightmost column arranged for the spare 201-*s* for the programmable logic blocks (LB) 201 before repaired may be renumbered to column 1 after the programmable logic blocks (LB) 201 are repaired, the column 1 arranged for the programmable logic blocks (LB) 201 before repaired may be renumbered to column 2 after the programmable logic blocks (LB) 201 are repaired, and so on. The column n-2 arranged for the programmable logic blocks (LB) 201 before repaired may be renumbered to column n-1 after the programmable logic blocks (LB) 201 are repaired, wherein n is an integer ranging from 3 to N. Each of the programmable logic blocks (LB) 201 after repaired in the renumbered column m and in a specific row may perform the same operation as one of the programmable logic blocks 201 before repaired in the column m and in the specific row, where m is an integer ranging from 1 to N. For example, each of the programmable logic blocks (LB) 201 after repaired in the renumbered column 1 and in a specific row may perform the same operations as one of the logic blocks 201 before repaired in the column 1 and in the specific row.

Figure 9:
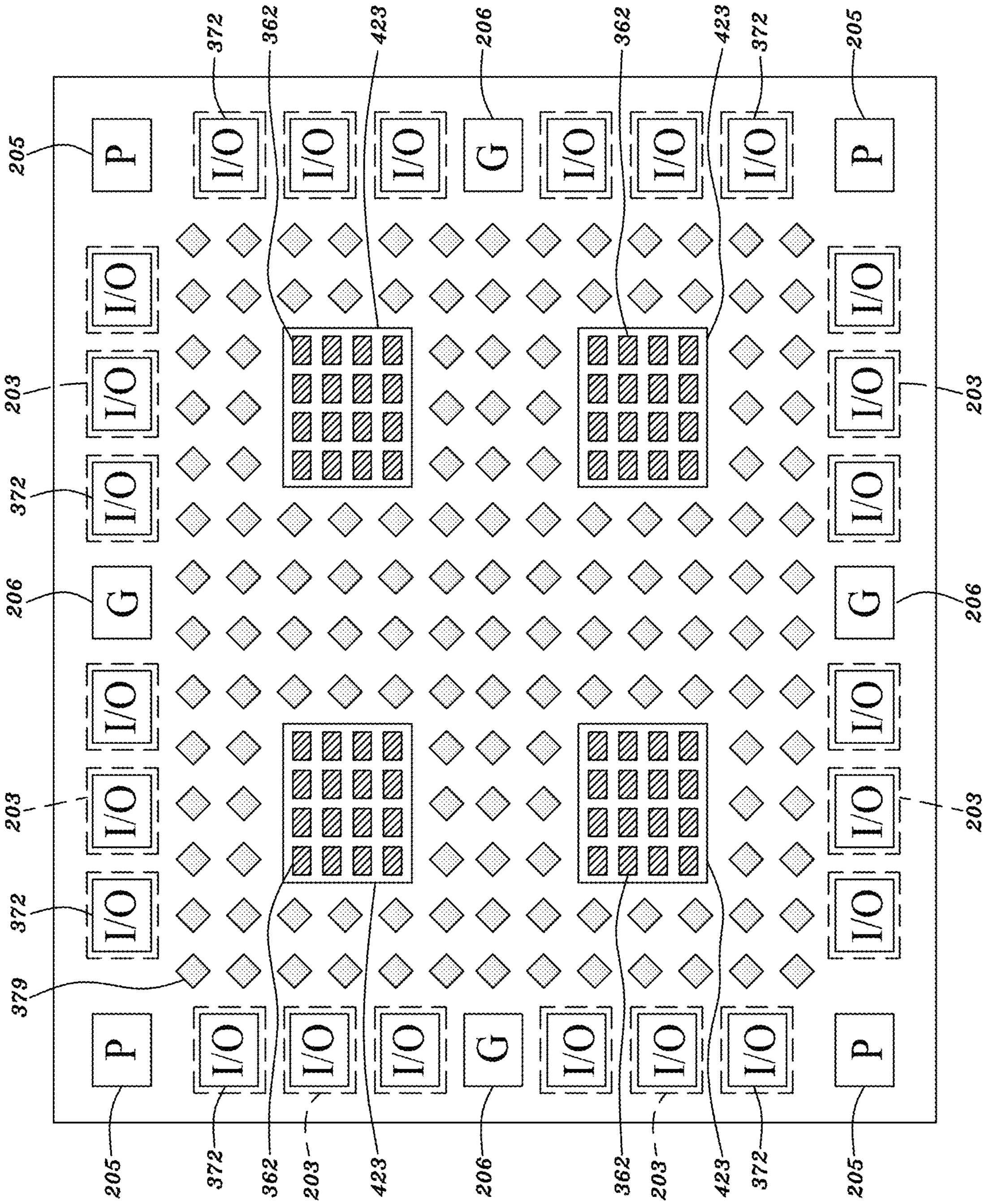
FIG. 9 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 9 is a schematically top view showing a block diagram of a dedicated programmable interconnection (DPI) integrated-circuit (IC) chip in accordance with an embodiment of the present application. Referring to FIG. 9, a dedicated programmable interconnection (DPI) integrated-circuit (IC) chip 410 is designed, implemented and fabricated using an advanced semiconductor technology node or generation, for example more advanced than or equal to, or below or equal to 30 nm, 20 nm or 10 nm; with a chip size and manufacturing yield optimized with the minimum manufacturing cost for the used semiconductor technology node or generation. The dedicated IP IC chip 410 may have an area between 400 $mm^2$ and 9 $mm^2$, 225 $mm^2$ and 9 $mm^2$, 144 $mm^2$ and 16 $mm^2$, 100 $mm^2$ and 16 $mm^2$, 75 $mm^2$ and 16 $mm^2$, or 50 $mm^2$ and 16 $mm^2$. Transistors or semiconductor devices of the dedicated IP IC chip 410 used in the advanced semiconductor technology node or generation may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

Referring to FIG. 9, since the dedicated programmable interconnection (DPI) integrated-circuit (IC) chip 410 is a standard commodity IC chip, the number of types of products for the DPIIC chip 410 may be reduced to a small number, and therefore expensive photo masks or mask sets for fabricating the DPIIC chip 410 using advanced semiconductor nodes or generations may be reduced to a few mask sets. For example, the mask sets for a specific technology node or generation may be reduced down to between 3 and 20, 3 and 10, or 3 and 5. Its NRE and production expenses are therefore greatly reduced. With the few types of products for the DPIIC chip 410, the manufacturing processes may be optimized to achieve very high manufacturing chip yields. Furthermore, the chip inventory management becomes easy, efficient and effective, therefore resulting in a relatively short chip delivery time and becoming very cost-effective.

Referring to FIG. 9, the DPIIC chip 410 may be of various types, including (1) multiple memory-array blocks 423 arranged in an array in a central region thereof, (2) multiple groups of cross-point switches 379 as illustrated in FIG. 3A, 3B, 3C or 3D, each group of which is arranged in one or more rings around one of the memory-array blocks 423, and (3) multiple small input/output (I/O) circuits 203, as illustrated in FIG. 5B, each having the node of S_Data_in coupling to one of the nodes N23-N26 of one of its cross-point switches 379 as illustrated in FIGS. 3A-3C through one of the programmable interconnects 361 or to one of the inputs D0-D15 of one of its cross-point switches 379 as illustrated in FIG. 3D through one of the programmable interconnects 361 and the node of S_Data_out coupling to one of the nodes N23-N26 of another of its cross-point switches 379 as illustrated in FIGS. 3A-3C through another of the programmable interconnects 361 or to the output Dout of another of its cross-point switches 379 as illustrated in FIG. 3D through another of the programmable interconnects 361. In each of the memory-array blocks 423 are multiple of memory cells 362, each of which may be an on-chip volatile memory cell referred to one 398 as illustrated in FIG. 1A or 1B, each having an output Out1 and/or Out2 coupling to one of the pass/no-pass switches 258 for one of the cross-point switches 379 as illustrated in FIGS. 3A, 3B and 7A close to said each of the memory-array blocks 423 to switch on or off said one of the pass/no-pass switches 258, or each of which may be an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell. Alternatively, in each of the memory-array blocks 423 are multiple of memory cells 362, each of which may be referred to one as illustrated in FIG. 1A or 1B, each having an output Out1 or Out2 coupling to one of the inputs, e.g., A0 and A1, of the second set and inputs SC-4 of one of the multiplexers 211 of one of the cross-point switches 379 as illustrated in FIGS. 3C and 7B close to said each of the memory-array blocks 423. Alternatively, in each of the memory-array blocks 423 are multiple of memory cells 362, each of which may be referred to one as illustrated in FIG. 1A or 1B, each having an output Out1 or Out2 coupling to one of the inputs, e.g., A0-A3, of the second set of the multiplexer 211 of one of the cross-point switches 379 as illustrated in FIGS. 3D and 7C close to said each of the memory-array blocks 423.

Referring to FIG. 9, the DPIIC chip 410 may include multiple intra-chip interconnects (not shown) each extending over spaces between neighboring two of the memory-array blocks 423, wherein said each of the intra-chip interconnects may be the programmable interconnect 361 or fixed interconnect 364 as illustrated in FIGS. 7A-7C. For the DPIIC chip 410, each of its small input/output (I/O) circuits 203, as illustrated in FIG. 5B, may have its output S_Data_in coupling to one or more of its programmable interconnects 361 and/or one or more of its fixed interconnects 364 and its input S_Dataout, S_Enable or S_Inhibit coupling to another one or more of its programmable interconnects 361 and/or another one or more of its fixed interconnects 364.

Referring to FIG. 9, the DPIIC chip 410 may include multiple of the I/O pads 372 as seen in FIG. 5B, each vertically over one of its small input/output (I/O) circuits 203, coupling to the node 381 of said one of its small input/output (I/O) circuits 203. In a first clock, a signal from one of the nodes N23-N26 of one of the cross-point switches 379 as illustrated in FIGS. 3A-3C, 7A and 7B, or the output Dout of one of the cross-point switches 379 as illustrated in FIGS. 3D and 7C, may be transmitted to the input S_Data_out of the small driver 374 of one of the small input/output (I/O) circuits 203 through one or more of the programmable interconnects 361, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the DPIIC chip 410. In a second clock, a signal from circuits outside the DPIIC chip 410 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the nodes N23-N26 of another of the cross-point switches 379 as illustrated in FIGS. 3A-3C, 7A and 7B, or to one of the inputs D0-D15 of another of the cross-point switches 379 as illustrated in FIGS. 3D and 7C, through another one or more of the programmable interconnects 361. Referring to FIG. 9, the DPIIC chip 410 may further include (1) multiple power pads 205 for applying the power supply voltage, i.e., Vcc, to the memory cells 362 for the cross-point switches 379 as illustrated in FIGS. 7A-7C, wherein the power supply voltage, i.e., Vcc, may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing ground reference voltage, i.e., Vss, to the memory cells 362 for the cross-point switches 379 as illustrated in FIGS. 7A-7C.

Specification for Dedicated Input/Output (I/O) Chip

Figure 10:
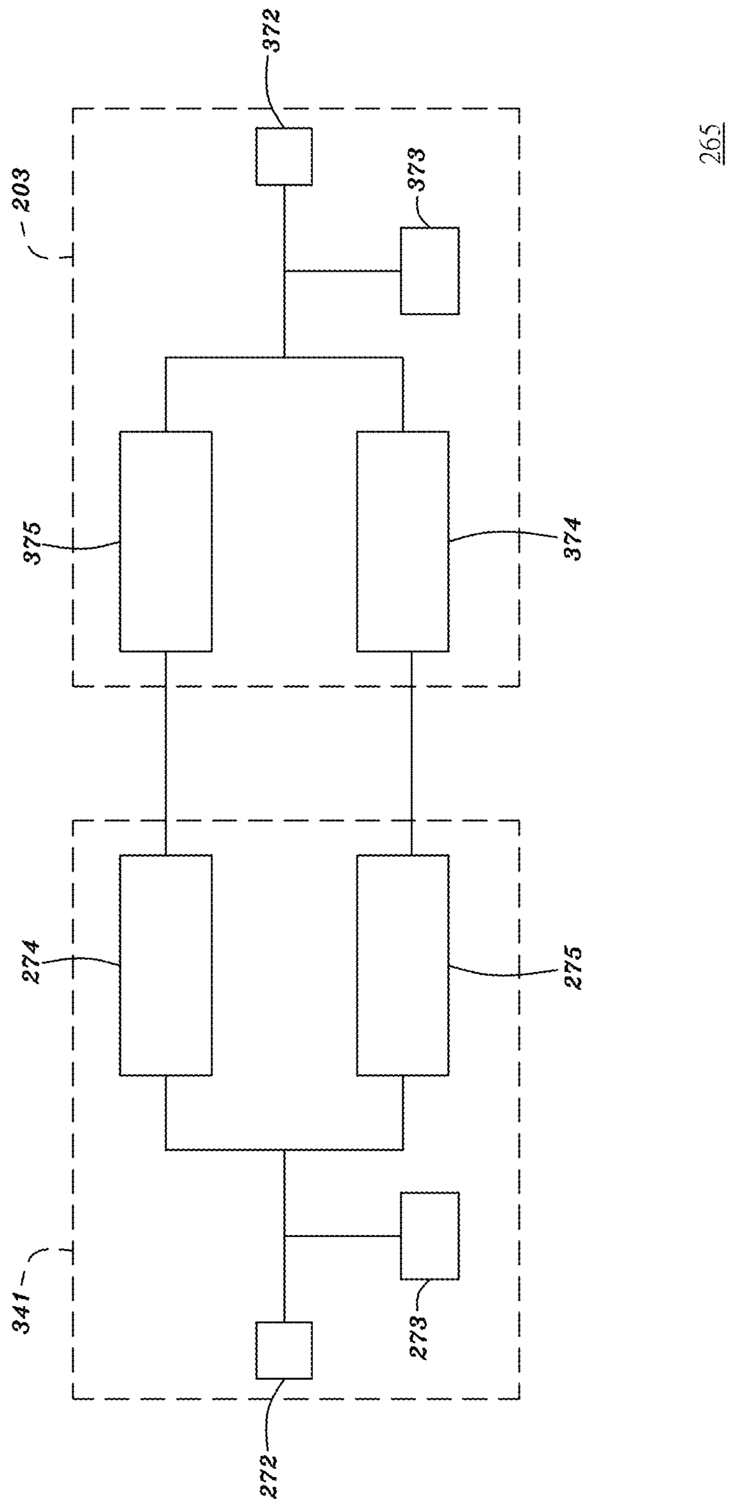
FIG. 10 is a schematically top view showing a block diagram of a dedicated input/output (I/O) chip in accordance with an embodiment of the present application.

FIG. 10 is a block diagram for a dedicated input/output (I/O) chip in accordance with an embodiment of the present application. Referring to FIG. 10, a dedicated input/output (I/O) chip 265 may include a plurality of the large I/O circuit 341 (only one is shown) and a plurality of the small I/O circuit 203 (only one is shown). The large I/O circuit 341 may be referred to one as illustrated in FIG. 5A; the small I/O circuit 203 may be referred to one as illustrated in FIG. 5B.

Referring to FIGS. 5A, 5B and 10, each of the large I/O circuits 341 may be provided with the large driver 274 having the input L_Data_out coupling to the output S_Data_in of the small receiver 375 of one of the small I/O circuits 203. Each of the large I/O circuits 341 may be provided with the large receiver 275 having the node of L_Data_in coupling to the node of S_Data_out of the small driver 374 of one of the small I/O circuits 203. When the large driver 274 is enabled by the L_Ebable signal, the small receiver 375 is activated by the S_Inhibit signal, the large receiver 275 is inhibited by the L_Inhibit signal and the small driver 374 is disabled by the S_Ebable signal, data from the I/O pad 372 of the small I/O circuit 203 may pass to the I/O pad 272 of the large I/O circuit 341 through, in sequence, the small receiver 375 and large driver 274. When the large receiver 275 is activated by the L_Inhibit signal, the small driver 374 is enabled by the S_Ebable signal, the large driver 274 is disabled by the L_Ebable signal and the small receiver 375 is inhibited by the S_Inhibit signal, data from the I/O pad 272 of the large I/O circuit 341 may pass to the I/O pad 372 of the small I/O circuit 203 through, in sequence, the large receiver 275 and small driver 374.

Specification for Logic Drive

Various types of standard commodity logic drives, packages, package drives, devices, modules, disks or disk drives (to be abbreviated as "drive" below, that is when "drive" is mentioned below, it means and reads as "drive, package, package drive, device, module, disk or disk drive") are introduced in the following paragraphs.

I. First Type of Logic Drive

Figure 11A:
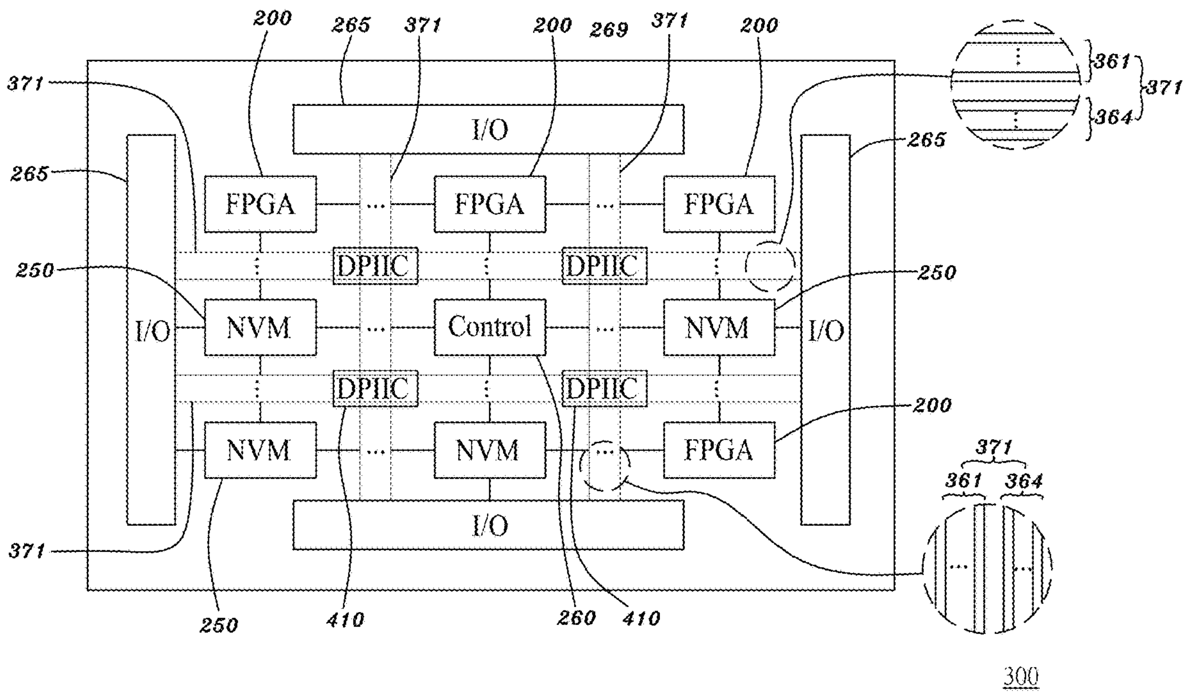
FIGS. 11A-11N are schematically top views showing various arrangement for a logic drive in accordance with an embodiment of the present application.

FIG. 11A is a schematically top view showing arrangement for various chips packaged in a first type of standard commodity logic drive in accordance with an embodiment of the present application. Referring to FIG. 11A, the standard commodity logic drive 300 may be packaged with a plurality of the standard commodity FPGA IC chip 200 as illustrated in FIGS. 8A-8J, one or more non-volatile memory (NVM) IC chips 250 and a dedicated control chip 260, which are arranged in an array, wherein the dedicated control chip 260 may be surrounded by the standard commodity FPGA IC chips 200 and NVMIC chips 250, i.e., NVM chips, and arranged between the NVMIC chips 250 and/or between the standard commodity FPGA IC chips 200. One of the NVMIC chips 250 at a right middle side of the logic drive 300 may be arranged between two of the standard commodity FPGA IC chips 200 at right top and right bottom sides of the logic drive 300. Some of the FPGA IC chips 200 may be arranged in a line at a top side of the logic drive 300.

Referring to FIG. 11A, the logic drive 300 may include multiple inter-chip interconnects 371 each extending over spaces between neighboring two of the standard commodity FPGA IC chips 200, NVMIC chips 250 and dedicated control chip 260. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250 and dedicated control chip 260 around said each of the DPIIC chips 410. For example, one of the DPIIC chips 410 at a left top corner of the dedicated control chip 260 may have a first minimum distance to a first one of the standard commodity FPGA IC chips 200 at a left top corner of said one of the DPIIC chips 410, wherein the first minimum distance is the one between the right bottom corner of the first one of the standard commodity FPGA IC chips 200 and the left top corner of said one of the DPIIC chips 410; said one of the DPIIC chips 410 may have a second minimum distance to a second one of the standard commodity FPGA IC chips 200 at a right top corner of said one of the DPIIC chips 410, wherein the second minimum distance is the one between the left bottom corner of the second one of the standard commodity FPGA IC chips 200 and the right top corner of said one of the DPIIC chips 410; said one of the DPIIC chips 410 may have a third minimum distance to one of the NVMIC chips 250 at a left bottom corner of said one of the DPIIC chips 410, wherein the third minimum distance is the one between the right top corner of said one of the NVMIC chips 250 and the left bottom corner of said one of the DPIIC chips 410; said one of the DPIIC chips 410 may have a fourth minimum distance to the dedicated control chip 260 at a right bottom corner of said one of the DPIIC chips 410, wherein the fourth minimum distance is the one between the left top corner of the dedicated control chip 260 and the right bottom corner of said one of the DPIIC chips 410.

Referring to FIG. 11A, each of the inter-chip interconnects 371 may be the programmable or fixed interconnect 361 or 364 as illustrated in FIGS. 7A-7C in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 502 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 11A, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to all of the NVMIC chips 250. One or more of the programmable or fixed interconnects 361 or 364 of the inter-chip interconnects 371 may couple from each of the DPIIC chips 410 to the dedicated control chip 260. One or more of the programmable or fixed interconnects 361 or 364 of the inter-chip interconnects 371 may couple from each of the DPIIC chips 410 to all of the NVMIC chips 250. One or more of the programmable or fixed interconnects 361 or 364 of the inter-chip interconnects 371 may couple from each of the NVMIC chips 250 to the dedicated control chip 260.

Accordingly, referring to FIG. 11A, a first one of the standard commodity FPGA IC chips 200 may have a first one of the programmable logic blocks 201, as illustrated in FIG. 6A, to transmit an output Dout to one of the inputs A0-A3 of a second one of the programmable logic blocks 201, as illustrated in FIG. 6A, of a second one of the standard commodity FPGA IC chips 200 through one of the cross-point switches 379 of one of the DPIIC chips 410. The output Dout of the first one of the programmable logic blocks 201 may be passed to said one of the inputs A0-A3 of the second one of the programmable logic blocks 201 through, in sequence, (1) the programmable interconnects 361 of the intra-chip interconnects 502 of the first one of the standard commodity FPGA IC chips 200, (2) a first group of programmable interconnects 361 of the inter-chip interconnects 371, (3) a first group of programmable interconnects 361 of the intra-chip interconnects of said one of the DPIIC chips 410, (4) said one of the cross-point switches 379 of said one of the DPIIC chips 410, (5) a second group of programmable interconnects 361 of the intra-chip interconnects of said one of the DPIIC chips 410, (6) a second group of programmable interconnects 361 of the inter-chip interconnects 371 and (7) the programmable interconnects 361 of the intra-chip interconnects 502 of the second one of the standard commodity FPGA IC chips 200.

Alternatively, referring to FIG. 11A, one of the standard commodity FPGA IC chips 200 may have a first one of the programmable logic blocks 201, as illustrated in FIG. 6A, to transmit an output Dout to one of the inputs A0-A3 of a second one of the programmable logic blocks 201, as illustrated in FIG. 6A, of said one of the standard commodity FPGA IC chips 200 through one of the cross-point switches 379 of one of the DPIIC chips 410. The output Dout of the first one of the programmable logic blocks 201 may be passed to one of the inputs A0-A3 of the second one of the programmable logic blocks 201 through, in sequence, (1) a first group of programmable interconnects 361 of the intra-chip interconnects 502 of said one of the standard commodity FPGA IC chips 200, (2) a first group of programmable interconnects 361 of the inter-chip interconnects 371, (3) a first group of programmable interconnects 361 of the intra-chip interconnects of said one of the DPIIC chips 410, (4) said one of the cross-point switches 379 of said one of the DPIIC chips 410, (5) a second group of programmable interconnects 361 of the intra-chip interconnects of said one of the DPIIC chips 410, (6) a second group of programmable interconnects 361 of the inter-chip interconnects 371 and (7) a second group of programmable interconnects 361 of the intra-chip interconnects 502 of said one of the standard commodity FPGA IC chips 200.

Referring to FIG. 11A, the logic drive 300 may include multiple dedicated input/output (I/O) chips 265 in a peripheral region thereof surrounding a central region thereof having the standard commodity FPGA IC chips 200, NVMIC chips 250, dedicated control chip 260 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from one of the DPIIC chips 410 to one of the dedicated input/output (I/O) chips 265. One of the fixed interconnects 364 of the inter-chip interconnects 371 may couple from one of the NVMIC chips 250 to one of the dedicated input/output (I/O) chips 265. One of the fixed interconnects 364 of the inter-chip interconnects 371 may couple from the dedicated control chip 260 to one of the dedicated input/output (I/O) chips 265.

Referring to FIG. 11A, each of the standard commodity FPGA IC chips 200 may be referred to ones as illustrated in FIGS. 8A-8J, and each of the DPIIC chips 410 may be referred to ones as illustrated in FIG. 9.

Referring to FIG. 11A, each of the dedicated I/O chips 265 and the dedicated control chip 260 may be designed, implemented and fabricated using varieties of semiconductor technology nodes or generations, including old or matured technology nodes or generations, for example, a semiconductor node or generation less advanced than or equal to, or above or equal to 40 nm, 50 nm, 90 nm, 130 nm, 250 nm, 350 nm or 500 nm. Packaged in the same logic drive 300, the semiconductor technology nodes or generation used in each of the dedicated I/O chip 265 and the dedicated control chip 260 is 1, 2, 3, 4, 5 or greater than 5 nodes or generations older, more matured or less advanced than that used in each of the standard commodity FPGA IC chips 200 and DPIIC chips 410.

Referring to FIG. 11A, transistors or semiconductor devices used in each of the dedicated I/O chips 265 and the dedicated control chip 260 may be a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and the dedicated control chip 260 may be different from those used in each of the standard commodity FPGA IC chips 200 and DPIIC chips 410; for example, packaged in the same logic drive 300, each of the dedicated I/O chips 265 and the dedicated control chip 260 may use the conventional MOSFET, while each of the standard commodity FPGA IC chips 200 and DPIIC chips 410 may use the FINFET; alternatively, packaged in the same logic drive 300, each of the dedicated I/O chips 265 and the dedicated control chip 260 may use the Fully Depleted Silicon-on-insulator (FDSOI) MOSFET, while each of the standard commodity FPGA IC chips 200 and DPIIC chips 410 may use the FINFET.

Referring to FIG. 11A, each of the NVMIC chips 250 may be a NAND flash chip or NOR flash chip, in a bare-die format or in a multi-chip flash package format. Data stored in the NVMIC chips 250 of the standard commodity logic drive 300 are kept even if the logic drive 300 is powered off. Alternatively, the NVMIC chips 250 may be Non-Volatile Radom-Access-Memory (NVRAM) IC chips, in a bare-die format or in a package format. The NVRAM may be a Ferroelectric RAM (FRAM), Magnetoresistive RAM (MRAM), or Phase-change RAM (PRAM). Each of the NVMIC chips 250 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. Each of the NVMIC chips 250 may be designed and fabricated using advanced NAND or NOR flash technology nodes or generations, for example, more advanced than or smaller than or equal to 45 nm, 28 nm, 20 nm, 16 nm or 10 nm, wherein the advanced NAND or NOR flash technology may comprise Single Level Cells (SLC) or multiple level cells (MLC) (for example, Double Level Cells DLC, or triple Level cells TLC), and in a 2D-NAND or a 3D NAND structure. The 3D NAND structures may comprise multiple stacked layers or levels of NAND cells, for example, greater than or equal to 4, 8, 16, 32 stacked layers or levels of NAND cells. Accordingly, the standard commodity logic drive 300 may have a standard non-volatile memory density, capacity or size of greater than or equal to 8 MB, 64 MB, 128 MB, 512 MB, 1 GB, 4 GB, 16 GB, 64 GB, 256 GB, or 512 GB, wherein "B" is bytes, each byte has 8 bits.

Referring to FIG. 11A, packaged in the same logic drive 300, the power supply voltage (Vcc) used in each of the dedicated I/O chips 265 and the dedicated control chip 260 may be greater than or equal to 1.5V, 2.0V, 2.5V, 3V, 3.5V, 4V, or 5V, while the power supply voltage (Vcc) used in each of the standard commodity FPGA IC chips 200 and DPIDC chips 410 may be between 0.2V and 2.5V, between 0.2V and 2V, between 0.2V and 1.5V, between 0.1V and 1V, or between 0.2V and 1V, or smaller or lower than or equal to 2.5V, 2V, 1.8V, 1.5V or 1V. Packaged in the same logic drive 300, the power supply voltage (Vcc) used in each of the dedicated I/O chips 265 and dedicated control chip 260 may be different from that used in each of the standard commodity FPGA IC chips 200 and DPIIC chips 410; for example, packaged in the same logic drive 300, each of the dedicated I/O chips 265 and dedicated control chip 260 may use a power supply voltage (Vcc) of 4V, while each of the standard commodity FPGA IC chips 200 and DPIIC chips 410 may use a power supply voltage (Vcc) of 1.5V; alternatively, packaged in the same logic drive 300, each of the dedicated I/O chips 265 and dedicated control chip 260 may use a power supply voltage (Vcc) of 2.5V, while each of the standard commodity FPGA IC chips 200 and DPIDC chips 410 may use a power supply (Vcc) of 0.75V.

Referring to FIG. 11A, packaged in the same logic drive 300, the gate oxide (physical) thickness of the Field-Effect-Transistors (FETs) of semiconductor devices used in each of the dedicated I/O chips 265 and dedicated control chip 260 may be thicker than or equal to 5 nm, 6 nm, 7.5 nm, 10 nm, 12.5 nm, or 15 nm, while the gate oxide (physical) thickness of FETs of semiconductor devices used in each of the standard commodity FPGA IC chips 200 and DPIIC chips 410 may be thinner than 4.5 nm, 4 nm, 3 nm or 2 nm. Packaged in the same logic drive 300, the gate oxide (physical) thickness of FETs of the semiconductor devices used in each of the dedicated I/O chips 265 and dedicated control chip 260 may be different from that used in each of the standard commodity FPGA IC chips 200 and DPIIC chips 410; for example, packaged in the same logic drive 300, each of the dedicated I/O chips 265 and dedicated control chip 260 may use a gate oxide (physical) thickness of FETs of 10 nm, while each of the standard commodity FPGA IC chips 200 and DPIIC chips 410 may use a gate oxide (physical) thickness of FETs of 3 nm; alternatively, packaged in the same logic drive 300, each of the dedicated I/O chips 265 and dedicated control chip 260 may use a gate oxide (physical) thickness of FETs of 7.5 nm, while each of the standard commodity FPGA IC chips 200 and DPIIC chips 410 may use a gate oxide (physical) thickness of FETs of 2 nm.

Referring to FIG. 11A, each of the dedicated I/O chip(s) 165 in the multi-chip package of the standard commodity logic drive 300 may have the circuits as illustrated in FIG. 10. Each of the dedicated I/O chip(s) 165 may arrange a plurality of the large I/O circuit 341 and I/O pad 272, as seen in FIGS. 5A and 10, for the logic drive 300 to employ one or multiple (2, 3, 4, or more than 4) Universal Serial Bus (USB) ports, one or more IEEE 1394 ports, one or more Ethernet ports, one or more HDMI ports, one or more VGA ports, one or more audio ports or serial ports, for example, RS-232 or COM (communication) ports, wireless transceiver I/Os, and/or Bluetooth transceiver I/Os, and etc. Each of the dedicated I/O chips 165 may have a plurality of the large I/O circuit 341 and I/O pad 272, as seen in FIGS. 10A and 15, for the logic drive 300 to employ Serial Advanced Technology Attachment (SATA) ports, or Peripheral Components Interconnect express (PCIe) ports to communicate, connect or couple with a memory drive.

Referring to FIG. 11A, the standard commodity FPGA IC chips 200 may have standard common features or specifications, mentioned as below: (1) the count of the programmable logic blocks (LB) 201 for each of the standard commodity FPGA IC chips 200 may be greater than or equal to 16 K, 64 K, 256 K, 512 K, 1 M, 4 M, 16 M, 64 M, 256 M, 1 G, or 4 G; (2) the number of the inputs of each of its programmable logic blocks (LB) 201 for each of the standard commodity FPGA IC chips 200 may be greater or equal to 4, 8, 16, 32, 64, 128, or 256; (3) the power supply voltage, i.e. Vcc, applied to the power pads 205 for each of the standard commodity FPGA IC chips 200 may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V; (4) the I/O pads 372 of the standard commodity FPGA IC chips 200 may have the same layout and number, and the I/O pads 372 at the same relative location to the respective standard commodity FPGA IC chips 200 have the same function.

II. Second Type of Logic Drive

Figure 11B:
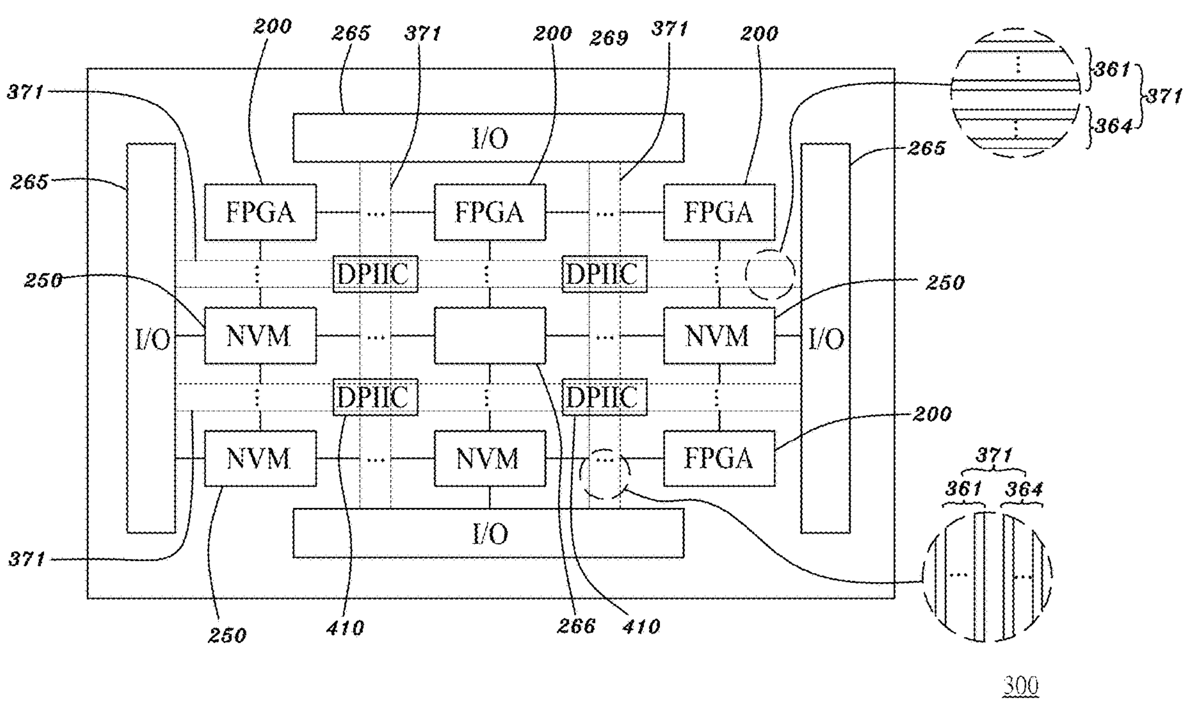

FIG. 11B is a schematically top view showing arrangement for various chips packaged in a second type of standard commodity logic drive in accordance with an embodiment of the present application. Referring to FIG. 11B, the dedicated control chip 260 and dedicated I/O chips 265 have functions that may be combined into a single chip 266, i.e., dedicated control and I/O chip, to perform above-mentioned functions of the control and I/O chips 260 and 265. The dedicated control and I/O chip 266 may include the architecture as seen in FIG. 10. The dedicated control chip 260 as seen in FIG. 11A may be replaced with the dedicated control and I/O chip 266 to be packaged at the place where the dedicated control chip 260 is arranged. For an element indicated by the same reference number shown in FIGS. 11A and 11B, the specification of the element as seen in FIG. 11B and the process for forming the same may be referred to that of the element as illustrated in FIG. 11A and the process for forming the same.

For interconnection, referring to FIG. 11B, one or more of the programmable or fixed interconnects 361 or 364 of the inter-chip interconnects 371 may couple from each of the standard commodity FPGA IC chips 200 to the dedicated control and I/O chip 266. One or more of the programmable or fixed interconnects 361 or 364 of the inter-chip interconnects 371 may couple from each of the DPIIC chips 410 to the dedicated control and I/O chip 266. One or more of the programmable or fixed interconnects 361 or 364 of the inter-chip interconnects 371 may couple from the dedicated control and I/O chip 266 to all of the dedicated input/output (I/O) chips 265. One or more of the programmable or fixed interconnects 361 or 364 of the inter-chip interconnects 371 may couple from the dedicated control and I/O chip 266 to all of the NVMIC chips 250.

Referring to FIG. 11B, each of the dedicated I/O chips 265 and dedicated control and I/O chip 266 is designed, implemented and fabricated using varieties of semiconductor technology nodes or generations, including old or matured technology nodes or generations, for example, a semiconductor node or generation less advanced than or equal to, or above or equal to 40 nm, 50 nm, 90 nm, 130 nm, 250 nm, 350 nm or 500 nm. Packaged in the same logic drive 300, the semiconductor technology node or generation used in each of the dedicated I/O chip 265 and dedicated control and I/O chip 266 is 1, 2, 3, 4, 5 or greater than 5 nodes or generations older, more matured or less advanced than that used in each of the standard commodity FPGA IC chips 200 and DPIIC chips 410.

Referring to FIG. 11B, transistors or semiconductor devices used in each of the dedicated I/O chips 265 and dedicated control and I/O chip 266 may be a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use the conventional MOSFET, while each of the standard commodity FPGA IC chips 200 and DPIIC chips 410 may use the FINFET; alternatively, packaged in the same logic drive 300, each of the dedicated I/O chips 265 and dedicated control and I/O chip 266 may use the Fully Depleted Silicon-on-insulator (FDSOI) MOSFET, while each of the standard commodity FPGA IC chips 200 and DPIIC chips 410 may use the FINFET.

Referring to FIG. 11B, packaged in the same logic drive 300, the power supply voltage used in each of the dedicated I/O chips 265 and dedicated control and I/O chip 266 may be greater than or equal to 1.5V, 2.0V, 2.5V, 3 V, 3.5V, 4V, or 5V, while the power supply voltage (Vcc) used in each of the standard commodity FPGA IC chips 200 and DPIDC chips 410 may be between 0.2V and 2.5V, between 0.2V and 2V, between 0.2V and 1.5V, between 0.1V and 1V, or between 0.2V and 1V, or smaller or lower than or equal to 2.5V, 2V, 1.8V, 1.5V or 1V. Packaged in the same logic drive 300, the power supply voltage used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use a power supply voltage (Vcc) of 4V, while each of the standard commodity FPGA IC chips 200 and DPIIC chips 410 may use a power supply voltage (Vcc) of 1.5V; alternatively, packaged in the same logic drive 300, each of the dedicated I/O chips 265 and dedicated control and I/O chip 266 may use a power supply voltage (Vcc) of 2.5V, while each of the standard commodity FPGA IC chips 200 and DPIDC chips 410 may use a power supply (Vcc) of 0.75V.

Referring to FIG. 11B, Packaged in the same logic drive 300, the gate oxide (physical) thickness of the Field-Effect-Transistors (FETs) of semiconductor devices used in each of the dedicated I/O chips 265 and dedicated control and I/O chip 266 may be thicker than or equal to 5 nm, 6 nm, 7.5 nm, 10 nm, 12.5 nm, or 15 nm, while the gate oxide (physical) thickness of FETs of semiconductor devices used in each of the standard commodity FPGA IC chips 200 and DPIIC chips 410 may be thinner than 4.5 nm, 4 nm, 3 nm or 2 nm. Packaged in the same logic drive 300, the gate oxide (physical) thickness of FETs of the semiconductor devices used in each of the dedicated I/O chips 265 and dedicated control and I/O chip 266 may be different from that used in each of the standard commodity FPGA IC chips 200 and DPIIC chips 410; for example, packaged in the same logic drive 300, each of the dedicated I/O chips 265 and dedicated control and I/O chip 266 may use a gate oxide (physical) thickness of FETs of 10 nm, while each of the standard commodity FPGA IC chips 200 and DPIIC chips 410 may use a gate oxide (physical) thickness of FETs of 3 nm; alternatively, packaged in the same logic drive 300, each of the dedicated I/O chips 265 and dedicated control and I/O chip 266 may use a gate oxide (physical) thickness of FETs of 7.5 nm, while each of the standard commodity FPGA IC chips 200 and DPIIC chips 410 may use a gate oxide (physical) thickness of FETs of 2 nm.

III. Third Type of Logic Drive

Figure 11C:
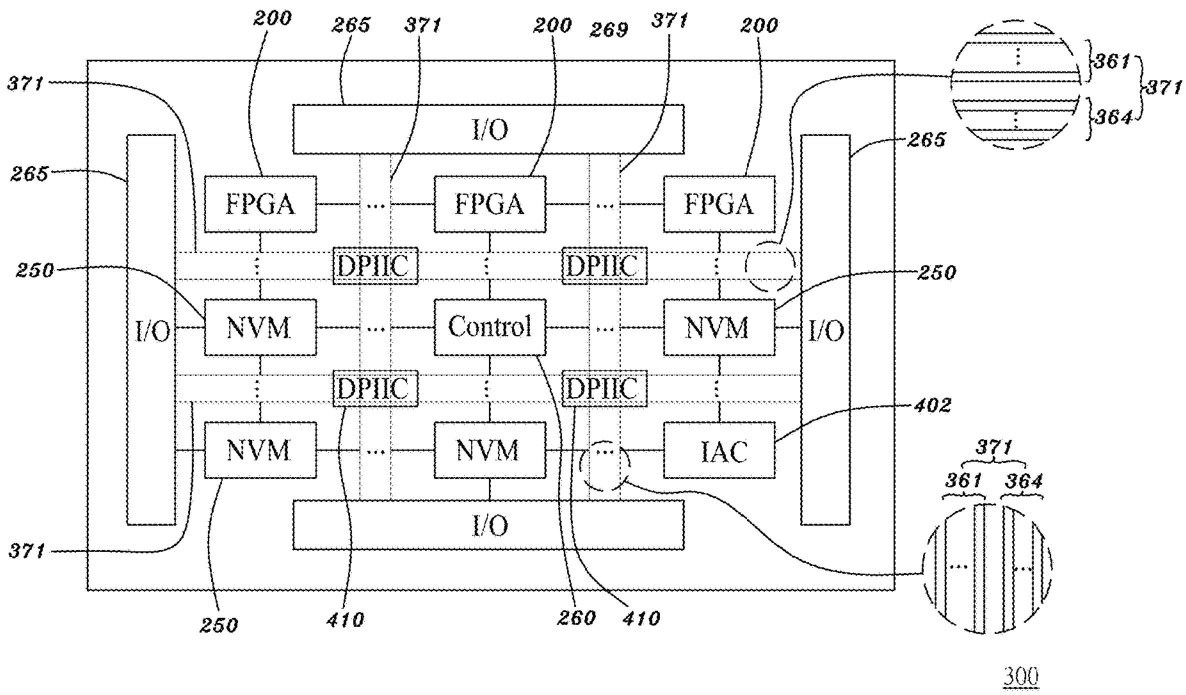

FIG. 11C is a schematically top view showing arrangement for various chips packaged in a third type of standard commodity logic drive in accordance with an embodiment of the present application. The structure shown in FIG. 11C is similar to that shown in FIG. 11A but the difference therebetween is that an Innovated ASIC or COT (abbreviated as IAC below) chip 402 may be further provided to be packaged in the logic drive 300. For an element indicated by the same reference number shown in FIGS. 11A and 11C, the specification of the element as seen in FIG. 11C and the process for forming the same may be referred to that of the element as illustrated in FIG. 11A and the process for forming the same.

Referring to FIG. 11C, the IAC chip 402 may be configured for Intellectual Property (IP) circuits, Application Specific (AS) circuits, analog circuits, mixed-mode signal circuits, Radio-Frequency (RF) circuits, and/or transmitter, receiver, transceiver circuits, etc. Each of the dedicated I/O chips 265 and dedicated control chip 260 and IAC chip 402 is designed, implemented and fabricated using varieties of semiconductor technology nodes or generations, including old or matured technology nodes or generations, for example, less advanced than or equal to, or above or equal to 40 nm, 50 nm, 90 nm, 130 nm, 250 nm, 350 nm or 500 nm. Alternatively, the advanced semiconductor technology nodes or generations, such as more advanced than or equal to, or below or equal to 40 nm, 20 nm or 10 nm, may be used for the IAC chip 402. Packaged in the same logic drive 300, the semiconductor technology node or generation used in each of the dedicated I/O chips 265 and dedicated control chip 260 and IAC chip 402 is 1, 2, 3, 4, 5 or greater than 5 nodes or generations older, more matured or less advanced than that used in each of the standard commodity FPGA IC chips 200 and DPIIC chips 410. Transistors or semiconductor devices used in the IAC chip 402 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and dedicated control chip 260 and IAC chip 402 may be different from that used in each of the standard commodity FPGA IC chips 200 and DPIIC chips 410; for example, packaged in the same logic drive 300, each of the dedicated I/O chips 265 and dedicated control chip 260 and IAC chip 402 may use the conventional MOSFET, while each of the standard commodity FPGA IC chips 200 and DPIIC chips 410 may use the FINFET; alternatively, packaged in the same logic drive 300, each of the dedicated I/O chips 265 and dedicated control chip 260 and IAC chip 402 may use the Fully Depleted Silicon-on-insulator (FDSOI) MOSFET, while each of the standard commodity FPGA IC chips 200 and DPIIC chips 410 may use the FINFET.

Since the IAC chip 402 in this aspect of disclosure may be designed and fabricated using older or less advanced technology nodes or generations, for example, less advanced than or equal to, or above or equal to 40 nm, 50 nm, 90 nm, 130 nm, 250 nm, 350 nm or 500 nm, its NRE cost is cheaper than or less than that of the current or conventional ASIC or COT chip designed and fabricated using an advanced IC technology node or generation, for example, more advanced than or below 30 nm, 20 nm or 10 nm. The NRE cost for designing a current or conventional ASIC or COT chip using an advanced IC technology node or generation, for example, more advanced than or below 30 nm, 20 nm or 10 nm, may be more than US $5 M, US $10 M, US $20 M or even exceeding US $50 M, or US $100 M. The cost of a photo mask set for an ASIC or COT chip at the 16 nm technology node or generation is over US $2 M, US $5 M, or US $10 M. Implementing the same or similar innovation or application using the third type of logic drive 300 including the IAC chip 402 designed and fabricated using older or less advanced technology nodes or generations, may reduce NRE cost down to less than US $10 M, US $7 M, US $5 M, US $3 M or US $1 M. Compared to the implementation by developing the current or conventional ASIC or COT chip, the NRE cost of developing the IAC chip 402 for the same or similar innovation or application used in the third type logic drive 300 may be reduced by a factor of larger than 2, 5, 10, 20, or 30.

For interconnection, referring to FIG. 11C, one or more of the programmable or fixed interconnects 361 or 364 of the inter-chip interconnects 371 may couple from each of the standard commodity FPGA IC chips 200 to the IAC chip 402. One or more of the programmable or fixed interconnects 361 or 364 of the inter-chip interconnects 371 may couple from each of the DPIIC chips 410 to the IAC chip 402. One or more of the programmable or fixed interconnects 361 or 364 of the inter-chip interconnects 371 may couple from the IAC chip 402 to all of the dedicated input/output (I/O) chips 265. One or more of the programmable or fixed interconnects 361 or 364 of the inter-chip interconnects 371 may couple from the IAC chip 402 to the dedicated control chip 260. One or more of the programmable or fixed interconnects 361 or 364 of the inter-chip interconnects 371 may couple from the IAC chip 402 to all of the NVMIC chips 250.

IV. Fourth Type of Logic Drive

Figure 11D:
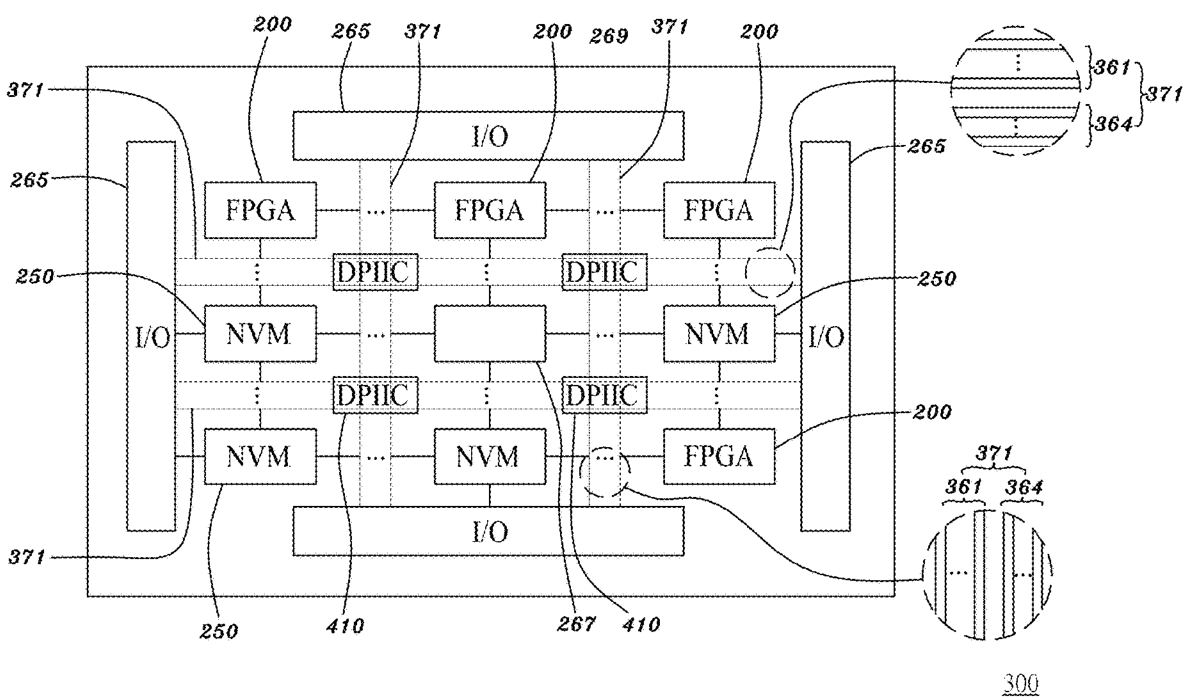

FIG. 11D is a schematically top view showing arrangement for various chips packaged in a fourth type of standard commodity logic drive in accordance with an embodiment of the present application. Referring to FIG. 11D, the functions of the dedicated control chip 260 and the IAC chip 402 as seen in FIG. 11C may be incorporated into a single chip 267, i.e., dedicated control and IAC (abbreviated as DCIAC below) chip. The structure shown in FIG. 11D is similar to that shown in FIG. 11A but the difference therebetween is that the DCIAC chip 267 may be further provided to be packaged in the logic drive 300. The dedicated control chip 260 as seen in FIG. 11A may be replaced with the DCIAC chip 267 to be packaged at the place where the dedicated control chip 260 is arranged. For an element indicated by the same reference number shown in FIGS. 11A and 11D, the specification of the element as seen in FIG. 11D and the process for forming the same may be referred to that of the element as illustrated in FIG. 11A and the process for forming the same. The DCIAC chip 267 now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc.

Referring to FIG. 11D, each of the dedicated I/O chips 265 and DCIAC chip 267 is designed, implemented and fabricated using varieties of semiconductor technology nodes or generations, including old or matured technology nodes or generations, for example, less advanced than or equal to, or above or equal to 40 nm, 50 nm, 90 nm, 130 nm, 250 nm, 350 nm or 500 nm. Alternatively, the advanced semiconductor technology nodes or generations, such as more advanced than or equal to, or below or equal to 40 nm, 20 nm or 10 nm, may be used for the DCIAC chip 267. Packaged in the same logic drive 300, the semiconductor technology node or generation used in each of the dedicated I/O chips 265 and DCIAC chip 267 is 1, 2, 3, 4, 5 or greater than 5 nodes or generations older, more matured or less advanced than that used in each of the standard commodity FPGA IC chips 200 and DPIIC chips 410. Transistors or semiconductor devices used in the DCIAC chip 267 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in each of the dedicated I/O chips 265 and DCIAC chip 267 may be different from that used in each of the standard commodity FPGA IC chips 200 and DPIIC chips 410; for example, packaged in the same logic drive 300, each of the dedicated I/O chips 265 and DCIAC chip 267 may use the conventional MOSFET, while each of the standard commodity FPGA IC chips 200 and DPIIC chips 410 may use the FINFET; alternatively, packaged in the same logic drive 300, each of the dedicated I/O chips 265 and DCIAC chip 267 may use the Fully Depleted Silicon-on-insulator (FDSOI) MOSFET, while one of the standard commodity FPGA IC chips 200 and DPIIC chips 410 may use the FINFET.

Since the DCIAC chip 267 in this aspect of disclosure may be designed and fabricated using older or less advanced technology nodes or generations, for example, less advanced than or equal to, or above or equal to 40 nm, 50 nm, 90 nm, 130 nm, 250 nm, 350 nm or 500 nm, its NRE cost is cheaper than or less than that of the current or conventional ASIC or COT chip designed and fabricated using an advanced IC technology node or generation, for example, more advanced than or below 30 nm, 20 nm or 10 nm. The NRE cost for designing a current or conventional ASIC or COT chip using an advanced IC technology node or generation, for example, more advanced than or below 30 nm, 20 nm or 10 nm, may be more than US $5 M, US $10 M, US $20 M or even exceeding US $50 M, or US $100 M. The cost of a photo mask set for an ASIC or COT chip at the 16 nm technology node or generation is over US $2 M, US $5 M or US $10 M. Implementing the same or similar innovation or application using the fourth type of logic drive 300 including the DCIAC chip 267 designed and fabricated using older or less advanced technology nodes or generations may reduce NRE cost down to less than US $10 M, US $7 M, US $5 M, US $3 M or US $1 M. Compared to the implementation by developing a current or conventional ASIC or COT chip, the NRE cost of developing the DCIAC chip 267 for the same or similar innovation or application used in the fourth type logic drive 300 may be reduced by a factor of larger than 2, 5, 10, 20 or 30.

For interconnection, referring to FIG. 11D, one or more of the programmable or fixed interconnects 361 or 364 of the inter-chip interconnects 371 may couple from each of the standard commodity FPGA IC chips 200 to the DCIAC chip 267. One or more of the programmable or fixed interconnects 361 or 364 of the inter-chip interconnects 371 may couple from each of the DPIIC chips 410 to the DCIAC chip 267. One or more of the programmable or fixed interconnects 361 or 364 of the inter-chip interconnects 371 may couple from the DCIAC chip 267 to all of the dedicated input/output (I/O) chips 265. One or more of the programmable or fixed interconnects 361 or 364 of the inter-chip interconnects 371 may couple from the DCIAC chip 267 to all of the NVMIC chips 250.

V. Fifth Type of Logic Drive

Figure 11E:
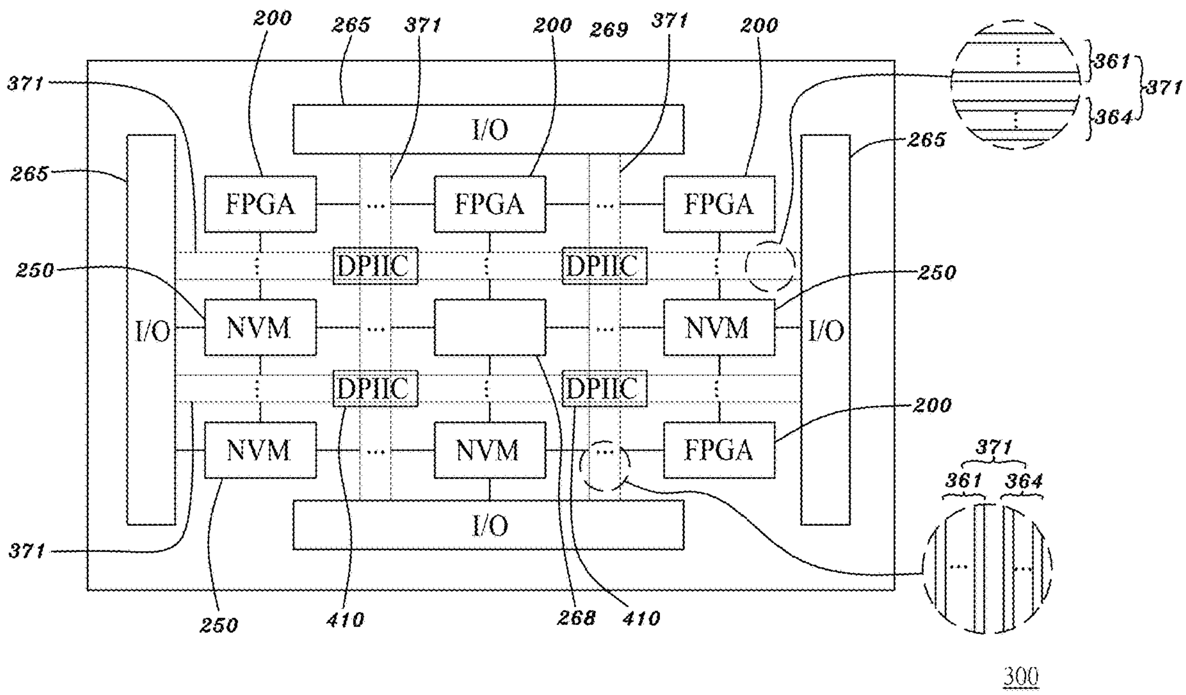

FIG. 11E is a schematically top view showing arrangement for various chips packaged in a fifth type of standard commodity logic drive in accordance with an embodiment of the present application. Referring to FIG. 11E, the functions of the dedicated control chip 260, dedicated I/O chips 265 and IAC chip 402 as seen in FIG. 11C may be incorporated into a single chip 268, i.e., dedicated control, dedicated I/O, and IAC (abbreviated as DCDI/OIAC below) chip. The structure shown in FIG. 11E is similar to that shown in FIG. 11A but the difference therebetween is that the DCDI/OIAC chip 268 may be further provided to be packaged in the logic drive 300. The dedicated control chip 260 as seen in FIG. 11A may be replaced with the DCDI/OIAC chip 268 to be packaged at the place where the dedicated control chip 260 is arranged. For an element indicated by the same reference number shown in FIGS. 11A and 11E, the specification of the element as seen in FIG. 11E and the process for forming the same may be referred to that of the element as illustrated in FIG. 11A and the process for forming the same. The DCDI/OIAC chip 268 may include the architecture as seen in FIG. 10. Further, the DCDI/OIAC chip 268 now comprises the control circuits, Intellectual Property (IP) circuits, Application Specific (AS) circuits, analog circuits, mixed-mode signal circuits, Radio-Frequency (RF) circuits, and/or transmitter, receiver, transceiver circuits, and etc.

Referring to FIG. 11E, the DCDI/OIAC chip 268 is designed, implemented and fabricated using varieties of semiconductor technology nodes or generations, including old or matured technology nodes or generations, for example, less advanced than or equal to, or above or equal to 30 nm, 40 nm, 50 nm, 90 nm, 130 nm, 250 nm, 350 nm, 500 nm. Alternatively, the advanced semiconductor technology nodes or generations, such as more advanced than or equal to, or below or equal to 40 nm, 20 nm or 10 nm, may be used for the DCDI/OIAC chip 268. Packaged in the same logic drive 300, the semiconductor technology node or generation used in the DCDI/OIAC chip 268 is 1, 2, 3, 4, 5 or greater than 5 nodes or generations older, more matured or less advanced than that used in each of the standard commodity FPGA IC chips 200 and DPIIC chips 410. Transistors or semiconductor devices used in the DCDI/OIAC chip 268 may be a FINFET, a FINFET on Silicon-On-Insulator (FINFET SOI), a Fully Depleted Silicon-on-insulator (FDSOI) MOSFET, a Partially Depleted Silicon-on-insulator (PDSOI) MOSFET or a conventional MOSFET. Packaged in the same logic drive 300, transistors or semiconductor devices used in the DCDI/OIAC chip 268 may be different from that used in each of the standard commodity FPGA IC chips 200 and DPIIC chips 410; for example, packaged in the same logic drive 300, the DCDI/OIAC chip 268 may use the conventional MOSFET, while each of the standard commodity FPGA IC chips 200 and DPIIC chips 410 may use the FINFET; alternatively, packaged in the same logic drive 300, the DCDI/OIAC chip 268 may use the Fully Depleted Silicon-on-insulator (FDSOI) MOSFET, while each of the standard commodity FPGA IC chips 200 and DPIIC chips 410 may use the FINFET.

Since the DCDI/OIAC chip 268 in this aspect of disclosure may be designed and fabricated using older or less advanced technology nodes or generations, for example, less advanced than or equal to, or above or equal to 40 nm, 50 nm, 90 nm, 130 nm, 250 nm, 350 nm or 500 nm, its NRE cost is cheaper than or less than that of the current or conventional ASIC or COT chip designed and fabricated using an advanced IC technology node or generation, for example, a technology node or generation more advanced than or below 30 nm, 20 nm or 10 nm. The NRE cost for designing an current or conventional ASIC or COT chip using an advanced IC technology node or generation, for example, a technology node or generation more advanced than or below 30 nm, 20 nm or 10 nm, may be more than US $5 M, US $10 M, US $20 M or even exceeding US $50 M, or US $100 M. The cost of a photo mask set for an ASIC or COT chip at the 16 nm technology node or generation is over US $2 M, US $5 M or US $10 M. Implementing the same or similar innovation or application using the fifth type of logic drive 300 including the DCDI/OIAC chip 268 designed and fabricated using older or less advanced technology nodes or generations, may reduce NRE cost down to less than US $10 M, US $7 M, US $5 M, US $3 M or US $1 M. Compared to the implementation by developing a current or conventional ASIC or COT chip, the NRE cost of developing the DCDI/OIAC chip 268 for the same or similar innovation or application used in the fifth type logic drive 300 may be reduced by a factor of larger than 2, 5, 10, 20 or 30.

For interconnection, referring to FIG. 11E, one or more of the programmable or fixed interconnects 361 or 364 of the inter-chip interconnects 371 may couple from each of the standard commodity FPGA IC chips 200 to the DCDI/OIAC chip 268. One or more of the programmable or fixed interconnects 361 or 364 of the inter-chip interconnects 371 may couple from each of the DPIIC chips 410 to the DCDI/OIAC chip 268. One or more of the programmable or fixed interconnects 361 or 364 of the inter-chip interconnects 371 may couple from the DCDI/OIAC chip 268 to all of the dedicated input/output (I/O) chips 265. One or more of the programmable or fixed interconnects 361 or 364 of the inter-chip interconnects 371 may couple from the DCDI/OIAC chip 268 to all of the NVMIC chips 250.

VI. Sixth Type of Logic Drive

Figure 11F:
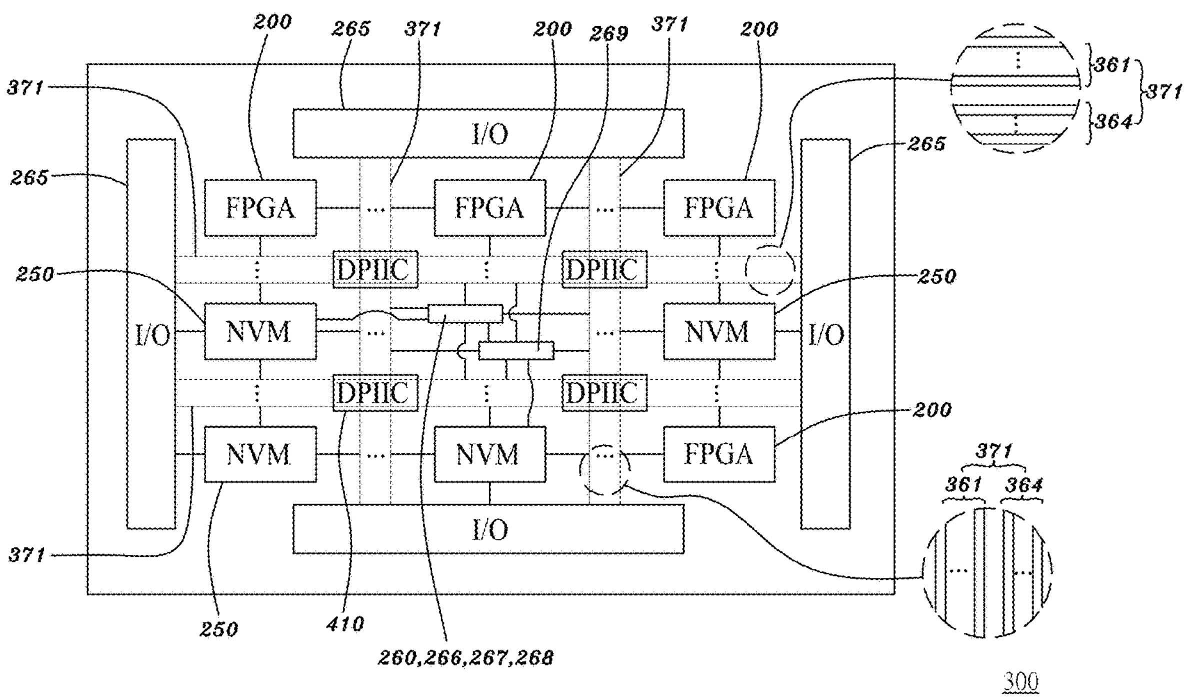
Figure 11G:
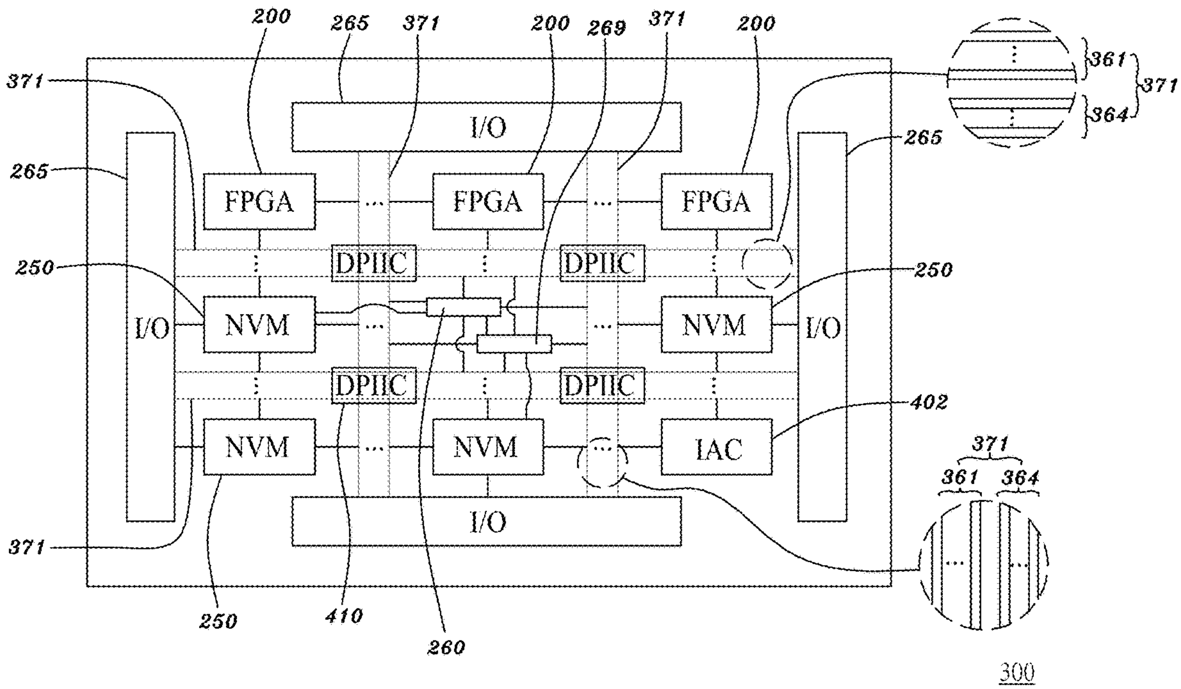

FIGS. 11F and 11G are schematically top views showing arrangement for various chips packaged in a sixth type of standard commodity logic drive in accordance with an embodiment of the present application. Referring to FIGS. 11F and 11G, the logic drive 300 as illustrated in FIGS. 11A-11E may further include a processing and/or computing (PC) IC chip 269, such as central processing unit (CPU) chip, graphic processing unit (GPU) chip, digital signal processing (DSP) chip, tensor processing unit (TPU) chip or application processing unit (APU) chip. The APU chip may be (1) a combination of CPU and DSP unit operating with each other, (2) a combination of CPU and GPU operating with each other, (3) a combination of GPU and DSP unit operating with each other or (4) a combination of CPU, GPU and DSP unit operating with one another. The structure shown in FIG. 11F is similar to those shown in FIGS. 11A, 11B, 11D and 11E but the difference therebetween is that the PCIC chip 269 may be further provided to be packaged in the logic drive 300 and close to the dedicated control chip 260 for the scheme in FIG. 11A, the dedicated control and I/O chip 266 for the scheme in FIG. 11B, the DCIAC chip 267 for the scheme in FIG. 11D or the DCDI/OIAC chip 268 for the scheme in FIG. 11E. The structure shown in FIG. 11G is similar to that shown in FIG. 11C but the difference therebetween is that the PCIC chip 269 may be further provided to be packaged in the logic drive 300 and close to the dedicated control chip 260. For an element indicated by the same reference number shown in FIGS. 11A, 11B, 11D, 11E and 11F, the specification of the element as seen in FIG. 11F and the process for forming the same may be referred to that of the element as illustrated in FIGS. 11A, 11B, 11D and 11E and the process for forming the same. For an element indicated by the same reference number shown in FIGS. 11A, 11C and 11G, the specification of the element as seen in FIG. 11G and the process for forming the same may be referred to that of the element as illustrated in FIGS. 11A and 11C and the process for forming the same.

Referring to FIGS. 11F and 11G, in a center region between neighboring two of the vertical bundles of inter-chip interconnects 371 and between neighboring two of the horizontal bundles of inter-chip interconnects 371 may be arranged the PCIC chip 269 and one of the dedicated control chip 260, dedicated control and I/O chip 266, DCIAC chip 267 and DCDI/OIAC chip 268. For interconnection, referring to FIGS. 11F and 11G, one or more of the programmable or fixed interconnects 361 or 364 of the inter-chip interconnects 371 may couple from each of the standard commodity FPGA IC chips 200 to the PCIC chip 269. One or more of the programmable or fixed interconnects 361 or 364 of the inter-chip interconnects 371 may couple from each of the DPIIC chips 410 to the PCIC chip 269. One or more of the programmable or fixed interconnects 361 or 364 of the inter-chip interconnects 371 may couple from the PCIC chip 269 to all of the dedicated input/output (I/O) chips 265. One or more of the programmable or fixed interconnects 361 or 364 of the inter-chip interconnects 371 may couple from the PCIC chip 269 to the dedicated control chip 260, dedicated control and I/O chip 266, DCIAC chip 267 or DCDI/OIAC chip 268. One or more of the programmable or fixed interconnects 361 or 364 of the inter-chip interconnects 371 may couple from the PCIC chip 269 to all of the NVMIC chips 250. One or more of the programmable or fixed interconnects 361 or 364 of the inter-chip interconnects 371 may couple from the PCIC chip 269 to the IAC chip 402 as seen in FIG. 11G. The PCIC chip 269 is designed, implemented and fabricated using an advanced semiconductor technology node or generation, for example more advanced than or equal to, or below or equal to 30 nm, 20 nm or 10 nm, which may be the same as, one generation or node less advanced than or one generation or node more advanced than that used for each of the standard commodity FPGA IC chips 200 and DPIIC chips 410. Transistors or semiconductor devices used in the PCIC chip 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

VII. Seventh Type of Logic Drive

Figure 11H:
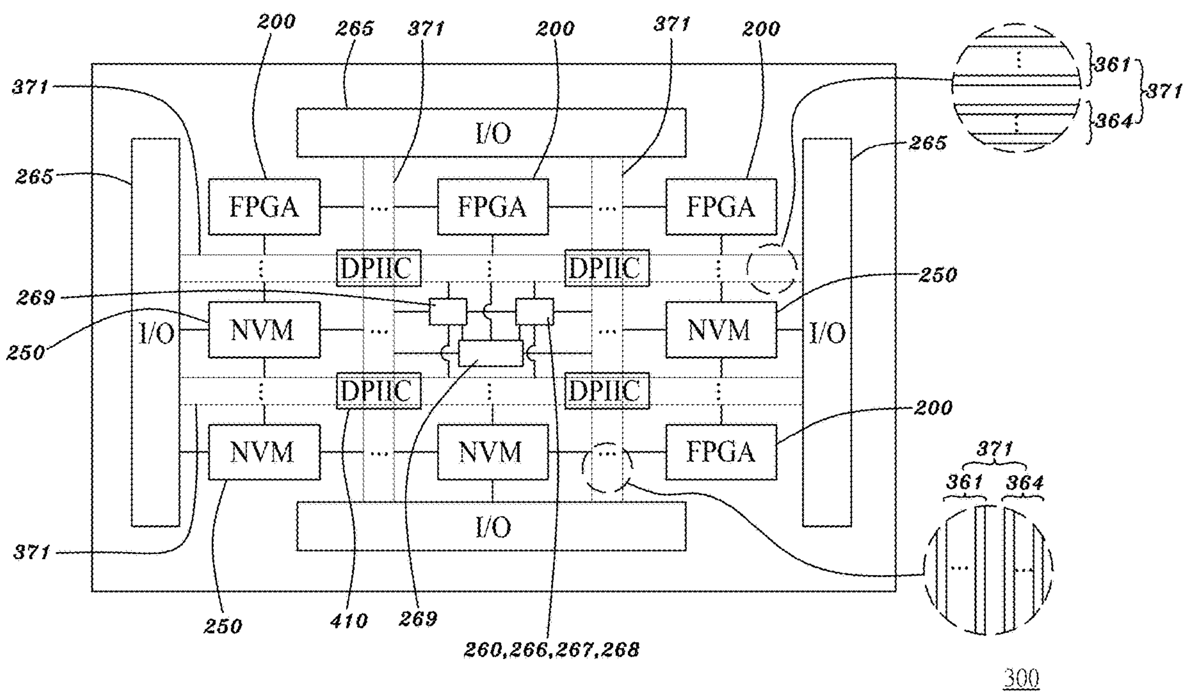
Figure 11I:
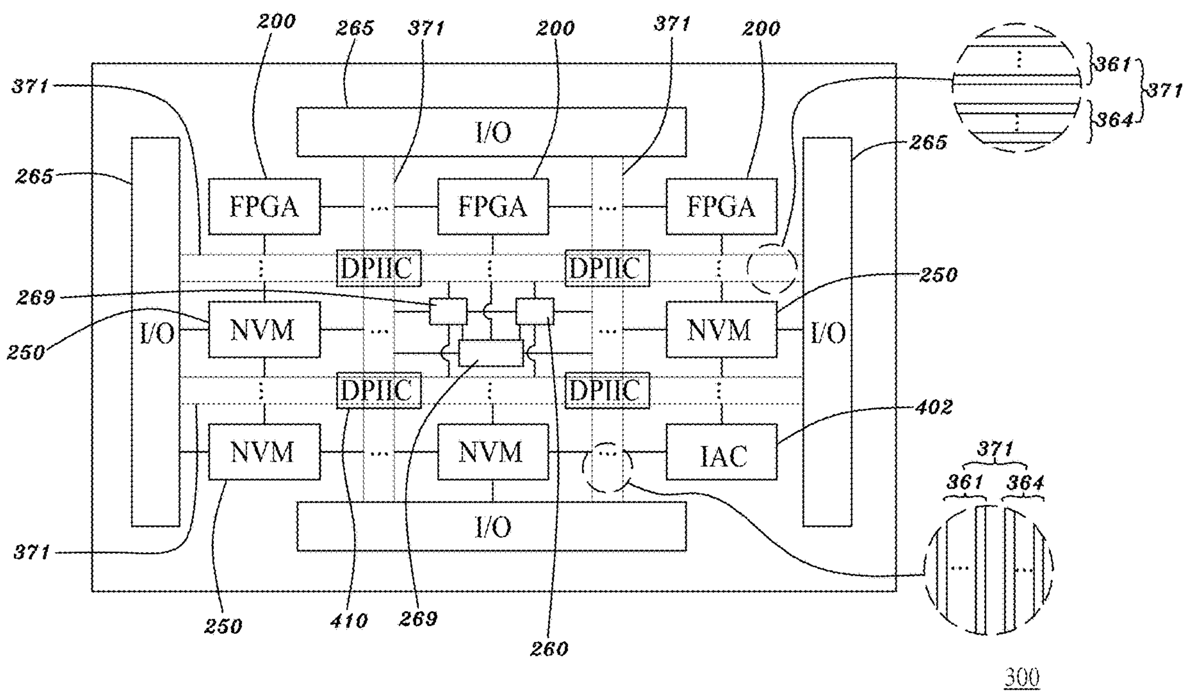

FIGS. 11H and 11I are schematically top views showing arrangement for various chips packaged in a seventh type of standard commodity logic drive in accordance with an embodiment of the present application. Referring to FIGS. 11H and 11I, the logic drive 300 as illustrated in FIGS. 11A-11E may further include two PCIC chips 269, a combination of which may be two selected from a central processing unit (CPU) chip, graphic processing unit (GPU) chip, digital signal processing (DSP) chip and tensor processing unit (TPU) chip. For example, (1) one of the two PCIC chips 269 may be a central processing unit (CPU) chip, and the other one of the two PCIC chips 269 may be a graphic processing unit (GPU) chip; (2) one of the two PCIC chips 269 may be a central processing unit (CPU) chip, and the other one of the two PCIC chips 269 may be a digital signal processing (DSP) chip; (3) one of the two PCIC chips 269 may be a central processing unit (CPU) chip, and the other one of the two PCIC chips 269 may be a tensor processing unit (TPU) chip; (4) one of the two PCIC chips 269 may be a graphic processing unit (GPU) chip, and the other one of the two PCIC chips 269 may be a digital signal processing (DSP) chip; (5) one of the two PCIC chips 269 may be a graphic processing unit (GPU) chip, and the other one of the two PCIC chips 269 may be a tensor processing unit (TPU) chip; (6) one of the two PCIC chips 269 may be a digital signal processing (DSP) chip, and the other one of the two PCIC chips 269 may be a tensor processing unit (TPU) chip. The structure shown in FIG.

11H is similar to those shown in FIGS. 11A, 11B, 11D and 11E but the difference therebetween is that the two PCIC chips 269 may be further provided to be packaged in the logic drive 300 and close to the dedicated control chip 260 for the scheme in FIG. 11A, the dedicated control and I/O chip 266 for the scheme in FIG. 11B, the DCIAC chip 267 for the scheme in FIG. 11D or the DCDI/OIAC chip 268 for the scheme in FIG. 11E. The structure shown in FIG. 11I is similar to that shown in FIG. 11C but the difference therebetween is that the two PCIC chips 269 may be further provided to be packaged in the logic drive 300 and close to the dedicated control chip 260. For an element indicated by the same reference number shown in FIGS. 11A, 11B, 11D, 11E and 11H, the specification of the element as seen in FIG. 11H and the process for forming the same may be referred to that of the element as illustrated in FIGS. 11A, 11B, 11D and 11E and the process for forming the same. For an element indicated by the same reference number shown in FIGS. 11A, 11C and 11I, the specification of the element as seen in FIG. 11I and the process for forming the same may be referred to that of the element as illustrated in FIGS. 11A and 11C and the process for forming the same.

Referring to FIGS. 11H and 11I, in a center region between neighboring two of the vertical bundles of inter-chip interconnects 371 and between neighboring two of the horizontal bundles of inter-chip interconnects 371 may be arranged the two PCIC chips 269 and one of the dedicated control chip 260, dedicated control and I/O chip 266, DCIAC chip 267 and DCDI/OIAC chip 268. For interconnection, referring to FIGS. 11H and 11I, one or more of the programmable or fixed interconnects 361 or 364 of the inter-chip interconnects 371 may couple from each of the standard commodity FPGA IC chips 200 to both of the PCIC chips 269. One or more of the programmable or fixed interconnects 361 or 364 of the inter-chip interconnects 371 may couple from each of the DPIIC chips 410 to both of the PCIC chip 269. One or more of the programmable or fixed interconnects 361 or 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from each of the PCIC chips 269 to the dedicated control chip 260, dedicated control and I/O chip 266, DCIAC chip 267 or DCDI/OIAC chip 268. One of the programmable or fixed interconnects 361 or 364 of the inter-chip interconnects 371 may couple from each of the PCIC chips 269 to all of the NVMIC chips 250. One or more of the programmable or fixed interconnects 361 or 364 of the inter-chip interconnects 371 may couple from each of the PCIC chips 269 to the other of the PCIC chips 269. One or more of the programmable or fixed interconnects 361 or 364 of the inter-chip interconnects 371 may couple from each of the PCIC chip 269 to the IAC chip 402 as seen in FIG. 11G. Each of the PCIC chips 269 is designed, implemented and fabricated using an advanced semiconductor technology node or generation, for example more advanced than or equal to, or below or equal to 30 nm, 20 nm or 10 nm, which may be the same as, one generation or node less advanced than or one generation or node more advanced than that used for each of the standard commodity FPGA IC chips 200 and DPIIC chips 410. Transistors or semiconductor devices used in each of the PCIC chips 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

VIII. Eighth Type of Logic Drive

Figure 11J:
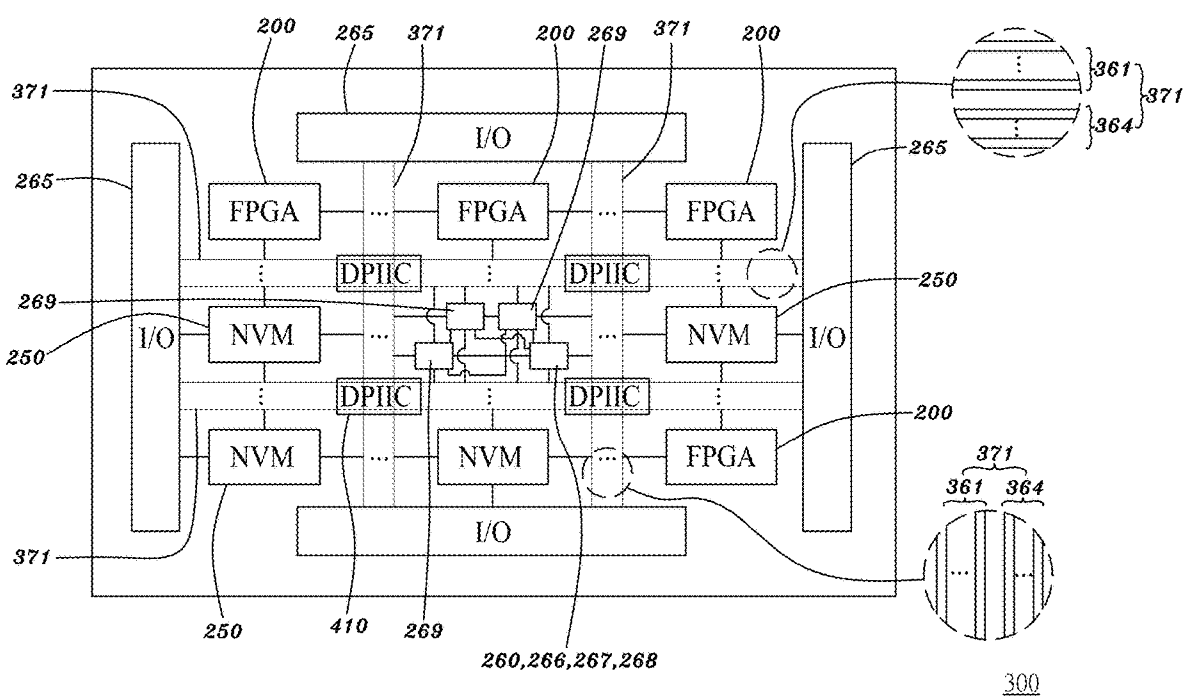
Figure 11K:
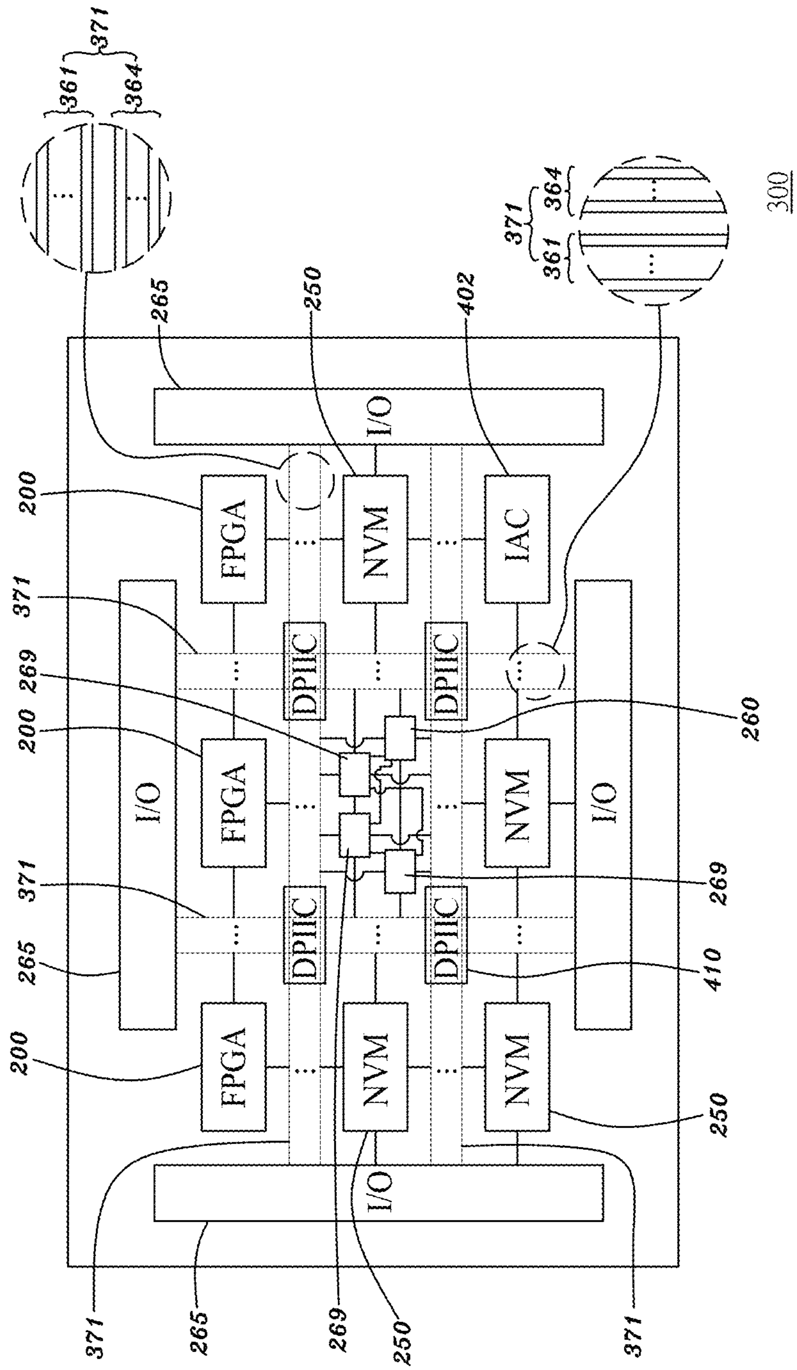

FIGS. 11J and 11K are schematically top views showing arrangement for various chips packaged in an eighth type of standard commodity logic drive in accordance with an embodiment of the present application. Referring to FIGS. 11J and 11K, the logic drive 300 as illustrated in FIGS. 11A-11E may further include three PCIC chips 269, a combination of which may be three selected from a central processing unit (CPU) chip, graphic processing unit (GPU) chip, digital signal processing (DSP) chip or tensor processing unit (TPU) chip. For example, (1) one of the three PCIC chips 269 may be a central processing unit (CPU) chip, another one of the three PCIC chips 269 may be a graphic processing unit (GPU) chip, the other one of the three PCIC chips 269 may be a digital signal processing (DSP) chip; (2) one of the three PCIC chips 269 may be a central processing unit (CPU) chip, another one of the three PCIC chips 269 may be a graphic processing unit (GPU) chip, the other one of the three PCIC chips 269 may be a tensor processing unit (TPU) chip; (3) one of the three PCIC chips 269 may be a central processing unit (CPU) chip, another one of the three PCIC chips 269 may be a digital signal processing (DSP) chip, the other one of the three PCIC chips 269 may be a tensor processing unit (TPU) chip; (4) one of the three PCIC chips 269 may be a graphic processing unit (GPU) chip, another one of the three PCIC chips 269 may be a digital signal processing (DSP) chip, the other one of the three PCIC chips 269 may be a tensor processing unit (TPU) chip. The structure shown in FIG. 11J is similar to those shown in FIGS. 11A, 11B, 11D and 11E but the difference therebetween is that the three PCIC chips 269 may be further provided to be packaged in the logic drive 300 and close to the dedicated control chip 260 for the scheme in FIG. 16A, the dedicated control and I/O chip 266 for the scheme in FIG. 11B, the DCIAC chip 267 for the scheme in FIG. 11D or the DCDI/OIAC chip 268 for the scheme in FIG. 11E. The structure shown in FIG. 11K is similar to that shown in FIG. 11C but the difference therebetween is that the three PCIC chips 269 may be further provided to be packaged in the logic drive 300 and close to the dedicated control chip 260. For an element indicated by the same reference number shown in FIGS. 11A, 11B, 11D, 11E and 11J, the specification of the element as seen in FIG. 11J and the process for forming the same may be referred to that of the element as illustrated in FIGS. 11A, 11B, 11D and 11E and the process for forming the same. For an element indicated by the same reference number shown in FIGS. 11A, 11C and 11K, the specification of the element as seen in FIG. 11K and the process for forming the same may be referred to that of the element as illustrated in FIGS. 11A and 11C and the process for forming the same.

Referring to FIGS. 11J and 11K, in a center region between neighboring two of the vertical bundles of inter-chip interconnects 371 and between neighboring two of the horizontal bundles of inter-chip interconnects 371 may be arranged the three PCIC chips 269 and one of the dedicated control chip 260, dedicated control and I/O chip 266, DCIAC chip 267 and DCDI/OIAC chip 268. For interconnection, referring to FIGS. 11J and 11K, one or more of the programmable or fixed interconnects 361 or 364 of the inter-chip interconnects 371 may couple from each of the standard commodity FPGA IC chips 200 to all of the PCIC chips 269. One or more of the programmable or fixed interconnects 361 or 364 of the inter-chip interconnects 371 may couple from each of the DPIIC chips 410 to all of the PCIC chips 269. One or more of the programmable or fixed interconnects 361 or 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from each of the PCIC chips 269 to the dedicated control chip 260, dedicated control and I/O chip 266, DCIAC chip 267 or DCDI/OIAC chip 268. One or more of the programmable or fixed interconnects 361 or 364 of the inter-chip interconnects 371 may couple from each of the PCIC chips 269 to all of the NVMIC chips 250. One or more of the programmable or fixed interconnects 361 or 364 of the inter-chip interconnects 371 may couple from each of the PCIC chips 269 to the other two of the PCIC chips 269. One or more of the programmable or fixed interconnects 364 of the inter-chip interconnects 371 may couple from each of the PCIC chip 269 to the IAC chip 402 as seen in FIG. 11G. Each of the PCIC chips 269 is designed, implemented and fabricated using an advanced semiconductor technology node or generation, for example more advanced than or equal to, or below or equal to 30 nm, 20 nm or 10 nm, which may be the same as, one generation or node less advanced than or one generation or node more advanced than that used for each of the standard commodity FPGA IC chips 200 and DPIIC chips 410. Transistors or semiconductor devices used in each of the PCIC chips 269 may be a FIN Field-Effect-Transistor (FINFET), a FINFET on Silicon-On-Insulator (FINFET SOI), a Fully Depleted Silicon-On-Insulator (FDSOI) MOSFET, a Partially Depleted Silicon-On-Insulator (PDSOI) MOSFET or a conventional MOSFET.

IX. Ninth Type of Logic Drive

Figure 11L:
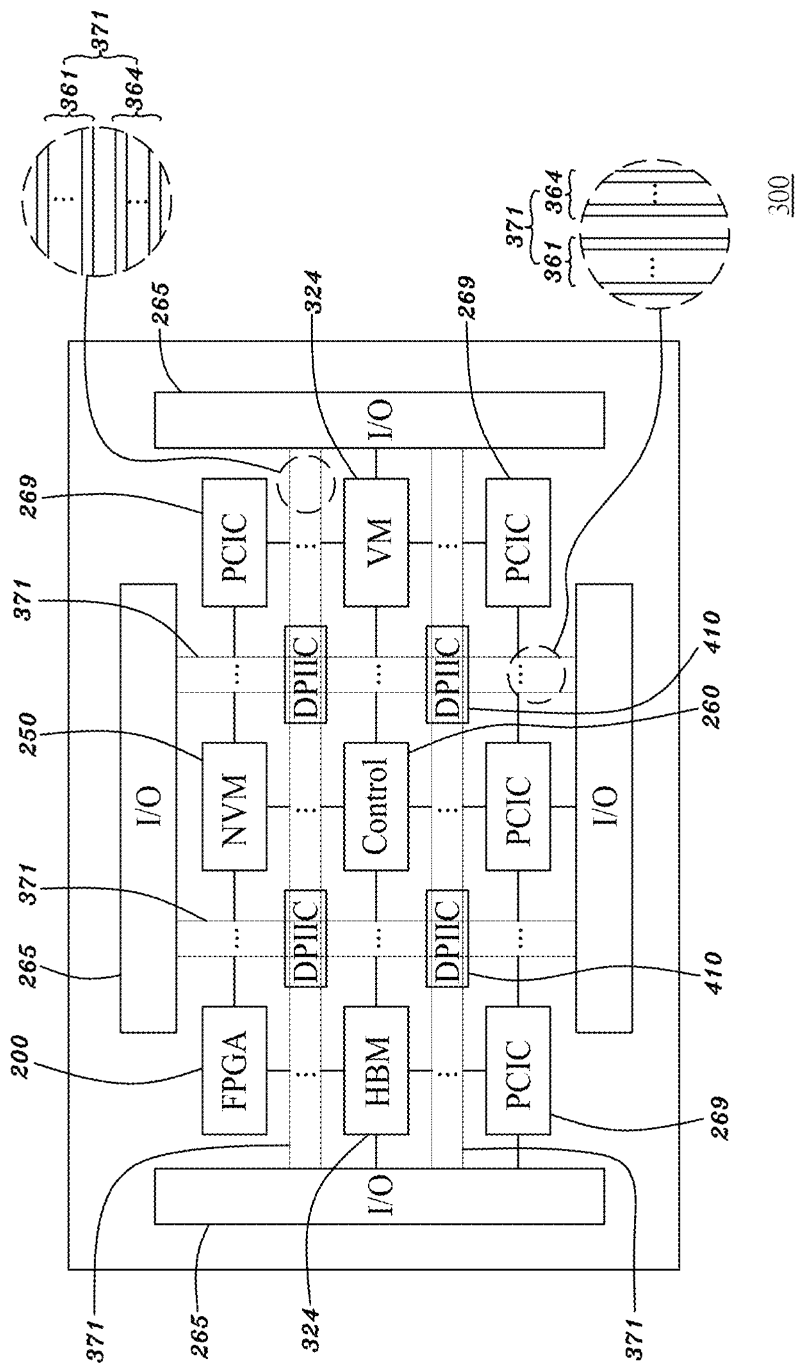

FIG. 11L is a schematically top view showing arrangement for various chips packaged in a ninth type of standard commodity logic drive in accordance with an embodiment of the present application. For an element indicated by the same reference number shown in FIGS. 11A-11L, the specification of the element as seen in FIG. 11L and the process for forming the same may be referred to that of the element as illustrated in FIGS. 11A-11K and the process for forming the same. Referring to FIG. 11L, a ninth type of standard commodity logic drive 300 may be packaged with one or more processing and/or computing (PC) integrated circuit (IC) chips 269, one or more standard commodity FPGA IC chips 200 as illustrated in FIGS. 8A-8J, one or more non-volatile memory (NVM) IC chips 250, one or more volatile memory (VM) integrated circuit (IC) chips 324, one or more high speed, high bandwidth memory (HBM) IC chips 251 and a dedicated control chip 260, which are arranged in an array, wherein the dedicated control chip 260 may be arranged in a center region surrounded by the PCIC chips 269, standard commodity FPGA IC chips 200, NVMIC chips 250 and VMIC chips 324. The combination for the PCIC chips 269 may comprise: (1) multiple GPU chips, for example 2, 3, 4 or more than 4 GPU chips, (2) one or more CPU chips and/or one or more GPU chips, (3) one or more CPU chips and/or one or more DSP chips, (4) one or more CPU chips, one or more GPU chips and/or one or more DSP chips, (5) one or more CPU chips and/or one or more TPU chips, or, (6) one or more CPU chips, one or more DSP chips and/or one or more TPU chips. Each of the HBM IC chips 251 may be a high speed, high bandwidth DRAM chip, high speed, high bandwidth cache SRAM chip, magnetoresistive random-access-memory (MRAM) chip or resistive random-access-memory (RRAM) chip. The PCIC chips 269 and standard commodity FPGA IC chips 200 may operate with the HBM IC chips 251 for high speed, high bandwidth parallel processing and/or parallel computing.

Referring to FIG. 11L, the logic drive 300 may include the inter-chip interconnects 371 each extending over spaces between neighboring two of the standard commodity FPGA IC chip 200, NVMIC chip 250, VMIC chip 324, dedicated control chip 260, PCIC chips 269 and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chip 200, NVMIC chip 250, VMIC chip 324, dedicated control chip 260, PCIC chips 269 and HBMIC chips 251 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 11L, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to all of the NVMIC chips 250. One or more of the programmable or fixed interconnects 361 or 364 of the inter-chip interconnects 371 may couple from each of the standard commodity FPGA IC chips 200 to all of the PCIC chips 269. One or more of the programmable or fixed interconnects 361 or 364 of the inter-chip interconnects 371 may couple from each of the standard commodity FPGA IC chips 200 to all of the HBMIC chips 251. One or more of the programmable or fixed interconnects 361 or 364 of the inter-chip interconnects 371 may couple from each of the DPIIC chips 410 to the dedicated control chip 260. One or more of the programmable or fixed interconnects 361 or 364 of the inter-chip interconnects 371 may couple from each of the DPIIC chips 410 to all of the NVMIC chips 250. One or more of the programmable or fixed interconnects 361 or 364 of the inter-chip interconnects 371 may couple from each of the DPIIC chips 410 to all of the PCIC chips 269. One or more of the programmable or fixed interconnects 361 or 364 of the inter-chip interconnects 371 may couple from each of the DPIIC chips 410 to all of the HBMIC chips 251. One or more of the programmable or fixed interconnects 361 or 364 of the inter-chip interconnects 371 may couple from one of the PCIC chips 269 to one of the HBMIC chips 251 and the communication between said one of the PCIC chips 269 and said one of the HBM IC chips 251 may have a data bit width of equal to or greater than 64, 128, 256, 512, 1024, 2048, 4096, 8 K, or 16 K. One or more of the programmable or fixed interconnects 361 or 364 of the inter-chip interconnects 371 may couple from each of the NVMIC chips 250 to the dedicated control chip 260. One or more of the programmable or fixed interconnects 361 or 364 of the inter-chip interconnects 371 may couple from each of the HBMIC chips 251 to the dedicated control chip 260. One or more of the programmable or fixed interconnects 361 or 364 of the inter-chip interconnects 371 may couple from each of the PCIC chips 269 to the dedicated control chip 260. One or more of the programmable or fixed interconnects 361 or 364 of the inter-chip interconnects 371 may couple from each of the PCIC chips 269 to all the others of the PCIC chips 269.

Referring to FIG. 11L, the logic drive 300 may include multiple dedicated input/output (I/O) chips 265 in a peripheral region thereof surrounding a central region thereof having the standard commodity FPGA IC chips 200, NVMIC chips 250, dedicated control chip 260, PCIC chips 269, HBMIC chips 251 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVMIC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the PCIC chips 269 to all of the dedicated input/output (I/O) chips 265. One or more of the programmable or fixed interconnects 361 or 364 of the inter-chip interconnects 371 may couple from each of the HBMIC chips 251 to all of the dedicated input/output (I/O) chips 265.

Referring to FIG. 11L, each of the standard commodity FPGA IC chips 200 may be referred to one as illustrated in FIGS. 8A-8J, and each of the DPIIC chips 410 may be referred to one as illustrated in FIG. 9. The specification of the commodity standard FPGA IC chips 200, DPIIC chips 410, dedicated I/O chips 265, NVMIC chips 250, dedicated control chip 260 may be referred to that as illustrated in FIG. 11A.

For example, referring to FIG. 11L, all of the PCIC chips 269 in the logic drive 300 may be GPU chips, for example 2, 3, 4 or more than 4 GPU chips and each of the HBM IC chips 251 in the logic drive 300 may be a high speed, high bandwidth DRAM chip, high speed, high bandwidth cache SRAM chip, magnetoresistive random-access-memory (MRAM) chip or resistive random-access-memory (RRAM) chip. The communication between one of the PCIC chips 269, i.e., GPU chips, and one of the HBM IC chips 251 may have a data bit width of equal to or greater than 64, 128, 256, 512, 1024, 2048, 4096, 8 K, or 16 K.

For example, referring to FIG. 11L, all of the PCIC chips 269 in the logic drive 300 may be TPU chips, for example 2, 3, 4 or more than 4 TPU chips and each of the HBM IC chips 251 in the logic drive 300 may be a high speed, high bandwidth DRAM chip, high speed, high bandwidth cache SRAM chip, magnetoresistive random-access-memory (MRAM) chip or resistive random-access-memory (RRAM) chip. The communication between one of the PCIC chips 269, i.e., TPU chips, and one of the HBM IC chips 251 may have a data bit width of equal to or greater than 64, 128, 256, 512, 1024, 2048, 4096, 8 K, or 16 K.

X. Tenth Type of Logic Drive

Figure 11M:
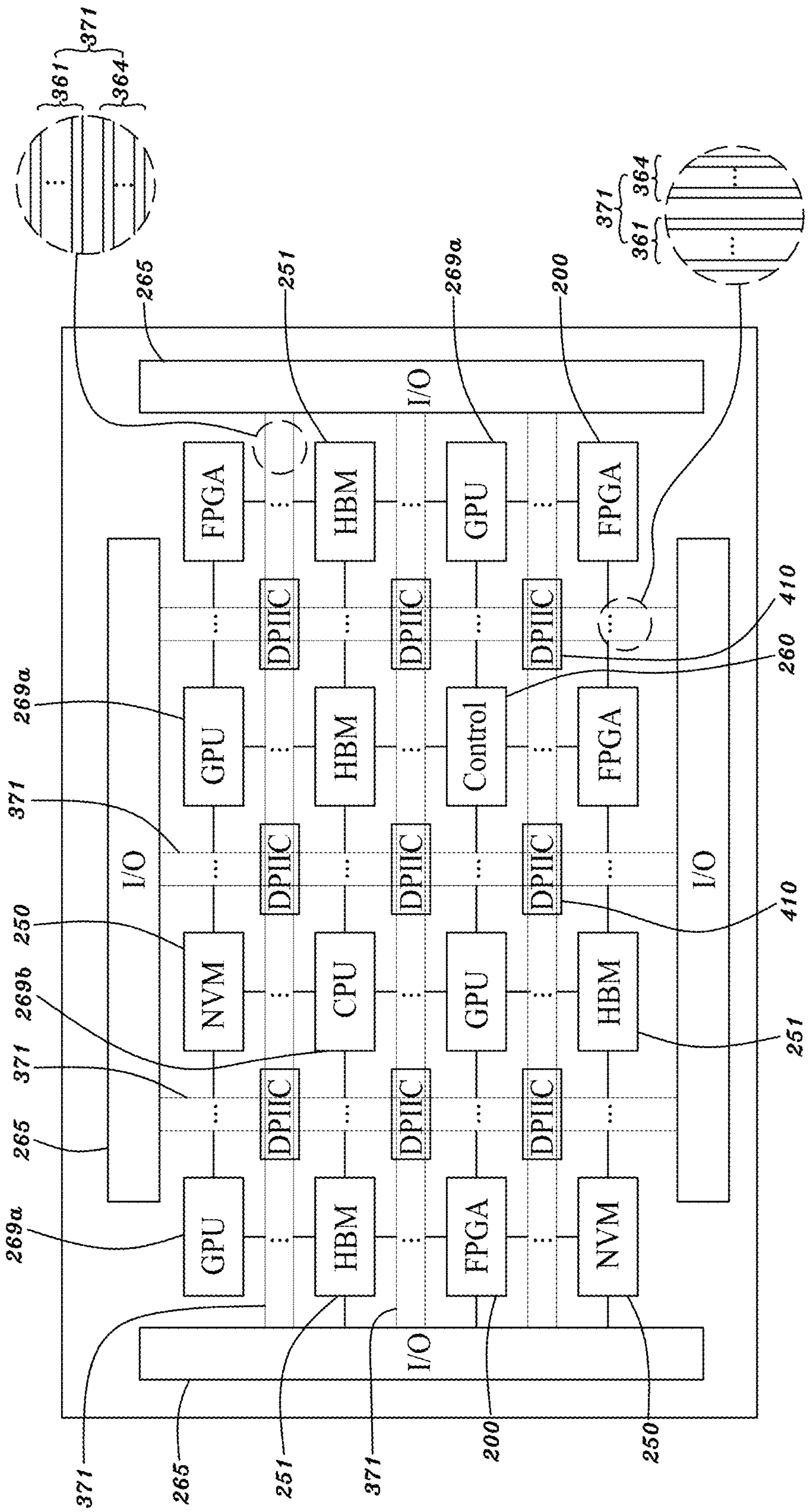

FIG. 11M is a schematically top view showing arrangement for various chips packaged in a tenth type of standard commodity logic drive in accordance with an embodiment of the present application. For an element indicated by the same reference number shown in FIGS. 11A-11M, the specification of the element as seen in FIG. 11M and the process for forming the same may be referred to that of the element as illustrated in FIGS. 11A-11L and the process for forming the same. Referring to FIG. 11M, the logic drive 300 may be packaged with multiple GPU chips 269*a* and a CPU chip 269*b* for the PCIC chips 269 as above mentioned. Further, the logic drive 300 may be packaged with multiple HBMIC chips 251 each arranged next to one of the GPU chips 269*a* for communication with said one of the GPU chips 269*a* in a high speed and high bandwidth. Each of the HBM IC chips 251 in the logic drive 300 may be a high speed, high bandwidth DRAM chip, high speed, high bandwidth cache SRAM chip, magnetoresistive random-access-memory (MRAM) chip or resistive random-access-memory (RRAM) chip. The logic drive 300 may be further packaged with a plurality of the standard commodity FPGA IC chip 200 and one or more of the NVMIC chips 250 configured to store the resulting values or programming codes in a non-volatile manner for programming the programmable logic blocks 201 or cross-point switches 379 of the standard commodity FPGA IC chips 200 and for programming the cross-point switches 379 of the DPIIC chips 410, as illustrated in FIGS. 6A-9. The CPU chip 269*b*, dedicated control chip 260, standard commodity FPGA IC chips 200, GPU chips 269*a*, NVMIC chips 250 and HBMIC chips 251 may be arranged in an array, wherein the CPU chip 269*b* and dedicated control chip 260 may be arranged in a center region surrounded by a periphery region having the standard commodity FPGA IC chips 200, GPU chips 269*a*, NVMIC chips 250 and HBMIC chips 251 mounted thereto.

Referring to FIG. 11M, the logic drive 300 may include the inter-chip interconnects 371 each extending over spaces between neighboring two of the standard commodity FPGA IC chips 200, NVMIC chips 250, dedicated control chip 260, GPU chips 269*a*, CPU chip 269*b* and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVMIC chips 250, dedicated control chip 260, GPU chips 269*a*, CPU chip 269*b* and HBMIC chips 251 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects

361 of the inter-chip interconnects 371 and one of the programmable interconnects 361 of the intra-chip interconnects 371 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 11M, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to all of the NVMIC chips 250. One or more of the programmable or fixed interconnects 361 or 364 of the inter-chip interconnects 371 may couple from each of the standard commodity FPGA IC chips 200 to all of the GPU chips 269*a*. One or more of the programmable or fixed interconnects 361 or 364 of the inter-chip interconnects 371 may couple from each of the standard commodity FPGA IC chips 200 to the CPU chip 269*b*. One or more of the programmable or fixed interconnects 361 or 364 of the inter-chip interconnects 371 may couple from each of the standard commodity FPGA IC chips 200 to all of the HBMIC chips 251. One or more of the programmable or fixed interconnects 361 or 364 of the inter-chip interconnects 371 may couple from each of the DPIIC chips 410 to the dedicated control chip 260. One or more the programmable or fixed interconnects 361 or 364 of the inter-chip interconnects 371 may couple from each of the DPIIC chips 410 to all of the NVMIC chips 250. One or more of the programmable or fixed interconnects 361 or 364 of the inter-chip interconnects 371 may couple from each of the DPIIC chips 410 to all of the GPU chips 269*a*. One or more of the programmable or fixed interconnects 361 or 364 of the inter-chip interconnects 371 may couple from each of the DPIIC chips 410 to the CPU chip 269*b*. One or more of the programmable or fixed interconnects 361 or 364 of the inter-chip interconnects 371 may couple from each of the DPIIC chips 410 to all of the HBMIC chips 251. One or more of the programmable or fixed interconnects 361 or 364 of the inter-chip interconnects 371 may couple from the CPU chip 269*b* to all of the GPU chips 269*a*. One or more of the programmable or fixed interconnects 361 or 364 of the inter-chip interconnects 371 may couple from the CPU chip 269*b* to all of the HBMIC chips 251. One or more of the programmable or fixed interconnects 361 or 364 of the inter-chip interconnects 371 may couple from one of the GPU chips 269*a* to one of the HBMIC chips 251 and the communication between said one of the GPU chips 269*a* and said one of the HBM IC chips 251 may have a data bit width of equal to or greater than 64, 128, 256, 512, 1024, 2048, 4096, 8 K, or 16 K. One or more of the programmable or fixed interconnects 361 or 364 of the inter-chip interconnects 371 may couple from each of the NVMIC chips 250 to the dedicated control chip 260. One or more of the programmable or fixed interconnects 361 or 364 of the inter-chip interconnects 371 may couple from each of the HBMIC chips 251 to the dedicated control chip 260. One or more of the programmable or fixed interconnects 361 or 364 of the inter-chip interconnects 371 may couple from each of the GPU chips 269*a* to the dedicated control chip 260. One or more of the programmable or fixed interconnects 361 or 364 of the inter-chip interconnects 371 may couple from the CPU chip 269*b* to the dedicated control chip 260.

Referring to FIG. 11M, the logic drive 300 may include multiple dedicated input/output (I/O) chips 265 in a peripheral region thereof surrounding a central region thereof having the standard commodity FPGA IC chips 200, NVMIC chips 250, dedicated control chip 260, GPU chips 269*a*, CPU chip 269*b*, HBMIC chips 251 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVMIC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the GPU chips 269*a* to all of the dedicated input/output (I/O) chips 265. One or more of the programmable or fixed interconnects 361 or 364 of the inter-chip interconnects 371 may couple from the CPU chip 269*b* to all of the dedicated input/output (I/O) chips 265. One or more of the programmable or fixed interconnects 361 or 364 of the inter-chip interconnects 371 may couple from each of the HBMIC chips 251 to all of the dedicated input/output (I/O) chips 265.

Accordingly, in the tenth type of logic drive 300, the GPU chips 269*a* may operate with the HBM IC chips 251 for high speed, high bandwidth parallel processing and/or computing. Referring to FIG. 11M, each of the standard commodity FPGA IC chips 200 may be the first type of standard commodity FPGA IC chips 200 as illustrated in FIGS. 8A-8J, and each of the DPIIC chips 410 may be the first type of DPIIC chips 410 as illustrated in FIG. 9. The specification of the commodity standard FPGA IC chips 200, DPIIC chips 410, dedicated I/O chips 265, NVMIC chips 250, dedicated control chip 260 may be referred to that as illustrated in FIG. 11A.

XI. Eleventh Type of Logic Drive

Figure 11N:
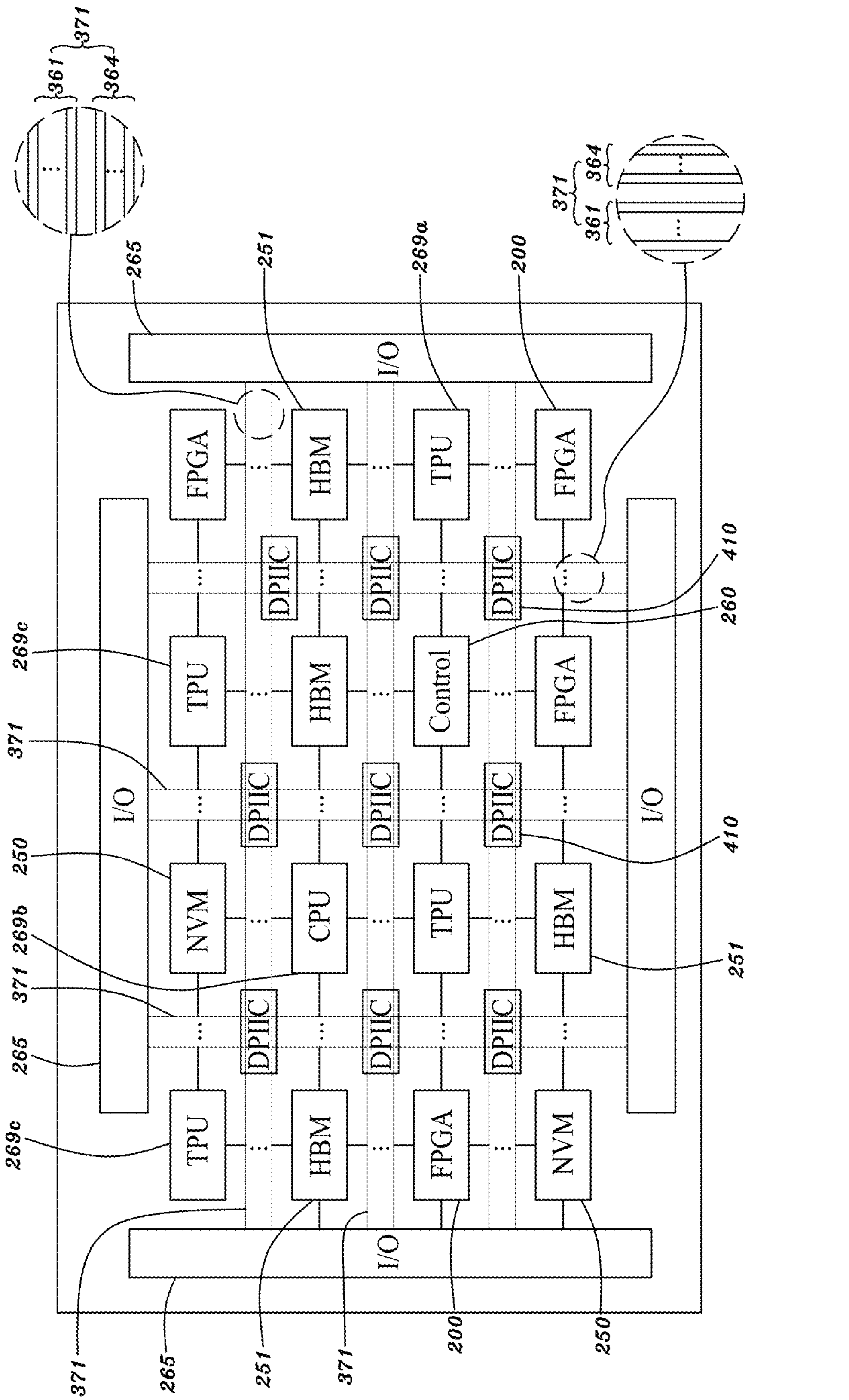

FIG. 11N is a schematically top view showing arrangement for various chips packaged in an eleventh type of standard commodity logic drive in accordance with an embodiment of the present application. For an element indicated by the same reference number shown in FIGS. 11A-11N, the specification of the element as seen in FIG.

11N and the process for forming the same may be referred to that of the element as illustrated in FIGS. 11A-11M and the process for forming the same. Referring to FIG. 11M, the logic drive 300 may be packaged with multiple TPU chips 269*c* and a CPU chip 269*b* for the PCIC chips 269 as above mentioned. Further, the logic drive 300 may be packaged with multiple HBMIC chips 251 each arranged next to one of the TPU chips 269*c* for communication with said one of the TPU chips 269*c* in a high speed and high bandwidth. Each of the HBM IC chips 251 in the logic drive 300 may be a high speed, high bandwidth DRAM chip, high speed, high bandwidth cache SRAM chip, magnetoresistive random-access-memory (MRAM) chip or resistive random-access-memory (RRAM) chip. The logic drive 300 may be further packaged with a plurality of the standard commodity FPGA IC chip 200 and one or more of the NVMIC chips 250 configured to store the resulting values or programming codes in a non-volatile manner for programming the programmable logic blocks 201 or cross-point switches 379 of the standard commodity FPGA IC chips 200 and for programming the cross-point switches 379 of the DPIIC chips 410, as illustrated in FIGS. 6A-9. The CPU chip 269*b*, dedicated control chip 260, standard commodity FPGA IC chips 200, TPU chips 269*c*, NVMIC chips 250 and HBMIC chips 251 may be arranged in an array, wherein the CPU chip 269*b* and dedicated control chip 260 may be arranged in a center region surrounded by a periphery region having the standard commodity FPGA IC chips 200, TPU chips 269*c*, NVMIC chips 250 and HBMIC chips 251 mounted thereto.

Referring to FIG. 11N, the logic drive 300 may include the inter-chip interconnects 371 each extending over spaces between neighboring two of the standard commodity FPGA IC chips 200, NVMIC chips 250, dedicated control chip 260, TPU chips 269*c*, CPU chip 269*b* and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVMIC chips 250, dedicated control chip 260, TPU chips 269*c*, CPU chip 269*b* and HBMIC chips 251 around said each of the DPIIC chips 410. Each of the inter-chip interconnects 371 may be the programmable or fixed interconnect 361 or 364 as mentioned above in the sections of "Specification for Programmable Interconnect" and "Specification for Fixed Interconnect". Signal transmission may be built (1) between one of the programmable interconnects 361 of the inter-chip interconnects 371 and one of the programmable interconnects 361 of the intra-chip interconnects 371 of one of the standard commodity FPGA IC chips 200 via one of the small input/output (I/O) circuits 203 of said one of the standard commodity FPGA IC chips 200 or (2) between one of the programmable interconnects 361 of the inter-chip interconnects 371 and one of the programmable interconnects 361 of the intra-chip interconnects of one of the DPIIC chips 410 via one of the small input/output (I/O) circuits 203 of said one of the DPIIC chips 410. Signal transmission may be built (1) between one of the fixed interconnects 364 of the inter-chip interconnects 371 and one of the fixed interconnects 364 of the intra-chip interconnects 502 of one of the standard commodity FPGA IC chips 200 via one of the small input/output (I/O) circuits 203 of said one of the standard commodity FPGA IC chips 200 or (2) between one of the fixed interconnects 364 of the inter-chip interconnects 371 and one of the fixed interconnects 364 of the intra-chip interconnects of one of the DPIIC chips 410 via one of the small input/output (I/O) circuits 203 of said one of the DPIIC chips 410.

Referring to FIG. 11N, one or more of the programmable or fixed interconnects 361 or 364 of the inter-chip interconnects 371 may couple from each of the standard commodity FPGA IC chips 200 to all of the DPIIC chips 410. One or more of the programmable or fixed interconnects 361 or 364 of the inter-chip interconnects 371 may couple from each of the standard commodity FPGA IC chips 200 to the dedicated control chip 260. One or more of the programmable or fixed interconnects 361 or 364 of the inter-chip interconnects 371 may couple from each of the standard commodity FPGA IC chips 200 to both of the NVMIC chips 250. One or more of the programmable or fixed interconnects 361 or 364 of the inter-chip interconnects 371 may couple from each of the standard commodity FPGA IC chips 200 to all of the TPU chips 269*c*. One or more of the programmable or fixed interconnects 361 or 364 of the inter-chip interconnects 371 may couple from each of the standard commodity FPGA IC chips 200 to the CPU chip 269*b*. One or more of the programmable or fixed interconnects 361 or 364 of the inter-chip interconnects 371 may couple from each of the standard commodity FPGA IC chips 200 to all of the HBMIC chips 251. One or more of the programmable or fixed interconnects 361 or 364 of the inter-chip interconnects 371 may couple from each of the DPIIC chips 410 to the dedicated control chip 260. One or more of the programmable or fixed interconnects 361 or 364 of the inter-chip interconnects 371 may couple from each of the DPIIC chips 410 to both of the NVMIC chips 250. One or more of the programmable or fixed interconnects 361 or 364 of the inter-chip interconnects 371 may couple from each of the DPIIC chips 410 to all of the TPU chips 269*c*. One or more of the programmable or fixed interconnects 361 or 364 of the inter-chip interconnects 371 may couple from each of the DPIIC chips 410 to the CPU chip 269*b*. One or more of the programmable or fixed interconnects 361 or 364 of the inter-chip interconnects 371 may couple from each of the DPIIC chips 410 to all of the HBMIC chips 251. One or more of the programmable or fixed interconnects or more 364 of the inter-chip interconnects 371 may couple from the CPU chip 269*b* to all of the TPU chips 269*c*. One or more of the programmable or fixed interconnects 361 or 364 of the inter-chip interconnects 371 may couple from the CPU chip 269*b* to all of the HBMIC chips 251. One or more of the programmable or fixed interconnects 364 of the inter-chip interconnects 371 may couple from one of the TPU chips 269*c* to one of the HBMIC chips 251 and the communication between said one of the TPU chips 269*c* and said one of the HBM IC chips 251 may have a data bit width of equal to or greater than 64, 128, 256, 512, 1024, 2048, 4096, 8 K, or 16 K. One or more of the programmable or fixed interconnects 361 or 364 of the inter-chip interconnects 371 may couple from each of the NVMIC chips 250 to the dedicated control chip 260. One or more of the programmable or fixed interconnects 361 or 364 of the inter-chip interconnects 371 may couple from each of the HBMIC chips 251 to the dedicated control chip 260. One or more of the programmable or fixed interconnects 361 or 364 of the inter-chip interconnects 371 may couple from each of the TPU chips 269*c* to the dedicated control chip 260. One or more of the programmable or fixed interconnects 361 or 364 of the inter-chip interconnects 371 may couple from the CPU chip 269*b* to the dedicated control chip 260.

Referring to FIG. 11N, the logic drive 300 may include multiple dedicated input/output (I/O) chips 265 in a peripheral region thereof surrounding a central region thereof having the standard commodity FPGA IC chips 200, NVMIC chips 250, dedicated control chip 260, TPU chips 269*c*, CPU chip 269*b*, HBMIC chips 251 and DPIIC chips 410 located therein. One or more of the programmable or fixed interconnects 361 or 364 of the inter-chip interconnects 371 may couple from each of the standard commodity FPGA IC chips 200 to all of the dedicated input/output (I/O) chips 265. One or more of the programmable or fixed interconnects 361 or 364 of the inter-chip interconnects 371 may couple from each of the DPIIC chips 410 to all of the dedicated input/output (I/O) chips 265. One or more of the programmable or fixed interconnects 361 or 364 of the inter-chip interconnects 371 may couple from each of the NVMIC chips 250 to all of the dedicated input/output (I/O) chips 265. One or more of the programmable or fixed interconnects 361 or 364 of the inter-chip interconnects 371 may couple from the dedicated control chip 260 to all of the dedicated input/output (I/O) chips 265. One or more of the programmable or fixed interconnects 361 or 364 of the inter-chip interconnects 371 may couple from each of the TPU chips 269*c* to all of the dedicated input/output (I/O) chips 265. One or more of the programmable or fixed interconnects 361 or 364 of the inter-chip interconnects 371 may couple from the CPU chip 269*b* to all of the dedicated input/output (I/O) chips 265. One or more of the programmable or fixed interconnects 361 or 364 of the inter-chip interconnects 371 may couple from each of the HBMIC chips 251 to all of the dedicated input/output (I/O) chips 265.

Accordingly, in the eleventh type of logic drive 300, the TPU chips 269*c* may operate with the HBM IC chips 251 for high speed, high bandwidth parallel processing and/or computing. Referring to FIG. 11N, each of the standard commodity FPGA IC chips 200 may be the first type of standard commodity FPGA IC chips 200 as illustrated in FIGS. 8A-8J, and each of the DPIIC chips 410 may be the first type of DPIIC chips 410 as illustrated in FIG. 9. The specification of the commodity standard FPGA IC chips 200, DPIIC chips 410, dedicated I/O chips 265, NVMIC chips 250, dedicated control chip 260 may be referred to that as illustrated in FIG. 11A.

Accordingly, referring to FIGS. 11F through 11N, once the programmable interconnects 361 of the FPGA IC chips 200 and DPIIC chips 410 are programmed, the programmed programmable interconnects 361 together with the fixed interconnects 364 of the standard commodity FPGA IC chips 200 and DPIIC chips 410 may provide some specific functions for some given applications. The standard commodity FPGA IC chips 200 may operate together with the PCIC chip or chips 269, e.g., GPU chips, CPU chips, TPU chips or DSP chips, in the same logic drive 300 to provide powerful functions and operations in applications, for example, Artificial Intelligence (AI), machine learning, deep learning, big data, Internet Of Things (IOT), Virtual Reality (VR), Augmented Reality (AR), driverless car electronics, Graphic Processing (GP), Digital Signal Processing (DSP), Micro Controlling (MC), and/or Central Processing (CP).

Interconnection for Logic Drive

Figure 12A:
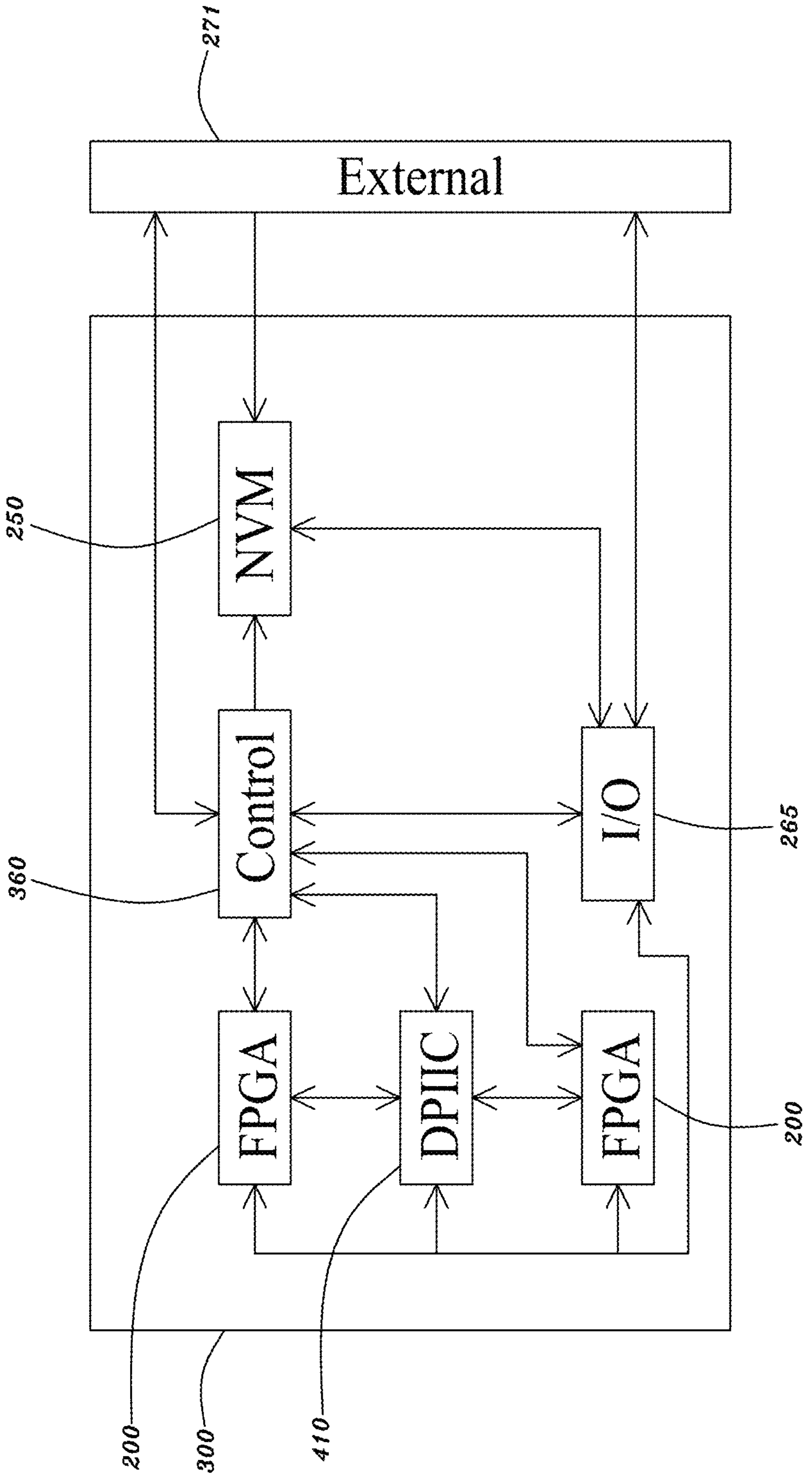
FIGS. 12A-12C are various block diagrams showing various connections between chips in a logic drive in accordance with an embodiment of the present application.
Figure 12B:
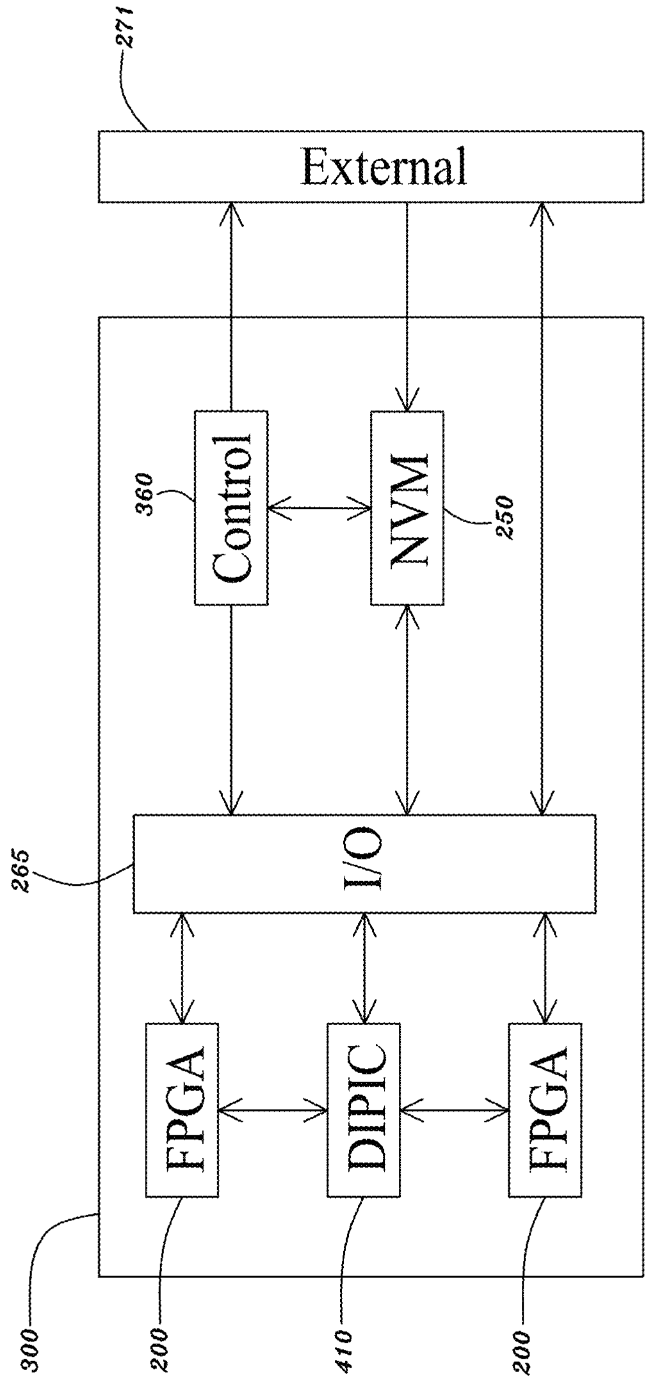
Figure 12C:
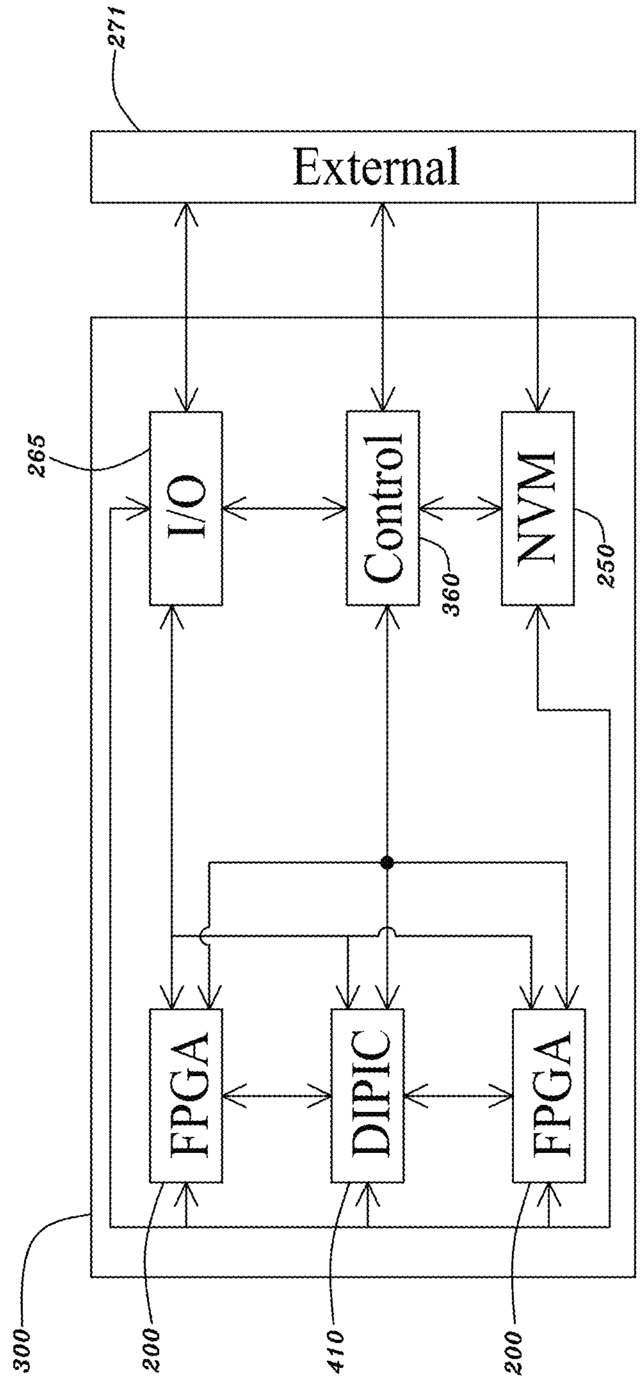

FIGS. 12A-12C are various block diagrams showing various connections between chips in a logic drive in accordance with an embodiment of the present application. Referring to FIGS. 12A-12C, a block 250 may be a combination of the NVMIC chips 250 in the logic drive 300 illustrated in FIGS. 11A-11N; two blocks 200 may be two different groups of the standard commodity FPGA IC chips 200 in the logic drive 300 illustrated in FIGS. 11A-11N; a block 410 may be a combination of the DPIIC chips 410 in the logic drive 300 illustrated in FIGS. 11A-11N; a block 265 may be a combination of the dedicated I/O chips 265 in the logic drive 300 illustrated in FIGS. 11A-11N; a block 360 may be the dedicated control chip 260, the dedicated control and I/O chip 266, the DCIAC chip 267 or DCDI/OIAC chip 268 in the logic drive 300 illustrated in FIGS. 11A-11N.

Referring to FIGS. 11A-11N and 12A-12C, each of the NVMIC chips 250 may reload resulting values or first programming codes from the external circuitry 271 outside the logic drive 300 such that each of the resulting values or first programming codes may pass from said each of the NVMIC chips 250 to one of the memory cells 490 of the standard commodity FPGA IC chips 200 via the fixed interconnects 364 of the inter-chip interconnects 371 and the fixed interconnects 364 of the intra-chip interconnects 502 of the standard commodity FPGA IC chips 200 for programing one of the programmable logic blocks 201 of the standard commodity FPGA IC chips 200 as illustrated in FIG. 6A. Each of the NVMIC chips 250 may reload second programming codes from the external circuitry 271 outside the logic drive 300 such that each of the second programming codes may pass from said each of the NVMIC chips 250 to one of the memory cells 362 of the standard commodity FPGA IC chips 200 via the fixed interconnects 364 of the inter-chip interconnects 371 and the fixed interconnects 364 of the intra-chip interconnects 502 of the standard commodity FPGA IC chips 200 for programing one of the pass/no-pass switches 258 or cross-point switches 379 of the standard commodity FPGA IC chips 200 as illustrated in FIGS. 2A-2F, 3A-3D and 7A-7C. Each of the NVMIC chips 250 may reload third programming codes from the external circuitry 271 outside the logic drive 300 such that each of the third programming codes may pass from said each of the NVMIC chips 250 to one of the memory cells 362 of the DPIIC chips 410 via the fixed interconnects 364 of the inter-chip interconnects 371 and the fixed interconnects 364 of the intra-chip interconnects of the DPIIC chips 410 for programing one of the pass/no-pass switches 258 or cross-point switches 379 of the DPIIC chips 410 as illustrated in FIGS. 2A-2F, 3A-3D and 7A-7C. The external circuitry 271 may not be allowed to reload the resulting values and first, second and third programming codes from any of the NVMIC chips 250 in the logic drive 300. Alternatively, the external circuitry 271 may be allowed to reload the resulting values and first, second and third programming codes from any of the NVMIC chips 250 in the logic drive 300.

I. First Type of Interconnection for Logic Drive

Referring to FIGS. 11A-11N and 12A, one or more of the programmable interconnects 361 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the programmable interconnects 361 of the inter-chip interconnects 371 may couple one or more of the small I/O circuits 203 of each of the dedicated I/O chips 265 to one or more of the small I/O circuits 203 of all of the DPIIC chips 410. One or more of the programmable interconnects 361 of the inter-chip interconnects 371 may couple one or more of the small I/O circuits 203 of each of the dedicated I/O chips 265 to one or more of the small I/O circuits 203 of all the others of the dedicated I/O chips 265. One or more of the fixed interconnects 364 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the fixed interconnects 364 of the inter-chip interconnects 371 may couple one or more of the small I/O circuits 203 of each of the dedicated I/O chips 265 to one or more of the small I/O circuits 203 of all of the DPIIC chips 410. One or more of the fixed interconnects 364 of the inter-chip interconnects 371 may couple one or more of the small I/O circuits 203 of each of the dedicated I/O chips 265 to one or more of the small I/O circuits 203 of all the others of the dedicated I/O chips 265.

Referring to FIGS. 11A-11N and 12A, one or more of the programmable interconnects 361 of the inter-chip interconnects 371 may couple one or more of the small I/O circuits 203 of each of the DPIIC chips 410 to one or more of the small I/O circuits 203 of all of the standard commodity FPGA IC chips 200. One or more of the programmable interconnects 361 of the inter-chip interconnects 371 may couple one or more of the small I/O circuits 203 of each of the DPIIC chips 410 to one or more of the small I/O circuits 203 of all the others of the DPIIC chips 410. One or more of the fixed interconnects 364 of the inter-chip interconnects 371 may couple one or more of the small I/O circuits 203 of each of the DPIIC chips 410 to one or more of the small I/O circuits 203 of all of the standard commodity FPGA IC chips 200. One or more of the fixed interconnects 364 of the inter-chip interconnects 371 may couple one or more of the small I/O circuits 203 of each of the DPIIC chips 410 to one or more of the small I/O circuits 203 of all the others of the DPIIC chips 410.

Referring to FIGS. 11A-11N and 12A, one or more of the programmable interconnects 361 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200. One or more of the fixed interconnects 364 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200.

Referring to FIGS. 11A-11N and 12A, one or more of the programmable interconnects 361 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the standard commodity FPGA IC chips 200. One more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the standard commodity FPGA IC chips 200. One or more of the programmable interconnects 361 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the DPIIC chips 410. One more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the DPIIC chips 410. One or more of the fixed interconnects 364 of the inter-chip interconnects 371 may couple one or more of the large I/O circuits 341 of the dedicated control chip 260, dedicated control and I/O chip 266, DCIAC chip 267 or DCDI/OIAC chip 268 in the control block 360 to one or more of the large I/O circuits 341 of all of the NVMIC chips 250. One or more of the fixed interconnects 364 of the inter-chip interconnects 371 may couple one or more of the large I/O circuits 341 of the dedicated control chip 260, dedicated control and I/O chip 266, DCIAC chip 267 or DCDI/OIAC chip 268 in the control block 360 to one or more of the large I/O circuits 341 of all of the dedicated I/O chips 265. One or more of the large I/O circuits 341 of the dedicated control chip 260, dedicated control and I/O chip 266, DCIAC chip 267 or DCDI/OIAC chip 268 in the control block 360 may couple to the external circuitry 271 outside the logic drive 300.

Referring to FIGS. 11A-11N and 12A, one or more of the fixed interconnects 364 of the inter-chip interconnects 371 may couple one or more of the large I/O circuits 341 of each of the dedicated I/O chips 265 to one or more of the large I/O circuits 341 of all of the NVMIC chips 250. One or more of the fixed interconnects 364 of the inter-chip interconnects 371 may couple one or more of the large I/O circuits 341 of each of the dedicated I/O chips 265 to one or more of the large I/O circuits 341 of the others of the dedicated I/O chips 265. One or more of the large I/O circuits 341 of each of the dedicated I/O chips 265 may couple to the external circuitry 271 outside the logic drive 300.

Referring to FIGS. 11A-11N and 12A, one or more of the fixed interconnects 364 of the inter-chip interconnects 371 may couple one or more of the large I/O circuits 341 of each of the NVMIC chips 250 to one or more of the large I/O circuits 341 of the others of the NVMIC chips 250. One or more of the large I/O circuits 341 of each of the NVMIC chips 250 may couple to the external circuitry 271 outside the logic drive 300. In this case, each of the NVMIC chips 250 in the logic drive 300 may not be provided with any I/O circuit having input or output capacitance, driving capability or loading smaller than 2 pF, but provided with the large I/O circuits 341 as seen in FIG. 5A to perform the above-mentioned connection. Each of the NVMIC chips 250 may pass data to all of the standard commodity FPGA IC chips 200 through one or more of the dedicated I/O chips 265; each of the NVMIC chips 250 may pass data to all of the DPIIC chips 410 through one or more of the dedicated I/O chips 265; each of the NVMIC chips 250 may have no freedom to pass any data to any of the standard commodity FPGA IC chips 200 not through any of the dedicated I/O chips 265; each of the NVMIC chips 250 may have no freedom to pass any data to any of the DPIIC chips 410 not through any of the dedicated I/O chips 265.

(1) Interconnection for Programming Memory Cells

Referring to FIGS. 11A-11N and 12A, in an aspect, the dedicated control chip 260, dedicated control and I/O chip 266, DCIAC chip 267 or DCDI/OIAC chip 268 in the control block 360 may generate a control command to one of its large I/O circuits 341 to drive the control command to a first one of the large I/O circuits 341 of one of the NVMIC chips 250 via one or more of the fixed interconnects 364 of the inter-chip interconnects 371. For said one of the NVMIC chips 250, the control command is driven by the first one of its large I/O circuits 341 to its internal circuits to command its internal circuits to pass the programming code to a second one of its large I/O circuits 341; the second one of its large I/O circuits 341 may drive the programming code to one of the large I/O circuits 341 of one of the dedicated I/O chips 265 via one or more of the fixed interconnects 364 of the inter-chip interconnects 371. For said one of the dedicated I/O chips 265, said one of its large I/O circuits may drive the programming code to one of its small I/O circuits 203; said one of its small I/O circuits 203 may drive the programming code to one of the small I/O circuits 203 of one of the DPIIC chips 410 via one or more of the fixed interconnects 364 of the inter-chip interconnects 371. For said one of the DPIIC chips 410, said one of its small I/O circuits 203 may drive the programming code to one of its memory cells 362 in one of its memory-array blocks 423 as seen in FIG. 9 via one or more of the fixed interconnects 364 of its intra-chip interconnects; the programming code may be stored in said one of its memory cells 362 for programming one of its pass/no-pass switches 258 and/or cross-point switches 379 as illustrated in FIGS. 2A-2F, 3A-3D and 7A-7C.

Alternatively, referring to FIGS. 11A-11N and 12A, the dedicated control chip 260, dedicated control and I/O chip 266, DCIAC chip 267 or DCDI/OIAC chip 268 in the control block 360 may generate a control command to one of its large I/O circuits 341 to drive the control command to a first one of the large I/O circuits 341 of one of the NVMIC chips 250 via one or more of the fixed interconnects 364 of the inter-chip interconnects 371. For said one of the NVMIC chips 250, the control command is driven by the first one of its large I/O circuits 341 to its internal circuits to command its internal circuits to pass the programming code to a second one of its large I/O circuits 341; the second one of its large I/O circuits 341 may drive the programming code to one of the large I/O circuits 341 of one of the dedicated I/O chips 265 via one or more of the fixed interconnects 364 of the inter-chip interconnects 371. For said one of the dedicated I/O chips 265, said one of its large I/O circuits may drive the programming code to one of its small I/O circuits 203; said one of its small I/O circuits 203 may drive the programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the programming code to one of its memory cells 362 via one or more of the fixed interconnects 364 of its intra-chip interconnects 502; the programming code may be stored in said one of its memory cells 362 for programming one of its pass/no-pass switches 258 and/or cross-point switches 379 as illustrated in FIGS. 2A-2F, 3A-3D and 7A-7C.

Alternatively, referring to FIGS. 11A-11N and 12A, the dedicated control chip 260, dedicated control and I/O chip 266, DCIAC chip 267 or DCDI/OIAC chip 268 in the control block 360 may generate a control command to one of its large I/O circuits 341 to drive the control command to a first one of the large I/O circuits 341 of one of the NVMIC chips 250 via one or more of the fixed interconnects 364 of the inter-chip interconnects 371. For said one of the NVMIC chips 250, the control command is driven by the first one of its large I/O circuits 341 to its internal circuits to command its internal circuits to pass the resulting value or programming code to a second one of its large I/O circuits 341; the second one of its large I/O circuits 341 may drive the resulting value or programming code to one of the large I/O circuits 341 of one of the dedicated I/O chips 265 via one or more of the fixed interconnects 364 of the inter-chip interconnects 371. For said one of the dedicated I/O chips 265, said one of its large I/O circuits may drive the resulting value or programming code to one of its small I/O circuits 203; said one of its small I/O circuits 203 may drive the resulting value or programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the resulting value or programming code to one of its memory cells 490 via one of its fixed interconnects 364; the resulting value or programming code may be stored in said one of its memory cells 490 for programming one of its programmable logic blocks 201 as illustrated in FIG. 6A.

(2) Interconnection for Operation

Referring to FIGS. 11A-11N and 12A, in an aspect, one of the dedicated I/O chips 265 may have one of its large I/O circuits 341 to drive a signal from the external circuitry 271 outside the logic drive 300 to one of its small I/O circuits 203. For said one of the dedicated I/O chips 265, said one of its small I/O circuits 203 may drive the signal to a first one of the small I/O circuits 203 of one of the DPIIC chips 410 via one or more of the programmable interconnects 361 of the inter-chip interconnects 371. For said one of the dedicated DPIIC chips 410, the first one of its small I/O circuits 203 may drive the signal to one of its cross-point switches 379 via a first one of the programmable interconnects 361 of its intra-chip interconnects; said one of its cross-point switches 379 may switch the signal from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the signal to one of the small I/O circuits 203 of one of the standard commodity FPGA IC chips 200 via one or more of the programmable interconnects 361 of the inter-chip interconnects 371. For said one of the standard commodity FPGA IC chips 200, said one of its small I/O circuits 203 may drive the signal to one of its cross-point switches 379 through a first group of the programmable interconnects 361 and by-pass interconnects 279 of its intra-chip interconnects 502 as seen in FIG. 8G; said one of its cross-point switches 379 may switch the signal to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 6A.

Referring to FIGS. 11A-11N and 12A, in another aspect, for a first one of the standard commodity FPGA IC chips 200, one of its programmable logic blocks (LB) 201 as seen in FIG. 6A may generate an output Dout to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of a second one of the standard commodity FPGA IC chips 200 via one or more of the programmable interconnects 361 of the inter-chip interconnects 371. For the second one of the FPGA IC chips 200, said one of its small I/O circuits 203 may drive the output Dout to one of its cross-point switches 379 through a first group of the programmable interconnects 361 and by-pass interconnects 279 of its intra-chip interconnects 502 as seen in FIG. 8G; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 6A.

Referring to FIGS. 11A-11N and 12A, in another aspect, for one of the standard commodity FPGA IC chips 200, one of its programmable logic blocks (LB) 201 as seen in FIG. 6A may generate an output Dout to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of one of the dedicated I/O chips 265 via one or more of the programmable interconnects 361 of the inter-chip interconnects 371. For said one of the dedicated I/O chips 265, said one of its small I/O circuits 203 may drive the output Dout to one of its large I/O circuits 341 to be passed to the external circuitry 271 outside the logic drive 300.

(3) Interconnection for Controlling

Referring to FIGS. 11A-11N and 12A, for the dedicated control chip 260, dedicated control and I/O chip 266, DCIAC chip 267 or DCDI/OIAC chip 268 in the control block 360, one of its large I/O circuits 341 may receive or drive a control command from or to the external circuitry 271 outside the logic drive 300.

Alternatively, referring to FIGS. 11A-11N and 12A, one of the dedicated I/O chips 265 may have a first one of its large I/O circuits 341 to drive a control command from the external circuitry 271 outside the logic drive 300 to a second one of its large I/O circuits 341. For said one of the dedicated I/O chips 265, the second one of its large I/O circuits 341 may drive the control command to one of the large I/O circuits 341 of the dedicated control chip 260, dedicated control and I/O chip 266, DCIAC chip 267 or DCDI/OIAC chip 268 in the control block 360 via one or more of the fixed interconnects 364 of the inter-chip interconnects 371.

Alternatively, referring to FIGS. 11A-11N and 12A, for the dedicated control chip 260, dedicated control and I/O chip 266, DCIAC chip 267 or DCDI/OIAC chip 268 in the control block 360, one of its large I/O circuits 341 may drive a control command to a first one of the large I/O circuits 341 of one of the dedicated I/O chips 265 via one or more of the fixed interconnects 364 of the inter-chip interconnects 371. For said one of the dedicated I/O chips 265, the first one of its large I/O circuits 341 may drive the control command to a second one of its large I/O circuits 341 to be passed to the external circuitry 271 outside the logic drive 300.

Thereby, referring to FIGS. 11A-11N and 12A, a control command may be provided from the external circuitry 271 outside the logic drive 300 to the dedicated control chip 260, dedicated control and I/O chip 266, DCIAC chip 267 or DCDI/OIAC chip 268 in the control block 360 or from the dedicated control chip 260, dedicated control and I/O chip 266, DCIAC chip 267 or DCDI/OIAC chip 268 in the control block 360 to the external circuitry 271 outside the logic drive 300.

II. Second Type of Interconnection for Logic Drive

Referring to FIGS. 11A-11N and 12B, one or more of the programmable interconnects 361 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the programmable interconnects 361 of the inter-chip interconnects 371 may couple one or more of the small I/O circuits 203 of each of the dedicated I/O chips 265 to one or more of the small I/O circuits 203 of all of the DPIIC chips 410. One or more of the programmable interconnects 361 of the inter-chip interconnects 371 may couple one or more of the small I/O circuits 203 of each of the dedicated I/O chips 265 to one or more of the small I/O circuits 203 of all the others of the dedicated I/O chips 265. One or more of the fixed interconnects 364 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the fixed interconnects 364 of the inter-chip interconnects 371 may couple one or more of the small I/O circuits 203 of each of the dedicated I/O chips 265 to one or more of the small I/O circuits 203 of all of the DPIIC chips 410. One or more of the fixed interconnects 364 of the inter-chip interconnects 371 may couple one or more of the small I/O circuits 203 of each of the dedicated I/O chips 265 to one or more of the small I/O circuits 203 of all the others of the dedicated I/O chips 265.

Referring to FIGS. 11A-11N and 12B, one or more of the programmable interconnects 361 of the inter-chip interconnects 371 may couple one or more of the small I/O circuits 203 of each of the DPIIC chips 410 to one or more of the small I/O circuits 203 of all of the standard commodity FPGA IC chips 200. One or more of the programmable interconnects 361 of the inter-chip interconnects 371 may couple one or more of the small I/O circuits 203 of each of the DPIIC chips 410 to one or more of the small I/O circuits 203 of all the others of the DPIIC chips 410. One or more of the fixed interconnects 364 of the inter-chip interconnects 371 may couple one or more of the small I/O circuits 203 of each of the DPIIC chips 410 to one or more of the small I/O circuits 203 of all of the standard commodity FPGA IC chips

200. One or more of the fixed interconnects 364 of the inter-chip interconnects 371 may couple one or more of the small I/O circuits 203 of each of the DPIIC chips 410 to one or more of the small I/O circuits 203 of all the others of the DPIIC chips 410.

Referring to FIGS. 11A-11N and 12B, one or more of the programmable interconnects 361 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200. One or more of the fixed interconnects 364 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200.

Referring to FIGS. 11A-11N and 12B, one or more of the fixed interconnects 364 of the inter-chip interconnects 371 may couple one or more of the large I/O circuits 341 of the dedicated control chip 260, dedicated control and I/O chip 266, DCIAC chip 267 or DCDI/OIAC chip 268 in the control block 360 to one or more of the large I/O circuits 341 of all of the dedicated I/O chips 265. One or more of the fixed interconnects 364 of the inter-chip interconnects 371 may couple one or more of the large I/O circuits 341 of the dedicated control chip 260, dedicated control and I/O chip 266, DCIAC chip 267 or DCDI/OIAC chip 268 in the control block 360 to one or more of the large I/O circuits 341 of all of the NVMIC chips 250. One or more of the large I/O circuits 341 of the dedicated control chip 260, dedicated control and I/O chip 266, DCIAC chip 267 or DCDI/OIAC chip 268 in the control block 360 may couple to the external circuitry 271 outside the logic drive 300.

Referring to FIGS. 11A-11N and 12B, one or more of the fixed interconnects 364 of the inter-chip interconnects 371 may couple one or more of the large I/O circuits 341 of each of the NVMIC chips 250 to one or more of the large I/O circuits 341 of all of the dedicated I/O chips 265. One or more of the fixed interconnects 364 of the inter-chip interconnects 371 may couple one or more of the large I/O circuits 341 of each of the NVMIC chips 250 to one or more of the large I/O circuits 341 of all the others of the NVMIC chips 250. One or more of the fixed interconnects 364 of the inter-chip interconnects 371 may couple one or more of the large I/O circuits 341 of each of the dedicated I/O chips 265 to one or more of the large I/O circuits 341 of all the others of the dedicated I/O chips 265. One or more of the large I/O circuits 341 of each of the NVMIC chips 250 may couple to the external circuitry 271 outside the logic drive 300. One or more of the large I/O circuits 341 of each of the dedicated I/O chips 265 may couple to the external circuitry 271 outside the logic drive 300.

Referring to FIGS. 11A-11N and 12B, in this case, each of the NVMIC chips 250 in the logic drive 300 may not be provided with any I/O circuit having input or output capacitance, driving capability or loading smaller than 2 pF, but provided with the large I/O circuits 341 as seen in FIG. 5A to perform the above-mentioned connection. Each of the NVMIC chips 250 may pass data to all of the standard commodity FPGA IC chips 200 through one or more of the dedicated I/O chips 265; each of the NVMIC chips 250 may pass data to all of the DPIIC chips 410 through one or more of the dedicated I/O chips 265; each of the NVMIC chips 250 may have no freedom to pass any data to any of the standard commodity FPGA IC chips 200 not through any of the dedicated I/O chips 265; each of the NVMIC chips 250 may have no freedom to pass any data to any of the DPIIC chips 410 not through any of the dedicated I/O chips 265. In this case, the dedicated control chip 260, dedicated control and I/O chip 266, DCIAC chip 267 or DCDI/OIAC chip 268 in the control block 360 may not be provided with any I/O circuit having input or output capacitance, driving capability or loading smaller than 2 pF, but provided with the large I/O circuits 341 as seen in FIG. 5A to perform the above-mentioned connection. The dedicated control chip 260, dedicated control and I/O chip 266, DCIAC chip 267 or DCDI/OIAC chip 268 in the control block 360 may pass control commands or other signals to all of the standard commodity FPGA IC chips 200 through one or more of the dedicated I/O chips 265; the dedicated control chip 260, dedicated control and I/O chip 266, DCIAC chip 267 or DCDI/OIAC chip 268 in the control block 360 may pass control commands or other signals to all of the DPIIC chips 410 through one or more of the dedicated I/O chips 265; the dedicated control chip 260, dedicated control and I/O chip 266, DCIAC chip 267 or DCDI/OIAC chip 268 in the control block 360 may have no freedom to pass any control command or other signal to any of the standard commodity FPGA IC chips 200 not through any of the dedicated I/O chips 265; the dedicated control chip 260, dedicated control and I/O chip 266, DCIAC chip 267 or DCDI/OIAC chip 268 in the control block 360 may have no freedom to pass any control command or other signal to any of the DPIIC chips 410 not through any of the dedicated I/O chips 265.

(1) Interconnection for Programming Memory Cells

Referring to FIGS. 11A-11N and 12B, in an aspect, the dedicated control chip 260, dedicated control and I/O chip 266, DCIAC chip 267 or DCDI/OIAC chip 268 in the control block 360 may generate a control command to one of its large I/O circuits 341 to drive the control command to a first one of the large I/O circuits 341 of one of the NVMIC chips 250 via one or more of the fixed interconnects 364 of the inter-chip interconnects 371. For said one of the NVMIC chips 250, the control command is driven by the first one of its large I/O circuits 341 to its internal circuits to command its internal circuits to pass the programming code to a second one of its large I/O circuits 341; the second one of its large I/O circuits 341 may drive the programming code to one of the large I/O circuits 341 of one of the dedicated I/O chips 265 via one or more of the fixed interconnects 364 of the inter-chip interconnects 371. For said one of the dedicated I/O chips 265, said one of its large I/O circuits may drive the programming code to one of its small I/O circuits 203; said one of its small I/O circuits 203 may drive the programming code to one of the small I/O circuits 203 of one of the DPIIC chips 410 via one or more of the fixed interconnects 364 of the inter-chip interconnects 371. For said one of the DPIIC chips 410, said one of its small I/O circuits 203 may drive the programming code to one of its memory cells 362 in one of its memory-array blocks 423 as seen in FIG. 9 via one or more of the fixed interconnects 364 of its intra-chip interconnects; the programming code may be stored in said one of its memory cells 362 for programming one of its pass/no-pass switches 258 and/or cross-point switches 379 as illustrated in FIGS. 2A-2F, 3A-3D and 7A-7C.

Alternatively, referring to FIGS. 11A-11N and 12B, the dedicated control chip 260, dedicated control and I/O chip 266, DCIAC chip 267 or DCDI/OIAC chip 268 in the control block 360 may generate a control command to one of its large I/O circuits 341 to drive the control command to a first one of the large I/O circuits 341 of one of the NVMIC chips 250 via one or more of the fixed interconnects 364 of the inter-chip interconnects 371. For said one of the NVMIC chips 250, the control command is driven by the first one of its large I/O circuits 341 to its internal circuits to command its internal circuits to pass the programming code to a second one of its large I/O circuits 341; the second one of its large I/O circuits 341 may drive the programming code to one of the large I/O circuits 341 of one of the dedicated I/O chips 265 via one or more of the fixed interconnects 364 of the inter-chip interconnects 371. For said one of the dedicated I/O chips 265, said one of its large I/O circuits may drive the programming code to one of its small I/O circuits 203; said one of its small I/O circuits 203 may drive the programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the programming code to one of its memory cells 362 via one or more of the fixed interconnects 364 of its intra-chip interconnects 502; the programming code may be stored in said one of its memory cells 362 for programming one of its pass/no-pass switches 258 and/or cross-point switches 379 as illustrated in FIGS. 2A-2F, 3A-3D and 7A-7C.

Alternatively, referring to FIGS. 11A-11N and 12B, the dedicated control chip 260, dedicated control and I/O chip 266, DCIAC chip 267 or DCDI/OIAC chip 268 in the control block 360 may generate a control command to one of its large I/O circuits 341 to drive the control command to a first one of the large I/O circuits 341 of one of the NVMIC chips 250 via one or more of the fixed interconnects 364 of the inter-chip interconnects 371. For said one of the NVMIC chips 250, the control command is driven by the first one of its large I/O circuits 341 to its internal circuits to command its internal circuits to pass the resulting value or programming code to a second one of its large I/O circuits 341; the second one of its large I/O circuits 341 may drive the resulting value or programming code to one of the large I/O circuits 341 of one of the dedicated I/O chips 265 via one or more of the fixed interconnects 364 of the inter-chip interconnects 371. For said one of the dedicated I/O chips 265, said one of its large I/O circuits may drive the resulting value or programming code to one of its small I/O circuits 203; said one of its small I/O circuits 203 may drive the resulting value or programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the resulting value or programming code to one of its memory cells 490 via one or more of the fixed interconnects 364 of its intra-chip interconnects 502; the resulting value or programming code may be stored in said one of its memory cells 490 for programming one of its programmable logic blocks 201 as illustrated in FIG. 6A.

(2) Interconnection for Operation

Referring to FIGS. 11A-11N and 12B, in an aspect, one of the dedicated I/O chips 265 may have one of its large I/O circuits 341 to drive a signal from the external circuitry 271 outside the logic drive 300 to one of its small I/O circuits 203. For said one of the dedicated I/O chips 265, said one of its small I/O circuits 203 may drive the signal to a first one of the small I/O circuits 203 of one of the DPIIC chips 410 via one or more of the programmable interconnects 361 of the inter-chip interconnects 371. For said one of the dedicated DPIIC chips 410, the first one of its small I/O circuits 203 may drive the signal to one of its cross-point switches 379 via a first group of the programmable interconnects 361 of its intra-chip interconnects; said one of its cross-point switches 379 may switch the signal from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the signal to one of the small I/O circuits 203 of one of the standard commodity FPGA IC chips 200 via one or more of the programmable interconnects 361 of the inter-chip interconnects 371. For said one of the standard commodity FPGA IC chips 200, said one of its small I/O circuits 203 may drive the signal to one of its cross-point switches 379 through a first group of the programmable interconnects 361 and by-pass interconnects 279 of its intra-chip interconnects 502 as seen in FIG. 8G; said one of its cross-point switches 379 may switch the signal to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 6A.

Referring to FIGS. 11A-11N and 12B, in another aspect, for a first one of the standard commodity FPGA IC chips 200, one of its programmable logic blocks (LB) 201 as seen in FIG. 6A may generate an output Dout to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of a second one of the standard commodity FPGA IC chips 200 via one or more of the programmable interconnects 361 of the inter-chip interconnects 371. For the second one of the FPGA IC chips 200, said one of its small I/O circuits 203 may drive the output Dout to one of its cross-point switches 379 through a first group of the programmable interconnects 361 and by-pass interconnects 279 of its intra-chip interconnects 502 as seen in FIG. 8G; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 6A.

Referring to FIGS. 11A-11N and 12B, in another aspect, for one of the standard commodity FPGA IC chips 200, one of its programmable logic blocks (LB) 201 as seen in FIG.

6A may generate an output Dout to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of one of the dedicated I/O chips 265 via one or more of the programmable interconnects 361 of the inter-chip interconnects 371. For said one of the dedicated I/O chips 265, said one of its small I/O circuits 203 may drive the output Dout to one of its large I/O circuits 341 to be passed to the external circuitry 271 outside the logic drive 300.

(3) Interconnection for Controlling

Referring to FIGS. 11A-11N and 12B, for the dedicated control chip 260, dedicated control and I/O chip 266, DCIAC chip 267 or DCDI/OIAC chip 268 in the control block 360, one of its large I/O circuits 341 may receive or drive a control command from or to the external circuitry 271 outside the logic drive 300.

Alternatively, referring to FIGS. 11A-11N and 12B, one of the dedicated I/O chips 265 may have a first one of its large I/O circuits 341 to drive a control command, from the external circuitry 271 outside the logic drive 300 to a second one of its large I/O circuits 341. For said one of the dedicated I/O chips 265, the second one of its large I/O circuits 341 may drive the control command to one of the large I/O circuits 341 of the dedicated control chip 260, dedicated control and I/O chip 266, DCIAC chip 267 or DCDI/OIAC chip 268 in the control block 360 via one or more of the fixed interconnects 364 of the inter-chip interconnects 371.

Alternatively, referring to FIGS. 11A-11N and 12B, for the dedicated control chip 260, dedicated control and I/O chip 266, DCIAC chip 267 or DCDI/OIAC chip 268 in the control block 360, one of its large I/O circuits 341 may drive a control command to a first one of the large I/O circuits 341 of one of the dedicated I/O chips 265 via one or more of the fixed interconnects 364 of the inter-chip interconnects 371. For said one of the dedicated I/O chips 265, the first one of its large I/O circuits 341 may drive the control command to a second one of its large I/O circuits 341 to be passed to the external circuitry 271 outside the logic drive 300.

Thereby, referring to FIGS. 11A-11N and 12B, a control command may be provided from the external circuitry 271 outside the logic drive 300 to the dedicated control chip 260, dedicated control and I/O chip 266, DCIAC chip 267 or DCDI/OIAC chip 268 in the control block 360 or from the dedicated control chip 260, dedicated control and I/O chip 266, DCIAC chip 267 or DCDI/OIAC chip 268 in the control block 360 to the external circuitry 271 outside the logic drive 300.

III. Third Type of Interconnection for Logic Drive

Referring to FIGS. 11A-11N and 12C, one or more of the programmable interconnects 361 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the programmable interconnects 361 of the inter-chip interconnects 371 may couple one or more of the small I/O circuits 203 of each of the dedicated I/O chips 265 to one or more of the small I/O circuits 203 of all of the DPIIC chips 410. One or more of the programmable interconnects 361 of the inter-chip interconnects 371 may couple one or more of the small I/O circuits 203 of each of the dedicated I/O chips 265 to one or more of the small I/O circuits 203 of all the others of the dedicated I/O chips 265. One or more of the fixed interconnects 364 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the fixed interconnects 364 of the inter-chip interconnects 371 may couple one or more of the small I/O circuits 203 of each of the dedicated I/O chips 265 to one or more of the small I/O circuits 203 of all of the DPIIC chips 410. One or more of the fixed interconnects 364 of the inter-chip interconnects 371 may couple one or more of the small I/O circuits 203 of each of the dedicated I/O chips 265 to one or more of the small I/O circuits 203 of all the others of the dedicated I/O chips 265.

Referring to FIGS. 11A-11N and 12C, one or more of the programmable interconnects 361 of the inter-chip interconnects 371 may couple one or more of the small I/O circuits 203 of each of the DPIIC chips 410 to one or more of the small I/O circuits 203 of all of the standard commodity FPGA IC chips 200. One or more of the programmable interconnects 361 of the inter-chip interconnects 371 may couple one or more of the small I/O circuits 203 of each of the DPIIC chips 410 to one or more of the small I/O circuits 203 of all the others of the DPIIC chips 410. One or more of the fixed interconnects 364 of the inter-chip interconnects 371 may couple one or more of the small I/O circuits 203 of each of the DPIIC chips 410 to one or more of the small I/O circuits 203 of all of the standard commodity FPGA IC chips 200. One or more of the fixed interconnects 364 of the inter-chip interconnects 371 may couple one or more of the small I/O circuits 203 of each of the DPIIC chips 410 to one or more of the small I/O circuits 203 of all the others of the DPIIC chips 410.

Referring to FIGS. 11A-11N and 12C, one or more of the programmable interconnects 361 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200. One or more of the fixed interconnects 364 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200.

Referring to FIGS. 11A-11N and 12C, one or more of the programmable interconnects 361 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the standard commodity FPGA IC chips 200. One more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the standard commodity FPGA IC chips 200. One or more of the programmable interconnects 361 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the DPIIC chips 410. One more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the DPIIC chips 410. One or more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the NVMIC chips 250. One or more of the fixed interconnects 364 of the inter-chip interconnects 371 may couple one or more of the small I/O circuits 203 of the dedicated control chip 260, dedicated control and I/O chip 266, DCIAC chip 267 or DCDI/OIAC chip 268 in the control block 360 to one or more of the small I/O circuits 203 of all of the dedicated I/O chips 265. One or more of the large I/O circuits 341 of the dedicated control chip 260, dedicated control and I/O chip 266, DCIAC chip 267 or DCDI/OIAC chip 268 in the control block 360 may couple to the external circuitry 271 outside the logic drive 300.

Referring to FIGS. 11A-11N and 12C, one or more of the fixed interconnects 364 of the inter-chip interconnects 371 may couple one or more of the small I/O circuits 203 of each of the dedicated I/O chips 265 to one or more of the small I/O circuits 203 of all of the NVMIC chips 250. One or more of the fixed interconnects 364 of the inter-chip interconnects 371 may couple one or more of the small I/O circuits 203 of each of the dedicated I/O chips 265 to one or more of the small I/O circuits 203 of the others of the dedicated I/O chips 265. One or more of the large I/O circuits 341 of each of the dedicated I/O chips 265 may couple to the external circuitry 271 outside the logic drive 300.

Referring to FIGS. 11A-11N and 12C, one or more of the programmable interconnects 361 of the inter-chip interconnects 371 may couple one or more of the small I/O circuits 203 of each of the NVMIC chips 250 to one or more of the small I/O circuits 203 of all of the standard commodity FPGA IC chips 200. One or more of the fixed interconnects 364 of the inter-chip interconnects 371 may couple one or more of the small I/O circuits 203 of each of the NVMIC chips 250 to one or more of the small I/O circuits 203 of all of the standard commodity FPGA IC chips 200. One or more of the programmable interconnects 361 of the inter-chip interconnects 371 may couple one or more of the small I/O circuits 203 of each of the NVMIC chips 250 to one or more of the small I/O circuits 203 of all of the DPIIC chips 410. One or more of the fixed interconnects 364 of the inter-chip interconnects 371 may couple one or more of the small I/O circuits 203 of each of the NVMIC chips 250 to one or more of the small I/O circuits 203 of all of the DPIIC chips 410. One or more of the fixed interconnects 364 of the inter-chip interconnects 371 may couple one or more of the small I/O circuits 203 of each of the NVMIC chips 250 to one or more of the small I/O circuits 203 of the others of the NVMIC chips 250. One or more of the large I/O circuits 341 of each of the NVMIC chips 250 may couple to the external circuitry 271 outside the logic drive 300.

(1) Interconnection for Programming Memory Cells

Referring to FIGS. 11A-11N and 12C, in an aspect, the dedicated control chip 260, dedicated control and I/O chip 266, DCIAC chip 267 or DCDI/OIAC chip 268 in the control block 360 may generate a control command to one of its small I/O circuits 203 to drive the control command to a first one of the small I/O circuits 203 of one of the NVMIC chips 250 via one or more of the fixed interconnects 364 of the inter-chip interconnects 371. For said one of the NVMIC chips 250, the control command is driven by the first one of its small I/O circuits 203 to its internal circuits to command its internal circuits to pass the programming code to a second one of its small I/O circuits 203; the second one of its small I/O circuits 203 may drive the programming code to one of the small I/O circuits 203 of one of the DPIIC chips 410 via one or more of the fixed interconnects 364 of the inter-chip interconnects 371. For said one of the DPIIC chips 410, said one of its small I/O circuits 203 may drive the programming code to one of its memory cells 362 in one of its memory-array blocks 423 as seen in FIG. 9 via one or more of the fixed interconnects 364 of its intra-chip interconnects; the programming code may be stored in said one of its memory cells 362 for programming one of its pass/no-pass switches 258 and/or cross-point switches 379 as illustrated in FIGS. 2A-2F, 3A-3D and 7A-7C.

Alternatively, referring to FIGS. 11A-11N and 12C, the dedicated control chip 260, dedicated control and I/O chip 266, DCIAC chip 267 or DCDI/OIAC chip 268 in the control block 360 may generate a control command to one of its small I/O circuits 203 to drive the control command to a first one of the small I/O circuits 203 of one of the NVMIC chips 250 via one or more of the fixed interconnects 364 of the inter-chip interconnects 371. For said one of the NVMIC chips 250, the control command is driven by the first one of its small I/O circuits 203 to its internal circuits to command its internal circuits to pass the programming code to a second one of its small I/O circuits 203; the second one of its small I/O circuits 203 may drive the programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the programming code to one of its memory cells 362 via one or more of the fixed interconnects 364 of its intra-chip interconnects 502; the programming code may be stored in said one of its memory cells 362 for programming one of its pass/no-pass switches 258 and/or cross-point switches 379 as illustrated in FIGS. 2A-2F, 3A-3D and 7A-7C.

Alternatively, referring to FIGS. 11A-11N and 12C, the dedicated control chip 260, dedicated control and I/O chip 266, DCIAC chip 267 or DCDI/OIAC chip 268 in the control block 360 may generate a control command to one of its small I/O circuits 203 to drive the control command to a first one of the small I/O circuits 203 of one of the NVMIC chips 250 via one or more of the fixed interconnects 364 of the inter-chip interconnects 371. For said one of the NVMIC chips 250, the control command is driven by the first one of its small I/O circuits 203 to its internal circuits to command its internal circuits to pass the resulting value or programming code to a second one of its small I/O circuits 203; the second one of its small I/O circuits 203 may drive the resulting value or programming code to one of the small I/O circuits 203 of one of the standard commodity FPGA IC chips 200 via one or more of the fixed interconnects 364 of the inter-chip interconnects 371. For said one of the standard commodity FPGA IC chips 200, said one of its small I/O circuits 203 may drive the resulting value or programming code to one of its memory cells 490 via one or more of the fixed interconnects 364 of its intra-chip interconnects 502; the resulting value or programming code may be stored in said one of its memory cells 490 for programming one of its programmable logic blocks 201 as illustrated in FIG. 6A.

(2) Interconnection for Operation

Referring to FIGS. 11A-11N and 12C, in an aspect, one of the dedicated I/O chips 265 may have one of its large I/O circuits 341 to drive a signal from the external circuitry 271 outside the logic drive 300 to one of its small I/O circuits 203. For said one of the dedicated I/O chips 265, said one of its small I/O circuits 203 may drive the signal to a first one of the small I/O circuits 203 of one of the DPIIC chips 410 via one or more of the programmable interconnects 361 of the inter-chip interconnects 371. For said one of the dedicated DPIIC chips 410, the first one of its small I/O circuits 203 may drive the signal to one of its cross-point switches 379 via a first one of the programmable interconnects 361 of its intra-chip interconnects; said one of its cross-point switches 379 may switch the signal from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the signal to one of the small I/O circuits 203 of one of the standard commodity FPGA IC chips 200 via one or more of the programmable interconnects 361 of the inter-chip interconnects 371. For said one of the standard commodity FPGA IC chips 200, said one of its small I/O circuits 203 may drive the signal to one of its cross-point switches 379 through a first group of the programmable interconnects 361 and by-pass interconnects 279 of its intra-chip interconnects 502 as seen in FIG. 8G; said one of its cross-point switches 379 may switch the signal to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 6A.

Referring to FIGS. 11A-11N and 12C, in another aspect, for a first one of the standard commodity FPGA IC chips 200, one of its programmable logic blocks (LB) 201 as seen in FIG. 6A may generate an output Dout to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of a second one of the standard commodity FPGA IC chips 200 via one or more of the programmable interconnects 361 of the inter-chip interconnects 371. For the second one of the FPGA IC chips 200, said one of its small I/O circuits 203 may drive the output Dout to one of its cross-point switches 379 through a first group of the programmable interconnects 361 and by-pass interconnects 279 of its intra-chip interconnects 502 as seen in FIG. 8G; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of the inputs A0-A3 of one of its programmable logic blocks (LB) 201 as seen in FIG. 6A.

Referring to FIGS. 11A-11N and 12C, in another aspect, for one of the standard commodity FPGA IC chips 200, one of its programmable logic blocks (LB) 201 as seen in FIG. 6A may generate an output Dout to be passed to one of its cross-point switches 379 via a first group of the programmable interconnects 361 and by-pass interconnects 279 of its intra-chip interconnects 502; said one of its cross-point switches 379 may switch the output Dout to pass from the first group of the programmable interconnects 361 and by-pass interconnects 279 of its intra-chip interconnects 502 to a second group of the programmable interconnects 361 and by-pass interconnects 279 of its intra-chip interconnects 502 to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first group of the programmable interconnects 361 of its intra-chip interconnects; said one of its cross-point switches 379 may switch the output Dout to pass from the first group of the programmable interconnects 361 of its intra-chip interconnects to a second group of the programmable interconnects 361 of its intra-chip interconnects to be passed to a second one of its small I/O circuits 203; the second one of its small I/O circuits 203 may drive the output Dout to one of the small I/O circuits 203 of one of the dedicated I/O chips 265 via one or more of the programmable interconnects 361 of the inter-chip interconnects 371. For said one of the dedicated I/O chips 265, said one of its small I/O circuits 203 may drive the output Dout to one of its large I/O circuits 341 to be passed to the external circuitry 271 outside the logic drive 300.

(3) Interconnection for Controlling

Referring to FIGS. 11A-11N and 12C, for the dedicated control chip 260, dedicated control and I/O chip 266, DCIAC chip 267 or DCDI/OIAC chip 268 in the control block 360, one of its large I/O circuits 341 may receive or drive a control command from or to the external circuitry 271 outside the logic drive 300.

Alternatively, referring to FIGS. 11A-11N and 12C, one of the dedicated I/O chips 265 may have one of its large I/O circuits 341 to drive a control command from the external circuitry 271 outside the logic drive 300 to one of its small I/O circuits 203. For said one of the dedicated I/O chips 265, said one of its small I/O circuits 203 may drive the control command to one of the small I/O circuits 203 of the dedicated control chip 260, dedicated control and I/O chip 266, DCIAC chip 267 or DCDI/OIAC chip 268 in the control block 360 via one or more of the fixed interconnects 364 of the inter-chip interconnects 371.

Alternatively, referring to FIGS. 11A-11N and 12A, for the dedicated control chip 260, dedicated control and I/O chip 266, DCIAC chip 267 or DCDI/OIAC chip 268 in the control block 360, one of its small I/O circuits 203 may drive a control command to one of the small I/O circuits 203 of one of the dedicated I/O chips 265 via one or more of the fixed interconnects 364 of the inter-chip interconnects 371. For said one of the dedicated I/O chips 265, said one of its small I/O circuits 203 may drive the control command to one of its large I/O circuits 341 to be passed to the external circuitry 271 outside the logic drive 300.

Thereby, referring to FIGS. 11A-11N and 12A, a control command may be provided from the external circuitry 271 outside the logic drive 300 to the dedicated control chip 260, dedicated control and I/O chip 266, DCIAC chip 267 or DCDI/OIAC chip 268 in the control block 360 or from the dedicated control chip 260, dedicated control and I/O chip 266, DCIAC chip 267 or DCDI/OIAC chip 268 in the control block 360 to the external circuitry 271 outside the logic drive 300.

Algorithm for Data Loading to Memory Cells

Figure 13A:
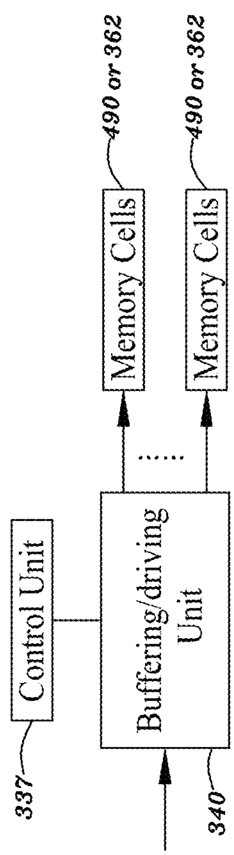
FIGS. 13A and 13B are block diagrams showing an algorithm for data loading to memory cells in accordance with an embodiment of the present application.

FIG. 13A is a block diagram showing an algorithm for data loading to memory cells in accordance with an embodiment of the present application. Referring to FIG. 13A, for loading data to the memory cells 490 and 362 of the standard commodity FPGA IC chip 200 as seen in FIGS. 8A-8J and to the memory cells 362 of the memory-array blocks 423 of the DPIIC chip 410 as seen in FIG. 9, a buffering/driving unit or buffer 340 may be provided for buffering data, such as the resulting values or programming codes, transmitted in series thereto and driving or amplifying the data in parallel to the memory cells 490 and 362 of the standard commodity FPGA IC chip 200 and/or to the memory cells 362 of the DPIIC chip 410. Furthermore, a control unit 337 may be provided for controlling multiple memory units 446, e.g., ones of SRAM cells of the first type as illustrated in FIG. 1A, of the buffering/driving unit 340 to couple in series to an input of the buffering/driving unit 340 and controlling the memory units 446 to couple in parallel to multiple respective outputs of the buffering/driving unit 340. The outputs of the buffering/driving unit 340 may couple respectively to multiple of the memory cells 490 and 362 of the standard commodity FPGA IC chip 200 as seen in FIGS. 8A-8J and/or couple respectively to multiple of the memory cells 362 of the memory-array blocks 423 of the DPIIC chip 410 as seen in FIG. 9.

Figure 13B:
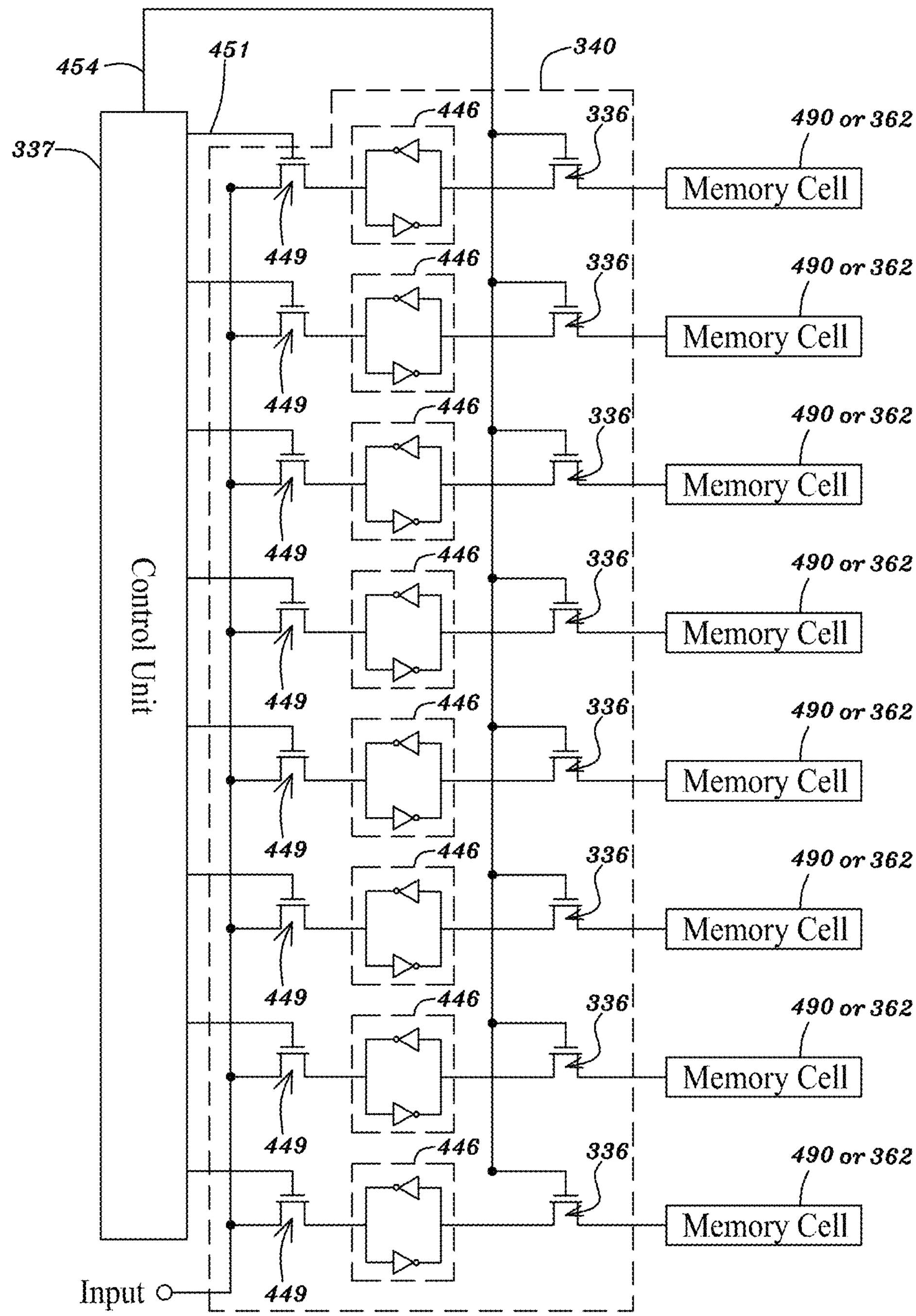

FIG. 13B is a circuit diagram showing architecture for data loading in accordance with an embodiment of the present application. Referring to FIG. 13B, in a serial-advanced-technology-attachment (SATA) standard, the buttering/driving unit 340 may include (1) the memory units 446, e.g., ones of SRAM cells of the first type as illustrated in FIG. 1A, (2) multiple switches 449, e.g., ones of SRAM cells of the first type as illustrated in FIG. 1A, each having a channel with an end coupling in parallel to each other or one another and the other end coupling in series to one of the memory units 446, and (3) multiple switches 336 each having a channel with an end coupling in series to one of the memory units 446 and the other end coupling in series to one of the memory cells 490 and 362 of the standard commodity FPGA IC chip 200 as seen in FIGS. 8A-8J or one of the memory cells 362 of the memory-array blocks 423 of the DPIIC chip 410 as seen in FIG. 9.

Referring to FIG. 13B, the control unit 337 couples to gate terminals of the switches 449 through multiple word lines 451, e.g., ones of SRAM cells of the first type as illustrated in FIG. 1A, and to gate terminals of the switches 336 through a word line 454. Thereby, the control unit 337 is configured to turn on one of the switches 449 and off the others of the switches 449 in each of first clock periods in each of clock cycles. The control unit 337 is configured to turn on all of the switches 336 in a second clock period in said each of the clock cycles and off all of the switches 336 in said each of the first clock periods in said each of the clock cycles. The control unit 337 is configured to turn off all of the switches 449 in the second clock period in said each of the clock cycles.

For example, referring to FIG. 13B, in a first one of the first clock periods in a first one of the clock cycles, the control unit 337 may turn on the bottommost one of the switches 449 and off the others of the switches 449, and thereby first data, such as a first one of the resulting values or programming codes, from the input of the buffering/driving unit 340 may pass through the channel of the bottommost one of the switches 449 to be latched or stored in the bottommost one of the memory units 446. Next, in second one of the first clock periods in the first one of the clock cycles, the control unit 337 may turn on the second bottom one of the switches 449 and off the others of the switches 449, and thereby second data, such as a second one of the resulting values or programming codes, from the input of the buffering/driving unit 340 may pass through the channel of the second bottom one of the switches 449 to be latched or stored in the second bottom one of the memory units 446. In the first one of the clock cycles, the control unit 337 may turn on the switches 449, in turn and one by one, and off the others of the switches 449 in the first clock periods, and thereby data, such as a first set of resulting values or programming codes, from the input of the buffering/driving unit 340 may, in turn and one by one, pass through the channels of the switches 449 to be latched or stored in the memory units 446, respectively. In the first one of the clock cycles, after the data from the input of the buffering/driving unit 340 are latched or stored, in turn and one by one, in all of the memory units 446, the control unit 337 may turn on all of the switches 336 and off all of the switches 449 in the second clock period, and thereby the data latched or stored in the memory units 446 may pass in parallel through the channels of the switches 336 to the memory cells 490 and/or 362 of the standard commodity FPGA IC chip 200 as seen in FIGS. 8A-8J and/or the memory cells 362 of the memory-array blocks 423 of the DPI IC chip 410 as seen in FIG. 9, respectively.

Next, referring to FIG. 13B, in a second one of the clock cycles, the control unit 337 and buffering/driving unit 340 may perform the same steps as illustrated above in the first one of the clock cycles. In the second one of the clock cycles, the control unit 337 may turn on the switches 449, in turn and one by one, and off the others of the switches 449 in the first clock periods, and thereby data, such as a second set of resulting values or programming codes, from the input of the buffering/driving unit 340 may, in turn and one by one, pass through the channels of the switches 449 to be latched or stored in the memory units 446, respectively. In the second one of the clock cycles, after the data from the input of the buffering/driving unit 340 are latched or stored, in turn and one by one, in all of the memory units 446, the control unit 337 may turn on all of the switches 336 and off all of the switches 449 in the second clock period, and thereby the data latched or stored in the memory units 446 may pass in parallel through the channels of the switches 336 to the memory cells 490 and/or 362 of the standard commodity FPGA IC chip 200 as seen in FIGS. 8A-8J and/or the memory cells 362 of the memory-array blocks 423 of the DPIIC chip 410 as seen in FIG. 9, respectively.

Referring to FIG. 13B, the above steps may be repeated for multiple times to have data, such as the resulting values or programming codes, from the input of the buffering/driving unit 340 to be loaded in the memory cells 490 and/or 362 of the standard commodity FPGA IC chip 200 as seen in FIGS. 8A-8J and/or the memory cells 362 of the memory-array blocks 423 of the DPIIC chip 410 as seen in FIG. 9. The buffering/driving unit 340 may latch the data from its single input and increase data bit-width to the memory cells 490 and/or 362 of the standard commodity FPGA IC chip 200 as seen in FIGS. 8A-8J and/or the memory cells 362 of the memory-array blocks 423 of the DPIIC chip 410 as seen in FIG. 9.

Alternatively, in a peripheral-component-interconnect (PCI) standard, referring to FIGS. 13A and 13B, a plurality of the buffering/driving unit 340 may be provided in parallel to buffer data, such as the resulting values or programming codes, in parallel from its inputs and drive or amplify the data to the memory cells 490 and/or 362 of the standard commodity FPGA IC chip 200 as seen in FIGS. 8A-8J and/or the memory cells 362 of the memory-array blocks 423 of the DPIIC chip 410 as seen in FIG. 9. Each of the buffering/driving units 340 may perform the same function as mentioned above.

I. First Type of Arrangement for Control Unit, Buffering/Driving Unit and Memory Cells for Standard Commodity FPGA IC Chip Referring to FIGS. 13A and 13B, in a case that a bit width between the standard commodity FPGA IC chip 200 as seen in FIGS. 8A-8J and an external circuitry thereof is 32 bits, the buffering/driving units 340 having the number of 32 may be set in parallel in the standard commodity FPGA IC chip 200 to buffer data, such as the resulting values or programming codes, from their 32 respective inputs coupling to the external circuitry, i.e., with a bit width of 32 bits in parallel, and drive or amplify the data to the memory cells 490 and/or 362 of the standard commodity FPGA IC chip 200 as seen in FIGS. 8A-8J. In each of the clock cycles, the control unit 337 set in the standard commodity FPGA IC chip 200 may turn on the switches 449, in turn and one by one, of each of the 32 buffering/driving units 340 and off the others of the switches 449 of said each of the 32 buffering/driving units 340 in the first clock periods, and thereby data, such as the resulting values or programming codes, from the input of each of the 32 buffering/driving units 340 may, in turn and one by one, pass through the channels of the switches 449 of said each of the 32 buffering/driving units 340 to be latched or stored in the memory units 446 of said each of the 32 buffering/driving units 340, respectively. In said each of the clock cycles, after the data from their 32 respective inputs in parallel are latched or stored, in turn and one by one, in all of the memory units 446 of the 32 buffering/driving units 340, the control unit 337 may turn on all of the switches 336 of the 32 buffering/driving units 340 and off all of the switches 449 of the 32 buffering/driving units 340 in the second clock period, and thereby the data latched or stored in all of the memory units 446 of the 32 buffering/driving units 340 may pass in parallel through the channels of the switches 336 of the 32 buffering/driving units 340 to the memory cells 490 and/or 362 of the standard commodity FPGA IC chip 200 as seen in FIGS. 8A-8J, respectively.

For the first type of standard commodity FPGA IC chip 200, each of the memory cells 490 for the look-up tables (LUTs) 210 may be an on-chip volatile memory cell referred to one 398 as illustrated in FIG. 1A or 1B or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell, and the memory cells 362 for the cross-point switches 379 may be an on-chip volatile memory cell referred to one 398 as illustrated in FIG. 1A or 1B or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell.

For each of the logic drives 300 as seen in FIGS. 11A-11N, each of the standard commodity FPGA IC chips 200 may be provided with the first arrangement for the control unit 337, buffering/driving unit 340 and memory cells 490 and 362 as mentioned above.

II. Second Type of Arrangement for Control Unit, Buffering/Driving Unit and Memory Cells for DPIIC Chip Referring to FIGS. 13A and 13B, in a case that a bit width between the DPIIC chip 410 as seen in FIG. 9 and an external circuitry thereof is 32 bits, the buffering/driving units 340 having the number of 32 may be set in parallel in the DPIIC chip 410 to buffer data, such as the programming codes, from their 32 respective inputs coupling to the external circuitry, i.e., with a bit width of 32 bits in parallel, and drive or amplify the data to the memory cells 362 of the memory-array blocks 423 of the DPIIC chip 410 as seen in FIG. 9. In each of the clock cycles, the control unit 337 set in the DPIIC chip 410 may turn on the switches 449, in turn and one by one, of each of the 32 buffering/driving units 340 and off the others of the switches 449 of said each of the 32 buffering/driving units 340 in the first clock periods, and thereby data, such as the programming codes, from the input of each of the 32 buffering/driving units 340 may, in turn and one by one, pass through the channels of the switches 449 of said each of the 32 buffering/driving units 340 to be latched or stored in the memory units 446 of said each of the 32 buffering/driving units 340, respectively. In said each of the clock cycles, after the data in parallel from their 32 respective inputs are latched or stored, in turn and one by one, in all of the memory units 446 of the 32 buffering/driving units 340, the control unit 337 may turn on all of the switches 336 of the 32 buffering/driving units 340 and off all of the switches 449 of the 32 buffering/driving units 340 in the second clock period, and thereby the data latched or stored in all of the memory units 446 of the 32 buffering/driving units 340 may pass in parallel through the channels of the switches 336 of the 32 buffering/driving units 340 to the memory cells 362 of the memory-array blocks 423 of the DPIIC chip 410 as seen in FIG. 9, respectively.

For the first type of DPIIC chip 410, each of the memory cells 362 for the cross-point switches 379 may be an on-chip volatile memory cell referred to one 398 as illustrated in FIG. 1A or 1B or an on-chip non-volatile memory cell such as floating-gate non-volatile memory cell, resistive randomaccess-memory (RRAM) cell, magnetoresistive random-access-memory (MRAM) cell or ferroelectric random-access-memory (FRAM) cell.

For each of the logic drives 300 as seen in FIGS. 11A-11N, each of the DPIIC chips 410 may be provided with the second arrangement for the control unit 337, buffering/driving unit 340 and memory cells 362 as mentioned above.

III. Third Type of Arrangement for Control Unit, Buffering/Driving Unit and Memory Cells for Logic Drive Referring to FIGS. 13A and 13B, the third arrangement for the control unit 337, buffering/driving unit 340 and memory cells 490 and 362 for the logic drive 300 as seen in FIGS. 11A-11N may be similar to the first arrangement for the control unit 337, buffering/driving unit 340 and memory cells 490 and 362 for each of the standard commodity FPGA IC chips 200 of the logic drive 300, but the difference therebetween is that the control unit 337 in the third arrangement is set in the dedicated control chip 260, dedicated control and I/O chip 266, DCIAC chip 267 or DCDI/OIAC chip 268 as seen in FIGS. 11A-11N, but instead is not set in any of the standard commodity FPGA IC chips 200 of the logic drives 300. The control unit 337 set in the dedicated control chip 260, dedicated control and I/O chip 266, DCIAC chip 267 or DCDI/OIAC chip 268 may (1) pass a control command to one of the switches 449 of the buffering/driving unit 340 in one of the standard commodity FPGA IC chips 200 through one of the word lines 451 provided by one or more of the fixed interconnects 364 of the inter-chip interconnects 371, or (2) pass a control command to the all switches 336 of the buffering/driving unit 340 in said one of the standard commodity FPGA IC chips 200 through the word line 454 provided by another of the fixed interconnects 364 of the inter-chip interconnects 371.

IV. Fourth Type of Arrangement for Control Unit, Buffering/Driving Unit and Memory Cells for Logic Drive Referring to FIGS. 13A and 13B, the fourth arrangement for the control unit 337, buffering/driving unit 340 and memory cells 362 for the logic drive 300 as seen in FIGS. 11A-11N may be similar to the second arrangement for the control unit 337, buffering/driving unit 340 and memory cells 362 for each of the DPIIC chips 410 of the logic drive 300, but the difference therebetween is that the control unit 337 in the fourth arrangement is set in the dedicated control chip 260, dedicated control and I/O chip 266, DCIAC chip 267 or DCDI/OIAC chip 268 as seen in FIGS. 11A-11N, but instead is not set in any of the DPIIC chips 410 of the logic drives 300. The control unit 337 set in the dedicated control chip 260, dedicated control and I/O chip 266, DCIAC chip 267 or DCDI/OIAC chip 268 may (1) pass a control command to one of the switches 449 of the buffering/driving unit 340 in one of the DPIIC chips 410 through one of the word lines 451 provided by one or more of the fixed interconnects 364 of the inter-chip interconnects 371, or (2) pass a control command to the all switches 336 of the buffering/driving unit 340 in said one of the DPIIC chips 410 through the word line 454 provided by another of the fixed interconnects 364 of the inter-chip interconnects 371.

V. Fifth Type of Arrangement for Control Unit, Buffering/Driving Unit and Memory Cells for Logic Drive Referring to FIGS. 13A and 13B, the fifth arrangement for the control unit 337, buffering/driving unit 340 and memory cells 490 and 362 for the logic drive 300 as seen in FIGS. 11B, 11E, 11F. 11H and 11J may be similar to the first arrangement for the control unit 337, buffering/driving unit 340 and memory cells 490 and 362 for each of the standard commodity FPGA IC chips 200 of the logic drive 300, but the difference therebetween is that both of the control unit 337 and buffering/driving unit 340 in the fifth arrangement are set in the dedicated control and I/O chip 266 or DCDI/OIAC chip 268 as seen in FIGS. 11B, 11E, 11F. 11H and 11J, but instead are not set in any of the standard commodity FPGA IC chips 200 of the logic drives 300. Data may be transmitted in series to the buffering/driving unit 340 in the dedicated control and I/O chip 266 or DCDI/OIAC chip 268 to be latched or stored in the memory units 446 of the buffering/driving unit 340. The buffering/driving unit 340 in the dedicated control and I/O chip 266 or DCDI/OIAC chip 268 may pass data in parallel from its memory units 446 to a group of the memory cells 490 and 362 of one of the standard commodity FPGA IC chips 200 through, in sequence, a parallel group of the small I/O circuits 203 of the dedicated control and I/O chip 266 or DCDI/OIAC chip 268, a parallel group of the fixed interconnects 364 of the inter-chip interconnects 371 and a parallel group of the small I/O circuits 203 of said one of the standard commodity FPGA IC chips 200.

VI. Sixth Type of Arrangement for Control Unit, Buffering/Driving Unit and Memory Cells for Logic Drive Referring to FIGS. 13A and 13B, the sixth arrangement for the control unit 337, buffering/driving unit 340 and memory cells 362 for the logic drive 300 as seen in FIGS. 11B, 11E, 11F. 11H and 11J may be similar to the second arrangement for the control unit 337, buffering/driving unit 340 and memory cells 490 and 362 for each of the DPIIC chips 410 of the logic drive 300, but the difference therebetween is that both of the control unit 337 and buffering/driving unit 340 in the sixth arrangement are set in the dedicated control and I/O chip 266 or DCDI/OIAC chip 268 as seen in FIGS. 11B, 11E, 11F. 11H and 11J, but instead are not set in any of the DPIIC chips 410 of the logic drives 300. Data may be transmitted in series to the buffering/driving unit 340 in the dedicated control and I/O chip 266 or DCDI/OIAC chip 268 to be latched or stored in the memory units 446 of the buffering/driving unit 340. The buffering/driving unit 340 in the dedicated control and I/O chip 266 or DCDI/OIAC chip 268 may pass data in parallel from its memory units 446 to a group of the memory cells 362 of one of the DPIIC chips 410 through, in sequence, a parallel group of the small I/O circuits 203 of the dedicated control and I/O chip 266 or DCDI/OIAC chip 268, a parallel group of the fixed interconnects 364 of the inter-chip interconnects 371 and a parallel group of the small I/O circuits 203 of said one of the DPIIC chips 410.

VII. Seventh Type of Arrangement for Control Unit, Buffering/Driving Unit and Memory Cells for Logic Drive Referring to FIGS. 13A and 13B, the seventh arrangement for the control unit 337, buffering/driving unit 340 and memory cells 490 and 362 for the logic drive 300 as seen in FIGS. 11A-11N may be similar to the first arrangement for the control unit 337, buffering/driving unit 340 and memory cells 490 and 362 for each of the standard commodity FPGA IC chips 200 of the logic drive 300, but the difference therebetween is that the control unit 337 in the seventh arrangement is set in the dedicated control chip 260, dedicated control and I/O chip 266, DCIAC chip 267 or DCDI/OIAC chip 268 as seen in FIGS. 11A-11N, but instead is not set in any of the standard commodity FPGA IC chips 200 of the logic drives 300. Further, the buffering/driving unit 340 in the seventh arrangement is set in one of the dedicated I/O chips 265 as seen in FIGS. 11A-11N, but instead is not set in any of the standard commodity FPGA IC chips 200 of the logic drives 300. The control unit 337 set in the dedicated control chip 260, dedicated control and I/O chip 266, DCIAC chip 267 or DCDI/OIAC chip 268 may (1) pass a control command to one of the switches 449 of the buffering/driving unit 340 in one of the dedicated I/O chips 265 through one of the word lines 451 provided by one of the fixed interconnects 364 of the inter-chip interconnects 371, or (2) pass a control command to the all switches 336 of the buffering/driving unit 340 in said one of the dedicated I/O chips 265 through the word line 454 provided by another of the fixed interconnects 364 of the inter-chip interconnects 371. Data may be transmitted in series to the buffering/driving unit 340 in said one of the dedicated I/O chips 265 to be latched or stored in the memory units 446 of the buffering/driving unit 340. The buffering/driving unit 340 in said one of the dedicated I/O chips 265 may pass data in parallel from its memory units 446 to a group of the memory cells 490 and 362 of one of the standard commodity FPGA IC chips 200 through, in sequence, a parallel group of the small I/O circuits 203 of said one of the dedicated I/O chips 265, a parallel group of the fixed interconnects 364 of the inter-chip interconnects 371 and a parallel group of the small I/O circuits 203 of said one of the standard commodity FPGA IC chips 200.

VIII. Eighth Type of Arrangement for Control Unit, Buffering/Driving Unit and Memory Cells for Logic Drive Referring to FIGS. 13A and 13B, the eighth arrangement for the control unit 337, buffering/driving unit 340 and memory cells 362 for the logic drive 300 as seen in FIGS. 11A-11N may be similar to the first arrangement for the control unit 337, buffering/driving unit 340 and memory cells 362 for each of the DPIIC chips 410 of the logic drive 300, but the difference therebetween is that the control unit 337 in the eighth arrangement is set in the dedicated control chip 260, dedicated control and I/O chip 266, DCIAC chip 267 or DCDI/OIAC chip 268 as seen in FIGS. 11A-11N, but instead is not set in any of the DPIIC chips 410 of the logic drives 300. Further, the buffering/driving unit 340 in the eighth arrangement is set in one of the dedicated I/O chips 265 as seen in FIGS. 11A-11N, but instead is not set in any of the DPIIC chips 410 of the logic drives 300. The control unit 337 set in the dedicated control chip 260, dedicated control and I/O chip 266, DCIAC chip 267 or DCDI/OIAC chip 268 may (1) pass a control command to one of the switches 449 of the buffering/driving unit 340 in one of the dedicated I/O chips 265 through one of the word lines 451 provided by one of the fixed interconnects 364 of the inter-chip interconnects 371, or (2) pass a control command to the all switches 336 of the buffering/driving unit 340 in said one of the dedicated I/O chips 265 through the word line 454 provided by another of the fixed interconnects 364 of the inter-chip interconnects 371. Data may be transmitted in series to the buffering/driving unit 340 in said one of the dedicated I/O chips 265 to be latched or stored in the memory units 446 of the buffering/driving unit 340. The buffering/driving unit 340 in said one of the dedicated I/O chips 265 may pass data in parallel from its memory units 446 to a group of the memory cells 490 and 362 of one of the DPIIC chips 410 through, in sequence, a parallel group of the small I/O circuits 203 of said one of the dedicated I/O chips 265, a parallel group of the fixed interconnects 364 of the inter-chip interconnects 371 and a parallel group of the small I/O circuits 203 of said one of the DPIIC chips 410.

First Interconnection Scheme for Chip (FISC) and Process for Forming the Same

Each of the standard commodity FPGA IC chips 200, DPIIC chips 410, dedicated I/O chips 265, dedicated control chip 260, dedicated control and I/O chip 266, IAC chip 402, DCIAC chip 267, DCDI/OIAC chip 268, DRAM chips 321 and PCIC chip 269 may be formed by following steps.

Figure 14A:
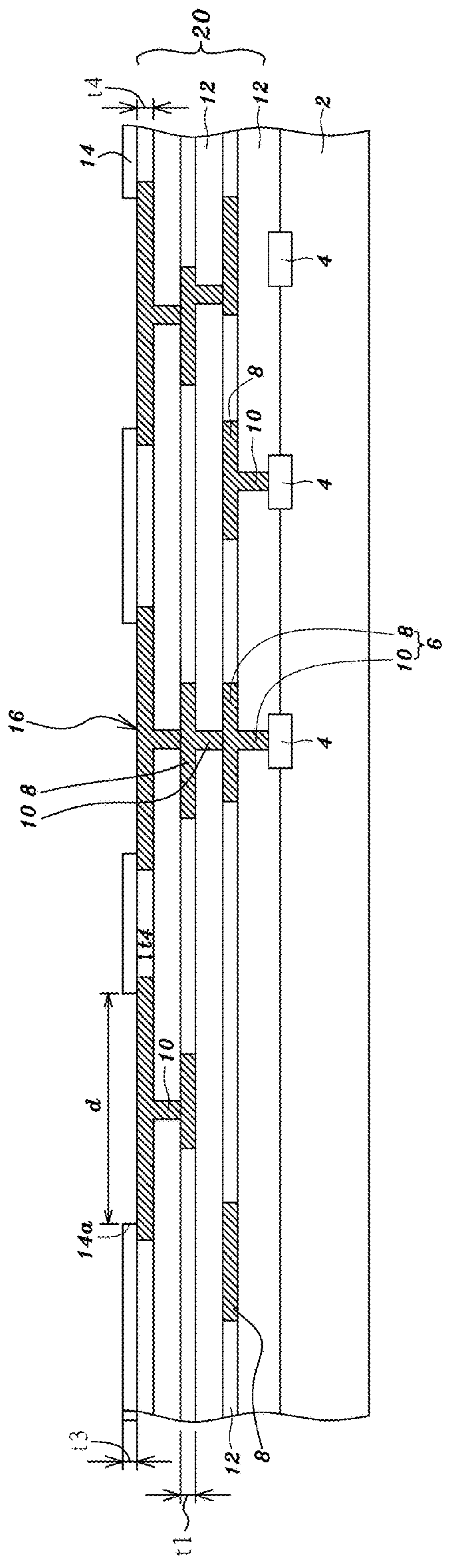
FIG. 14A is a cross-sectional view of a semiconductor wafer in accordance with an embodiment of the present application.

FIG. 14A is a cross-sectional view of a semiconductor wafer in accordance with an embodiment of the present application. Referring to FIG. 14A, a semiconductor substrate or semiconductor blank wafer 2 may be a silicon substrate or silicon wafer, a GaAs substrate, GaAs wafer, a SiGe substrate, SiGe wafer, Silicon-On-Insulator (SOI) substrate with the substrate wafer size, for example 8", 12" or 18" in the diameter.

Figure 31A:
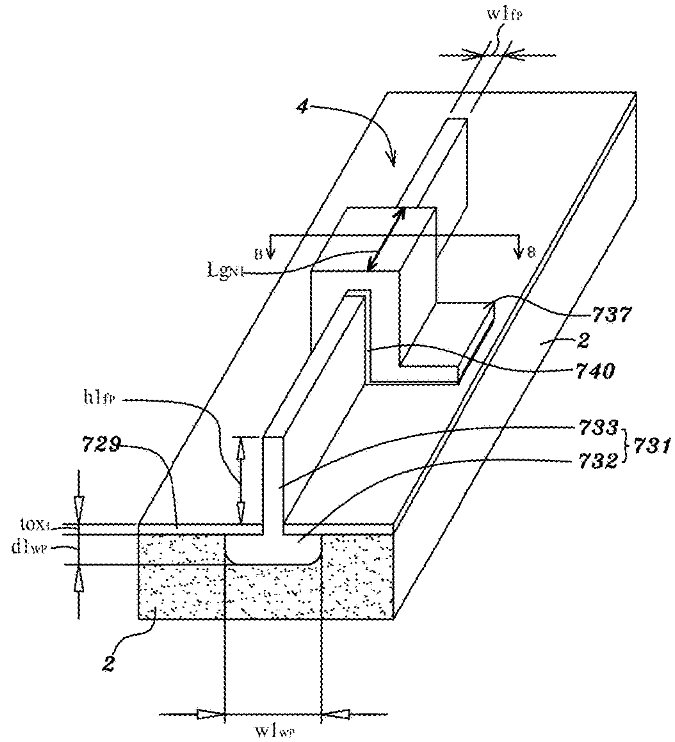
FIG. 31A is a schematically perspective view showing a structure of a fin field effect transistor in accordance with an embodiment of the present application.
Figure 31B:
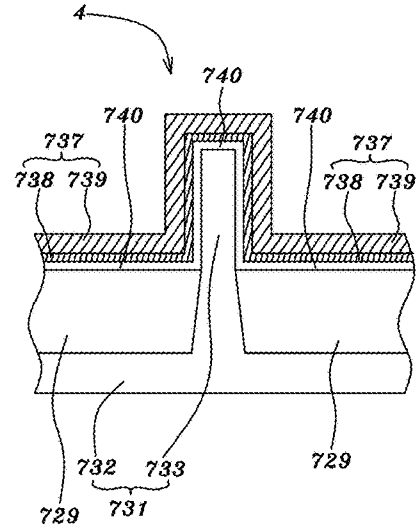
FIG. 31B is a cross-sectional view showing a structure of a fin field effect transistor along a cross-sectional line B-B of FIG. 31A in accordance with an embodiment of the present application.
Figure 32A:
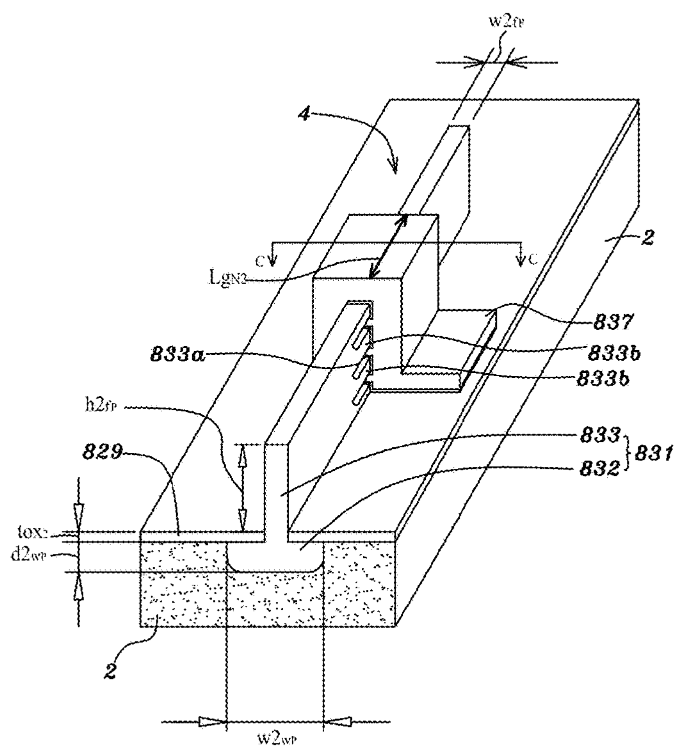
FIG. 32A is a schematically perspective view showing a structure of a gate-all-around field effect transistor in accordance with an embodiment of the present application.
Figure 32B:
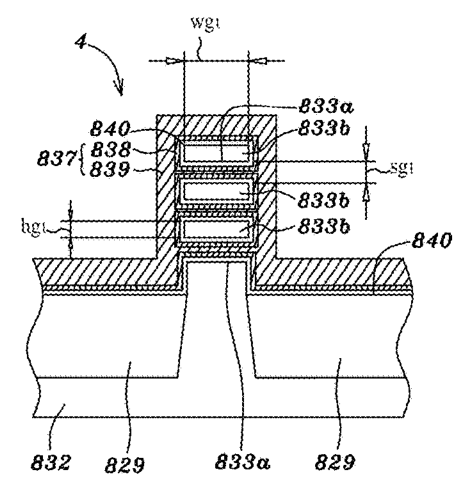
FIG. 32B is a cross-sectional view showing a structure of a gate-all-around field effect transistor along a cross-sectional line C-C of FIG. 32A in accordance with an embodiment of the present application.

Referring to FIG. 14A, multiple semiconductor devices 4 are formed in or over a semiconductor-device area of the semiconductor substrate 2. The semiconductor devices 4 may comprise a memory cell, a logic circuit, a passive device, such as a resistor, a capacitor, an inductor or a filter, or an active device, such as p-channel MOS device, n-channel MOS device, CMOS (Complementary Metal Oxide Semiconductor) device, BJT (Bipolar Junction Transistor) device, BiCMOS (Bipolar CMOS) device, Fin Field-Effect-Transistor (FinFET) as seen in FIGS. 31A and 31B or Gate-All-Around Field-Effect-Transistor (GAAFET) as seen in FIGS. 32A and 32B, FINFET on Silicon-On-Insulator (FINFET SOI), Fully Depleted Silicon-On-Insulator (FDSOI) MOSFET, Partially Depleted Silicon-On-Insulator (PDSOI) MOSFET or conventional MOSFET, used for the transistors of the standard commodity FPGA IC chips 200, DPIIC chips 410, dedicated I/O chips 265, dedicated control chip 260, dedicated control and I/O chip 266, IAC chip 402, DCIAC chip 267, DCDI/OIAC chip 268, NVMIC chips 250 and PCIC chip 269.

With regards to the logic drive 300 as seen in FIGS. 11A-11N, the semiconductor devices 4 may compose the multiplexer 211 of the logic blocks (LB) 201, memory cells 490 for the look-up table 210 of the logic blocks (LB) 201, memory cells 362 for the pass/no-pass switches 258, pass/no-pass switches 258, cross-point switches 379 and small I/O circuits 203, as illustrated in FIGS. 8A-8J, for each of its standard commodity FPGA IC chips 200. The semiconductor devices 4 may compose the memory cells 362 for the pass/no-pass switches 258, pass/no-pass switches 258, cross-point switches 379 and small I/O circuits 203, as illustrated in FIG. 9, for each of its DPIIC chips 410. The semiconductor devices 4 may compose the large and small I/O circuits 341 and 203, as illustrated in FIG. 10, for each of its dedicated I/O chips 265, its dedicated control and I/O chip 266 or its DCDI/OIAC chip 268. The semiconductor devices 4 may compose the control unit 337 as seen in FIGS. 13A and 13B set in each of its standard commodity FPGA IC chips 200, each of its DPIIC chips 410, its dedicated control chip 260, its dedicated control and I/O chip 266, its DCIAC chip 267 or its DCDI/OIAC chip 268. The semiconductor devices 4 may compose the buffering/driving unit 340 as seen in FIGS. 13A and 13B set in each of its standard commodity FPGA IC chips 200, each of its DPIIC chips 410, each of its dedicated I/O chips 265, its dedicated control and I/O chip 266 or its DCDI/OIAC chip 268.

Referring to FIG. 14A, a first interconnection scheme 20, connected to the semiconductor devices 4, is formed over the semiconductor substrate 2. The first interconnection scheme 20 in, on or of the Chip (FISC) is formed over the semiconductor substrate 2 by a wafer process. The FISC 20 may comprise 4 to 15 layers, or 6 to 12 layers of interconnection metal layers 6 (only three layers are shown) patterned with multiple metal pads, lines or traces 8 and multiple metal vias 10. The metal pads, lines or traces 8 and metal vias 10 of the FISC 20 may be used for the programmable and fixed interconnects 361 and 364 of the intra-chip interconnects 502, as seen in FIG. 8A, of each of the standard commodity FPGA IC chips 200. The first interconnection scheme 20 of the FISC 20 may include multiple insulating dielectric layers 12 and multiple interconnection metal layers 6 each in neighboring two of the insulating dielectric layers 12. Each of the interconnection metal layers 6 of the FISC 20 may include the metal pads, lines or traces 8 at a top portion thereof and the metal vias 10 at a bottom portion thereof. One of the insulating dielectric layers 12 of the FISC 20 may be between the metal pads, lines or traces 8 of neighboring two of the interconnection metal layers 6, a top one of which may have the metal vias 10 in said one of the insulating dielectric layers 12. For each of the interconnection metal layers 6 of the FISC 20, its metal pads, lines or traces 8 may have a thickness t1 of less than 3 μm (such as between 3 nm and 500 nm, between 10 nm and 1,000 nm or between 10 nm and 3,000 nm, or thinner than or equal to 5 nm, 10 nm, 30 nm, 50 nm, 100 nm, 200 nm, 300 nm, 500 nm, or 1,000 nm) and may have a width, for example, between 3 nm and 500 nm, or between 10 nm and 1,000 nm, or, narrower than 5 nm, 10 nm, 20 nm, 30 nm, 70 nm, 100 nm, 300 nm, 500 nm or 1,000 nm. For example, the metal pads, lines or traces 8 and metal vias 10 of the FISC 20 are principally made of copper by a damascene process such as single-damascene process or double-damascene process, mentioned as below. For each of the interconnection metal layers 6, its metal pads, lines or traces 8 may include a copper layer having a thickness of less than 3 μm (such as between 0.2 and 2 μm). Each of the insulating dielectric layers 12 of the FISC 20 may have a thickness between, for example, 3 nm and 500 nm, or between 10 nm and 1,000 nm, or thinner than 5 nm, 10 nm, 30 nm, 50 nm, 100 nm, 200 nm, 300 nm, 500 nm or 1,000 nm.

I. Single Damascene Process for FISC

Figure 14B:
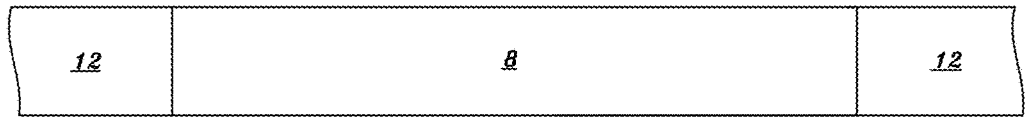
FIGS. 14B-14H are cross-sectional views showing a single damascene process is performed to form a first interconnection scheme in accordance with an embodiment of the present application.

In the following, a single damascene process for the FISC 20 is illustrated in FIGS. 14B-14H. Referring to FIG. 14B, a first insulating dielectric layer 12 is provided and multiple metal vias 10 or metal pads, lines or traces 8 (only one is shown) having exposed top surfaces are provided in the first insulating dielectric layer 12. A top-most layer of the first insulating dielectric layer 12 may be, for example, a low k dielectric layer, such as SiOC layer.

Figure 14C:
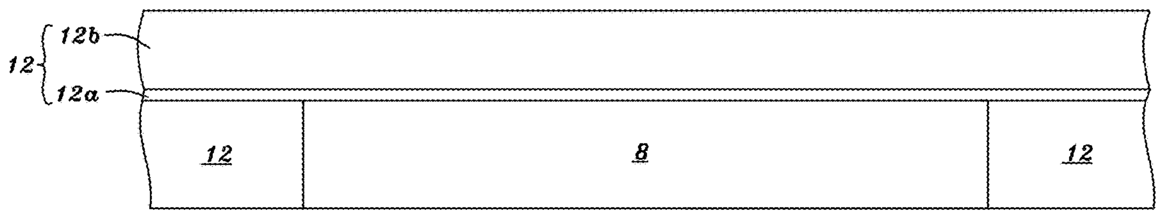

Referring to FIG. 14C, a chemical vapor deposition (CVD) method may be performed to deposit a second insulating dielectric layer 12 (upper one) on or over the first insulating dielectric layer 12 (lower one) and on the exposed vias 10 or metal pads, lines or traces 8 in the first insulating dielectric layer 12. The second insulting dielectric layer 12 (upper one) may be formed by (a) depositing a bottom differentiate etch-stop layer 12*a*, for example, a Silicon Carbon Nitride layer (SiCN), on the top-most layer of the first insulting dielectric layer 12 (lower one) and on the exposed top surfaces of the vias 10 or metal pads, lines or traces 8 in the first insulating dielectric layer 12 (lower one), and (b) next depositing a low k dielectric layer 12*b*, for example, a SiOC layer, on the bottom differentiate etch-stop layer 12*a*. The low k dielectric layer 12*b* may have low k dielectric material having a dielectric constant smaller than that of the $SiO_2$ material. The SiCN, SiOC, and $SiO_2$ layers may be deposited by CVD methods. The material used for the first and second insulating dielectric layers 12 of the FISC 20 comprises inorganic material, or material compounds comprising silicon, nitrogen, carbon, and/or oxygen.

Figure 14D:
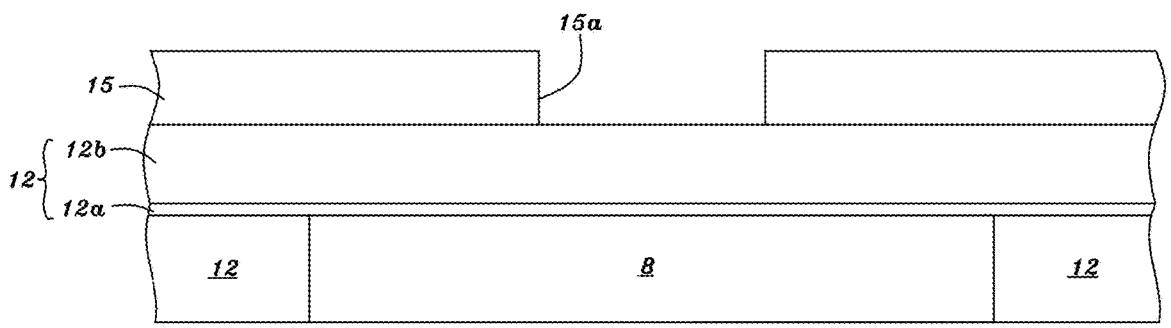
Figure 14E:
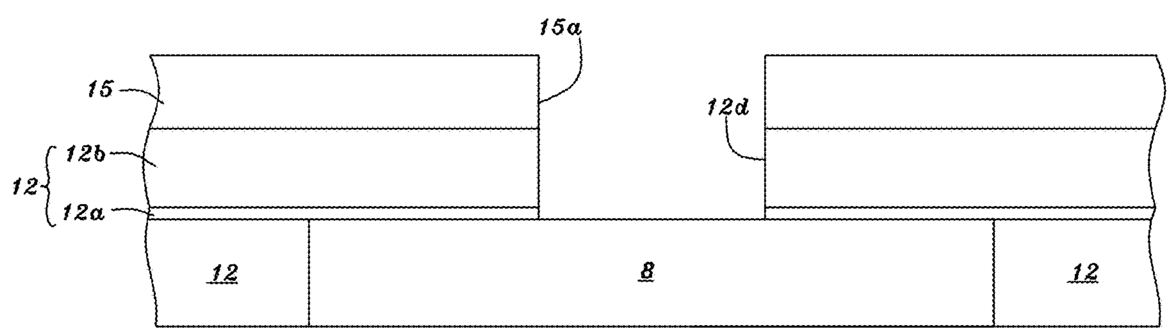
Figure 14F:
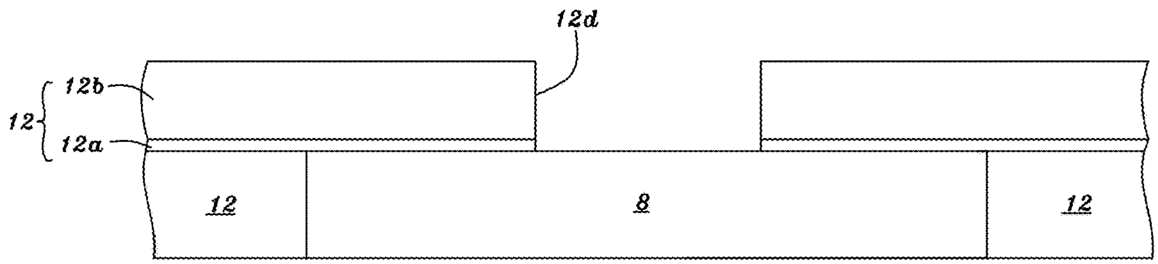

Next, referring to FIG. 14D, a photoresist layer 15 is coated on the second insulting dielectric layer 12 (upper one), and then the photoresist layer 15 is exposed and developed to form multiple trenches or openings 15*a* (only one is shown) in the photoresist layer 15. Next, referring to FIG. 14E, an etching process is performed to form trenches or openings 12*d* (only one is shown) in the second insulating dielectric layer 12 (upper one) and under the trenches or openings 15*a* in the photoresist layer 15. Next, referring to FIG. 14F, the photoresist layer 15 may be removed.

Figure 14G:
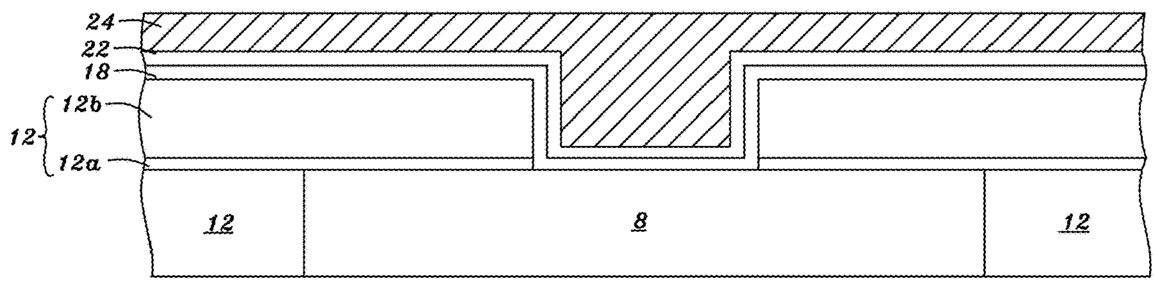

Next, referring to FIG. 14G, an adhesion layer 18 may be deposited on a top surface of the second insulating dielectric layer 12 (upper one), a sidewall of the trenches or openings 12*d* in the second insulating dielectric layer 12 (upper one) and a top surface of the vias 10 or metal pads, lines or traces 8 in the first insulating dielectric layer 12 (lower one) by, for example, sputtering or Chemical Vapor Depositing (CVD) a titanium (Ti) or titanium nitride (TiN) layer 18 (with thickness for example, between 1 nm and 50 nm). Next, an electroplating seed layer 22 may be deposited on the adhesion layer 18 by, for example, sputtering or CVD depositing a copper seed layer 22 (with a thickness, for example, between 3 nm and 200 nm) on the adhesion layer 18. Next, a copper layer 24 (with a thickness, for example, between 10 nm and 3,000 nm, 10 nm and 1,000 nm or 10 nm and 500 nm) may be electroplated on the copper seed layer 22.

Figure 14H:
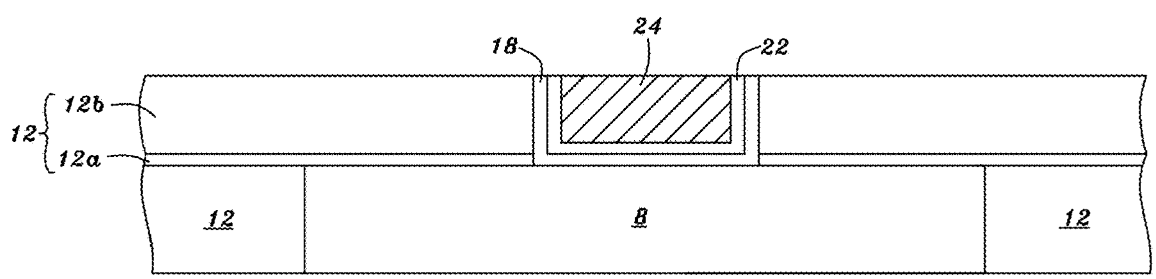

Next, referring to FIG. 14H, a chemical-mechanical polishing (CMP) process may be applied to remove the adhesion layer 18, electroplating seed layer 22 and copper layer 24 outside the trenches or openings 12*d* in the second insulating dielectric layer 12 (upper one) until the top surface of the second insulating dielectric layer 12 (upper one) is exposed. The metals left or remained in trenches or openings 12*d* in the second insulating dielectric layer 12 (upper one) are used as the metal vias 10 or metal pads, lines or traces 8 for each of the interconnection metal layers 6 of the FISC 20.

In the single-damascene process, the copper electroplating process step and the CMP process step are performed for the metal pads, lines or traces 8 of a lower one of the interconnection metal layers 6, and are then performed sequentially again for the metal vias 10 of an upper one of the interconnection metal layers 6 in the insulating dielectric layer 12 on the lower one of the interconnection metal layers 6. In other words, in the single damascene copper process, the copper electroplating process step and the CMP process step are performed two times for forming the metal pads, lines or traces 8 of the lower one of the interconnection metal layers 6, and metal vias 10 of the upper one of the interconnection metal layers 6 in the insulating dielectric layer 12 on the lower one of interconnection metal layers 6.

II. Double Damascene Process for FISC

Figure 14I:
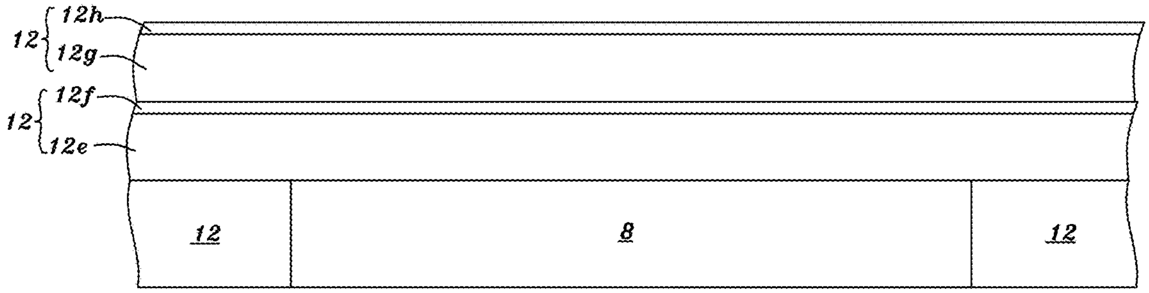
FIGS. 14I-14Q are cross-sectional views showing a double damascene process is performed to form a first interconnection scheme in accordance with an embodiment of the present application.

Alternatively, a double damascene process may be performed for fabricating the metal vias 10 and metal pads, lines or traces 8 of the FISC 20, as illustrated in FIGS. 14I-14Q. Referring to FIG. 14I, a first insulating dielectric layer 12 is provided and multiple metal pads, lines or traces 8 (only one is shown) having exposed top surfaces are provided in the first insulating dielectric layer 12. A top-most layer of the first insulating dielectric layer 12 may be, for example, a Silicon Carbon Nitride layer (SiCN) or Silicon Nitride (SiN). Next, a dielectric stack layer comprising second and third insulating dielectric layers 12 are deposited on the top-most layer of the first insulting dielectric layer 12 and the exposed top surfaces of metal pads, lines or traces 8 in the first insulating dielectric layer 12. The dielectric stack layer comprises, from bottom to top, (a) a bottom low k dielectric layer 12*e*, such as SiOC layer, (to be used as an inter-metal dielectric layer to have the metal vias 10 formed therein) on the first insulating dielectric layer 12 (lower one), (b) a middle differentiate etch-stop layer 12*f*, such as Silicon Carbon Nitride layer (SiCN) or Silicon Nitride layer (SiN), on the bottom low k dielectric layer 12*e*, (c) a top low k SiOC layer 12*g* (to be used as the insulating dielectrics between the metal pads, lines or traces 8 in or of the same interconnection metal layer 6) on the middle differentiate etch-stop layer 12*f*, and (d) a top differentiate etch-stop layer 12*h*, such as Silicon Carbon Nitride layer (SiCN) or Silicon Nitride (SiN) layer, on the top low k SiOC layer 12*g*. All layers of SiCN, SiN or SiOC may be deposited by CVD methods. The bottom low k dielectric layer 12*e* and middle differentiate etch-stop layer 12*f* may compose the second insulating dielectric layer 12 (middle one); the top low k SiOC layer 12*g* and top differentiate etch-stop layer 12*h* may compose the third insulating dielectric layer 12 (top one).

Figure 14J:
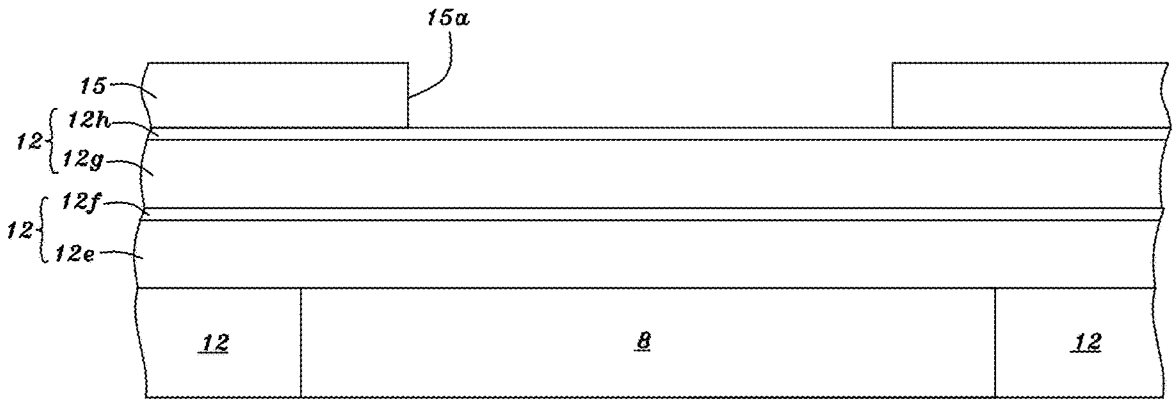
Figure 14K:
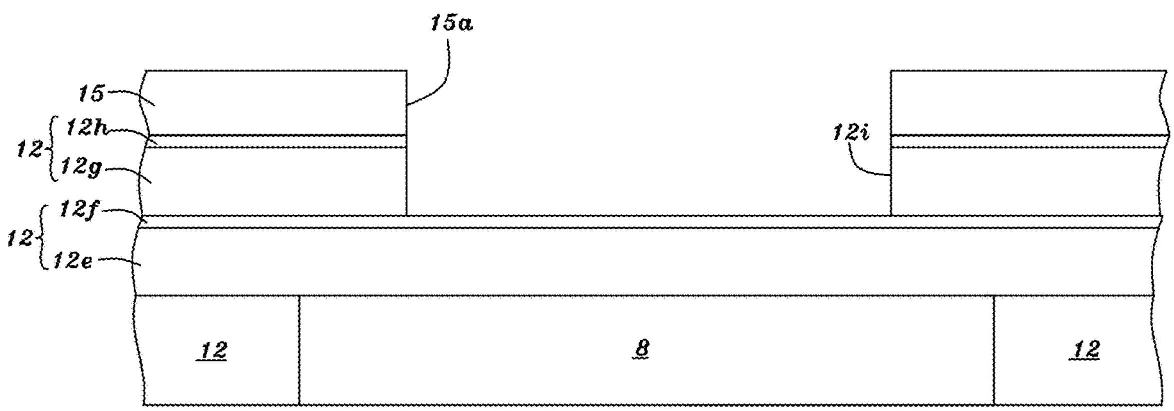
Figure 14L:
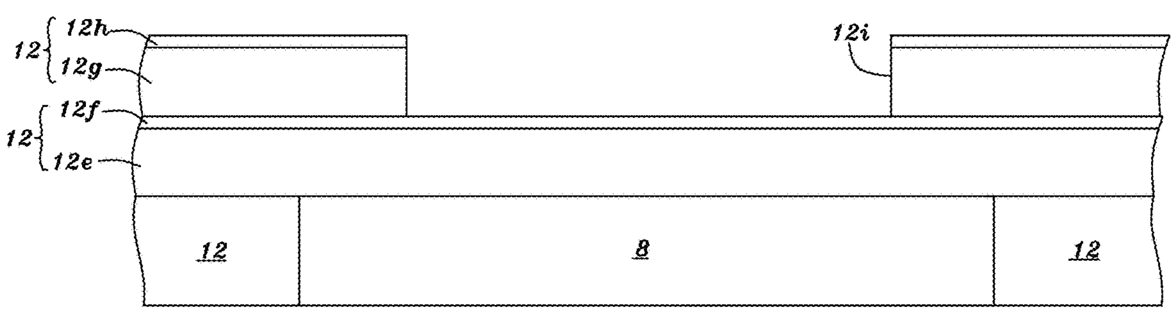

Next, referring to FIG. 14J, a first photoresist layer 15 is coated on the top differentiate etch-stop layer 12*h* of the third insulting dielectric layer 12 (top one), and then the first photoresist layer 15 is exposed and developed to form multiple trenches or openings 15*a* (only one is shown) in the first photoresist layer 15 to expose the top differentiate etch-stop layer 12*h* of the third insulting dielectric layer 12 (top one). Next, referring to FIG. 14K, an etching process is performed to form trenches or top openings 12*i* (only one is shown) in the third insulating dielectric layer 12 (top one) and under the trenches or openings 15*a* in the first photoresist layer 15 and to stop at the middle differentiate etch-stop layer 12*f* of the second insulting dielectric layer 12 (middle one) for the later double-damascene copper process to from the metal pads, lines or traces 8 of the interconnection metal layer 6. Next, referring to FIG. 14L, the first photoresist layer 15 may be removed.

Figure 14M:
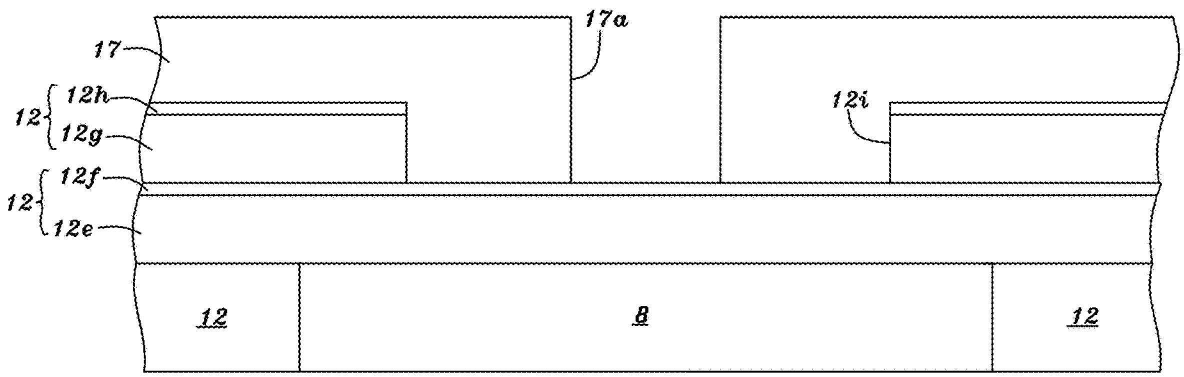
Figure 14N:
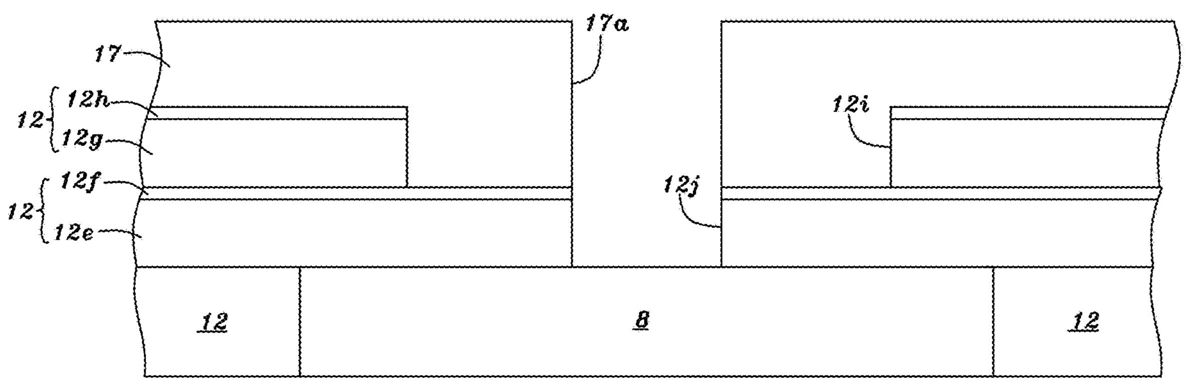
Figure 14O:
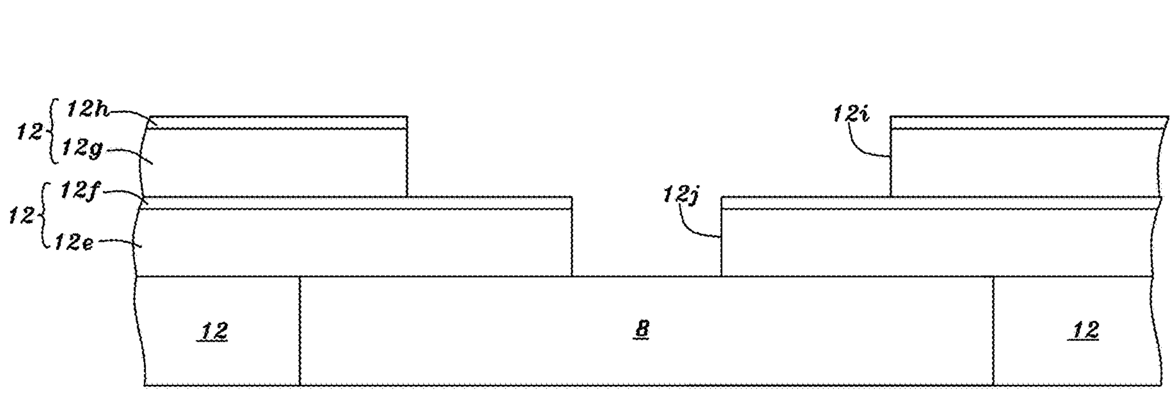

Next, referring to FIG. 14M, a second photoresist layer 17 is coated on the top differentiate etch-stop layer 12*h* of the third insulting dielectric layer 12 (top one) and the middle differentiate etch-stop layer 12*f* of the second insulting dielectric layer 12 (middle one), and then the second photoresist layer 17 is exposed and developed to form multiple trenches or openings 17*a* (only one is shown) in the second photoresist layer 17 to expose the middle differentiate etch-stop layer 12*f* of the second insulting dielectric layer 12 (middle one). Next, referring to FIG. 14N, an etching process is performed to form holes or bottom openings 12*j* (only one is shown) in the second insulating dielectric layer 12 (middle one) and under the trenches or openings 17*a* in the second photoresist layer 17 and to stop at the metal pads, lines or traces 8 (only one is shown) in the first insulating dielectric layer 12 for the later double-damascene copper process to from the metal vias 10 in the second insulating dielectric layer 12, i.e., inter-metal dielectric layer. Next, referring to FIG. 14O, the second photoresist layer 17 may be removed. The second and third insulating dielectric layers 12 (middle and upper ones) may compose a dielectric stack layer. One of the trenches or top openings 12*i* in the top portion of the dielectric stack layer, i.e., third insulating dielectric layer 12 (upper one), may overlap one of the bottom openings or holes 12*j* in the bottom portion of the dielectric stack layer, i.e., second insulating dielectric layer 12 (middle one), and have a size larger than that of said one of the bottom openings or holes 12*j*. In other words, the bottom openings or holes 12*j* in the bottom portion of the dielectric stack layer, i.e., second insulating dielectric layer 12 (middle one), are inside or enclosed by the trenches or top openings 12*i* in the top portion of the dielectric stack layer, i.e., third insulating dielectric layer 12 (upper one), from a top view.

Figure 14P:
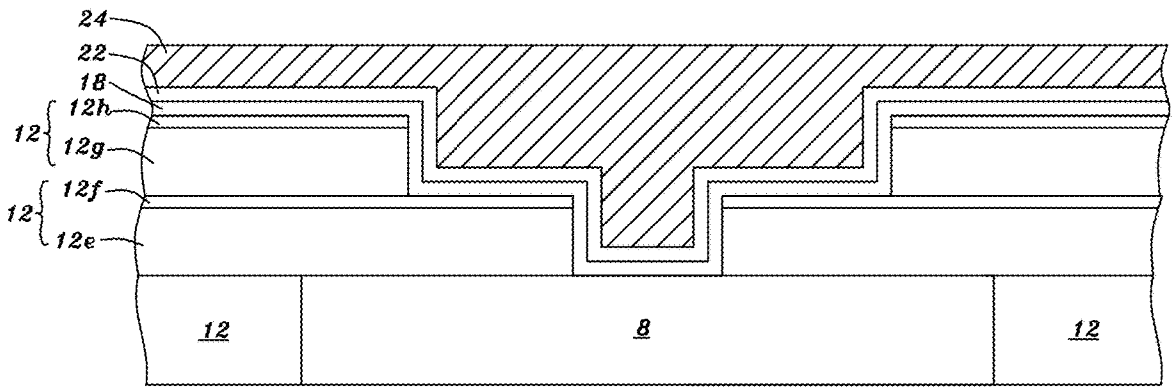

Next, referring to FIG. 14P, an adhesion layer 18 may be deposited on top surfaces of the second and third insulating dielectric layers 12 (middle and upper ones), a sidewall of the trenches or top openings 12*i* in the third insulating dielectric layer 12 (upper one), a sidewall of the holes or bottom openings 12*j* in the second insulating dielectric layer 12 (middle one) and a top surface of the metal pads, lines or traces 8 in the first insulating dielectric layer 12 (bottom one) by, for example, sputtering or Chemical Vapor Depositing (CVD) a titanium (Ti) or titanium nitride (TiN) layer 18 (with thickness for example, between 1 nm and 50 nm). Next, an electroplating seed layer 22 may be deposited on the adhesion layer 18 by, for example, sputtering or CVD depositing a copper seed layer 22 (with a thickness, for example, between 3 nm and 200 nm) on the adhesion layer 18. Next, a copper layer 24 (with a thickness, for example, between 20 nm and 6,000 nm, 10 nm and 3,000 nm or 10 nm and 1,000 nm) may be electroplated on the copper seed layer 22.

Figure 14Q:
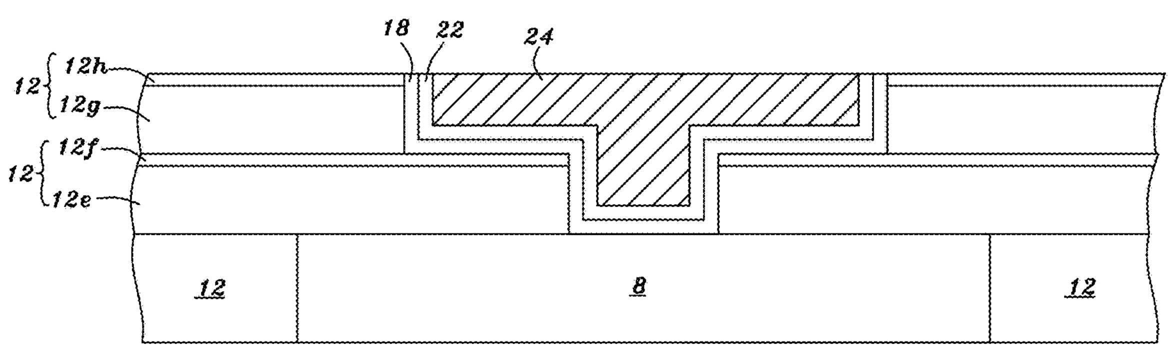

Next, referring to FIG. 14Q, a chemical-mechanical polishing (CMP) process may be applied to remove the adhesion layer 18, electroplating seed layer 22 and copper layer 24 outside the holes or bottom openings 12*j* and trenches or top openings 12*i* in the second and third insulating dielectric layers 12 (middle and top ones) until the top surface of the third insulating dielectric layer 12 (top one) is exposed. The metals left or remained in the trenches or top openings 12*i* in the third insulating dielectric layer 12 (top one) are used as the metal pads, lines or traces 8 for each of the interconnection metal layers 6 of the FISC 20. The metals left or remained in the holes or bottom openings 12*j* in the second insulating dielectric layer 12 (middle one) are used as the metal vias 10 for each of the interconnection metal layers 6 of the FISC 20 for coupling the metal pads, lines or traces 8 below and above the metal vias 10.

In the double-damascene process, the copper electroplating process step and CMP process step are performed one time for forming the metal pads, lines or traces 8 and metal vias 10 in two of the insulating dielectric layers 12.

Accordingly, the processes for forming the metal pads, lines or traces 8 and metal vias 10 using the single damascene copper process as illustrated in FIGS. 14B-14H or the double damascene copper process as illustrated in FIGS. 14I-14Q may be repeated multiple times to form a plurality of the interconnection metal layer 6 for the FISC 20. The FISC 20 may comprise 4 to 15 layers or 6 to 12 layers of interconnection metal layers 6. The topmost one of the interconnection metal layers 6 of the FISC may have multiple metal pads 16, such as copper pads formed by the above-mentioned single or double damascene process or aluminum pads formed by a sputter process.

III. Passivation Layer for Chip

Referring to FIG. 14A, a passivation layer 14 is formed over the first interconnection scheme 20 of the chip (FISC) and over the insulating dielectric layers 12. The passivation layer 14 can protect the semiconductor devices 4 and the interconnection metal layers 6 from being damaged by moisture foreign ion contamination, or from water moisture or contamination from external environment, for example sodium mobile ions. In other words, mobile ions (such as sodium ion), transition metals (such as gold, silver and copper) and impurities may be prevented from penetrating through the passivation layer 14 to the semiconductor devices 4, such as transistors, polysilicon resistor elements and polysilicon-polysilicon capacitor elements, and to the interconnection metal layers 6.

Referring to FIG. 14A, the passivation layer 14 is commonly made of a mobile ion-catching layer or layers, for example, a combination of SiN, SiON, and/or SiCN layer or layers deposited by a chemical vapor deposition (CVD) process. The passivation layer 14 commonly has a thickness t3 of more than 0.3 μm, such as between 0.3 and 1.5 μm. In a preferred case, the passivation layer 14 may have a silicon-nitride layer having a thickness of more than 0.3 μm. The total thickness of the mobile ion catching layer or layers, i.e., a combination of SiN, SiON, and/or SiCN layer or layers, may be thicker than or equal to 100 nm, 150 nm, 200 nm, 300 nm, 450 nm or 500 nm.

Referring to FIG. 14A, an opening 14*a* in the passivation layer 14 is formed to expose a metal pad 16 of a topmost one of the interconnection metal layers 6 of the FISC 20. The metal pad 16 may be used for signal transmission or for connection to a power source or a ground reference. The metal pad 16 may have a thickness t4 of between 0.4 and 3 μm or between 0.2 and 2 μm. For example, the metal pad 16 may be composed of a sputtered aluminum layer or a sputtered aluminum-copper-alloy layer with a thickness of between 0.2 and 2 μm. Alternatively, the metal pad 16 may include the electroplated copper layer 24 formed by the single damascene process as seen in FIG. 14H or by the double damascene process as seen in FIG. 14Q.

Referring to FIG. 14A, the opening 14*a* may have a transverse dimension d, from a top view, of between 0.5 and 20 μm or between 20 and 200 μm. The shape of the opening 14*a* from a top view may be a circle, and the diameter of the circle-shaped opening 14*a* may be between 0.5 and 20 μm or between 20 and 200 μm. Alternatively, the shape of the opening 14*a* from a top view may be a square, and the width of the square-shaped opening 14*a* may be between 0.5 and 20 μm or between 20 and 200 μm. Alternatively, the shape of the opening 14*a* from a top view may be a polygon, such as hexagon or octagon, and the polygon-shaped opening 14*a* may have a width of between 0.5 and 20 μm or between 20 and 200 μm. Alternatively, the shape of the opening 14*a* from a top view may be a rectangle, and the rectangle-shaped opening 14*a* may have a shorter width of between 0.5 and 20 μm or between 20 and 200 μm. Further, there may be some of the semiconductor devices 4 under the metal pad 16 exposed by the opening 14*a*. Alternatively, there may be no active devices under the metal pad 16 exposed by the opening 14*a*.

Micro-Bump on Chip

FIGS. 15A-15G are schematically cross-sectional views showing a process for forming a micro-bump or micro-pillar on chip in accordance with an embodiment of the present application. For connection to circuitry outside a chip, multiple micro-bumps may be formed over the metal pads 16 exposed by the openings 14*a* in the passivation layer 14.

Figure 15A:
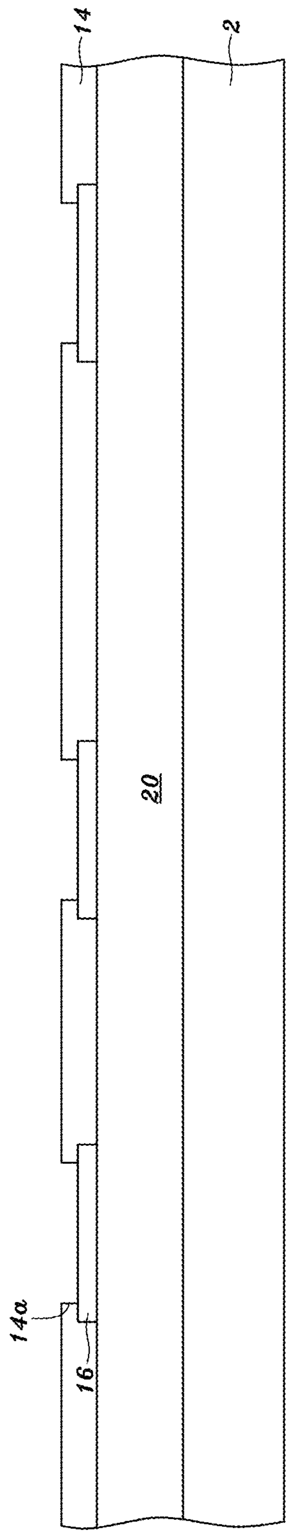
FIGS. 15A-15H are schematically cross-sectional views showing a process for forming a micro-bump or micro-pillar on chip in accordance with an embodiment of the present application.
Figure 15B:
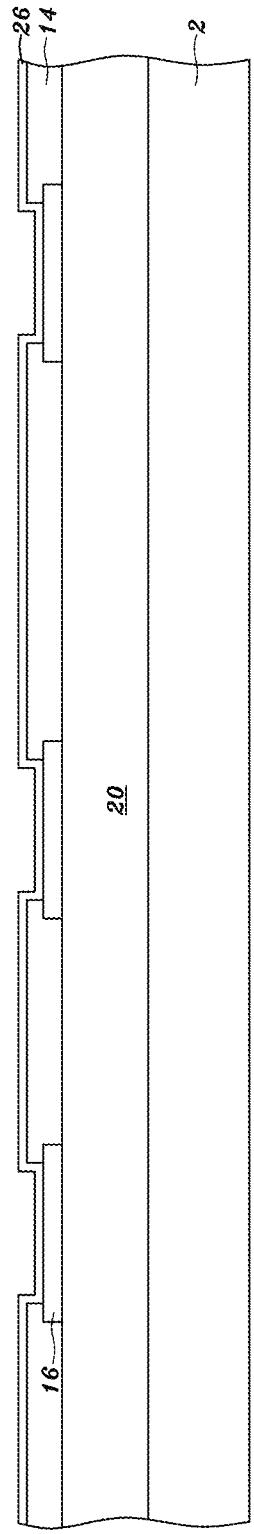

FIG. 15A is a simplified drawing from FIG. 14A. Referring to FIG. 15B, an adhesion layer 26 having a thickness of between 0.001 and 0.7 μm, between 0.01 and 0.5 μm or between 0.03 and 0.35 μm may be sputtered on the passivation layer 14 and on the metal pad 16, such as aluminum pad or copper pad, exposed by opening 14*a*. The material of the adhesion layer 26 may include titanium, a titanium-tungsten alloy, titanium nitride, chromium, titanium-tungsten-alloy layer, tantalum nitride, or a composite of the abovementioned materials. The adhesion layer 26 may be formed by an atomic-layer-deposition (ALD) process, chemical vapor deposition (CVD) process or evaporation process. For example, the adhesion layer 26 may be formed by sputtering or CVD depositing a titanium (Ti) or titanium nitride (TiN) layer (with a thickness, for example, between 1 nm and 50 nm) on the passivation layer 14 and on the metal pads 16 at a bottom of the openings 14 in the passivation layer 14.

Figure 15C:
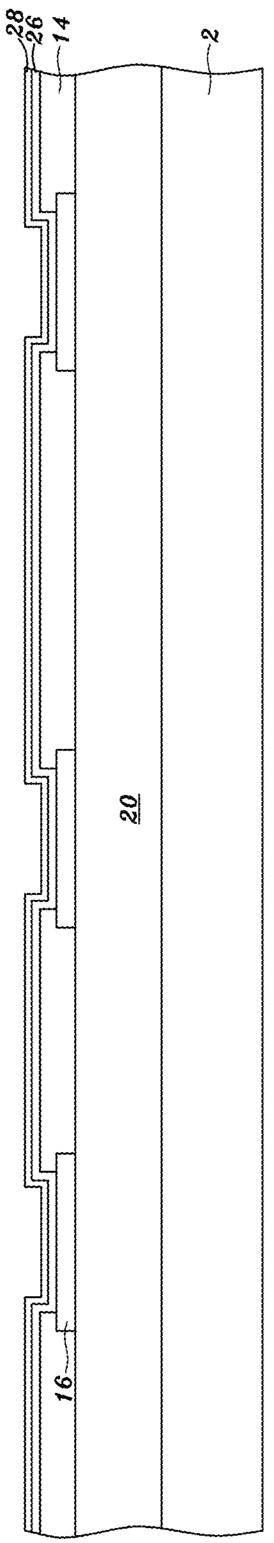

Next, referring to FIG. 15C, an electroplating seed layer 28 having a thickness of between 0.001 and 1 μm, between 0.03 and 2 μm or between 0.05 and 0.5 μm may be sputtered on the adhesion layer 26. Alternatively, the electroplating seed layer 28 may be formed by an atomic-layer-deposition (ALD) process, chemical-vapor-deposition (CVD) process, vapor deposition method, electroless plating method or PVD (Physical Vapor Deposition) method. The electroplating seed layer 28 is beneficial to electroplating a metal layer thereon. Thus, the material of the electroplating seed layer 28 varies with the material of a metal layer to be electroplated on the electroplating seed layer 28. When a copper layer is to be electroplated on the electroplating seed layer 28, copper is a preferable material to the electroplating seed layer 28. For example, the electroplating seed layer 28 may be deposited on or over the adhesion layer 26 by, for example, sputtering or CVD depositing a copper seed layer (with a thickness between, for example, 3 nm and 300 nm or 3 nm and 200 nm) on the adhesion layer 26.

Figure 15D:
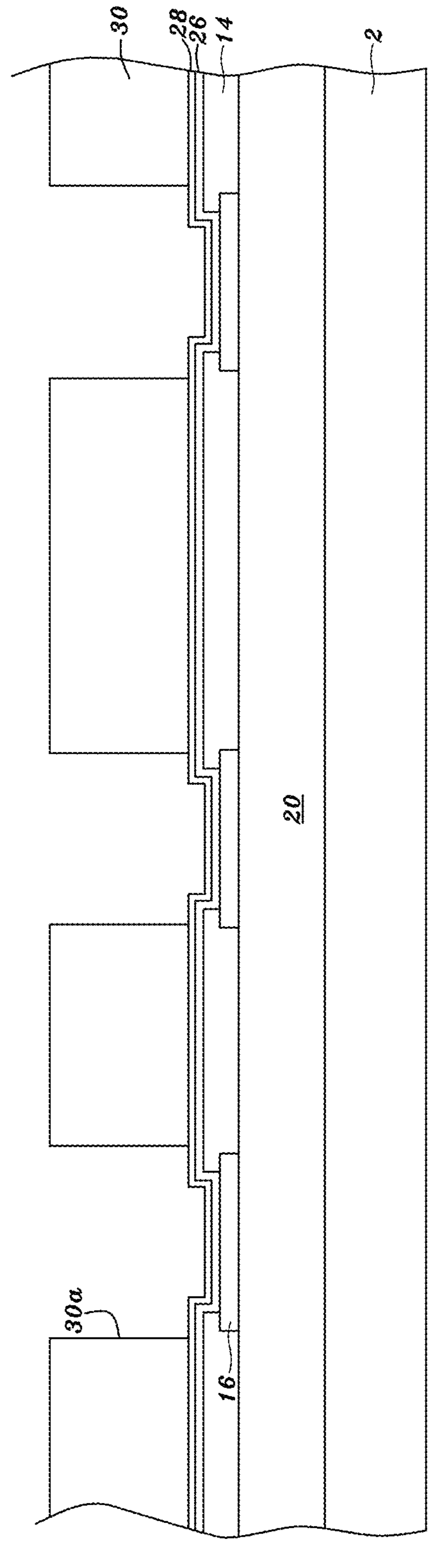

Next, referring to FIG. 15D, a photoresist layer 30, such as positive-type photoresist layer, having a thickness of between 5 and 300 μm or between 20 and 50 μm is spin-on coated on the electroplating seed layer 28. The photoresist layer 30 is patterned with the processes of exposure, development, etc., to form an opening 30*a* in the photoresist layer 30 exposing the electroplating seed layer 28 over the metal pad 16. A 1× stepper, 1× contact aligner or laser scanner may be used to expose the photoresist layer 30 during the process of exposure.

For example, the photoresist layer 30 may be formed by spin-on coating a positive-type photosensitive polymer layer having a thickness of between 5 and 100 μm on the electroplating seed layer 28, then exposing the photosensitive polymer layer using a 1× stepper, 1× contact aligner or laser scanner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants on the electroplating seed layer 28 with an $O_2$ plasma or a plasma containing fluorine of below 200 PPM and oxygen, such that the photoresist layer 30 may be patterned with multiple openings 30*a* in the photoresist layer 30 exposing the electroplating seed layer 28 over the metal pad 16.

Referring to FIG. 15D, each of the openings 30*a* in the photoresist layer 30 may overlap one of the openings 14*a* in the passivation layer 14 for forming one of micro-pillars or micro-bumps in said one of the openings 30*a* by following processes to be performed later, exposing the electroplating seed layer 28 at the bottom of said one of the openings 30*a*, and may extend out of said one of the openings 14*a* to an area or ring of the passivation layer 14 around said one of the openings 14*a*.

Figure 15E:
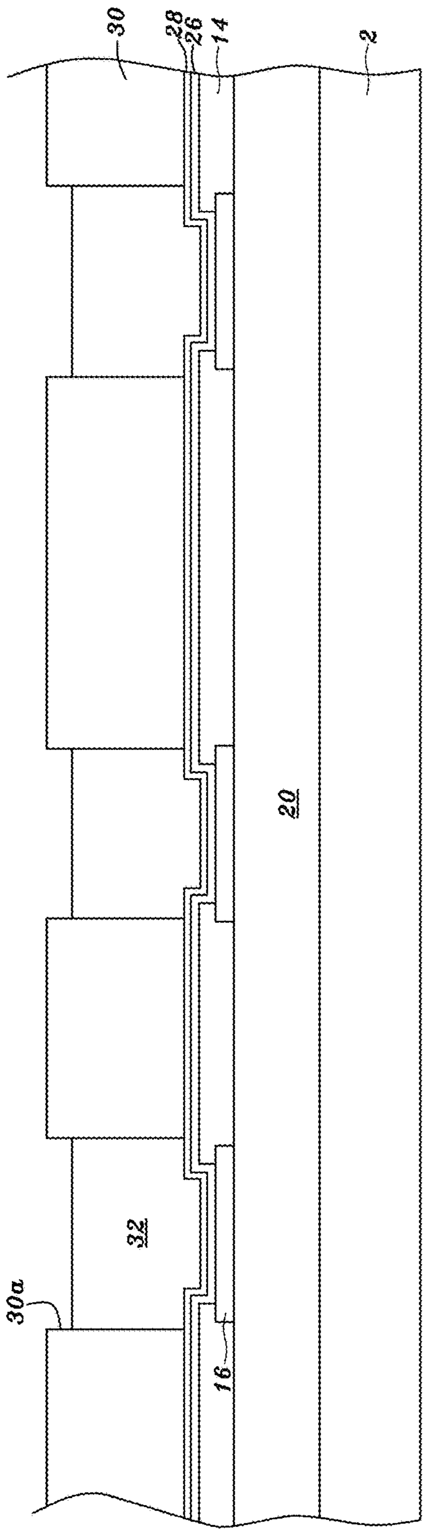

Next, referring to FIG. 15E, a metal layer 32, such as copper, may be electroplated on the electroplating seed layer 28 exposed by the trenches or openings 30*a*. For example, the metal layer 32 may be formed by electroplating a copper layer with a thickness between 3 μm and 60 μm, 5 μm and 50 μm, 5 μm and 40 μm, 5 μm and 5 μm and 20 μm, or 5 μm and 15 μm on the electroplating seed layer 28, made of copper, exposed by the openings 30*a*.

Figure 15F:
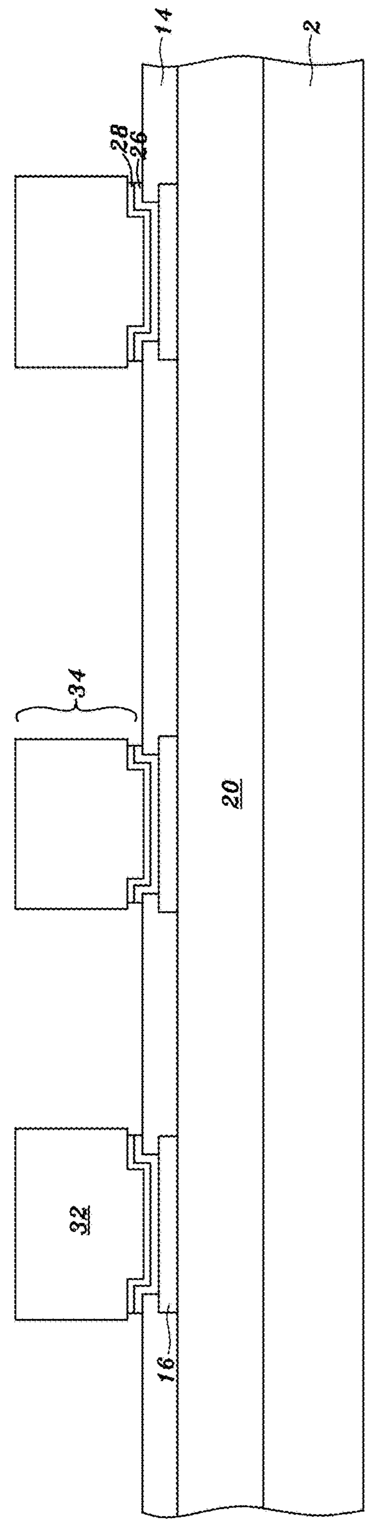

Referring to FIG. 15F, after the copper layer 32 is formed, most of the photoresist layer 30 may be removed using an organic solution with amide. However, some residuals from the photoresist layer 30 could remain on the metal layer 32 and on the electroplating seed layer 28. Thereafter, the residuals may be removed from the metal layer 32 and from the electroplating seed layer 28 with a plasma, such as $O_2$ plasma or plasma containing fluorine of below 200 PPM and oxygen. Next, the electroplating seed layer 28 and adhesion layer 26 not under the copper layer 32 are subsequently removed with a dry etching method or a wet etching method. As to the wet etching method, when the adhesion layer 26 is a titanium-tungsten-alloy layer, it may be etched with a solution containing hydrogen peroxide; when the adhesion layer 26 is a titanium layer, it may be etched with a solution containing hydrogen fluoride; when the electroplating seed layer 28 is a copper layer, it may be etched with a solution containing $NH_4OH$. As to the dry etching method, when the adhesion layer 26 is a titanium layer or a titanium-tungsten-alloy layer, it may be etched with a chlorine-containing plasma etching process or with an RIE process. Generally, the dry etching method to etch the electroplating seed layer 28 and the adhesion layer 26 not under the metal layer 32 may include a chemical plasma etching process, a sputtering etching process, such as argon sputter process, or a chemical vapor etching process.

Thereby, the adhesion layer 26, electroplating seed layer 28 and electroplated copper layer 32 may compose multiple micro-pillars or micro-bumps 34 on the metal pads 16 at bottoms of the openings **14*a* in the passivation layer 14. Each of the micro-bumps 34 may have a height, protruding from a top surface of the passivation layer 14, between 3 μm and 60 μm, 5 μm and 50 μm, 5 μm and 40 μm, 5 μm and 30 μm, 5 μm and 20 μm, 5 μm and 15 μm or 3 μm and 10 μm, or greater than or equal to 30 μm, 20 μm, 15 μm, 5 μm or 3 μm, and a largest dimension in a cross-section (for example, the diameter of a circle shape, or the diagonal length of a square or rectangle shape) between, for example, 3 μm and 60 μm, 5 μm and 50 μm, 5 μm and 40 μm, 5 μm and 30 μm, 5 μm and 20 μm, 5 μm and 15 μm or 3 μm and 10 μm, or smaller than or equal to 60 μm, 50 μm, 40 μm, 30 μm, 20 μm, 15 μm or 10 μm. The space between one of the micro-pillars or micro-bumps 34 to its nearest neighboring one of the micro-pillars or micro-bumps 34** is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 μm, 50 μm, 40 μm, 30 μm, 20 μm, 15 μm or 10 μm.

Figure 15G:
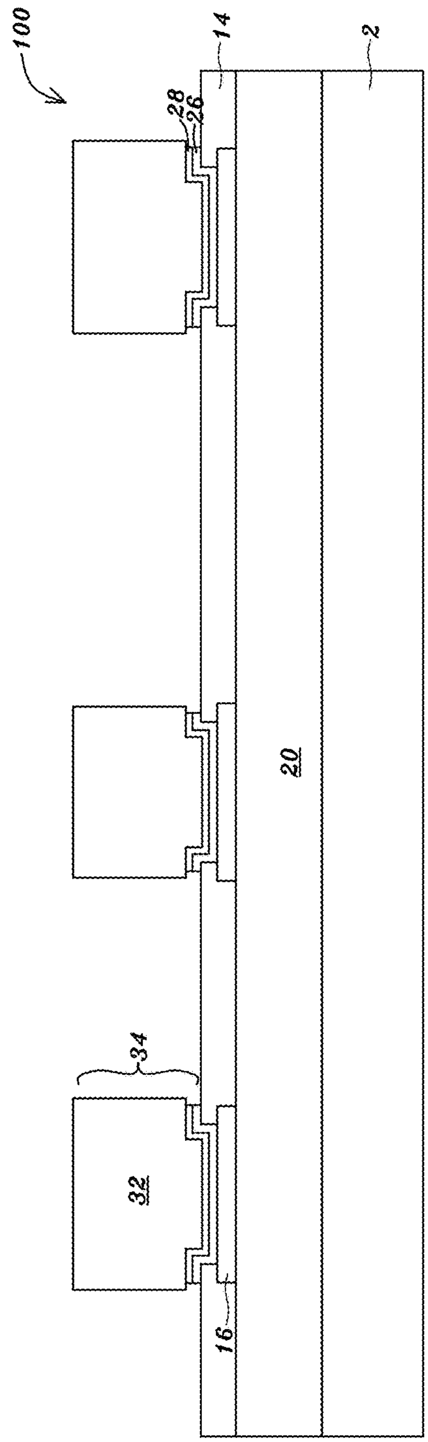

Referring to FIG. 15G, after the micro-pillars or micro-bumps 34 are formed over the semiconductor wafer as seen in FIG. 15F, the semiconductor wafer may be separated, cut or diced into multiple individual semiconductor chips 100, integrated circuit chips, by a laser cutting process or by a mechanical cutting process. These semiconductor chips 100 may be packaged using the following steps as shown in FIGS. 18A-18U, 19A-19Z, 20A-20Z, 21A-21H and 22I.

Figure 15H:
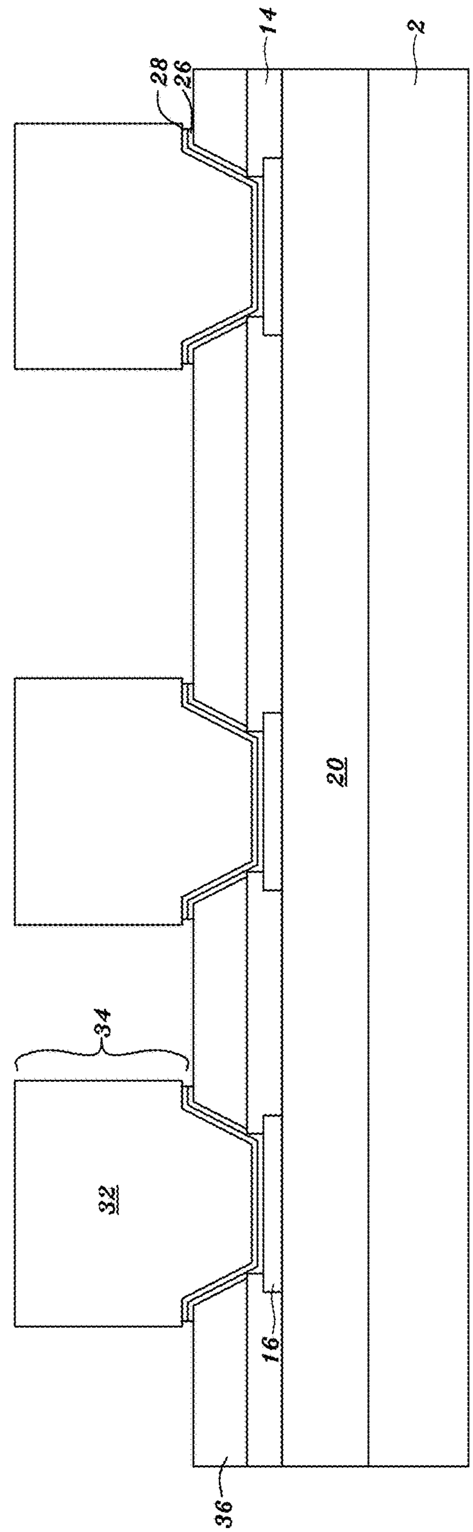

Alternatively, FIG. 15H is a schematically cross-sectional view showing a micro-bump or micro-pillar on chip in accordance with an embodiment of the present application. Referring to FIG. 15H, before the adhesion layer 26 is formed as shown in FIG. 15B, a polymer layer 36, that is, an insulating dielectric layer contains an organic material, for example, a polymer, or material compounds comprising carbon, may be formed on the passivation layer 14 by a process including a spin-on coating process, a lamination process, a screen-printing process, a spraying process or a molding process, and multiple openings in the polymer layer 36 are formed over the metal pads 16. The polymer layer 36 has a thickness between 3 and 30 micrometers or between 5 and 15 micrometers and the material of the polymer layer 36 may include benzocyclobutane (BCB), parylene, photoepoxy SU-8, elastomer, silicone, polyimide (PI), polybenzoxazole (PBO) or epoxy resin.

In a case, the polymer layer 36 may be formed by spin-on coating a negative-type photosensitive polyimide layer having a thickness between 6 and 50 micrometers on the passivation layer 14 and on the pads 16, then baking the spin-on coated polyimide layer, then exposing the baked polyimide layer using a 1× stepper, 1× contact aligner or laser scanner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings exposing the pads 16, then curing or heating the developed polyimide layer at a temperature between 180 and 400° C. or higher than or equal to 100° C., 125° C., 150° C., 175° C., 200° C., 225° C., 250° C., 275° C. or 300° C. for a time between 20 and 150 minutes in a nitrogen ambient or in an oxygen-free ambient, the cured polyimide layer having a thickness between 3 and 30 micrometers, and then removing the residual polymeric material or other contaminants from the pads 16 with an $O_2$ plasma or a plasma containing fluorine of below 200 PPM and oxygen.

Thereby, referring to FIG. 15H, the micro-pillars or micro-bumps 34 may be formed on the metal pads 16 at bottoms of the openings **14*a* in the passivation layer 14 and on the polymer layer 36 around the metal pads 16. The specification of the micro-pillars or micro-bumps 34 as seen in FIG. 15H may be referred to that of the micro-pillars or micro-bumps 34 as illustrated in FIG. 15F. Each of the micro-bumps 34 may have a height, protruding from a top surface of the polymer layer 36, between 3 μm and 60 μm, 5 μm and 50 μm, 5 μm and 40 μm, 5 and 30 μm, 5 μm and 20 μm, 5 μm and 15 μm or 3 μm and 10 μm, or greater than or equal to 30 μm, 20 μm, 15 μm, 5 μm or 3 μm, and a largest dimension in a cross-section (for example, the diameter of a circle shape, or the diagonal length of a square or rectangle shape) between, for example, 3 μm and 60 μm, 5 μm and 50 μm, 5 μm and 40 μm, 5 μm and 30 μm, 5 μm and 20 μm, 5 μm and 15 μm or 3 μm and 10 μm, or smaller than or equal to 60 μm, 50 μm, 40 μm, 20 μm, 15 μm or 10 μm. The space from one of the micro-pillars or micro-bumps 34 to its nearest neighboring one of the micro-pillars or micro-bumps 34** is between, for example, 3 μm and 60 μm, 5 μm and 50 μm, 5 μm and 40 μm, 5 μm and 30 μm, 5 μm and 20 μm, 5 μm and 15 μm, or 3 μm and 10 μm, or smaller than or equal to 60 m, 50 μm, 40 μm, 30 μm, 20 μm, 15 μm or 10 μm.

Embodiment for SISC Over Passivation Layer

Alternatively, before the micro-bumps 34 are formed, a Second Interconnection Scheme in, on or of the Chip (SISC) may be formed on or over the passivation layer 14 and the FISC 20. FIGS. 16A-16D are schematically cross-sectional views showing a process for forming an interconnection metal layer over a passivation layer in accordance with an embodiment of the present application.

Figure 16A:
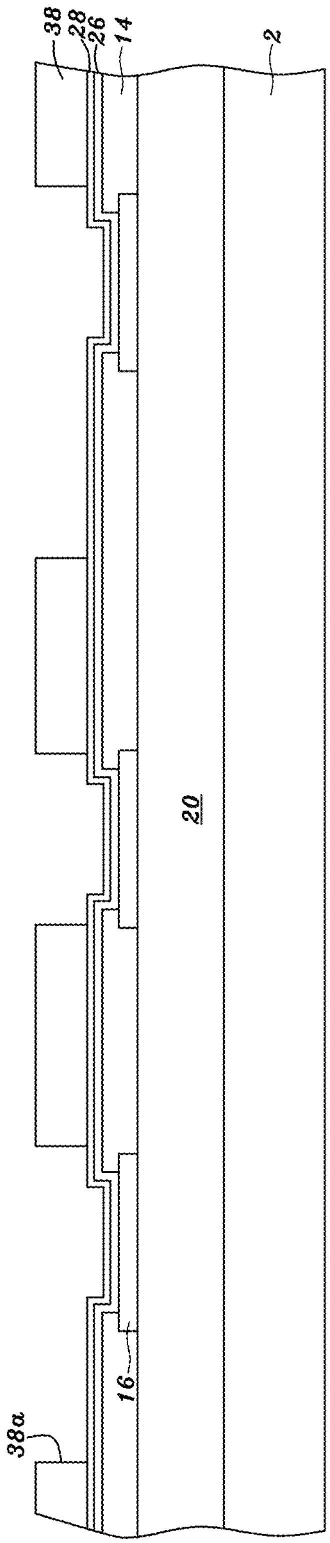
FIGS. 16A-16L and 17 are schematically cross-sectional views showing a process for forming a second interconnection scheme over a passivation layer and forming multiple micro-pillars or micro-bumps on the second interconnection metal layer in accordance with an embodiment of the present application.

Referring to FIG. 16A, the process for fabricating the SISC over the passivation layer 14 may continue from the step shown in FIG. 15C. A photoresist layer 38, such as positive-type photoresist layer, having a thickness of between 1 and 50 μm is spin-on coated or laminated on the electroplating seed layer 28. The photoresist layer 38 is patterned with the processes of exposure, development, etc., to form multiple trenches or openings 38*a* in the photoresist layer 38 exposing the electroplating seed layer 28. A 1× stepper, 1× contact aligner or laser scanner may be used to expose the photoresist layer 38 with at least two of G-line having a wavelength ranging from 434 to 438 nm, H-line having a wavelength ranging from 403 to 407 nm, and I-line having a wavelength ranging from 363 to 367 nm, illuminating the photoresist layer 96, that is, G-line and H-line, G-line and I-line, H-line and I-line, or G-line, H-line and I-line illuminate the photoresist layer 38, then developing the exposed photoresist layer 38, and then removing the residual polymeric material or other contaminants on the electroplating seed layer 28 with an $O_2$ plasma or a plasma containing fluorine of below 200 PPM and oxygen, such that the photoresist layer 38 may be patterned with multiple trenches or openings 38*a* in the photoresist layer 38 exposing the electroplating seed layer 28 for forming metal pads, lines or traces in the trenches or openings 38*a* and on the electroplating seed layer 28 by following processes to be performed later. One of the trenches or openings 38*a* in the photoresist layer 38 may overlap the whole area of one of the openings 14*a* in the passivation layer 14.

Figure 16B:
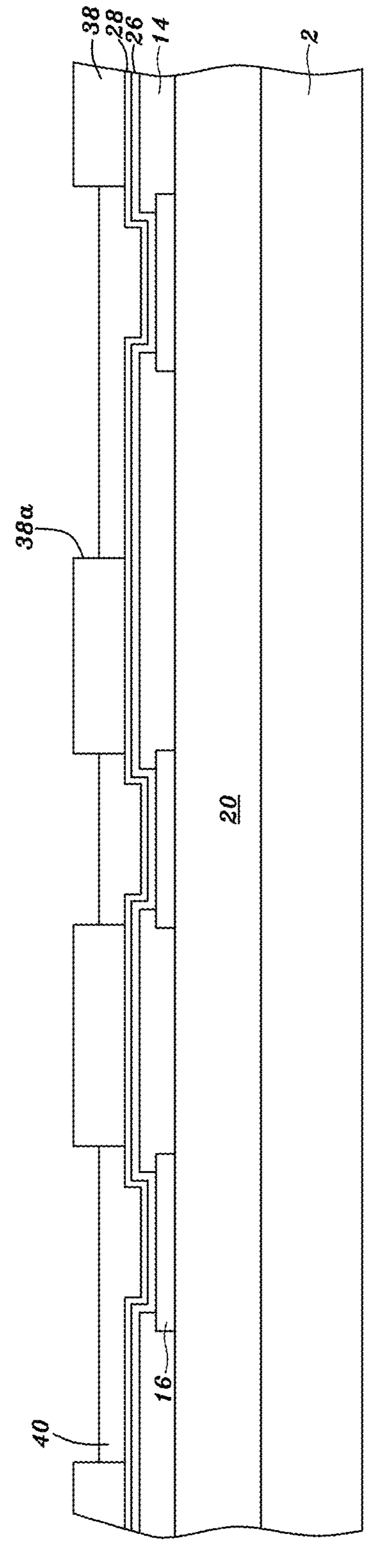

Next, referring to FIG. 16B, a metal layer 40, such as copper, may be electroplated on the electroplating seed layer 28 exposed by the trenches or openings 38*a*. For example, the metal layer 40 may be formed by electroplating a copper layer with a thickness of between 0.3 and 20 μm, 0.5 and 5 μm, 1 μm and 10 μm or 2 μm and 10 μm on the electroplating seed layer 28, made of copper, exposed by the trenches or openings 38*a*.

Figure 16C:
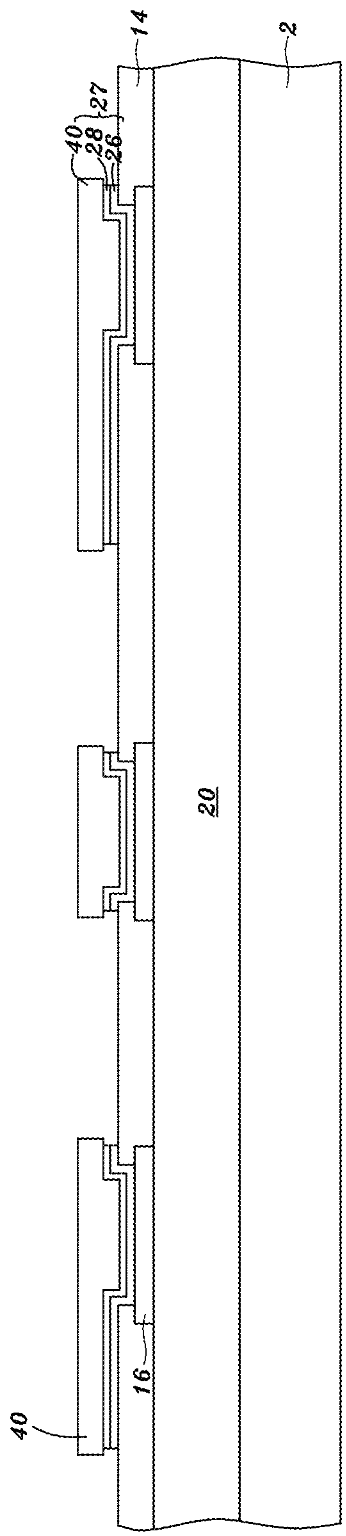

Referring to FIG. 16C, after the metal layer 40 is formed, most of the photoresist layer 38 may be removed and then the electroplating seed layer 28 and adhesion layer 26 not under the metal layer 40 may be etched. The removing and etching processes may be referred respectively to the process for removing the photoresist layer 30 and etching the electroplating seed layer 28 and adhesion layer 26 as illustrated in FIG. 15F. Thereby, the adhesion layer 26, electroplating seed layer 28 and electroplated metal layer 40 may be patterned to form an interconnection metal layer 27 over the passivation layer 14.

Figure 16D:
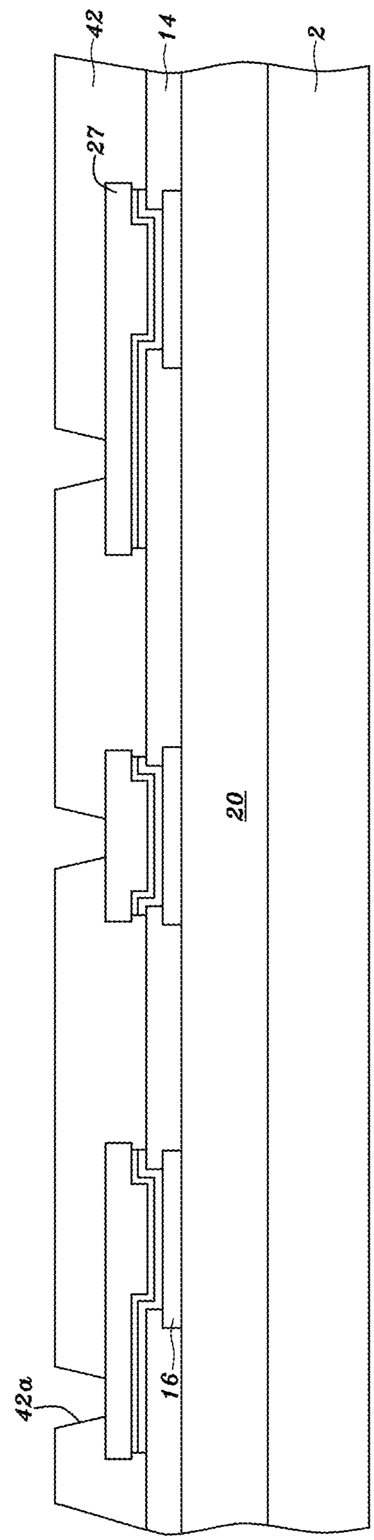

Next, referring to FIG. 16D, a polymer layer 42, i.e., insulting or inter-metal dielectric layer, is formed on the passivation layer 14 and metal layer 40 and multiple openings 42*a* in the polymer layer 42 are over multiple contact points of the interconnection metal layer 27. The material of the polymer layer 42 and the process for forming the same may be referred to that of the polymer layer 36 and the process for forming the same as illustrated in FIG. 15H.

Figure 17:
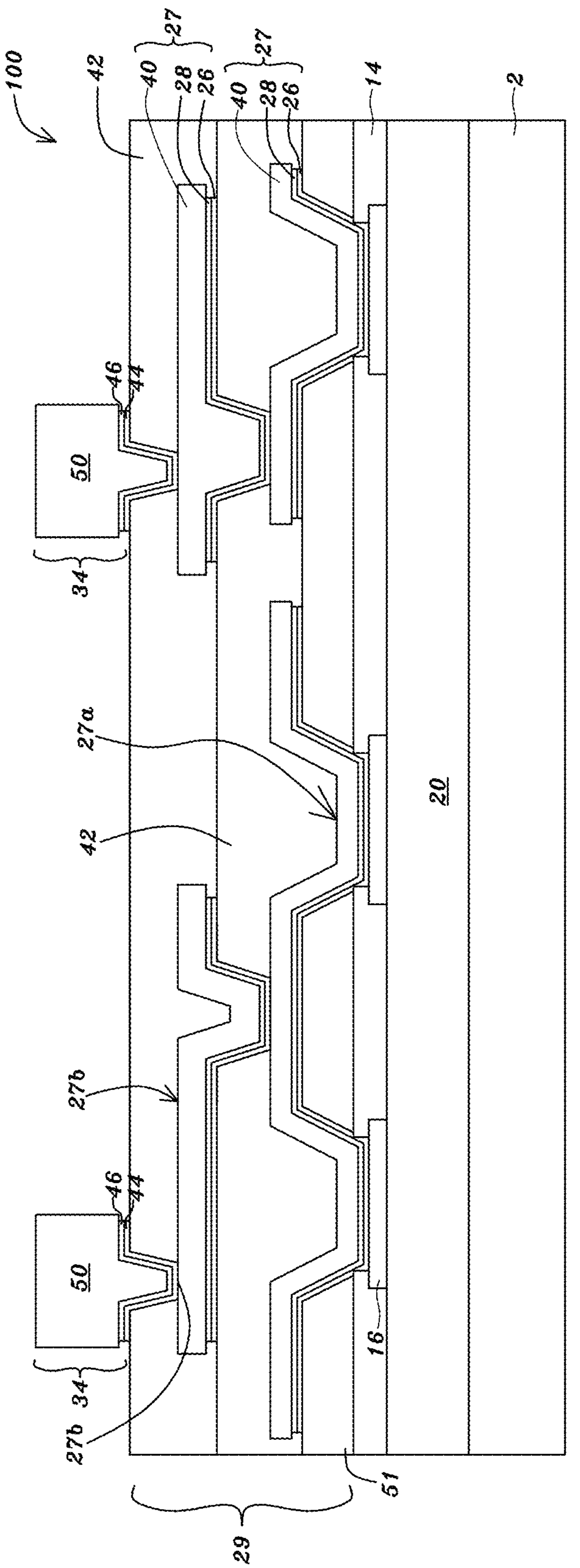

The process for forming the interconnection metal layer 27 as illustrated in FIGS. 15A, 15B and 16A-16C and the process for forming the polymer layer 42 as seen in FIG. 16D may be alternately performed more than one times to fabricate the SISC 29 as seen in FIG. 17. FIG. 17 is a cross-sectional view showing a second interconnection scheme of a chip (SISC) is formed with multiple interconnection metal layers 27 and multiple polymer layers 42 and 51, i.e., insulating or inter-metal dielectric layers, alternatively arranged in accordance with an embodiment of the present application. Referring to FIG. 17, the SISC 29 may include an upper one of the interconnection metal layers 27 formed with multiple metal vias 27*a* in the openings 42*a* in one of the polymer layers 42 and multiple metal pads, lines or traces 27*b* on said one of the polymer layers 42. The upper one of the interconnection metal layers 27 may be connected to a lower one of the interconnection metal layers 27 through the metal vias 27*a* of the upper one of the interconnection metal layers 27 in the openings 42*a* in said one of the polymer layers 42. The SISC 29 may include the bottommost one of the interconnection metal layers 27 formed with multiple metal vias 27*a* in the openings 14*a* in the passivation layer 14 and multiple metal pads, lines or traces 27*b* on the passivation layer 14. The bottommost one of the interconnection metal layers 27 may be connected to the interconnection metal layers 6 of the FISC 20 through the metal vias 27*a* of the bottommost one of the interconnection metal layers 27 in the openings 14*a* in the passivation layer 14.

Figure 16E:
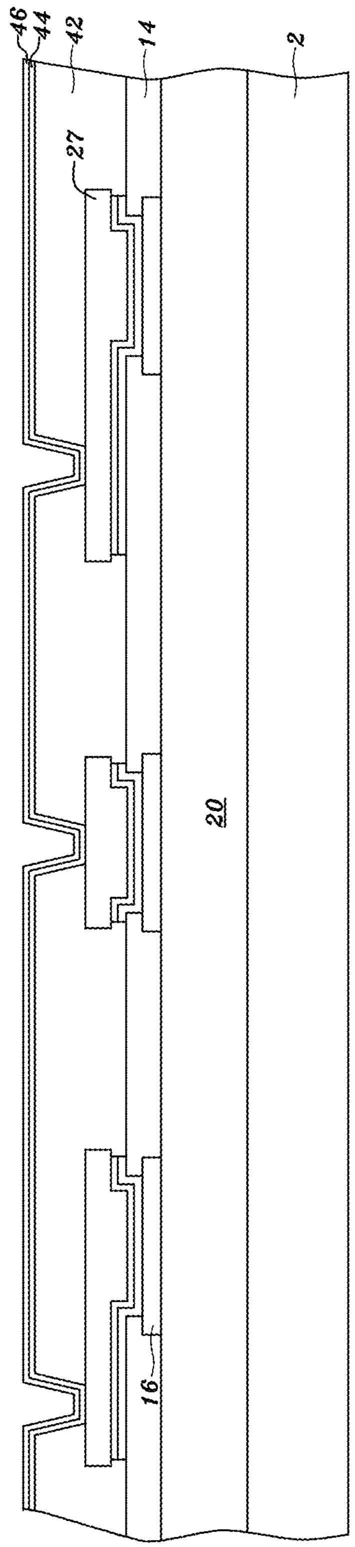
Figure 16F:
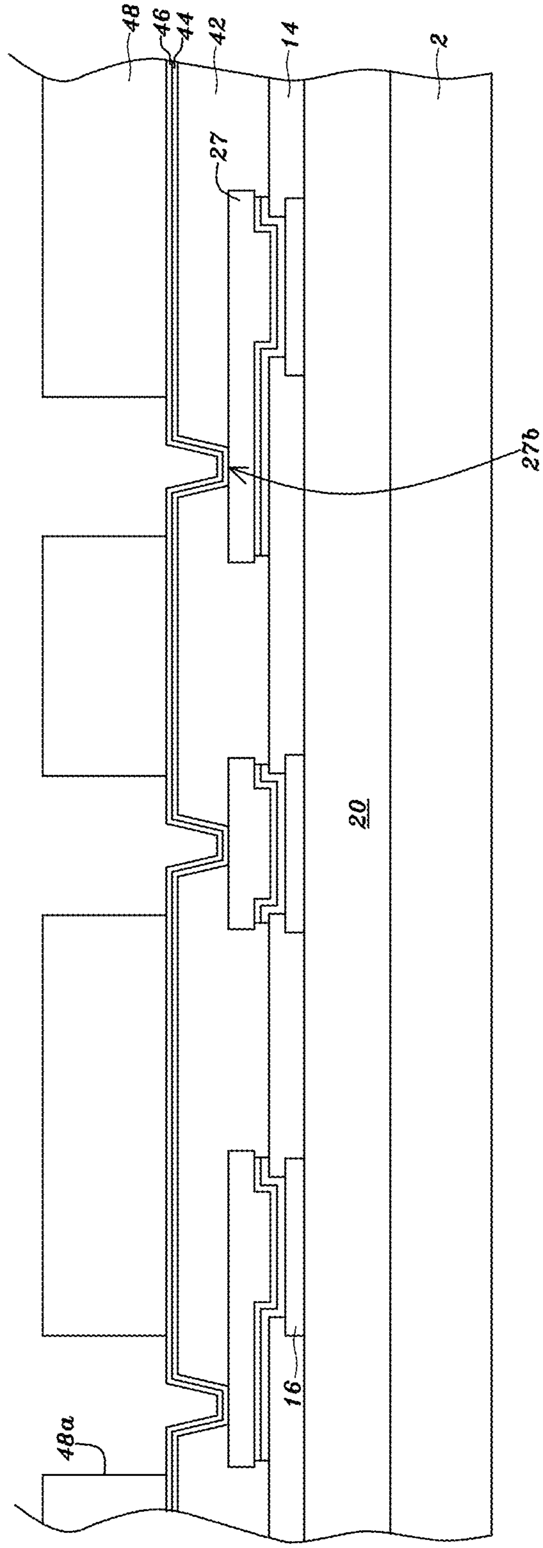
Figure 16G:
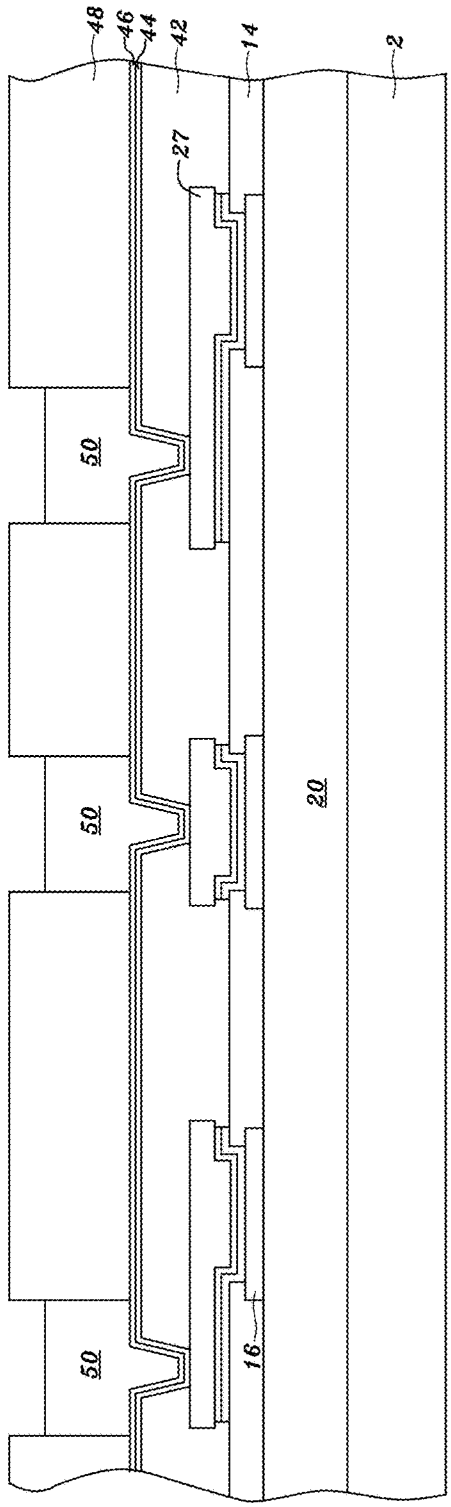
Figure 16H:
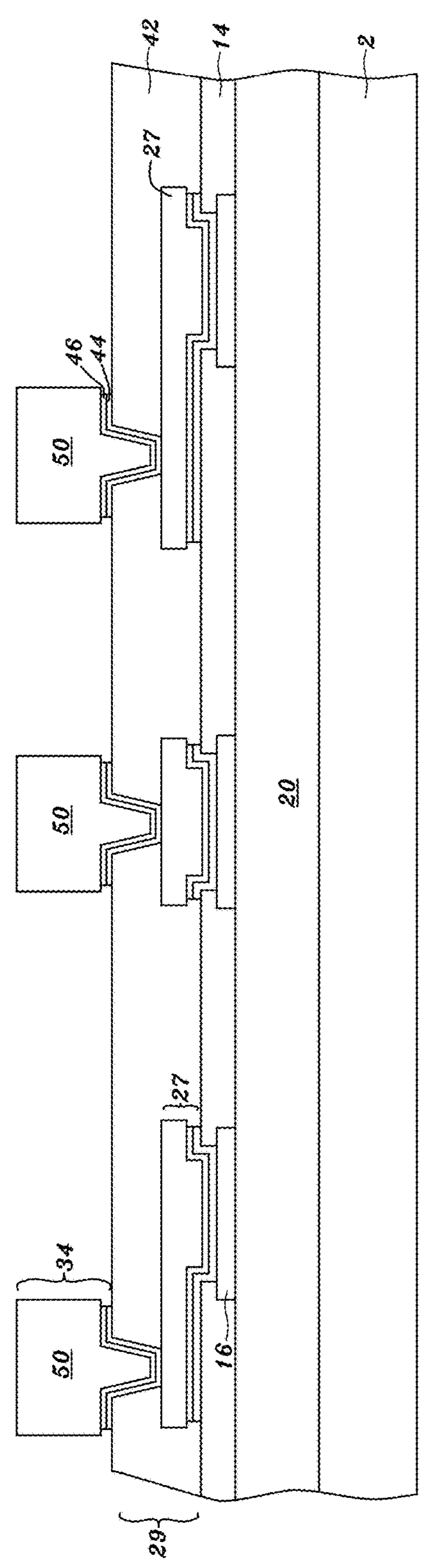
Figure 16I:
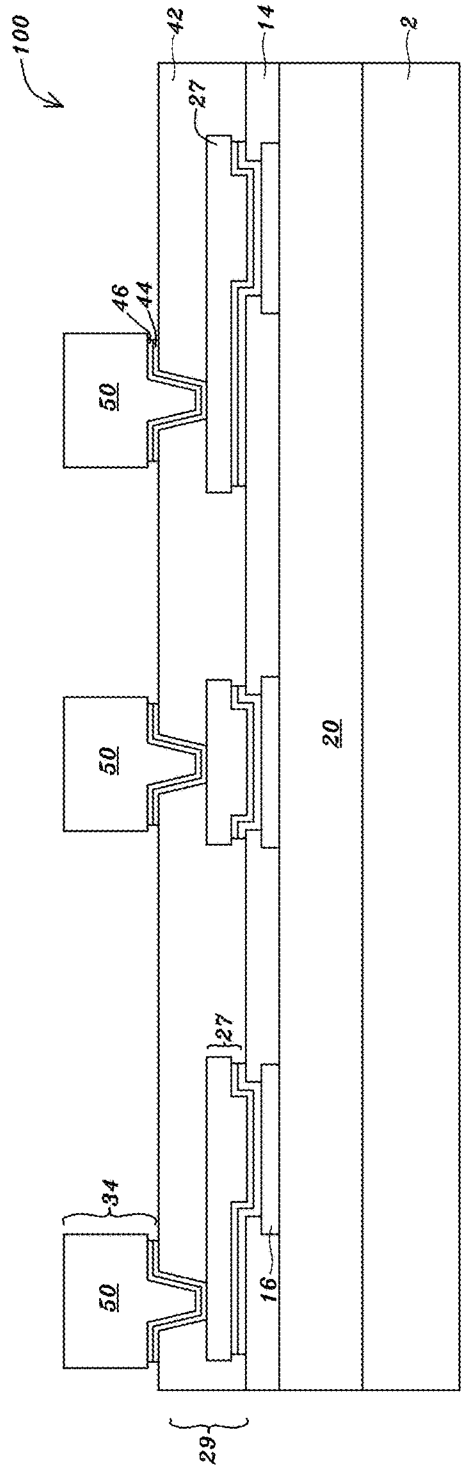
Figure 16J:
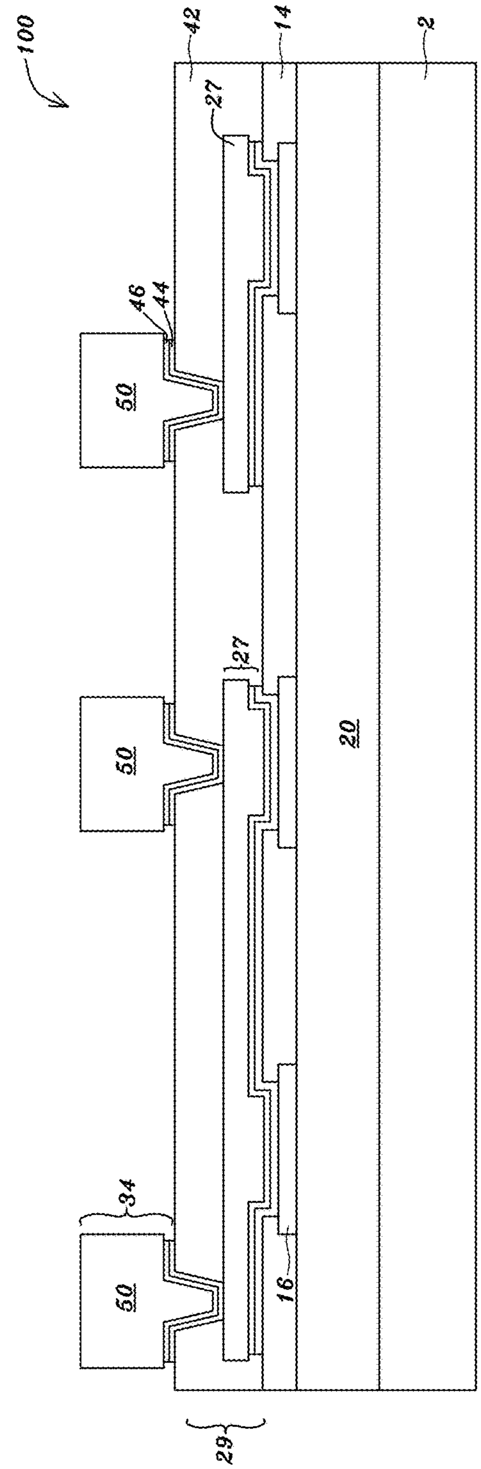
Figure 16K:
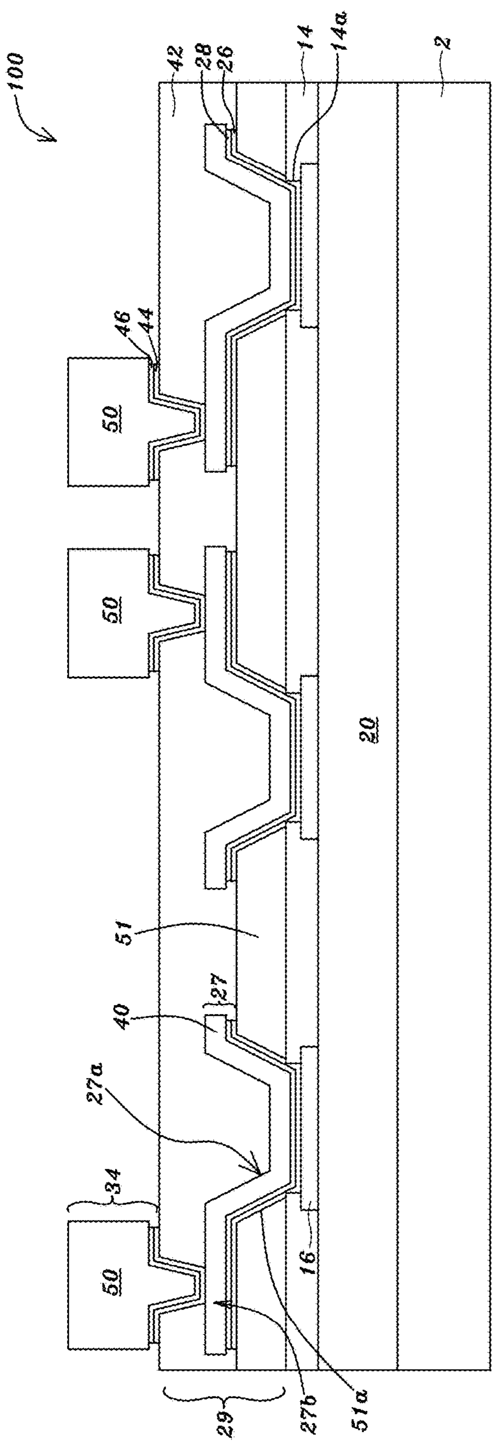
Figure 16L:
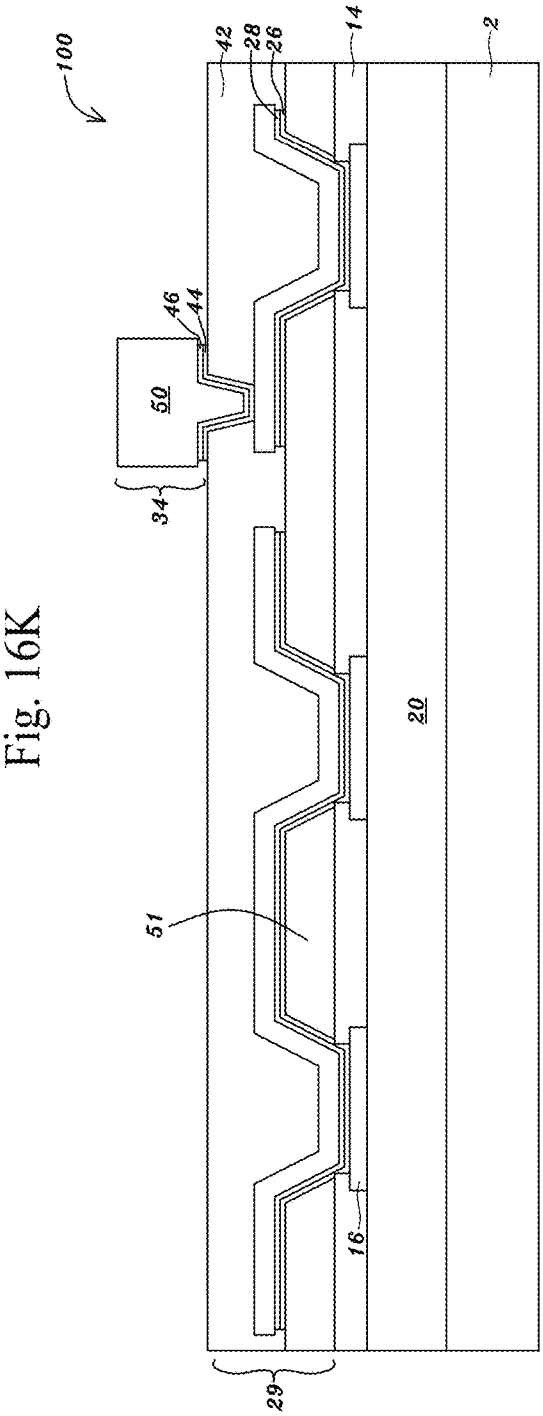

Alternatively, referring to FIGS. 16K, 16L and 17, a polymer layer 51 may be formed on the passivation layer 14 before the bottommost one of the interconnection metal layers 27 is formed. The material of the polymer layer 51 and the process for forming the same may be referred to the polymer layer 36 and the process for forming the same as shown in FIG. 15H. In this case, the SISC 29 may include the bottommost one of the interconnection metal layers 27 formed with multiple metal vias 27*a* in the openings 51*a* in the polymer layer 51 and multiple metal pads, lines or traces 27*b* on the polymer layer 51. The bottommost one of the interconnection metal layers 27 may be connected to the interconnection metal layers 6 of the FISC 20 through the metal vias 27*a* of the bottommost one of the interconnection metal layers 27 in the openings 14*a* in the passivation layer 14 and in the openings 51*a* in the polymer layer 51.

Accordingly, the SISC 29 may be optionally formed with 2 to 6 layers or 3 to 5 layers of interconnection metal layers 27 over the passivation layer 14. For each of the interconnection metal layers 27 of the SISC 29, its metal pads, line or traces 27*b* may have a thickness between, for example, 0.3 μm and 20 μm, 0.5 μm and 10 μm, 1 μm and 5 μm, 1 μm and 10 μm or 2 μm and 10 μm, or thicker than or equal to 0.3 μm, 0.5 μm, 0.7 μm, 1 μm, 1.5 μm, 2 μm or 3 μm and a width between, for example, 0.3 μm and 20 μm, 0.5 μm and 10 μm, 1 μm and 5 μm, 1 μm and 10 μm or 2 μm and 10 μm, or wider than or equal to 0.3 μm, 0.5 μm, 0.7 μm, 1 μm, 1.5 μm, 2 μm or 3 μm. Each of the polymer layers 42 and 51 may have a thickness between, for example, 0.3 μm and 20 μm, 0.5 μm and 10 μm, 1 μm and 5 μm, or 1 μm and 10 μm, or thicker than or equal to 0.3 μm, 0.5 μm, 0.7 μm, 1 μm, 1.5 μm, 2 μm or 3 μm. The metal pads, lines or traces 27*b* of the interconnection metal layers 27 of the SISC 29 may be used for the programmable interconnects 202.

FIGS. 16E-16I are schematically cross-sectional views showing a process for forming micro-pillars or micro-bumps on an interconnection metal layer over a passivation layer in accordance with an embodiment of the present application. Referring to FIG. 16E, an adhesion layer 44 may be sputtered on the polymer layer 42 and on the metal layer 40 exposed by the opening 42*a*. The specification of the adhesion layer 44 and the process for forming the same may be referred to that of the adhesion layer 26 and the process for forming the same as illustrated in FIG. 15B. An electroplating seed layer 46 may be sputtered on the adhesion layer 44. The specification of the electroplating seed layer 46 and the process for forming the same may be referred to that of the electroplating seed layer 28 and the process for forming the same as illustrated in FIG. 15C.

Next, referring to FIG. 16F, a photoresist layer 48 is formed on the electroplating seed layer 46. The photoresist layer 48 is patterned with the processes of exposure, development, etc., to form an opening 48*a* in the photoresist layer 48 exposing the electroplating seed layer 46. The specification of the photoresist layer 48 and the process for forming the same may be referred to that of the photoresist layer 48 and the process for forming the same as illustrated in FIG. 15D.

Next, referring to FIG. 16G, a copper layer 50 is electroplated on the electroplating seed layer 46 exposed by the opening 48*a*. The specification of the copper layer 50 and the process for forming the same may be referred to that of the copper layer 32 and the process for forming the same as illustrated in FIG. 15E.

Next, referring to FIG. 16H, most of the photoresist layer 48 may be removed and then the electroplating seed layer 46 and adhesion layer 44 not under the copper layer 50 may be etched. The processes for removing the photoresist layer 48 and etching electroplating seed layer 46 and adhesion layer 44 may be referred respectively to the processes for removing the photoresist layer 30 and etching the electroplating seed layer 28 and adhesion layer 26 as illustrated in FIG. 15F.

Thereby, referring to FIG. 16H, the adhesion layer 44, electroplating seed layer 46 and electroplated copper layer 50 may compose multiple micro-pillars or micro-bumps 34 on the topmost one of the interconnection metal layers 27 of the SISC 29 at bottoms of the openings 42*a* in the topmost one of the polymer layers 42 of the SISC 29. The specification of the micro-pillars or micro-bumps 34 as seen in FIG. 16H may be referred to that of the micro-pillars or micro-bumps 34 as illustrated in FIG. 15F. Each of the micro-bumps 34 may have a height, protruding from a top surface of a topmost one of the polymer layers 42 of the SISC 29, between 3 μm and 60 μm, 5 μm and 50 μm, 5 μm and 40 μm, 5 μm and 30 μm, 5 μm and 20 μm, 5 μm and 15 μm or 3 μm and 10 μm, or greater than or equal to 30 μm, 20 μm, 15 μm, 5 μm or 3 μm, and a largest dimension in a cross-section (for example, the diameter of a circle shape, or the diagonal length of a square or rectangle shape) between, for example, 3 μm and 60 μm, 5 μm and 50 μm, 5 μm and 40 μm, 5 μm and 30 μm, 5 μm and 20 μm, 5 μm and 15 μm or 3 μm and 10 μm, or smaller than or equal to 60 μm, 50 μm, 40 μm, 30 μm, 20 μm, 15 μm or 10 μm.

Referring to FIG. 16I, after the micro-pillars or micro-bumps 34 are formed over the semiconductor wafer as shown in FIG. 16H, the semiconductor wafer may be separated, cut or diced into multiple individual semiconductor chips 100, integrated circuit chips, by a laser cutting process or by a mechanical cutting process. These semiconductor chips 100 may be packaged using the following steps as shown in FIGS. 18A-18U, 19A-19Z, 20A-20Z, 21A-21H and 22I.

Referring to FIG. 16J, the above-mentioned interconnection metal layers 27 may comprise a power interconnection metal trace or a ground interconnection metal trace to connect multiple of the metal pads 16 and to have the micro-pillars or micro-bumps 34 formed thereon. Referring to FIG. 16L, the above-mentioned interconnection metal layers 27 may comprise an interconnection metal trace to connect multiple of the metal pads 16 and to have no micro-pillar or micro-bump formed thereon.

Referring to FIGS. 16I-16L and 17, the interconnection metal layers 27 of the FISC 29 may be used for the programmable and fixed interconnects 361 and 364 of the intra-chip interconnects 502, as seen in FIG. 8A, of each of the standard commodity FPGA IC chips 200.

Embodiment for FOIT

Figure 18A:
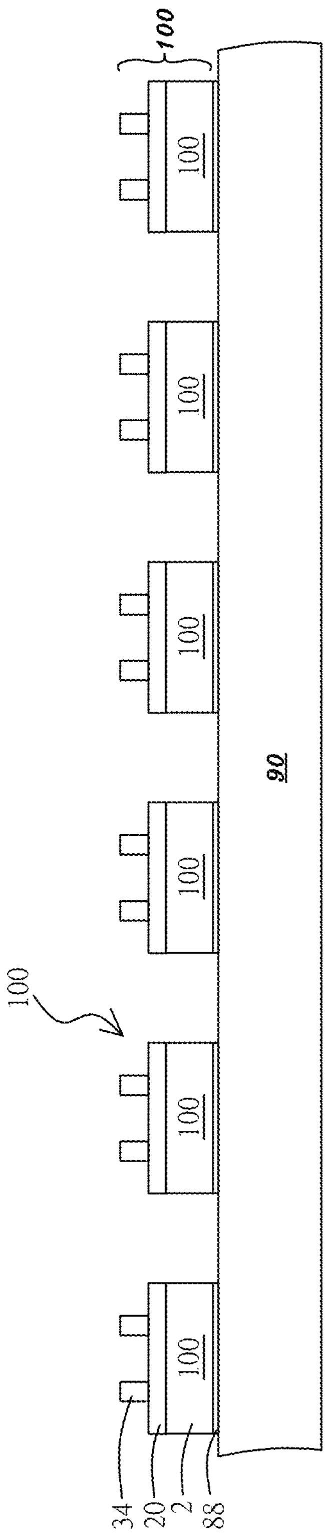
FIGS. 18A-18W are schematic views showing a process for forming a single-layer-packaged logic drive based on FOIT in accordance with an embodiment of the present application.
Figure 18B:
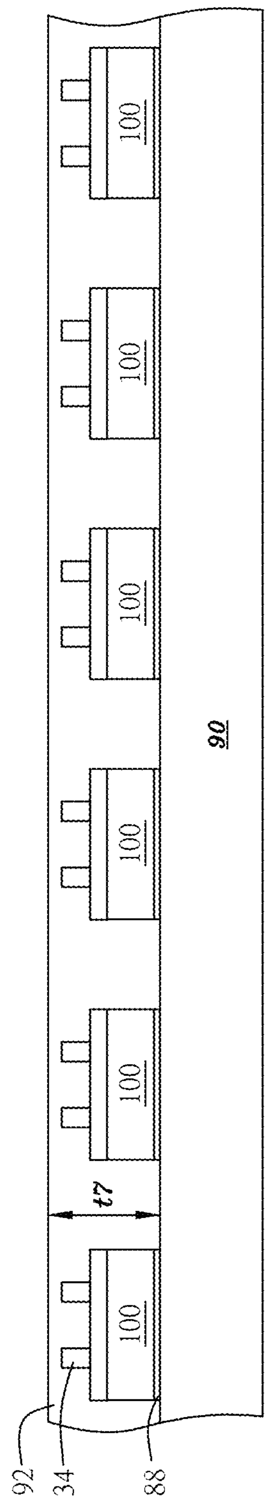
Figure 18C:
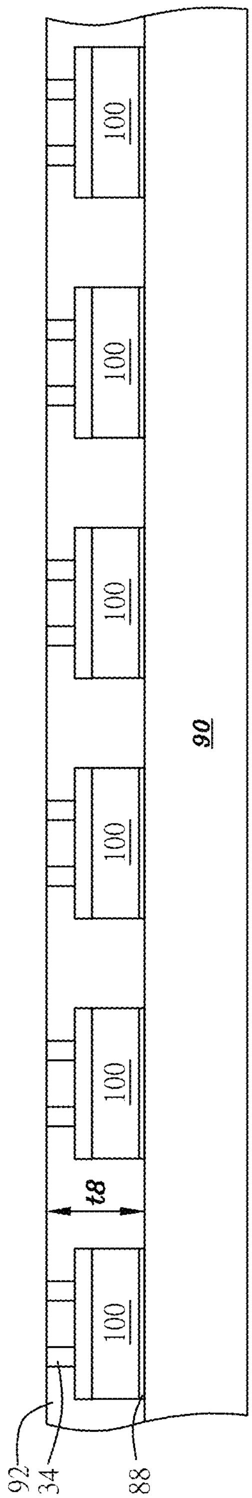
Figure 18D:
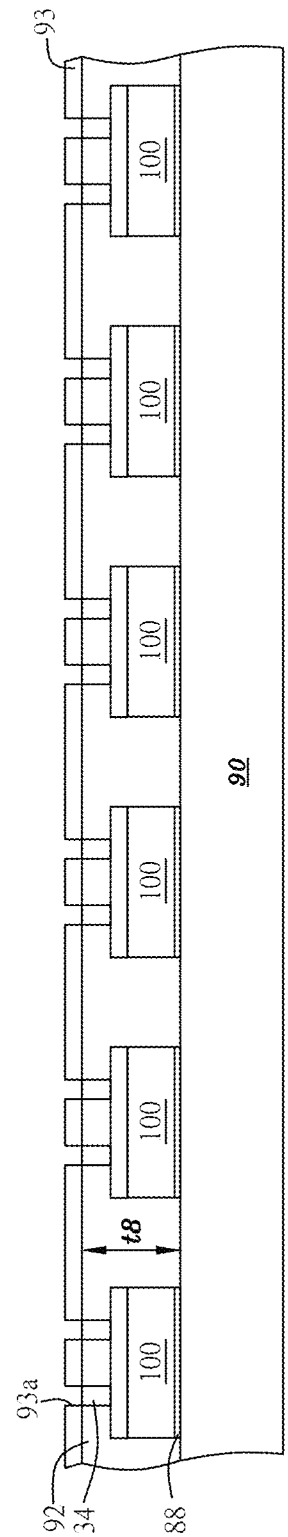
Figure 18E:
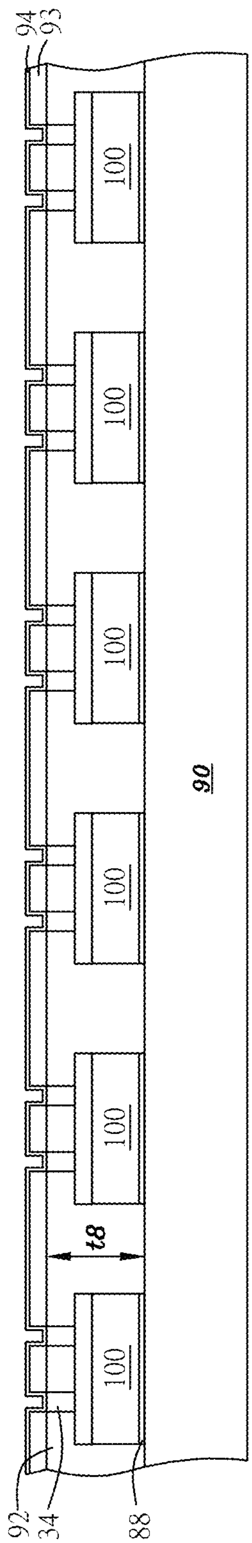
Figure 18F:
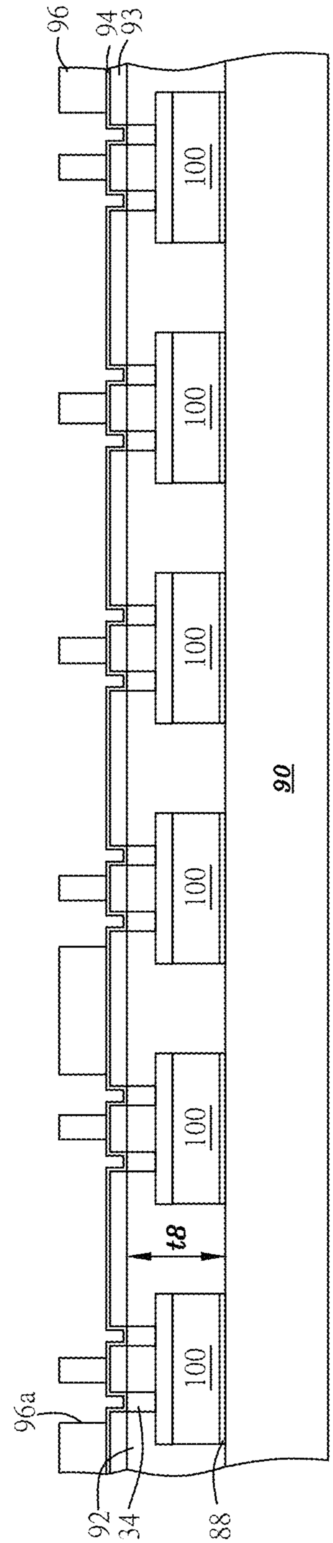
Figure 18G:
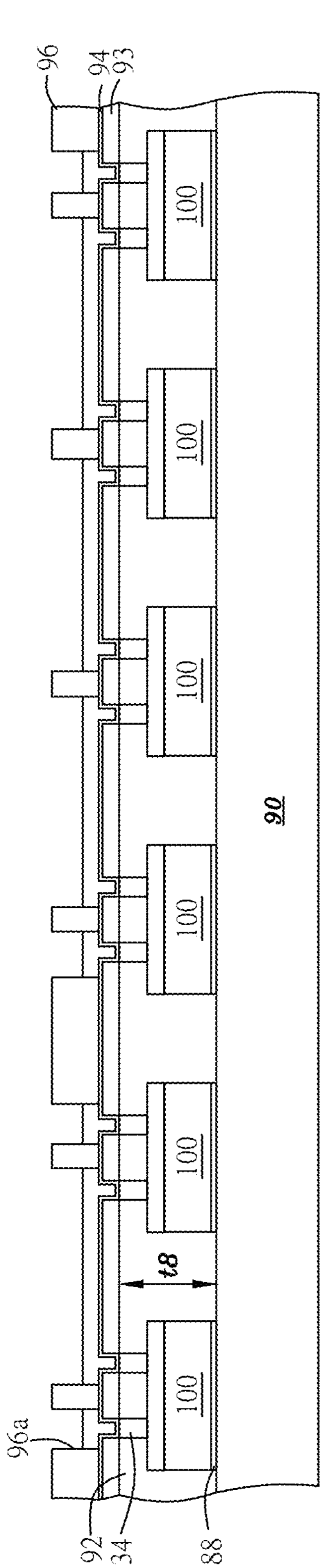
Figure 18H:
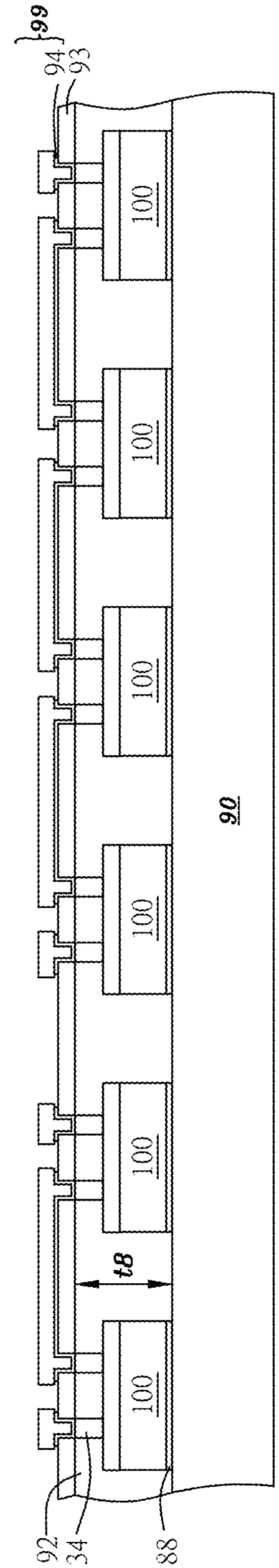
Figure 18I:
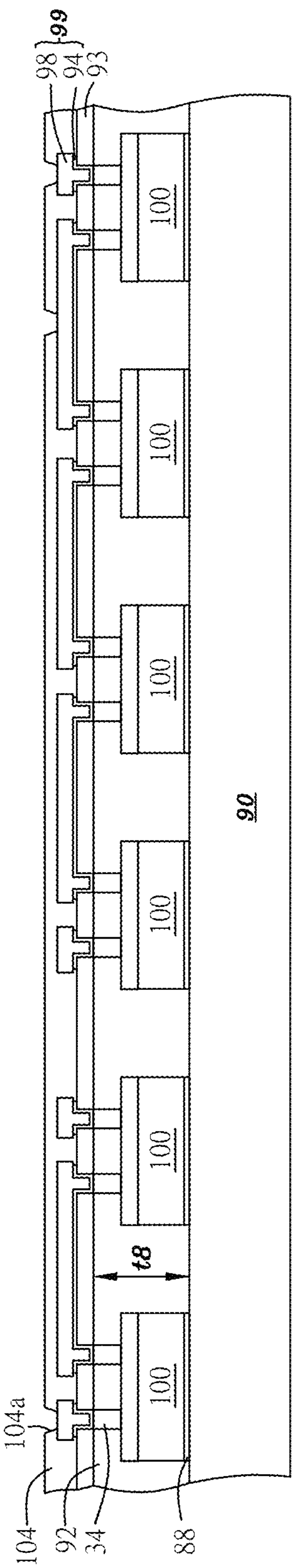
Figure 18J:
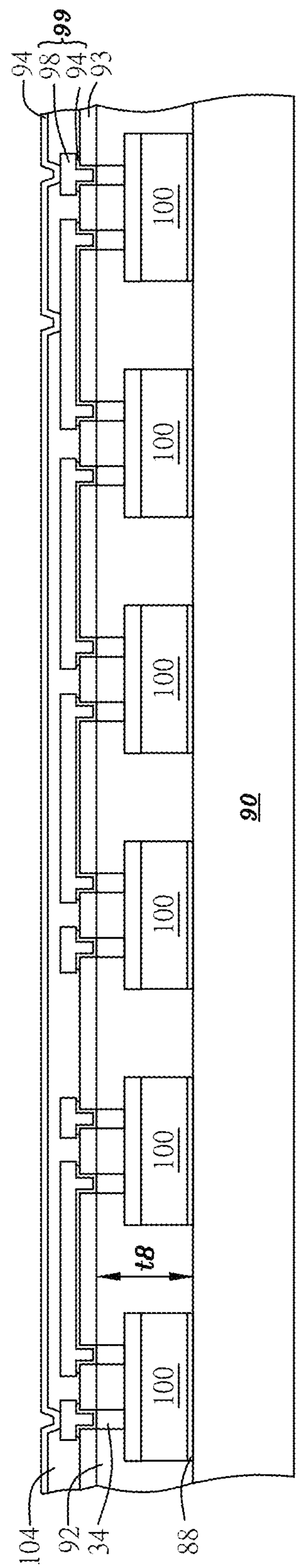
Figure 18K:
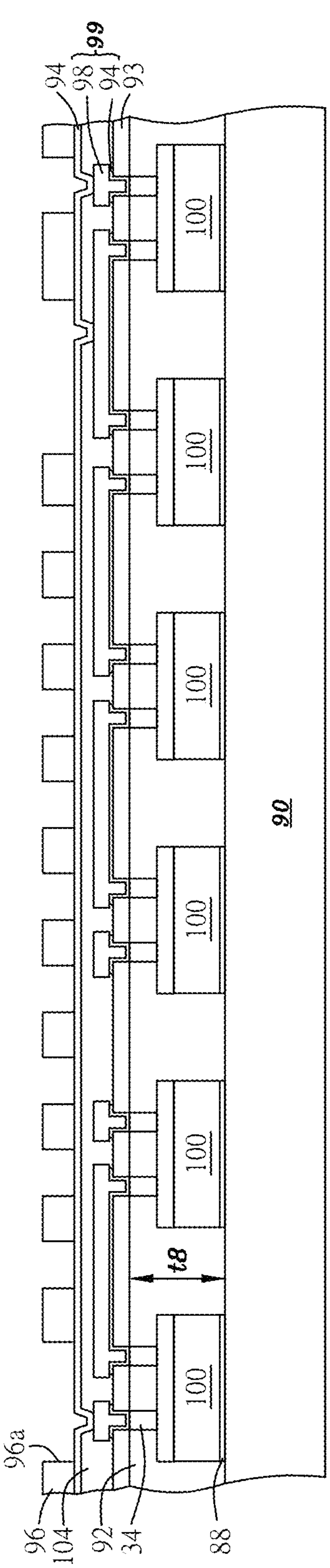
Figure 18L:
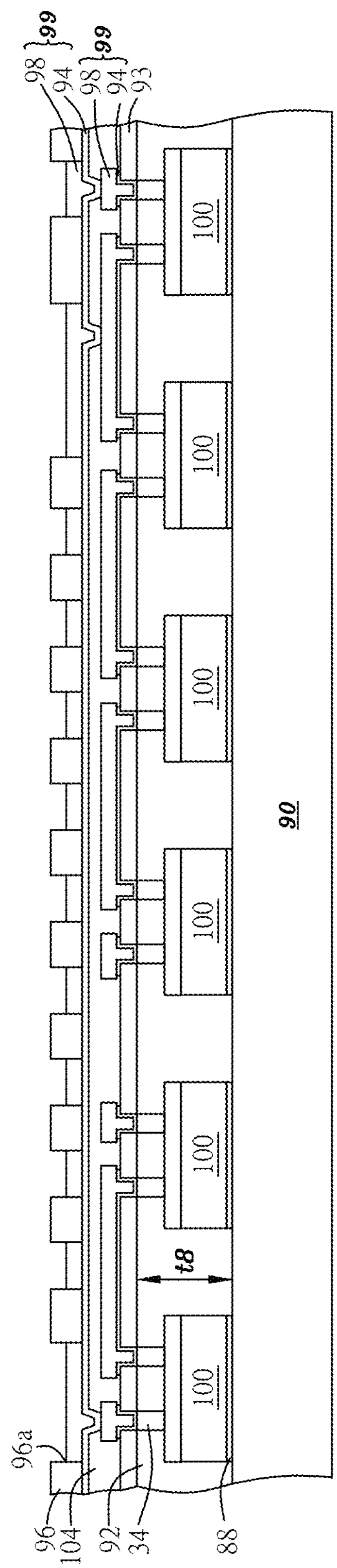
Figure 18M:
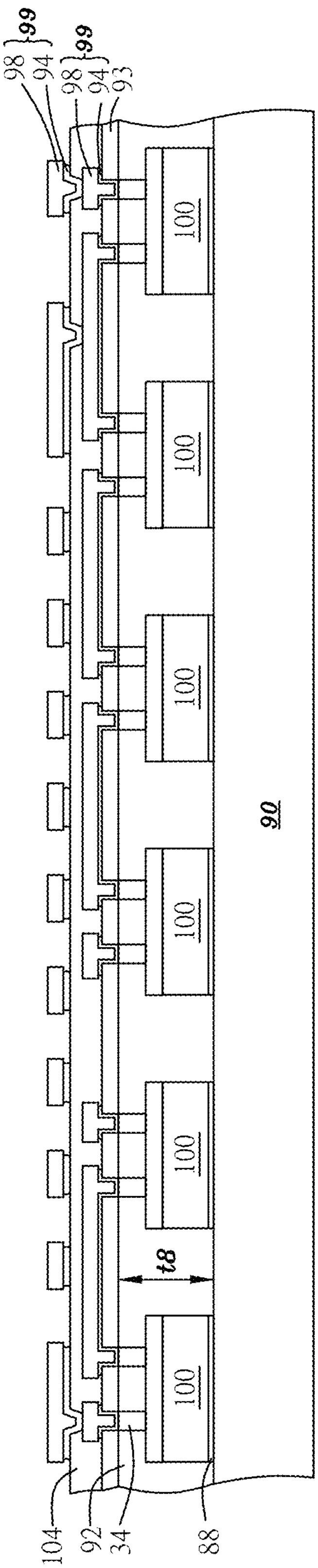
Figure 18N:
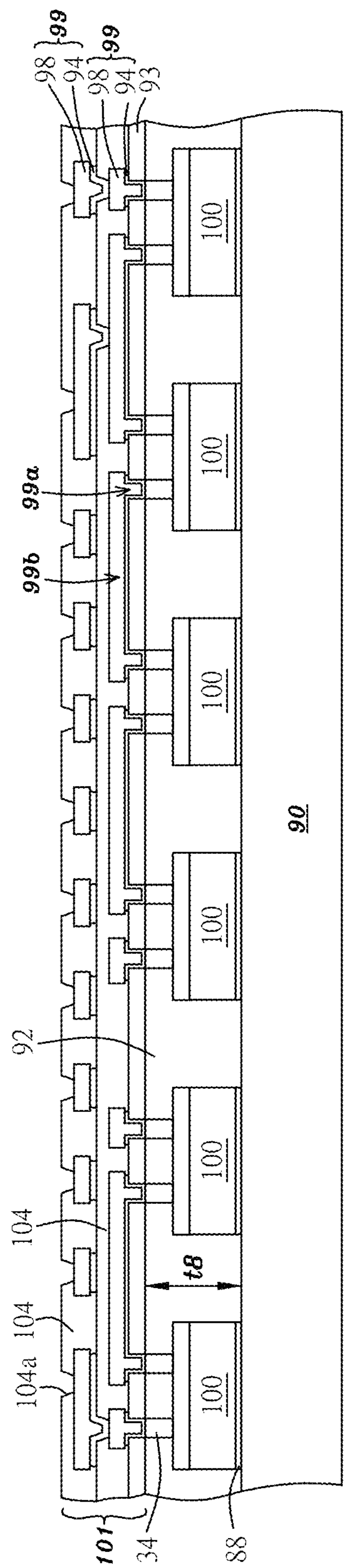
Figure 18O:
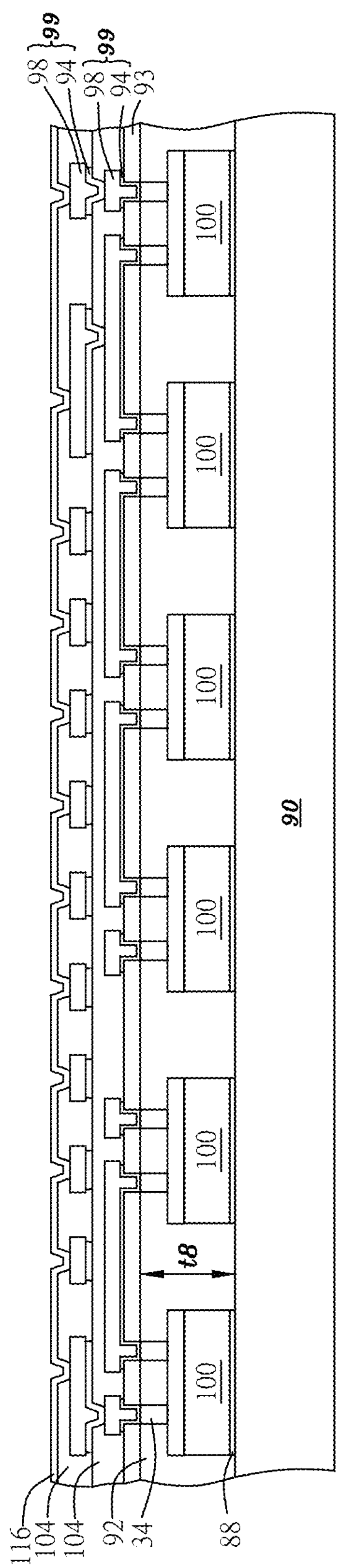
Figure 18P:
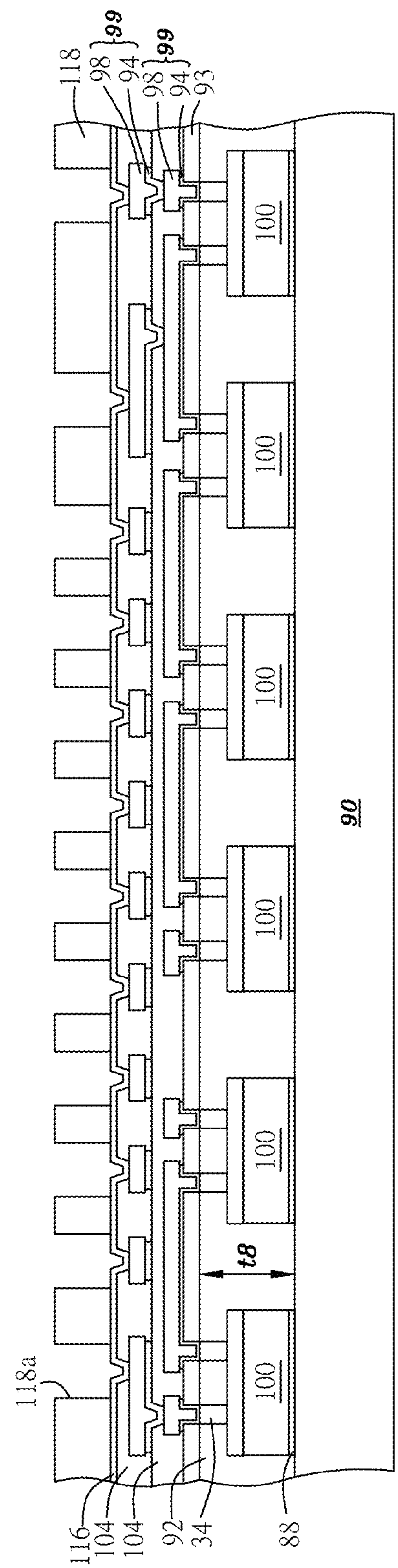
Figure 18Q:
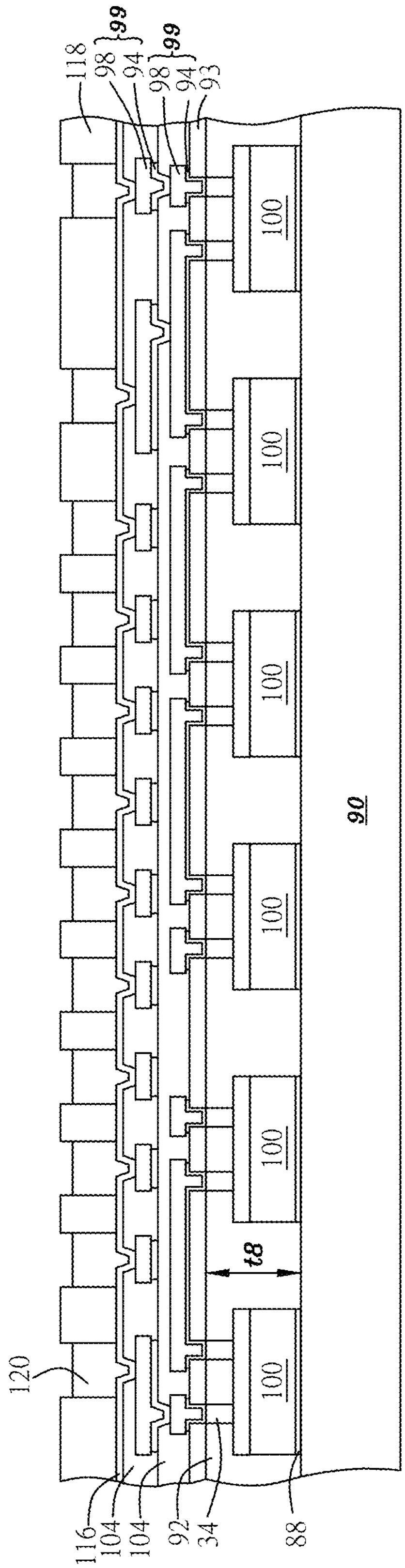
Figure 18R:
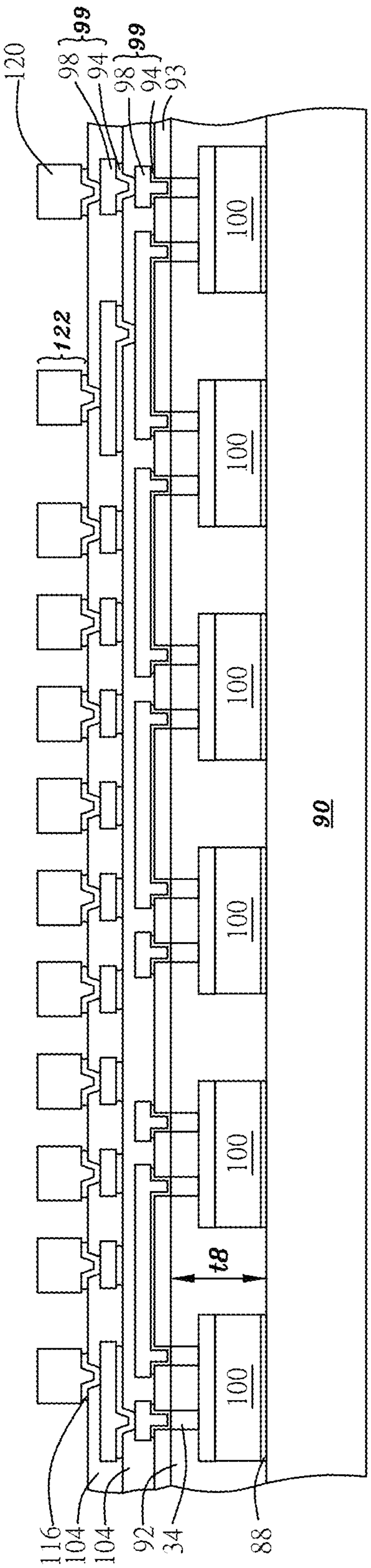
Figure 18S:
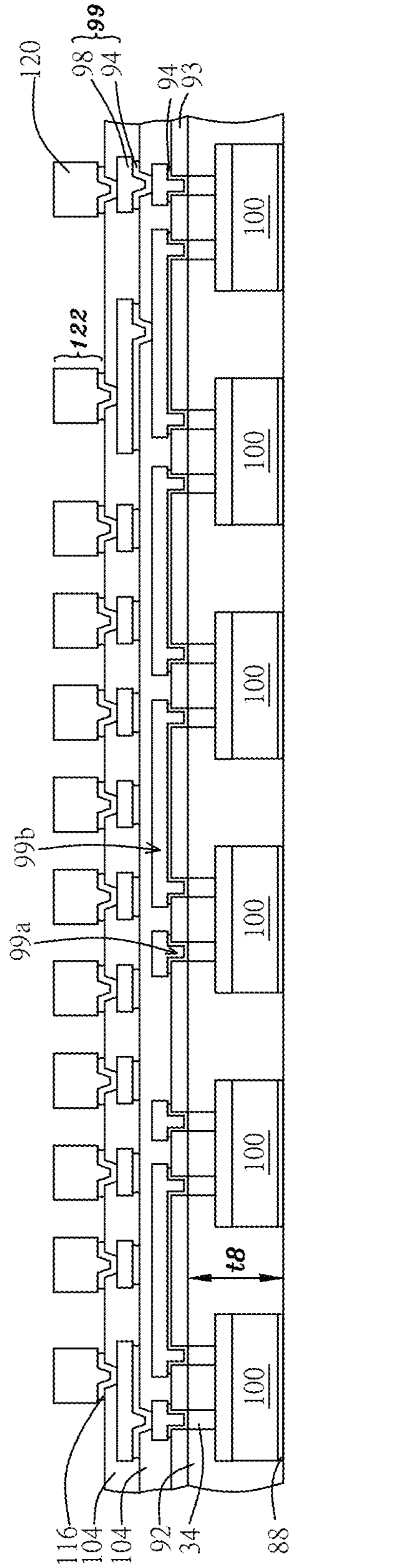
Figure 18T:
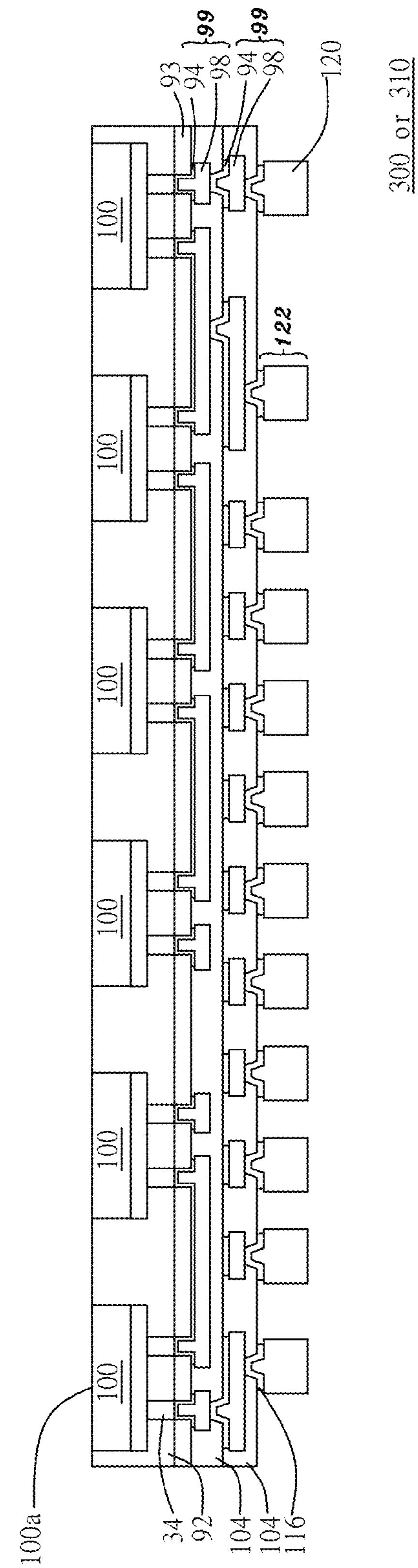

A Fan-Out Interconnection Technology (FOIT) may be employed for making or fabricating the logic drive 300 in a multi-chip package. The FOIT are described as below:

FIG. 18A-18T are schematic views showing a process for forming a logic drive based on FOIT in accordance with an embodiment of the present application. Referring to FIG. 18A, a glue material 88 is formed on multiple regions of a carrier substrate 90, i.e., chip carrier, holder or molder, by a dispensing process to form multiple glue portions on the carrier substrate 90. The carrier substrate 90 may be in a wafer format (with 8", 12" or 18" in diameter) or a panel format in square or rectangle format (with a width or a length greater than or equal to 20 cm, 30 cm, 50 cm, 75 cm, 100 cm, 150 cm 200 cm or 300 cm). Next, the various types of semiconductor chips 100 as illustrated in FIGS. 15G, 15H, 16I-16L and 17 are placed, mounted, fixed or attached onto the glue material 88 to join the carrier substrate 90. Each of the semiconductor chips 100 to be packaged in the logic drives 300 may be formed with the micro-pillars or micro-bumps 34 with the above-mentioned height, protruding from a top surface of the said each of the semiconductor chips 100, between 3 μm and 60 μm, 5 μm and 50 μm, 5 μm and 40 μm, 5 μm and 30 μm, 5 μm and 20 μm, 5 μm and 15 μm, or 3 μm and 10 μm, or greater than or equal to 30 μm, 20 μm, 15 μm, 5 μm or 3 μm. Each of the semiconductor chips 100 is placed, held, fixed or attached on or to the carrier substrate 90 with its side or surface formed with the semiconductor devices 4, e.g., transistors, being faced up. The backside of each of the semiconductor chips 100 formed without any active device is faced down to be placed, fixed, held or attached on or to the glue material 88 preformed on the carrier substrate 90. Next, the glue material 88 is baked or cured at a temperature of between 100 and 200° C.

In view of the logic drive 300 shown in FIGS. 11A-11N, each of the semiconductor chips 100 may be one of the standard commodity FPGA IC chips 200, DPIIC chips 410, NVMIC chips 250, dedicated I/O chips 265, PCIC chips 269 (such as CPU chips, GPU chips, TPU chips or APU chips), DRAM chips 321, dedicated control chips 260, dedicated control and I/O chips 266, IAC chips 402, DCIAC chips 267 and DCDI/OIAC chips 268. For example, the six semiconductor chips 100 shown in FIG. 18A may be the NVMIC chip 250, the standard commodity FPGA IC chip 200, the CPU chip 269, the dedicated control chip 260, the standard commodity FPGA IC chip 200 and the GPU chip 269 arranged respectively from left to right. For example, the six semiconductor chips 100 shown in FIG. 18A may be the NVMIC chip 250, the standard commodity FPGA IC chip 200, the DPIIC chip 410, the CPU chip 269, the DPIIC chip 410 and the GPU chip 269 arranged respectively from left to right. For example, the six semiconductor chips 100 shown in FIG. 18A may be the dedicated I/O chip 265, the NVMIC chip 250, the standard commodity FPGA IC chip 200, the DPIIC chip 410, the standard commodity FPGA IC chip 200 and the dedicated I/O chip 265.

Referring to FIG. 18A, the material of the glue material 88 may be polymer material, such as polyimide or epoxy resin, and the thickness of the glue material 88 is between 1 and 50 μm. For example, the glue material 88 may be polyimide having a thickness of between 1 and 50 μm. Alternatively, the glue material 88 may be epoxy resin having a thickness of between 1 and 50 μm. Therefore, the semiconductor chips 100 may be adhered to the carrier substrate 90 using polyimide. Alternatively, the semiconductor chips 100 may be adhered to the carrier substrate 90 using epoxy resin.

In FIG. 18A, the material of the carrier substrate 90 may be silicon, metal, ceramics, glass, steel, plastics, polymer, epoxy-based polymer, or epoxy-based compound. For example, the carrier substrate 90 may be a glass-fiber-reinforced epoxy-based substrate with a thickness of between 200 and 2,000 μm. Alternatively, the carrier substrate 90 may be a glass substrate with a thickness of between 200 and 2,000 μm. Alternatively, the carrier substrate 90 may be a silicon substrate with a thickness of between 200 and 2,000 μm. Alternatively, the carrier substrate 90 may be a ceramic substrate with a thickness of between 200 and 2,000 μm. Alternatively, the carrier substrate 90 may be an organic substrate with a thickness of between 200 and 2,000 μm. Alternatively, the carrier substrate 90 may be a metal substrate, comprising aluminum, with a thickness of between 200 and 2,000 μm. Alternatively, the carrier substrate 90 may be a metal substrate, comprising copper, with a thickness of between 200 and 2,000 μm. The carrier substrate 90 may have no metal trace in the carrier substrate 90, but may have a function for carrying the semiconductor chips 100.

Referring to FIG. 18B, a polymer layer 92 having a thickness t7 of between 250 and 1,000 μm is formed by methods, such as spin-on coating, screen-printing, dispensing or molding, on the carrier substrate 90 and on the semiconductor chips 100, enclosing the micro-pillars or micro-bumps 34 of the semiconductor chips 100, and filled into multiple gaps between the semiconductor chips 100. The molding method includes compress molding (using top and bottom pieces of molds) or casting molding (using a dispenser). The material, resin, or compound used for the polymer layer 92 may be a polymer material includes, for example, polyimide, BenzoCycloButene (BCB), parylene, epoxy-based material or compound, photo epoxy SU-8, elastomer or silicone. The polymer layer 92 may be, for example, photosensitive polyimide/PBO PIMEL™ supplied by Asahi Kasei Corporation, Japan, or epoxy-based molding compounds, resins or sealants provided by Nagase ChemteX Corporation, Japan. The polymer layer 92 is applied (by coating, printing, dispensing or molding) on or over the carrier substrate 90 and on or over the semiconductor chips 100 to a level to: (i) fill gaps between the semiconductor chips 100, (ii) cover the top surfaces of the semiconductor chips 100, (iii) fill gaps between the micro-pillars or micro-bumps 34 on or of the semiconductor chips 100, (iv) cover top surfaces of the micro-pillars or micro-bumps 34 on or of the semiconductor chips 100. The polymeric material, resin or molding compound for the polymer layer 92 may be cured or cross-linked by raising a temperature to a certain temperature degree, for example, higher than or equal to 50° C., 70° C., 90° C., 100° C., 125° C., 150° C., 175° C., 200° C., 225° C., 250° C., 275° C. or 300° C.

Referring to FIG. 18C, the polymer layer 92 is polished from a front side thereof to uncover a front surface of each of the micro-pillars or micro-bumps 34 and to planarize the front side of the polymer layer 92, for example by a mechanical polishing process. Alternatively, the polymer layer 92 may be polished by a chemical mechanical polishing (CMP) process. When the polymer layer 92 is being polished, the micro-pillars or micro-bumps 34 each may have a front portion allowed to be removed and the polymer layer 92, after polished, may have a thickness t8 between 250 and 800 microns.

Next, a Top Interconnection Scheme in, on or of the logic drive (TISD) may be formed on or over the front side of the polymer layer 92 and the front sides of the micro-pillars or micro-bumps 34 by a wafer or panel processing, as seen in FIGS. 18D-18N.

Referring to FIG. 18D, a polymer layer 93, i.e., insulating dielectric layer, is formed on the polymer layer 92 and the micro-pillar or micro-bumps 34 by a method of spin-on coating, screen-printing, dispensing or molding, and openings 93*a* in the polymer layer 93 are formed over the micro-pillars or micro-bumps 34 to be exposed by the openings 93*a*. The polymer layer 93 may contain, for example, polyimide, BenzoCycloButene (BCB), parylene, epoxy-based material or compound, photo epoxy SU-8, elastomer or silicone. The polymer layer 93 may comprise organic material, for example, a polymer, or material compounds comprising carbon. The polymer layer 93 may be photosensitive, and may be used as photoresist as well for patterning multiple openings 93*a* therein to have multiple metal vias formed therein by following processes to be performed later. The polymer layer 93 may be coated, exposed to light through a photomask, and then developed to form the openings 93*a* therein. The openings 93*a* in the polymer layer 93 overlap the top surfaces of the micro-pillars or micro bumps 34 to be exposed by the openings 93*a*. In some applications or designs, the size or transverse largest dimension of one of the openings 93*a* in the polymer layer 93 may be smaller than that of the area of the top surface of one of the micro-pillars or micro-bumps 34 under said one of the openings 93*a*. In other applications or designs, the size or transverse largest dimension of one of the openings 93*a* in the polymer layer 93 may be greater than that of the area of the top surface of one of the micro-pillars or micro-bumps 34 under said one of the openings 93*a*. Next, the polymer layer 93, i.e., insulating dielectric layer, is cured at a temperature, for example, higher than or equal to 100° C., 125° C., 150° C., 175° C., 200° C., 225° C., 250° C., 275° C. or 300° C. The polymer layer 93 has a thickness between 3 and 30 micrometers or between 5 and 15 micrometers. The polymer layer 93 may be added with some dielectric particles or glass fibers. The material of the polymer layer 93 and the process for forming the same may be referred to that of the polymer layer 36 and the process for forming the same as illustrated in FIG. 15H.

Next, an emboss process is performed on the polymer layer 93 and on the exposed top surfaces of the micro-pillars or micro-bumps 34, as seen in FIGS. 18E-18H.

Next, referring to FIG. 18E, an adhesion/seed layer 94 is formed on the polymer layer 93 and on the exposed top surfaces of the micro-pillars or micro-bumps 34. Optionally, the adhesion/seed layer 94 may be formed on the polymer layer 92 around the exposed top surfaces of the micro-pillars or micro-bumps 34. First, an adhesion layer having a thickness of between 0.001 and 0.7 μm, between 0.01 and 0.5 μm or between 0.03 and 0.35 μm may be sputtered on the polymer layer 93 and on the micro-pillars or micro-bumps 34. Optionally, the adhesion layer may be formed on the polymer layer 92 around the exposed top surfaces of the micro-pillars or micro-bumps 34. The material of the adhesion layer may include titanium, a titanium-tungsten alloy, titanium nitride, chromium, titanium-tungsten-alloy layer, tantalum nitride, or a composite of the abovementioned materials. The adhesion layer may be formed by an atomic-layer-deposition (ALD) process, chemical vapor deposition (CVD) process or evaporation process. For example, the adhesion layer may be formed by sputtering or CVD depositing a titanium (Ti) or titanium nitride (TiN) layer (with a thickness, for example, between 1 nm and 50 nm) on the polymer layer 93 and on the exposed top surfaces of the micro-pillars or micro-bumps 34.

Next, an electroplating seed layer having a thickness of between 0.001 and 1 μm, between 0.03 and 2 μm or between 0.05 and 0.5 μm may be sputtered on a whole top surface of the adhesion layer. Alternatively, the electroplating seed layer may be formed by an atomic-layer-deposition (ALD) process, chemical-vapor-deposition (CVD) process, vapor deposition method, electroless plating method or PVD (Physical Vapor Deposition) method. The electroplating seed layer is beneficial to electroplating a metal layer thereon. Thus, the material of the electroplating seed layer varies with the material of a metal layer to be electroplated on the electroplating seed layer. When a copper layer is to be electroplated on the electroplating seed layer, copper is a preferable material to the electroplating seed layer. For example, the electroplating seed layer may be deposited on or over the adhesion layer by, for example, sputtering or CVD depositing a copper seed layer (with a thickness between, for example, 3 nm and 300 nm or 3 nm and 200 nm) on the adhesion layer. The adhesion layer and electroplating seed layer compose the adhesion/seed layer 94 as seen in FIG. 18E.

Next, referring to 18F, a photoresist layer 96, such as positive-type photoresist layer, having a thickness of between 5 and 50 μm is spin-on coated or laminated on the electroplating seed layer of the adhesion/seed layer 94. The photoresist layer 96 is patterned with the processes of exposure, development, etc., to form multiple trenches or openings 96*a* in the photoresist layer 96 exposing the electroplating seed layer of the adhesion/seed layer 94. A 1× stepper, 1× contact aligner or laser scanner may be used to expose the photoresist layer 96 with at least two of G-line having a wavelength ranging from 434 to 438 nm, H-line having a wavelength ranging from 403 to 407 nm, and I-line having a wavelength ranging from 363 to 367 nm, illuminating the photoresist layer 96, that is, G-line and H-line, G-line and I-line, H-line and I-line, or G-line, H-line and I-line illuminate the photoresist layer 96, then developing the exposed polymer layer 96, and then removing the residual polymeric material or other contaminants on the electroplating seed layer of the adhesion/seed layer 94 with an $O_2$ plasma or a plasma containing fluorine of below 200 PPM and oxygen, such that the photoresist layer 96 may be patterned with multiple openings 96*a* in the photoresist layer 96 exposing the electroplating seed layer of the adhesion/seed layer 94 for forming metal pads, lines or traces in the trenches or openings 96*a* and on the electroplating seed layer of the adhesion/seed layer 94 by following processes to be performed later. One of the trenches or openings 96*a* in the photoresist layer 96 may overlap the whole area of one of the openings 93*a* in the polymer layer 93.

Next, referring to FIG. 18G, a metal layer 98, such as copper, is electroplated on the electroplating seed layer of the adhesion/seed layer 94 exposed by the trenches or openings 96*a*. For example, the metal layer 98 may be formed by electroplating a copper layer with a thickness of between 0.3 and 20 μm, 0.5 and 5 μm, 1 μm and 10 μm or 2 μm and 10 μm on the electroplating seed layer, made of copper, exposed by the trenches or openings 96*a*.

Referring to FIG. 18H, after the metal layer 98 is formed, most of the photoresist layer 38 may be removed and then the adhesion/seed layer 28 not under the metal layer 98 may be etched. The removing and etching processes may be referred respectively to the processes for removing the photoresist layer 30 and etching the electroplating seed layer 28 and adhesion layer 26 as illustrated in FIG. 15F. Thereby, the adhesion/seed layer 94 and electroplated metal layer 98 may be patterned to form an interconnection metal layer 99 over the polymer layer 92. The interconnection metal layer 99 may be formed with multiple metal vias 99*a* in the openings 93*a* in the polymer layer 93 and multiple metal pads, lines or traces 99*b* on the polymer layer 93.

Next, referring to FIG. 18I, a polymer layer 104, i.e., insulting or inter-metal dielectric layer, is formed on the polymer layer 14 and metal layer 98 and multiple openings 104*a* in the polymer layer 104 are over multiple contact points of the interconnection metal layer 99. The polymer layer 104 has a thickness between 3 and 30 micrometers or between 5 and 15 micrometers. The polymer layer 104 may be added with some dielectric particles or glass fibers. The material of the polymer layer 104 and the process for forming the same may be referred to that of the polymer layer 93 or 36 and the process for forming the same as illustrated in FIG. 18D or 15H.

The process for forming the interconnection metal layer 99 as illustrated in FIGS. 18F-18H and the process for forming the polymer layer 104 may be alternately performed more than one times to fabricate the TISD 101 as seen in FIGS. 18D-18N. Referring to FIG. 18N, the TISD 101 may include an upper one of the interconnection metal layers 99 formed with multiple metal vias 99*a* in the openings 104*a* in one of the polymer layers 104 and multiple metal pads, lines or traces 99*b* on said one of the polymer layers 104. The upper one of the interconnection metal layers 99 may be connected to a lower one of the interconnection metal layers 99 through the metal vias 99*a* of the upper one of the interconnection metal layers 99 in the openings 104*a* in said one of the polymer layers 104. The TISD 101 may include the bottommost one of the interconnection metal layers 99 formed with multiple metal vias 99*a* in the openings 93*a* in the polymer layer 93 and multiple metal pads, lines or traces 99*b* on the polymer layer 93. The bottommost one of the interconnection metal layers 99 may be connected to the SISCs 29 of the semiconductor chips 100 through its metal vias 99*a* and the micro-pillars or micro-bumps 94.

Accordingly, referring to FIG. 18N, the TISD 101 may comprise 2 to 6 layers, or 3 to 5 layers of interconnection metal layers 99. The metal pads or lines or traces 99*b* of the interconnection metal layers 99 of the TISD 101 may be over the semiconductor chips 100 and extend horizontally across the edges of the semiconductor chips 100; in other words, the metal pads or lines or traces 99*b* may extend over the a gap between neighboring two of the semiconductor chips 100 of the logic drive 300. The metal pads, lines or traces 99*b* of the interconnection metal layers 99 of the TISD 101 connect or couple the micro-pillars or micro-bumps 34 of two or more of the semiconductor chips 100 of the logic drive 300.

Referring to FIG. 18N, the interconnection metal layers 99 of the TISD 101 are coupled or connected to the interconnection metal layers 27 of the SISC 29, the interconnection metal layers 6 of the FISC 20, and/or the semiconductor devices 4, i.e., transistors, of the semiconductor chips 100 of the logic drive 300, through the micro-pillars or micro-bumps 34 of the semiconductor chips 100. The semiconductor chips 100 are surrounded by the polymer layer 92 filled in the gaps between the semiconductor chips 100, and the semiconductor chips 100 are also covered by the polymer layer 92 on the top surfaces of the semiconductor chips 100. For the TISD 101, the metal pads, lines or traces 99*b* of its interconnection metal layers 99 may have thicknesses between, for example, 0.3 μm and 30 μm, 0.5 μm and 20 μm, 1 μm and 10 μm or 0.5 μm to 5 μm, or thicker than or equal to 0.3 μm, 0.5 μm, 0.7 μm, 1 μm, 1.5 μm, 2 μm, 3 μm or 5 μm, and widths between, for example, 0.3 μm and 30 μm, 0.5 μm and 1 μm and 10 μm or 0.5 μm to 5 μm or wider than or equal to 0.3 μm, 0.5 μm, 0.7 μm, 1 μm, 1.5 μm, 2 μm, 3 μm or 5 μm. For the TISD, its polymer layers 104, i.e., inter-metal dielectric layer, may have a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The interconnection metal layers 99 of the TISD 101 may be used for the inter-chip interconnects 371 as seen in FIGS. 11A-11N.

Referring to FIG. 18N, in the logic drive 300 as seen in FIGS. 11A-11N, the programmable interconnects 361 of the inter-chip interconnects 371 may be provided by the interconnection metal layers 99 of TISD 101 and may be programmed by a plurality of the memory cells 362 distributed in the standard commodity FPGA IC chips 200 as seen in FIG. 8A-8J and DPIIC chips 410 as seen in FIG. 9. Each (or each group) of the memory cells 362 is configured to turn on or off one of the pass/no-pass switches 258 to control whether connection between two of the programmable interconnects 361 of the TISD 101 coupling to two ends of said one of the pass/no-pass switches 258 is established or not. Thereby, in the logic drive 300 as seen in FIGS. 11A-11N, a group of the programmable interconnects 361 of the TISD 101 may connected to each other or one another by the pass/no-pass switches 258 of the cross-point switches 379 set in one or more of the DPIIC chips 410 to (1) connect one of the standard commodity FPGA IC chips 200 to another of the standard commodity FPGA IC chips 200, (2) connect one of the standard commodity FPGA IC chips 200 to one of the dedicated I/O chips 265, (3) connect one of the standard commodity FPGA IC chips 200 to one of the DRAM chips 321, (4) connect one of the standard commodity FPGA IC chips 200 to one of the PCIC chips 269, (5) connect one of the standard commodity FPGA IC chips 200 to the dedicated control chip 260, dedicated control and I/O chip 266, DCIAC chip 267 or DCDI/OIAC chip 268, (6) connect one of the dedicated I/O chips 265 to another of the dedicated I/O chips 265, (7) connect one of the dedicated I/O chips 265 to one of the DRAM chips 321, (8) connect one of the dedicated I/O chips 265 to one of the PCIC chips 269, (9) connect one of the dedicated I/O chips 265 to the dedicated control chip 260, dedicated control and I/O chip 266, DCIAC chip 267 or DCDI/OIAC chip 268, (10) connect one of the DRAM chips 321 to another of the DRAM chips 321, (11) connect one of the DRAM chips 321 to one of the PCIC chips 269, (12) connect one of the DRAM chips 321 to the dedicated control chip 260, dedicated control and I/O chip 266, DCIAC chip 267 or DCDI/OIAC chip 268, (13) connect one of the PCIC chips 269 to another of the PCIC chips 269, or (14) connect one of the PCIC chips 269 to the dedicated control chip 260, dedicated control and I/O chip 266, DCIAC chip 267 or DCDI/OIAC chip 268.

Figure 18U:
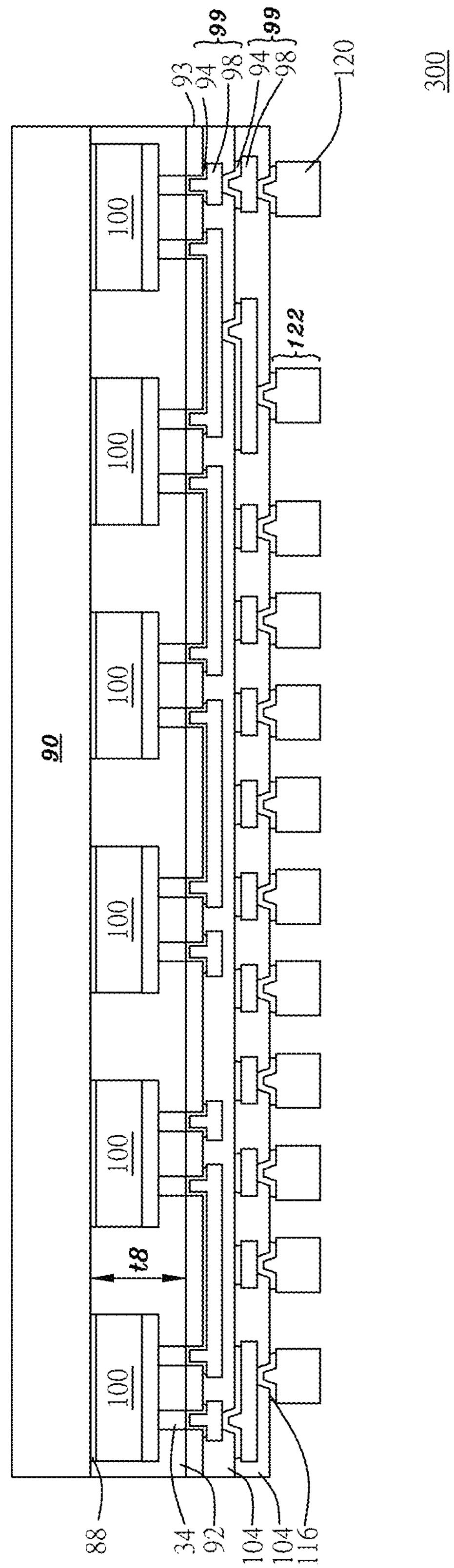

Typically, the metal pads, lines or traces 99*b* of the TISD 101 as seen in FIGS. 18T and 18U may have a thickness greater than or equal to the metal pads, lines or traces 27*b* of the SISC 29 as seen in FIGS. 16I-16L and 17 greater than the metal pads, lines or traces 8 as seen in FIG. 14A.

Metal Bumps Over TISD

Next, multiple metal pillars or bumps may be formed on a topmost one of the interconnection metal layers 99 of the TISD 101, as seen in FIGS. 18O-18R. FIGS. 18O-18R are schematically cross-sectional views showing a process for forming metal pillars or bumps on an interconnection metal layer of TISD in accordance with an embodiment of the present application.

Referring to FIG. 18O, an adhesion/seed layer 116 is formed on a topmost one of the polymer layers 104 of the TISD 101 and on a topmost one of the interconnection metal layers 99 of the TISD 101. First, an adhesion layer having a thickness of between 0.001 and 0.7 μm, between 0.01 and 0.5 μm or between 0.03 and 0.35 μm may be sputtered on the topmost one of the polymer layers 104 of the TISD 101 and on the topmost one of the interconnection metal layers 99 of the TISD 101. The material of the adhesion layer may include titanium, a titanium-tungsten alloy, titanium nitride, chromium, titanium-tungsten-alloy layer, tantalum nitride, or a composite of the abovementioned materials. The adhesion layer may be formed by an atomic-layer-deposition (ALD) process, chemical vapor deposition (CVD) process or evaporation process. For example, the adhesion layer may be formed by sputtering or CVD depositing a titanium (Ti) or titanium nitride (TiN) layer (with a thickness, for example, between 1 nm and 200 nm or between 5 nm and 50 nm) on the topmost one of the polymer layers 104 of the TISD 101 and on the topmost one of the interconnection metal layers 99 of the TISD 101.

Next, an electroplating seed layer having a thickness of between 0.001 and 1 μm, between 0.03 and 2 μm or between 0.05 and 0.5 μm may be sputtered on a whole top surface of the adhesion layer. Alternatively, the electroplating seed layer may be formed by an atomic-layer-deposition (ALD) process, chemical-vapor-deposition (CVD) process, vapor deposition method, electroless plating method or PVD (Physical Vapor Deposition) method. The electroplating seed layer is beneficial to electroplating a metal layer thereon. Thus, the material of the electroplating seed layer varies with the material of a metal layer to be electroplated on the electroplating seed layer. When a copper layer, for a first type of metal bumps 122 to be formed in the following steps, is to be electroplated on the electroplating seed layer, copper is a preferable material to the electroplating seed layer. When a copper barrier layer, for a second type of metal bumps 122 to be formed in the following steps, is to be electroplated on the electroplating seed layer, copper is a preferable material to the electroplating seed layer. When a gold layer, for a third type of metal bumps 122 to be formed in the following steps, is to be electroplated on the electroplating seed layer, gold is a preferable material to the electroplating seed layer. For example, the electroplating seed layer, for the first or second type of metal bumps 122 to be formed in the following steps, may be deposited on or over the adhesion layer by, for example, sputtering or CVD depositing a copper seed layer (with a thickness between, for example, 3 nm and 400 nm or 10 nm and 200 nm) on the adhesion layer. The electroplating seed layer, for the third type of metal bumps 122 to be formed in the following steps, may be deposited on or over the adhesion layer by, for example, sputtering or CVD depositing a gold seed layer (with a thickness between, for example, 1 nm and 300 nm or 1 nm and 50 nm) on the adhesion layer. The adhesion layer and electroplating seed layer compose the adhesion/seed layer 116 as seen in FIG. 18O.

Next, referring to 18P, a photoresist layer 118, such as positive-type photoresist layer, having a thickness of between 5 and 500 μm is spin-on coated or laminated on the electroplating seed layer of the adhesion/seed layer 116. The photoresist layer 118 is patterned with the processes of exposure, development, etc., to form multiple openings 118*a* in the photoresist layer 118 exposing the electroplating seed layer of the adhesion/seed layer 116. A 1× stepper, 1× contact aligner or laser scanner may be used to expose the photoresist layer 118 with at least two of G-line having a wavelength ranging from 434 to 438 nm, H-line having a wavelength ranging from 403 to 407 nm, and I-line having a wavelength ranging from 363 to 367 nm, illuminating the photoresist layer 118, that is, G-line and H-line, G-line and I-line, H-line and I-line, or G-line, H-line and I-line illuminate the photoresist layer 118, then developing the exposed photoresist layer 118, and then removing the residual polymeric material or other contaminants on the electroplating seed layer of the adhesion/seed layer 116 with an $O_2$ plasma or a plasma containing fluorine of below 200 PPM and oxygen, such that the photoresist layer 118 may be patterned with multiple openings 118*a* in the photoresist layer 118 exposing the electroplating seed layer of the adhesion/seed layer 116 over the metal pads 99*b* of a topmost one of the interconnection metal layers 99.

Referring to FIG. 18P, one of the openings 118*a* in the photoresist layer 118 may overlap one of the openings 104*a* in the topmost one of the polymer layers 104 for forming one of metal pads or bumps by following processes to be performed later, exposing the electroplating seed layer of the adhesion/seed layer 116 at the bottom of said one of the openings 118*a*, and may extend out of said one of the openings 104 to an area or ring of the topmost one of the polymer layers 104 of the TISD 111 around said one of the openings 104.

Referring to FIG. 18Q, a metal layer 120, such as copper, is electroplated on the electroplating seed layer of the adhesion/seed layer 116 exposed by the openings 118*a*. For example, in a first type, the metal layer 120 may be formed by electroplating a copper layer with a thickness of between 5 μm and 120 μm, 10 μm and 100 μm, 10 μm and 60 μm, 10 μm and 40 μm, or 10 μm and 30 μm on the electroplating seed layer, made of copper, exposed by the openings 118*a*.

Referring to FIG. 18R, after the metal layer 120 is formed, most of the photoresist layer 118 may be removed and then the adhesion/seed layer 116 not under the metal layer 120 may be etched. The removing and etching processes may be referred respectively to the processes for removing the photoresist layer 30 and etching the electroplating seed layer 28 and adhesion layer 26 as illustrated in FIG. 15F. Thereby, the adhesion/seed layer 116 and electroplated metal layer 120 may be patterned to form multiple metal bumps 122 on the metal pads 99*b* of the topmost one of the interconnection metal layers 99 at bottoms of the openings 104*a* in the topmost one of the polymer layers 104. The metal pillars or bumps 122 may be used for connecting or coupling the semiconductor chips 100, such as dedicated I/O chips 265 as seen in FIGS. 11A-11N, of the logic drive 300 to circuits or components external or outside of the logic drive 300.

The first type of metal pillars or bumps 122 may have a height, protruding from a top surface of the topmost one of the polymer layers 104, between 5 μm and 120 μm, 10 μm and 100 μm, 10 μm and 60 μm, 10 μm and 40 μm or 10 μm and 30 μm, or greater or taller than or equal to 50 μm, 30 μm, 20 μm, 15 μm, or 5 μm, and a largest dimension in a cross-section (for example, the diameter of a circle shape or the diagonal length of a square or rectangle shape), for example, between 5 μm and 120 μm, 10 μm and 100 μm, 10 μm and 60 μm, 10 μm and 40 μm or 10 μm and 30 μm, or greater than or equal to 60 μm, 50 μm, 40 μm, 30 μm, 20 μm, 15 μm or 10 μm. The smallest space between neighboring two of the metal pillars or bumps 122 of the first type may be, for example, between 5 μm and 120 μm, 10 μm and 100 μm, 10 μm and 60 μm, 10 μm and 40 μm or 10 μm and 30 μm, or greater than or equal to 60 μm, 50 μm, 40 μm, 30 μm, 20 μm, 15 μm or 10 μm.

Alternatively, for a second type of metal bumps 122, the metal layer 120 as seen in FIG. 18Q may be formed by electroplating a copper barrier layer, such as nickel layer, with a thickness, for example, between 1 μm and 50 μm, 1 μm and 40 μm, 1 μm and 30 μm, 1 μm and 20 μm, 1 μm and 10 μm, 1 μm and 5 μm or 1 μm and 3 μm on the electroplating seed layer, made of copper, exposed by the openings 118*a*, and then electroplating a solder layer with a thickness, for example, between 1 μm and 150 μm, 1 μm and 120 μm, 5 μm and 120 μm, 5 μm and 100 μm, 5 μm and 75 μm, 5 μm and 50 μm, 5 μm and 40 μm, 5 μm and 30 μm, 5 μm and 20 μm, 5 μm and 10 μm, 1 μm and 5 μm, or 1 μm and 3 μm on the copper barrier layer in the openings 118*a*. The solder layer may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. Furthermore, after most of the photoresist layer 118 is removed and the adhesion/seed layer 116 not under the metal layer 120 is etched as seen in FIG. 18R, a reflow process may be performed to reflow the solder layer into multiple solder balls or bumps in a circular shape for the second type of metal bumps 122.

The second type of metal pillars or bumps 122 may have a height, protruding from a top surface of the topmost one of the polymer layers 104, between 5 μm and 150 μm, 5 μm and 120 μm, 10 μm and 100 μm, 10 μm and 60 μm, 10 μm and 40 μm, or 10 μm and 30 μm, or greater or taller than or equal to 75 μm, 50 μm, 30 μm, 20 μm, 15 μm, or 10 μm and a largest dimension in a cross-section (for example, the diameter of a circle shape or the diagonal length of a square or rectangle shape), for example, between 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 100 μm, 60 μm, 50 μm, 40 μm, 30 μm, 20 μm, 15 μm, or 10 μm. The smallest space between neighboring two of the metal pillars or bumps 122 of the second type may be, for example, between 5 μm and 150 μm, 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm.

Alternatively, for a third type of metal bumps 122, the electroplating seed layer as illustrated in FIG. 18O may be formed by sputtering or CVD depositing a gold seed layer (with a thickness, for example, between 1 nm and 300 nm, or 1 nm and 100 nm) on the adhesion layer as illustrated in FIG. 18O. The adhesion layer and electroplating seed layer compose the adhesion/seed layer 116 as seen in FIG. 18O. The metal layer 120, as seen in FIG. 18Q, may be formed by electroplating a gold layer with a thickness, for example, between 3 μm and 40 μm, 3 μm and 30 μm, 3 μm and 20 μm, 3 μm and 15 μm, or 3 μm and 10 μm on the electroplating seed layer, made of gold, exposed by the openings 118*a*. Next, most of the photoresist layer 118 may be removed and then the adhesion/seed layer 116 not under the metal layer 120 may be etched to form the third type of metal bumps 122.

The third type of metal pillars or bumps 122 may have a height, protruding from a top surface of the topmost one of the polymer layers 104, between 3 μm and 40 μm, 3 μm and 30 μm, 3 μm and 20 μm, 3 μm and 15 μm, or 3 μm and 10 μm, or smaller or shorter than or equal to 40 μm, 30 μm, 20 μm, 15 μm, or 10 μm and a largest dimension in a cross-section (for example, the diameter of a circle shape or the diagonal length of a square or rectangle shape), for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 μm. The smallest space between neighboring two of the metal pillars or bumps 122 of the third type may be, for example, between 3 μm and 40 μm, 3 μm and 30 μm, 3 μm and 20 μm, 3 μm and 15 μm, or 3 μm and 10 μm, or smaller than or equal to 40 μm, 30 μm, 20 μm, 15 μm, or 10 μm.

Alternatively, for a fourth type of metal bumps 122, the metal layer 120 as seen in FIG. 18Q may be formed by electroplating a copper layer with a thickness, for example, between 1 μm and 100 μm, 1 μm and 50 μm, 1 μm and 30 μm, 1 μm and 20 μm, 1 μm and 10 μm, 1 μm and 5 μm or 1 μm and 3 μm on the electroplating seed layer, made of copper, exposed by the openings 118*a*, and then electroplating a solder layer with a thickness, for example, between 1 μm and 150 μm, 1 μm and 120 μm, 5 μm and 120 μm, 5 μm and 100 μm, 5 μm and 75 μm, 5 μm and 50 μm, 5 μm and 40 μm, 5 μm and 30 μm, 5 μm and 20 μm, 5 μm and 10 μm, 1 μm and 5 μm, or 1 μm and 3 μm on the copper layer in the openings 118*a*. The solder layer may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. Furthermore, after most of the photoresist layer 118 is removed and the adhesion/seed layer 116 not under the metal layer 120 is etched as seen in FIG. 18R, a reflow process may be performed to reflow the solder layer into multiple solder balls or bumps in a circular shape for the fourth type of metal bumps 122.

The fourth type of metal pillars or bumps 122 may have a height, protruding from a top surface of the topmost one of the polymer layers 104, between 5 μm and 150 μm, 5 μm and 120 μm, 10 μm and 100 μm, 10 μm and 60 μm, 10 μm and 40 μm, or 10 μm and 30 μm, or greater or taller than or equal to 75 μm, 50 μm, 30 μm, 20 μm, 15 μm, or 10 μm and a largest dimension in a cross-section (for example, the diameter of a circle shape or the diagonal length of a square or rectangle shape), for example, between 5 μm and 200 μm, 5 μm and 150 μm, 5 μm and 120 μm, 10 μm and 100 μm, 10 μm and 60 μm, 10 μm and 40 μm, or 10 μm and 30 μm; or greater than or equal to 100 μm, 60 μm, 50 μm, 40 μm, 30 μm, 20 μm, 15 μm, or 10 μm. The smallest space between neighboring two of the metal pillars or bumps 122 of the fourth type may be, for example, between 5 μm and 150 μm, 5 μm and 120 μm, 10 μm and 100 μm, 10 μm and 60 μm, 10 μm and 40 μm, or 10 μm and 30 μm; or greater than or equal to 60 μm, 50 μm, 40 μm, 30 μm, 20 μm, 15 μm or 10 μm.

Process for Chip Package

Next, referring to FIG. 18S, the carrier substrate 90 may be removed, by a polishing, grinding or chemical mechanical polishing (CMP) process, from the structure as seen in FIG. 18R. Alternatively, the carrier substrate 90 may be removed, by a polishing, grinding or chemical mechanical polishing (CMP) process, after polishing the polymer layer 92 as seen in FIG. 18C and before forming the polymer layer 93 as seen in FIG. 18D. Optionally, a wafer or panel thinning process, for example, a CMP process, polishing process or grinding process, may be performed to polish or grind a backside 100*a* of the semiconductor chips 100 and a backside 92*a* of the polymer layer 92 for thinning the structure as seen in FIG. 18S such that the polymer layer 92 may have a thickness between 50 and 500 μm. Alternatively, the carrier substrate 90 may not be removed.

After the carrier substrate 90 is removed as shown in FIG. 18S, the package structure shown in FIG. 18S may be separated, cut or diced into multiple individual chip packages, i.e., single-layer-packaged logic drives 300, as shown in FIG. 18T by a laser cutting process or by a mechanical cutting process. In the case that the carrier substrate 90 is not removed, the carrier substrate 90 may be further separated, cut or diced into multiple carrier units of the individual chip packages, i.e., single-layer-packaged logic drives 300, as shown in FIG. 18U.

Assembly for Chip Package

Referring to FIGS. 18T and 18U, the first, second or third type of metal bumps or pillars 122 may be used for assembling the logic drive 300 onto an assembling substrate, film or board, similar to the flip-chip assembly of the chip packaging technology, or similar to the Chip-On-Film (COF) assembly technology used in the LCD driver packaging technology. The assembling substrate, film or board may be, for example, a Printed Circuit Board (PCB), a silicon substrate with interconnection schemes, a metal substrate with interconnection schemes, a glass substrate with interconnection schemes, a ceramic substrate with interconnection schemes, or a flexible film with interconnection schemes.

Figure 18V:
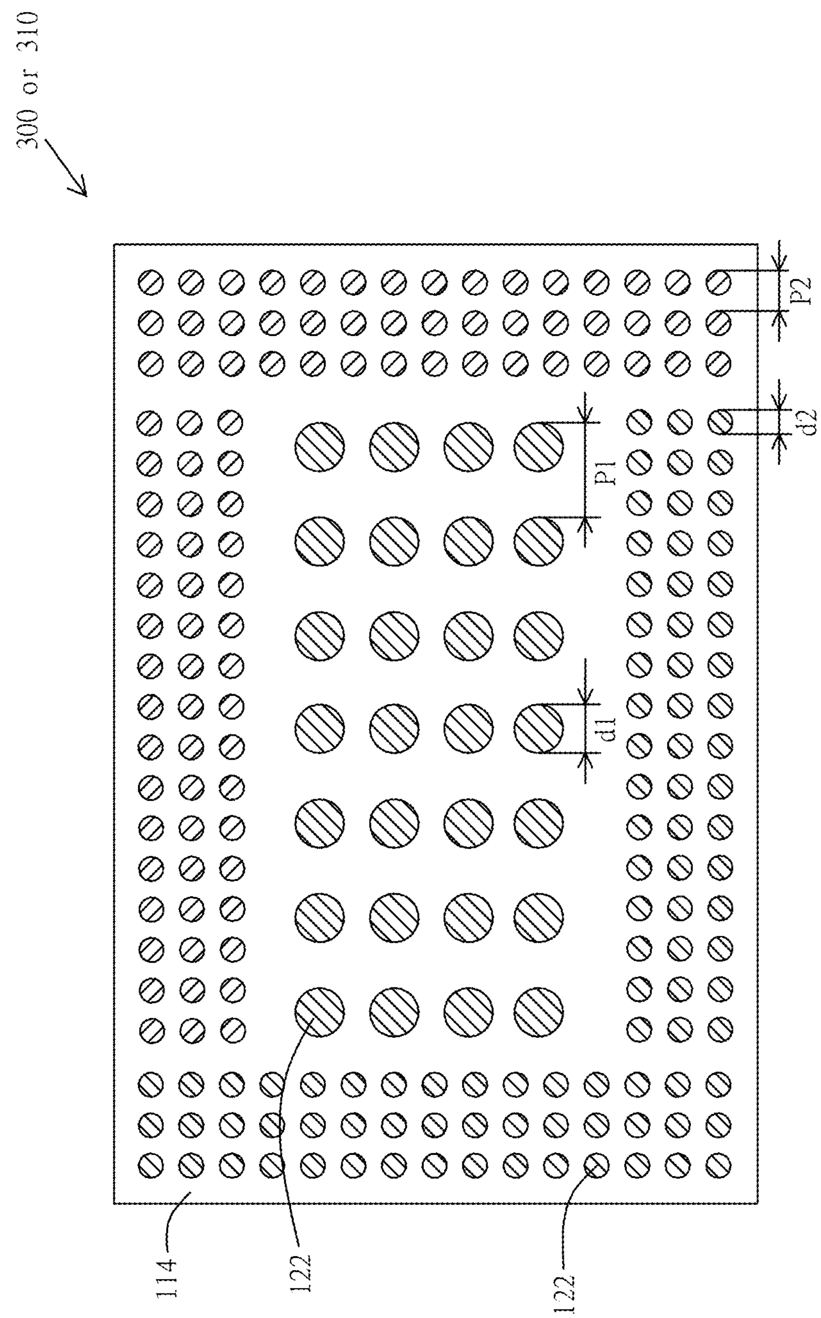

FIG. 18V is a schematically bottom view of FIG. 18T, showing a layout of metal bumps of a logic drive in accordance with an embodiment of the present application. Referring to FIG. 18V, the metal pillars or bumps 122 of the first, second or third type may be arranged with a layout of a grid array. A first group of the metal pillars or bumps 122 of the first, second or third type is arranged in an array in a central region of a bottom surface of the chip package, i.e., logic drive 300, and a second group of the metal pillars or bumps 122 of the first, second or third type may be arranged in an array in a peripheral region, surrounding the central region, of the bottom surface of the chip package, i.e., logic drive 300. Each of the metal pillars or bumps 122 of the first, second or third type in the first group may have a largest transverse dimension d1, e.g., diameter in a circular shape or diagonal length in a square or rectangle shape, greater than a largest transverse dimension d2, e.g., diameter in a circular shape or diagonal length in a square or rectangle shape, of each of the metal pillars or bumps 122 of the first, second or third type in the second group. More than 90% or 80% of the metal pillars or bumps 122 of the first, second or third type in the first group may be used for power supply or ground reference. More than 50% or 60% of the metal pillars or bumps 122 of the first, second or third type in the second group may be used for signal transmission. The metal pillars or bumps 122 of the first, second or third type in the second group may be arranged from one or more rings, such as 1 2, 3, 4, 5 or 6 rings, along the edges of a bottom surface of the chip package, i.e., logic drive 300. The minimum pitch of the metal pillars or bumps 122 of the first, second or third type in the second group may be smaller than that of the metal pillars or bumps 122 of the first, second or third type in the first group.

For bonding the first type of metal pillars or bumps 122 to the assembling substrate, film or board, the assembling substrate, film or board may be provided with multiple metal bonding pads or bumps, at its top surface, having a solder layer to be bonded with the metal pillars or bumps 122 of the first type using a solder reflowing process or thermal compressing bonding process. Thereby, the chip package, i.e., logic drive 300, may be bonded onto the assembling substrate, film or board.

For the second type of metal pillars or bumps 122, they may be bonded to the assembling substrate, film or board by a solder flow or reflow process with or without solder flux. Thereby, the chip package, i.e., logic drive 300, may be bonded onto the assembling substrate, film or board.

For the third type of metal pillars or bumps 122, they may be thermal-compress bonded to a flexible circuit film, tape or substrate in the COF technology. In the COF assembly, the metal pillars or bumps 122 of the third type may provide very high I/Os in a small area. The metal pillars or bumps 122 of the third type may have a pitch smaller than 20 nm. For a square shaped logic drive 300 with a width of 10 mm, the number of I/Os of the metal pillars or bumps 122 of the third type for signal inputs or outputs arranged along 4 edges of its bottom surface, for example, in two rings (or two rows) in its peripheral area, may be, for example, greater than or equal to 5,000 (with a bump pitch of 15 nm), 4,000 (with a bump pitch of 20 nm) or 2,500 (with a bump pitch of 15 nm). The reason that 2 rings or rows are designed along its edges is for the easy fan-out from the logic drive 300 when a single-layered film with one-sided metal lines or traces is used for the flexible circuit film, tape or substrate to be bonded with the metal pillars or bumps 122 of the third type. The metal pads on the flexible circuit film, tape or substrate may have a gold layer, at a top surface of its metal pads, to be bonded with the metal pillars or bumps 122 of the third type using a gold-to-gold thermal compressing bonding method. Alternatively, the metal pads on the flexible circuit film, tape or substrate may have a solder layer, at a top surface of its metal pads, to be bonded with the metal pillars or bumps 122 of the third type using a gold-to-solder thermal compressing bonding method.

Figure 18W:
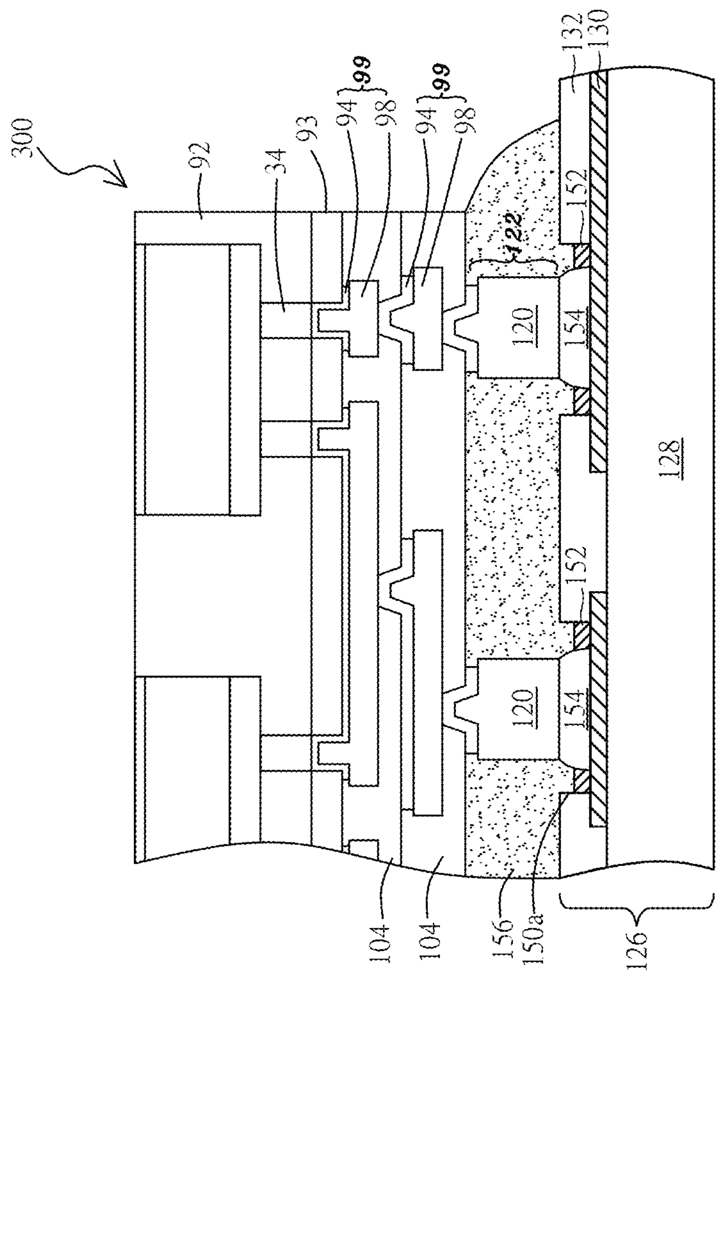

For example, FIG. 18W is a cross-sectional view showing multiple metal pillars or bumps of a logic drive are bonded onto a flex circuit film, tape or substrate in accordance with an embodiment of the present application. Referring to FIG. 18W, the metal pillars or bumps 122 of the first, second or third type may be bonded to a flexible circuit film, tape or substrate 126. The flexible circuit film, tape or substrate 126 includes a polymer layer 148, a copper trace 146 on the polymer layer 148, a protective polymer layer 150 on the copper trace 146 and on the polymer layer 148, and a gold or solder layer 152 electroless plated on the copper trace 146 exposed by an opening in the protective polymer layer 150. The flexible circuit film, tape or substrate 126 is further connected to an external circuit, such as another semiconductor chip, printed circuit board (PCB), glass substrate, another flexible circuit film, tape or substrate, ceramic substrate, glass fiber reinforced epoxy based substrate, silicon substrate or organic substrate, wherein the printed circuit board contains a core, having glass fiber, and multiple circuit layers over and under the core. The metal pillars or bumps 122 of the first, second or third type may be bonded to the gold or solder layer 152. For the metal pillars or bumps 122 of the third type, the metal layer 152 may be a tin or solder layer to be bonded with it using a gold-to-solder thermal compressing bonding method, and thereby a tin-gold alloy 154 may be formed between the copper trace 146 and the metal pillars or bumps 122 of the third type. Alternatively, for the metal pillars or bumps 122 of the third type, the metal layer 152 may be a gold layer to be bonded with it using a gold-to-gold thermal compressing bonding method. Thereafter, a polymeric material 156, such as polyimide, may be filled into a gap between the logic drive, i.e., logic drive 300, and the flexible circuit film, tape or substrate 126 to enclose the metal pillars or bumps 122 of the first, second or third type.

As mentioned above, the semiconductor chips 100 are arranged in a single layer to form a single-layer-packaged logic drive 300. A plurality of the single-layer-packaged logic drive 300 may compose an integrated logic drive. The integrated logic drive may be fabricated with two or more than two of the single-layer-packaged logic drives 300, such as 2, 3, 4, 5, 6, 7, 8 or greater than 8 ones, that can be, for example, (1) flip-package assembled in a planar fashion on a printed circuit board (PCB), high-density fine-line PCB, Ball-Grid-Array (BGA) substrate, or flexible circuit film or tape; or (2) assembled in a stack fashion using a Package-on-Package (POP) assembling technology of assembling one of the single-layer-packaged logic drives 300 on top of the other one of the single-layer-packaged logic drives 300.

For achieving the single-layer-packaged logic drives 300 assembled in a stack fashion, a middle, bottom or lower one of the single-layer-packaged logic drives 300 may be formed with through-package vias or through-polymer vias (TPV) mentioned as below:

First Embodiment for Chip Package with TPVs

Each of the single-layer-packaged logic drives 300 in the stack fashion, i.e., in the POP package, may be fabricated in accordance with the same process steps and specifications as described in the above paragraphs as illustrated in FIGS. 18A-18T, but further including multiple TPVs 158 in the polymer layer 92 between the semiconductor chips 100 of the logic drive 300, and/or in a peripheral area of the logic drive 300 surrounding the semiconductor chips 100 in a central area of the logic drive 300 as seen in FIGS. 19A-19M. FIGS. 19A-19M are schematically cross-sectional views showing a process for forming a chip package with TPVs based on FOIT in accordance with an embodiment of the present application. The TPVs 158 may be formed in one of the single-layer-packaged logic drive 300 for connecting or coupling circuits or components at the front side of said one of the single-layer-packaged logic drives 300 to those at the backside of said one of the single-layer-packaged logic drives 300.

Figure 19A:
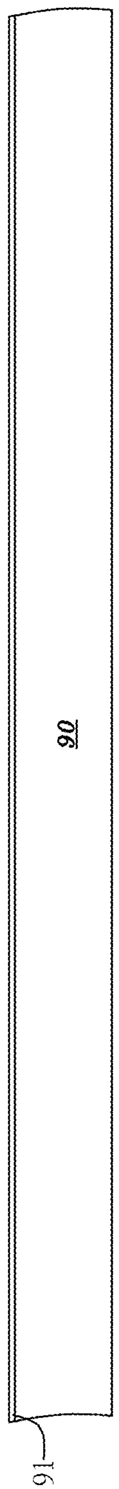
FIGS. 19A-19L are schematically cross-sectional views showing a process for forming a single-layer-packaged logic drive based on TPVs and FOIT in accordance with an embodiment of the present application.
Figure 19B:
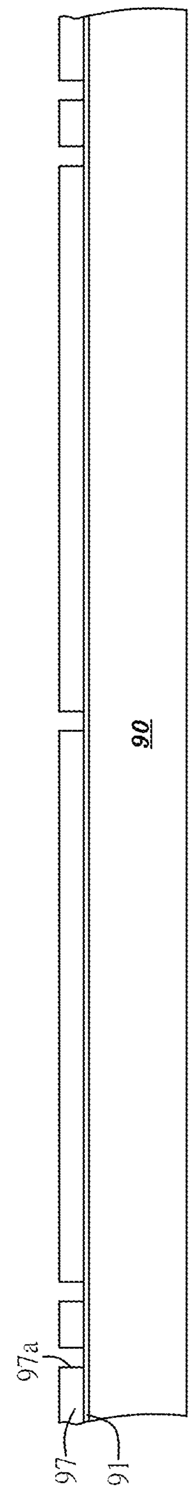
Figure 19C:
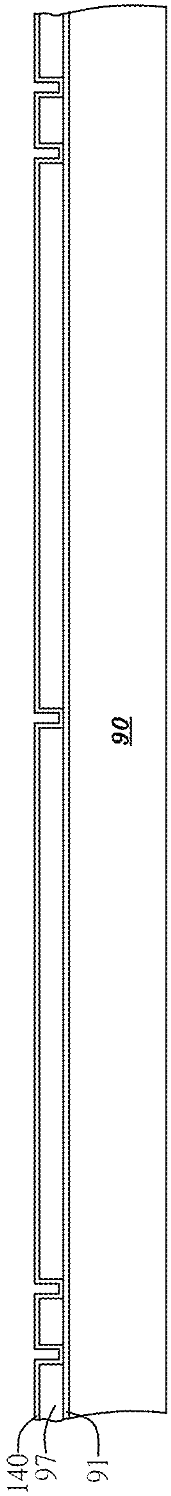
Figure 19D:
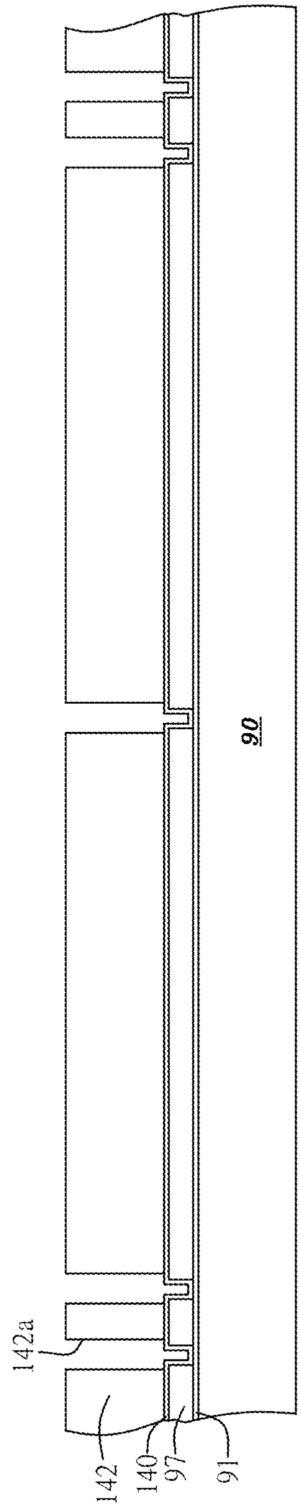
Figure 19E:
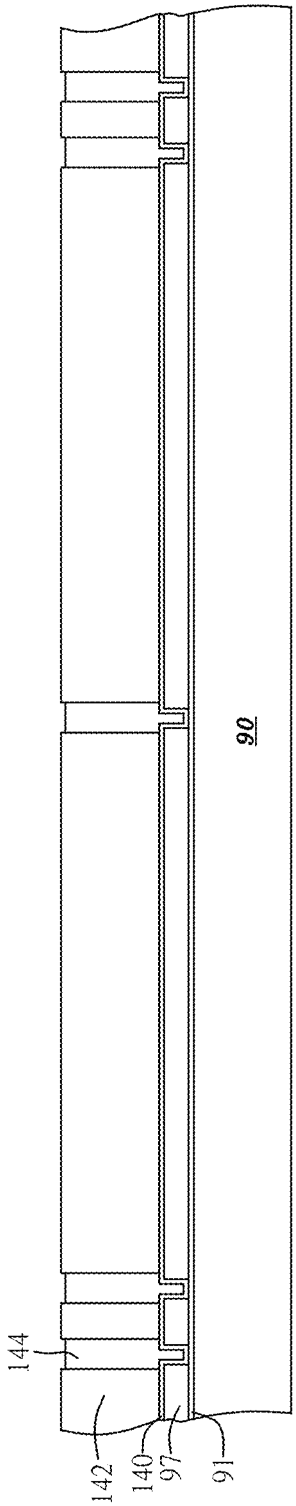
Figure 19F:
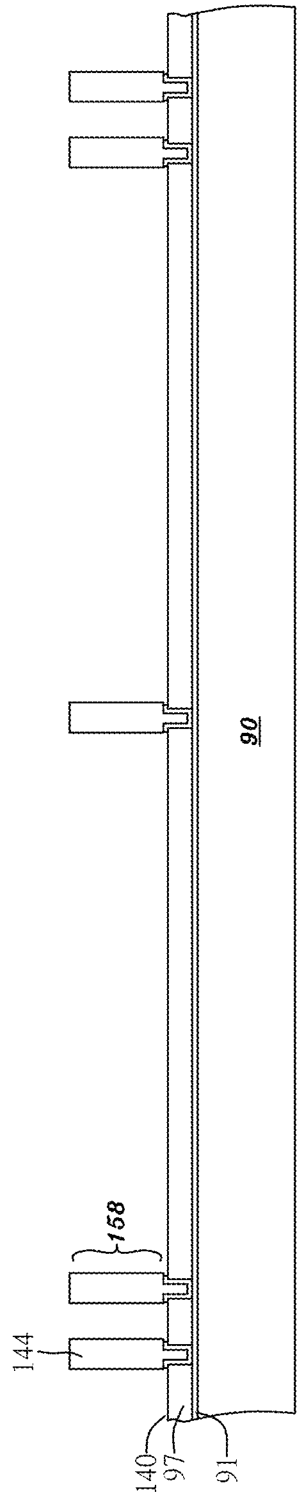
Figure 19G:
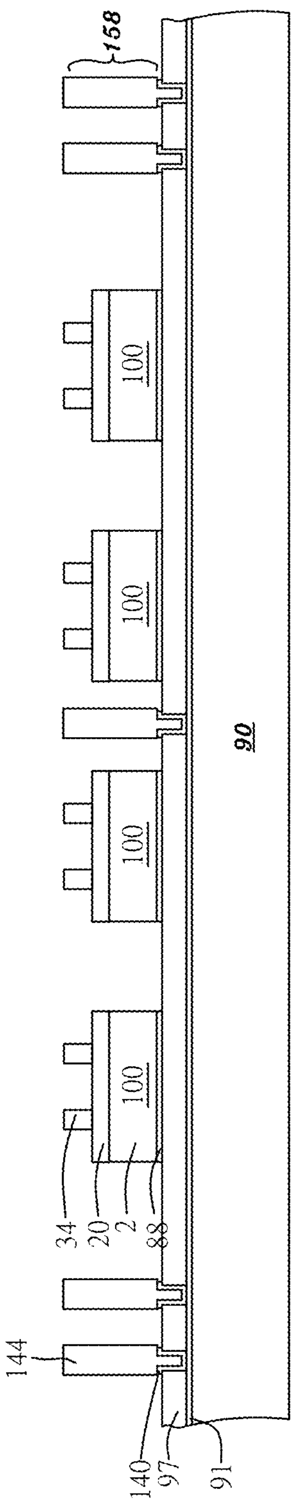
Figure 19H:
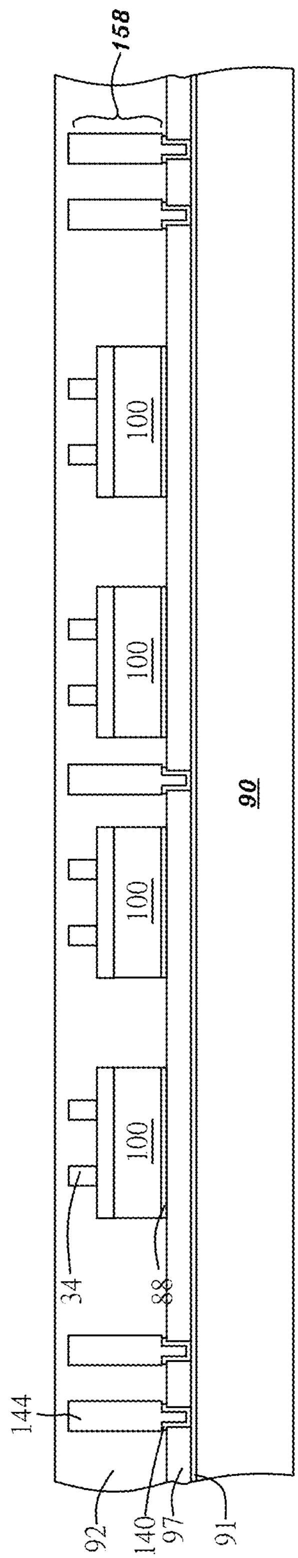
Figure 19I:
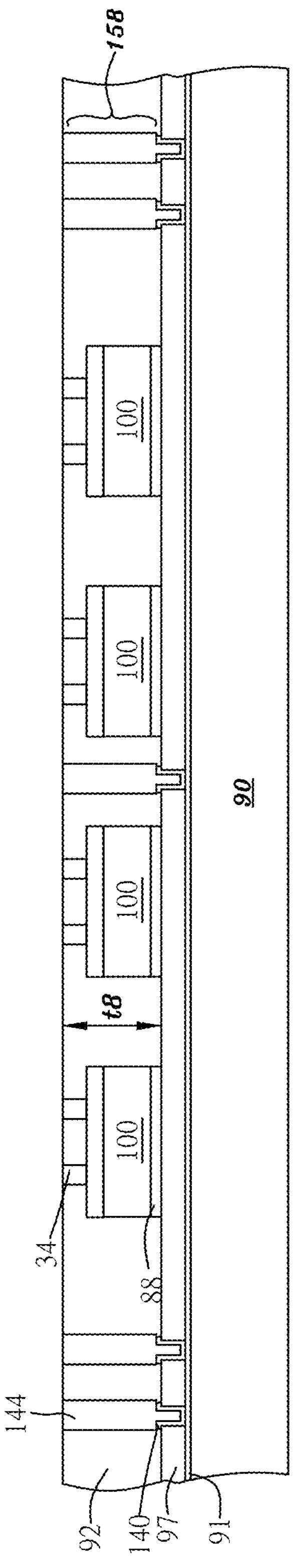
Figure 19J:
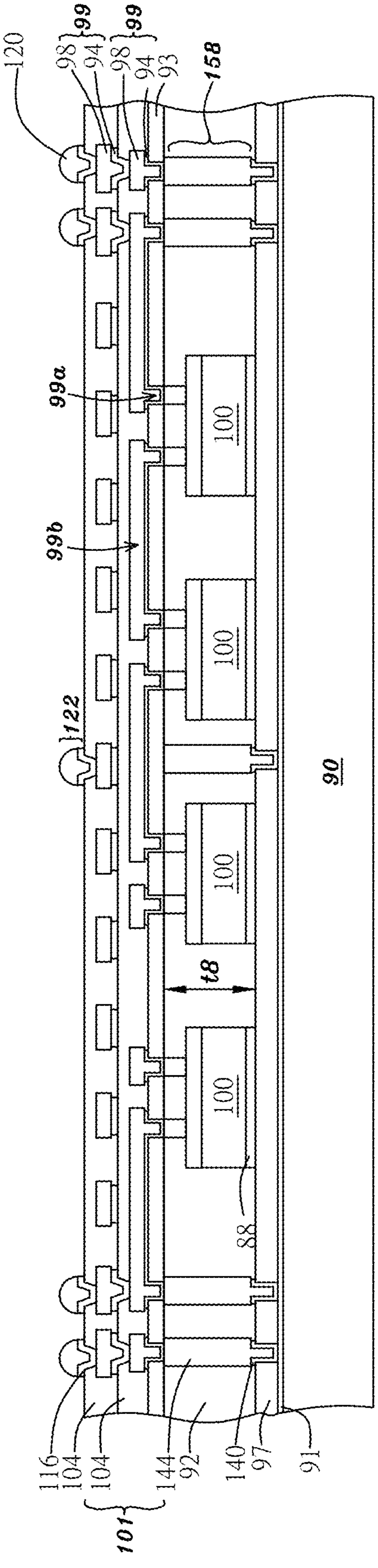
Figure 19K:
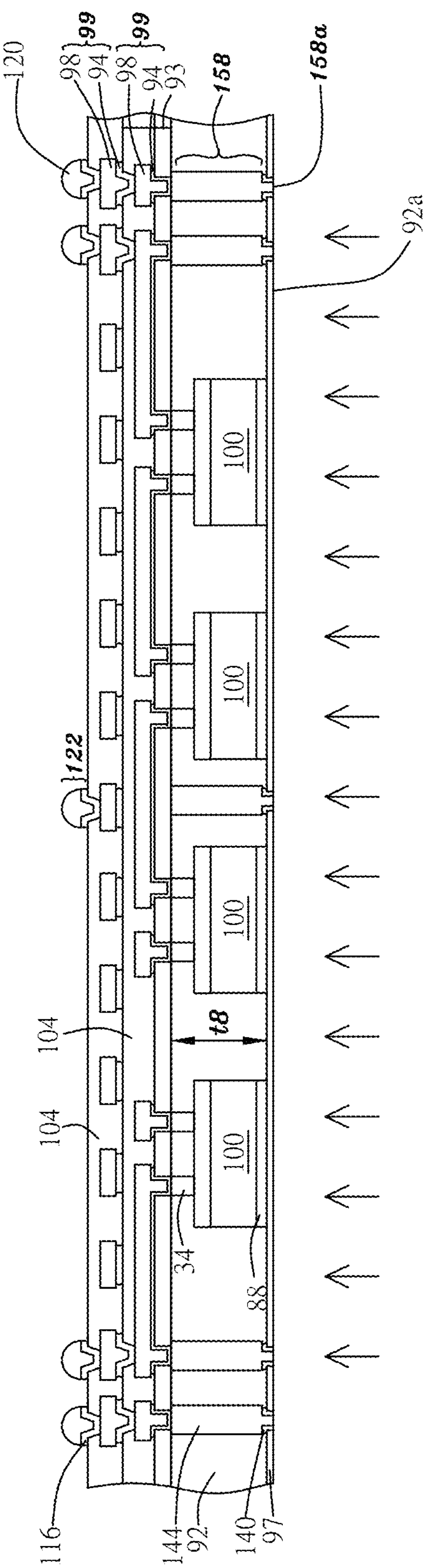
Figure 19L:
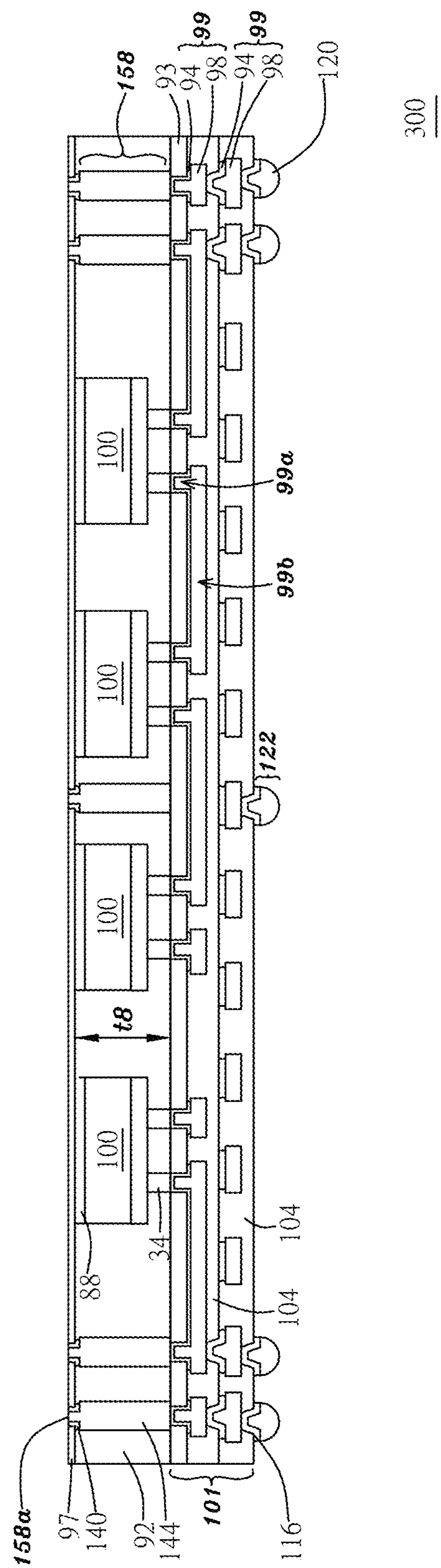
Figure 19M:
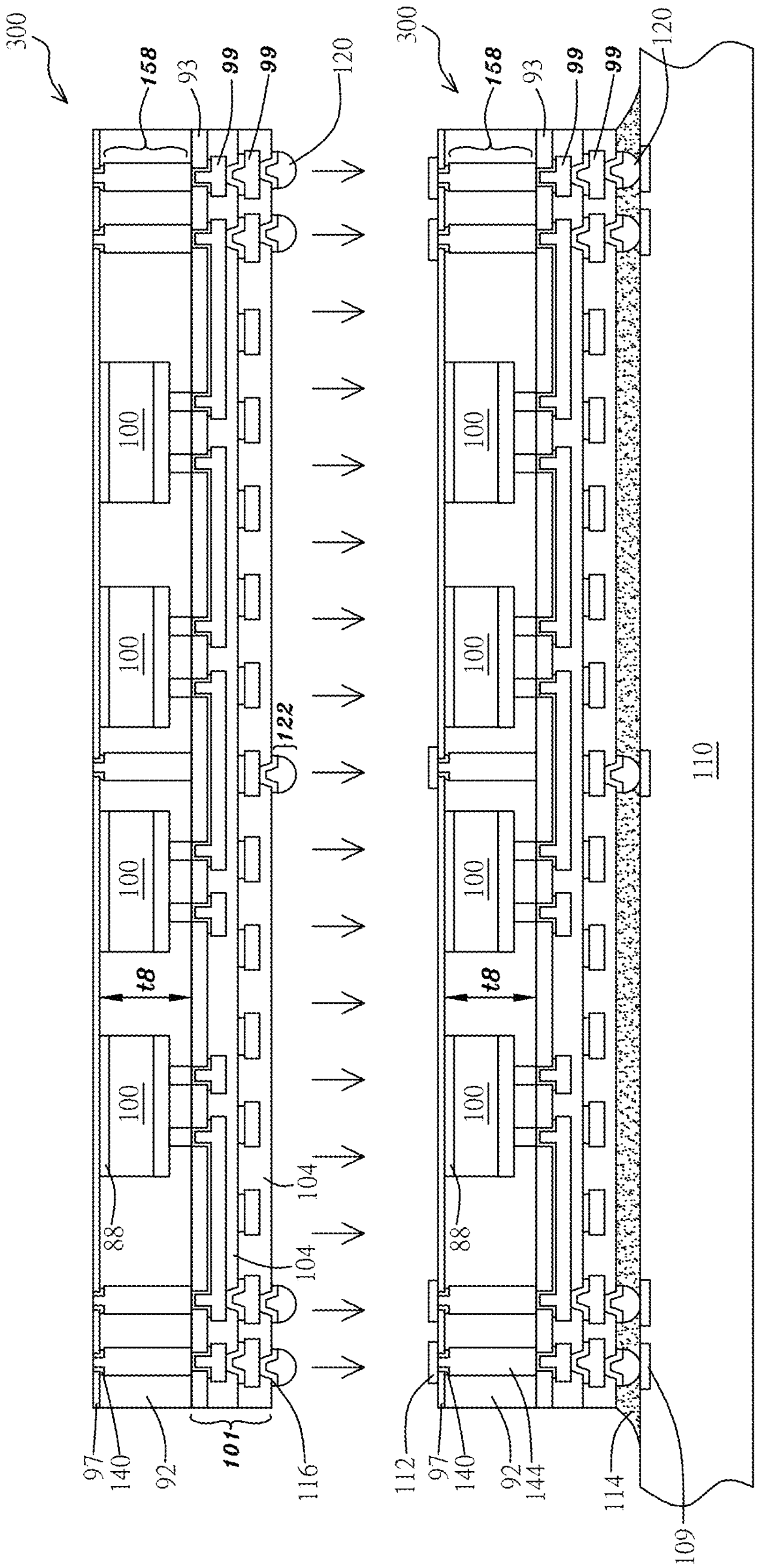
FIGS. 19M-19R are schematically cross-sectional views showing a process for a package-on-package (POP) assembly in accordance with an embodiment of the present application.
Figure 19N:
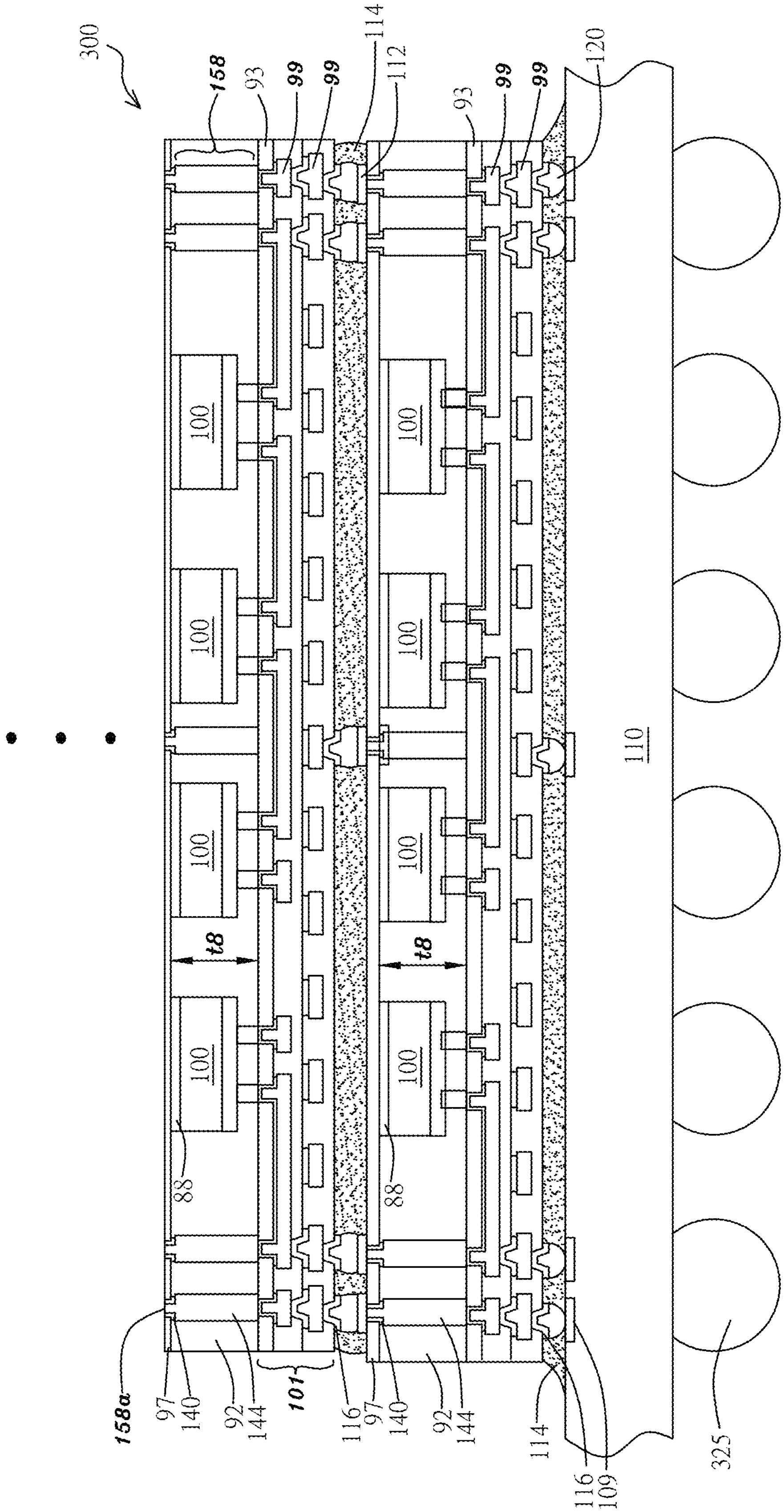
Figure 19O:
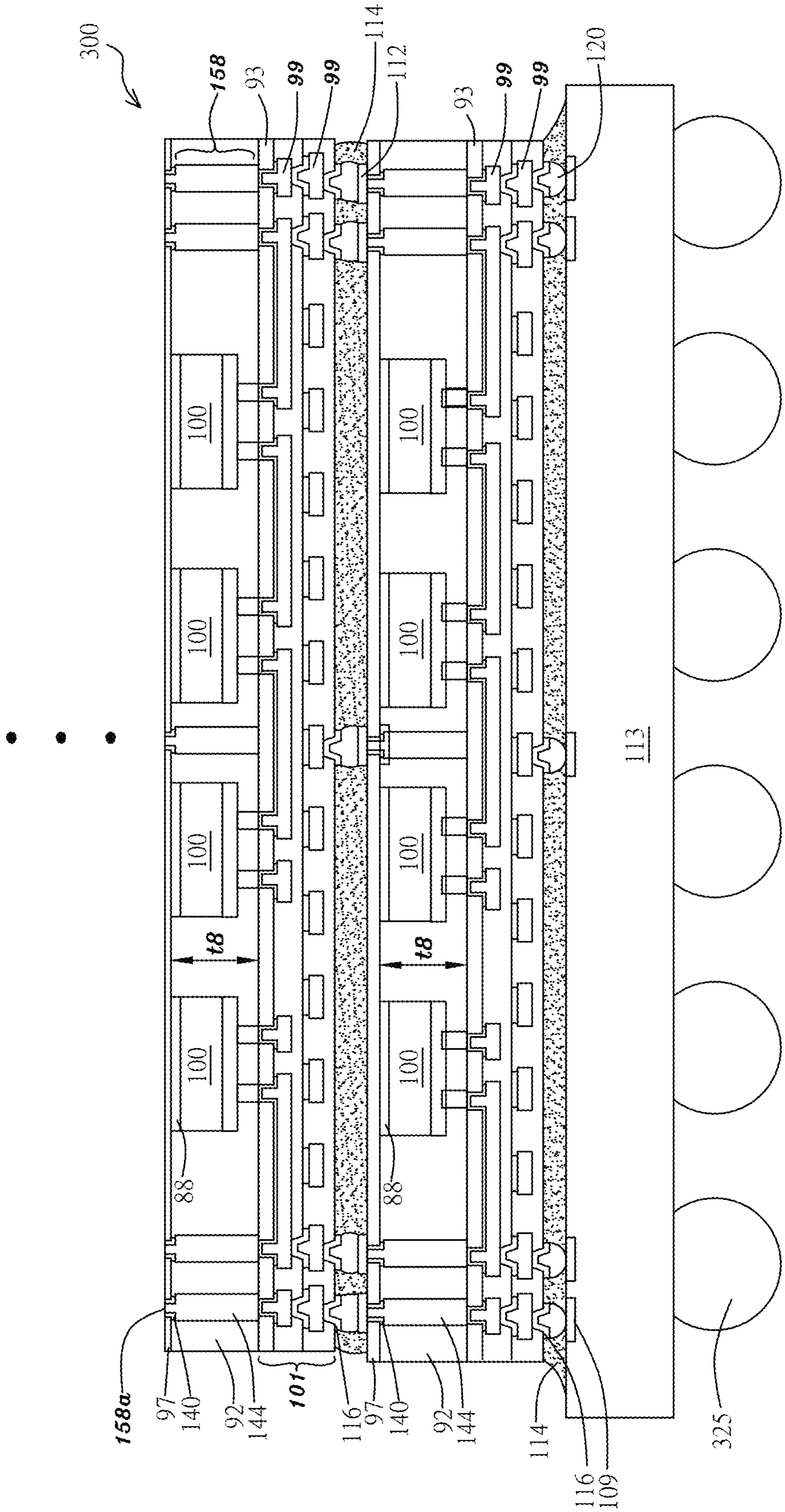

FIGS. 19A-19O are schematically views showing a process for forming a chip package with TPVs in accordance with a first embodiment of the present application. Before the semiconductor chips 100 are mounted onto the carrier substrate 90 illustrated in FIG. 18A, the TPVs 158 as seen in FIG. 19D may be formed over the carrier substrate 90 illustrated in FIG. 18A. Referring to FIG. 19A, a base insulating layer 91 including a silicon-oxide layer, silicon-nitride layer, polymer layer or combination thereof may be formed on the carrier substrate 90 illustrated in FIG. 18A.

Next, referring to FIG. 19B, a polymer layer 97, i.e., insulating dielectric layer, is formed on the base insulating layer 91 by a method of spin-on coating, screen-printing, dispensing or molding, and openings 97*a* in the polymer layer 97 are formed over the base insulating layer 91 to be exposed by the openings 97*a*. The polymer layer 97 may contain, for example, polyimide, BenzoCycloButene (BCB), parylene, epoxy-based material or compound, photo epoxy SU-8, elastomer or silicone. The polymer layer 97 may comprise organic material, for example, a polymer, or material compounds comprising carbon. The polymer layer 97 may be photosensitive, and may be used as photoresist as well for patterning multiple openings 97*a* therein to have an end portion of multiple through-package vias (TPV) formed therein by following processes to be performed later. The polymer layer 97 may be coated, exposed to light through a photomask, and then developed to form the openings 97*a* therein. The openings 97*a* in the polymer layer 97 expose multiple top areas of the base insulating layer 91. Next, the polymer layer 97, i.e., insulating dielectric layer, is cured at a temperature, for example, higher than or equal to 100° C., 125° C., 150° C., 175° C., 200° C., 225° C., 250° C., 275° C. or 300° C. The polymer layer 97 after cured may have a thickness between, for example, 2 μm and 50 μm, 3 μm and 50 μm, 3 μm and 30 μm, 3 μm and 20 μm, or 3 μm and 15 μm; or thicker than or equal to 2 μm, 3 μm, 5 μm, 10 μm, 20 μm, or 30 μm. The polymer layer 97 may be added with some dielectric particles or glass fibers. The material of the polymer layer 97 and the process for forming the same may be referred to that of the polymer layer 36 and the process for forming the same as illustrated in FIG. 15H.

Next, multiple metal pillars or bumps may be formed on the base insulating layer 91, as seen in FIGS. 19C-19F.

FIGS. 19C-19F are schematically cross-sectional views showing a process for forming multiple through-package vias (TPV) over a carrier substrate in accordance with an embodiment of the present application. Referring to FIG. 19C, an adhesion/seed layer 140 is formed on the polymer layer 97 and on the base insulating layer 91 at bottoms of the openings 97*a* in the insulting polymer 97. First, an adhesion layer having a thickness of between 0.001 and 0.7 μm, between 0.01 and 0.5 μm or between 0.03 and 0.35 μm may be sputtered on the insulting dielectric layer 91 and on the base insulating layer 91 at bottoms of the openings 97*a* in the insulting polymer 97. The material of the adhesion layer may include titanium, a titanium-tungsten alloy, titanium nitride, chromium, titanium-tungsten-alloy layer, tantalum nitride, or a composite of the abovementioned materials. The adhesion layer may be formed by an atomic-layer-deposition (ALD) process, chemical vapor deposition (CVD) process or evaporation process. For example, the adhesion layer may be formed by sputtering or CVD depositing a titanium (Ti) or titanium nitride (TiN) layer (with a thickness, for example, between 1 nm and 200 nm or between 5 nm and 50 nm) on the insulting dielectric layer 91.

Next, an electroplating seed layer having a thickness of between 0.001 and 1 μm, between 0.03 and 2 μm or between 0.05 and 0.5 μm may be sputtered on a whole top surface of the adhesion layer. Alternatively, the electroplating seed layer may be formed by an atomic-layer-deposition (ALD) process, chemical-vapor-deposition (CVD) process, vapor deposition method, electroless plating method or PVD (Physical Vapor Deposition) method. The electroplating seed layer is beneficial to electroplating a metal layer thereon. Thus, the material of the electroplating seed layer varies with the material of a metal layer to be electroplated on the electroplating seed layer. When a copper layer is to be electroplated on the electroplating seed layer, copper is a preferable material to the electroplating seed layer. For example, the electroplating seed layer may be deposited on or over the adhesion layer by, for example, sputtering or CVD depositing a copper seed layer (with a thickness between, for example, 3 nm and 300 nm or 10 nm and 120 nm) on the adhesion layer. The adhesion layer and electroplating seed layer compose the adhesion/seed layer 140 as seen in FIG. 19A.

Next, referring to FIG. 19D, a photoresist layer 142, such as positive-type photoresist layer, having a thickness of between 5 and 500 μm is spin-on coated or laminated on the electroplating seed layer of the adhesion/seed layer 140. The photoresist layer 142 is patterned with the processes of exposure, development, etc., to form multiple openings 142*a* in the photoresist layer 142 exposing the electroplating seed layer of the adhesion/seed layer 140. A 1× stepper, 1× contact aligner or laser scanner may be used to expose the photoresist layer 142 with at least two of G-line having a wavelength ranging from 434 to 438 nm, H-line having a wavelength ranging from 403 to 407 nm, and I-line having a wavelength ranging from 363 to 367 nm, illuminating the photoresist layer 142, that is, G-line and H-line, G-line and I-line, H-line and I-line, or G-line, H-line and I-line illuminate the photoresist layer 142, then developing the exposed photoresist layer 142, and then removing the residual polymeric material or other contaminants on the electroplating seed layer of the adhesion/seed layer 140 with an $O_2$ plasma or a plasma containing fluorine of below 200 PPM and oxygen, such that the photoresist layer 142 may be patterned with multiple openings 142*a* in the photoresist layer 142 exposing the electroplating seed layer of the adhesion/seed layer 140. Each of the opening 142*a* in the photoresist layer 142 may overlap one of the openings 97*a* in the polymer layer 97 and extend out of said one of the openings 97*a* in the polymer layer 97 to an area or a ring of the polymer layer 97 around said one of the openings 97*a* in the polymer layer 97, wherein the ring of polymer layer 97 may have a width between 1 μm and 15 μm, 1 μm and 10 μm, or 1 μm and 5 μm.

Referring to FIG. 19D, the openings 142*a* are positioned at the places where multiple gaps between the semiconductor chips 100 to be mounted to the polymer layer 97 in the following processes are arranged and where peripheral areas of individual chip packages 300 to be formed in the following processes are arranged, wherein each of the peripheral areas surrounds the semiconductor chips 100 to be mounted in a central area of one of the individual chip packages 300 to be formed.

Referring to FIG. 19E, a copper layer 144 having a thickness between 5 μm and 300 μm, 5 μm and 200 jam, 5 μm and 150 μm, 5 μm and 120 μm, 10 μm and 100 μm, 10 μm and 60 μm, 10 μm and 40 μm, or 10 μm and 30 μm is electroplated on the electroplating seed layer of the adhesion/seed layer 140 exposed by the openings 142*a*.

Referring to FIG. 19F, after the copper layer 144 is formed, most of the photoresist layer 142 may be removed and then the adhesion/seed layer 140 not under the metal layer 144 may be etched. The removing and etching processes may be referred respectively to the processes for removing the photoresist layer 30 and etching the electroplating seed layer 28 and adhesion layer 26 as illustrated in FIG. 15F. Thereby, the adhesion/seed layer 140 and electroplated metal layer 144 may be patterned to form multiple TPVs 158 on the base insulating layer 91 and on the polymer layer 97 around the openings 97*a* in the polymer layer 97. Each of the TPVs 158 may have a height, protruding from a top surface of the polymer layer 97, between 5 μm and 300 μm, 5 μm and 200 μm, 5 μm and 150 μm, 5 μm and 120 μm, 10 μm and 100 μm, 10 μm and 60 μm, 10 μm and 40 μm or 10 μm and 30 μm, or greater or taller than or equal to 50 μm, 30 μm, 20 μm, 15 μm, or 5 μm and a largest dimension in its cross-section (for example, its diameter of a circle shape or its diagonal length of a square or rectangle shape) between, for example, 5 μm and 300 jam, 5 μm and 200 μm, 5 μm and 150 μm, 5 μm and 120 μm, 10 μm and 100 μm, 10 μm and 60 μm, 10 μm and 40 μm or 10 μm and 30 μm, or greater than or equal to 150 μm, 100 μm, 60 μm, 50 μm, 40 μm, 30 μm, 20 μm, 15 μm or 10 μm. The smallest space between neighboring two of the TPVs 158 may be between, for example, 5 μm and 300 μm, 5 μm and 200 μm, 5 μm and 150 μm, 5 μm and 120 μm, 10 μm and 100 μm, 10 μm and 60 μm, 10 μm and 40 μm or 10 μm and 30 μm, or greater than or equal to 150 μm, 100 μm, 60 μm, 50 μm, 40 μm, 30 μm, 20 μm, 15 μm or 10 μm.

Next, the following steps for FOIT as seen in FIGS. 19G-19J may be referred to the steps for FOIT as illustrated in FIGS. 18A-18R. For an element indicated by the same reference number shown in FIGS. 18A-18R and 19G-19J, the specification of the element as seen in FIGS. 19G-19J and the process for forming the same may be referred to that of the element as illustrated in FIGS. 18A-18R and the process for forming the same.

Referring to FIG. 19G, the glue material 88 is formed on multiple regions of the polymer layer 97. Next, the semiconductor chips 100 as illustrated in FIGS. 15G, 15H, 16I-16L and 17 have backsides attached onto the glue material 88 to join the polymer layer 97.

Referring to FIG. 19H, the polymer layer 92 having a thickness t7 of between 250 and 1,000 μm is applied (by coating, printing, dispensing or molding) on or over the polymer layer 97 and on or over the semiconductor chips 100 to a level to: (i) fill gaps between the semiconductor chips 100, (ii) cover the top surfaces of the semiconductor chips 100, (iii) fill gaps between the micro-pillars or micro-bumps 34 of the semiconductor chips 100, (iv) cover top surfaces of the micro-pillars or micro-bumps 34 of the semiconductor chips 100, (v) fill gaps between the TPVs 158 and (vi) cover the TPVs 158.

Referring to FIG. 19I, the polymer layer 92 is polished from a front side thereof to uncover a front side of each of the micro-pillars or micro-bumps 34 and a front side of each of the TPVs 158, and to planarize the front side of the polymer layer 92, for example by a mechanical polishing process. Alternatively, the polymer layer 92 may be polished by a chemical mechanical polishing (CMP) process. When the polymer layer 92 is being polished, the micro-pillars or micro-bumps 34 each may have a front portion allowed to be removed and the polymer layer 92, after polished, may have a thickness t8 between 250 and 800 microns.

Next, the TISD 101 as illustrated in FIGS. 18D-18N may be formed on or over the front side of the polymer layer 92 and on or over the front sides of the micro-pillars or micro-bumps 34 and TPVs 158 by a wafer or panel processing. Next, the metal pillars or bumps 122 as illustrated in FIGS. 18O-18R may be formed on the topmost one of the interconnection metal layers 99 of the TISD 101 at bottoms of the openings 104*a* of the topmost one of the polymer layer 104 as seen in FIG. 19J.

Next, referring to FIG. 19K, the carrier substrate 90 may be removed, by a peeling, polishing, grinding or chemical mechanical polishing (CMP) process, from the structure as seen in FIG. 19K to uncover the base insulating layer 91. Next, the base insulating layer 91 and a bottom portion of the polymer layer 97 may be removed, by a polishing, grinding or chemical mechanical polishing (CMP) process, from the structure as seen in FIG. 19K to uncover a backside 158*a* of each of the TPVs 158 such that the TPVs 158 has copper exposed at the backside 158*a* thereof for acting as multiple metal pads. Alternatively, after polishing the polymer layer 92 as seen in FIG. 19I and before forming the polymer layer 93 of the TISD 101, the carrier substrate 90 may be removed, by a peeling, polishing, grinding or chemical mechanical polishing (CMP) process, from the structure as seen in FIG. 19K to uncover the base insulating layer 91. Next, the base insulating layer 91 and the bottom portion of the polymer layer 97 may be removed, by a polishing, grinding or chemical mechanical polishing (CMP) process to uncover the backside 158*a* of each of the TPVs 158 such that the TPVs 158 has copper exposed at the backside 158*a* thereof for acting as multiple metal pads. Thereafter, the TISD 101 as illustrated in FIGS. 18D-18N may be formed on or over the front side of the polymer layer 92 and on or over the front sides of the micro-pillars or micro-bumps 34 and TPVs 158 by a wafer or panel processing. Next, the metal pillars or bumps 122 as illustrated in FIGS. 18O-18R may be formed on the topmost one of the interconnection metal layers 99 of the TISD 101 at bottoms of the openings 104*a* of the topmost one of the polymer layer 104 as seen in FIG. 19K.

After the carrier substrate 90, the base insulating layer 91 and the bottom portion of the polymer layer 97 are removed as shown in FIG. 19K, the package structure shown in FIG. 19K may be separated, cut or diced into multiple individual chip packages, i.e., single-layer-packaged logic drives 300, as shown in FIG. 19L by a laser cutting process or by a mechanical cutting process.

Second Embodiment for Chip Package with TPVs

FIGS. 19S-19Z are schematically views showing a process for forming a chip package with TPVs in accordance with a second embodiment of the present application. The difference between the second embodiment as illustrated in FIGS. 19S-19Z and the first embodiment as illustrated in FIGS. 19A-19L is that the polymer layer 97 may be completely removed. For an element indicated by the same reference number shown in FIGS. 19S-19Z and 19A-19L, the specification of the element as seen in FIGS. 19S-19Z and the process for forming the same may be referred to that of the element as illustrated in FIGS. 19A-19L and the process for forming the same.

Figure 19P:
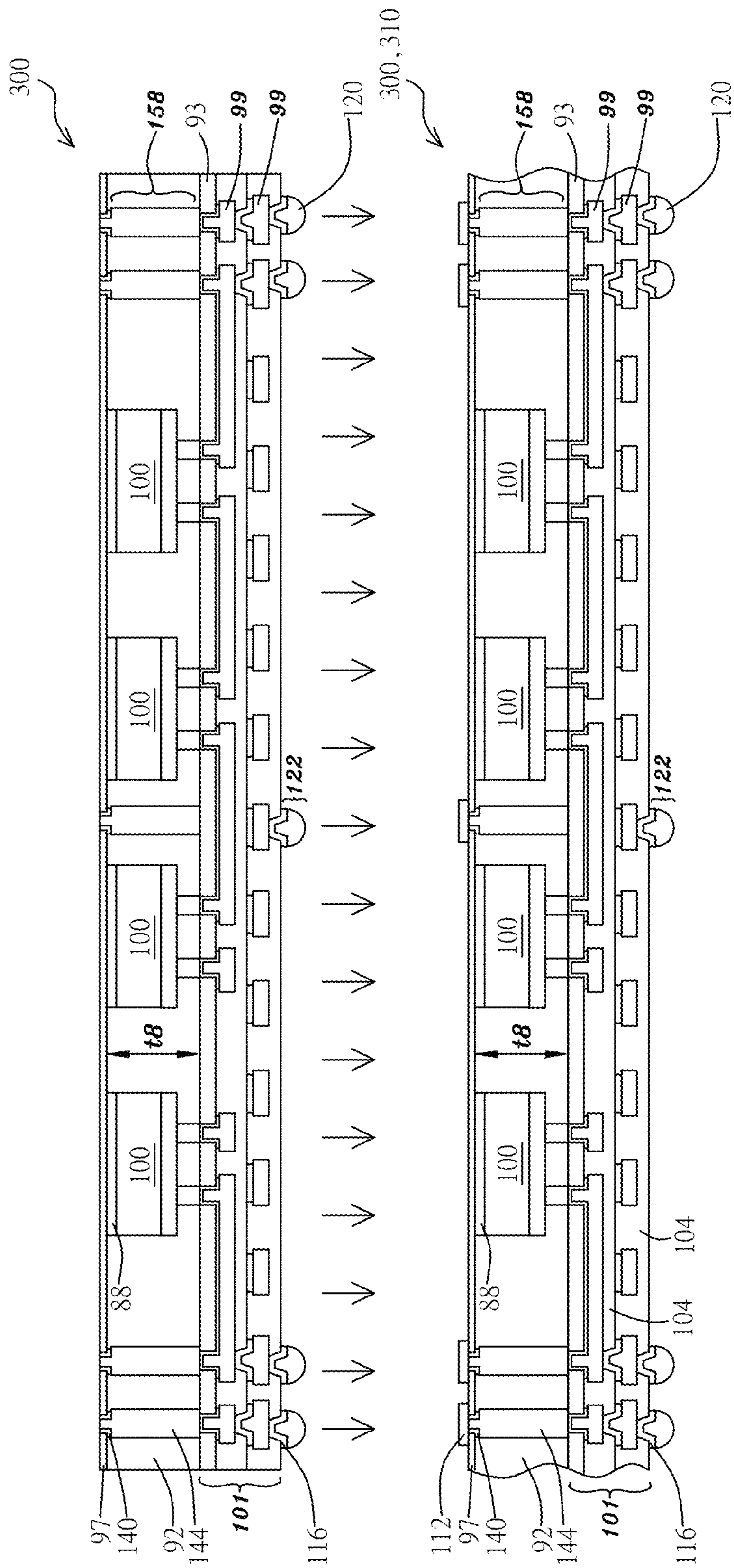
Figure 19Q:
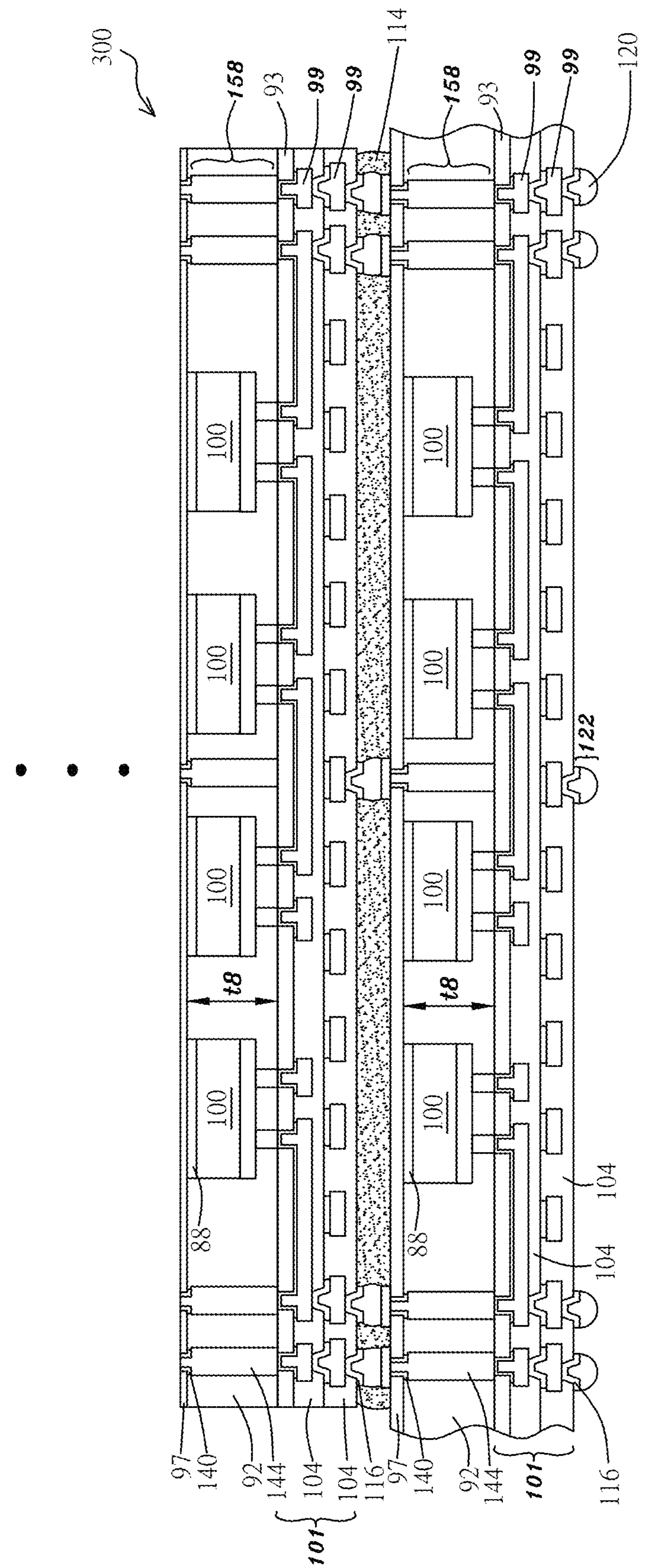
Figure 19R:
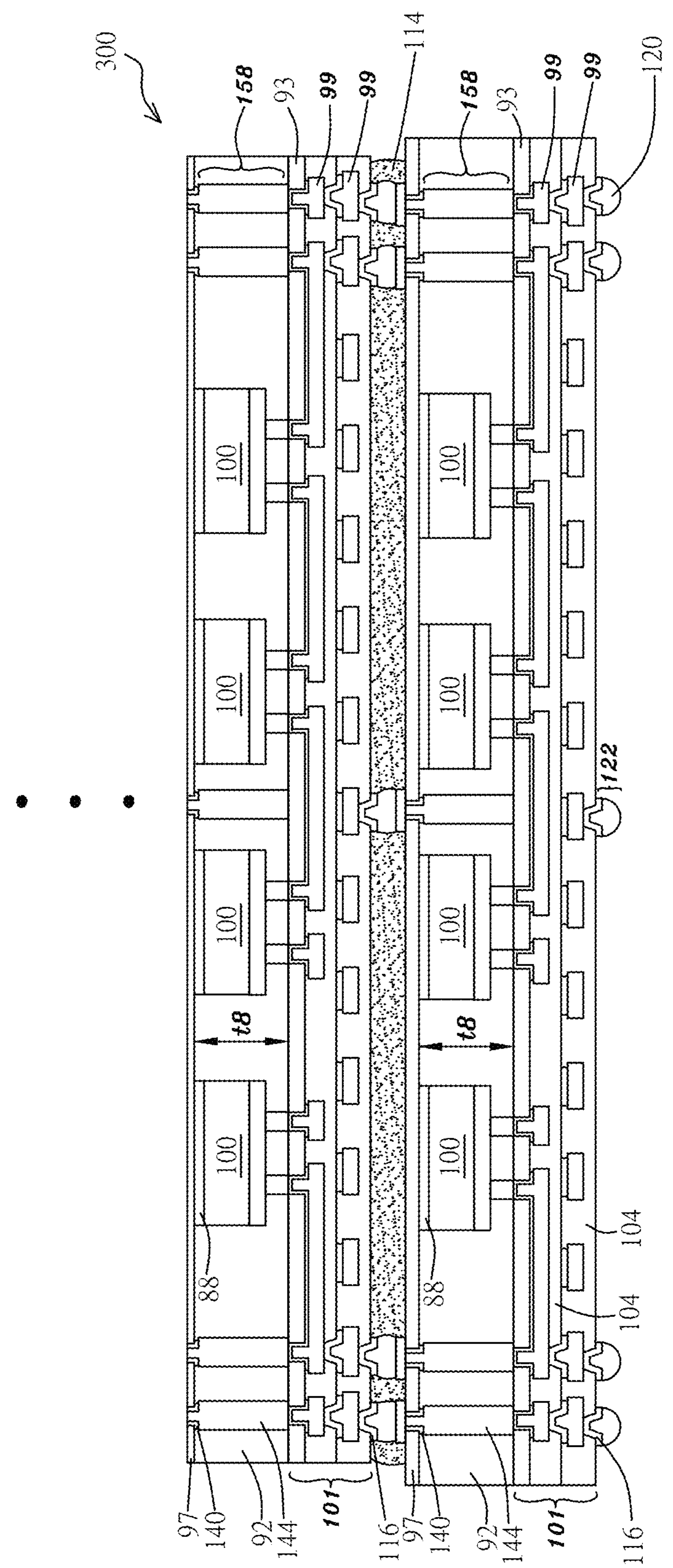
Figure 19S:
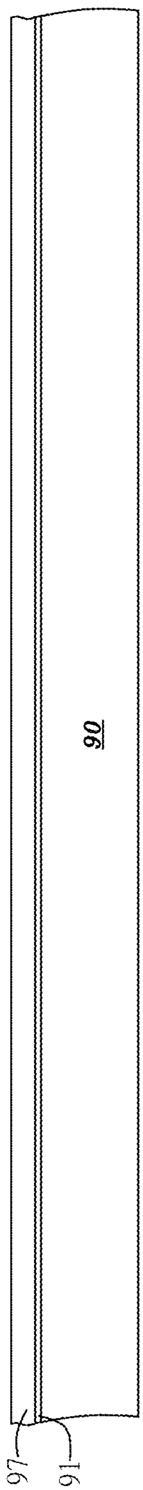
FIGS. 19S-19Z are schematically cross-sectional views showing a process for forming a single-layer-packaged logic drive based on TPVs and FOIT in accordance with an embodiment of the present application.

For the second embodiment, referring to FIG. 19S, the polymer layer 97 is formed on the base insulating layer 91 by a method of spin-on coating, screen-printing, dispensing or molding, but none of the openings 97*a* as seen in FIG. 19B are formed in the polymer layer 97. In this case, besides the materials as illustrated in FIG. 19B, the polymer layer 97 may be a non-photosensitive material.

Next, multiple metal pillars or bumps may be formed on the polymer layer 97, as seen in FIGS. 19T-19W. FIGS. 19T-19W are schematically cross-sectional views showing a process for forming multiple through-package vias (TPV) over a carrier substrate in accordance with an embodiment of the present application.

Figure 19T:
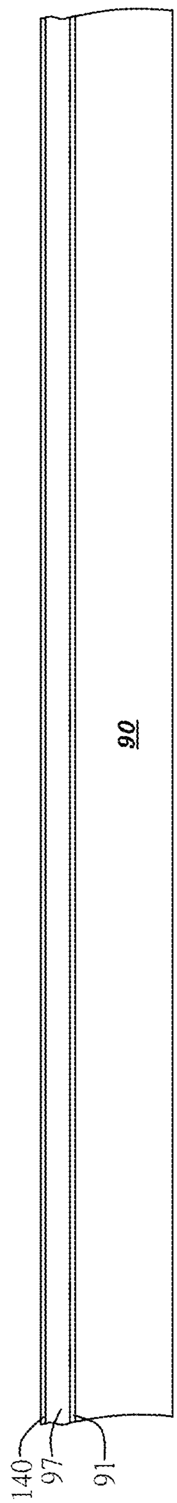

Referring to FIG. 19T, the adhesion/seed layer 140 is formed on the polymer layer 97.

Figure 19U:
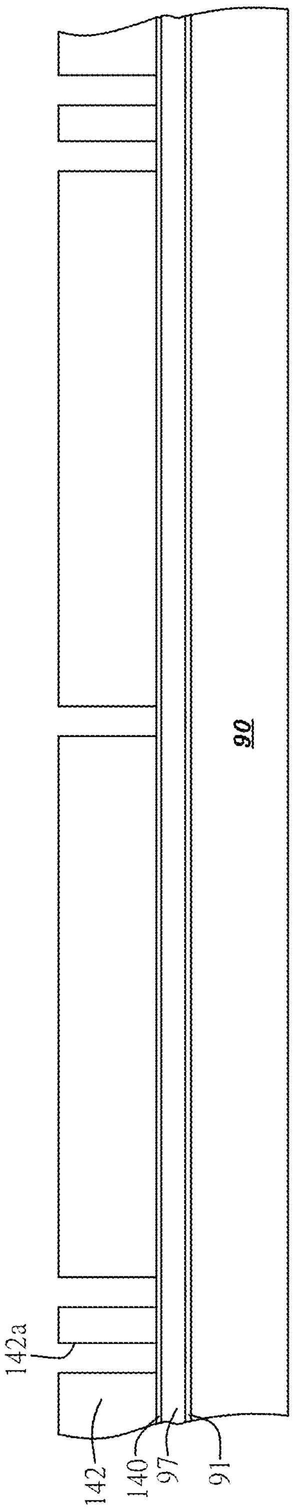

Next, referring to FIG. 19U, the photoresist layer 142, such as positive-type photoresist layer, having a thickness of between 5 and 500 μm is spin-on coated or laminated on the electroplating seed layer of the adhesion/seed layer 140. The photoresist layer 142 is patterned with the processes of exposure, development, etc., to form multiple openings 142*a* in the photoresist layer 142 exposing the electroplating seed layer of the adhesion/seed layer 140. The openings 142*a* are positioned at the places where multiple gaps between the semiconductor chips 100 to be mounted to the polymer layer 97 in the following processes are arranged and where peripheral areas of individual chip packages 300 to be formed in the following processes are arranged, wherein each of the peripheral areas surrounds the semiconductor chips 100 to be mounted in a central area of one of the individual chip packages 300 to be formed.

Figure 19V:
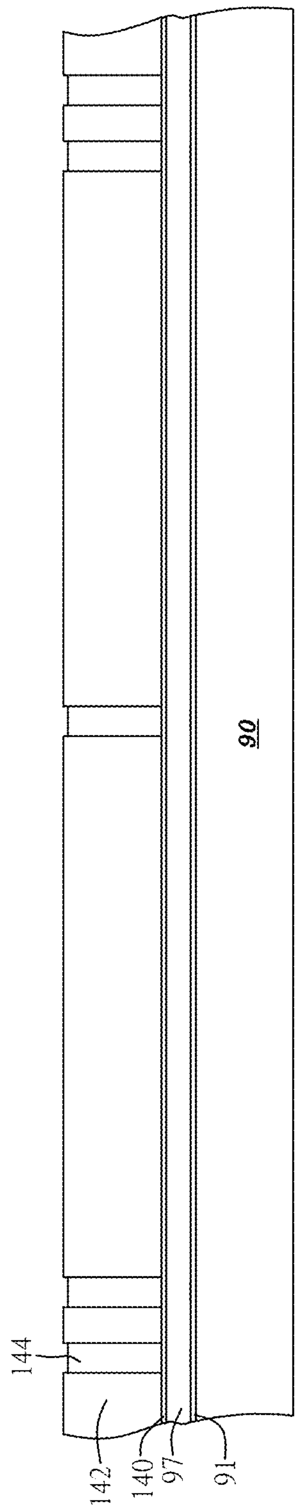

Next, referring to FIG. 19V, a copper layer 144 having a thickness between 5 μm and 300 μm, 5 μm and 200 nm, 5 nm and 150 nm, 5 nm and 120 nm, 10 nm and 100 nm, 10 nm and 60 nm, 10 nm and 40 nm, or 10 nm and 30 μm is electroplated on the electroplating seed layer of the adhesion/seed layer 140 exposed by the openings 142*a*.

Figure 19W:
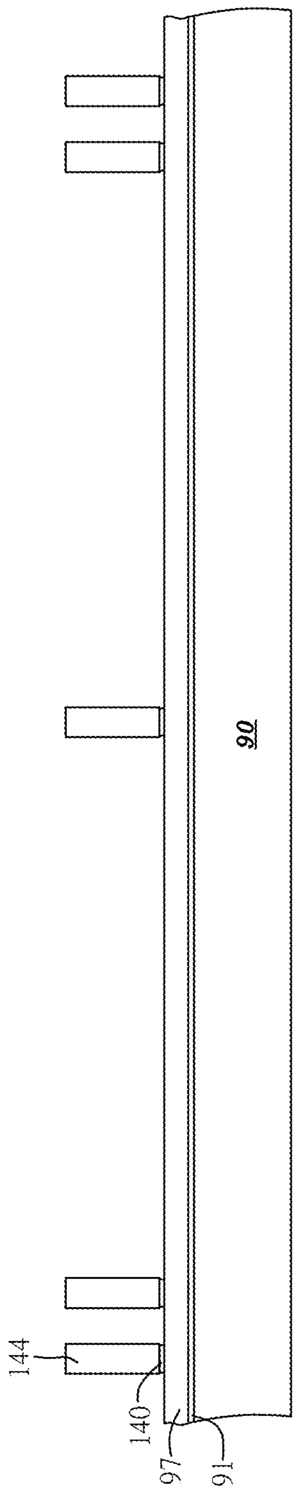

Next, referring to FIG. 19W, after the copper layer 144 is formed, most of the photoresist layer 142 may be removed and then the adhesion/seed layer 140 not under the metal layer 144 may be etched. The removing and etching processes may be referred respectively to the processes for removing the photoresist layer 30 and etching the electroplating seed layer 28 and adhesion layer 26 as illustrated in FIG. 15F. Thereby, the adhesion/seed layer 140 and electroplated metal layer 144 may be patterned to form the TPVs 158 on the polymer layer 97. Each of the TPVs 158 may have a height, protruding from a top surface of the polymer layer 97, between 5 nm and 300 nm, 5 nm and 200 nm, 5 nm and 150 nm, 5 nm and 120 nm, 10 nm and 100 nm, 10 nm and 60 nm, 10 nm and 40 μm or 10 nm and 30 μm, or greater or taller than or equal to 50 nm, 30 nm, 20 nm, 15 nm, or 5 nm and a largest dimension in its cross-section (for example, its diameter of a circle shape or its diagonal length of a square or rectangle shape) between, for example, 5 nm and 300 nm, 5 nm and 200 nm, 5 nm and 150 nm, 5 nm and 120 nm, 10 nm and 100 nm, 10 nm and 60 μm, 10 μm and 40 μm or 10 μm and 30 nm, or greater than or equal to 150 nm, 100 nm, 60 nm, 50 nm, 40 nm, 30 nm, 20 nm, 15 nm or 10 nm. The smallest space between neighboring two of the TPVs 158 may be between, for example, 5 nm and 300 nm, 5 nm and 200 nm, 5 nm and 150 nm, 5 nm and 120 nm, 10 nm and 100 nm, 10 nm and 60 nm, 10 nm and 40 nm or 10 nm and 30 nm, or greater than or equal to 150 nm, 100 nm, 60 nm, 50 nm, 40 nm, 30 nm, 20 nm, 15 nm or 10 nm.

Figure 19X:
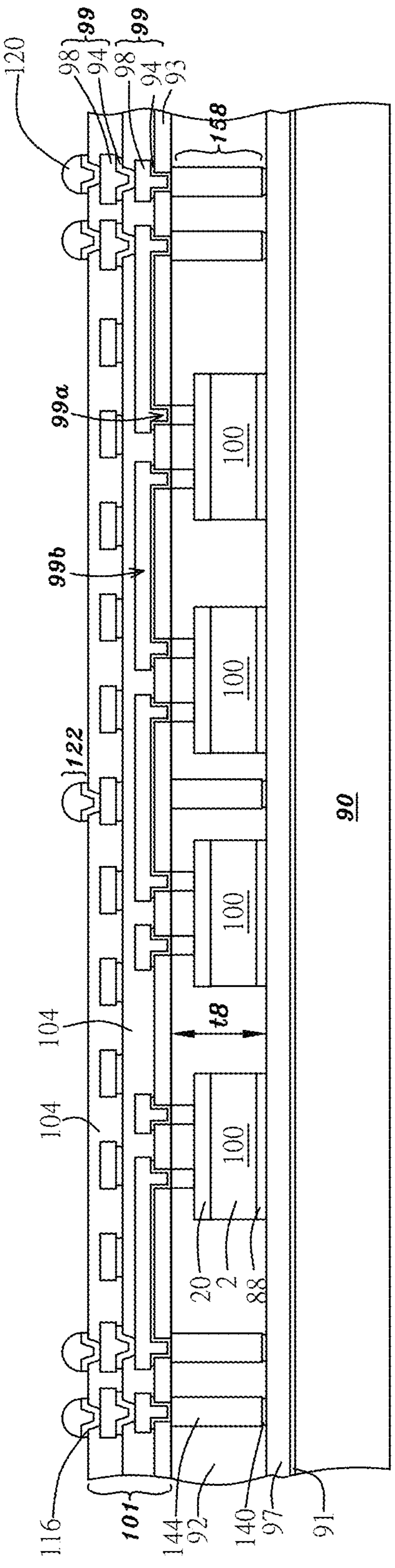

Next, the following steps for FOIT as seen in FIG. 19X may be referred to the steps for FOIT as illustrated in FIGS. 19G-19J and 18A-18R.

Figure 19Y:
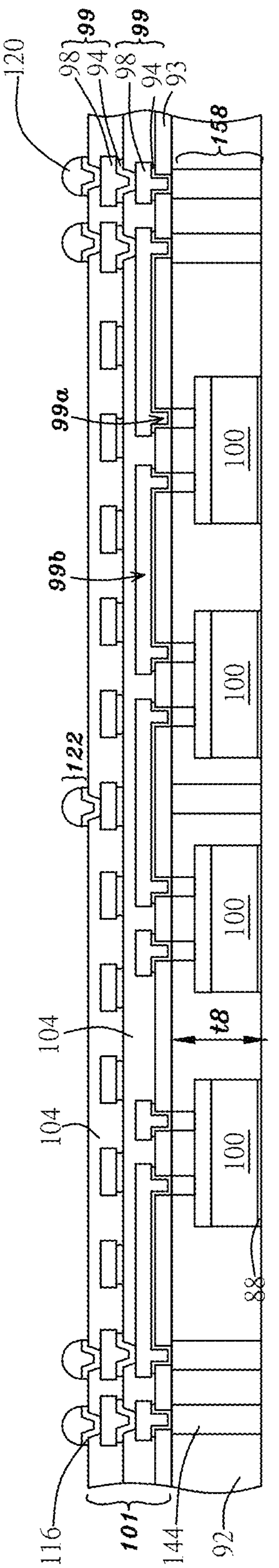

Next, referring to FIG. 19Y, the carrier substrate 90 may be removed, by a peeling, polishing, grinding or chemical mechanical polishing (CMP) process, from the structure as seen in FIG. 19X to uncover the base insulating layer 91. Next, the base insulating layer 91 and polymer layer 97 may be completely removed, by a polishing, grinding or chemical mechanical polishing (CMP) process, from the structure as seen in FIG. 19K to uncover a backside 158*a* of each of the TPVs 158 such that the TPVs 158 has copper exposed at the backside 158*a* thereof for acting as multiple metal pads. Alternatively, after polishing the polymer layer 92 as seen in FIG. 19I and before forming the polymer layer 93 of the TISD 101, the carrier substrate 90 may be removed, by a peeling, polishing, grinding or chemical mechanical polishing (CMP) process, from the structure as seen in FIG. 19X to uncover the base insulating layer 91. Next, the base insulating layer 91 and polymer layer 97 may be removed, by a polishing, grinding or chemical mechanical polishing (CMP) process to uncover the backside 158*a* of each of the TPVs 158 such that the TPVs 158 has copper exposed at the backside 158*a* thereof for acting as multiple metal pads. Thereafter, the TISD 101 as illustrated in FIGS. 18D-18N may be formed on or over the front side of the polymer layer 92 and on or over the front sides of the micro-pillars or micro-bumps 34 and TPVs 158 by a wafer or panel processing. Next, the metal pillars or bumps 122 as illustrated in FIGS. 18O-18R may be formed on the topmost one of the interconnection metal layers 99 of the TISD 101 at bottoms of the openings 104*a* of the topmost one of the polymer layer 104 as seen in FIG. 19Y.

Figure 19Z:
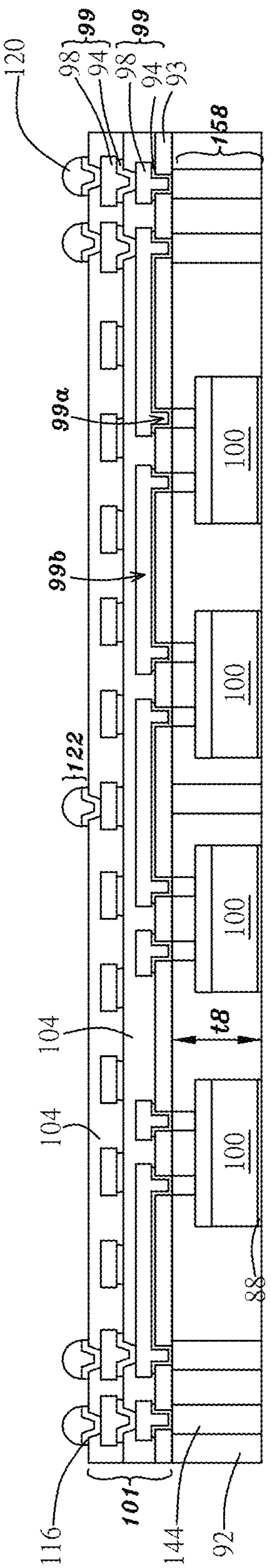

After the carrier substrate 90, the base insulating layer 91 and the bottom portion of the polymer layer 97 are removed as shown in FIG. 19Y, the package structure shown in FIG. 19Y may be separated, cut or diced into multiple individual chip packages, i.e., single-layer-packaged logic drives 300, as shown in FIG. 19Z by a laser cutting process or by a mechanical cutting process.

Package-On-Package (POP) Assembly for Drives with TISD

FIGS. 19M-19O are schematically views showing a process for fabricating a package-on-package assembly in accordance with an embodiment of the present application. Referring to FIGS. 19M-19O, when a top one of the single-layer-packaged logic drives 300 as seen in FIG. 19L is mounted onto a bottom one of the single-layer-packaged logic drives 300, the bottom one of the single-layer-packaged logic drives 300 may have its TPVs 158 in its polymer layer 92 to couple to circuits, interconnection metal schemes, metal pads, metal pillars or bumps, and/or components of the top one of the single-layer-packaged logic drives 300 at the backside of the bottom one of the single-layer-packaged logic drives 300. The process for fabricating a package-on-package assembly is mentioned as below:

First, referring to FIG. 19M, a plurality of the bottom one of the single-layer-packaged logic drives 300 (only one is shown) may have its metal pillars or bumps 122 mounted onto multiple metal pads 109 of a circuit carrier or substrate 110 at a topside thereof, such as printed circuit board (PCB), ball-grid-array (BGA) substrate, flexible circuit film or tape, or ceramic circuit substrate. An underfill 114 may be filled into a gap between the circuit carrier or substrate 110 and the bottom one of the single-layer-packaged logic drives 300. Alternatively, the underfill 114 between the circuit carrier or substrate 110 and the bottom one of the single-layer-packaged logic drives 300 may be skipped. Next, a surface-mount technology (SMT) may be used to mount a plurality of the top one of the single-layer-packaged logic drives 300 (only one is shown) onto the plurality of the bottom one of the single-layer-packaged logic drives 300, respectively.

For the surface-mount technology (SMT), solder or solder cream or flux 112 may be first printed on the metal pads 158*a* of the TPVs 158 of the bottom one of the single-layer-packaged logic drives 300. Next, referring to FIG. 19N, the top one of the single-layer-packaged logic drives 300 may have its metal pillars or bumps 122 placed on the solder or solder cream or flux 112. Next, a reflowing or heating process may be performed to fix the metal pillars or bumps 122 of the top one of the single-layer-packaged logic drives 300 to the TPVs 158 of the bottom one of the single-layer-packaged logic drives 300. Next, an underfill 114 may be filled into a gap between the top and bottom ones of the single-layer-packaged logic drives 300. Alternatively, the underfill 114 between the top and bottom ones of the single-layer-packaged logic drives 300 may be skipped.

In the next optional step, referring to FIG. 19N, other multiple of the single-layer-packaged logic drives 300 as seen in FIG. 19L may have its metal pillars or bumps 122 mounted onto the TPVs 158 of the plurality of the top one of the single-layer-packaged logic drives 300 or the TPVs 158 of the plurality of the topmost one of the single-layer-packaged logic drives 300 using the surface-mount technology (SMT) and the underfill 114 is then optionally formed therebetween. The step may be repeated by multiple times to form three or more than three of the single-layer-packaged logic drives 300 stacked on the circuit carrier or substrate 110.

Next, referring to FIG. 19N, multiple solder balls 325 are planted on a backside of the circuit carrier or substrate 110. Next, referring to FIG. 19O, the circuit carrier or structure 110 may be separated, cut or diced into multiple individual substrate units 113, such as Printed Circuit Boards (PCBs), Ball-Grid-Army (BGA) substrates, flexible circuit films or tapes, or ceramic circuit substrates, by a laser cutting process or by a mechanical cutting process. Thereby, the number i of the single-layer-packaged logic drives 300 may be stacked on one of the substrate units 113, wherein the number i may be equal to or greater than 2, 3, 4, 5, 6, 7 or 8.

Alternatively, FIGS. 19P-19R are schematically views showing a process for fabricating a package-on-package assembly in accordance with an embodiment of the present application. Referring to FIGS. 19P and 19Q, a plurality of the top one of the single-layer-packaged logic drives 300 may have its metal pillars or bumps 122 fixed or mounted, using the SMT technology, to the TPVs 158 of the structure in a wafer or panel level as seen in FIG. 19K before being separated into a plurality of the bottom one of the single-layer-packaged logic drives 300.

Next, referring to FIG. 19Q, the underfill 114 may be filled into a gap between each of the top ones of the single-layer-packaged logic drives 300 and the structure in a wafer or panel level as seen in FIG. 19K. Alternatively, the underfill 114 may be skipped.

In the next optional step, referring to FIG. 19Q, other multiple of the single-layer-packaged logic drives 300 as seen in FIG. 19L may have its metal pillars or bumps 122 mounted onto the TPVs 158 of the top ones of the single-layer-packaged logic drives 300 using the surface-mount technology (SMT) and the underfill 114 is then optionally formed therebetween. The step may be repeated by multiple times to form two or more than two of the single-layer-packaged logic drives 300 stacked on the structure in a wafer or panel level as seen in FIG. 19K.

Next, referring to FIG. 19R, the structure in a wafer or panel level as seen in FIG. 19K may be separated, cut or diced into a plurality of the bottom one of the single-layer-packaged logic drives 300 by a laser cutting process or by a mechanical cutting process. Thereby, the number i of the single-layer-packaged logic drives 300 may be stacked together, wherein the number i may be equal to or greater than 2, 3, 4, 5, 6, 7 or 8. Next, the single-layer-packaged logic drives 300 stacked together may have a bottommost one provided with the metal pillars or bumps 122 to be mounted onto the multiple metal pads 109 of the circuit carrier or substrate 110 as seen in FIG. 19M, such as ball-grid-array substrate, at the topside thereof. Next, an underfill 114 may be filled into a gap between the circuit carrier or substrate 110 and the bottommost one of the single-layer-packaged logic drives 300. Alternatively, the underfill 114 may be skipped. Next, multiple solder balls 325 are planted on a backside of the circuit carrier or substrate 110. Next, the circuit carrier or structure 110 may be separated, cut or diced into multiple individual substrate units 113, such as printed circuit boards (PCB) or BGA (Ball-Grid-array) substrates, by a laser cutting process or by a mechanical cutting process, as seen in FIG. 19O. Thereby, the number i of the single-layer-packaged logic drives 300 may be stacked on one of the substrate units 13, wherein the number i may be equal to or greater than 2, 3, 4, 5, 6, 7 or 8.

The single-layer-packaged logic drives 300 with the TPVs 158 to be stacked in a vertical direction to form the POP assembly may be in a standard format or have standard sizes. For example, the single-layer-packaged logic drives 300 may be in a shape of square or rectangle, with a certain widths, lengths and thicknesses. An industry standard may be set for the shape and dimensions of the single-layer-packaged logic drives 300. For example, the standard shape of the single-layer-packaged logic drives 300 may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm or 5 mm. Alternatively, the standard shape of the single-layer-packaged logic drives 300 may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm or 5 mm.

Third Embodiment for Chip Package with TPVs

Figure 28A:
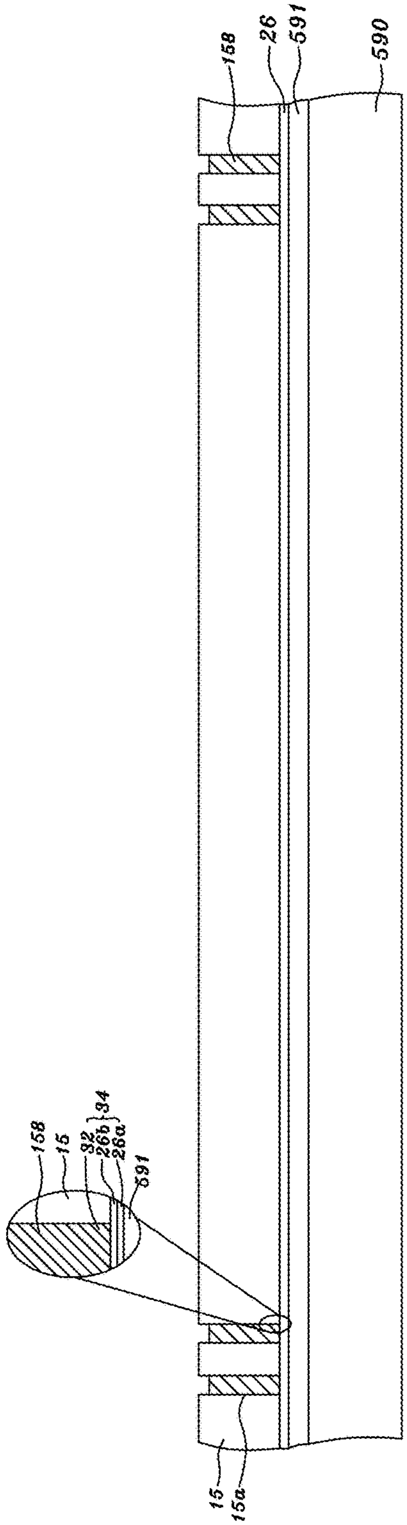
FIGS. 28A-28G are schematically views showing a process for forming a chip package with TPVs in accordance with a third embodiment of the present application.

FIGS. 28A-28G are schematically views showing a process for forming a chip package with TPVs in accordance with a third embodiment of the present application. Referring to FIG. 28A, a temporary substrate (T-Sub) 590, such as glass or silicon substrate, may be provided, and a sacrificial bonding layer 591 may be formed on the temporary substrate (T-sub) 590. The sacrificial bonding layer 591 may be provided to have the temporary substrate (T-sub) 590 to be easily debonded or released from the sacrificial bonding layer 591 by decomposing the sacrificial bonding layer 591. For example, the sacrificial bonding layer 591 may be a material of light-to-heat conversion (LTHC) that may be deposited on the temporary substrate (T-sub) 590 by printing or spin-on coating. The LTHC material may be a liquid ink containing carbon black and binder in a mixture of solvents. Next, an adhesion/barrier layer 26 may be formed on the sacrificial bonding layer 591 by sputtering or chemical vapor depositing an adhesion layer 26*a*, such as titanium (Ti) or titanium nitride (TiN) layer having a thickness between 1 nm and 50 nm, on the sacrificial bonding layer 591, and sputtering or chemical vapor depositing a seed layer 26*b*, such as copper, on its adhesion layer 26*a*. Next, a photoresist layer 15 may be formed on the seed layer 26*b* of the adhesion/barrier layer 26, wherein multiple openings 15*a* may be formed in the photoresist layer 15 and each of the openings 15*a* may expose the seed layer 26*b* of the adhesion/barrier layer 26. Next, a copper layer 158 may be electroplated in the openings 15*a* and on the seed layer 26*b* of the adhesion/barrier layer 26 to be patterned with multiple copper posts each having a circular shape.

Figure 28B:
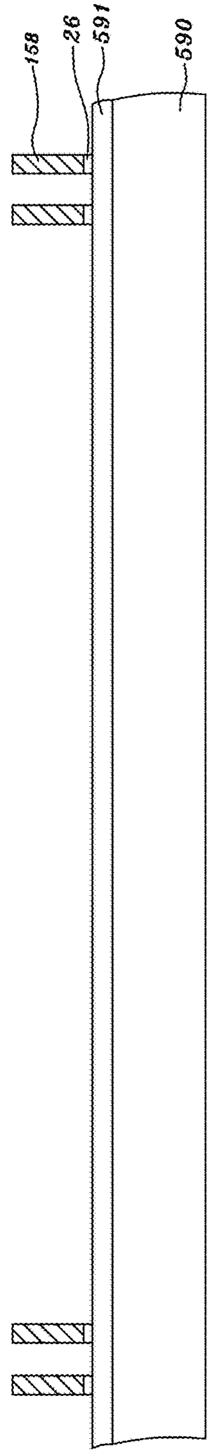

Next, the photoresist layer 15 is removed from the seed layer 26*b* of the adhesion/barrier layer 26, as seen in FIG. 28B.

Figure 28C:
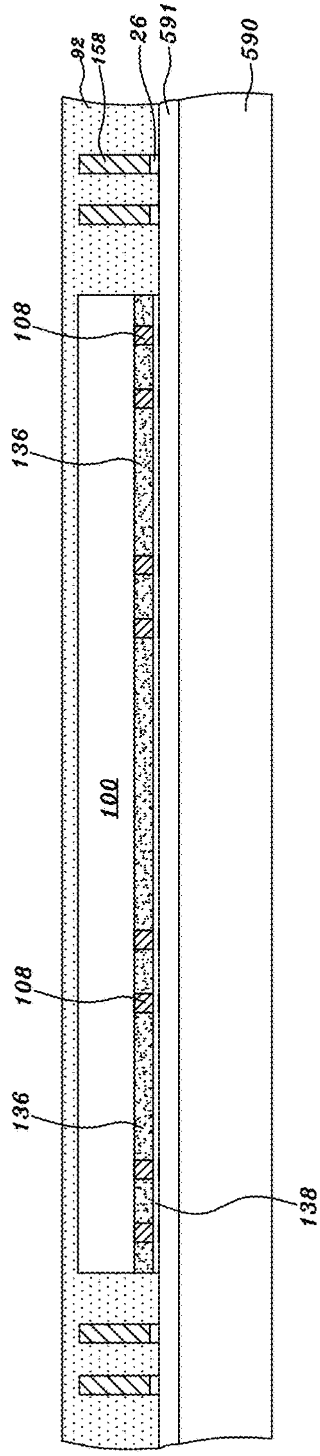

Next, referring to FIG. 28C, multiple semiconductor chips 100 (only one is shown) may be provided with a polymer layer 136 at an active side thereof, i.e., at a bottom thereof, and multiple metal pads, lines or traces 108 each in an opening in the polymer layer 136, wherein each of the metal pads, lines or traces 108 may have a bottom surface coplanar to a bottom surface of the polymer layer 136. Each of the metal pads, lines or traces 108 may include a copper or aluminum layer having a thickness between 1 and 10 micrometers, and the polymer layer 136 may be a layer of polyimide or benzocyclobutene (BCB) having a thickness between 1 and 10 micrometers. For each of the semiconductor chips 100, a layer 138 of adhesive glue may be formed on the bottom surface of its polymer layer 136 and on the bottom surface of each of its metal pads, lines or traces 108. Each of the semiconductor chips 100 may be mounted to the temporary substrate (T-sub) 590 by the layer 138 of adhesive glue adhering said each of the semiconductor chips 100 to the sacrificial bonding layer 591. Next, a polymer layer 92 may be formed by methods, such as spin-on coating, screen-printing, dispensing or molding, over a top surface of the sacrificial bonding layer 591, a backside of each of the semiconductor chips 100 and a top of each of the copper posts 158, in multiple gaps each between neighboring two of the copper posts 158 and in multiple gaps each between one of the semiconductor chips 100 and one of the copper posts 158. The polymer layer 92 may be, for example, polyimide, BenzoCycloButene (BCB), parylene, epoxy-based material or compound, photo epoxy SU-8, elastomer or silicone.

Figure 28D:
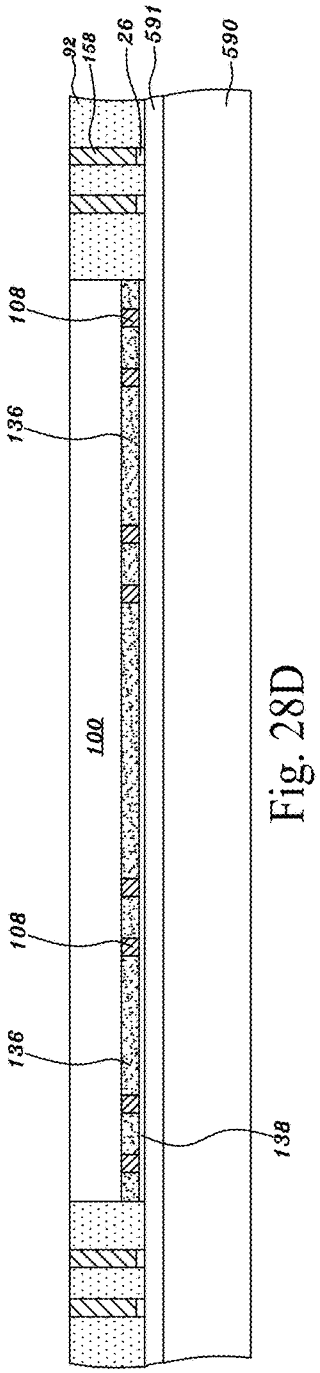

Next, a chemical mechanical polishing (CMP), polishing or grinding process may be performed to remove a top portion of the polymer layer 92 and a top portion of each of the semiconductor chips 100 and to planarize the backside of each of the semiconductor chips 100, the top of each of the copper post 158 and a top surface of the polymer layer 92, as seen in FIG. 28D. Thereby, the top of each of the copper posts 158 may be exposed.

Figure 28E:
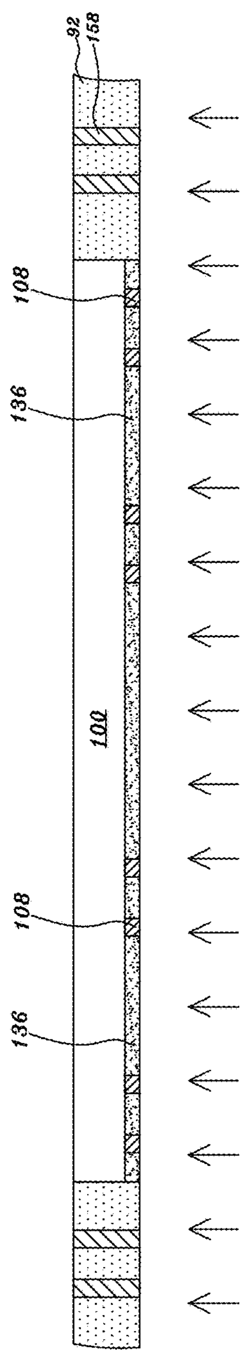

Next, the temporary substrate (T-sub) 590 may be released from the semiconductor chips 100, polymer layer 92 and copper posts 158. For example, in the case that the sacrificial bonding layer 591 is the material of light-to-heat conversion (LTHC) and the temporary substrate (T-sub) 590 is a glass substrate, a laser light, such as YAG laser having a wavelength of about 1064 nm, an output power between 20 and 50 W and a spot size of 0.3 mm in diameter at a focal point, may be generated to pass from the backside of the temporary substrate (T-sub) 590 to the sacrificial bonding layer 591 through the temporary substrate (T-sub) 590 to scan the sacrificial bonding layer 591 at a speed of 8.0 m/s, for example, such that the sacrificial bonding layer 591 may be decomposed and thus the temporary substrate 590 may be easily released from the sacrificial bonding layer 591. Next, an adhesive peeling tape (not shown) may be attached to a bottom surface of the sacrificial bonding layer 591. Next, the sacrificial bonding layer 591 may be released or peeled from the frontside of the vertical-through-via (VTV) wafer by pulling the adhesive peeling tape, to expose the adhesion layer 26*a* of the adhesion/seed layer 26 under each of the copper posts 158, the layer 138 of adhesive glue under each of the semiconductor chips 100 and a bottom surface of the polymer layer 92. Next, a chemical mechanical polishing (CMP), polishing or grinding process may be performed to remove the adhesion/seed layer 26, the layer 138 of adhesive glue and a bottom portion of the polymer layer 92 to planarize a bottom of each of the copper posts 158, a bottom surface of the polymer layer 36 of each of the semiconductor chips 100, a bottom of each of the metal pads, lines or traces 108 of each of the semiconductor chips 100 and a bottom surface of the polymer layer 92, as seen in FIG. 28E. Thereby, the bottom of each of the copper posts 158 and the bottom of each of the metal pads, lines or traces 108 of each of the semiconductor chips 100 may be exposed.

Figure 28F:
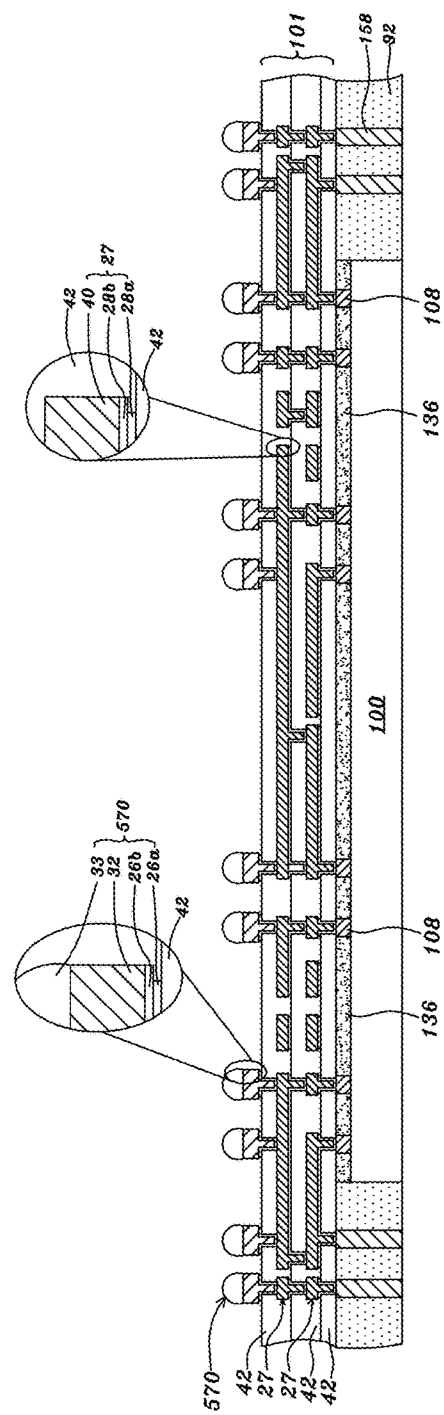

Next, referring to FIG. 28F, the structure as seen in FIG. 28E is flipped. A top or frontside interconnection scheme for a logic drive or device (TISD or FISD) may be formed over the semiconductor chips 100, copper posts 158 and polymer layer 92. The top of frontside interconnection scheme for a logic drive or device (TISD or FISD) 101 may be provided with one or more interconnection metal layers 27 coupling to each of the metal pads, lines or traces 108 of each of the semiconductor chips 100 and each of the copper posts 158 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the polymer layer 92 and between the bottommost one of its interconnection metal layers 27 and the frontside of each of the semiconductor chips 100, wherein each opening in the bottommost one of its polymer layers 42 may be over one of the metal pads, lines or traces 108 of one of the semiconductor chips 100 or over one of the copper posts 158. Each of its interconnection metal layers 27 may extend horizontally across an edge of each of the semiconductor chips 100. The topmost one of its interconnection metal layers 27 may have multiple metal pads at bottoms of multiple respective openings 42*a* in the topmost one of its polymer layers 42.

Referring to FIG. 28F, for the top or frontside interconnection scheme for a logic drive or device (TISD or FISD) 101, each of its polymer layers 42 may be a layer of polyimide, BenzoCycloButene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more lower portions in openings in one of its polymer layers 42 having a thickness between 0.3 μm and 20 μm, and an upper portion having a thickness 0.3 μm and 20 μm over said one of its polymer layers 42, (2) an adhesion layer 28*a*, such as titanium or titanium nitride having a thickness between 1 nm and 50 nm, at a bottom and sidewall of each of the one or more lower portions of the copper layer 40 of said each of the metal traces or lines and at a bottom of the upper portion of the copper layer 40 of said each of the metal traces or lines, and (3) a seed layer 28*b*, such as copper, between the copper layer 40 and adhesion layer 28*a* of said each of the metal traces or lines, wherein the upper portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 or 5 μm, and a width between, for example, 0.3 μm and 30 μm, 0.5 μm and 20 μm, 1 μm and 10 μm, or 0.5 and 5 μm, or wider than or equal to 0.3 μm, 0.5 μm, 0.7 μm, 1 μm, 1.5 μm, 2 μm, 3 μm or 5 μm.

Next, multiple metal bumps, pillars or pads 570 may be formed in an array on the metal pads of the topmost one of the interconnection metal layers 27 of the frontside interconnection scheme for a logic drive or device (FISD) 101 at the bottoms of the respective openings 42*a* in the topmost one of the polymer layers 42 of the top or frontside interconnection scheme for a logic drive or device (TISD or FISD) 101. Each of the metal bumps, pillars or pads 570 may be of various types. A first type of metal bumps, pillars or pads 570 may include (1) an adhesion layer 26*a*, such as titanium (Ti) or titanium nitride (TiN) layer having a thickness between 1 nm and 50 nm, on the topmost one of the interconnection metal layers 27 of the frontside interconnection scheme for a logic drive or device (FISD) 101, (2) a seed layer 26*b*, such as copper, on its adhesion layer 26*a* and (3) a copper layer 32 having a thickness between 20 μm and 100 μm on its seed layer 26*b*. Alternatively, a second type of metal bumps, pillars or pads 570 may include the adhesion layer 26*a*, seed layer 26*b* and copper layer 32 as mentioned above, and may further include a tin-containing solder cap 33 made of tin or a tin-silver alloy having a thickness between 20 jam and 100 μm on its copper layer 32. Alternatively, a third type of metal bumps, pillars or pads 570 may include a gold layer having a thickness between 3 and 15 micrometers.

Figure 28G:
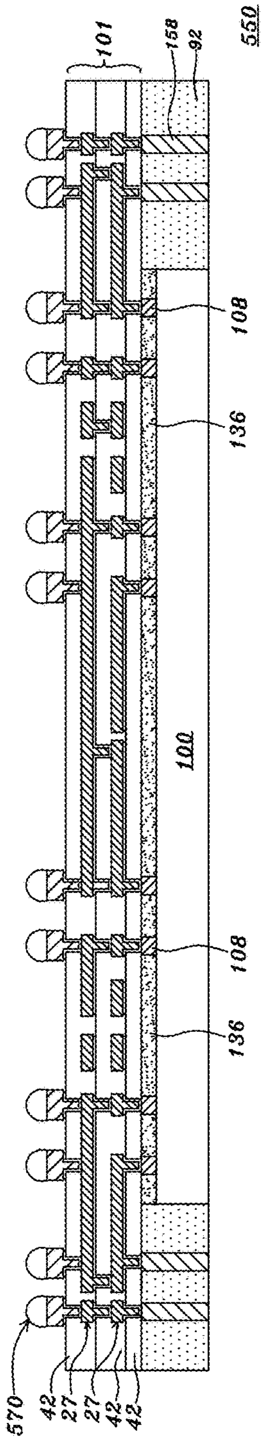

Next, the structure as seen in FIG. 28F may be cut or diced into multiple individual chip packages 550 as shown in FIG. 28G by a laser cutting process or by a mechanical cutting process. Referring to FIG. 28G, for the chip package 550, its semiconductor chips 100 may couple to each other or one another through the interconnection metal layers 27 of its top or frontside interconnection scheme for a logic drive or device (TISD or FISD) 101. For each of the chip packages

550, each of its copper posts 158 may serve as a through package via (TPV), i.e., through polymer via, to provide vertical connection to or from the interconnection metal layers 27 of its top or frontside interconnection scheme for a logic drive or device (TISD or FISD) 101.

For each of the chip packages 550, each of its semiconductor chips 100 may be provided for the standard commodity FPGA IC chip 200, DPIIC chip 410, NVMIC chip 250 (such as NAND or NOR flash chip), dedicated I/O chip 265, PCIC chip 269 (such as digital-signal-processing (DSP) chip, CPU chip, GPU chip, TPU chip or APU chip), high-bandwidth memory (HBM) chip (such as DRAM chip 321, SRAM chip, MRAM chip or RRAM chip), dedicated control chip 260, dedicated control and I/O chip 266, IAC chip 402 (such as analog IC chip, mixed mode IC chip or radio-frequency (RF) IC chip), DCIAC chip 267 or DCDI/OIAC chip 268 with an arrangement for one of the standard commodity logic drive 300 as illustrated in FIGS. 11A-11N. The interconnection metal layers 27 of its top or frontside interconnection scheme for a logic drive or device (TISD or FISD) 101 may compose the programmable interconnects 361 and fixed interconnects 364 of its inter-chip interconnects 371 as illustrated in FIGS. 11A-11N.

Alternatively, for each of the chip packages 550, which may be a single-chip package or chiplet, only one semiconductor chip 100 as mentioned in FIG. 28C may be provided therein, wherein the only one semiconductor chip 100 may be a standard commodity FPGA IC chip 200, DPIIC chip 410, NVMIC chip 250 (such as NAND or NOR flash chip), dedicated I/O chip 265, PCIC chip 269 (such as digital-signal-processing (DSP) chip, CPU chip, GPU chip, TPU chip or APU chip), high-bandwidth memory (HBM) chip (such as DRAM chip 321, SRAM chip, MRAM chip or RRAM chip), dedicated control chip 260, dedicated control and I/O chip 266, IAC chip 402 (such as analog IC chip, mixed mode IC chip or radio-frequency (RF) IC chip), DCIAC chip 267 or DCDI/OIAC chip 268.

Fourth Embodiment for Chip Package with TPVs

Figure 28H:
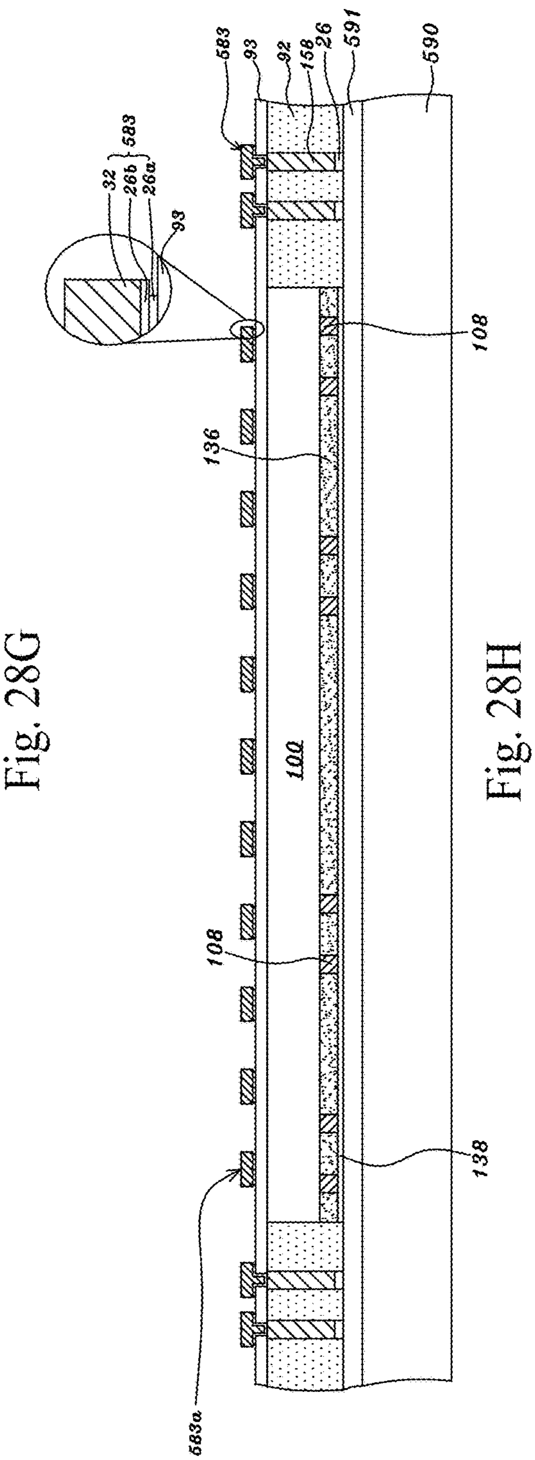
FIGS. 28H and 28I are schematically views showing a process for forming a chip package with TPVs in accordance with a fourth embodiment of the present application.
Figure 28I:
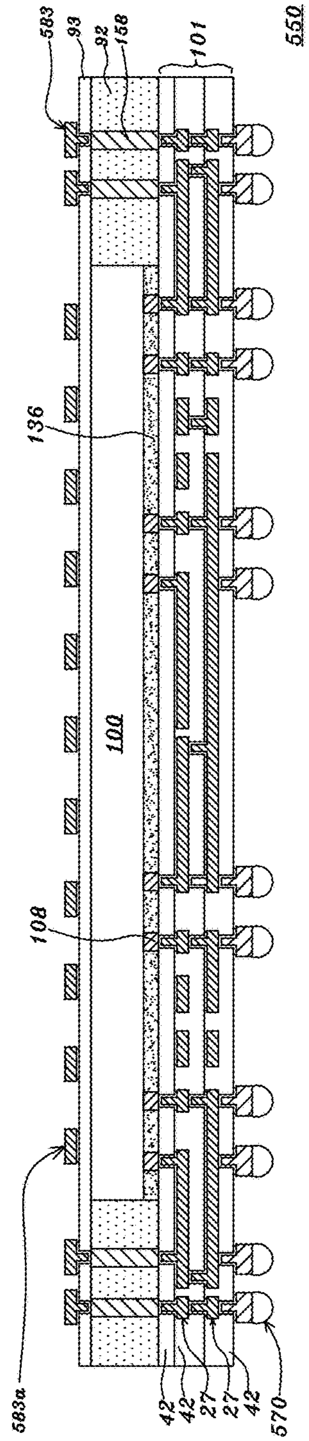

FIGS. 28H and 28I are schematically views showing a process for forming a chip package with TPVs in accordance with a fourth embodiment of the present application. Referring to FIG. 28H, after the chemical mechanical polishing (CMP), polishing or grinding process is performed as illustrated in FIG. 28C, an insulating dielectric layer 93 may be formed on the backside of each of the semiconductor chips 100 and on the top surface of the polymer layer 92. Each opening 93*a* in the insulating dielectric layer 93 may be vertically over the top of the copper posts 158, that is, the top of each of the copper posts 158 may be at a bottom of one of the openings in the insulating dielectric layer 93. The insulating dielectric layer 93 may be a layer of polyimide, BenzoCycloButene (BCB), parylene, epoxy-based material or compound, photo epoxy SU-8, elastomer or silicone, having a thickness between 3 and 30 micrometers or between 5 and 15 micrometers. Next, multiple metal pads or bumps 583 may be formed with a thickness between 1 μm and 10 μm in an array each on the top of one of the copper posts 158 or on a top surface of the insulating dielectric layer 93. Each of the metal pads or bumps 583 may be of various types. A first type of metal pads or bumps 583 having a thickness between 1 μm and 10 μm may include (1) an adhesion layer 26*a*, such as titanium (Ti) or titanium nitride (TiN) layer having a thickness between 1 nm and 50 nm, on the top of one of the copper posts 158 or on the top surface of the insulating dielectric layer 93, (2) a seed layer 26*b*, such as copper, on its adhesion layer 26*a* and (3) a copper layer 32 having a thickness between 1 μm and 10 μm on its seed layer 26*b*. Alternatively, a second type of metal pads or bumps 583 may include the adhesion layer 26*a*, seed layer 26*b* and copper layer 32 as mentioned above, and may further include a tin-containing solder cap made of tin or a tin-silver alloy having a thickness between 1 μm and 10 μm on its copper layer 32.

Next, the steps as illustrated in FIGS. 28E-28G may be performed to form multiple chip packages 550 as seen in FIG. 28I. For each of the chip packages 550, each of its copper posts 158 may serve as a through package via (TPV), i.e., through polymer via, to provide vertical connection between the interconnection metal layers 27 of its top or frontside interconnection scheme for a logic drive or device (TISD or FISD) 101 and one of the metal pads or bumps 583. Its metal pads or bumps 583 arranged in an array may include multiple dummy pads or bumps 583*a* not connecting to any of its semiconductor chip(s) 100 but having mechanical functions for subsequent package-on-package (POP) assembly, formed on the bottom surface of its insulating dielectric layer 93 and vertically under its semiconductor chip(s) 100. Each of its dummy pads or bumps 583*a* may have no connection to any of the copper posts 158.

First Embodiment for Chip Package with BISD and TPVs

Figure 20A:
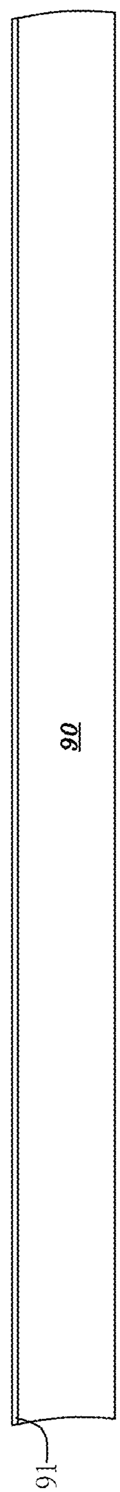
FIG. 20A-20M are schematic views showing a process for forming BISD over a carrier substrate in accordance with an embodiment of the present application.
Figure 20B:
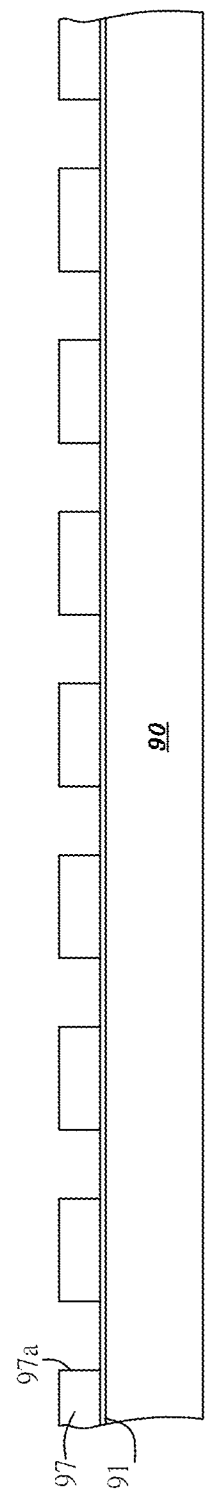
Figure 20C:
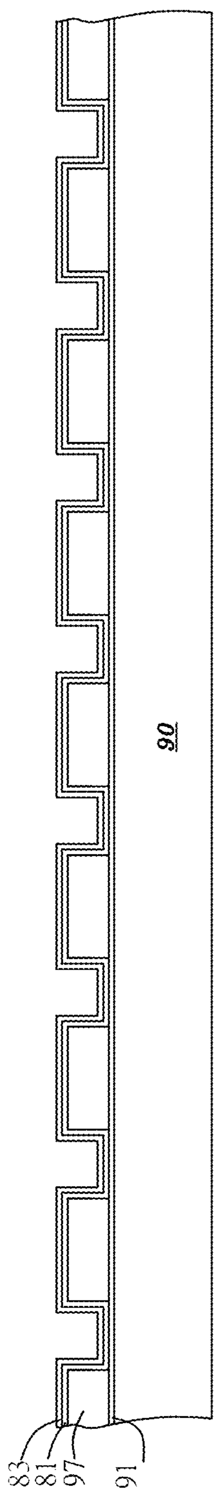
Figure 20D:
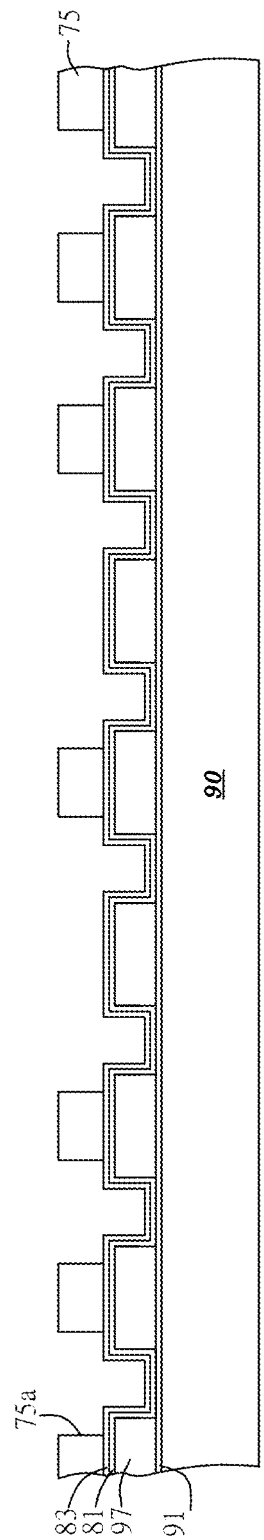
Figure 20E:
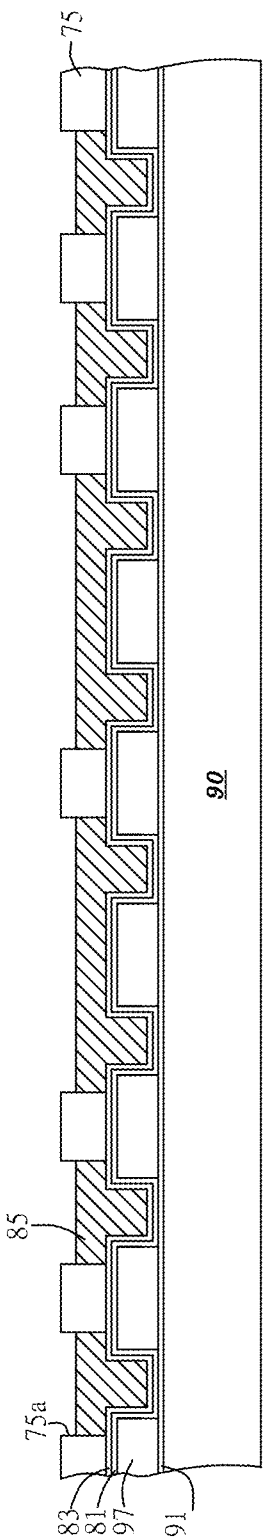
Figure 20F:
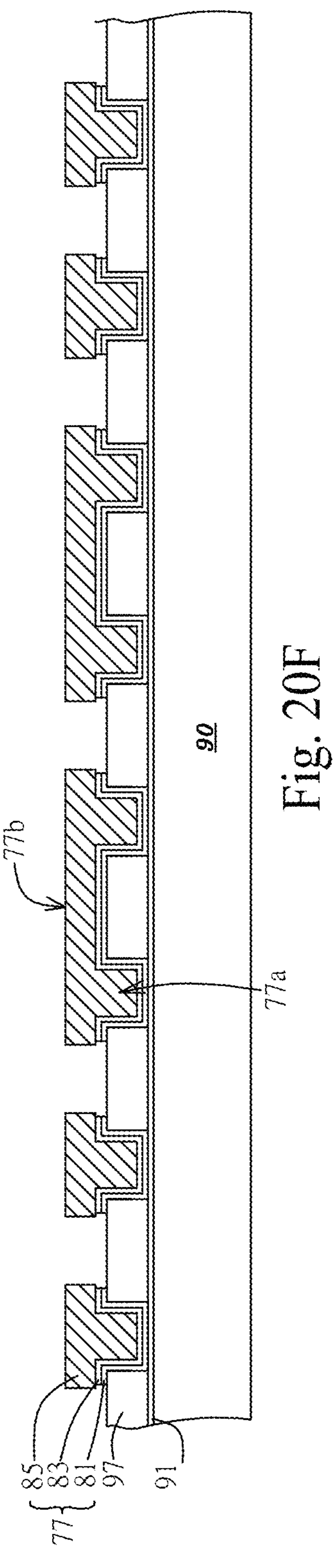
Figure 20G:
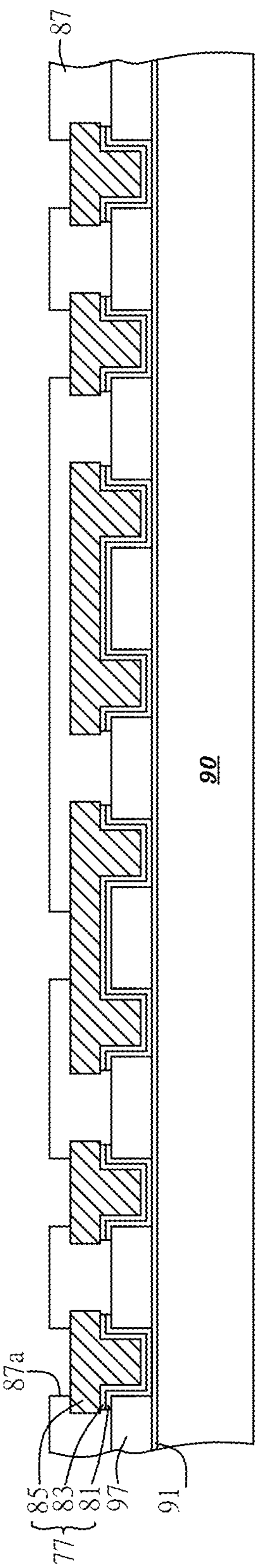
Figure 20H:
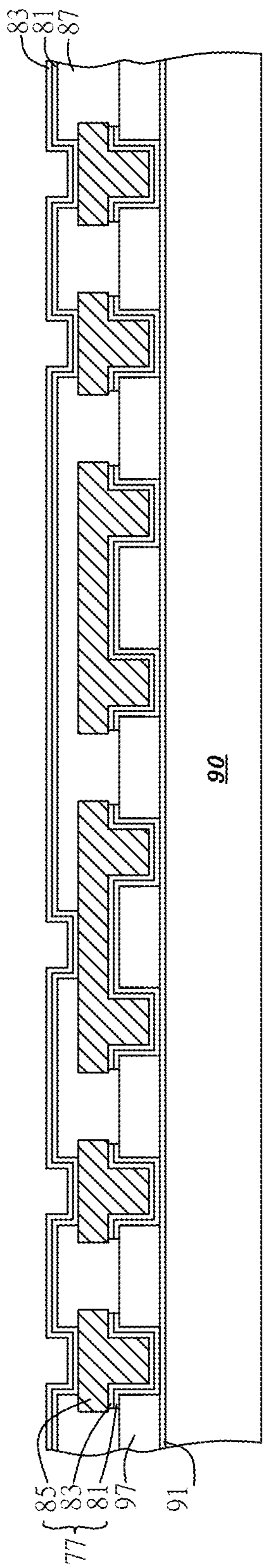
Figure 20I:
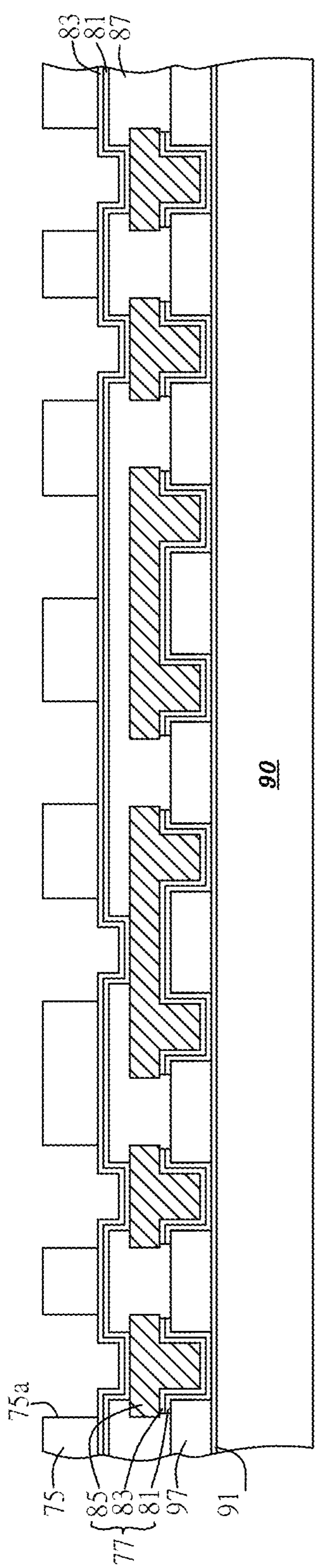
Figure 20J:
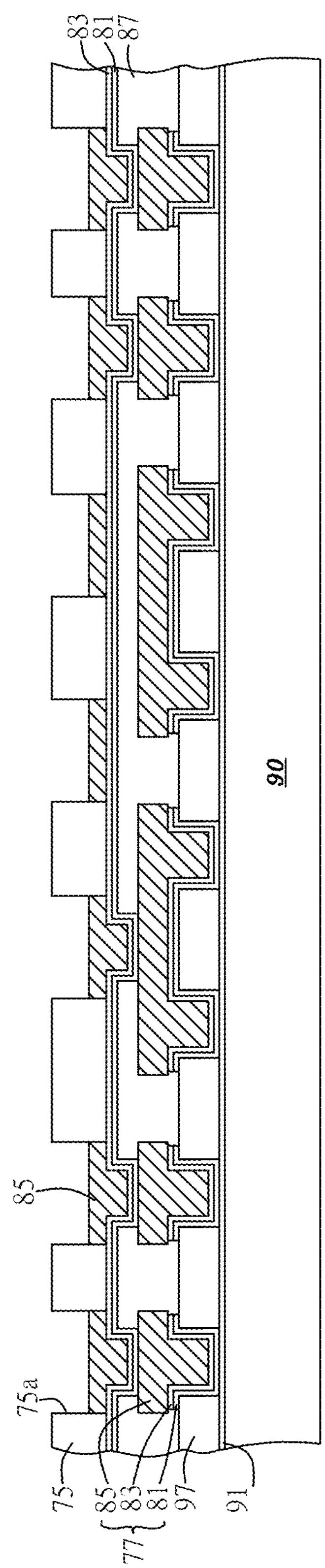
Figure 20K:
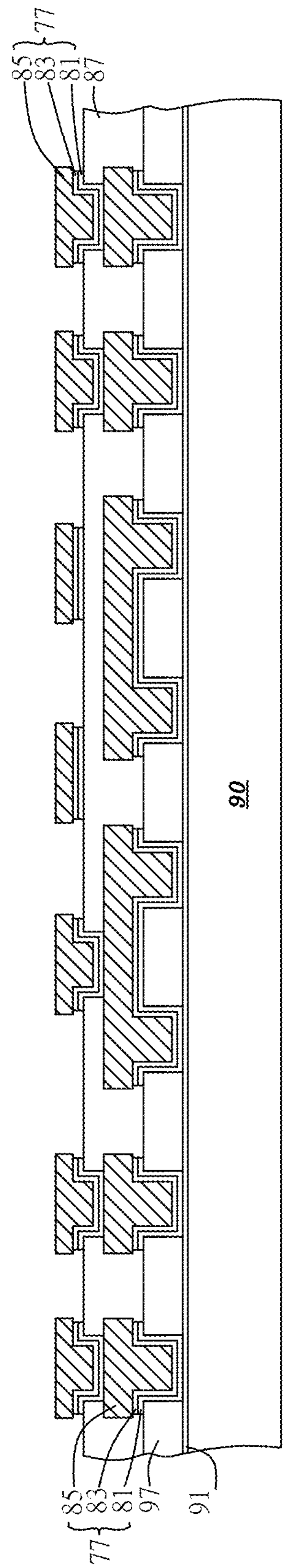
Figure 20L:
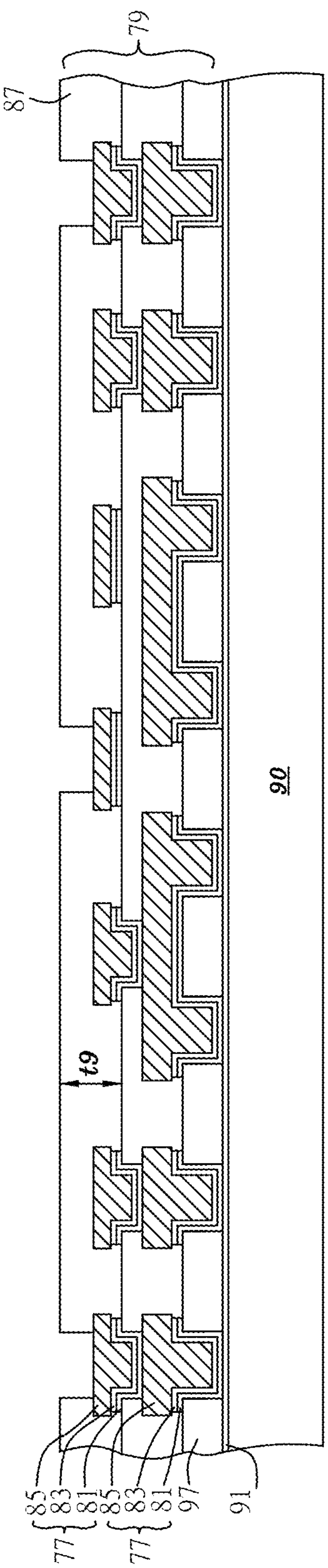
Figure 20M:
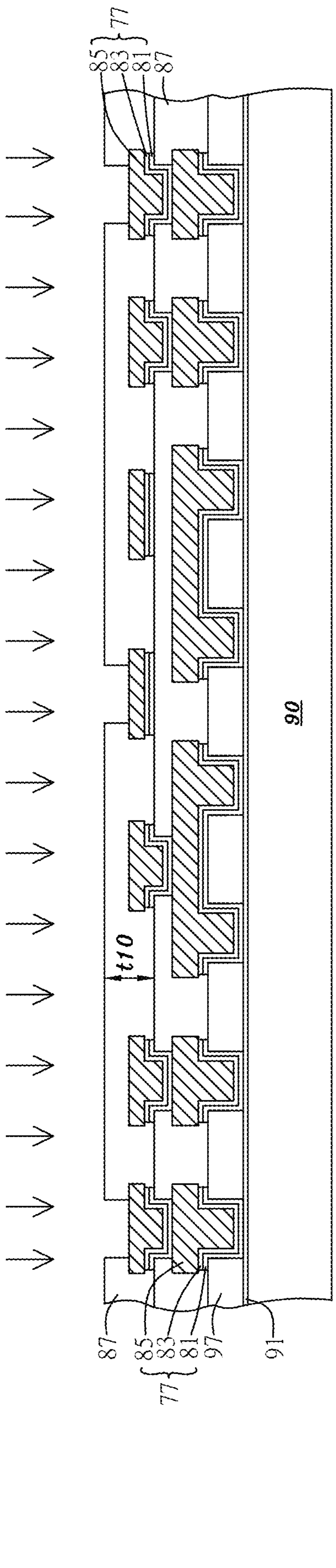
Figure 20N:
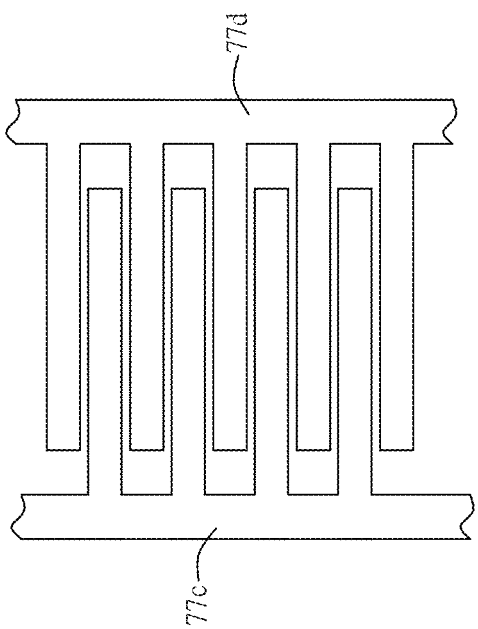
FIG. 20N is a top view showing a metal plane in accordance with an embodiment of the present application.
Figure 20O:
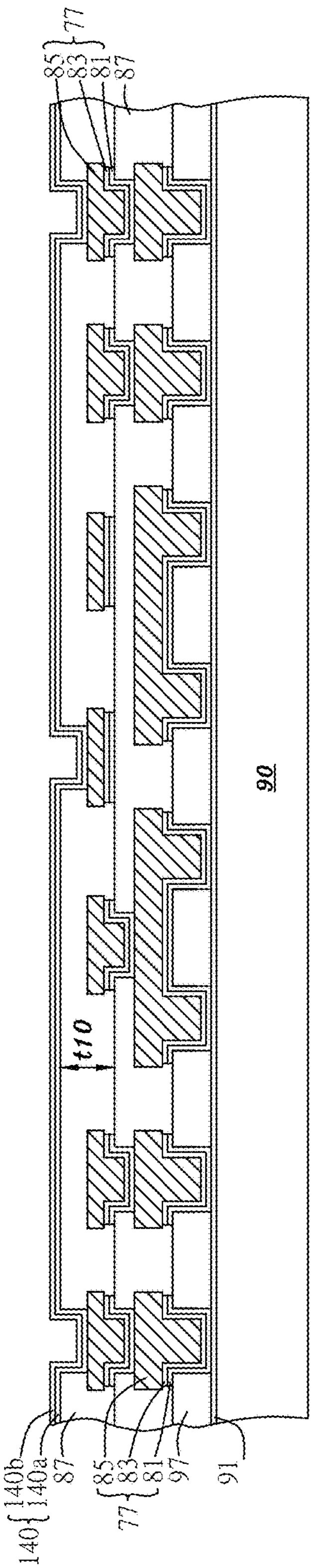
FIGS. 20O-20R are schematically cross-sectional views showing a process for forming multiple through-package vias (TPV) on the BISD in accordance with an embodiment of the present application.
Figure 20P:
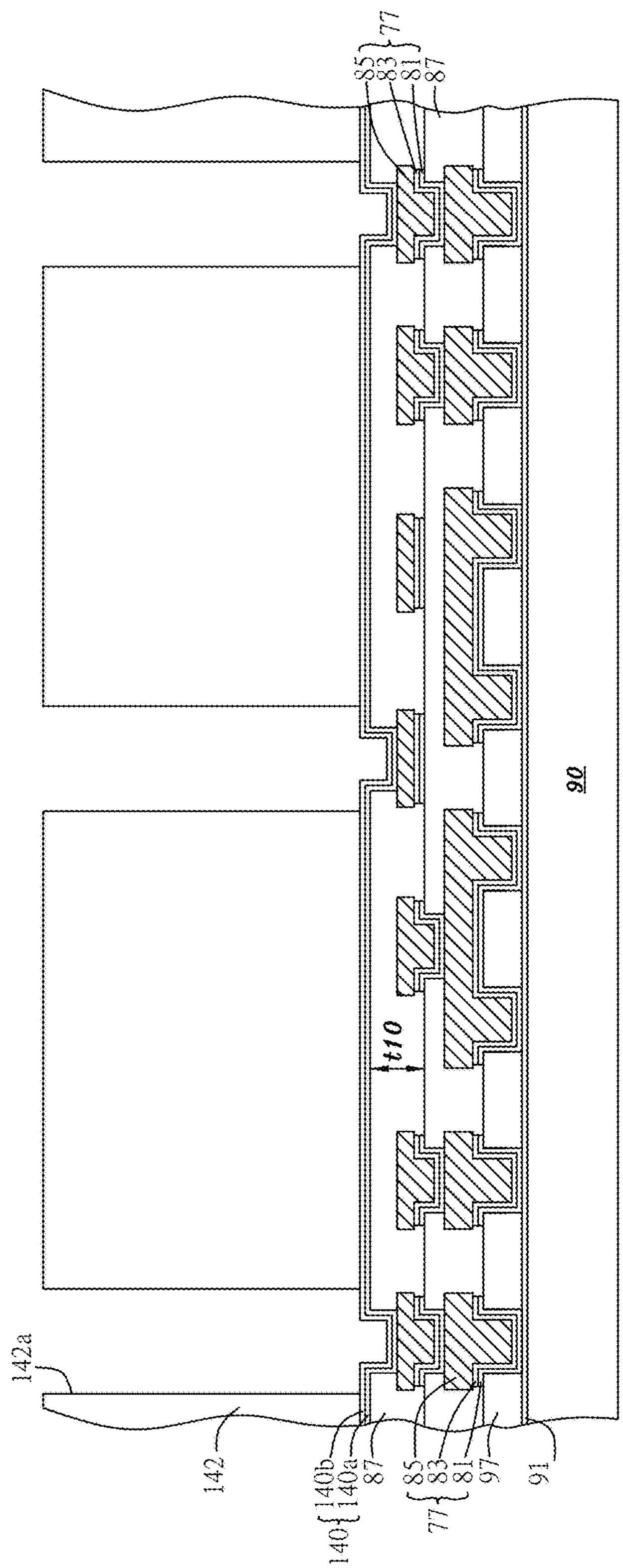
Figure 20Q:
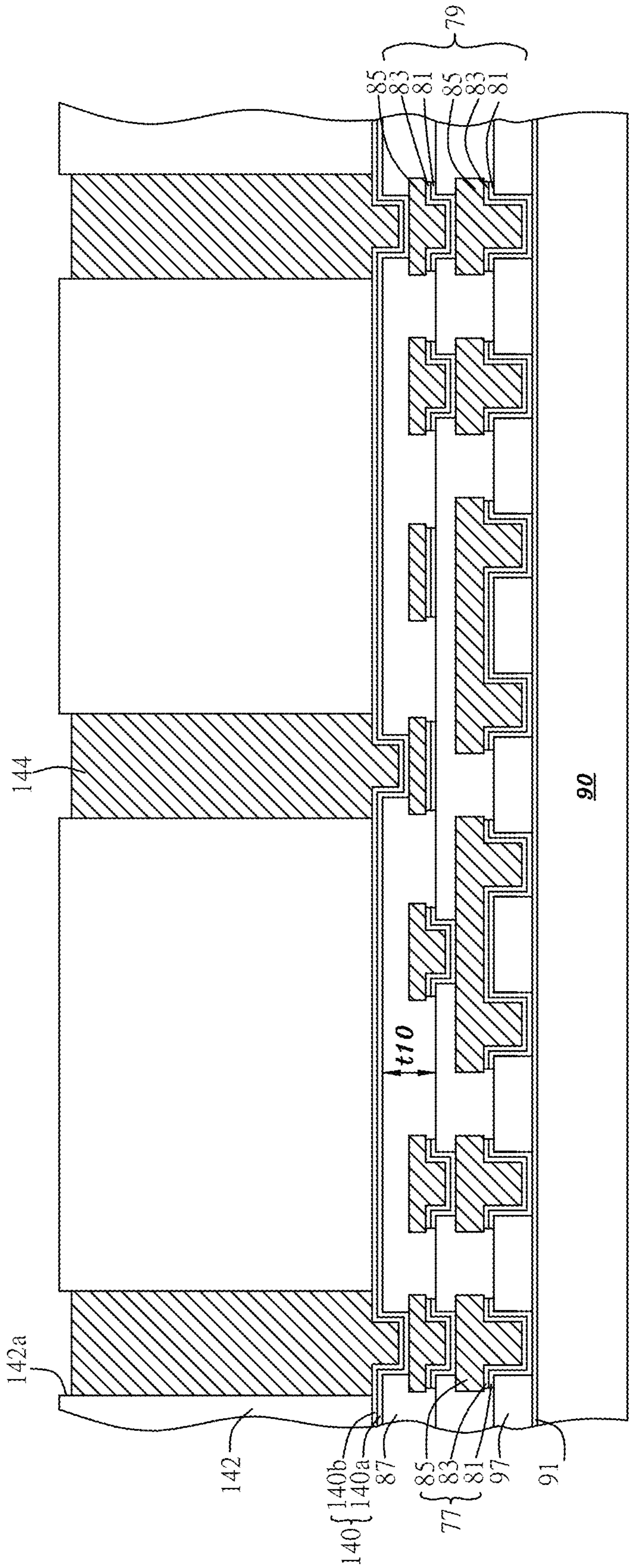
Figure 20R:
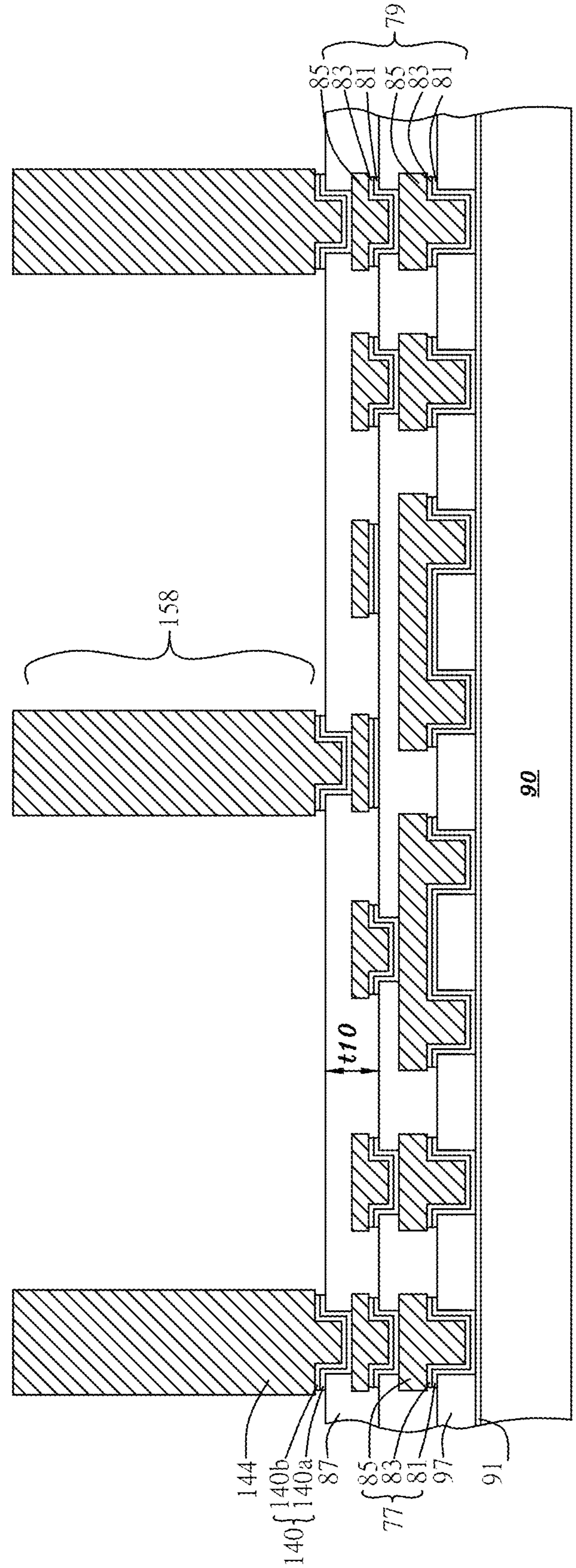
Figure 20S:
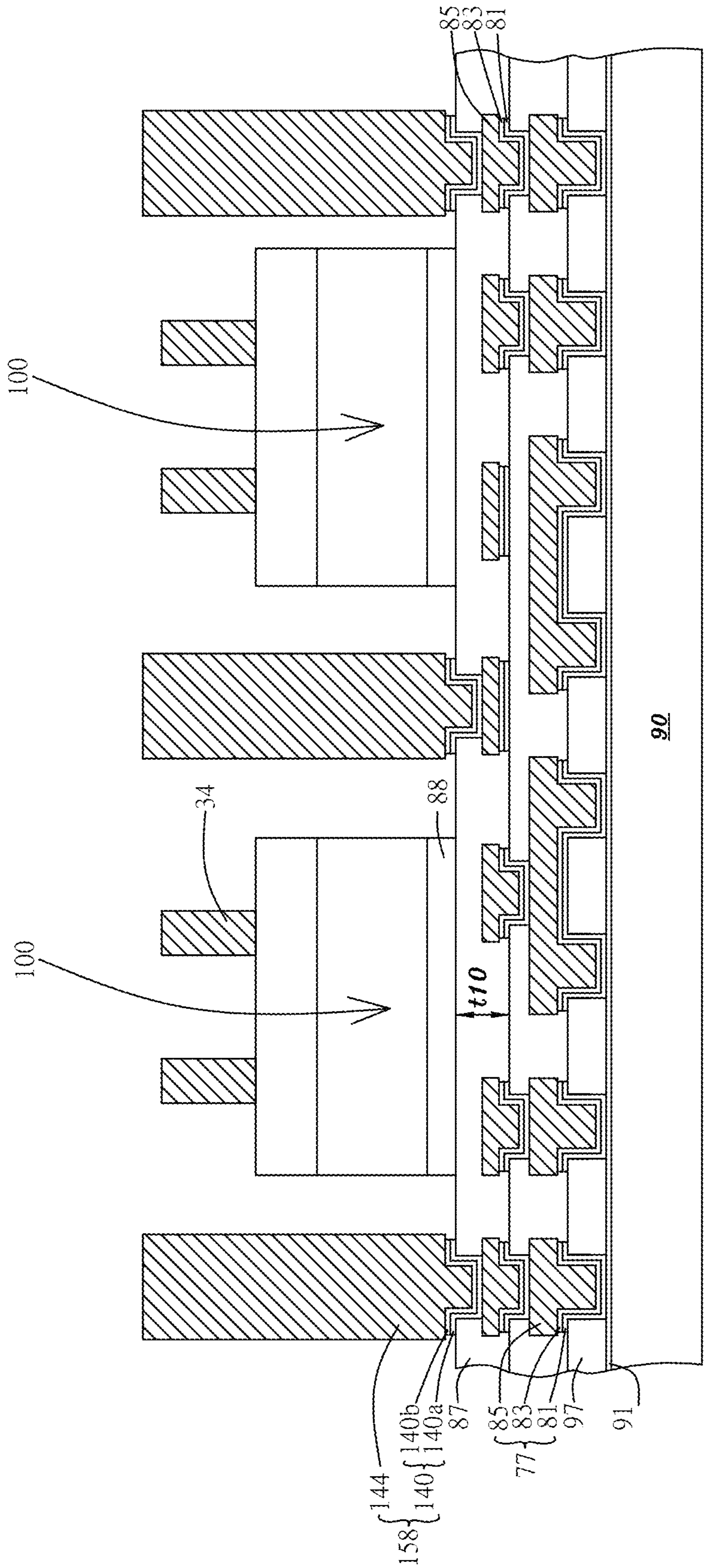
FIGS. 20S-20Z are schematically cross-sectional views showing a process for forming a single-layer-packaged logic drive in accordance with an embodiment of the present application.
Figure 20T:
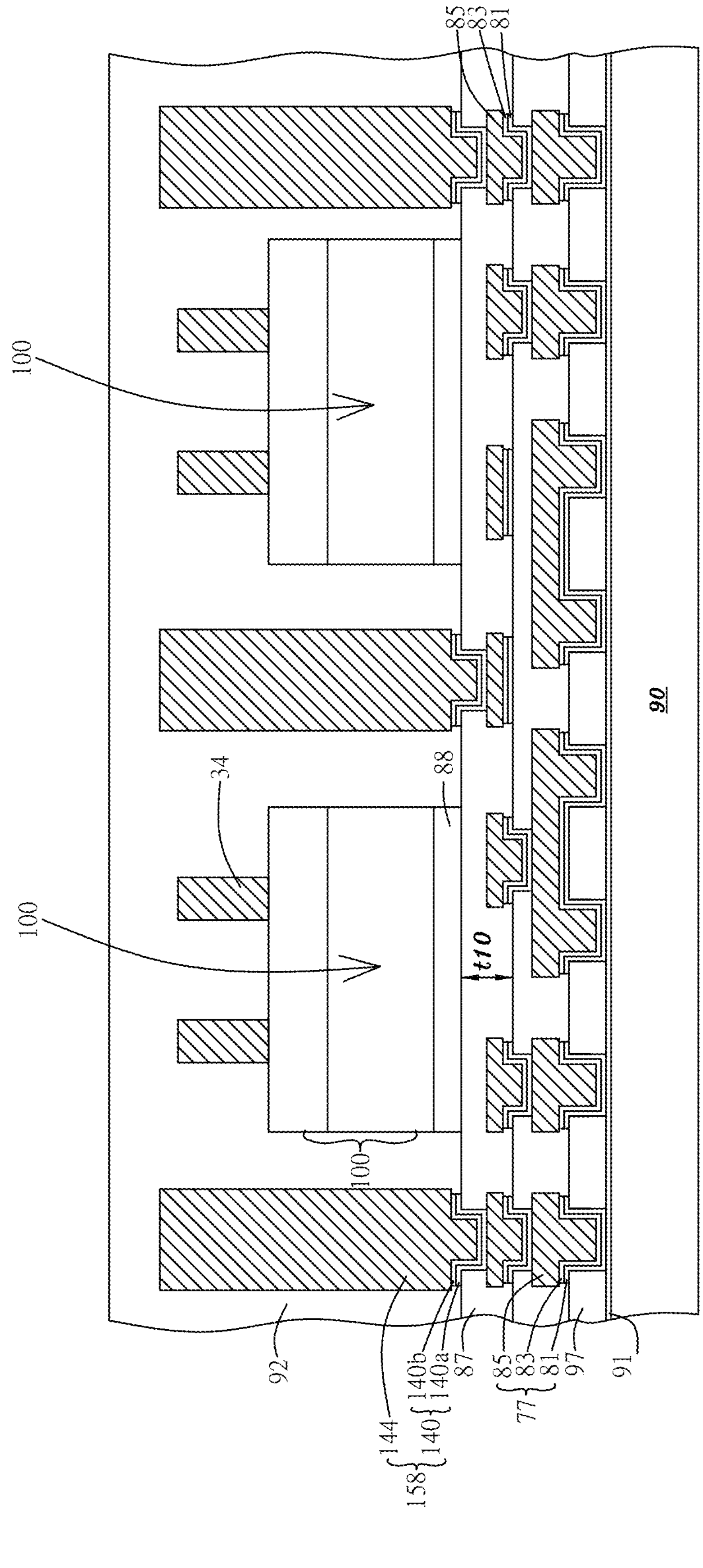
Figure 20U:
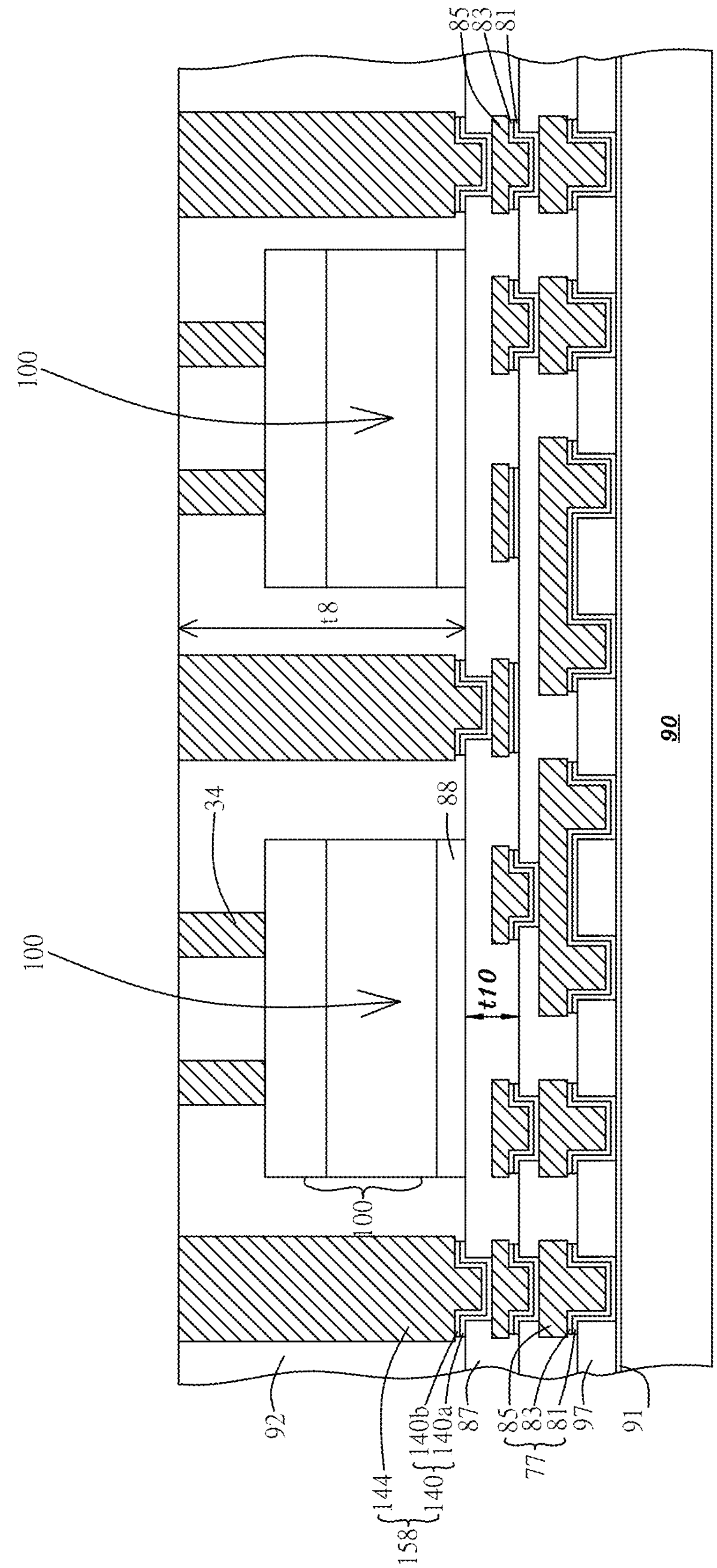
Figure 20V:
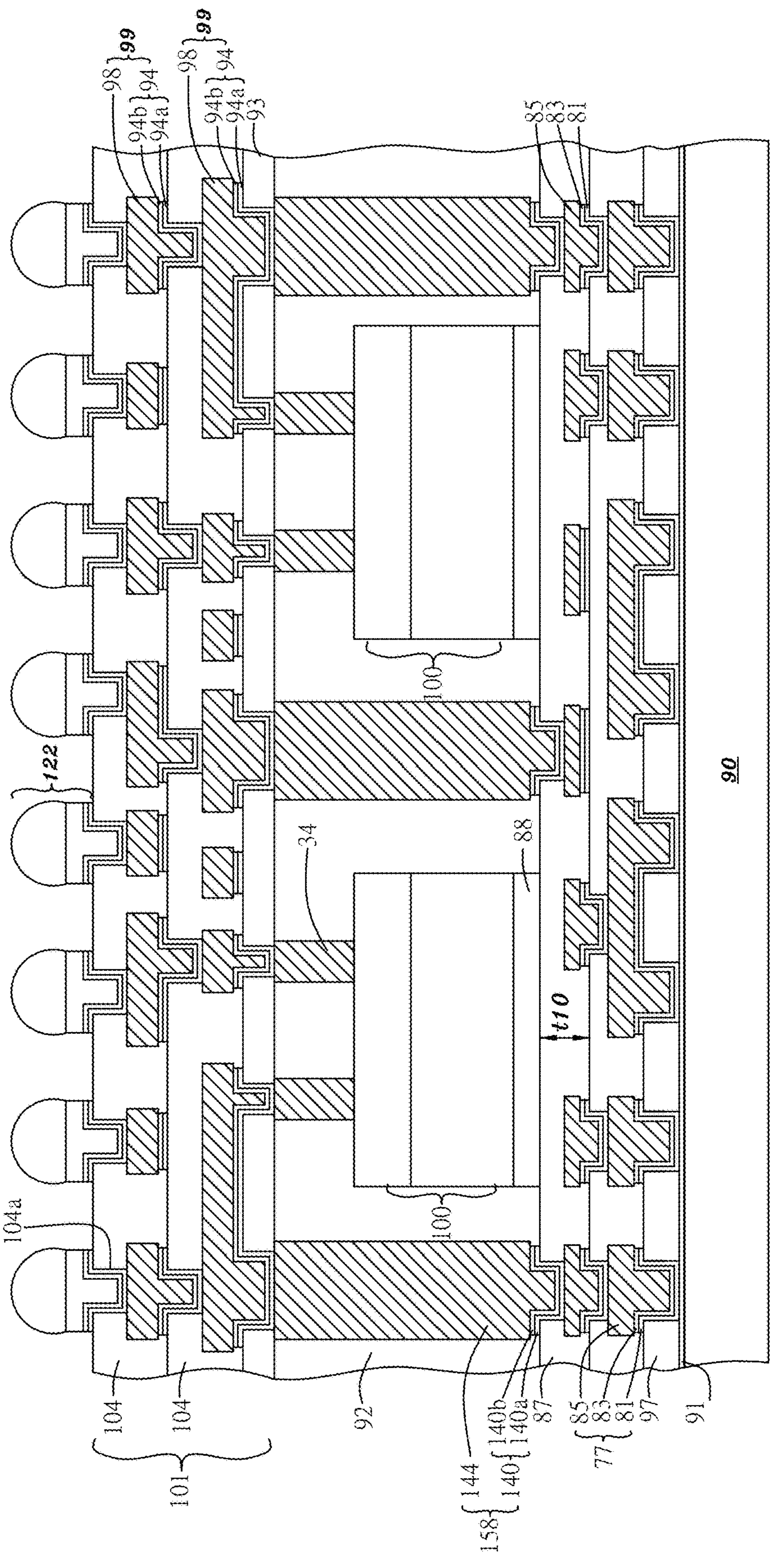
Figure 20W:
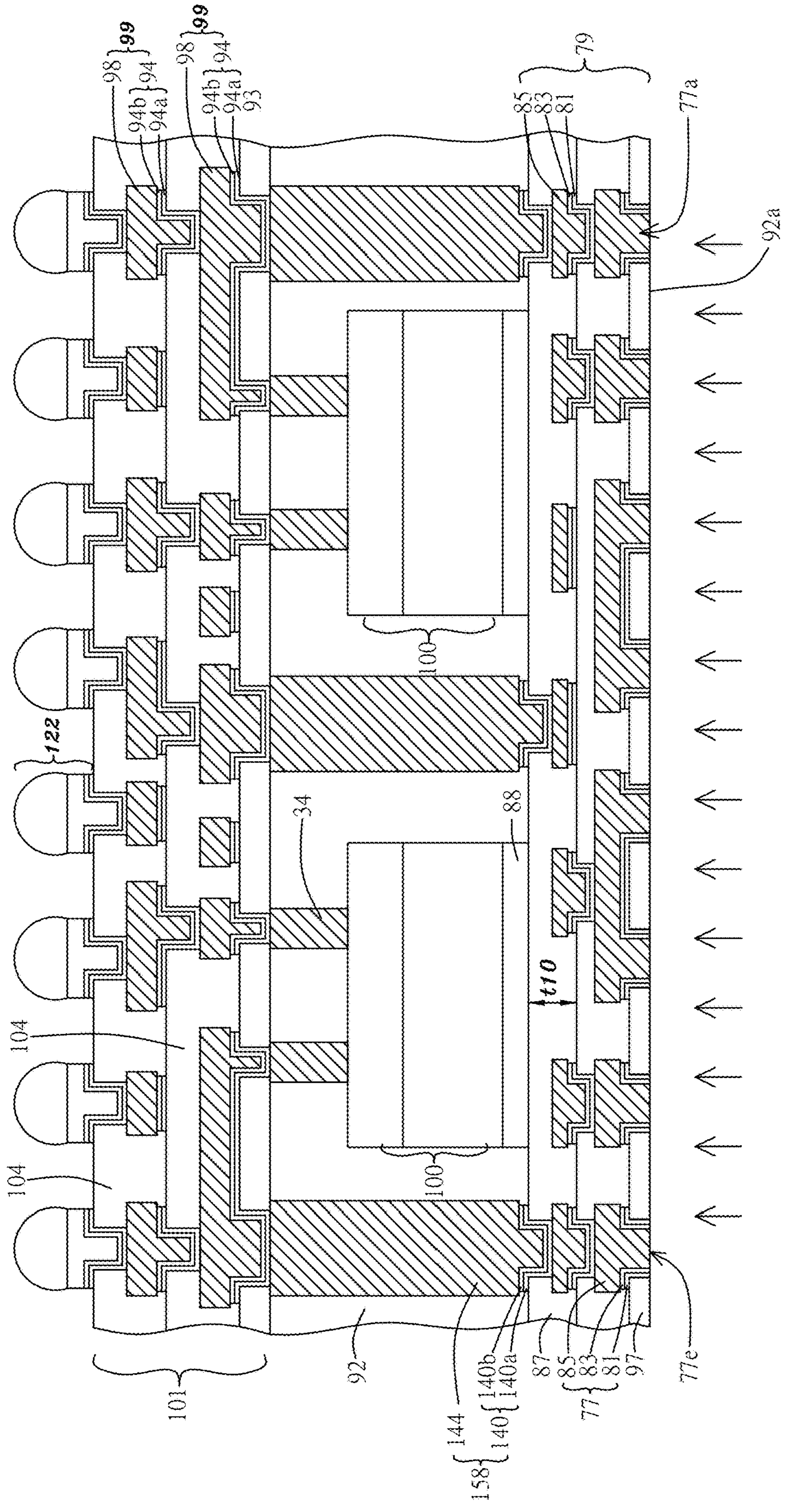
Figure 20X:
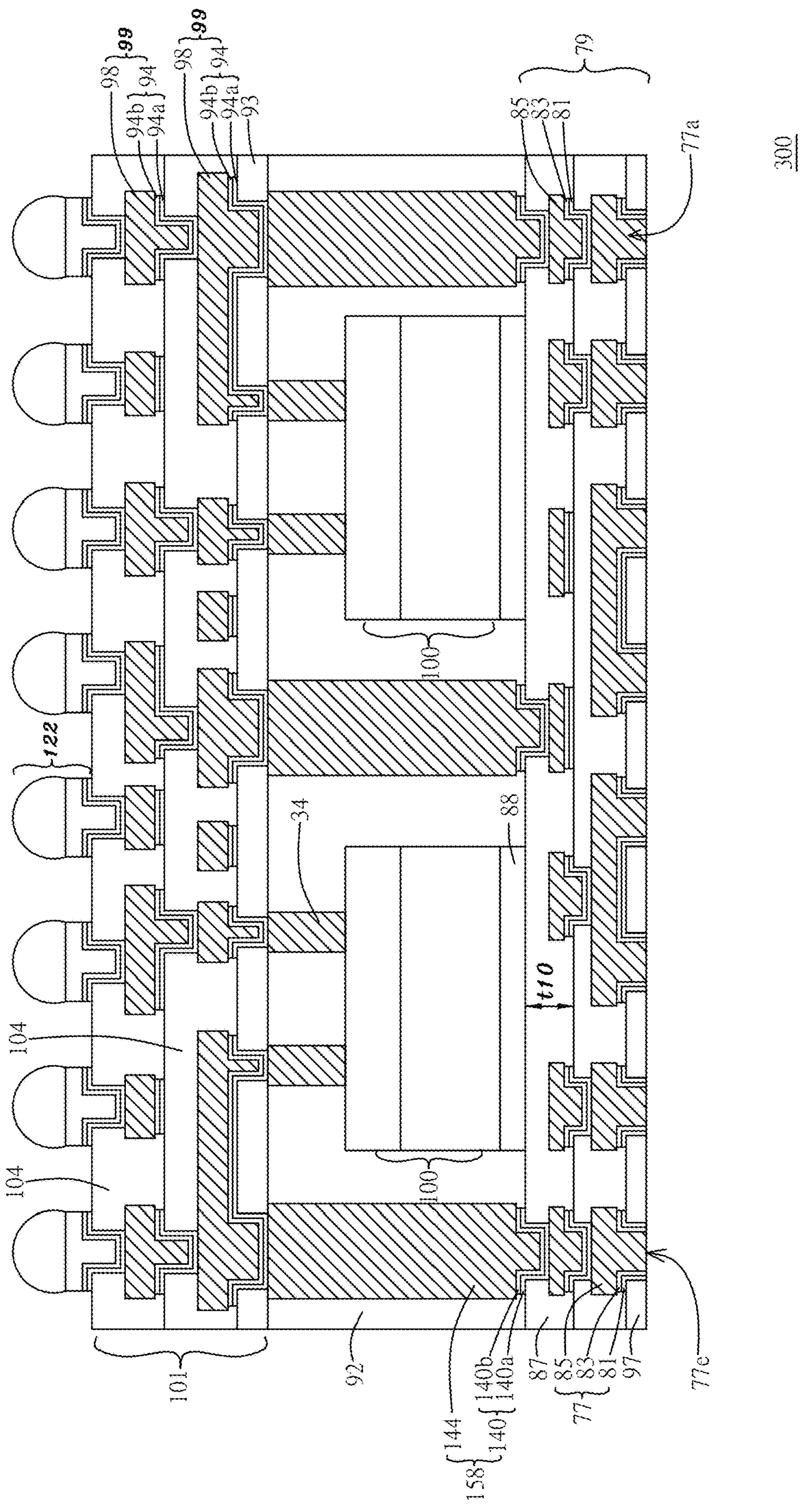

Alternatively, the Fan-Out Interconnection Technology (FOIT) may be further performed over the carrier substrate 90 for fabricating a Bottom metal Interconnection Scheme at a backside of the logic Drive 300 (BISD) in a multi-chip package for a first embodiment as seen in FIGS. 20A-20X. The BISD are described as below:

FIG. 20A-20M are schematic views showing a process for forming BISD over a carrier substrate in accordance with an embodiment of the present application. Referring to FIG. 20A, a base insulating layer 91 including a silicon-oxide layer, silicon-nitride layer, polymer layer or combination thereof may be formed on the carrier substrate 90 illustrated in FIG. 18A.

Next, referring to FIG. 20B, a polymer layer 97, i.e., insulating dielectric layer, is formed on the base insulating layer 91 by a method of spin-on coating, screen-printing, dispensing or molding, and openings 97*a* in the polymer layer 97 are formed over the base insulating layer 91 to be exposed by the openings 97*a*. The polymer layer 97 may contain, for example, polyimide, BenzoCycloButene (BCB), parylene, epoxy-based material or compound, photo epoxy SU-8, elastomer or silicone. The polymer layer 97 may comprise organic material, for example, a polymer, or material compounds comprising carbon. The polymer layer 97 may be photosensitive, and may be used as photoresist as well for patterning multiple openings 97*a* therein to have metal vias formed therein by following processes to be performed later. The polymer layer 97 may be coated, exposed to light through a photomask, and then developed to form the openings 97*a* therein. The openings 97*a* in the polymer layer 97 expose multiple top areas of the base insulating layer 91. Next, the polymer layer 97, i.e., insulating dielectric layer, is cured at a temperature, for example, higher than or equal to 100° C., 125° C., 150° C., 175° C., 200° C., 225° C., 250° C., 275° C. or 300° C. The polymer layer 97 after cured may have a thickness between, for example, 3 μm and 50 μm, 3 μm and 30 μm, 3 μm and 20 μm, or 3 μm and 15 μm, or thicker than or equal to 3 μm, 5 μm, 10 μm, 20 μm, or 30 μm. The polymer layer 97 may be added with some dielectric particles or glass fibers. The material of the polymer layer 97 and the process for forming the same may be referred to that of the polymer layer 36 and the process for forming the same as illustrated in FIG. 15H.

Next, an emboss process is performed on the polymer layer 97 and on the exposed top areas of the base insulating layer 91 to form the BISD 79, as seen in FIGS. 20C-20M. Referring to FIG. 20C, an adhesion layer 81 having a thickness of between 0.001 and 0.7 μm, between 0.01 and 0.5 μm or between 0.03 and 0.35 μm may be sputtered on the polymer layer 97 and on the base insulating layer 91. The material of the adhesion layer 81 may include titanium, a titanium-tungsten alloy, titanium nitride, chromium, titanium-tungsten-alloy layer, tantalum nitride, or a composite of the abovementioned materials. The adhesion layer 81 may be formed by an atomic-layer-deposition (ALD) process, chemical vapor deposition (CVD) process or evaporation process. For example, the adhesion layer 81 may be formed by sputtering or CVD depositing a titanium (Ti) or titanium nitride (TiN) layer (with a thickness, for example, between 1 nm and 200 nm or between 5 nm and 50 nm) on the polymer layer 97 and on the exposed top areas of the base insulating layer 91.

Next, referring to FIG. 20C, an electroplating seed layer 83 having a thickness of between 0.001 and 1 μm, between 0.03 and 2 μm or between 0.05 and 0.5 μm may be sputtered on a whole top surface of the adhesion layer 81. Alternatively, the electroplating seed layer 83 may be formed by an atomic-layer-deposition (ALD) process, chemical-vapor-deposition (CVD) process, vapor deposition method, electroless plating method or PVD (Physical Vapor Deposition) method. The electroplating seed layer 83 is beneficial to electroplating a metal layer thereon. Thus, the material of the electroplating seed layer 83 varies with the material of a metal layer to be electroplated on the electroplating seed layer 83. When a copper layer is to be electroplated on the electroplating seed layer 83, copper is a preferable material to the electroplating seed layer 83. For example, the electroplating seed layer may be deposited on or over the adhesion layer 81 by, for example, sputtering or CVD depositing a copper seed layer (with a thickness between, for example, 3 nm and 300 nm or 10 nm and 120 nm) on the adhesion layer 81.

Next, referring to 24D, a photoresist layer 75, such as positive-type photoresist layer, having a thickness of between 5 and 50 μm is spin-on coated or laminated on the electroplating seed layer 83. The photoresist layer 75 is patterned with the processes of exposure, development, etc., to form multiple trenches or openings 75*a* in the photoresist layer 75 exposing the electroplating seed layer 83. A 1× stepper, 1× contact aligner or laser scanner may be used to expose the photoresist layer 75 with at least two of G-line having a wavelength ranging from 434 to 438 nm, H-line having a wavelength ranging from 403 to 407 nm, and I-line having a wavelength ranging from 363 to 367 nm, illuminating the photoresist layer 75, that is, G-line and H-line, G-line and I-line, H-line and I-line, or G-line, H-line and I-line illuminate the photoresist layer 75, then developing the exposed polymer layer 75, and then removing the residual polymeric material or other contaminants on the electroplating seed layer 83 with an $O_2$ plasma or a plasma containing fluorine of below 200 PPM and oxygen, such that the photoresist layer 75 may be patterned with multiple openings 75*a* in the photoresist layer 75 exposing the electroplating seed layer 83 for forming metal pads, lines or traces in the trenches or openings 75*a* and on the electroplating seed layer 83 by following processes to be performed later. One of the trenches or openings 75*a* in the photoresist layer 75 may overlap the whole area of one of the openings 97*a* in the polymer layer 97.

Next, referring to FIG. 20E, a metal layer 85, such as copper, is electroplated on the electroplating seed layer 83 exposed by the trenches or openings 75*a*. For example, the metal layer 85 may be formed by electroplating a copper layer with a thickness between 5 μm and 80 μm, 5 μm and 50 μm, 5 μm and 40 μm, 5 μm and 30 μm, 3 μm and 20 μm, 3 μm and 15 μm, or 3 μm and 10 μm on the electroplating seed layer 83, made of copper, exposed by the trenches or openings 75*a*.

Referring to FIG. 20F, after the metal layer 85 is formed, most of the photoresist layer 75 may be removed and then the adhesion layer 81 and electroplating seed layer 83 not under the metal layer 85 may be etched. The removing and etching processes may be referred respectively to the processes for removing the photoresist layer 30 and etching the electroplating seed layer 28 and adhesion layer 26 as illustrated in FIG. 15F. Thereby, the adhesion layer 81, electroplating seed layer 83 and electroplated metal layer 85 may be patterned to form an interconnection metal layer 77 on the polymer layer 97 and in the openings 97*a* in the polymer layer 97. The interconnection metal layer 77 may be formed with multiple metal vias 77*a* in the openings 97*a* in the polymer layer 97 and multiple metal pads, lines or traces 77*b* on the polymer layer 97.

Next, referring to FIG. 20G, a polymer layer 87, i.e., insulting or inter-metal dielectric layer, is formed on the polymer layer 97 and metal layer 85 and multiple openings 87*a* in the polymer layer 87 are over multiple contact points of the interconnection metal layer 77. The polymer layer 87 has a thickness between 3 and 30 micrometers or between 5 and 15 micrometers. The polymer layer 87 may be added with some dielectric particles or glass fibers. The material of the polymer layer 87 and the process for forming the same may be referred to that of the polymer layer 97 or 36 and the process for forming the same as illustrated in FIG. 20B or 15H.

The process for forming the interconnection metal layer 77 as illustrated in FIGS. 20C-20F and the process for forming the polymer layer 87 may be alternately performed more than one times to fabricate the BISD 79 as seen in FIGS. 20H-20L. Referring to FIG. 20L, the BISD 79 may include an upper one of the interconnection metal layers 77 formed with multiple metal vias 77*a* in the openings 87*a* in one of the polymer layers 87 and multiple metal pads, lines or traces 77*b* on said one of the polymer layers 87. The upper one of the interconnection metal layers 77 may be connected to a lower one of the interconnection metal layers 77 through the metal vias 77*a* of the upper one of the interconnection metal layers 77 in the openings 87*a* in said one of the polymer layers 87. The BISD 79 may include the bottommost one of the interconnection metal layers 77 formed with multiple metal vias 77*a* in the openings 97*a* in the polymer layer 97 and multiple metal pads, lines or traces 77*b* on the polymer layer 97.

Referring to FIG. 20L, a topmost one of the interconnection metal layers 77 may be covered with a topmost one of the polymer layer 87. The openings 87*a* in the topmost one of the polymer layer 87 are positioned at the places where multiple gaps between the semiconductor chips 100 to be mounted onto the polymer layer 87 in the following processes are to be arranged and at the places where peripheral areas of individual logic drives 300 to be completed in the following processes are to be arranged, wherein each of the peripheral areas surrounds the semiconductor chips 100 to be mounted in a central area of one of the logic drives 300. The topmost one of the polymer layers 87 after cured and before polished in the following process may have a thickness t9 between 3 and 30 micrometers or between 5 and 15 micrometers.

Next, referring to FIG. 20M, a chemical-mechanical polishing (CMP) process, mechanical polishing process or grinding process may be performed to planarize or polish the top surface of the topmost one of the polymer layers 87 of the BISD 79 such that the topmost one of the polymer layers 87 after polished may have a thickness t10 between 3 and 30 micrometers or between 5 and 15 micrometers. Thereby, the BISD 79 may include 1 to 6 layers, or 2 to 5 layers of interconnection metal layers 77.

Referring to FIG. 20M, each of the interconnection metal layers 77 of the BISD 79 may have a thickness, on one of the polymer layers 87 and 97, between, for example, 0.3 μm and 40 μm, 0.5 μm and 30 μm, 1 jam and 20 μm, 1 μm and 15 μm, 1 μm and 10 μm or 0.5 μm and 5 μm, or thicker than or equal to 0.3 μm, 0.7 μm, 1 μm, 2 μm, 3 μm, 5 μm, 7 μm or 10 μm. Each of the interconnection metal layers 77 of the BISD 79 may have a line width between, for example, 0.3 μm and 40 μm, 0.5 μm and 30 μm, 1 μm and 20 μm, 1 μm and 15 μm, 1 μm and 10 jam or 0.5 μm to 5 μm, or wider than or equal to 0.3 μm, 0.7 μm, 1 μm, 2 μm, 3 μm, 5 μm, 7 μm or 10 μm. Each of the polymer layers 87 between neighboring two of the interconnection metal layers 77 may have a thickness, between neighboring two of the interconnection metal layers 77, between, for example, 0.3 μm and 50 μm, 0.3 μm and 30 μm, 0.5 μm and 20 μm, 1 μm and 10 μm or 0.5 μm and 5 μm, or thicker than or equal to 0.3 μm, 0.5 μm, 0.7 μm, 1 μm, 1.5 jam, 2 μm, 3 μm or 5 μm. Each of the metal vias 77*a* of the interconnection metal layers 77 in one of the openings 87*a* in the polymer layers 87 may have a thickness or height between, for example, 3 μm and 50 μm, 3 μm and 30 μm, 3 μm and 20 μm or 3 μm and 15 μm, or thicker than or equal to 3 μm, 5 μm, 10 μm, 20 μm or 30 μm.

FIG. 20N is a top view showing a metal plane in accordance with an embodiment of the present application. Referring to FIGS. 20M and 20N, one of the interconnection metal layers 77 may include two metal planes 77*c* and 77*d* used as a power plane and ground plane of a power supply, respectively, wherein the metal planes 77*c* and 77*d* may have a thickness, for example, between 5 μm and 50 μm, 5 μm and 30 μm, 5 μm and 20 μm or 5 μm and 15 μm, or thicker than or equal to 5 μm, 10 μm, 20 μm or 30 μm. Each of the metal planes 77*c* and 77*d* may be layout as an interlaced or interleaved shaped structure or fork-shaped structure, that is, each of the metal planes 77*c* and 77*d* may have multiple parallel-extension sections and a transverse connection section coupling the parallel-extension sections. One of the metal planes 77*c* and 77*d* may have one of the parallel-extension sections arranged between neighboring two of the parallel-extension sections of the other of the metal planes 77*c* and 77*d*. Alternatively, one of the interconnection metal layers 77 may include a metal plane, used as a heat dissipater or spreader for heat dissipation or spreading, having a thickness, for example, between 5 μm and 50 μm, 5 μm and 30 jam, 5 μm and 20 μm or 5 μm and 15 μm, or thicker than or equal to 5 μm, 10 μm, 20 μm or 30 μm.

Next, an emboss process as illustrated in FIGS. 19C-19F is performed on the BISD 79 to form the through-package vias (TPV), as seen in FIGS. 20O-20R. FIGS. 20O-20R are schematically cross-sectional views showing a process for forming multiple through-package vias (TPV) on the BISD in accordance with an embodiment of the present application. Referring to FIG. 20O, an adhesion layer 140*a* having a thickness between 0.001 and 0.7 μm or between 0.01 and 0.5 μm or between 0.03 and 0.35 μm may be sputtered on the topmost one of the polymer layers 87 and on the topmost one of the interconnection metal layers 77 at bottoms of the openings 87*a* in the topmost one of the polymer layers 87. The material of the adhesion layer 140*a* may include titanium, a titanium-tungsten alloy, titanium nitride, chromium, titanium-tungsten-alloy layer, tantalum nitride, or a composite of the abovementioned materials. The adhesion layer may be formed by an atomic-layer-deposition (ALD) process, chemical vapor deposition (CVD) process or evaporation process. For example, the adhesion layer 140*a* may be formed by sputtering or CVD depositing a titanium (Ti) or titanium nitride (TiN) layer (with a thickness, for example, between 1 nm and 200 nm or between 5 nm and 50 nm) on the topmost one of the polymer layers 87 and on the topmost one of the interconnection metal layers 77 at bottoms of the openings 87*a* in the topmost one of the polymer layers 87.

Next, referring to FIG. 20O, an electroplating seed layer 140*b* having a thickness of between 0.001 and 1 μm, between 0.03 and 2 μm or between 0.05 and 0.5 μm may be sputtered on a whole top surface of the adhesion layer 140*a*. Alternatively, the electroplating seed layer 140*b* may be formed by an atomic-layer-deposition (ALD) process, chemical-vapor-deposition (CVD) process, vapor deposition method, electroless plating method or PVD (Physical Vapor Deposition) method. The electroplating seed layer 140*b* is beneficial to electroplating a metal layer thereon. Thus, the material of the electroplating seed layer 140*b* varies with the material of a metal layer to be electroplated on the electroplating seed layer 140*b*. When a copper layer is to be electroplated on the electroplating seed layer 140*b*, copper is a preferable material to the electroplating seed layer 140*b*. For example, the electroplating seed layer 140*b* may be deposited on or over the adhesion layer 140*a* by, for example, sputtering or CVD depositing a copper seed layer (with a thickness between, for example, 3 nm and 400 nm or 10 nm and 200 nm) on the adhesion layer 140*a*. The adhesion layer 140*a* and electroplating seed layer 140*b* compose the adhesion/seed layer 140.

Next, referring to 24P, a photoresist layer 142, such as positive-type photoresist layer, having a thickness of between 5 and 500 μm is spin-on coated or laminated on the electroplating seed layer 140*b* of the adhesion/seed layer 140. The photoresist layer 142 is patterned with the processes of exposure, development, etc., to form multiple openings 142*a* in the photoresist layer 142 exposing the electroplating seed layer 140*b* of the adhesion/seed layer 140. A 1× stepper, 1× contact aligner or laser scanner may be used to expose the photoresist layer 142 with at least two of G-line having a wavelength ranging from 434 to 438 nm, H-line having a wavelength ranging from 403 to 407 nm, and I-line having a wavelength ranging from 363 to 367 nm, illuminating the photoresist layer 142, that is, G-line and H-line, G-line and I-line, H-line and I-line, or G-line, H-line and I-line illuminate the photoresist layer 142, then developing the exposed photoresist layer 142, and then removing the residual polymeric material or other contaminants on the electroplating seed layer 140*b* of the adhesion/seed layer 140 with an $O_2$ plasma or a plasma containing fluorine of below 200 PPM and oxygen, such that the photoresist layer 142 may be patterned with multiple openings 142*a* in the photoresist layer 142 exposing the electroplating seed layer 140*b* of the adhesion/seed layer 140. Each of the opening 142*a* in the photoresist layer 142 may overlap one of the openings 87*a* in the topmost one of the polymer layers 87 and extend out of said one of the openings 87*a* in the topmost one of the polymer layers 87 to an area or a ring of the topmost one of the polymer layers 87 around said one of the openings 87*a* in the topmost one of the polymer layers 87, wherein the ring of the topmost one of the polymer layers 87 may have a width between 1 μm and 15 μm, 1 μm and 10 μm or 1 μm and 5 μm.

Referring to FIG. 20P, the openings 142*a* are positioned at the places where multiple gaps between the semiconductor chips 100 to be mounted onto the topmost one of the polymer layers 87 of the BISD 79 in the following processes are to be arranged and at the places where peripheral areas of the logic drives 300 to be completed in the following processes are to be arranged, wherein each of the peripheral areas surrounds the semiconductor chips 100 to be mounted in a central area of one of the logic drives 300.

Referring to FIG. 20Q, a copper layer 144 having a thickness between 5 μm and 300 μm, 5 μm and 200 μm, 5 μm and 150 μm, 5 μm and 120 μm, 10 μm and 100 μm, 10 μm and 60 μm, 10 μm and 40 μm or 10 μm and 30 μm is electroplated on the electroplating seed layer 140*b* of the adhesion/seed layer 140 exposed by the openings 142*a*.

Referring to FIG. 20R, after the copper layer 144 is formed, most of the photoresist layer 142 may be removed and then the electroplating seed layer 140*b* and adhesion layer 140*a* not under the metal layer 144 may be etched. The removing and etching processes may be referred respectively to the processes for removing the photoresist layer 30 and etching the electroplating seed layer 28 and adhesion layer 26 as illustrated in FIG. 15F. Thereby, the adhesion/seed layer 140 and electroplated metal layer 144 may be patterned to form multiple TPVs 158 on the topmost one of the interconnection metal layers 77 and on the topmost one of the polymer layers 87 around the openings 87*a* in the topmost one of the polymer layers 87.

Figure 21A:
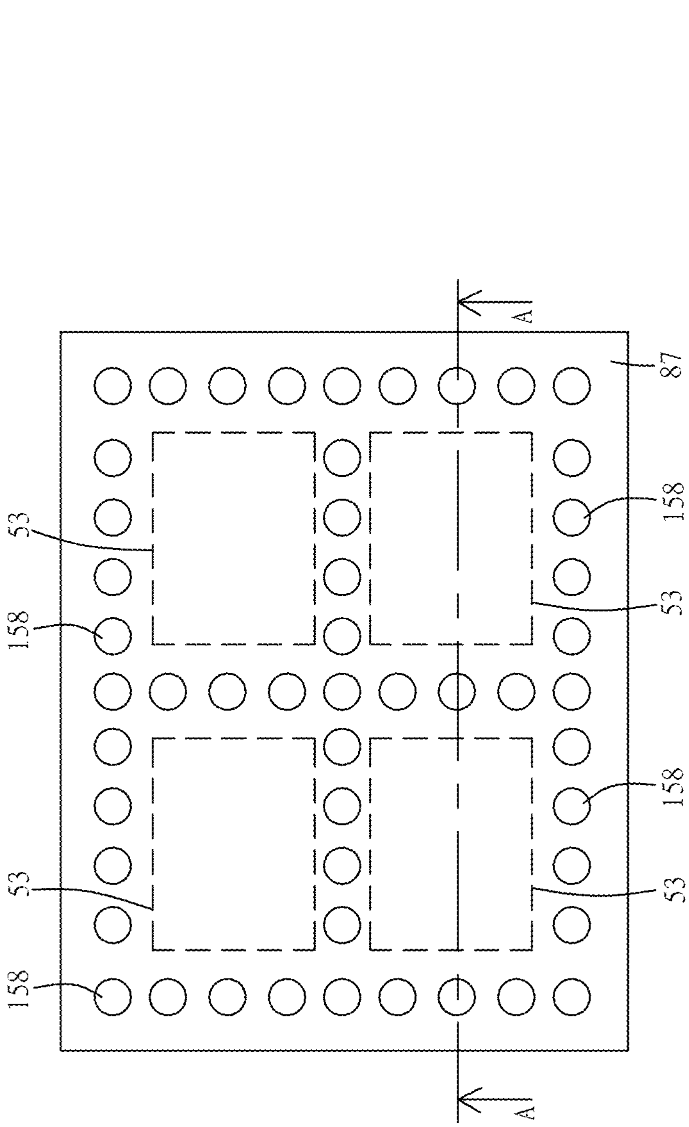
FIG. 21A is a top view of TPVs in accordance with an embodiment of the present application.

FIG. 21A is a top view of TPVs in accordance with an embodiment of the present application. The areas 53 surrounded by dot lines may have the semiconductor chips 100 to be mounted thereto. Referring to FIG. 21A, the TPVs 158 are positioned at the places where multiple gaps between the semiconductor chips 100 to be mounted onto the topmost one of the polymer layers 87 of the BISD 79 in the following processes are to be arranged and at the places where peripheral areas of the logic drives 300 to be completed in the following processes are to be arranged, wherein each of the peripheral areas surrounds the semiconductor chips 100 to be mounted in a central area of one of the logic drives 300.

Referring to FIG. 20R, each of the TPVs 158 may have a height, protruding from a top surface of the topmost one of the polymer layers 87 of BISD 79, between 5 μm and 300 μm, 5 μm and 200 μm, 5 μm and 150 μm, 5 μm and 120 μm, 10 μm and 100 μm, 10 μm and 60 μm, 10 μm and 40 μm or 10 μm and 30 μm, or greater or taller than or equal to 50 μm, 30 μm, 20 μm, 15 μm or 5 μm and a largest dimension in its cross-section (for example, its diameter of a circle shape or its diagonal length of a square or rectangle shape) between, for example, 5 μm and 300 μm, 5 μm and 200 μm, 5 μm and 150 μm, 5 μm and 120 μm, 10 μm and 100 μm, 10 μm and 60 μm, 10 μm and 40 μm or 10 μm and 30 μm, or greater than or equal to 150 μm, 100 μm, 60 μm, 50 μm, 40 μm, 30 μm, 20 μm, 15 μm or 10 μm. The smallest space between neighboring two of the TPVs 158 may be between, for example, 5 μm and 300 μm, 5 μm and 200 μm, 5 μm and 150 μm, 5 μm and 120 μm, 10 μm and 100 μm, 10 μm and 60 μm, 10 μm and 40 μm or 10 μm and 30 μm, or greater than or equal to 150 μm, 100 μm, 60 μm, 50 μm, 40 μm, 30 μm, 20 μm, 15 μm or 10 μm.

Next, the following steps for FOIT as seen in FIGS. 20S-20V may be referred to the steps for FOIT as illustrated in FIGS. 18A-18R. For an element indicated by the same reference number shown in FIGS. 18A-18R and 20S-20V, the specification of the element as seen in FIGS. 20S-20V and the process for forming the same may be referred to that of the element as illustrated in FIGS. 18A-18R and the process for forming the same.

Referring to FIG. 20S, the glue material 88 is formed on multiple regions of the topmost one of the polymer layers 87. Next, the semiconductor chips 100 as illustrated in FIGS. 15G, 15H, 16I-16L and 17 have backsides attached onto the glue material 88 to join the topmost one of the polymer layers 87.

Referring to FIG. 20T, the polymer layer 92 having a thickness t7 of between 250 and 1,000 μm is applied (by coating, printing, dispensing or molding) on or over the topmost one of the polymer layers 87 and on or over the semiconductor chips 100 to a level to: (i) fill gaps between the semiconductor chips 100, (ii) cover the top surfaces of the semiconductor chips 100, (iii) fill gaps between the micro-pillars or micro-bumps 34 of the semiconductor chips 100, (iv) cover top surfaces of the micro-pillars or micro-bumps 34 of the semiconductor chips 100, (v) fill gaps between the TPVs 158 and (vi) cover the TPVs 158.

Referring to FIG. 20U, the polymer layer 92 is polished from a front side thereof to uncover a front side of each of the micro-pillars or micro-bumps 34 and a front side of each of the TPVs 158, and to planarize the front side of the polymer layer 92, for example by a mechanical polishing process. Alternatively, the polymer layer 92 may be polished by a chemical mechanical polishing (CMP) process. When the polymer layer 92 is being polished, the micro-pillars or micro-bumps 34 each may have a front portion allowed to be removed and the polymer layer 92, after polished, may have a thickness t8 between 250 and 800 microns.

Next, referring to FIG. 20V, the TISD 101 as illustrated in FIGS. 18D-18N may be formed on or over the front side of the polymer layer 92 and on or over the front sides of the micro-pillars or micro-bumps 34 and TPVs 158 by a wafer or panel processing. Thereby, the interconnection metal layers 99 and the polymer layers 93 and 104 may be alternately formed over the front side of the polymer layer 92 and on or over the front sides of the micro-pillars or micro-bumps 34 and TPVs 158. Each of the interconnection metal layers 99 contains the adhesion layer, referenced as 94*a* herein, and the seed layer, referenced as 94*b* herein, composing the adhesion/seed layer 94. Each of the interconnection metal layers 99 contains the metal layer 98 on the adhesion/seed layer 94. Next, the metal pillars or bumps 122 as illustrated in FIGS. 18O-18R may be formed on the topmost one of the interconnection metal layers 99 of the TISD 101 at bottoms of the openings 104*a* of the topmost one of the polymer layer 104.

Next, referring to FIG. 20W, the carrier substrate 90, the base insulating layer 91 and a bottom portion of the polymer layer 97 may be removed, by a polishing, grinding or chemical mechanical polishing (CMP) process, from the structure as seen in FIG. 20V to uncover the metal vias 77*a* of the bottommost one of the interconnection metal layers 77 of the BISD 79 in the openings 97*a* in the bottommost one of the polymer layers 87 and 97 of the BISD 79 such that the metal vias 77*a* of the bottommost one of the interconnection metal layers 77 of the BISD 79 have copper exposed at the backside 77*e* thereof. Alternatively, after polishing the polymer layer 92 as seen in FIG. 20U and before forming the polymer layer 93 of the TISD 101, the carrier substrate 90, the base insulating layer 91 and the bottom portion of the polymer layer 97 may be removed, by a polishing, grinding or chemical mechanical polishing (CMP) process to uncover the metal vias 77*a* of the bottommost one of the interconnection metal layers 77 of the BISD 79 in the openings 97*a* in the bottommost one of the polymer layers 87 and 97 of the BISD 79 such that the metal vias 77*a* of the bottommost one of the interconnection metal layers 77 of the BISD 79 have copper exposed at the backside 77*e* thereof to be layout as metal pads in an array.

After the carrier substrate 90, the base insulating layer 91 and the bottom portion of the polymer layer 97 are removed as shown in FIG. 20W, the package structure shown in FIG. 20W may be separated, cut or diced into multiple individual chip packages, i.e., single-layer-packaged logic drives 300, as shown in FIG. 20X by a laser cutting process or by a mechanical cutting process.

Figure 20Y:
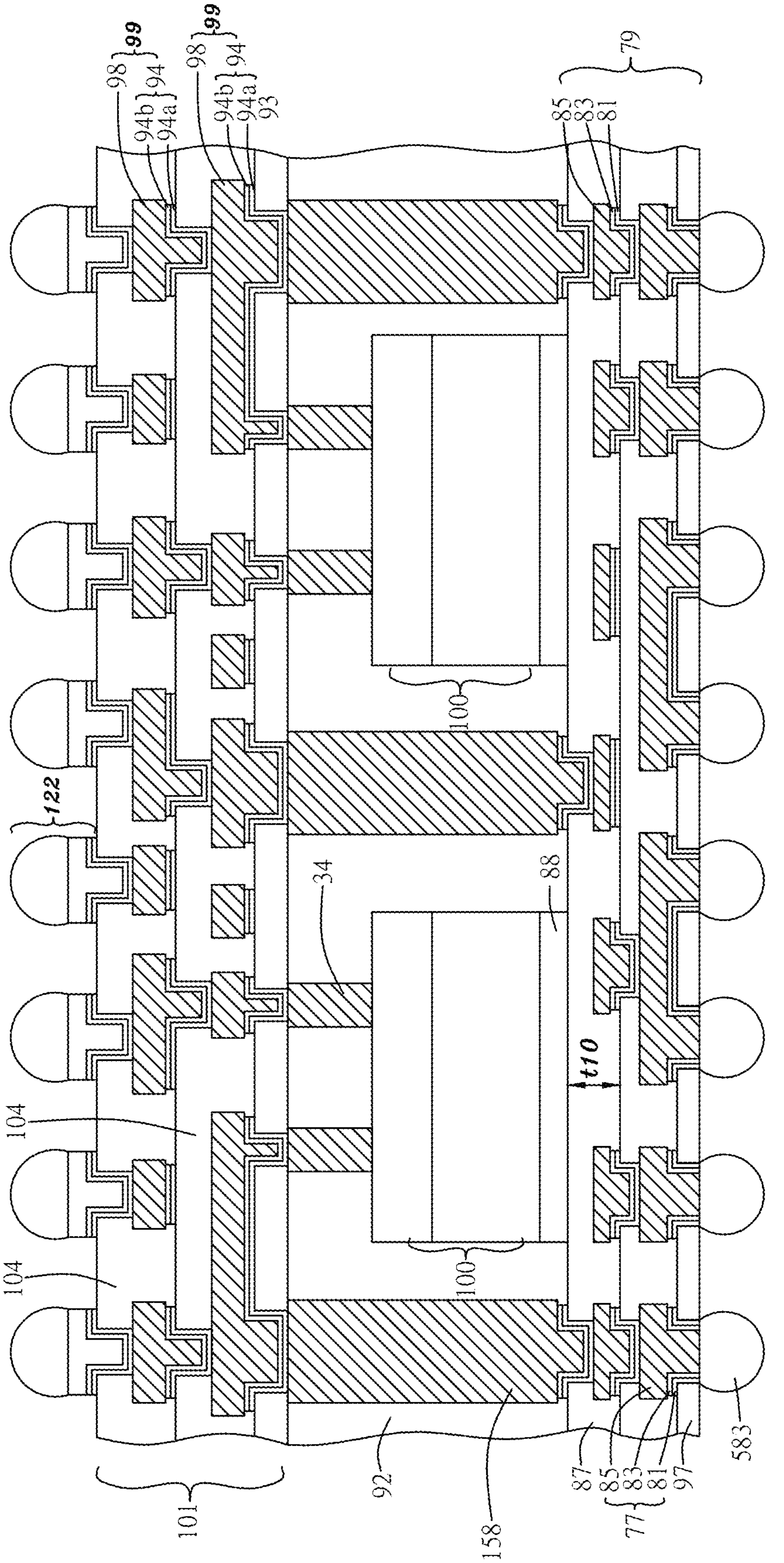

Alternatively, following the step as illustrated in FIG. 20W, multiple solder bumps 583 may be formed on the contact pads 77*e* of the BISD 79 of the package structure as shown in FIG. 20W by a screen printing method or a solder-ball mounting method, and then by a solder reflow process as seen in FIG. 20Y. The material used for forming the solder bumps 583 may be a lead-free solder containing tin, copper, silver, bismuth, indium, zinc, antimony, and/or traces of other metals, for example, Sn—Ag—Cu (SAC) solder, Sn—Ag solder, or Sn—Ag—Cu—Zn solder. One of the solder bumps 583 may be used for connecting or coupling one of the semiconductor chips 100, such as the dedicated I/O chip 265 as seen in FIGS. 11A-11N, of the logic drive 300 to the external circuits or components outside of the logic drive 300 through one of the micro-bumps 54, the interconnection metal layers 99 of the TISD 101, one of the TPVs 582 and the interconnection metal layers 77 of the BISD 79 in sequence. Each of the solder bumps 583 may have a height, from a backside surface of the BISD 79, between 5 μm and 150 μm, between 5 μm and 120 μm, between 10 μm and 100 μm, between 10 μm and 60 μm, between 10 μm and 40 μm or between 10 μm and 30 μm, or greater or taller than or equal to 75 μm, 50 μm, 30 μm, 20 μm, 15 μm or 10 μm, for example, and a largest dimension in cross-sections, such as a diameter of a circle shape or a diagonal length of a square or rectangle shape, between 5 μm and 200 μm, between 5 μm and 150 μm, between 5 μm and 120 μm, between 10 μm and 100 μm, between 10 μm and 60 μm, between 10 μm and 40 μm, or between 10 μm and 30 μm, or greater than or equal to 100 μm, 60 μm, 50 μm, 40 μm, 30 μm, 20 μm, 15 μm or 10 μm, for example. The smallest space from one of the solder bumps 583 to its nearest neighboring one of the solder bumps 583 is, for example, between 5 μm and 150 μm, between 5 μm and 120 μm, between 10 μm and 100 μm, between 10 μm and 60 μm, between 10 μm and 40 μm, or between 10 μm and 30 μm, or greater than or equal to 60 μm, 50 μm, 40 μm, 30 μm, 20 μm, 15 μm or 10 μm.

Figure 20Z:
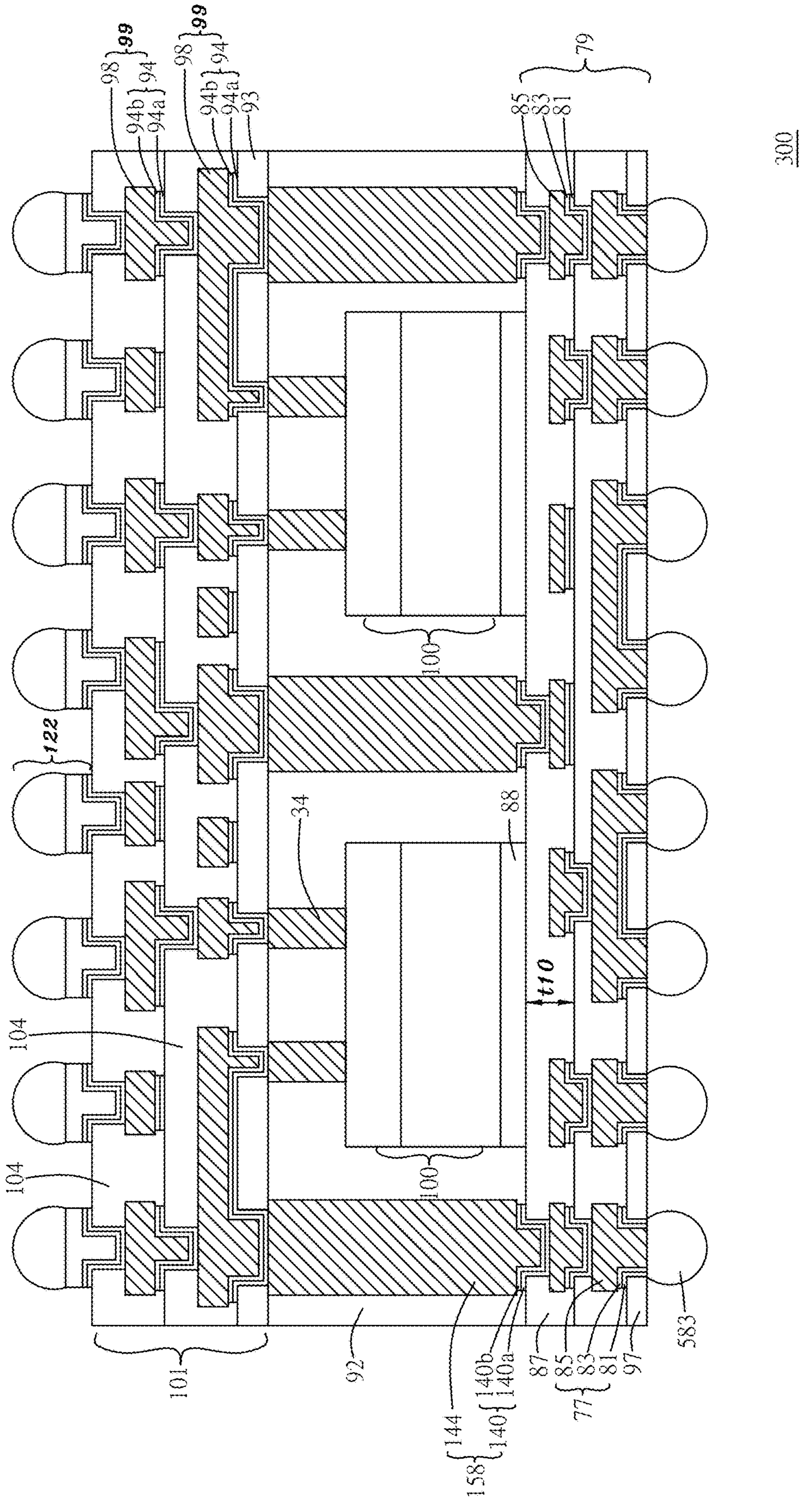

Next, the package structure shown in FIG. 20Y may be separated, cut or diced into multiple individual chip packages, i.e., single-layer-packaged logic drives 300, as shown in FIG. 20Z by a laser cutting process or by a mechanical cutting process.

Programing for TPVs, Metal Pads and Metal Pillars or Bumps

Referring to FIGS. 20X and 19L, one of the TPVs 158 may be programmed by one or more of the memory cells 379 in one or more of the DPIIC chips 410, wherein said one or more of the memory cells 379 may switch on or off one or more of the cross-point switches 379 distributed in said one or more of the DPIIC chips 410 as seen in FIGS. 3A-3C and 9 to form a signal path from said one of the TPVs 158 to any of the standard commodity FPGA IC chips 200, dedicated I/O chips 265, DRAM chips 321, PCIC chips 269, dedicated control chip 260, dedicated control and I/O chip 266, DCIAC chip 267 or DCDI/OIAC chip 268 in the logic drive 300 as seen in FIGS. 11A-11N through one or more of the programmable interconnects 361 of the inter-chip interconnects 371 provided by the TISD 101 and/or BISD 79. Thereby, the TPVs 158 may be programmable.

Furthermore, referring to FIGS. 20X and 19L, one of the metal bumps or pillars 122 may be programmed by one or more of the memory cells 379 in one or more of the DPIIC chips 410, wherein said one or more of the memory cells 379 may switch on or off one or more of the cross-point switches 379 distributed in said one or more of the DPIIC chips 410 as seen in FIGS. 8A-8C and 9 to form a signal path from said one of the metal bumps or pillars 122 to any of the standard commodity FPGA IC chips 200, dedicated I/O chips 265, DRAM chips 321, PCIC chips 269, dedicated control chip 260, dedicated control and I/O chip 266, DCIAC chip 267 or DCDI/OIAC chip 268 in the logic drive 300 as seen in FIGS. 11A-11N through one or more of the programmable interconnects 361 of the inter-chip interconnects 371 provided by the TISD 101 and/or BISD 79. Thereby, the metal bumps or pillars 122 may be programmable.

Furthermore, referring to FIG. 20X, one of the metal pads 77*e* may be programmed by one or more of the memory cells 379 in one or more of the DPIIC chips 410, wherein said one or more of the memory cells 379 may switch on or off one or more of the cross-point switches 379 distributed in said one or more of the DPIIC chips 410 as seen in FIGS. 8A-8C and 9 to form a signal path from said one of the metal pads 77*e* to any of the standard commodity FPGA IC chips 200, dedicated I/O chips 265, DRAM chips 321, PCIC chips 269, dedicated control chip 260, dedicated control and I/O chip 266, DCIAC chip 267 or DCDI/OIAC chip 268 in the logic drive 300 as seen in FIGS. 11A-11N through one or more of the programmable interconnects 361 of the inter-chip interconnects 371 provided by the TISD 101 and/or BISD 79. Thereby, the metal pads 77*e* may be programmable.

Interconnection for Logic Drive with TISD and BISD

FIGS. 21B through 21G are cross-sectional views showing various interconnection nets in a single-layer-packaged logic drive in accordance with embodiments of the present application.

Figure 21B:
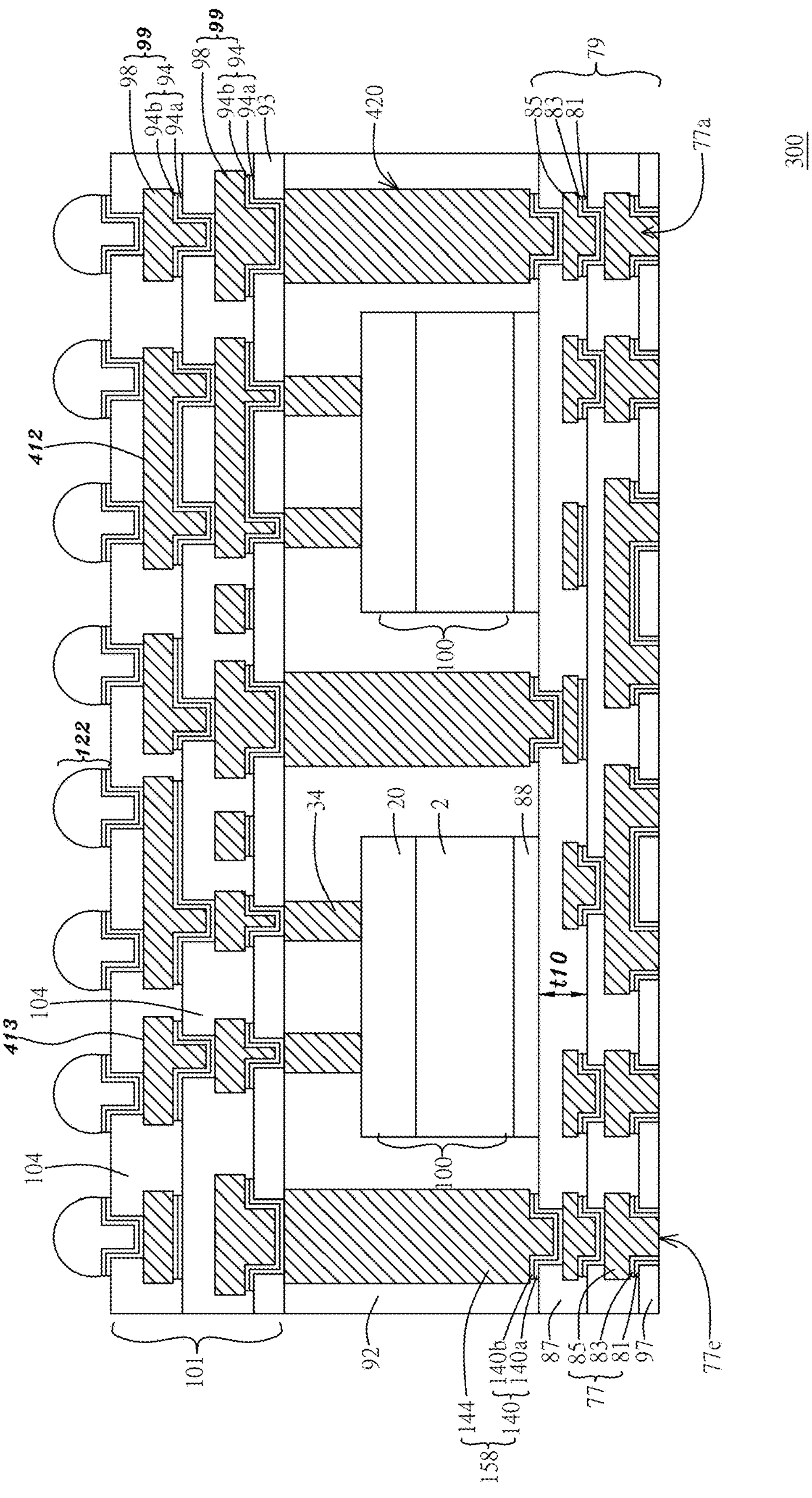
FIGS. 21B-21G are cross-sectional views showing various interconnection nets in a single-layer-packaged logic drive in accordance with embodiments of the present application.
Figure 21C:
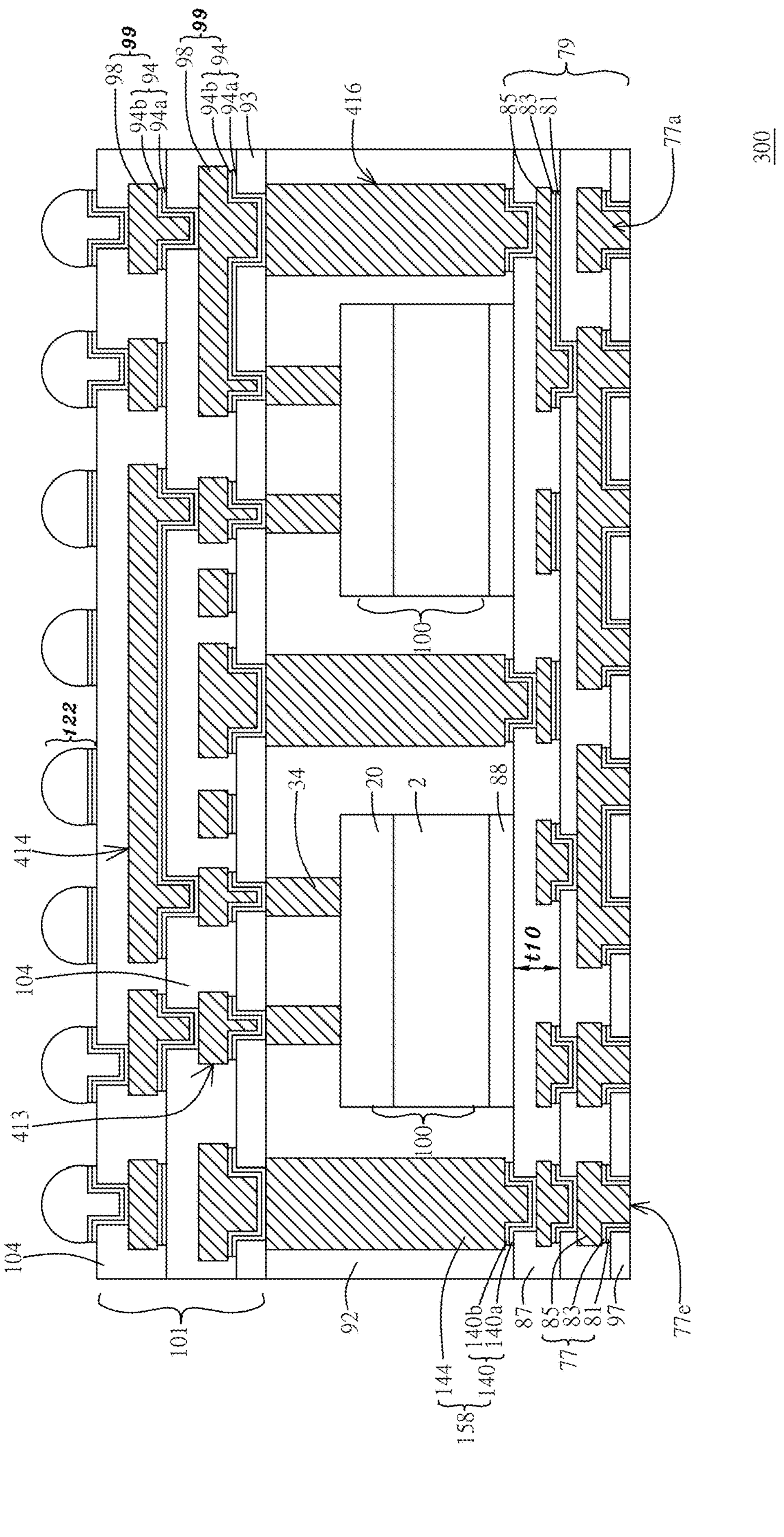
Figure 21D:
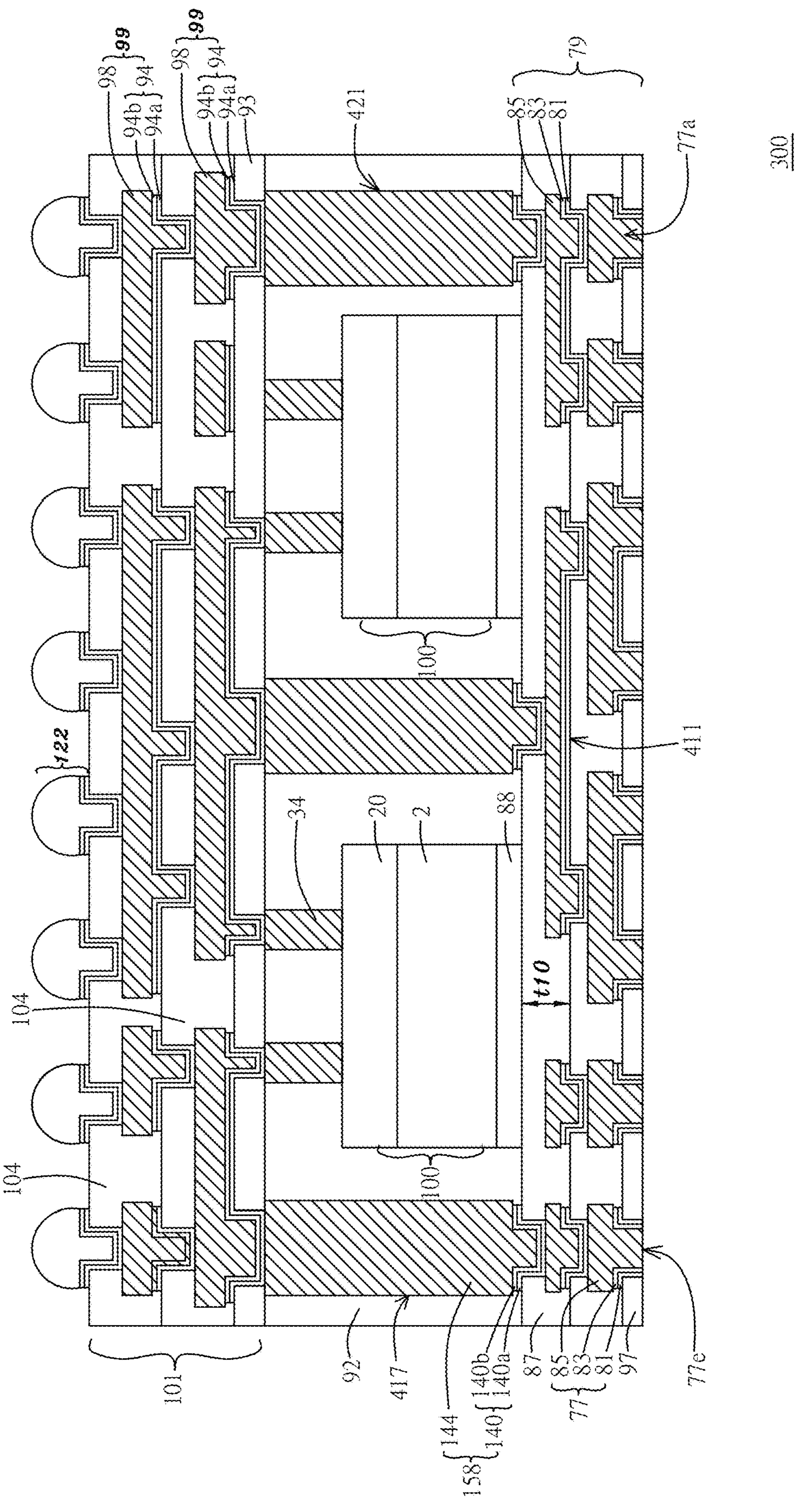

Referring to FIG. 21D, the interconnection metal layers 99 of the TISD 101 may connect one or more of the metal pillars or bumps 122 to one of the semiconductor chips 100 and connect one of the semiconductor chips 100 to another of the semiconductor chips 100. For a first case, the interconnection metal layers 99 and 77 of the TISD 101 and BISD 79 and the TPVs 158 may compose a first interconnection net 411 connecting multiple of the metal pillars or bumps 122 to each other or one another, connecting multiple of the semiconductor chips 100 to each other or one another and connecting multiple of the metal pads 77*e* to each other or one another. Said multiple of the metal pillars or bumps 122, said multiple of the semiconductor chips 100 and said multiple of the metal pads 77*e* may be connected together by the first interconnection net 411. The first interconnection net 411 may be a signal bus for delivering signals or a power or ground plane or bus for delivering power or ground supply.

Referring to FIG. 21B, for a second case, the interconnection metal layers 99 of the TISD 101 may compose a second interconnection net 412 connecting multiple of the metal pillars or bumps 122 to each other or one another and connecting multiple of the micro pillars or bumps 34 of one of the semiconductor chips 100 to each other or one another. Said multiple of the metal pillars or bumps 122 and said multiple of the micro pillars or bumps 34 may be connected together by the second interconnection net 412. The second interconnection net 412 may be a signal bus for delivering signals or a power or ground plane or bus for delivering power or ground supply.

Referring to FIGS. 21B and 21C, for a third case, the interconnection metal layers 99 of the TISD 101 may compose a third interconnection net 413 connecting one of the metal pillars or bumps 122 to one of the micro pillars or bumps 34 of one of the semiconductor chips 100. The third interconnection net 413 may be a signal bus for delivering signals or trace for signal transmission or a power or ground plane or bus for delivering power or ground supply.

Referring to FIG. 21C, for a fourth case, the interconnection metal layers 99 of the TISD 101 may compose a fourth interconnection net 414 not connecting to any of the metal pillars or bumps 122 of the single-layer-packaged logic drive 300 but connecting multiple of the semiconductor chips 100 to each other or one another. The fourth interconnection net 414 may be one of the programmable interconnects 361 of the inter-chip interconnects 371 for signal transmission.

Figure 21E:
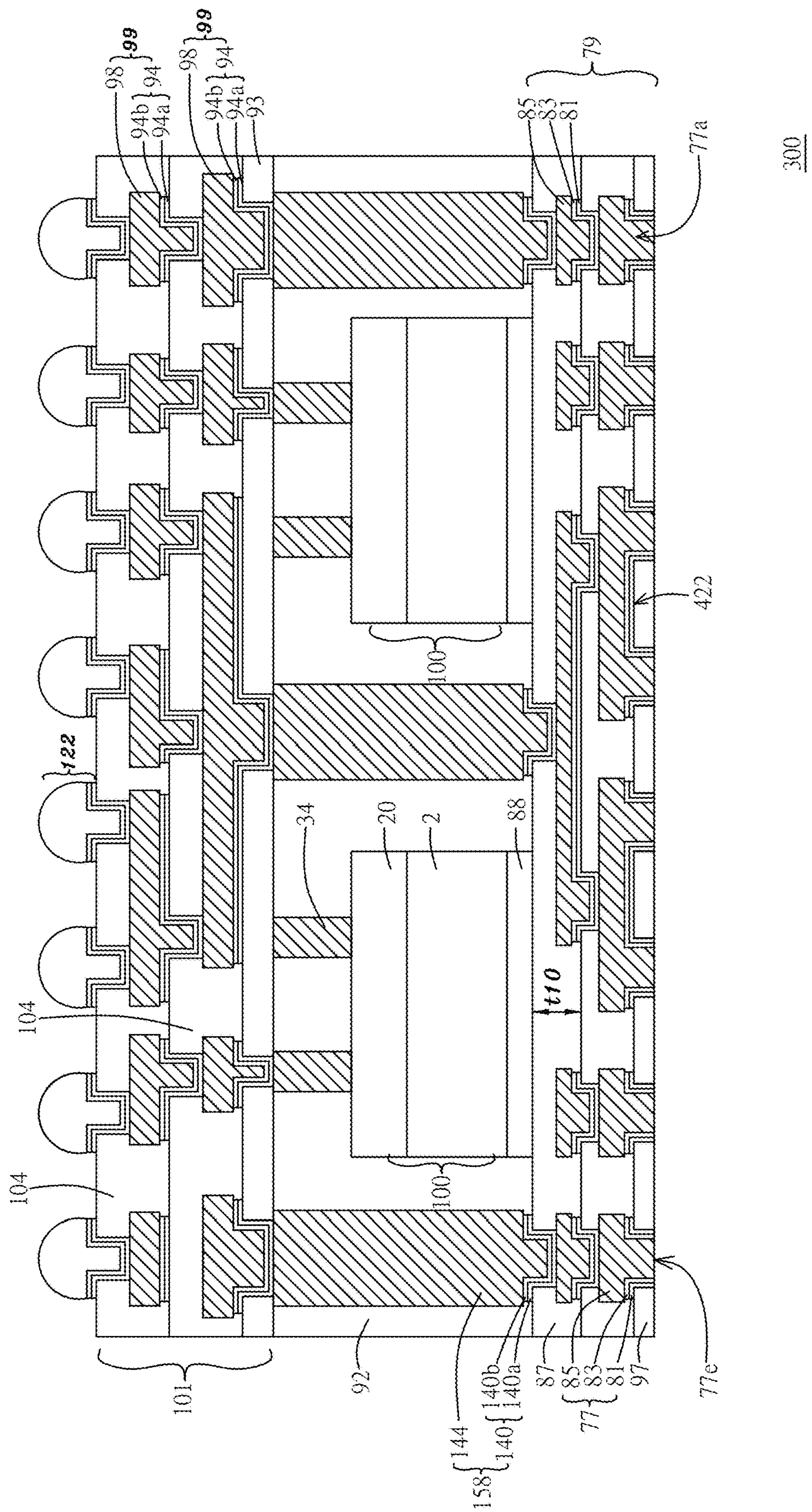
Figure 21F:
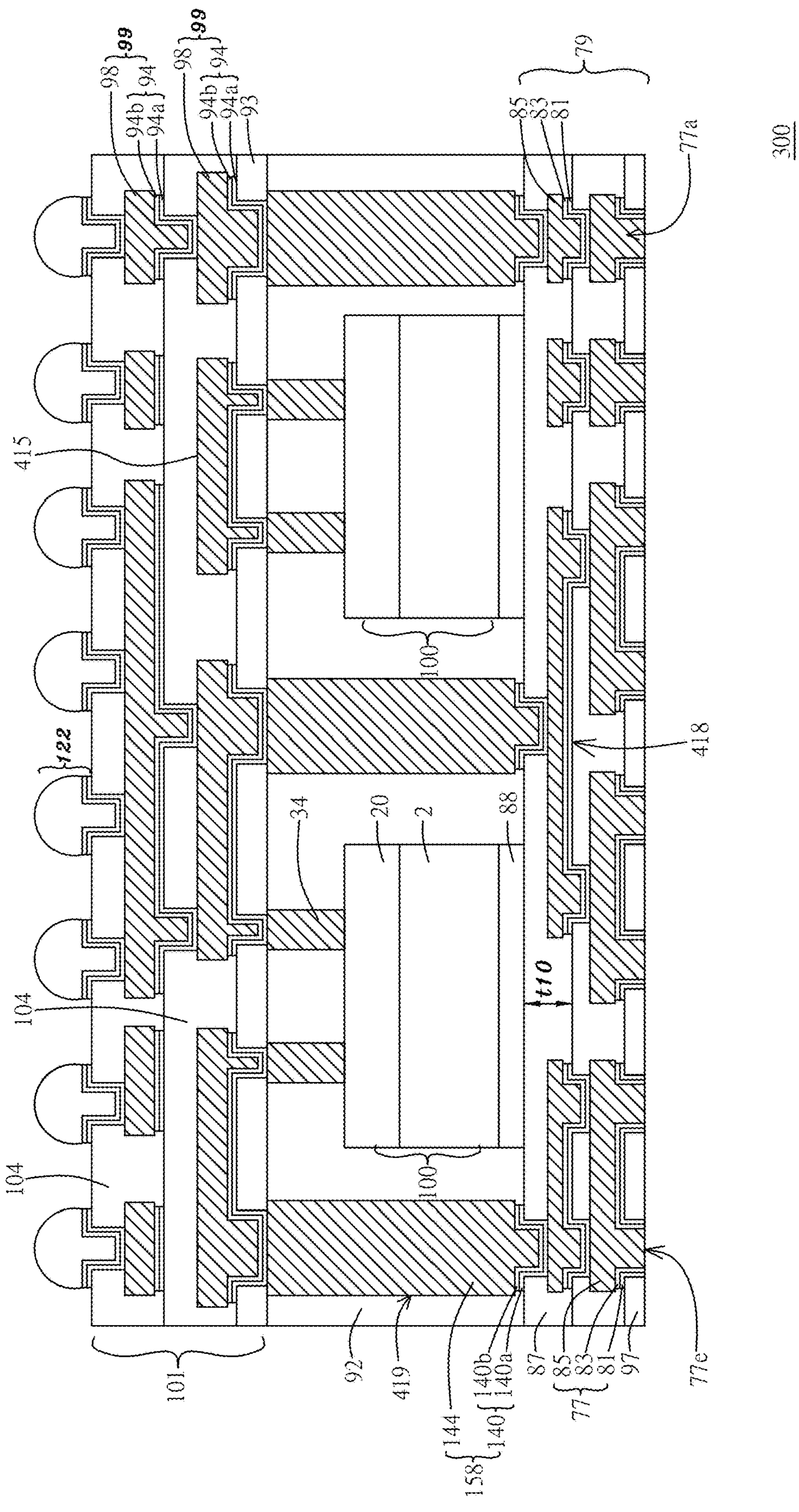

Referring to FIG. 21F, for a fifth case, the interconnection metal layers 99 of the TISD 101 may compose a fifth interconnection net 415 not connecting to any of the metal pillars or bumps 122 of the single-layer-packaged logic drive 300 but connecting multiple of the micro pillars or bumps 34 of one of the semiconductor devices 4 to each other or one another. The fifth interconnection net 415 may be a signal bus or trace for signal transmission or a power or ground plane or bus for delivering power or ground supply.

Referring to FIGS. 21C, 21D and 21F, the interconnection metal layers 77 of the BISD 79 may be connected to the interconnection metal layers 99 of the TISD 101 through the TPVs 158. For example, each of the metal pads **77*e* of the BISD 79 in a first group may be connected to one of the semiconductor chips 100 through, in sequence, the interconnection metal layers 77 of the BISD 79, one or more of the TPVs 158 and the interconnection metal layers 99 of the TISD 101, as provided by a sixth interconnection net 416 in FIG. 21C, the first interconnection net 411 and a seventh interconnection nets 417 in FIG. 21D and eighth and ninth interconnection nets 418 and 419 in FIG. 21F. Furthermore, one of the metal pads 77*e* in the first group may be further connected to one or more of the metal pillars or bumps 122 through, in sequence, the interconnection metal layers 77 of the BISD 79, one or more of the TPVs 158 and the interconnection metal layers 99 of the TISD 101, as provided by the first, sixth, seventh and eighth interconnection nets 411, 416, 417 and 418. Alternatively, multiple of the metal pads 77*e* in the first group may be connected to each other or one another through the interconnection metal layers 77 of the BISD 79 and to one or more of the metal pillars or bumps 122 through, in sequence, the interconnection metal layers 77 of the BISD 79, one or more of the TPVs 158 and the interconnection metal layers 99 of the TISD 101, wherein said multiple of the metal pads 77*e* in the first group may be divided into a first subset of one or ones under a backside of one of the semiconductor chips 100 and a second subset of one or ones under a backside of another of the semiconductor chips 100, as provided by the first and eighth interconnection nets 411 and 418. Alternatively, one or multiple of the metal pads 77*e* in the first group may not be connected to any of the metal pillars or bumps 122 of the single-layer-packaged logic drive 300, as provided by the ninth interconnection net 419**.

Referring to FIGS. 21B, 21D and 21E, each of the metal pads **77*e* of the BISD 79 in a second group may not be connected to any of the semiconductor chips 100 of the single-layer-packaged logic drive 300 but connected to one or more of the metal pillars or bumps 122 through, in sequence, the interconnection metal layers 77 of the BISD 79, one or more of the TPVs 158 and the interconnection metal layers 99 of the TISD 101, as provided by a tenth interconnection net 420 in FIG. 21B, an eleventh interconnection net 421 in FIG. 21D and a twelfth interconnection net 422 in FIG. 21E. Alternatively, multiple of the metal pads 77*e* of the BISD 79 in the second group may not be connected to any of the semiconductor chips 100 of the single-layer-packaged logic drive 300 but connected to each other or one another through the interconnection metal layers 77 of the BISD 79 and to one or more of the metal pillars or bumps 122 through, in sequence, the interconnection metal layers 77 of the BISD 79, one or more of the TPVs 158 and the interconnection metal layers 99 of the TISD 101, wherein said multiple of the metal pads 77*e* in the second group may be divided into a first subset of one or ones under a backside of one of the semiconductor chips 100 and a second subset of one or ones under a backside of another of the semiconductor chips 100, as provided by the twelfth interconnection net 422 in FIG. 21**E.

Figure 21G:
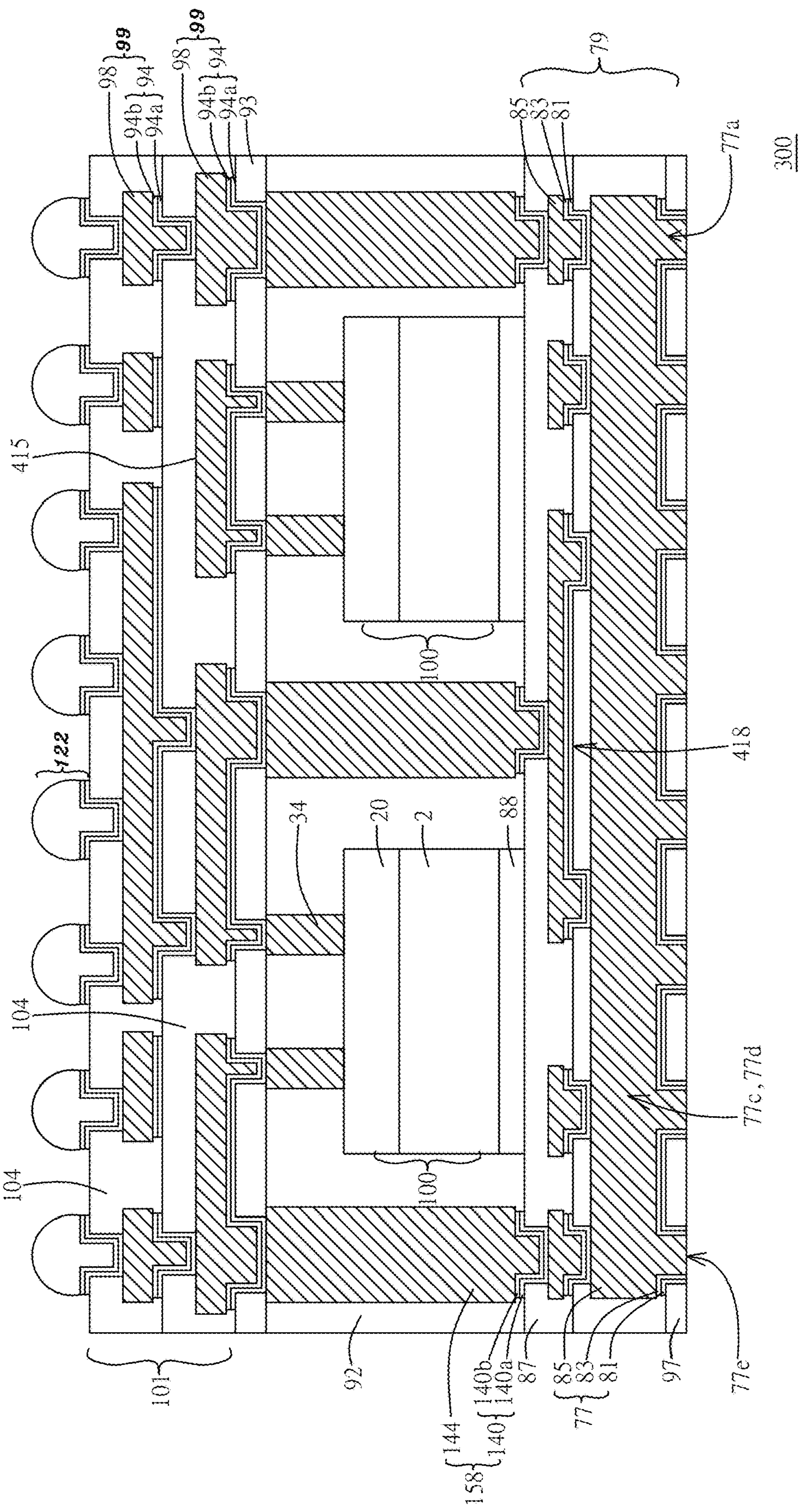
Figure 21H:
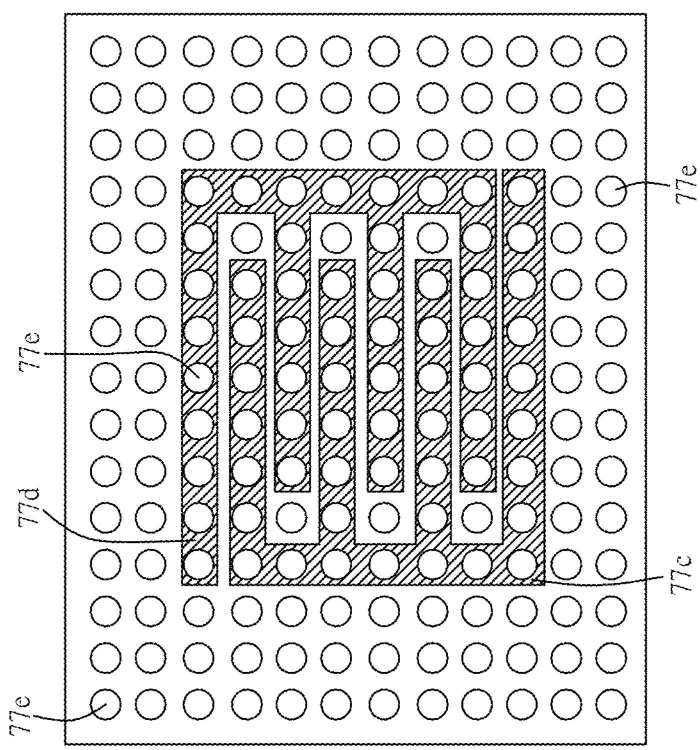
FIG. 21H is a bottom view of FIG. 25G, showing a layout of metal pads of a logic drive in accordance with an embodiment of the present application.

Referring to FIG. 21G, one of the interconnection metal layers 77 in the BISD 79 may include the power plane **77*c* and ground plane 77*d* of a power supply, as illustrated in FIG. 20N. FIG. 21H is a bottom view of FIG. 21G, showing a layout of metal pads of a logic drive in accordance with an embodiment of the present application. Referring to FIG. 21H, the metal pads 77*e* may be layout in an array at a backside of the logic drive 300. Some of the metal pads 77*e* may be vertically aligned with the semiconductor chips 100. A first group of the metal pads 77*e* is arranged in an array in a central region of a backside surface of the chip package, i.e., logic drive 300, and a second group of the metal pads 77*e* may be arranged in an array in a peripheral region, surrounding the central region, of the backside surface of the chip package, i.e., logic drive 300. More than 90% or 80% of the metal pads 77*e* in the first group may be used for power supply or ground reference. More than 50% or 60% of the metal pads 77*e* in the second group may be used for signal transmission. The metal pads 77*e* in the second group may be arranged from one or more rings, such as 1 2, 3, 4, 5 or 6 rings, along the edges of the backside surface of the chip package, i.e., logic drive 300. The minimum pitch of the metal pads 77*e* in the second group may be smaller than that of the metal pads 77*e*** in the first group.

Alternatively, referring to FIG. 21G, one of the interconnection metal layers 77 of the BISD 79, such as the bottommost one, may include a thermal plane for heat dispassion and one or more of the TPVs 158 may be provided as thermal vias formed over the thermal plane for heat dispassion.

Package-on-Package (POP) Assembly for Drives with TISD and BISD

Figure 22A:
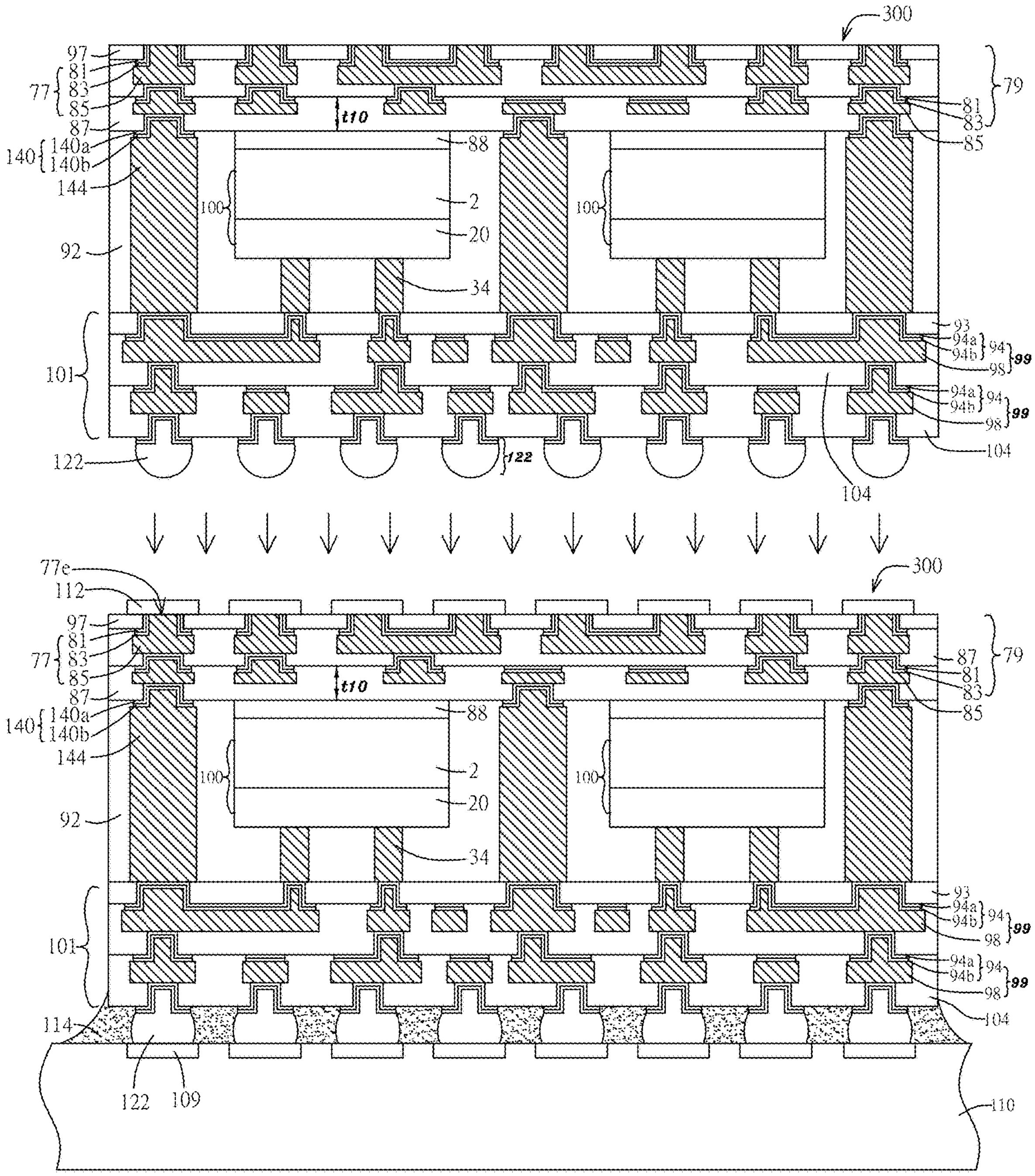
FIGS. 22A-22I are schematically views showing a process for fabricating a package-on-package assembly in accordance with an embodiment of the present application.

FIGS. 22A-22F are schematically views showing a process for fabricating a package-on-package assembly in accordance with an embodiment of the present application. Referring to FIG. 22A, when a top one of the single-layer-packaged logic drives 300 as seen in FIG. 20X is mounted onto a bottom one of the single-layer-packaged logic drives 300 as seen in FIG. 20X, the bottom one of the single-layer-packaged logic drives 300 may have its BISD 79 to couple the TISD 101 of the top one of the single-layer-packaged logic drives 300 via the metal pillars or bumps 122 provided from the top one of the single-layer-packaged logic drives 300. The process for fabricating a package-on-package assembly is mentioned as below:

First, referring to FIG. 22A, a plurality of the bottom one of the single-layer-packaged logic drives 300 (only one is shown) may have its metal pillars or bumps 122 mounted onto multiple metal pads 109 of a circuit carrier or substrate 110 at a topside thereof, such as Printed Circuit Board (PCB), Ball-Grid-Array (BGA) substrate, flexible circuit film or tape, or ceramic circuit substrate. An underfill 114 may be filled into a gap between the circuit carrier or substrate 110 and the bottom one of the single-layer-packaged logic drives 300. Alternatively, the underfill 114 may be skipped. Next, a surface-mount technology (SMT) may be used to mount a plurality of the top one of the single-layer-packaged logic drives 300 (only one is shown) onto the plurality of the bottom one of the single-layer-packaged logic drives 300, respectively. Solder or solder cream or flux 112 may be first printed on the metal pads 77*e* of the BISD 79 of the bottom one of the single-layer-packaged logic drives 300.

Figure 22B:
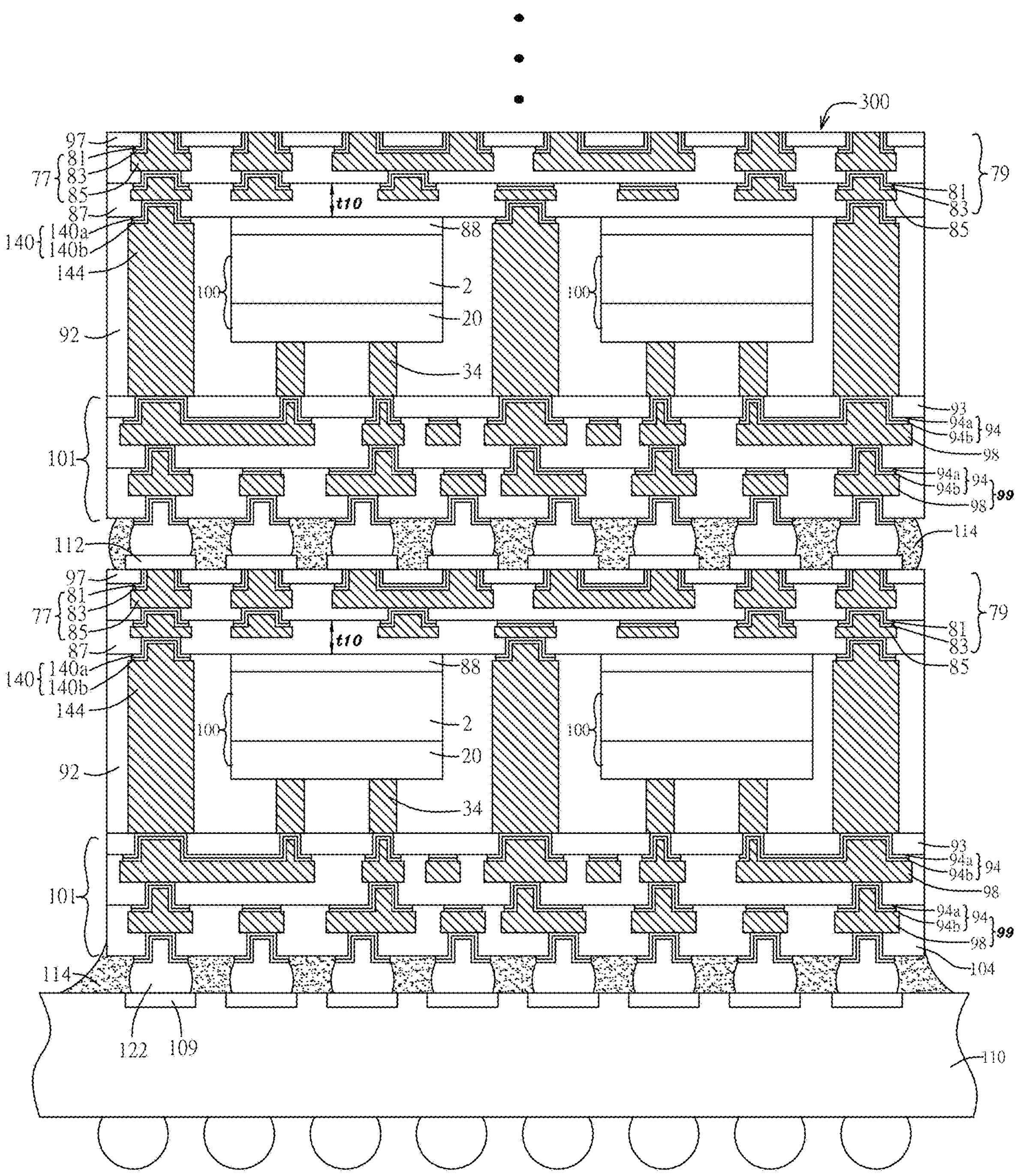

Next, referring to FIGS. 22A and 22B, the top one of the single-layer-packaged logic drives 300 may have its metal pillars or bumps 122 placed on the solder or solder cream or flux 112. Next, referring to FIG. 22B, a reflowing or heating process may be performed to fix the metal pillars or bumps 122 of the top one of the single-layer-packaged logic drives 300 to the metal pads 77*e* of the BISD 79 of the bottom one of the single-layer-packaged logic drives 300. Next, an underfill 114 may be filled into a gap between the top and bottom ones of the single-layer-packaged logic drives 300. Alternatively, the underfill 114 may be skipped.

In the next optional step, referring to FIG. 22B, other multiple of the single-layer-packaged logic drives 300 as seen in FIG. 20X may have its metal pillars or bumps 122 mounted onto the metal pads 77*e* of the BISD 79 of the plurality of the top one of the single-layer-packaged logic drives 300 using the surface-mount technology (SMT) and the underfill 114 is then optionally formed therebetween. The step may be repeated by multiple times to form the single-layer-packaged logic drives 300 stacked in three-layered fashion or more-than-three-layered fashion on the circuit carrier or substrate 110.

Next, referring to FIG. 22B, multiple solder balls 325 are planted on a backside of the circuit carrier or substrate 110. Next, referring to FIG. 22C, the circuit carrier or structure 110 may be separated, cut or diced into multiple individual substrate units 113, such as Printed Circuit Boards (PCBs), Ball-Grid-Array (BGA) substrates, flexible circuit films or tapes, or ceramic circuit substrates, by a laser cutting process or by a mechanical cutting process. Thereby, the number i of the single-layer-packaged logic drives 300 may be stacked on one of the individual substrate units 113, wherein the number i may be equal to or greater than 2, 3, 4, 5, 6, 7 or 8.

Figure 22C:
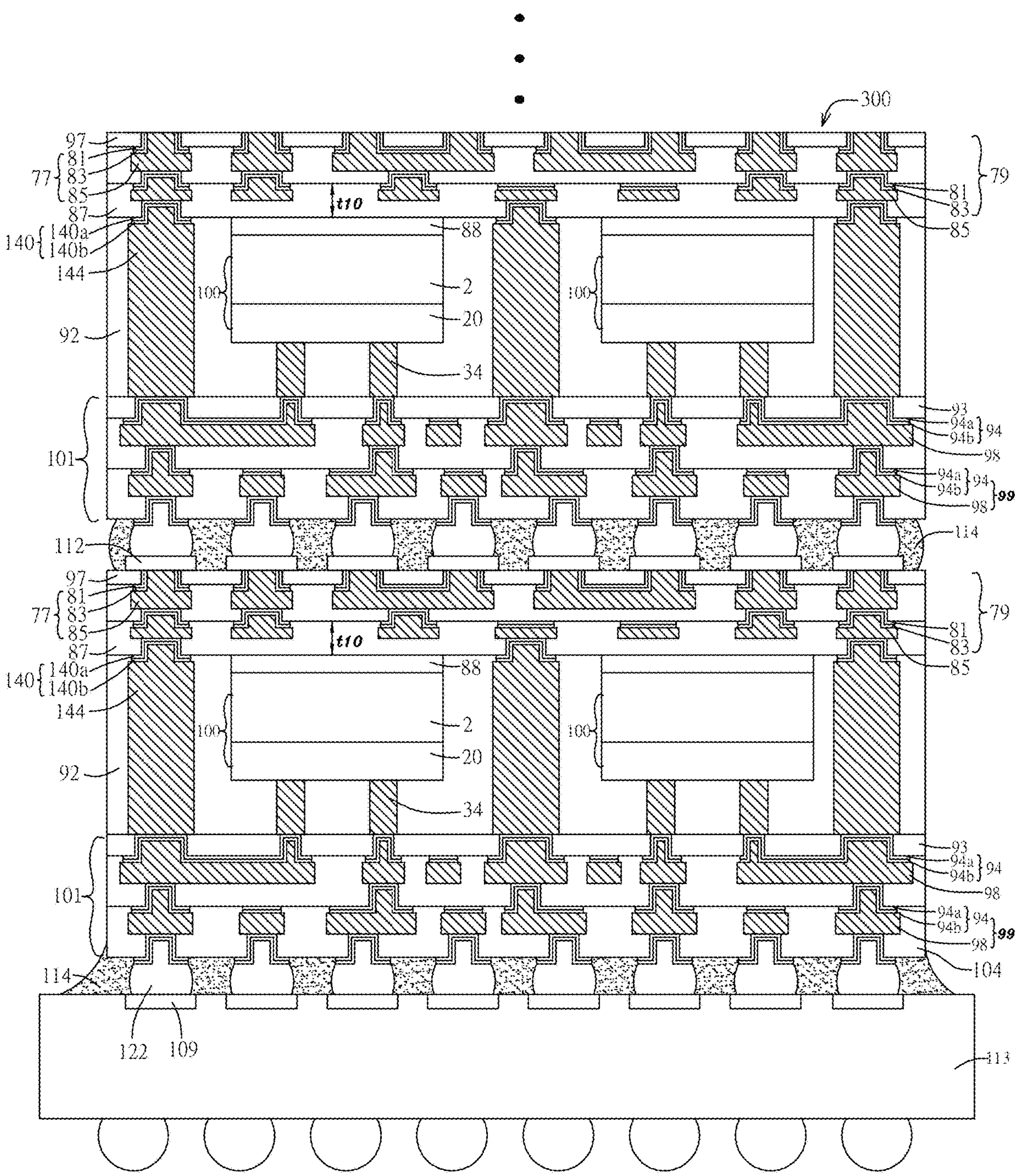
Figure 22D:
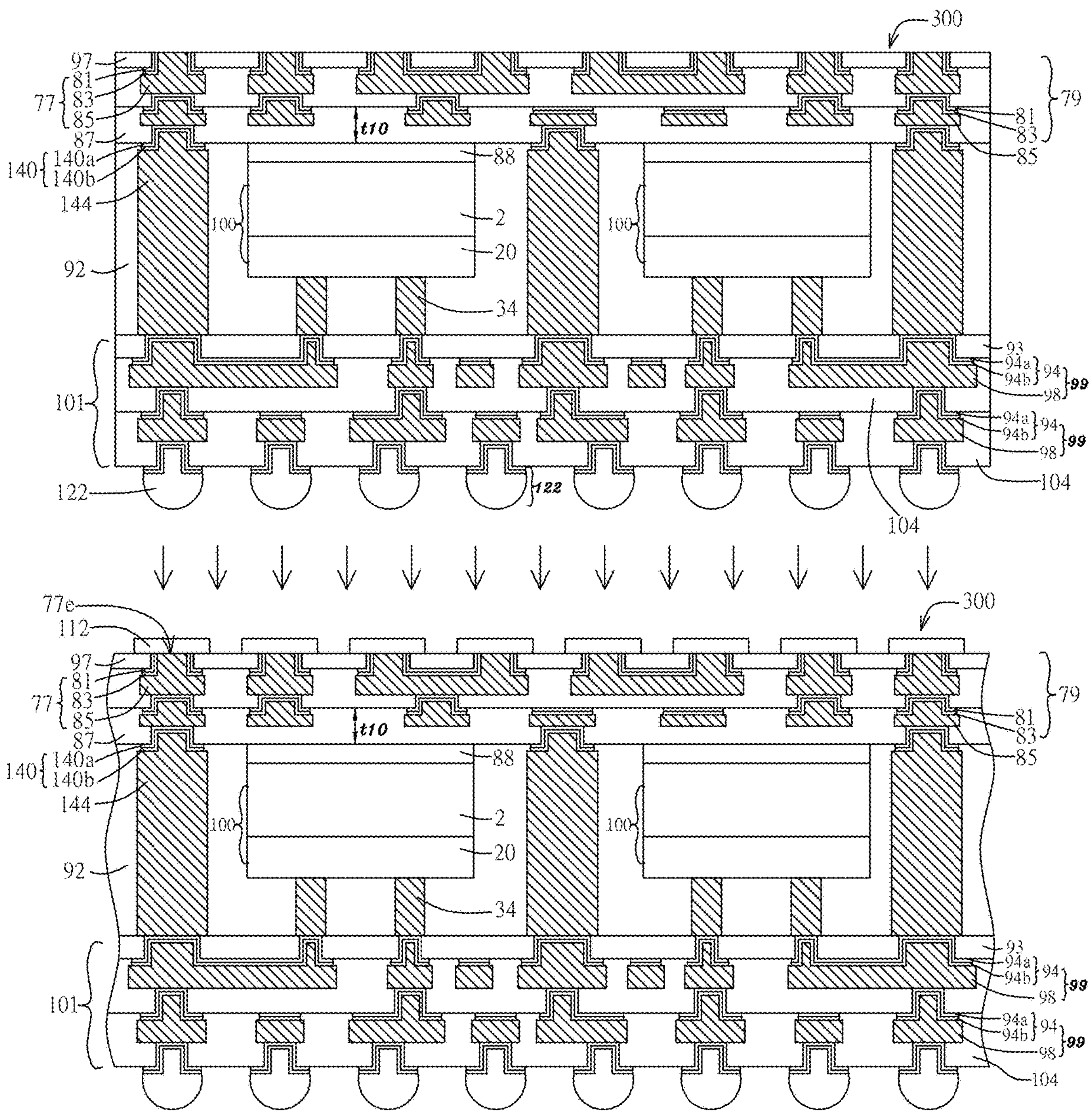
Figure 22E:
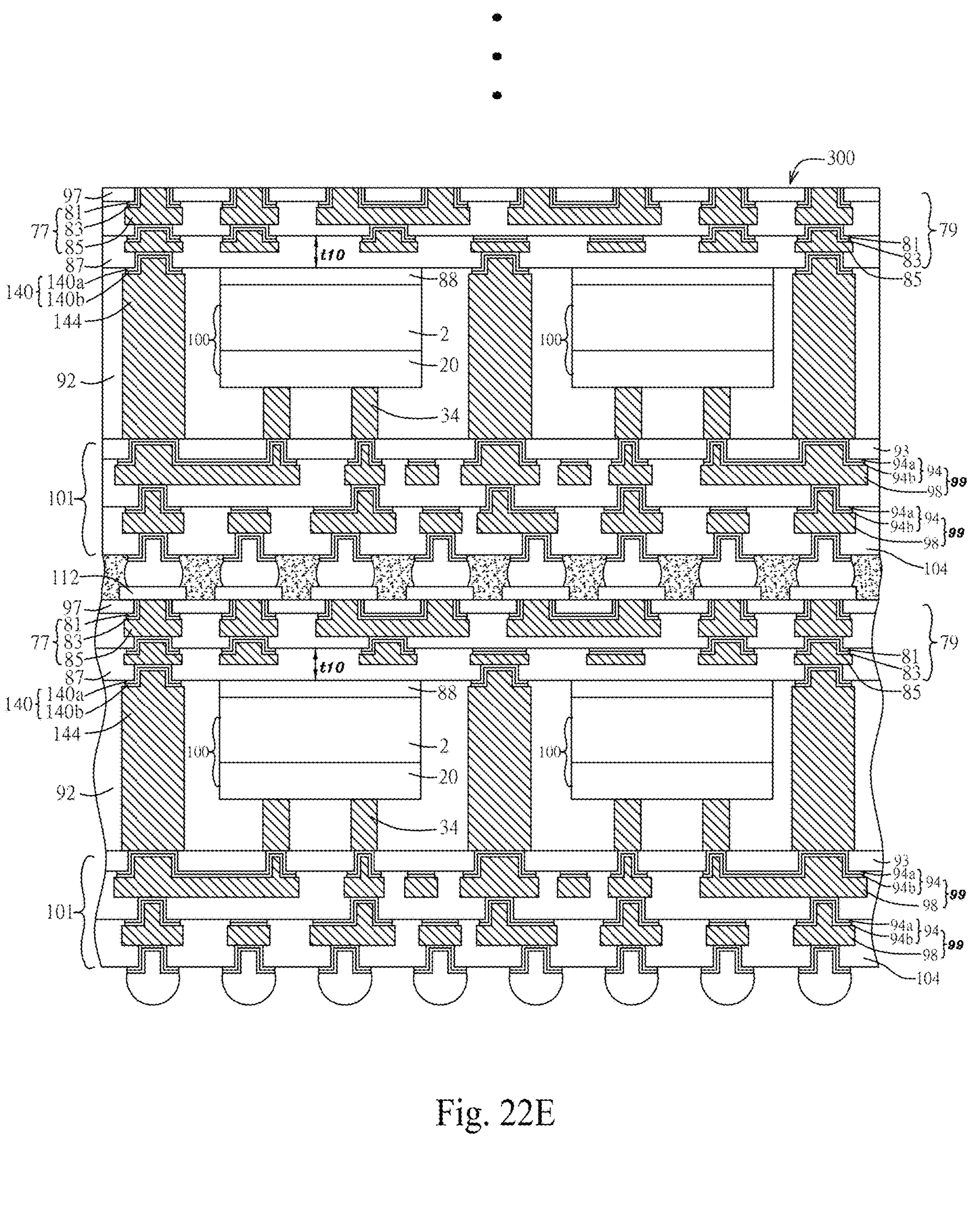
Figure 22F:
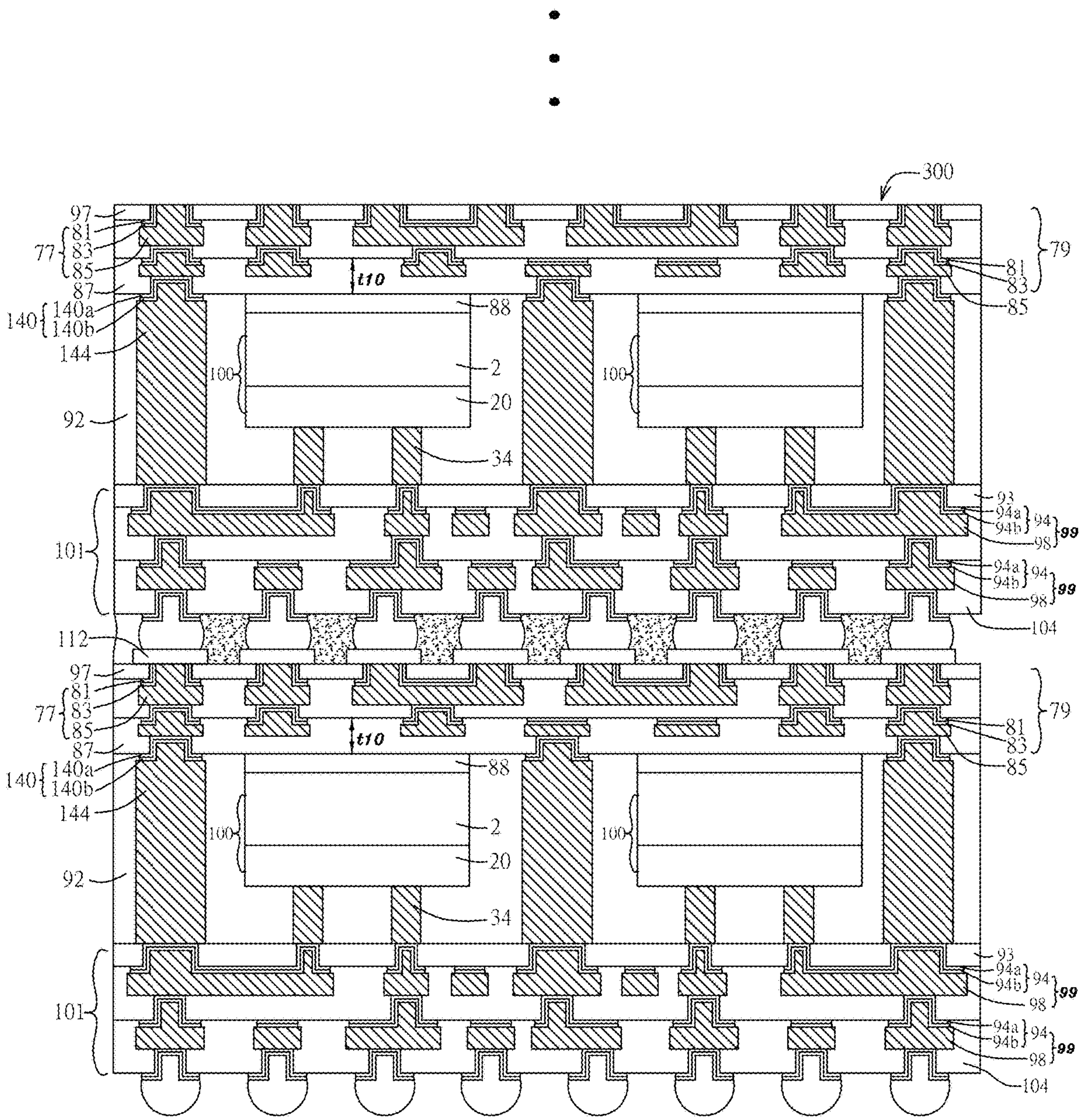

Alternatively, FIGS. 22D through 22F are schematically views showing a process for fabricating a package-on-package assembly in accordance with an embodiment of the present application. Referring to FIGS. 22D and 22E, a plurality of the top one of the single-layer-packaged logic drives 300 may have its metal pillars or bumps 122 fixed or mounted, using the SMT technology, to the metal pads 77*e* of the BISD 79 of the structure in a wafer or panel level as seen in FIG. 20W before being separated into a plurality of the bottom one of the single-layer-packaged logic drives 300.

Next, referring to FIG. 22E, the underfill 114 may be filled into a gap between each of the top ones of the single-layer-packaged logic drives 300 and the structure in a wafer or panel level as seen in FIG. 20W. Alternatively, the underfill 114 may be skipped.

In the next optional step, referring to FIG. 22E, other multiple of the single-layer-packaged logic drives 300 as seen in FIG. 20X may have its metal pillars or bumps 122 mounted onto the metal pads 77*e* of the BISD 79 of the plurality of the top one of the single-layer-packaged logic drives 300 using the surface-mount technology (SMT) and the underfill 114 is then optionally formed therebetween. The step may be repeated by multiple times to form the single-layer-packaged logic drives 300 stacked in two-layered fashion or more-than-two-layered fashion on the structure in a wafer or panel level as seen in FIG. 20W.

Next, referring to FIG. 22F, the structure in a wafer or panel level as seen in FIG. 20X may be separated, cut or diced into a plurality of the bottom one of the single-layer-packaged logic drives 300 by a laser cutting process or by a mechanical cutting process. Thereby, the number i of the single-layer-packaged logic drives 300 may be stacked together, wherein the number i may be equal to or greater than 2, 3, 4, 5, 6, 7 or 8. Next, the single-layer-packaged logic drives 300 stacked together may have a bottommost one provided with the metal pillars or bumps 122 to be mounted onto the multiple metal pads 109 of the circuit carrier or substrate 110 as seen in FIG. 22A, such as ball-grid-array substrate, at a topside thereof. Next, an underfill 114 may be filled into a gap between the circuit carrier or substrate 110 and the bottommost one of the single-layer-packaged logic drives 300. Alternatively, the underfill 114 may be skipped. Next, multiple solder balls 325 are planted on a backside of the circuit carrier or substrate 110. Next, the circuit carrier or structure 110 may be separated, cut or diced into multiple individual substrate units 113, such as printed circuit boards (PCB) or BGA (Ball-Grid-array) substrates, by a laser cutting process or by a mechanical cutting process, as seen in FIG. 22C. Thereby, the number i of the single-layer-packaged logic drives 300 may be stacked on one of the individual substrate units 113, wherein the number i may be equal to or greater than 2, 3, 4, 5, 6, 7 or 8.

The single-layer-packaged logic drives 300 with the TPVs 158 to be stacked in a vertical direction to form the POP assembly may be in a standard format or have standard sizes. For example, the single-layer-packaged logic drives 300 may be in a shape of square or rectangle, with a certain widths, lengths and thicknesses. An industry standard may be set for the shape and dimensions of the single-layer-packaged logic drives 300. For example, the standard shape of the single-layer-packaged logic drives 300 may be a square, with a width greater than or equal to 4 mm, 7 mm, 10 mm, 12 mm, 15 mm, 20 mm, 25 mm, 30 mm, 35 mm or 40 mm, and having a thickness greater than or equal to 0.03 mm, 0.05 mm, 0.1 mm, 0.3 mm, 0.5 mm, 1 mm, 2 mm, 3 mm, 4 mm or 5 mm. Alternatively, the standard shape of the single-layer-packaged logic drives 300 may be a rectangle, with a width greater than or equal to 3 mm, 5 mm, 7 mm, 10 mm, 12 mm, 15 mm, 20 mm, 25 mm, 30 mm, 35 mm or 40 mm, and a length greater than or equal to 5 mm, 7 mm, 10 mm, 12 mm, 15 mm, 20 mm, 25 mm, 30 mm, 35 mm, 40 mm, 45 mm or 50 mm; and having a thickness greater than or equal to 0.03 mm, 0.05 mm, 0.1 mm, 0.3 mm, 0.5 mm, 1 mm, 2 mm, 3 mm, 4 mm or 5 mm.

Interconnection for Multiple Drives with TISD and BISD

Figure 22G:
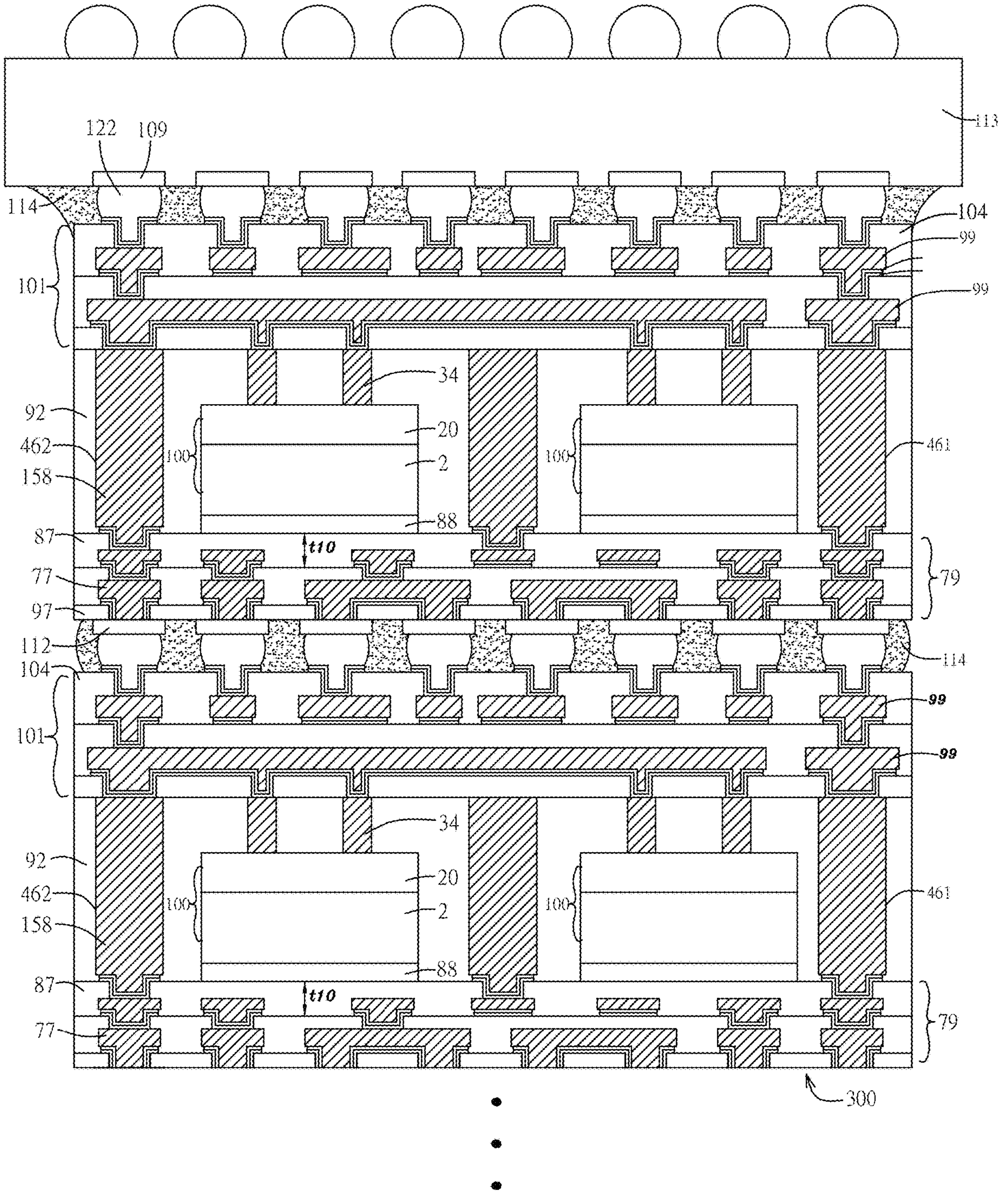
Figure 22H:
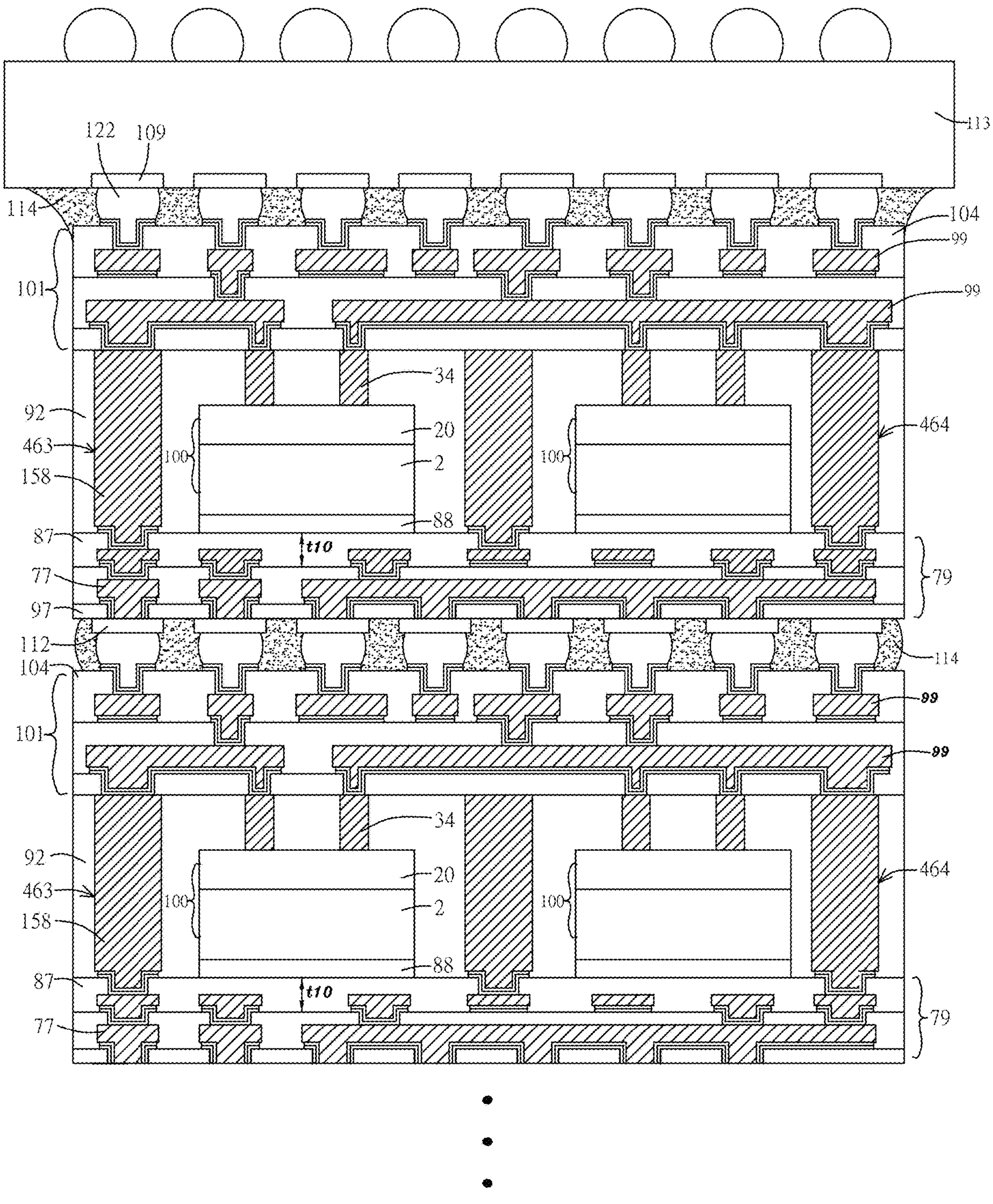
Figure 22I:
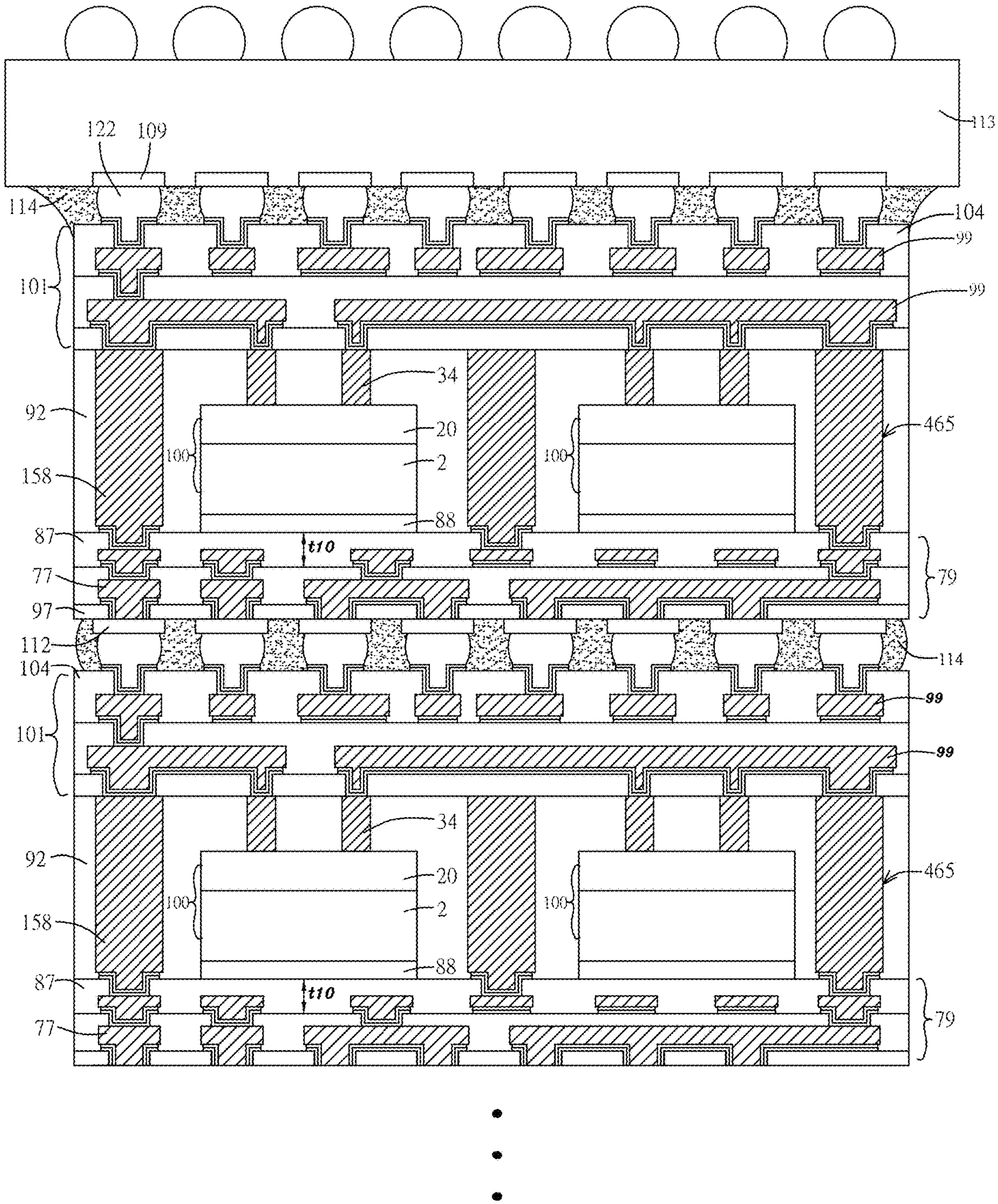

FIGS. 22G through 22I are cross-sectional views showing various connection of multiple logic drives in POP assembly in accordance with embodiment of the present application. Referring to FIG. 22G, in the POP assembly, each of the single-layer-packaged logic drives 300 may include one or more of the TPVs 158 used as first inter-drive interconnects 461 stacked and coupled to each other or one another for connecting to an upper one of the single-layer-packaged logic drives 300 and/or to a lower one of the single-layer-packaged logic drives 300, without connecting or coupling to any of the semiconductor chips 100 in the POP assembly. In each of the single-layer-packaged logic drives 300, each of the first inter-drive interconnects 461 is formed, from bottom to top, of: (i) one of the metal pads 77*e* of the BISD 79, (ii) a stacked portion of the interconnection metal layers 77 of the BISD 79, (iii) one of the TPVs 158, (iv) a stacked portion of the interconnection metal layers 99 of the TISD 100, and (v) a stacked one of the metal pillars or bumps 122.

Alternatively, referring to FIG. 22G, a second inter-drive interconnect 462 in the POP assembly may be provided like the first inter-drive interconnect 461, but the second inter-drive interconnect 462 may connect or couple to one or more of its semiconductor chips 100 through the interconnection metal layers 99 of the TISD 101.

Alternatively, referring to FIG. 22H, each of the single-layer-packaged logic drives 300 may provide a third inter-drive interconnect 463 like the second inter-drive interconnect 461 in FIG. 22G, but the third inter-drive interconnect 463 is not stacked up to one of the metal pillars or bumps 122, which are arranged vertically over the third inter-drive interconnect 463, joining said each of the single-layer-packaged logic drives 300 and an upper one of the single-layer-packaged logic drives 300 or joining said each of the single-layer-packaged logic drives 300 and the circuit carrier or substrate 110. The third inter-drive interconnect 463 may couple to another one or more of the metal pillars or bumps 122, which are arranged not vertically over the third inter-drive interconnect 463 but vertically over one of its semiconductor chips 100, joining said each of the single-layer-packaged logic drives 300 and an upper one of the single-layer-packaged logic drives 300 or joining said each of the single-layer-packaged logic drives 300 and the substrate unit 113.

Alternatively, referring to FIG. 22H, each of the single-layer-packaged logic drives 300 may provide a fourth inter-drive interconnect 464 composed from (i) a first horizontally-distributed portion of the interconnection metal layers 77 of its BISD 79, (ii) one of its TPVs 158 coupled to one or more of the metal pads 77*e* of the first horizontally-distributed portion vertically under one or more of its semiconductor chips 100, (iii) a second horizontally-distributed portion of the interconnection metal layers 99 of its TISD 101 connecting or coupling said one of its TPVs 158 to one or more of its semiconductor chips 100, The second horizontally-distributed portion of its fourth inter-drive interconnect 464 may couple to the metal pillars or bumps 122, which are arranged not vertically over said one of its TPVs 158 but vertically over said one or more of its semiconductor chips 100, joining said each of the single-layer-packaged logic drives 300 and an upper one of the single-layer-packaged logic drives 300 or joining said each of the single-layer-packaged logic drives 300 and the substrate unit 113.

Alternatively, referring to FIG. 22I, each of the single-layer-packaged logic drives 300 may provide a fifth inter-drive interconnect 465 composed from (i) a first horizontally-distributed portion of the interconnection metal layers 77 of its BISD 79, (ii) one of its TPVs 158 coupled to one or more of the metal pads 77*e* of the first horizontally-distributed portion vertically under one or more of the semiconductor chips 100, (iii) a second horizontally-distributed portion of the interconnection metal layers 99 of its TISD 101 connecting or coupling said one of its TPVs 158 to one or more of the semiconductor chips 100. The second horizontally-distributed portion of its fifth inter-drive interconnect 465 may not couple to any of the metal pillars or bumps 122 joining said each of the single-layer-packaged logic drives 300 and an upper one of the single-layer-packaged logic drives 300 or joining said each of the single-layer-packaged logic drives 300 and the substrate unit 113.

Second Embodiment for Chip Package with BISD and TPVs

Figure 28J:
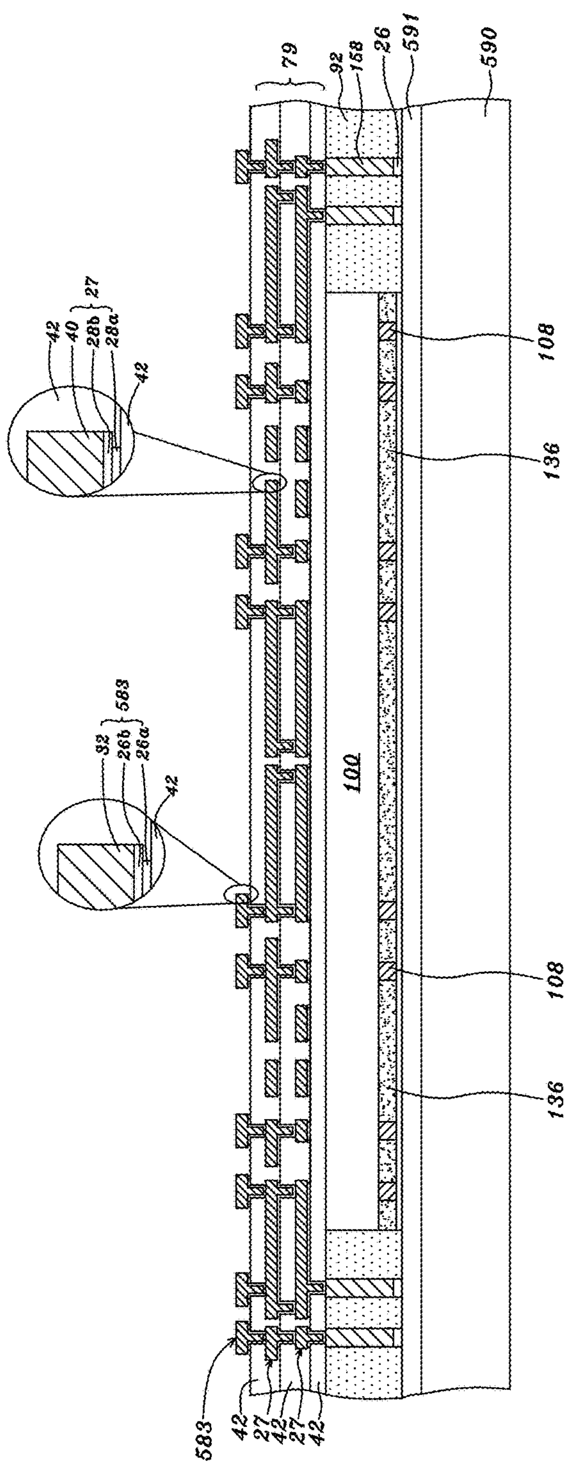
FIGS. 28J and 28K are schematically views showing a process for forming a chip package with BISD and TPVs in accordance with a second embodiment of the present application.
Figure 28K:
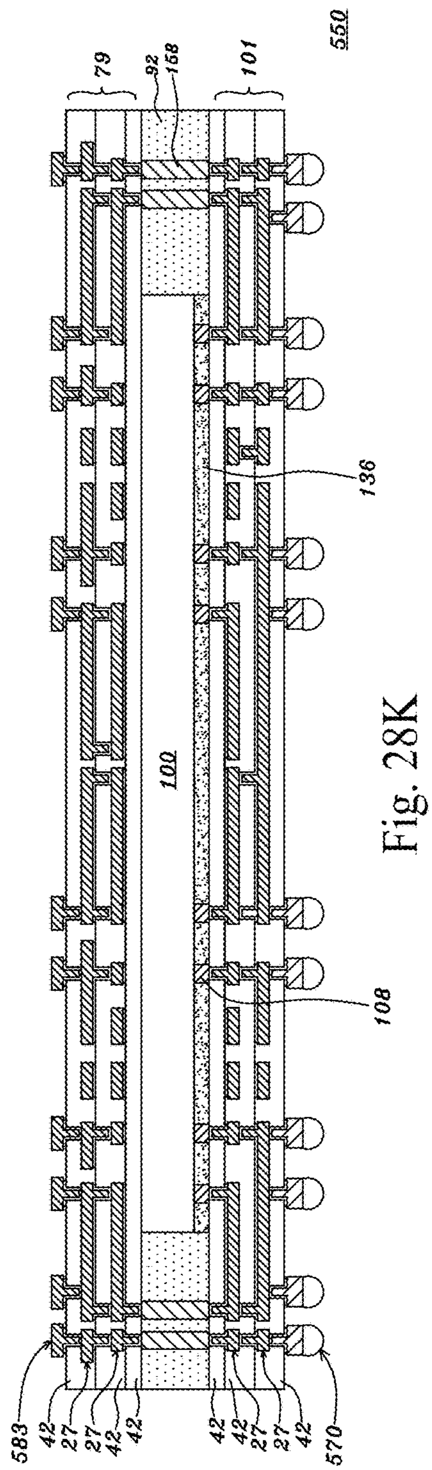

FIGS. 28J and 28K are schematically views showing a process for forming a chip package with BISD and TPVs in accordance with a second embodiment of the present application. Referring to FIG. 28J, after the chemical mechanical polishing (CMP), polishing or grinding process is performed as illustrated in FIG. 28C, a backside interconnection scheme for a logic drive or device (BISD) 79 may be formed over the backside of each of the semiconductor chips 100, the top surface of the polymer layer 92 and the top of each of the copper posts 158. The backside interconnection scheme for a logic drive or device (BISD) 79 may include one or more interconnection metal layers 27 coupling to each of the copper posts 158 and one or more polymer layers 42 each between neighboring two of its interconnection metal layers 27, under the bottommost one of its interconnection metal layers 27 or over the topmost one of its interconnection metal layers 27, wherein an upper one of its interconnection metal layers 27 may couple to a lower one of its interconnection metal layers 27 through an opening in one of its polymer layers 42 between the upper and lower ones of its interconnection metal layers 27. The bottommost one of its polymer layers 42 may be between the bottommost one of its interconnection metal layers 27 and the polymer layer 92 and between the bottommost one of its interconnection metal layers 27 and the backside of each of the semiconductor chips 100, wherein each opening in the bottommost one of its polymer layers 42 may be over the top of each of the copper posts 158, that is, the top of each of the copper posts 158 may be at a bottom of one of the openings in the bottommost one of its polymer layers 42. Each of its interconnection metal layers 27 may extend horizontally across an edge of each of the semiconductor chips 100.

Referring to FIG. 28J, for the backside interconnection scheme for a logic drive or device (BISD) 79, each of its polymer layers 42 may be a layer of polyimide, BenzoCycloButene (BCB), parylene, epoxy-based material or compound, photo epoxy SU-8, elastomer or silicone, having a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. Each of its interconnection metal layers 27 may be provided with multiple metal traces or lines each including (1) a copper layer 40 having one or more lower portions in openings in one of its polymer layers 42 having a thickness between 0.3 μm and 20 μm, and an upper portion having a thickness 0.3 μm and 20 μm over said one of its polymer layers 42, (2) an adhesion layer 28*a*, such as titanium or titanium nitride having a thickness between 1 nm and 50 nm, at a bottom and sidewall of each of the one or more lower portions of the copper layer 40 of said each of the metal traces or lines and at a bottom of the upper portion of the copper layer 40 of said each of the metal traces or lines, and (3) a seed layer 28*b*, such as copper, between the copper layer 40 and adhesion layer 28*a* of said each of the metal traces or lines, wherein the upper portion of the copper layer 40 of said each of the metal traces or lines may have a sidewall not covered by the adhesion layer 28*a* of said each of the metal traces or lines. Each of its interconnection metal layers 27 may provide multiple metal lines or traces with a thickness between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm, and a width between, for example, 0.3 μm and 30 μm, 0.5 μm and 20 μm, 1 μm and 10 μm, or 0.5 μm and 5 μm, or wider than or equal to 0.3 μm, 0.5 μm, 0.7 μm, 1 μm, 1.5 μm, 2 μm, 3 μm or 5 μm.

Next, multiple metal pads or bumps 583 may be formed, with a thickness between 1 μm and 10 μm, each on the topmost one of the interconnection metal layers 27 of the backside interconnection scheme for a logic drive or device (BISD) 79 exposed by multiple respective openings 42*a* in the topmost one of its polymer layers 42. Each of the metal pads or bumps 583 may be of various types. A first type of metal pads or bumps 583 having a thickness between 1 μm and 10 μm may include (1) an adhesion layer 26*a*, such as titanium (Ti) or titanium nitride (TiN) layer having a thickness between 1 nm and 50 nm, on the topmost one of the interconnection metal layers 27 of the backside interconnection scheme for a logic drive or device (BISD) 79, (2) a seed layer 26*b*, such as copper, on its adhesion layer 26*a* and (3) a copper layer 32 having a thickness between 1 μm and 10 μm on its seed layer 26*b*. Alternatively, a second type of metal pads or bumps 583 may include the adhesion layer 26*a*, seed layer 26*b* and copper layer 32 as mentioned above, and may further include a tin-containing solder cap made of tin or a tin-silver alloy having a thickness between 1 μm and 10 μm on its copper layer 32.

Next, the steps as illustrated in FIGS. 28E-28G may be performed to form multiple chip packages as seen in FIG. 28K. For each of the chip packages 550, each of its copper posts 158 may serve as a through package via (TPV), i.e., through polymer via, to provide vertical connection between the interconnection metal layers 27 of its top or frontside interconnection scheme for a logic drive or device (TISD or FISD) 101 and the interconnection metal layers 27 of its backside interconnection scheme for a logic drive or device (BISD). The interconnection metal layers 27 of its top or frontside interconnection scheme for a logic drive or device (TISD or FISD) 101, its copper posts 158 and the interconnection metal layers 27 of its backside interconnection scheme for a logic drive or device (BISD) 101 may compose the programmable interconnects 361 and fixed interconnects 364 of its inter-chip interconnects 371 for the standard commodity logic drives 300 as illustrated in FIGS. 11A-11N.

Immersive IC Interconnection Environment (IIIE)

Referring to FIGS. 22G through 22I, the single-layer-packaged logic drives 300 may be stacked to form a super-rich interconnection scheme or environment, wherein their semiconductor chips 100 represented for the FPGA IC chips 200, provided with the logic blocks 201 and the cross-point switches 379 as illustrated in FIGS. 8A through 8J, immerses in the super-rich interconnection scheme or environment, i.e., programmable 3D Immersive IC Interconnection Environment (IIIE). For one of the FPGA IC chips 200 in one of the single-layer-packaged logic drives 300, (1) the interconnection metal layers 6 of the FISC 20 of said one of the FPGA IC chips 200, interconnection metal layers 27 of the SISC 29 of said one of the FPGA IC chips 200, micro pillars or bumps 34 of said one of the FPGA IC chips 200, interconnection metal layers 99 of the TISD 101 of said one of the single-layer-packaged logic drives 300, and metal pillars or bumps 122 between an upper one and said one of the single-layer-packaged logic drives 300 are provided over the logic blocks 201 and cross-point switches 379 of said one of the FPGA IC chips 200; (2) the interconnection metal layers 77 of the BISD 79 of said one of the single-layer-packaged logic drives 300 and the copper pads 77*e* of the BISD 79 of said one of the single-layer-packaged logic drives 300 are provided under the logic blocks 201 and cross-point switches 379 of said one of the FPGA IC chips 200; and (3) the TPVs 158 of said one of the single-layer-packaged logic drives 300 are provided surrounding the logic blocks 201 and cross-point switches 379 of said one of the FPGA IC chips 200. The programmable 3D IIIE provides the super-rich interconnection scheme or environment, comprising the FISC 20, SISC 29 and micro pillars or bumps 34 of each of the semiconductor chips 100, the TISD 101, BISD 79 and TPVs 158 of each of the single-layer-packaged logic drives 300 and the metal pillars or bumps 122 between each two of the single-layer-packaged logic drives 300, for constructing an interconnection scheme or system in three dimensions (3D). The interconnection scheme or system in a horizontal direction may be programmed by the cross-point switches 379 of each of the standardized commodity FPGA IC chips 200 and DPIIC chips 410 of each of the single-layer-packaged logic drives 300. Also, the interconnection scheme or system in a vertical direction may be programmed by the cross-point switches 379 of each of the standardized commodity FPGA IC chips 200 and DPIIC chips 410 of each of the single-layer-packaged logic drives 300.

Figure 23A:
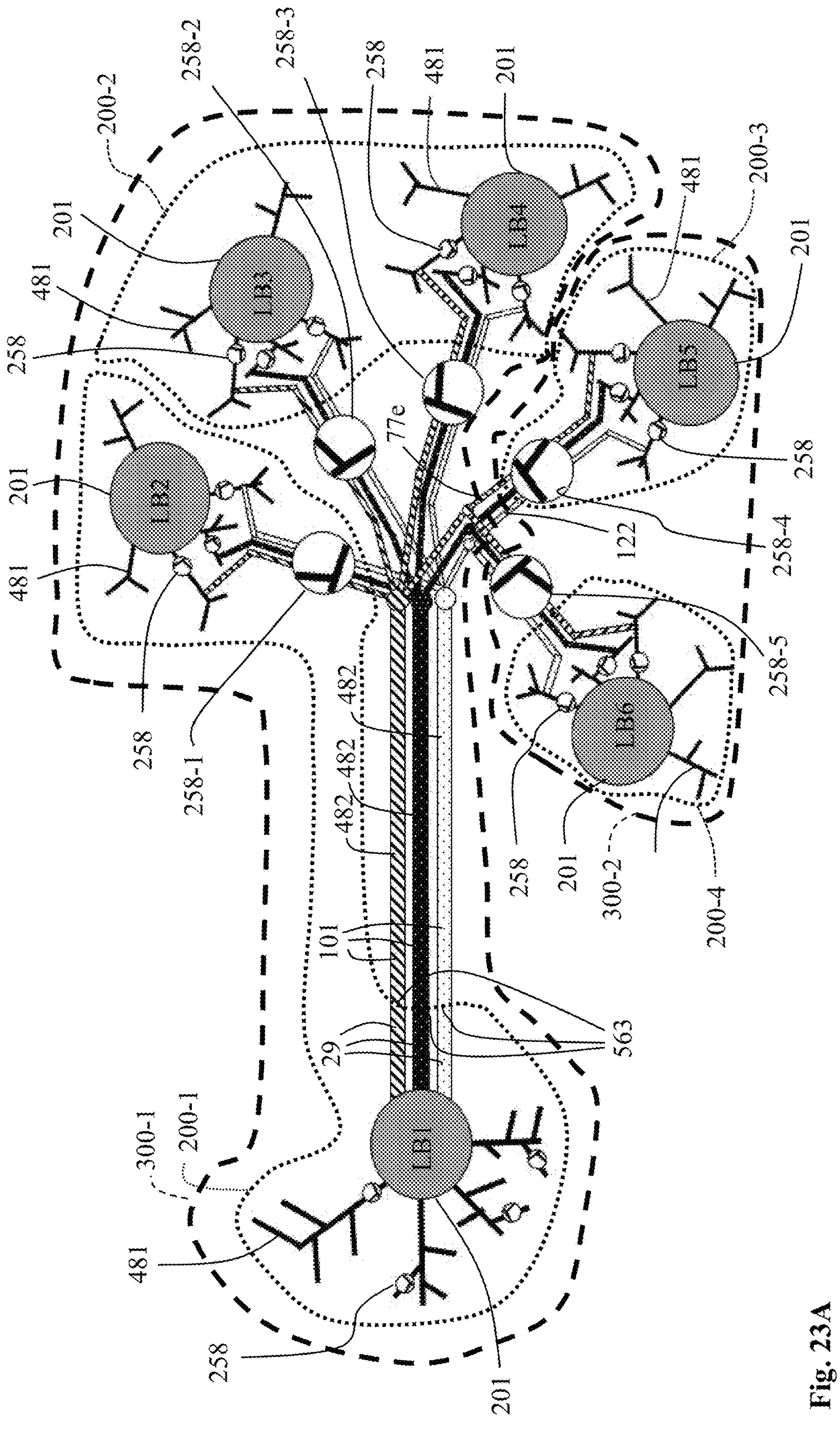
FIGS. 23A and 23B are conceptual views showing interconnection between multiple logic blocks from an aspect of human's nerve system in accordance with an embodiment of the present application.
Figure 23B:
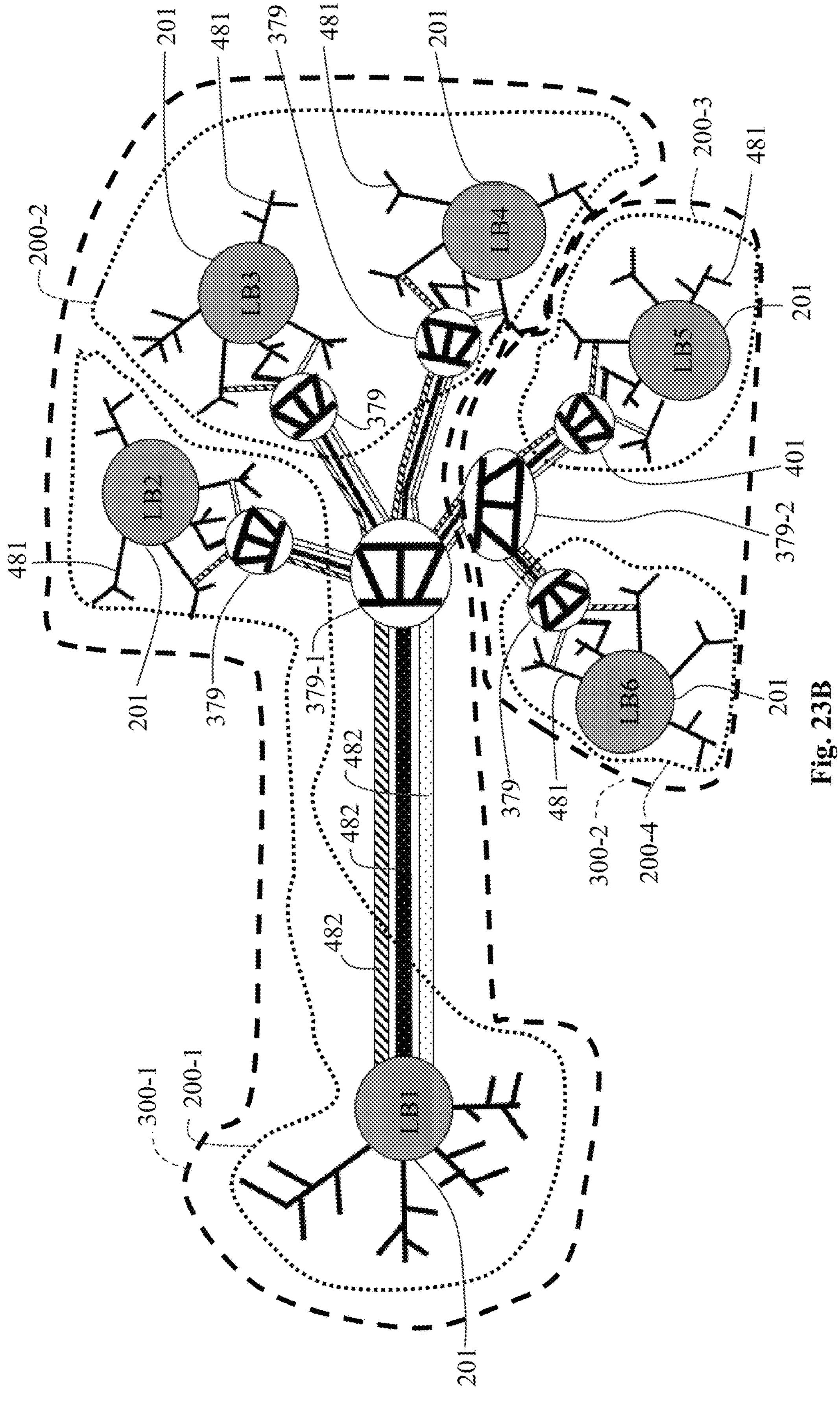

FIGS. 23A and 23B are conceptual views showing interconnection between multiple logic blocks from an aspect of human's nerve system in accordance with an embodiment of the present application. For an element indicated by the same reference number shown in FIGS. 23A and 23B and in above-illustrated figures, the specification of the element as seen in FIGS. 23A and 23B may be referred to that of the element as above illustrated in the figures. Referring to FIG. 23A, the programmable 3D IIIE is similar or analogous to a human brain. The logic blocks 201 as seen in FIG. 6A are similar or analogous to neurons or nerve cells; the interconnection metal layers 6 of the FISC 20 and/or the interconnection metal layers 27 of the SISC 29 are similar or analogous to the dendrites connecting to the neurons or nerve cells 201. The micro pillars or bumps 34 of one of the standardized commodity FPGA IC chips 200 connecting to the small receivers 375 of the small I/O circuits 203 of said one of the FPGA IC chips 200 for the inputs of the logic blocks 201 of said one of the standardized commodity FPGA IC chips 200 are similar or analogous to post-synaptic cells at ends of the dendrites. For short distance between two of the logic blocks 201 in one of the standardized commodity FPGA IC chips 200, the interconnection metal layers 6 of its FISC 20 and the interconnection metal layers 27 of its SISC 29 may construct an interconnect 482 like an axon connecting from one of the neurons or nerve cells 201 to another of the neurons or nerve cells 201. For long distance between two of the standardized commodity FPGA IC chips 200, the interconnection metal layers 99 of the TISD 101 of the single-layer-packaged logic drives 300, the interconnection metal layers 77 of the BISD 79 of the single-layer-packaged logic drives 300 and the TPVs 158 of the single-layer-packaged logic drives 300 may construct the axon-like interconnect 482 connecting from one of the neurons or nerve cells 201 to another of the neurons or nerve cells 201. One of the micro pillars or bumps 34 of a first one of the standardized commodity FPGA IC chips 200 connecting to the axon-like interconnect 482 may be programmed to connect to the small drivers 374 of the small I/O circuits 203 of a second one of the standardized commodity FPGA IC chips 200 is similar or analogous to pre-synaptic cells at a terminal of the axon 482.

For more elaboration, referring to FIG. 23A, a first one 200-1 of the standardized commodity FPGA IC chips 200 may include first and second ones LB1 and LB2 of the logic blocks 201 like the neurons, the FISC 20 and SISC 29 like the dendrites 481 coupled to the first and second ones LB1 and LB2 of the logic blocks 201 and the cross-point switches 379 programmed for connection of its FISC 20 and SISC 29 to the first and second ones LB1 and LB2 of the logic blocks 201. A second one 200-2 of the standardized commodity FPGA IC chips 200 may include third and fourth ones LB3 and LB4 of the logic blocks 210 like the neurons, the FISC 20 and SISC 29 like the dendrites 481 coupled to the third and fourth ones LB3 and LB4 of the logic blocks 210 and the cross-point switches 379 programmed for connection of its FISC 20 and SISC 29 to the third and fourth ones LB3 and LB4 of the logic blocks 210. A first one 300-1 of the logic drives 300 may include the first and second ones 200-1 and 200-2 of the standardized commodity FPGA IC chips 200. A third one 200-3 of the standardized commodity FPGA IC chips 200 may include a fifth one LB5 of the logic blocks 201 like the neurons, the FISC 20 and SISC 29 like the dendrites 481 coupled to the fifth one LB5 of the logic blocks 201 and its cross-point switches 379 programmed for connection of its FISC 20 and SISC 29 to the fifth one LB5 of the logic blocks 201. A fourth one 200-4 of the standardized commodity FPGA IC chips 200 may include a sixth one LB6 of the logic blocks 201 like the neurons, the FISC 20 and SISC 29 like the dendrites 481 coupled to the sixth one LB6 of the logic blocks 201 and the cross-point switches 379 programmed for connection of its FISC 20 and SISC 29 to the sixth one LB6 of the logic blocks 201. A second one 300-2 of the logic drives 300 may include the third and fourth ones 200-3 and 200-4 of the standardized commodity FPGA IC chips 200. (1) A first portion, which is provided by the interconnection metal layers 6 and 27 of the FISC 20 and SISC 29, extending from the logic block LB1, (2) one of the micro-bumps or pillars 34 extending from the first portion, (3) a second portion, which is provided by the interconnection metal layers 99 and/or 77 of the TISD 101 and/or BISD 79 of the first one 300-1 of the single-layer-packaged logic drives 300, extending from said one of the micro-bumps or pillars 34, (4) the other one of the micro-bumps or pillars 34 extending from the second portion, and (5) a third portion, which is provided by the interconnection metal layers 6 and 27 of the FISC 20 and SISC 29, extending from the other one of the micro-bumps or pillars 34 to the logic block LB2 may compose the axon-like interconnect 482. The axon-like interconnect 482 may be programmed to connect the first one LB1 of the logic block 201 to either of the second through sixth ones LB2, LB3, LB4, LB5 and LB6 of the logic blocks 201 according to switching of first through fifth ones 258-1 through 258-5 of the pass/no-pass switches 258 of the cross-point switches 379 set on the axon-like interconnect 482. The first one 258-1 of the pass/no-pass switches 258 may be arranged in the first one 200-1 of the standardized commodity FPGA IC chips 200. The second and third ones 258-2 and 258-3 of the pass/no-pass switches 258 may be arranged in one of the DPIIC chips 410 in the first one 300-1 of the logic drives 300. The fourth one 258-4 of the pass/no-pass switches 258 may be arranged in the third one 200-3 of the standardized commodity FPGA IC chips 200. The fifth one 258-5 of the pass/no-pass switches 258 may be arranged in one of the DPIIC chips 410 in the second one 300-2 of the logic drives 300. The first one 300-1 of the single-layer-packaged logic drives 300 may have the metal pads 77*e* coupling to the second one 300-2 of the single-layer-packaged logic drives 300 through the metal bumps or pillars 122. Alternatively, the first through fifth ones 258-1 through 258-5 of the pass/no-pass switches 258 set on the axon-like interconnect 482 may be omitted. Alternatively, the pass/no-pass switches 258 set on the dendrites-like interconnect 481 may be omitted.

Furthermore, referring to FIG. 23B, the axon-like interconnect 482 may be considered as a scheme or structure of a tree including (i) a trunk or stem connecting to the first one LB1 of the logic blocks 201, (ii) multiple branches branching from the trunk or stem for connecting its trunk or stem to one of the second and sixth ones LB2-LB6 of the logic blocks 201, (iii) a first one 379-1 of the cross-point switches 379 set between its trunk or stem and each of its branches for switching the connection between its trunk or stem and one of its branches, (iv) multiple sub-branches branching from one of its branches for connecting said one of its branches to one of the fifth and sixth ones LB5 and LB6 of the logic blocks 201, and (v) a second one 379-2 of the cross-point switches 379 set between said one of its branches and each of its sub-branches for switching the connection between said one of its branches and one of its sub-branches. The first one 379-1 of the cross-point switches 379 may be provided in one of the DPIIC chips 410 in the first one 300-1 of the logic drives 300, and the second one 379-2 of the cross-point switches 379 may be provided in one of the DPIIC chips 410 in the second one 300-2 of the logic drives 300. Each of the dendrite-like interconnects 481 may include (i) a stem connecting to one of the first through sixth ones LB1-LB6 of the logic blocks 201, (ii) multiple branches branching from the stem, (iii) a cross-point switch 401 set between its stem and each of its branches for switching the connection between its stem and one of its branches. Each of the logic blocks 201 may couple to multiple of the dendrite-like interconnects 481 composed of the interconnection metal layers 6 of the FISC 20 and the interconnection metal layers 27 of the SISC 29. Each of the logic blocks 201 may be coupled to a distal terminal of one or more of the axon-like interconnects 482, extending from others of the logic blocks 201, through the dendrite-like interconnects 481 extending from said each of the logic blocks 201.

Combinations of POP Assembly for Logic Drive and Memory Drive

As mentioned above, the single-layer-packaged logic drive 300 may be packaged with the semiconductor chips 100 as illustrated in FIGS. 11A-11N. A plurality of the logic drive 300 may be incorporated with one or more memory drives 310 into a module. The memory drives 310 are configured to store data or applications. The memory drives 310 may be divided into two types, one of which is a non-volatile memory drive 322, and the other one of which is a volatile memory drive 323, as seen in FIGS. 24A-24K. FIGS. 24A-24K are schematically views showing multiple combinations of POP assemblies for logic and memory drives in accordance with embodiments of the present application. The structure for the memory drives 310 and the process for forming the same may be referred to the illustration for FIGS. 14A through 22I but the semiconductor chips 100 are non-volatile memory chips for the non-volatile memory drive 322; the semiconductor chips 100 are volatile memory chips for the volatile memory drive 323.

Figure 24A:
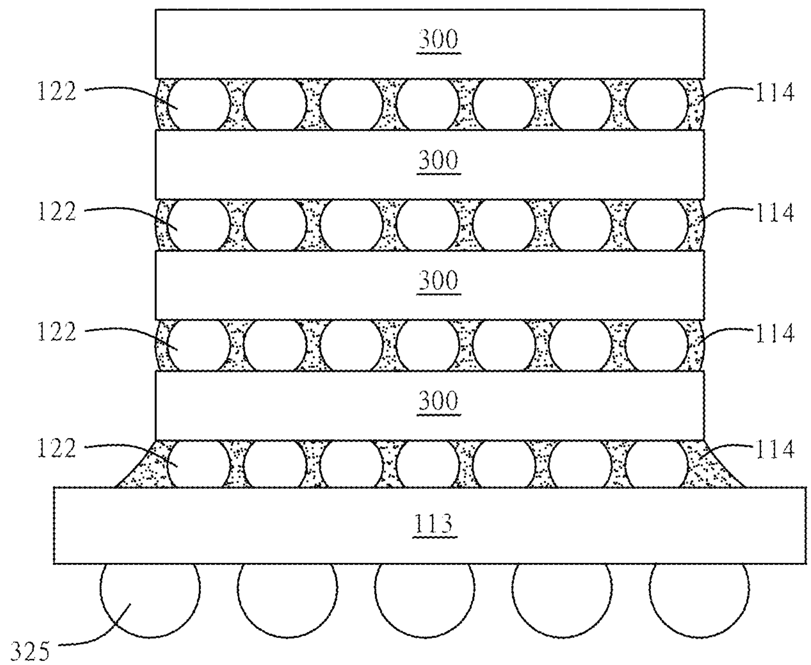
FIGS. 24.A-24K are schematically views showing multiple combinations of POP assemblies for logic and memory drives in accordance with embodiments of the present application.
FIG. 24L is a schematically top view of multiple POP assemblies, which is a schematically cross-sectional view along a cut line A-A shown in FIG. 24K.

Referring to FIG. 24A, the POP assembly may be stacked with only the single-layer-packaged logic drives 300 on the substrate unit 113 in accordance with the process as illustrated in FIGS. 14A through 22I. An upper one of the single-layer-packaged logic drives 300 may have the metal pillars or bumps 122 mounted onto the metal pads 77*e* of a lower one of the single-layer-packaged logic drives 300 at the backside thereof, but a bottommost one of the single-layer-packaged logic drives 300 may have the metal pillars or bumps 122 mounted onto the metal pads 109 of the substrate unit 113 at the topside thereof.

Figure 24B:
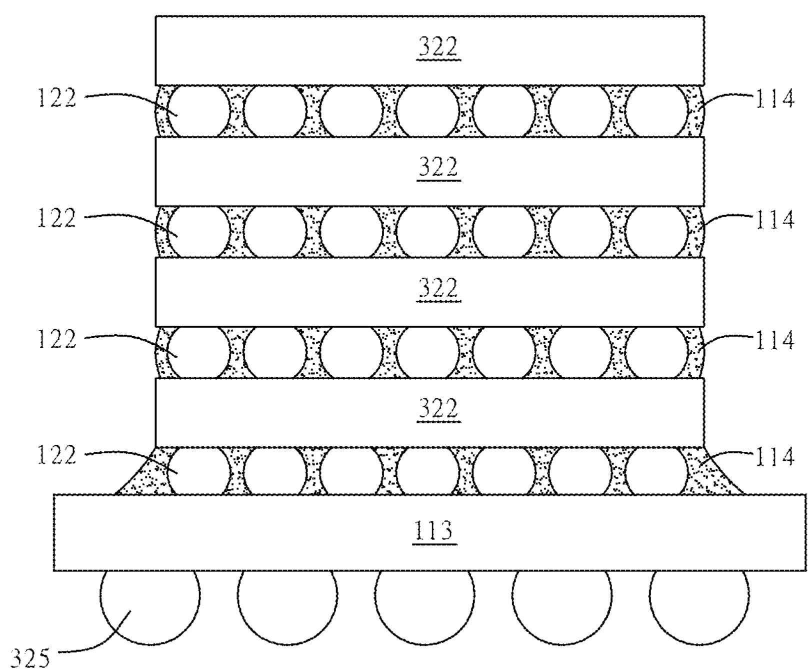

Referring to FIG. 24B, the POP assembly may be stacked with only the single-layer-packaged non-volatile memory drives 322 on the substrate unit 113 in accordance with the process as illustrated in FIGS. 14A through 22I. An upper one of the single-layer-packaged non-volatile memory drives 322 may have the metal pillars or bumps 122 mounted onto the metal pads 77*e* of a lower one of the single-layer-packaged non-volatile memory drives 322 at the backside thereof, but a bottommost one of the single-layer-packaged non-volatile memory drives 322 may have the metal pillars or bumps 122 mounted onto the metal pads 109 of the substrate unit 113 at the topside thereof.

Figure 24C:
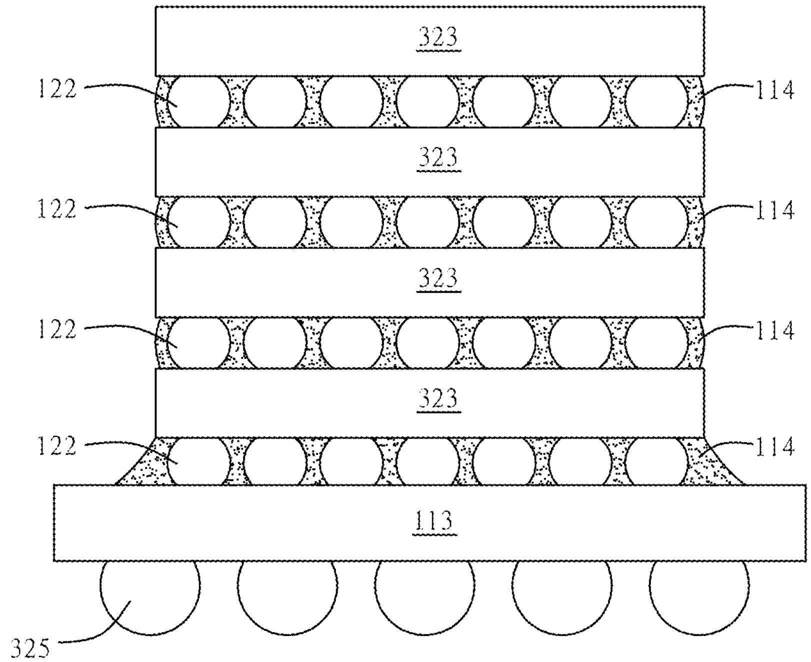

Referring to FIG. 24C, the POP assembly may be stacked with only the single-layer-packaged volatile memory drives 323 on the substrate unit 113 in accordance with the process as illustrated in FIGS. 14A through 22I. An upper one of the single-layer-packaged volatile memory drives 323 may have the metal pillars or bumps 122 mounted onto the metal pads 77*e* of a lower one of the single-layer-packaged volatile memory drives 323 at the backside thereof, but a bottommost one of the single-layer-packaged volatile memory drives 323 may have the metal pillars or bumps 122 mounted onto the metal pads 109 of the substrate unit 113 at the topside thereof.

Figure 24D:
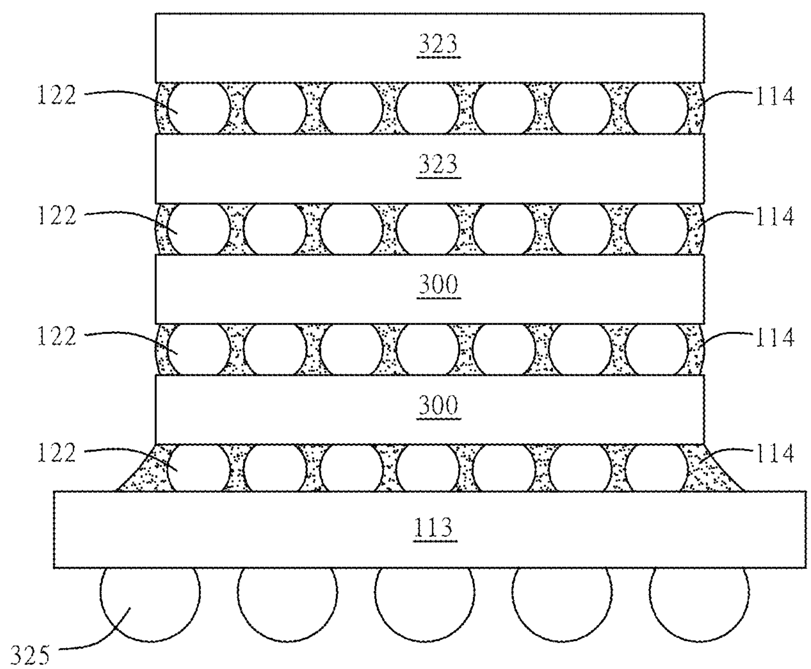

Referring to FIG. 24D, the POP assembly may be stacked with a group of the single-layer-packaged logic drives 300 and a group of the single-layer-packaged volatile memory drives 323 in accordance with the process as illustrated in FIGS. 14A through 22I. The group of the single-layer-packaged logic drives 300 may be arranged over the substrate unit 113 and under the group of the single-layer-packaged volatile memory drives 323. For example, a group of two single-layer-packaged logic drives 300 may be arranged over the substrate unit 113 and under a group of two single-layer-packaged volatile memory drives 323. A first one of the single-layer-packaged logic drives 300 may have the metal pillars or bumps 122 mounted onto the metal pads 109 of the substrate unit 113 at the topside thereof, a second one of the single-layer-packaged logic drives 300 may have the metal pillars or bumps 122 mounted onto the metal pads 77*e* of the first one of the single-layer-packaged logic drives 300 at the backside thereof, a first one of the single-layer-packaged volatile memory drives 323 may have the metal pillars or bumps 122 mounted onto the metal pads 77*e* of the second one of the single-layer-packaged logic drives 300 at the backside thereof, and a second one of the single-layer-packaged volatile memory drives 323 may have the metal pillars or bumps 122 mounted onto the metal pads 77*e* of the first one of the single-layer-packaged volatile memory drives 323 at the backside thereof.

Figure 24E:
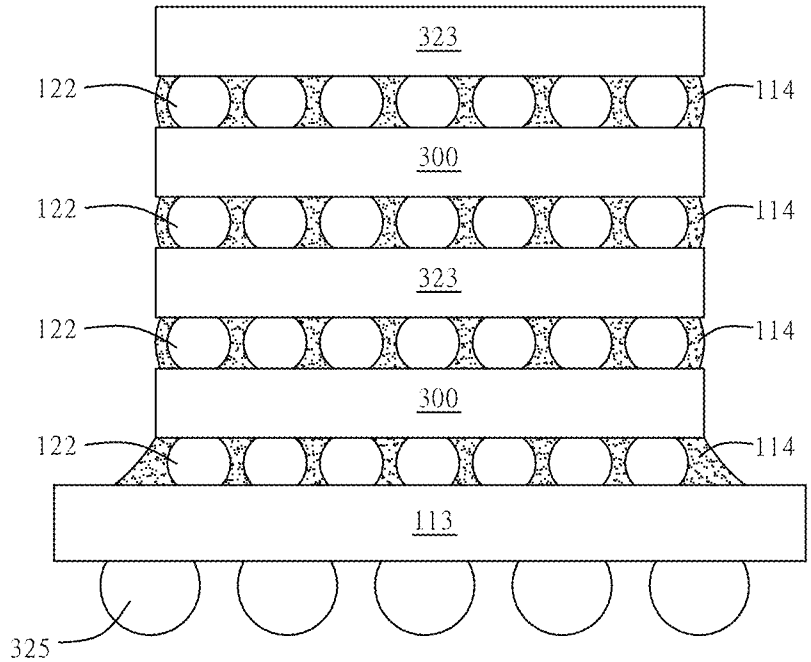

Referring to FIG. 24E, the POP assembly may be alternately stacked with the single-layer-packaged logic drives 300 and the single-layer-packaged volatile memory drives 323 in accordance with the process as illustrated in FIGS. 14A through 22I. For example, a first one of the single-layer-packaged logic drives 300 may have the metal pillars or bumps 122 mounted onto the metal pads 109 of the substrate unit 113 at the topside thereof, a first one of the single-layer-packaged volatile memory drives 323 may have the metal pillars or bumps 122 mounted onto the metal pads 77*e* of the first one of the single-layer-packaged logic drives 300 at the backside thereof, a second one of the single-layer-packaged logic drives 300 may have the metal pillars or bumps 122 mounted onto the metal pads 77*e* of the first one of the single-layer-packaged volatile memory drives 323 at the backside thereof, and a second one of the single-layer-packaged volatile memory drives 323 may have the metal pillars or bumps 122 mounted onto the metal pads 77*e* of the second one of the single-layer-packaged logic drives 300 at the backside thereof.

Figure 24F:
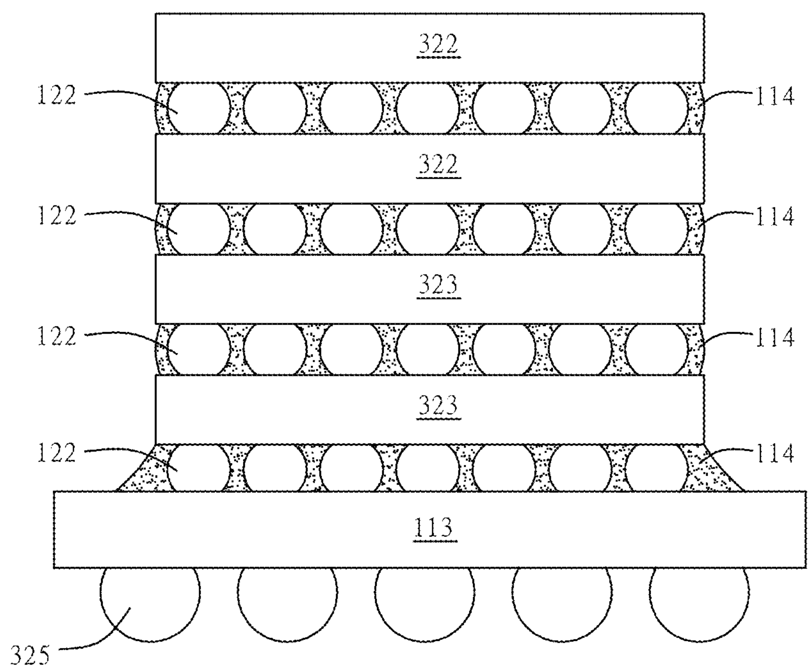

Referring to FIG. 24F, the POP assembly may be stacked with a group of the single-layer-packaged non-volatile memory drives 322 and a group of the single-layer-packaged volatile memory drives 323 in accordance with the process as illustrated in FIGS. 14A through 22I. The group of the single-layer-packaged volatile memory drives 323 may be arranged over the substrate unit 113 and under the group of the single-layer-packaged non-volatile memory drives 322. For example, a group of two single-layer-packaged volatile memory drives 323 may be arranged over the substrate unit 113 and under a group of two single-layer-packaged non-volatile memory drives 322. A first one of the single-layer-packaged volatile memory drives 323 may have the metal pillars or bumps 122 mounted onto the metal pads 109 of the substrate unit 113 at the topside thereof, a second one of the single-layer-packaged volatile memory drives 323 may have the metal pillars or bumps 122 mounted onto the metal pads 77*e* of the first one of the single-layer-packaged volatile memory drives 323 at the backside thereof, a first one of the single-layer-packaged non-volatile memory drives 322 may have the metal pillars or bumps 122 mounted onto the metal pads 77*e* of the second one of the single-layer-packaged volatile memory drives 323 at the backside thereof, and a second one of the single-layer-packaged non-volatile memory drives 322 may have the metal pillars or bumps 122 mounted onto the metal pads 77*e* of the first one of the single-layer-packaged non-volatile memory drives 322 at the backside thereof.

Figure 24G:
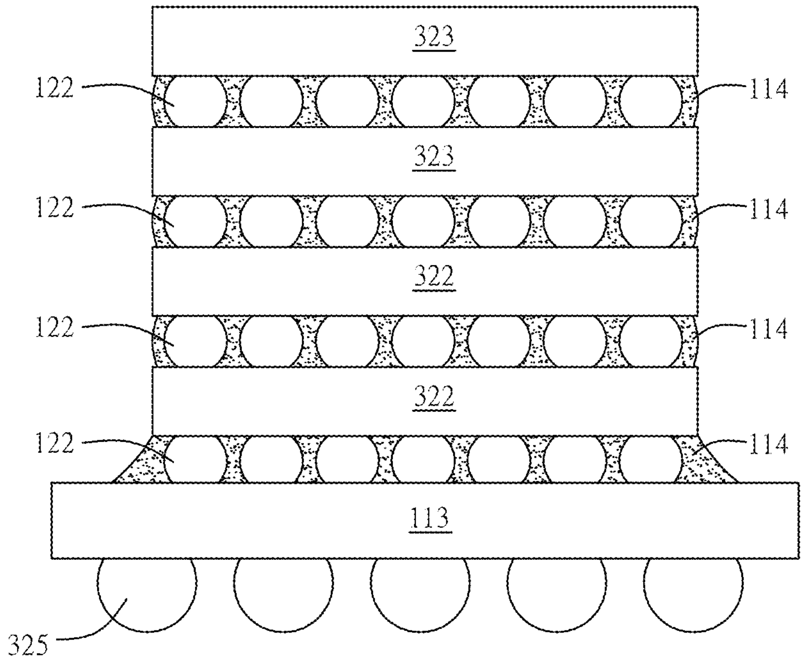

Referring to FIG. 24G, the POP assembly may be stacked with a group of the single-layer-packaged non-volatile memory drives 322 and a group of the single-layer-packaged volatile memory drives 323 in accordance with the process as illustrated in FIGS. 14A through 22I. The group of the single-layer-packaged non-volatile memory drives 322 may be arranged over the substrate unit 113 and under the group of the single-layer-packaged volatile memory drives 323. For example, a group of two single-layer-packaged non-volatile memory drives 322 may be arranged over the substrate unit 113 and under a group of two single-layer-packaged volatile memory drives 323. A first one of the single-layer-packaged non-volatile memory drives 322 may have the metal pillars or bumps 122 mounted onto the metal pads 109 of the substrate unit 113 at the topside thereof, a second one of the single-layer-packaged non-volatile memory drives 322 may have the metal pillars or bumps 122 mounted onto the metal pads 77*e* of the first one of the single-layer-packaged non-volatile memory drives 322 at the backside thereof, a first one of the single-layer-packaged volatile memory drives 323 may have the metal pillars or bumps 122 mounted onto the metal pads 77*e* of the second one of the single-layer-packaged non-volatile memory drives 322 at the backside thereof, and a second one of the single-layer-packaged volatile memory drives 323 may have the metal pillars or bumps 122 mounted onto the metal pads 77*e* of the first one of the single-layer-packaged volatile memory drives 323 at the backside thereof.

Figure 24H:
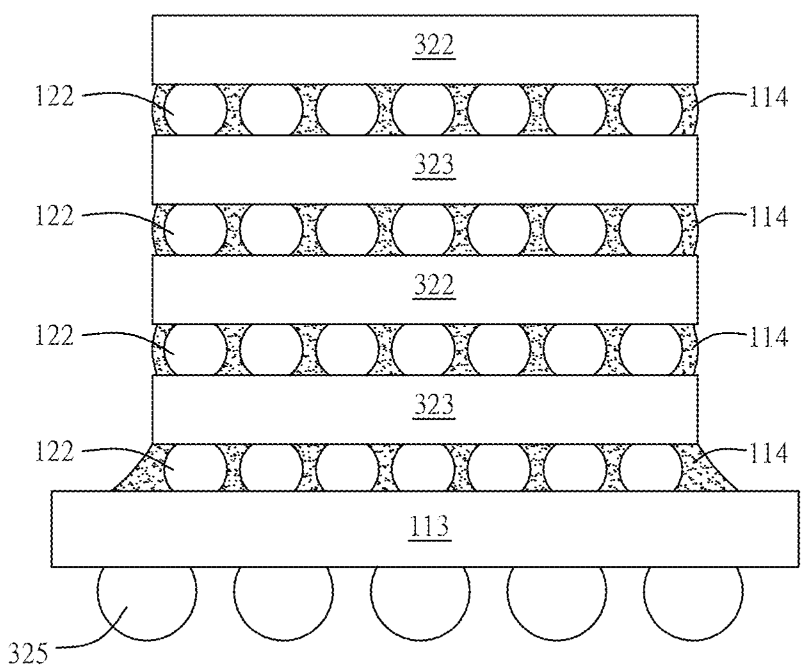

Referring to FIG. 24H, the POP assembly may be alternately stacked with the single-layer-packaged volatile memory drives 323 and the single-layer-packaged non-volatile memory drives 322 in accordance with the process as illustrated in FIGS. 14A through 22I. For example, a first one of the single-layer-packaged volatile memory drives 323 may have the metal pillars or bumps 122 mounted onto the metal pads 109 of the substrate unit 113 at the topside thereof, a first one of the single-layer-packaged non-volatile memory drives 322 may have the metal pillars or bumps 122 mounted onto the metal pads 77*e* of the first one of the single-layer-packaged volatile memory drives 323 at the backside thereof, a second one of the single-layer-packaged volatile memory drives 323 may have the metal pillars or bumps 122 mounted onto the metal pads 77*e* of the first one of the single-layer-packaged non-volatile memory drives 322 at the backside thereof, and a second one of the single-layer-packaged non-volatile memory drives 322 may have the metal pillars or bumps 122 mounted onto the metal pads 77*e* of the second one of the single-layer-packaged volatile memory drives 323 at the backside thereof.

Figure 24J:
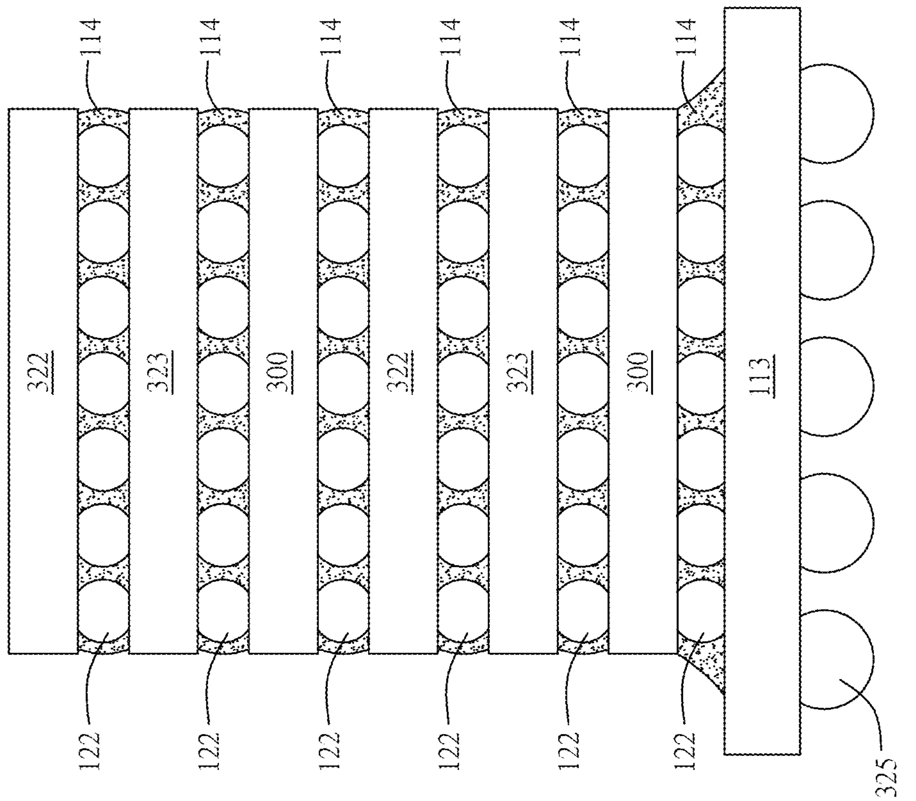
Figure 24I:
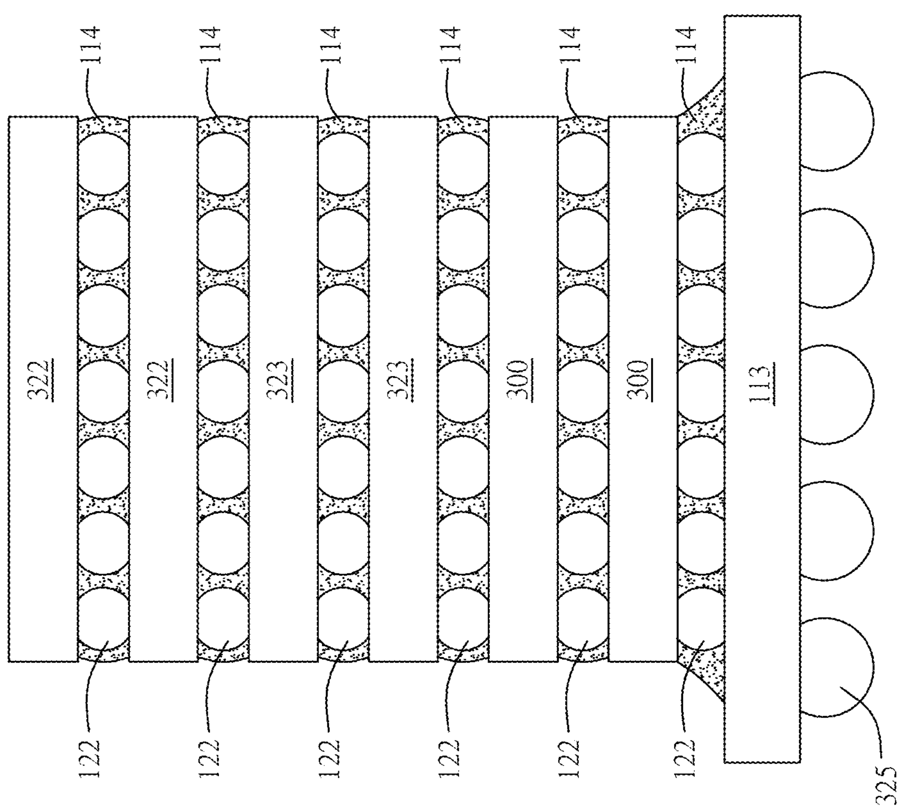

Referring to FIG. 24I, the POP assembly may be stacked with a group of the single-layer-packaged logic drives 300, a group of the single-layer-packaged non-volatile memory drives 322 and a group of the single-layer-packaged volatile memory drives 323 in accordance with the process as illustrated in FIGS. 14A through 22I. The group of the single-layer-packaged logic drives 300 may be arranged over the substrate unit 113 and under the group of the single-layer-packaged volatile memory drives 323, and the group of the single-layer-packaged volatile memory drives 323 may be arranged over the group of the single-layer-packaged logic drives 300 and under the group of the single-layer-packaged non-volatile memory drives 322. For example, a group of two single-layer-packaged logic drives 300 may be arranged over the substrate unit 113 and under a group of two single-layer-packaged volatile memory drives 323, and the group of two single-layer-packaged volatile memory drives 323 may be arranged over the group of two single-layer-packaged logic drives 300 and under a group of two single-layer-packaged non-volatile memory drives 322. A first one of the single-layer-packaged logic drives 300 may have the metal pillars or bumps 122 mounted onto the metal pads 109 of the substrate unit 113 at the topside thereof, a second one of the single-layer-packaged logic drives 300 may have the metal pillars or bumps 122 mounted onto the metal pads 77*e* of the first one of the COIP logic drives 300 at the backside thereof, a first one of the single-layer-packaged volatile memory drives 323 may have the metal pillars or bumps 122 mounted onto the metal pads 77*e* of the second one of the single-layer-packaged logic drives 300 at the backside thereof, a second one of the single-layer-packaged volatile memory drives 323 may have the metal pillars or bumps 122 mounted onto the metal pads 77*e* of the first one of the single-layer-packaged volatile memory drives 323 at the backside thereof, a first one of the single-layer-packaged non-volatile memory drives 322 may have the metal pillars or bumps 122 mounted onto the metal pads 77*e* of the second one of the single-layer-packaged volatile memory drives 323 at the backside thereof, and a second one of the single-layer-packaged non-volatile memory drives 322 may have the metal pillars or bumps 122 mounted onto the metal pads 77*e* of the first one of the single-layer-packaged non-volatile memory drives 322 at the backside thereof.

Referring to FIG. 24J, the POP assembly may be alternately stacked with the single-layer-packaged logic drives 300, the single-layer-packaged volatile memory drives 323 and the single-layer-packaged non-volatile memory drives 322 in accordance with the process as illustrated in 14A through 22I. For example, a first one of the single-layer-packaged logic drives 300 may have the metal pillars or bumps 122 mounted onto the metal pads 109 of the substrate unit 113 at the topside thereof, a first one of the single-layer-packaged volatile memory drives 323 may have the metal pillars or bumps 122 mounted onto the metal pads 77*e* of the first one of the single-layer-packaged logic drives 300 at the backside thereof, a first one of the single-layer-packaged non-volatile memory drives 322 may have the metal pillars or bumps 122 mounted onto the metal pads 77*e* of the first one of the single-layer-packaged volatile memory drives 323 at the backside thereof, a second one of the single-layer-packaged logic drives 300 may have the metal pillars or bumps 122 mounted onto the metal pads 77*e* of the first one of the single-layer-packaged non-volatile memory drives 322 at the backside thereof, a second one of the single-layer-packaged volatile memory drives 323 may have the metal pillars or bumps 122 mounted onto the metal pads 77*e* of the second one of the single-layer-packaged logic drives 300 at the backside thereof, and a second one of the single-layer-packaged non-volatile memory drives 322 may have the metal pillars or bumps 122 mounted onto the metal pads 77*e* of the second one of the single-layer-packaged volatile memory drives 323 at the backside thereof.

For each of the POP assemblies as seen in FIGS. 241 and 24J, each of its single-layer-packaged non-volatile memory drives 322 may be packaged with one or more of the NVMIC chips 250 configured to store the resulting values and/or programming codes in a non-volatile manner for programming the programmable logic blocks 201 and/or pass/no-pass switches 258 and/or cross-point switches 379 of each of the standard commodity FPGA IC chips 200 of each of its standard commodity logic drives 300 and for programming the pass/no-pass switches 258 and/or cross-point switches 379 of each of the DPIIC chips 410 of its standard commodity logic drive 300, as illustrated in FIGS. 6A-9. When said each of the POP assemblies is powered on, (1) the resulting values stored in one or more of the NVMIC chips 250 of each of its single-layer-packaged non-volatile memory drive 322 may be loaded to the memory cells 490 of each of the standard commodity FPGA IC chips 200 of each of its standard commodity logic drives 300 to be stored therein for programming the programmable logic blocks 201 of each of the standard commodity FPGA IC chips 200 of each of its standard commodity logic drives 300, (2) the programming codes stored in one or more of the NVMIC chips 250 of each of its single-layer-packaged non-volatile memory drive 322 may be loaded to the memory cells 362 of said each of the standard commodity FPGA IC chips 200 of said each of its standard commodity logic drives 300 to be stored therein for programming the pass/no-pass switches 258 and/or cross-point switches 379 of said each of the standard commodity FPGA IC chips 200 of said each of its standard commodity logic drives 300, and (3) the programming codes stored in one or more of the NVMIC chips 250 of each of its single-layer-packaged non-volatile memory drive 322 may be loaded to the memory cells 362 of each of the DPIIC chips 410 of said each of its standard commodity logic drives 300 to be stored therein for programming the pass/no-pass switches 258 and/or cross-point switches 379 of said each of the DPIIC chips 410 of said each of its standard commodity logic drives 300.

Figure 24K:
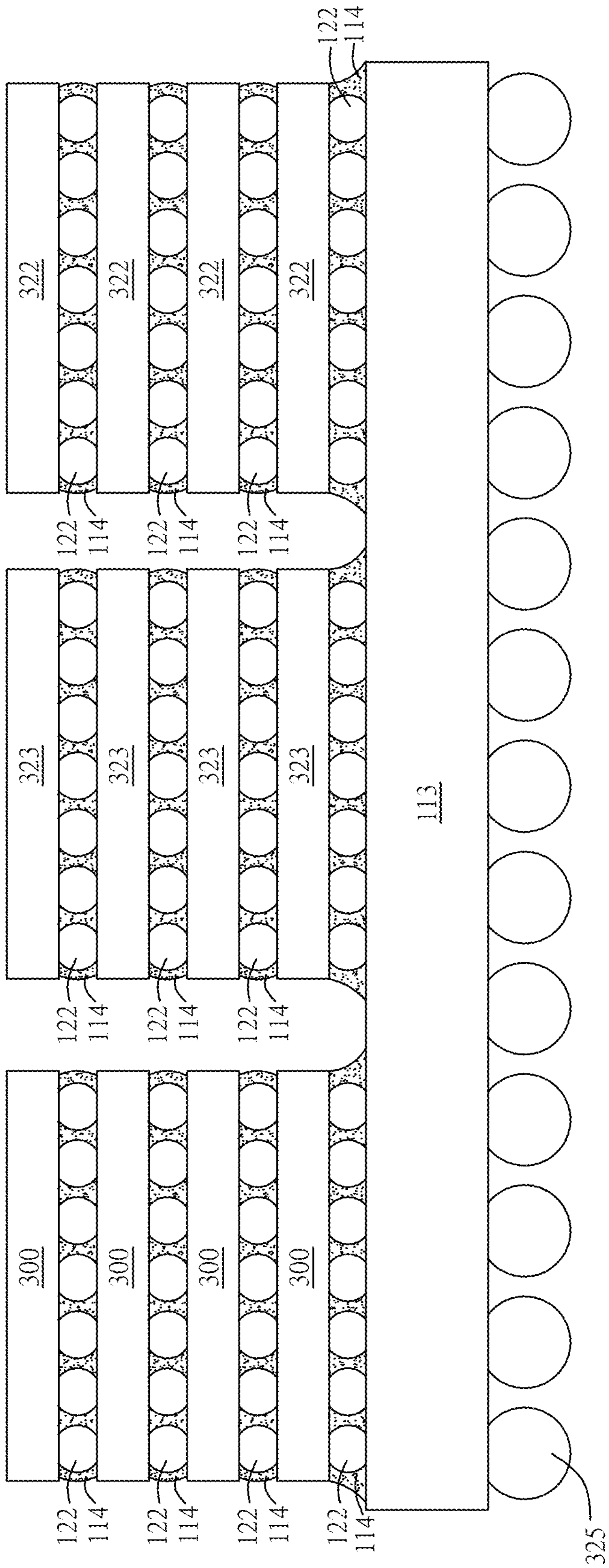

Referring to FIG. 24K, the POP assembly may be stacked with three stacks, one of which is stacked with only the single-layer-packaged logic drives 300 on the substrate unit 113 in accordance with the process as illustrated in FIGS. 14A through 22I, another one of which is stacked with only the single-layer-packaged non-volatile memory drives 322 on the substrate unit 113 in accordance with the process as illustrated in FIGS. 14A through 22I, and the other one of which is stacked with only the single-layer-packaged volatile memory drives 323 on the substrate unit 113 in accordance with the process as illustrated in FIGS. 14A through 22I. With respect to the process for forming the same, after the three stacks of the single-layer-packaged logic drives 300, the single-layer-packaged non-volatile memory drives 322 and the single-layer-packaged volatile memory drives 323 are stacked on a circuit carrier or substrate, like the one 110 as seen in FIG. 22A, the solder balls 325 are planted on a backside of the circuit carrier or substrate and then the circuit carrier or structure 110 may be separated, cut or diced into multiple individual substrate units 113, such as printed circuit boards (PCB) or BGA (Ball-Grid-array) substrates, by a laser cutting process or by a mechanical cutting process.

Figure 24L:
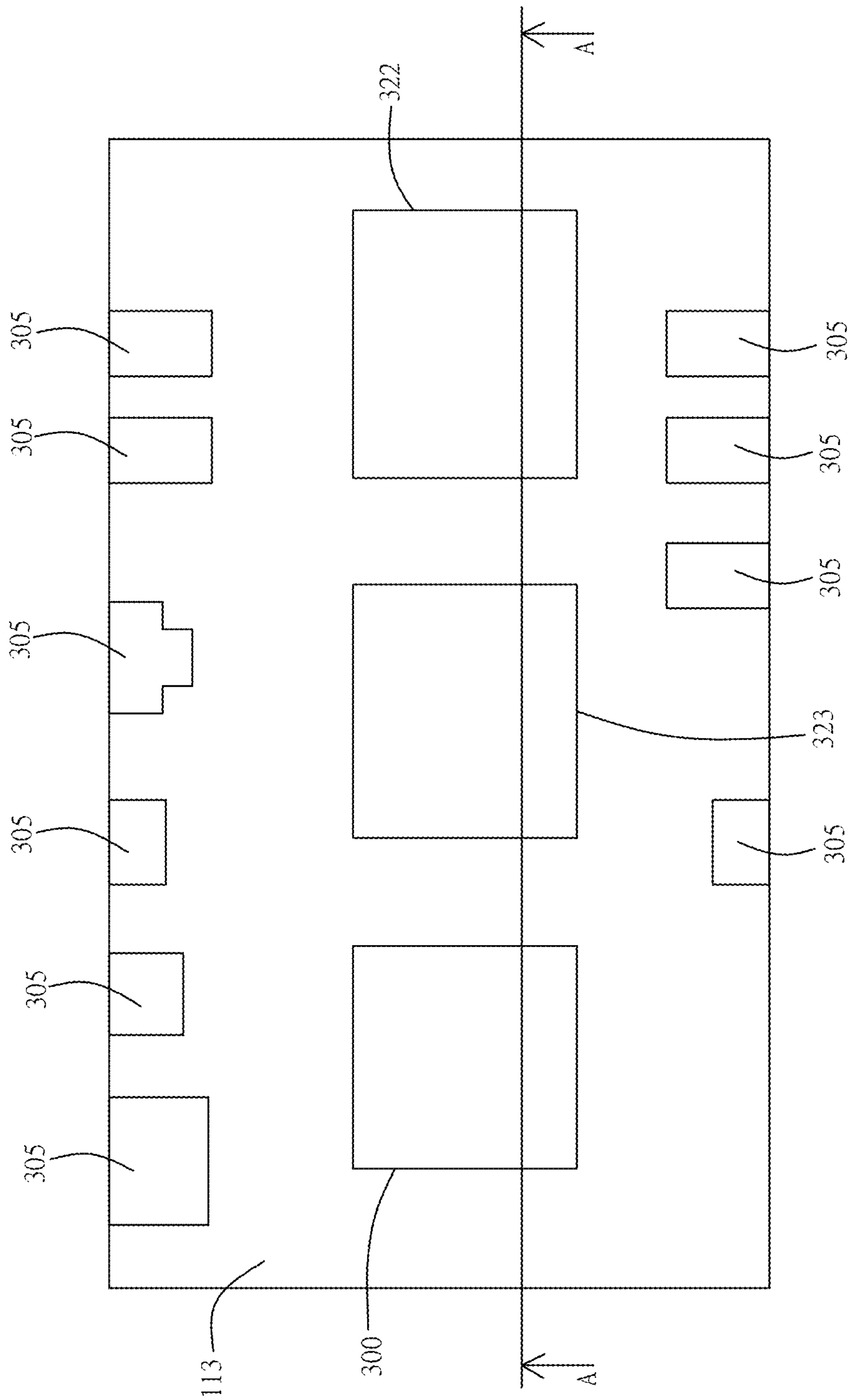

FIG. 24L is a schematically top view of multiple POP assemblies, which is a schematically cross-sectional view along a cut line A-A shown in FIG. 24K. Furthermore, multiple I/O ports 305 may be mounted onto the substrate unit 113 to have one or more universal-serial-bus (USB) plugs, high-definition-multimedia-interface (HDMI) plugs, audio plugs, internet plugs, power plugs and/or video-graphic-array (VGA) plugs inserted therein.

Application for Logic Drive

Figure 25A:
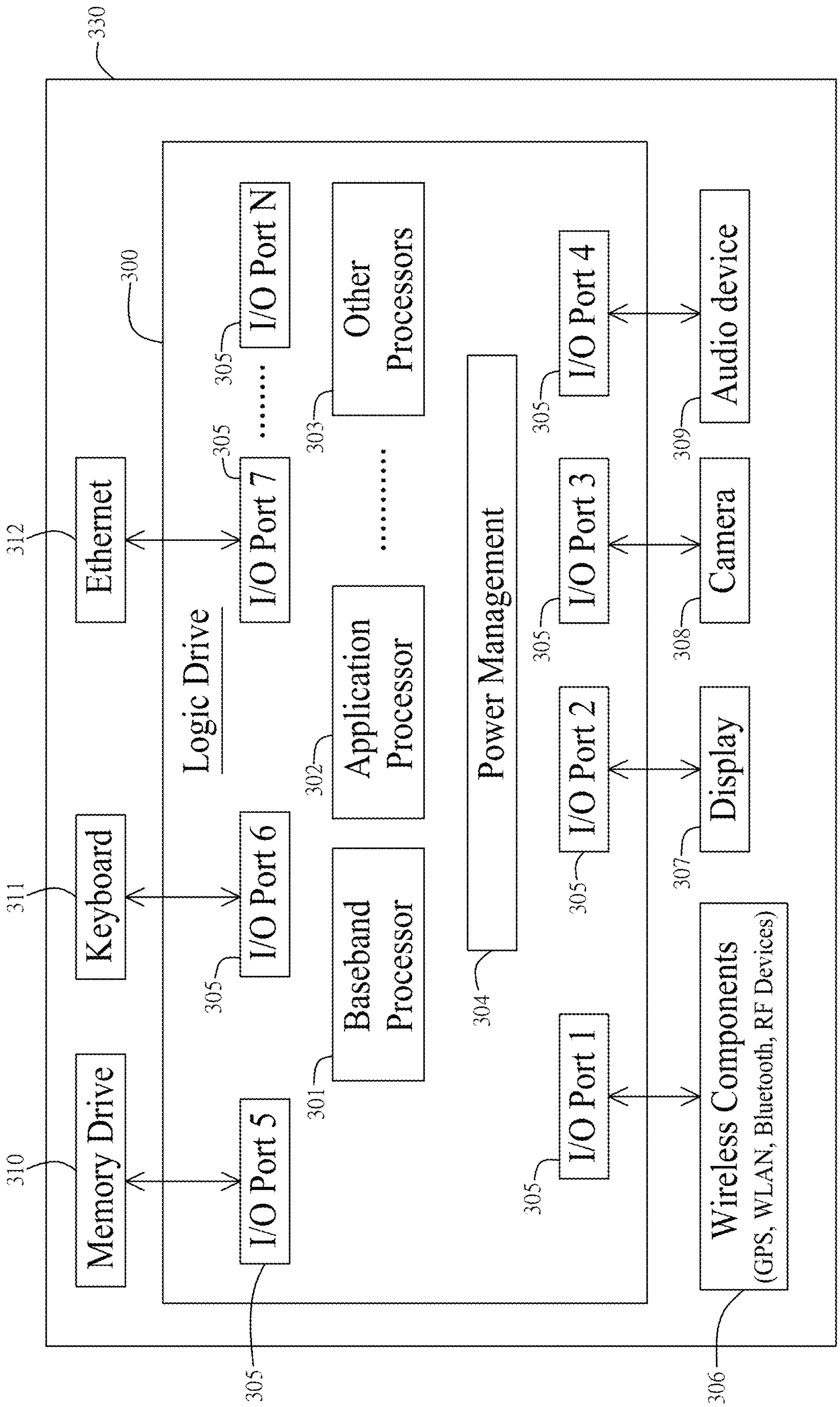
FIGS. 25A-25C are schematically views showing various applications for logic and memory drives in accordance with multiple embodiments of the present application.
Figure 25B:
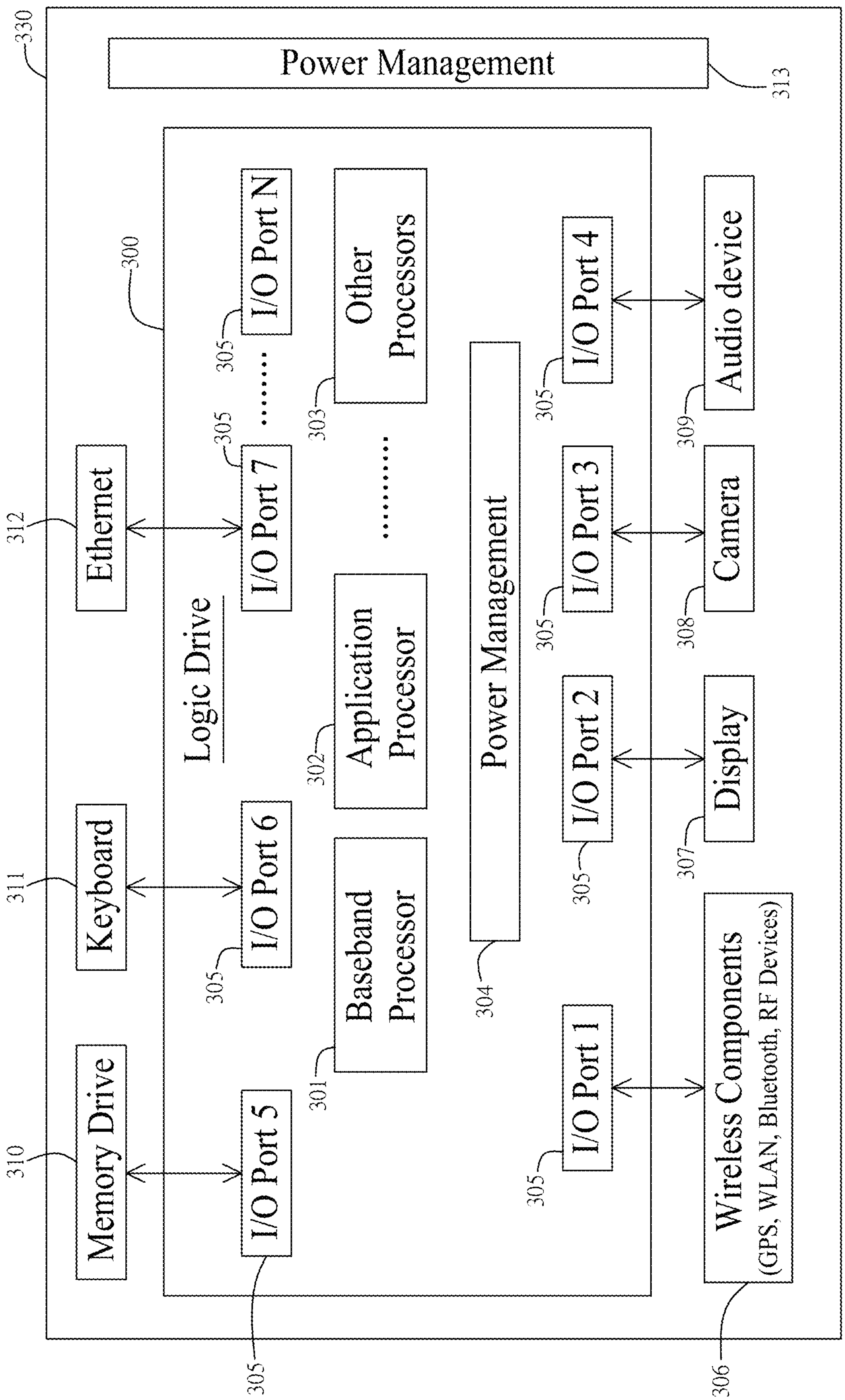
Figure 25C:
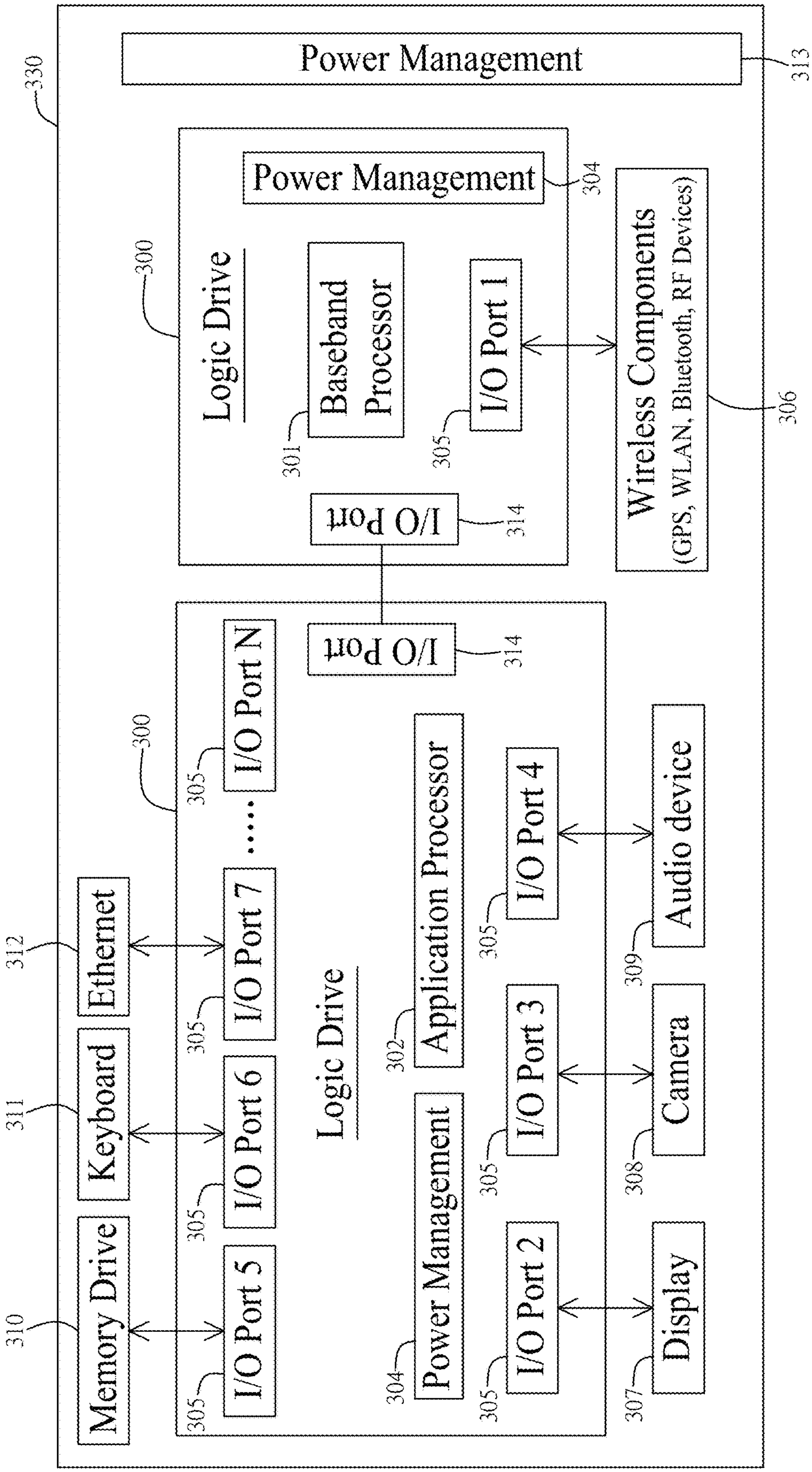

The current system design, manufactures and/or product business may be changed into a commodity system/product business, like current commodity DRAM, or flash memory business, by using the standardized commodity logic drive 300. A system, computer, processor, smart-phone, or electronic equipment or device may become a standard commodity hardware comprises mainly the memory drive 310 and the logic drive 300. FIGS. 25A-25C are schematically views showing various applications for logic and memory drives in accordance with multiple embodiments of the present application. Referring to FIGS. 25A-25C, the logic drive 300 in the aspect of the disclosure may have big enough or adequate number of inputs/outputs (I/Os) to support multiple I/O ports 305 used for programming all or most applications. The logic drive 300 may have I/Os, provided by the metal bumps 122, to support required I/O ports for programming, for example, to perform all or any combinations of functions of Artificial Intelligence (AI), machine learning, deep learning, big data, Internet Of Things (JOT), Virtual Reality (VR), Augmented Reality (AR), car electronics, Graphic Processing (GP), Digital Signal Processing (DSP), Micro Controlling (MC), and/or Central Processing (CP), and etc. The logic drive 300 may be configured for (1) programming or configuring Inputs/Outputs (I/Os) for software or application developers to load application software or program codes stored in the memory drive 310 to program or configure the logic drive 300 through the I/O ports 305 or connectors connecting or coupling to the I/Os of the logic drive 300; and (2) executing the I/Os for the users to perform their instructions through the I/O ports 305 or connectors connecting or coupling to the I/Os of the logic drive 300, for example, generating a Microsoft Word file, or a PowerPoint presentation file, or an Excel file. The I/O ports 305 or connectors connecting or coupling to the corresponding I/Os of the logic drive 300 may comprise one or multiple (2, 3, 4, or more than 4) Universal Serial Bus (USB) ports, one or more IEEE 1394 ports, one or more Ethernet ports, one or more high-definition-multimedia-interface (HDMI) ports, one or more video-graphic-array (VGA) ports, one or more power-supply ports, one or more audio ports or serial ports, for example, RS-232 or COM (communication) ports, wireless transceiver I/Os, and/or Bluetooth transceiver I/Os, and etc. The I/O ports 305 or connector may be placed, located, assembled, or connected onto a substrate, film or board, such as Printed Circuit Board (PCB), silicon substrate with interconnection schemes, metal substrate with interconnection schemes, glass substrate with interconnection schemes, ceramic substrate with interconnection schemes, or the flexible film 126 with interconnection schemes as illustrated in FIG. 18W. The logic drive 300 is assembled on the substrate, film or board using its metal pillars or bumps 122, similar to the flip-chip assembly of the chip packaging technology, or the Chip-On-Film (COF) assembly technology used in the LCD driver packaging technology.

FIG. 25A is a schematically view showing an application for a logic drive or FPGA IC module in accordance with an embodiment of the present application. Referring to FIG. 25A, a laptop or desktop computer, mobile or smart phone or artificial-intelligence (AI) robot 330 may include the logic drive 300 that may be programmed for multiple processors including a baseband processor 301, application processor 302 and other processors 303, wherein the application processor 302 may include a central processing unit (CPU), southbridge, northbridge and graphical processing unit (GPU), and the other processors 303 may include a radio frequency (RF) processor, wireless connectivity processor and/or liquid-crystal-display (LCD) control module. The logic drive 300 may further include a function of power management 304 to put each of the processors 301, 302 and 303 into the lowest power demand state available via software. Each of the I/O ports 305 may connect a subset of the metal pillars or bumps 122 of the logic drive 300 to various external devices. For example, these I/O ports 305 may include I/O port 1 for connection to wireless communication components 306, such as global-positioning-system (GPS) component, wireless-local-area-network (WLAN) component, bluetooth components or RF devices, of the computer, phone or robot 330. These I/O ports 305 may include I/O port 2 for connection to various display devices 307, such as LCD display device or organic-light-emitting-diode (OLED) display device, of the computer, phone or robot 330. These I/O ports 305 may include I/O port 3 for connection to a camera 308 of the computer, phone or robot 330. These I/O ports 305 may include I/O port 4 for connection to various audio devices 309, such as microphone or speaker, of the computer, phone or robot 330. These I/O ports 305 or connectors connecting or coupling to the corresponding I/Os of the logic drive may include I/O port 5, such as Serial Advanced Technology Attachment (SATA) ports or Peripheral Components Interconnect express (PCIe) ports, for communication with the memory drive, disk or device 310, such as hard disk drive, flash drive and/or solid-state drive, of the computer, phone or robot 330. These I/O ports 305 may include I/O port 6 for connection to a keyboard 311 of the computer, phone or robot 330.

These I/O ports 305 may include I/O port 7 for connection to Ethernet networking 312 of the computer, phone or robot 330.

Alternatively, FIG. 25B is a schematically view showing an application for a logic drive or FPGA IC module in accordance with an embodiment of the present application. The scheme shown in FIG. 25B is similar to that illustrated in FIG. 25A, but the difference therebetween is that the computer, phone or robot 330 is further provided with a power-management chip 313 therein but outside the logic drive 300, wherein the power-management chip 313 is configured to put each of the logic drive 300, wireless communication components 306, display devices 307, camera 308, audio devices 309, memory drive, disk or device 310, keyboard 311 and Ethernet networking 312 into the lowest power demand state available via software.

Alternatively, FIG. 25C is a schematically view showing an application for a logic drive or FPGA IC module in accordance with an embodiment of the present application. Referring to FIG. 25C, a laptop or desktop computer, mobile or smart phone or artificial-intelligence (AI) robot 331 in another embodiment may include a plurality of the logic drive 300 that may be programmed for multiple processors. For example, a first one, i.e., left one, of the logic drives 300 may be programmed for the baseband processor 301; a second one, i.e., right one, of the logic drives 300 may be programmed for the application processor 302 including a central processing unit (CPU), southbridge, northbridge and graphical processing unit (GPU). The first one of the logic drives 300 may further include a function of power management 304 to put the baseband processor 301 into the lowest power demand state available via software. The second one of the logic drives 300 may further include a function of power management 304 to put the application processor 302 into the lowest power demand state available via software. The first and second ones of the logic drives 300 may further include various I/O ports 305 for various connections to various devices. For example, these I/O ports 305 may include I/O port 1 set on the first one of the logic drives 300 for connection to wireless communication components 306, such as global-positioning-system (GPS) component, wireless-local-area-network (WLAN) component, bluetooth components or RF devices, of the computer, phone or robot 330. These I/O ports 305 may include I/O port 2 set on the second one of the logic drives 300 for connection to various display devices 307, such as LCD display device or organic-light-emitting-diode (OLED) display device, of the computer, phone or robot 330. These I/O ports 305 may include I/O port 3 set on the second one of the logic drives 300 for connection to a camera 308 of the computer, phone or robot 330. These I/O ports 305 may include I/O port 4 set on the second one of the logic drives 300 for connection to various audio devices 309, such as microphone or speaker, of the computer, phone or robot 330. These I/O ports 305 may include I/O port 5 set on the second one of the logic drives 300 for connection to a memory drive, disk or device 310, such as hard disk or solid-state disk or drive (SSD), of the computer, phone or robot 330. These I/O ports 305 may include I/O port 6 set on the second one of the logic drives 300 for connection to a keyboard 311 of the computer, phone or robot 330. These I/O ports 305 may include I/O port 7 set on the second one of the logic drives 300 for connection to Ethernet networking 312 of the computer, phone or robot 330. Each of the first and second ones of the logic drives 300 may have dedicated I/O ports 314 for data transmission between the first and second ones of the logic drives 300. The computer, phone or robot 330 is further provided with a power-management chip 313 therein but outside the first and second ones of the logic drives 300, wherein the power-management chip 313 is configured to put each of the first and second ones of the logic drives 300, wireless communication components 306, display devices 307, camera 308, audio devices 309, memory drive, disk or device 310, keyboard 311 and Ethernet networking 312 into the lowest power demand state available via software.

Memory Drive

Figure 26A:
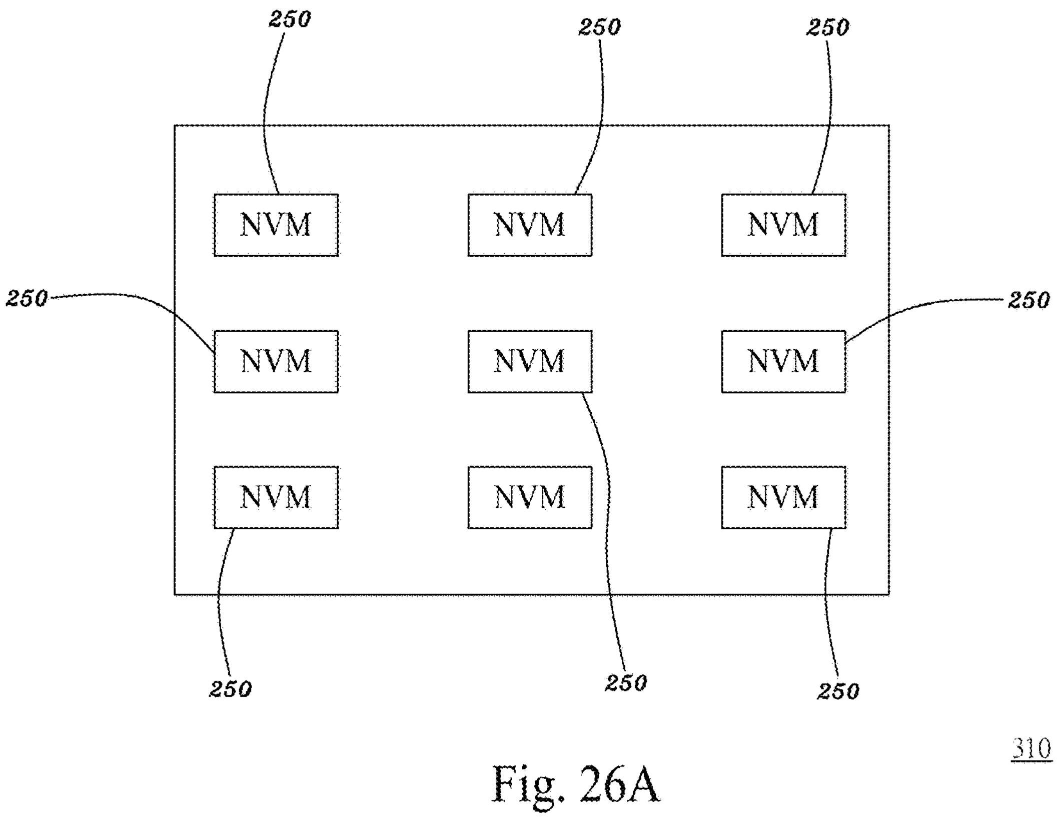
FIGS. 26A-26F are schematically top views showing various standard commodity memory drives in accordance with an embodiment of the present application.

The disclosure also relates to a standard commodity memory drive, package, package drive, device, module, disk, disk drive, solid-state disk, or solid-state drive 310 (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity non-volatile memory IC chips 250 for use in data storage, as seen in FIG. 26A. FIG. 26A is a schematically top view showing a standard commodity memory drive in accordance with an embodiment of the present application. Referring to FIG. 26A, a first type of memory drive 310 may be a non-volatile memory drive 322, which may be used for the drive-to-drive assembly as seen in FIGS. 24A-24K, packaged with multiple high speed, high bandwidth non-volatile memory (NVM) IC chips 250 for the semiconductor chips 100 arranged in an array, wherein the architecture of the memory drive 310 and the process for forming the same may be referred to that of the logic drive 300 and the process for forming the same, but the difference therebetween is the semiconductor chips 100 are arranged as shown in FIG. 26A. Each of the high speed, high bandwidth non-volatile memory IC chips 250 may be a NAND or NOR flash chip in a bare-die format or in a multi-chip flash package format. Data stored in the non-volatile memory IC chips 250 of the standard commodity memory drive 310 are kept even if the memory drive 310 is powered off. Alternatively, the high speed, high bandwidth non-volatile memory IC chips 250 may be Non-Volatile Radom-Access-Memory (NVRAM) IC chips in a bare-die format or in a package format. The NVRAM may be a Ferroelectric RAM (FRAM), Magnetoresistive RAM (MRAM), Resistive RAM (RRAM) or Phase-change RAM (PRAM). Each of the NAND or NOR flash chips 250 may have a standard memory density, capacity or size of greater than or equal to 64 Mb, 512 Mb, 1 Gb, 4 Gb, 16 Gb, 64 Gb, 128 Gb, 256 Gb, or 512 Gb, wherein "b" is bits. Each of the NAND or NOR flash chips 250 may be designed and fabricated using advanced NAND or NOR flash technology nodes or generations, for example, more advanced than or equal to 45 nm, 28 nm, 20 nm, 16 nm, and/or 10 nm, wherein the advanced NAND or NOR flash technology may comprise Single Level Cells (SLC) or multiple level cells (MLC) (for example, Double Level Cells DLC, or triple Level cells TLC) in a 2D-NAND or a 3D NAND structure. The 3D NAND structures may comprise multiple stacked layers or levels of NAND cells, for example, greater than or equal to 4, 8, 16, 32 stacked layers or levels of NAND cells. Accordingly, the standard commodity memory drive 310 may have a standard non-volatile memory density, capacity or size of greater than or equal to 8 MB, 64 MB, 128 GB, 512 GB, 1 GB, 4 GB, 16 GB, 64 GB, 256 GB, or 512 GB, wherein "B" is bytes, each byte has 8 bits.

Figure 26B:
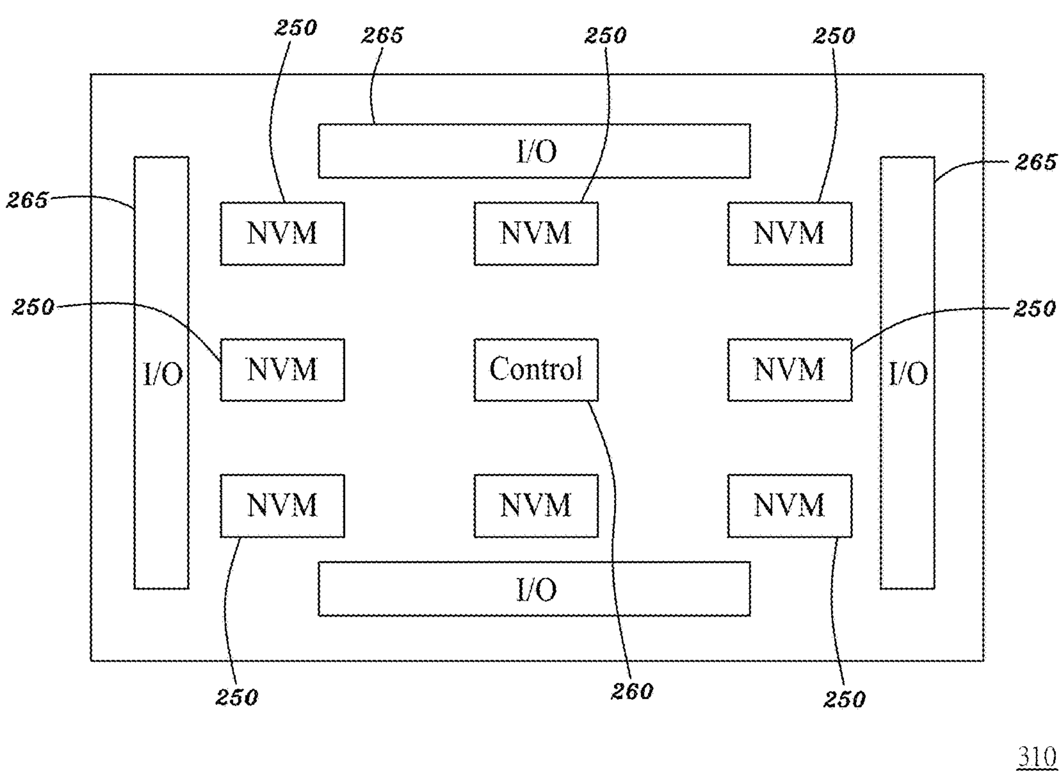

FIG. 26B is a schematically top view showing another standard commodity memory drive in accordance with an embodiment of the present application. Referring to FIG. 26B, a second type of memory drive 310 may be a non-volatile memory drive 322, which may be used for the drive-to-drive assembly as seen in FIGS. 24A-24K, packaged with multiple non-volatile memory IC chips 250 as illustrated in FIG. 26A, multiple dedicated I/O chips 265 and a dedicated control chip 260 for the semiconductor chips 100, wherein the non-volatile memory IC chips 250 and dedicated control chip 260 may be arranged in an array. The architecture of the memory drive 310 and the process for forming the same may be referred to that of the logic drive 300 and the process for forming the same, but the difference therebetween is the semiconductor chips 100 are arranged as shown in FIG. 26B. The dedicated control chip 260 may be surrounded by the non-volatile memory IC chips 250. Each of the dedicated I/O chips 265 may be arranged along a side of the memory drive 310. The specification of the non-volatile memory IC chip 250 may be referred to that as illustrated in FIG. 26A. The specification of the dedicated control chip 260 packaged in the memory drive 310 may be referred to that of the dedicated control chip 260 packaged in the logic drive 300 as illustrated in FIG. 11A. The specification of the dedicated I/O chip 265 packaged in the memory drive 310 may be referred to that of the dedicated I/O chip 265 packaged in the logic drive 300 as illustrated in FIGS. 11A-11N.

Figure 26C:
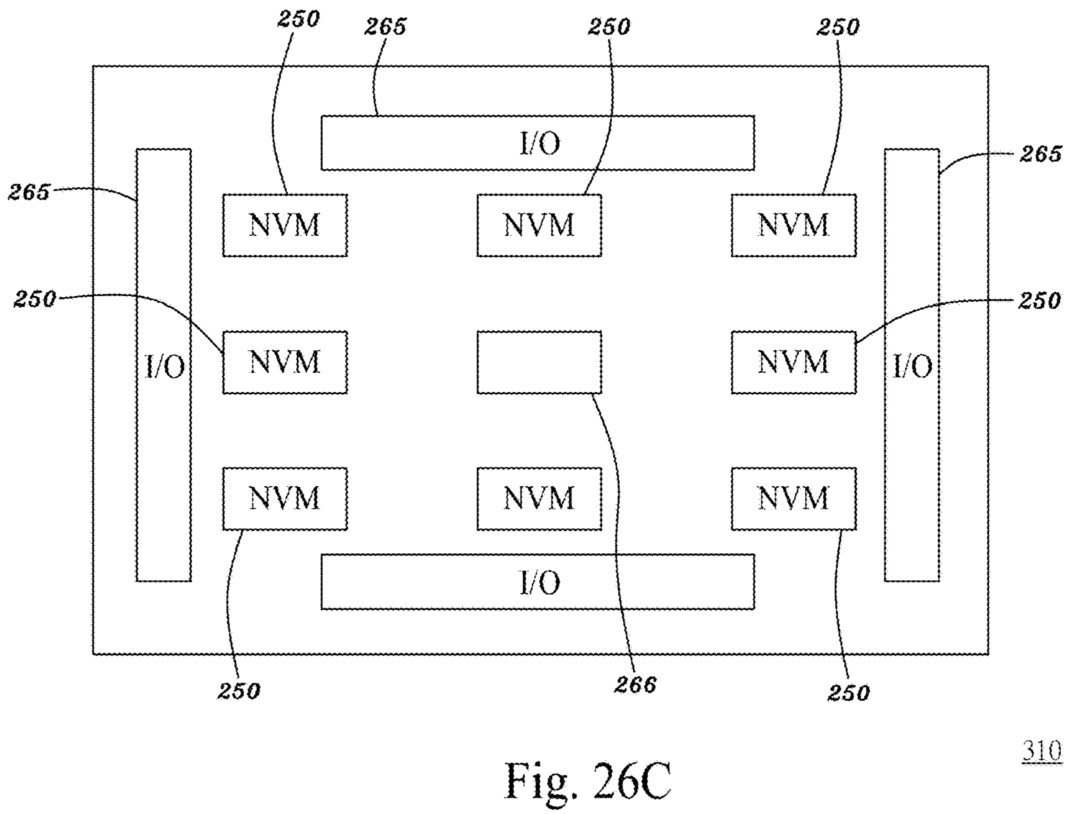

FIG. 26C is a schematically top view showing another standard commodity memory drive in accordance with an embodiment of the present application. Referring to FIG. 26C, the dedicated control chip 260 and dedicated I/O chips 265 have functions that may be combined into a single chip 266, i.e., dedicated control and I/O chip, to perform above-mentioned functions of the control and I/O chips 260 and 265. A third type of memory drive 310 may be a non-volatile memory drive 322, which may be used for the drive-to-drive assembly as seen in FIGS. 24A-24K, packaged with multiple non-volatile memory IC chips 250 as illustrated in FIG. 26A, multiple dedicated I/O chips 265 and a dedicated control and I/O chip 266 for the semiconductor chips 100, wherein the non-volatile memory IC chips 250 and dedicated control and I/O chip 266 may be arranged in an array. The architecture of the memory drive 310 and the process for forming the same may be referred to that of the logic drive 300 and the process for forming the same, but the difference therebetween is the semiconductor chips 100 are arranged as shown in FIG. 26C. The dedicated control and I/O chip 266 may be surrounded by the non-volatile memory IC chips 250. Each of the dedicated I/O chips 265 may be arranged along a side of the memory drive 310. The specification of the non-volatile memory IC chip 250 may be referred to that as illustrated in FIG. 26A. The specification of the dedicated control and I/O chip 266 packaged in the memory drive 310 may be referred to that of the dedicated control and I/O chip 266 packaged in the logic drive 300 as illustrated in FIG. 11B. The specification of the dedicated I/O chip 265 packaged in the memory drive 310 may be referred to that of the dedicated I/O chip 265 packaged in the logic drive 300 as illustrated in FIGS. 11A-11N.

Figure 26D:
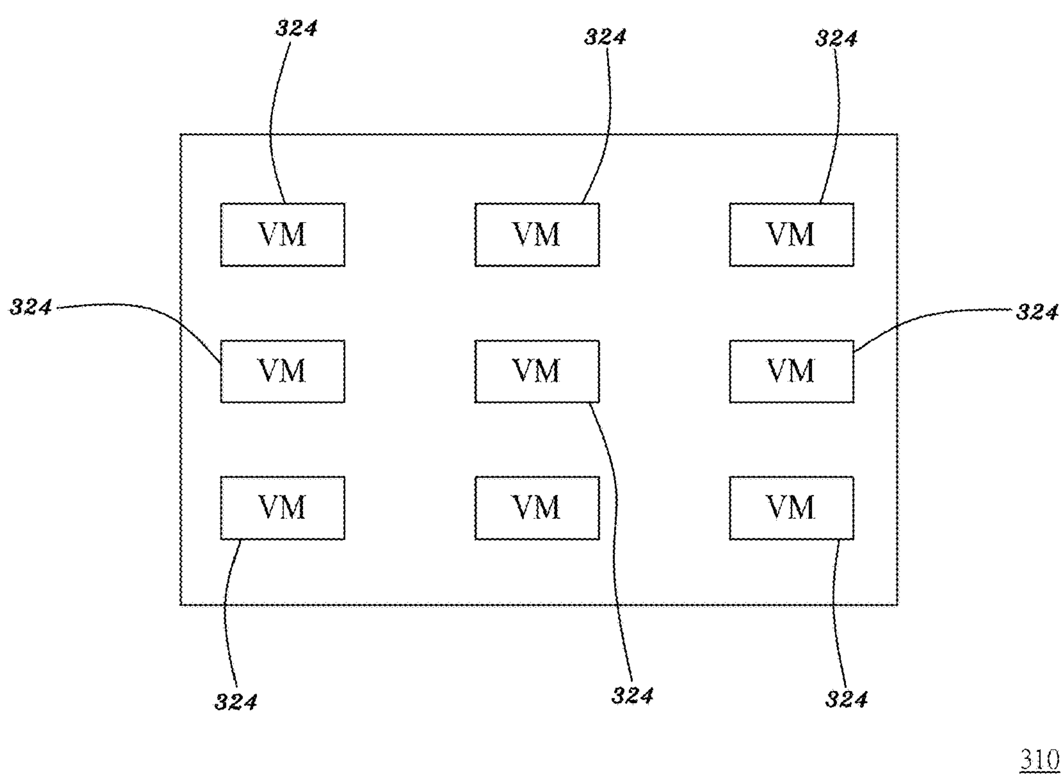

FIG. 26D is a schematically top view showing a standard commodity memory drive in accordance with an embodiment of the present application. Referring to FIG. 26D, a fourth type of memory drive 310 may be a volatile memory drive 323, which may be used for the drive-to-drive assembly as seen in FIGS. 24A-24K, packaged with multiple volatile memory (VM) IC chips 324, such as high speed, high bandwidth DRAM chips as illustrated for the one 321 packaged in the logic drive 300 as illustrated in FIGS. 11A-11N or high speed, high bandwidth cache SRAM chips, for the semiconductor chips 100 arranged in an array, wherein the architecture of the memory drive 310 and the process for forming the same may be referred to that of the logic drive 300 and the process for forming the same, but the difference therebetween is the semiconductor chips 100 are arranged as shown in FIG. 26D. In a case, all of the volatile memory (VM) IC chips 324 of the memory drive 310 may be DRAM chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM chips and SRAM chips.

Figure 26E:
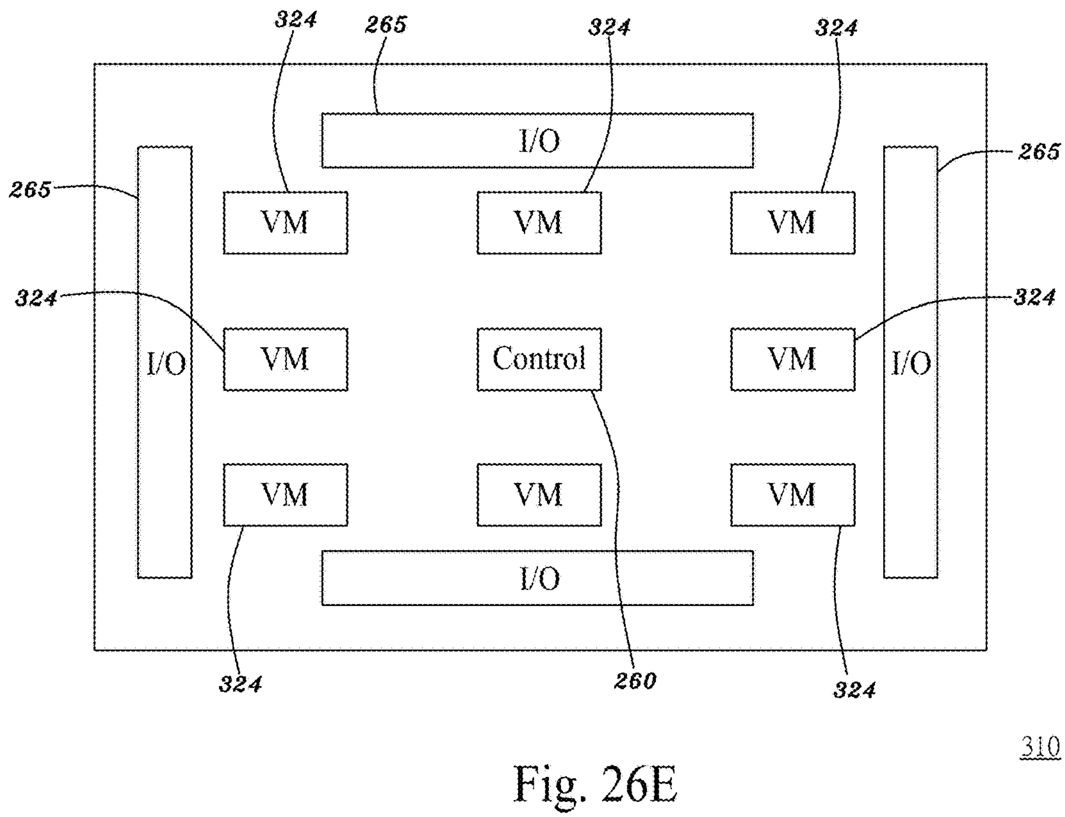

FIG. 26E is a schematically top view showing another standard commodity memory drive in accordance with an embodiment of the present application. Referring to FIG. 26E, a fifth type of memory drive 310 may be a volatile memory drive 323, which may be used for the drive-to-drive assembly as seen in FIGS. 24A-24K, packaged with multiple volatile memory (VM) IC chips 324, such as high speed, high bandwidth DRAM chips or high speed, high bandwidth cache SRAM chips, multiple dedicated I/O chips 265 and a dedicated control chip 260 for the semiconductor chips 100, wherein the volatile memory (VM) IC chips 324 and dedicated control chip 260 may be arranged in an array, wherein the architecture of the memory drive 310 and the process for forming the same may be referred to that of the logic drive 300 and the process for forming the same, but the difference therebetween is the semiconductor chips 100 are arranged as shown in FIG. 26E. In this case, the locations for mounting each of the DRAM chips 321 may be changed for mounting a SRAM chip. The dedicated control chip 260 may be surrounded by the volatile memory chips such as DRAM chips 321 or SRAM chips. Each of the dedicated I/O chips 265 may be arranged along a side of the memory drive 310. In a case, all of the volatile memory (VM) IC chips 324 of the memory drive 310 may be DRAM chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM chips and SRAM chips. The specification of the dedicated control chip 260 packaged in the memory drive 310 may be referred to that of the dedicated control chip 260 packaged in the logic drive 300 as illustrated in FIG. 11A. The specification of the dedicated I/O chip 265 packaged in the memory drive 310 may be referred to that of the dedicated I/O chip 265 packaged in the logic drive 300 as illustrated in FIGS. 11A-11N.

Figure 26F:
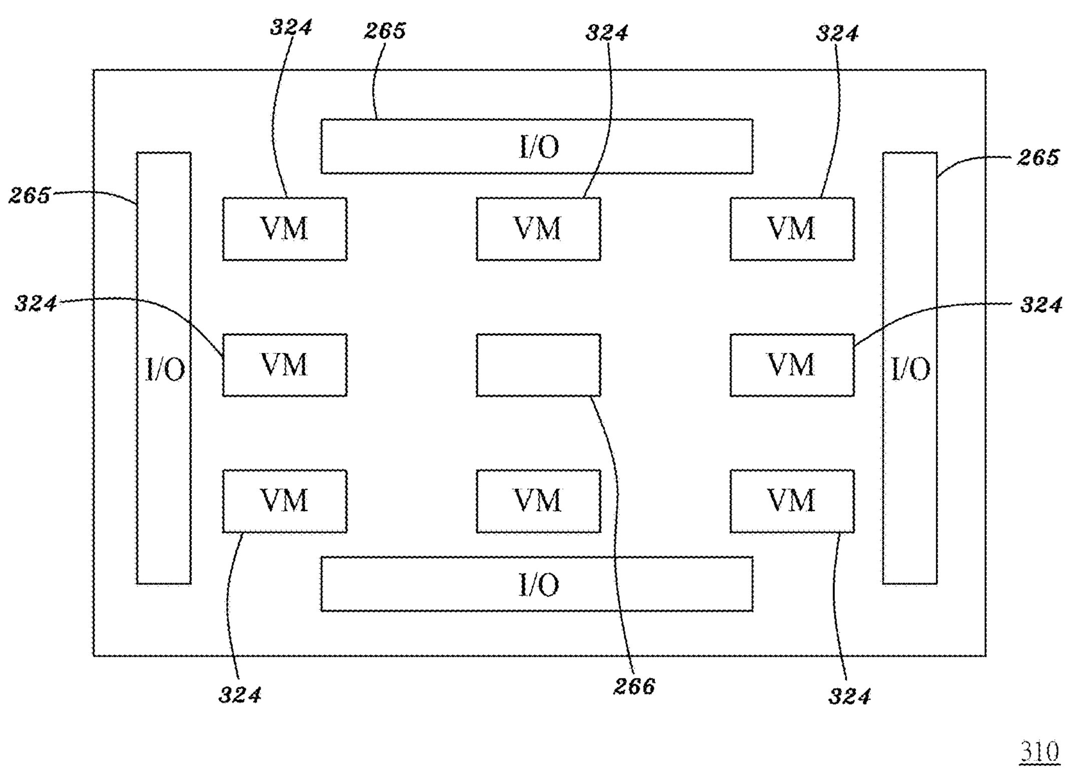

FIG. 26F is a schematically top view showing another standard commodity memory drive in accordance with an embodiment of the present application. Referring to FIG. 26F, the dedicated control chip 260 and dedicated I/O chips 265 have functions that may be combined into a single chip 266, i.e., dedicated control and I/O chip, to perform above-mentioned functions of the control and I/O chips 260 and 265. A sixth type of memory drive 310 may be a volatile memory drive 323, which may be used for the drive-to-drive assembly as seen in FIGS. 24A-24K, packaged with multiple volatile memory (VM) IC chips 324, such as high speed, high bandwidth DRAM chips as illustrated for the one 321 packaged in the logic drive 300 as illustrated in FIGS. 11A-11N or high speed, high bandwidth cache SRAM chips, multiple dedicated I/O chips 265 and the dedicated control and I/O chip 266 for the semiconductor chips 100, wherein the volatile memory (VM) IC chips 324 and dedicated control and I/O chip 266 may be arranged in an array as shown in FIG. 26F. The dedicated control and I/O chip 266 may be surrounded by the volatile memory chips such as DRAM chips 321 or SRAM chips. In a case, all of the volatile memory (VM) IC chips 324 of the memory drive 310 may be DRAM chips 321. Alternatively, all of the volatile memory (VM) IC chips 324 of the memory drive 310 may be SRAM chips. Alternatively, all of the volatile memory (VM) IC chips 324 of the memory drive 310 may be a combination of DRAM chips and SRAM chips. The architecture of the memory drive 310 and the process for forming the same may be referred to that of the logic drive 300 and the process for forming the same, but the difference therebetween is the semiconductor chips 100 are arranged as shown in FIG. 26F. Each of the dedicated I/O chips 265 may be arranged along a side of the memory drive 310. The specification of the dedicated control and I/O chip 266 packaged in the memory drive 310 may be referred to that of the dedicated control and I/O chip 266 packaged in the logic drive 300 as illustrated in FIG. 11B. The specification of the dedicated I/O chip 265 packaged in the memory drive 310 may be referred to that of the dedicated I/O chip 265 packaged in the logic drive 300 as illustrated in FIGS. 11A-11N. The specification of the DRAM chips 321 packaged in the memory drive 310 may be referred to that of the DRAM chips 321 packaged in the logic drive 300 as illustrated in FIGS. 11A-11N.

Alternatively, another type of memory drive 310 may include a combination of non-volatile memory (NVM) IC chips 250 and volatile memory chips. For example, referring to FIGS. 26A-26C, some of the locations for mounting the NVMIC chips 250 may be changed for mounting the volatile memory chips, such as high speed, high bandwidth DRAM chips 321 or high speed, high bandwidth SRAM chips.

FISC-to-FISC Assembly for Logic and Memory Drives

Figure 27A:
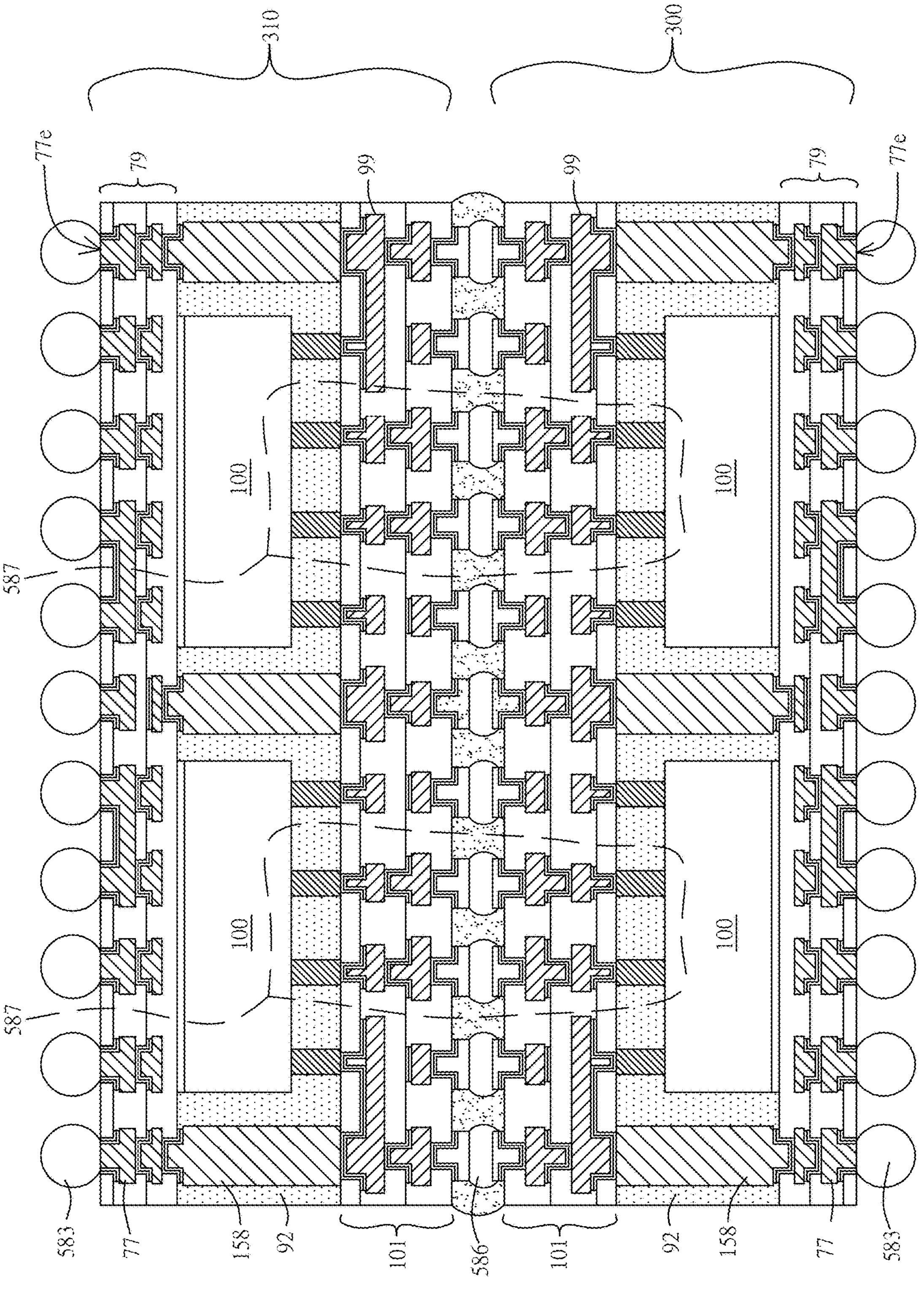
FIGS. 27A-27C are cross-sectional views showing various assemblies for logic and memory drives in accordance with an embodiment of the present application.
Figure 27B:
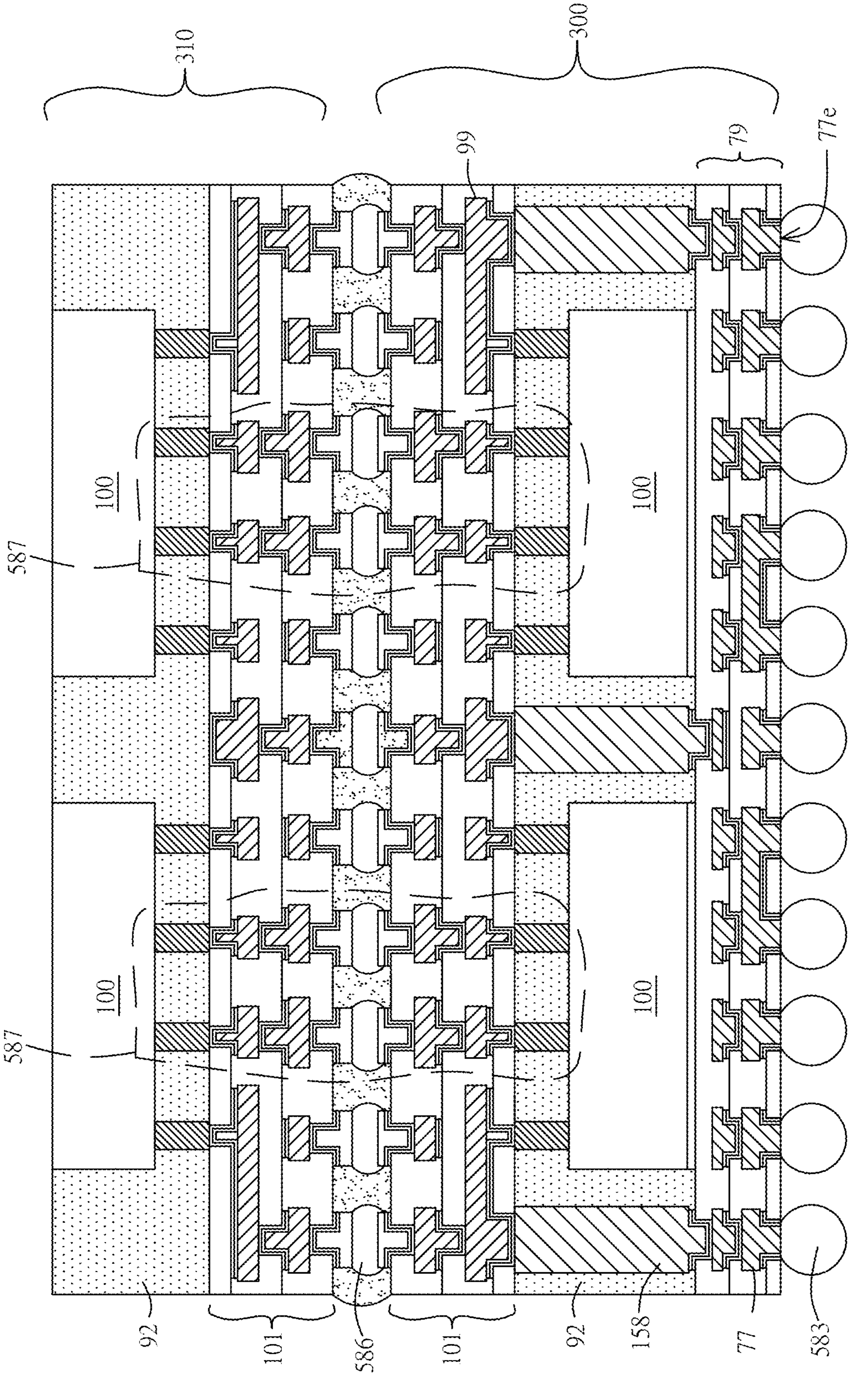
Figure 27C:
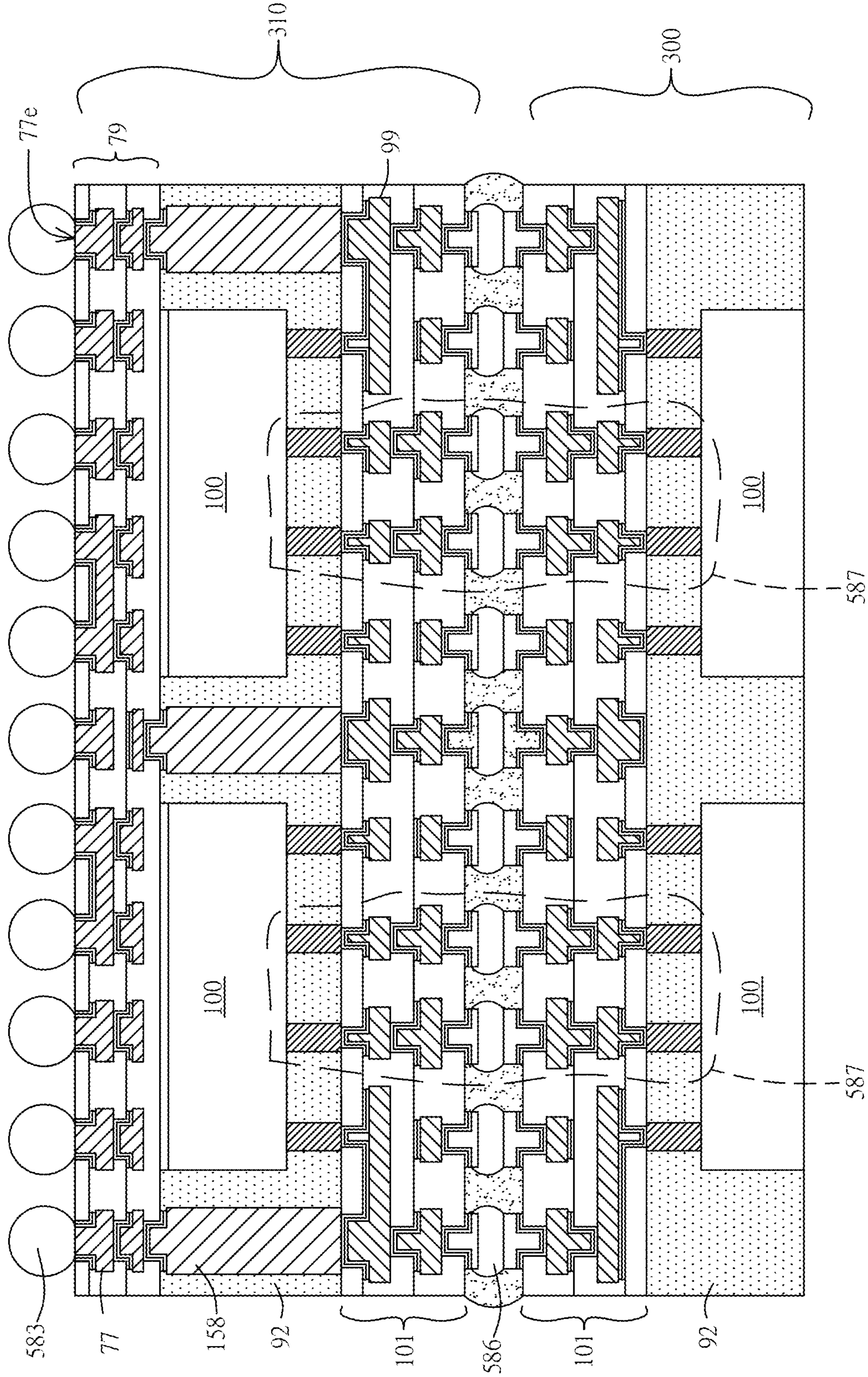

Alternatively, FIGS. 27A-27C are cross-sectional views showing various assemblies for logic and memory drives in accordance with an embodiment of the present application. Referring to FIG. 27A, the memory drive 310 may have the metal bumps 122 to be bonded to the metal bumps 122 of the logic drive 300 to form multiple bonded contacts 586 between the memory and logic drives 310 and 300. For example, one of the logic and memory drives 300 and 310 may be provided the metal pillars or bumps 122 of the fourth type having the solder balls or bumps, as illustrated in FIG. 18R, to be bonded to the copper layer of the metal pillars or bumps 122 of the first type of the other of the logic and memory drives 300 and 310 so as to form the bonded contacts 586 between the memory and logic drives 310 and 300.

For high speed and high bandwidth communications between one of the semiconductor chips 100, e.g., non-volatile or volatile memory chip 250 or 324 as illustrated in FIGS. 34A-34F, of the memory drive 310 and one of the semiconductor chips 100, e.g., FPGA IC chip 200 or PCIC chip 269 as illustrated in FIGS. 11A-11N, of the logic drive 300, said one of the semiconductor chips 100 of the memory drive 310 may be aligned with and positioned vertically over said one of the semiconductor chips 100 of the logic drive 300.

Referring to FIG. 27A, the memory drive 310 may include multiple first stacked portions provided by the interconnection metal layers 99 of its TISD 101, wherein each of the first stacked portions may be aligned with and stacked on or over one of the bonded contacts 586 and positioned between said one of its semiconductor chips 100 and said one of the bonded contacts 586. Further, for the memory drive 310, multiple of its micro-bumps 34 may be aligned with and stacked on or over its first stacked portions respectively and positioned between said one of its semiconductor chips 100 and its first stacked portions to connect said one of its semiconductor chips 100 to its first stacked portions respectively.

Referring to FIG. 27A, the logic drive 300 may include multiple second stacked portions provided by the interconnection metal layers 99 of its TISD 101, wherein each of the second stacked portions may be aligned with and stacked under or below one of the bonded contacts 586 and positioned between said one of its semiconductor chips 100 and said one of the bonded contacts 586. Further, for the logic drive 300, multiple of its micro-bumps 34 may be aligned with and stacked under or below its second stacked portions respectively and positioned between said one of its semiconductor chips 100 and its second stacked portions to connect said one of its semiconductor chips 100 to its second stacked portions respectively.

Accordingly, referring to FIG. 27A, from bottom to top, one of the micro-bumps 34 of the logic drive 300, one of the second stacked portions of the TISD 101 of the logic drive 300, one of the bonded contacts 586, one of the first stacked portions of the TISD 101 of the memory drive 310 and one of the micro-bumps 34 of the memory drive 310 may be stacked together in a vertical direction to form a vertical stacked path 587 between said one of the semiconductor chips 100 of the logic drive 300 and said one of the semiconductor chips 100 of the memory drive 310 for signal transmission or power or ground delivery. In an aspect, a plurality of the vertical stacked path 587 having the number equal to or greater than 64, 128, 256, 512, 1024, 2048, 4096, 8 K, or 16 K, for example, may be connected between said one of the semiconductor chips 100 of the logic drive 300 and said one of the semiconductor chips 100 of the memory drive 310 for parallel signal transmission or for signal transmission or power or ground delivery.

Referring to FIG. 27A, for said each of the logic and memory drives 300 and 310, the small I/O circuits 203 as seen in FIG. 5B having the driving capability, loading, output capacitance or input capacitance between 0.01 pF and 10 pF, 0.05 pF and 5 pF, 0.01 pF and 2 pF or 0.01 pF and 1 pF, or smaller than 10 pF, 5 pF, 3 pF, 2 pF, 1 pF, 0.5 pF or 0.1 pF may be set in said one of its semiconductor chips 100 for one of the vertical stacked paths 287. For example, the small I/O circuits 203 may be composed of the small ESD protection circuit 373, small receiver 374, and small driver 375.

Referring to FIG. 27A, each of the logic and memory drives 300 and 310 may have the metal bumps 583 of the metal pads 77*e* of its BISD 79 for connecting the logic and memory drives 300 and 310 to an external circuitry. For each of the logic and memory drives 300 and 310, one of its metal bumps 583 may (1) couple to one of its semiconductor chips 100 through the interconnection metal layers 77 of its BISD 79, one or more of its TPVs 158, the interconnection metal layers 99 of its TISD 101 and one or more of its micro bumps 34 in sequence, (2) couple to one of the semiconductor chips 100 of the other of the logic and memory drives 300 and 310 through the interconnection metal layers 77 of its BISD 79, one or more of its TPVs 158, the interconnection metal layers 99 of its TISD 101, one or more of the bonded contacts 586, the interconnection metal layers 99 of the TISD 101 of the other of the logic and memory drives 300 and 310, and one or more of the micro-bumps 34 of the other of the logic and memory drives 300 and 310 in sequence, or (3) couple to one of the metal bumps 583 of the other of the logic and memory drives 300 and 310 through the interconnection metal layers 77 of its BISD 79, one or more of its TPVs 158, the interconnection metal layers 99 of its TISD 101, one or more of the bonded contacts 586, the interconnection metal layers 99 of the TISD 101 of the other of the logic and memory drives 300 and 310, one or more of the TPVs 158 of the other of the logic and memory drives 300 and 310, and the interconnection metal layers 77 of the BISD 79 of the other of the logic and memory drives 300 and 310 in sequence.

Alternatively, referring to FIGS. 27B and 27C, their structures are similar to that shown in FIG. 27A. For an element indicated by the same reference number shown in FIG. 27A-27C, the specification of the element as seen in FIGS. 27B and 27C may be referred to that of the element as illustrated in FIG. 27A. The difference between the structures shown in FIGS. 27A and 27B is that the memory drive 310 may not be provided with the metal bumps 583, BISD 79 and TPVs 582 for external connection. The difference between the structures shown in FIGS. 27A and 27C is that the logic drive 300 may not be provided with the metal bumps 583, BISD 79 and TPVs 582 for external connection.

Referring to FIGS. 27A-27C, for an example of parallel signal transmission, the vertical stacked paths 587 in parallel may be arranged between said one of the semiconductor chip 100, e.g. GPU chip as illustrated in FIGS. 11F-11N, of the logic drive 300 and one of the semiconductor chips 100, e.g., high speed, high bandwidth cache SRAM chip, DRAM chip, or NVMIC chip for MRAM or RRAM as illustrated in FIGS. 26A-26F, of the COIP memory drive 310 with a data bit width of equal to or greater than 64, 128, 256, 512, 1024, 2048, 4096, 8 K, or 16 K. Alternatively, for an example of parallel signal transmission, the vertical stacked paths 587 in parallel may be arranged between one of the semiconductor chip 100, e.g. tensor-procession-unit (TPU) chip as illustrated in FIGS. 11F-11N, of the COIP logic drive 300 and one of the semiconductor chips 100, e.g., high speed, high bandwidth cache SRAM chip, DRAM chip, or NVM chip for MRAM or RRAM as illustrated in FIGS. 26A-26F, of the COIP memory drive 310 with a data bit width of equal to or greater than 64, 128, 256, 512, 1024, 2048, 4096, 8 K, or 16 K.

Non-Volatile Programmable Logic Drive

Figure 29A:
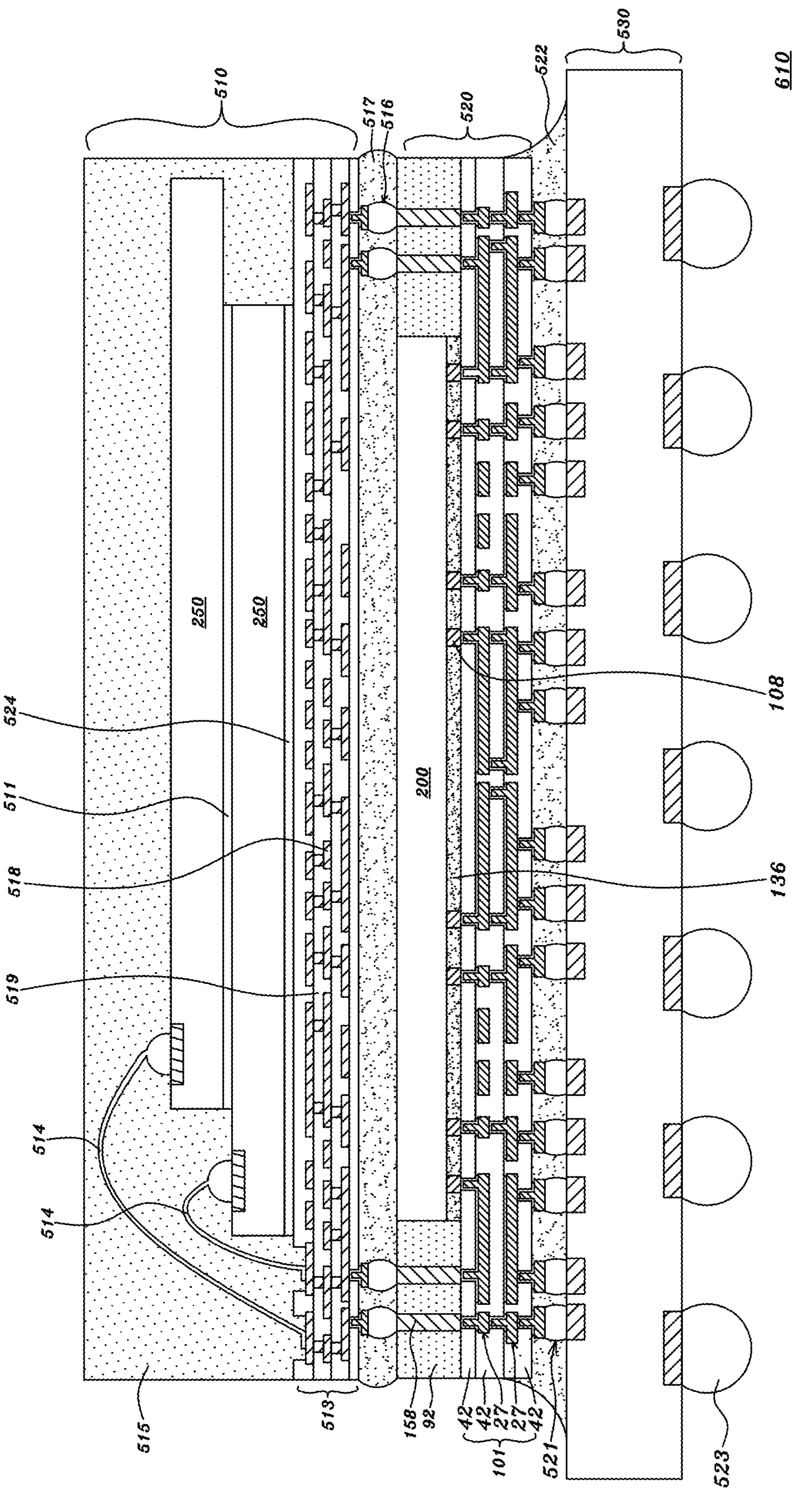
FIGS. 29A-29K are schematically cross-sectional views showing package-on-package (POP) assemblies for various types of non-volatile programmable logic drives for use as an application specific integrated circuit (ASIC) in accordance with an embodiment of the present application.

FIG. 29A is a schematically cross-sectional view showing a package-on-package (POP) assembly for a first type of non-volatile programmable logic drive in accordance with an embodiment of the present application. Referring to FIG. 29A, for forming a first type of non-volatile programmable logic drive 610, a non-volatile-memory (NVM) chip package 510 may be provided with multiple solder bumps each to be attached to one of the copper posts 158 of a logic chip package 520, which may be the single-chip package or chiplet 550 as illustrated in FIG. 28G, into a solder joint 516 therebetween having a solder between 20 and 100 micrometers, wherein the semiconductor chip 100 of the single-chip package or chiplet 550 used for the logic chip package 520 may be a FPGA IC chip 200 as illustrated in FIGS. 8A-8J. An underfill 517, such as polymer, may be formed between the NVM and logic chip packages 510 and 520, enclosing the solder joints 516. The non-volatile-memory (NVM) chip package 510 may include (1) two non-volatile memory IC chips 250, each of which may be a NAND flash chip or NOR flash chip as illustrated in FIGS. 11A-11N, stacked with each other and mounted to each other via an adhesive layer 511 such as silver paste or an heat conductive paste, wherein an upper one of the non-volatile memory IC chips 250 may overhang from an edge of a lower one of the non-volatile memory IC chips 250, (2) a circuit board 513 under the non-volatile memory IC chips 250 to have the lower one of the non-volatile memory IC chips 250 to be attached to a top surface thereof via an adhesive layer 524 such as silver paste or an heat conductive paste, (3) multiple wirebonded wires 514 each coupling one of the non-volatile memory IC chips 250 to the circuit board 513 and (4) a molded polymer 515 over the circuit board 513, encapsulating the non-volatile memory IC chips 250 and wirebonded wires 514. The circuit board 513 may include one or more interconnection metal layers 518 coupling the wirebonded wires 514 to the solder joints 516 and one or more polymer layers 519 each between neighboring two of its interconnection metal layers 518, under the bottommost one of its interconnection metal layers 518 or over the topmost one of its interconnection metal layers 518, wherein an upper one of its interconnection metal layers 518 may couple to a lower one of its interconnection metal layers 518 through an opening in one of its polymer layers 519 between the upper and lower ones of its interconnection metal layers 518. The logic chip package 520 may be provided with the metal bumps, pillars or pads 570 each to be attached to a circuit board 530 into a solder joint 521 therebetween having a solder between 20 and 100 micrometers. An underfill 522, such as polymer, may be formed between the logic chip package 520 and the circuit board 530, enclosing the solder joints 521. Multiple solder bumps or balls 523 may be provided in an array at a bottom of the circuit board 530. Besides the FPGA IC chip 200, the semiconductor chip 100 of the single-chip package or chiplet 550 used for the logic chip package 520 may be a CPU chip, GPU chip, TPU chip, APU chip or DSP chip.

In a first alternative, for the first type of non-volatile programmable logic drive 610, the circuit board 513 and solder joints 516 may be replaced with a leadframe (not shown) for a thin-small-outline-package (TSOP). The leadframe may have a lower one of the two stacked non-volatile memory integrated-circuit (IC) chips 250 mounted thereon and each of the wirebonded wires 514 may couple one of the non-volatile memory IC chips 250 to one of multiple inner leads of the leadframe. The molded polymer 515 may encapsulate the non-volatile memory IC chips 250, wirebonded wires 514 and inner leads of the leadframe. The leadframe may have multiple outer leads outside of the molded polymer 515 each to be bonded to one of the copper posts 158 of the logic chip package 520 via a solder, wherein each of the outer leads may connect to one of the inner leads thereof. Thereby, the non-volatile memory integrated-circuit (IC) chip 250 may couples to the FPGA IC chip 200 of the logic chip package 520 through, in sequence, the leadframe, one of the copper posts 158 and one or more of the interconnection metal layers 27 of the top or frontside interconnection scheme for a logic drive or device 101 (TISD or FISD) of the logic chip package 520.

In a second alternative, for the first type of non-volatile programmable logic drive 610, the NVM chip package 510 may be a chip scale package (CSP), wherein an area ratio between the NVM chip package 510 and the non-volatile memory integrated-circuit (IC) chip 250 is equal to or smaller than 1.5.

Figure 29B:
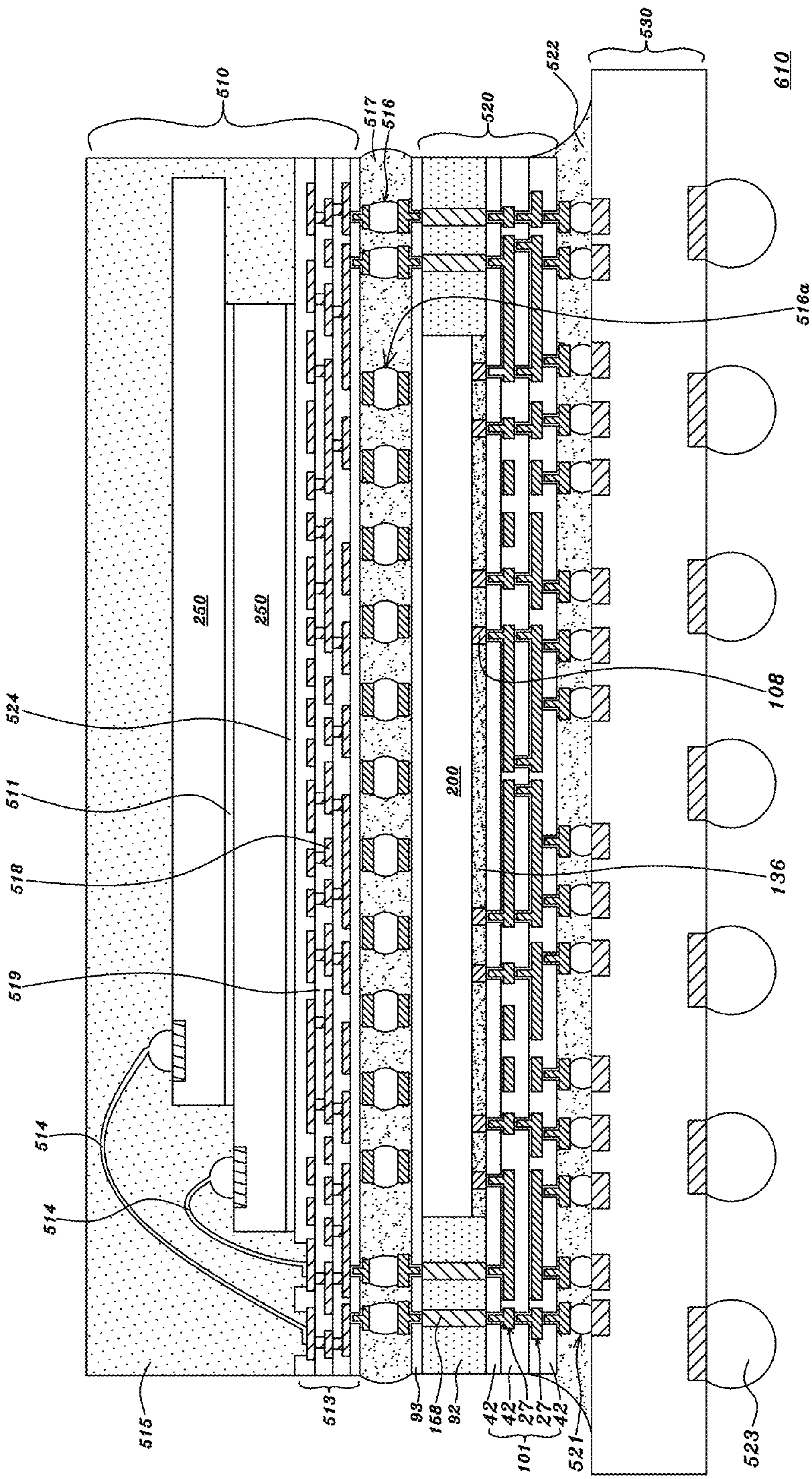

FIG. 29B is a schematically cross-sectional view showing a package-on-package (POP) assembly for a second type of non-volatile programmable logic drive in accordance with an embodiment of the present application. The package-on-package (POP) assembly 610 as seen in FIG. 29B may have a similar structure to that as illustrated in FIG. 29A. For an element indicated by the same reference number shown in FIGS. 29A and 29B, the specification of the element as seen in FIG. 29B may be referred to that of the element as illustrated in FIG. 29A. The difference between the packageon-package (POP) assemblies 610 as illustrated in FIGS. 29A and 29B is that for forming a second type of non-volatile programmable logic drive 610 as seen in FIG. 29B, a non-volatile-memory (NVM) chip package 510 as illustrated in FIG. 29A may be provided with multiple solder bumps each to be attached to one of the metal pads or bumps 583 of a logic chip package 520, which may be the single-chip package or chiplet 550 as illustrated in FIG. 28I, into a solder joint 516 therebetween having a solder between 20 and 100 micrometers, wherein the semiconductor chip 100 of the single-chip package or chiplet 550 used for the logic chip package 520 may be a FPGA IC chip 200 as illustrated in FIGS. 8A-8J. An underfill 517, such as polymer, may be formed between the NVM and logic chip packages 510 and 520, enclosing the solder joints 516. It is noted that the logic chip package 520 may include the dummy pads or bumps 583*a* in a first group to be bonded with a first group of the solder bumps of the non-volatile-memory (NVM) chip package 510 respectively into a first group of solder joints 516*a* at a voltage of ground reference and the dummy pads or bumps 583*a* in a second group to be bonded with a second group of the solder bumps of the non-volatile-memory (NVM) chip package 510 respectively into a second group of solder joints 516*a* not for any electrical function, wherein the first and second groups of solder joints 516*a* may be vertically over the FPGA IC chip 200 of the logic chip package 520. Besides the FPGA IC chip 200, the semiconductor chip 100 of the single-chip package or chiplet 550 used for the logic chip package 520 may be a CPU chip, GPU chip, TPU chip, APU chip or DSP chip. However, in the first alternative, each of the outer leads of the leadframe may be bonded to one of the metal pads or bumps 583 of the logic chip package 520 via a solder.

Figure 29C:
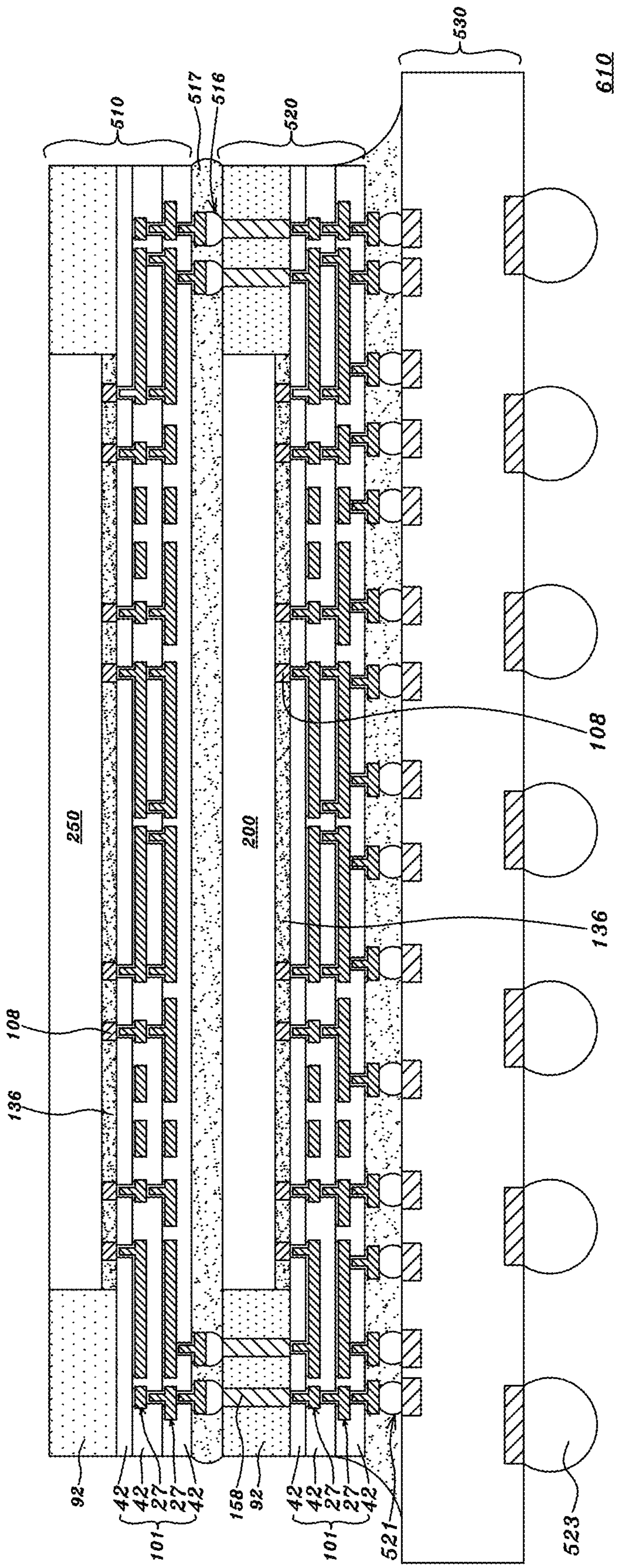

FIG. 29C is a schematically cross-sectional view showing a package-on-package (POP) assembly for a third type of non-volatile programmable logic drive in accordance with an embodiment of the present application. The package-on-package (POP) assembly 610 as seen in FIG. 29C may have a similar structure to that as illustrated in FIG. 29A. For an element indicated by the same reference number shown in FIGS. 29A and 29C, the specification of the element as seen in FIG. 29C may be referred to that of the element as illustrated in FIG. 29A. The difference between the package-on-package (POP) assemblies 610 as illustrated in FIGS. 29A and 29C is that for forming a third type of non-volatile programmable logic drive 610 as seen in FIG. 29C, the single-chip package or chiplet 550 as illustrated in FIG. 28G may be provided as a non-volatile-memory (NVM) chip package 510, wherein the semiconductor chip 100 of the single-chip package or chiplet 550 used for the non-volatile-memory (NVM) chip package 510 may be a NVMIC chip 250 such as NOR flash chip or NAND flash chip as illustrated in FIGS. 11A-11N and none of the copper posts 158 as seen in FIG. 28G is provided in the polymer layer 92 of the single-chip package or chiplet 550 used for the non-volatile-memory (NVM) chip package 510. The non-volatile-memory (NVM) chip package 510 may be provided with the metal bumps, pillars or pads 570 each to be attached to one of the copper posts 158 of a logic chip package 520, which may be the single-chip package or chiplet 550 as illustrated in FIG. 28G, into a solder joint 516 therebetween having a solder between 20 and 100 micrometers. An underfill 517, such as polymer, may be formed between the NVM and logic chip packages 510 and 520, enclosing the solder joints 516. Alternatively, the logic chip package 520 may be provided as illustrated in FIG. 28I with the metal pads or bumps 583 each to be bonded with one of the metal bumps, pillars or pads 570 into a solder joint 516 as seen in FIG. 29B therebetween having a solder between 20 and 100 micrometers. It is noted that the metal pads or bumps 583 of the logic chip package 520 may include the dummy pads or bumps 583*a* in a first group to be bonded with a first group of the metal bumps, pillars or pads 570 of the non-volatile-memory (NVM) chip package 510 respectively into a first group of solder joints as ones 516*a* in FIG. 29B at a voltage of ground reference and the dummy pads or bumps 583*a* in a second group to be bonded with a second group of the metal bumps, pillars or pads 570 of the non-volatile-memory (NVM) chip package 510 respectively into a second group of solder joints as ones 516*a* in FIG. 29B not for any electrical function, wherein the first and second groups of solder joints 516*a* may be vertically over the FPGA IC chip 200 of the logic chip package 520. Besides the FPGA IC chip 200, the semiconductor chip 100 of the single-chip package or chiplet 550 used for the logic chip package 520 may be a CPU chip, GPU chip, TPU chip, APU chip or DSP chip.

Figure 29D:
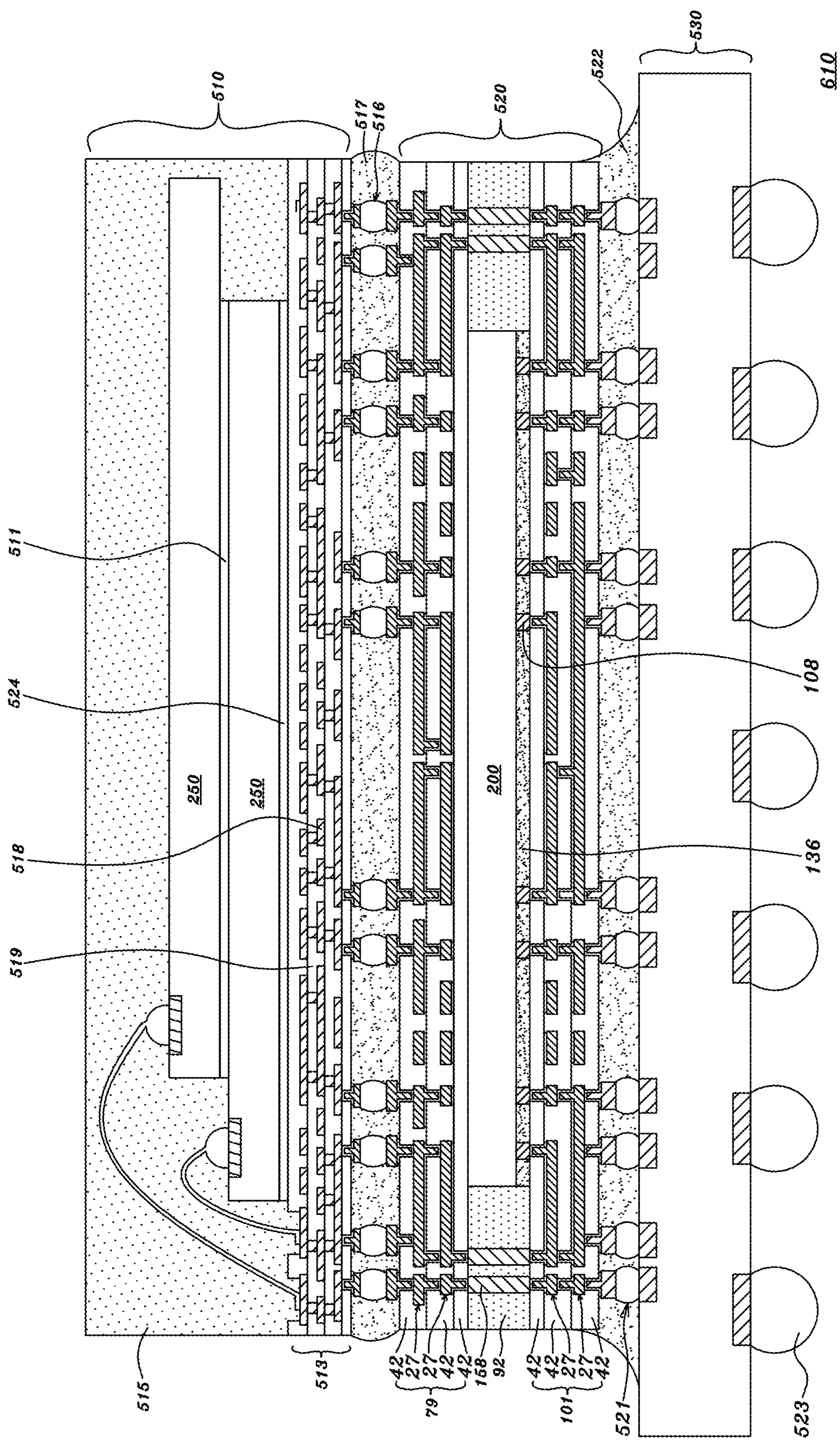

FIG. 29D is a schematically cross-sectional view showing a package-on-package (POP) assembly for a fourth type of non-volatile programmable logic drive in accordance with an embodiment of the present application. The package-on-package (POP) assembly 610 as seen in FIG. 29D may have a similar structure to that as illustrated in FIG. 29A. For an element indicated by the same reference number shown in FIGS. 29A and 29D, the specification of the element as seen in FIG. 29D may be referred to that of the element as illustrated in FIG. 29A. The difference between the package-on-package (POP) assemblies 610 as illustrated in FIGS. 29A and 29D is that for forming a fourth type of non-volatile programmable logic drive 610 as seen in FIG. 29D, a non-volatile-memory (NVM) chip package 510 as illustrated in FIG. 29A may be provided with multiple solder bumps each to be attached to one of the metal pads or bumps 583 of a logic chip package 520, which may be the single-chip package or chiplet 550 as illustrated in FIG. 28K, into a solder joint 516 therebetween having a solder between 20 and 100 micrometers, wherein the semiconductor chip 100 of the single-chip package or chiplet 550 used for the logic chip package 520 may be a FPGA IC chip 200 as illustrated in FIGS. 8A-8J. An underfill 517, such as polymer, may be formed between the NVM and logic chip packages 510 and 520, enclosing the solder joints 516. Besides the FPGA IC chip 200, the semiconductor chip 100 of the single-chip package or chiplet 550 used for the logic chip package 520 may be a CPU chip, GPU chip, TPU chip, APU chip or DSP chip. However, in the first alternative, each of the outer leads of the leadframe may be bonded to one of the metal pads or bumps 583 of the logic chip package 520 via a solder.

Figure 29E:
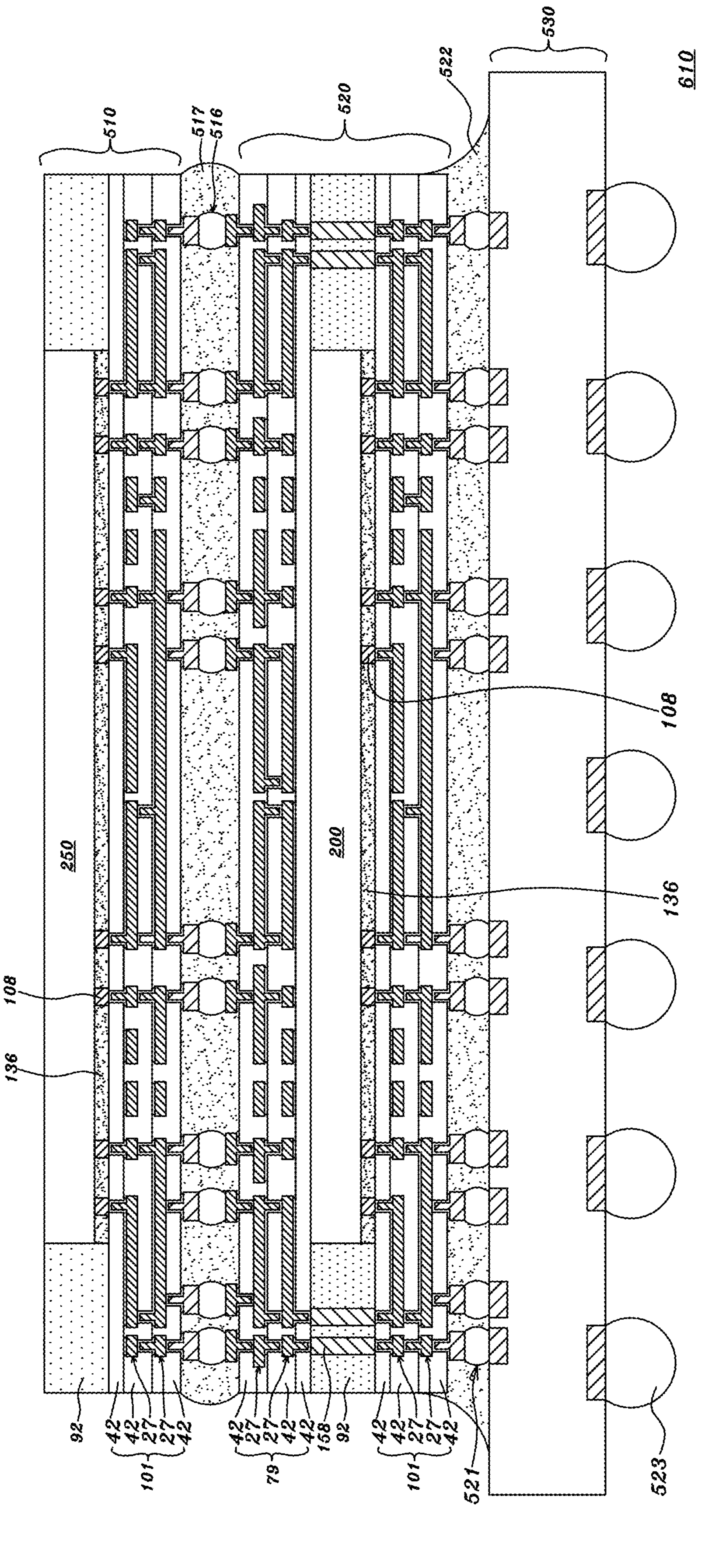

FIG. 29E is a schematically cross-sectional view showing a package-on-package (POP) assembly for a fifth type of non-volatile programmable logic drive in accordance with an embodiment of the present application. The package-on-package (POP) assembly 610 as seen in FIG. 29E may have a similar structure to that as illustrated in FIG. 29D. For an element indicated by the same reference number shown in FIGS. 29A, 29D and 29E, the specification of the element as seen in FIG. 29E may be referred to that of the element as illustrated in FIGS. 29A and 29D. The difference between the package-on-package (POP) assemblies 610 as illustrated in FIGS. 29D and 29E is that for forming a fifth type of non-volatile programmable logic drive 610 as seen in FIG. 29E, the single-chip package or chiplet 550 as illustrated in FIG. 28G may be provided as a non-volatile-memory (NVM) chip package 510, wherein the semiconductor chip

100 of the single-chip package or chiplet 550 used for the non-volatile-memory (NVM) chip package 510 may be a NVMIC chip 250 such as NOR flash chip or NAND flash chip as illustrated in FIGS. 11A-11N and none of the copper posts 158 as seen in FIG. 28G is provided in the polymer layer 92 of the single-chip package or chiplet 550 used for the non-volatile-memory (NVM) chip package 510. The non-volatile-memory (NVM) chip package 510 may be provided with the metal bumps, pillars or pads 570 each to be attached to one of the metal pads or bumps 583 of a logic chip package 520, which may be the single-chip package or chiplet 550 as illustrated in FIG. 28K, into a solder joint 516 therebetween having a solder between 20 and 100 micrometers. An underfill 517, such as polymer, may be formed between the NVM and logic chip packages 510 and 520, enclosing the solder joints 516. Besides the FPGA IC chip 200, the semiconductor chip 100 of the single-chip package or chiplet 550 used for the logic chip package 520 may be a CPU chip, GPU chip, TPU chip, APU chip or DSP chip.

Figure 29F:
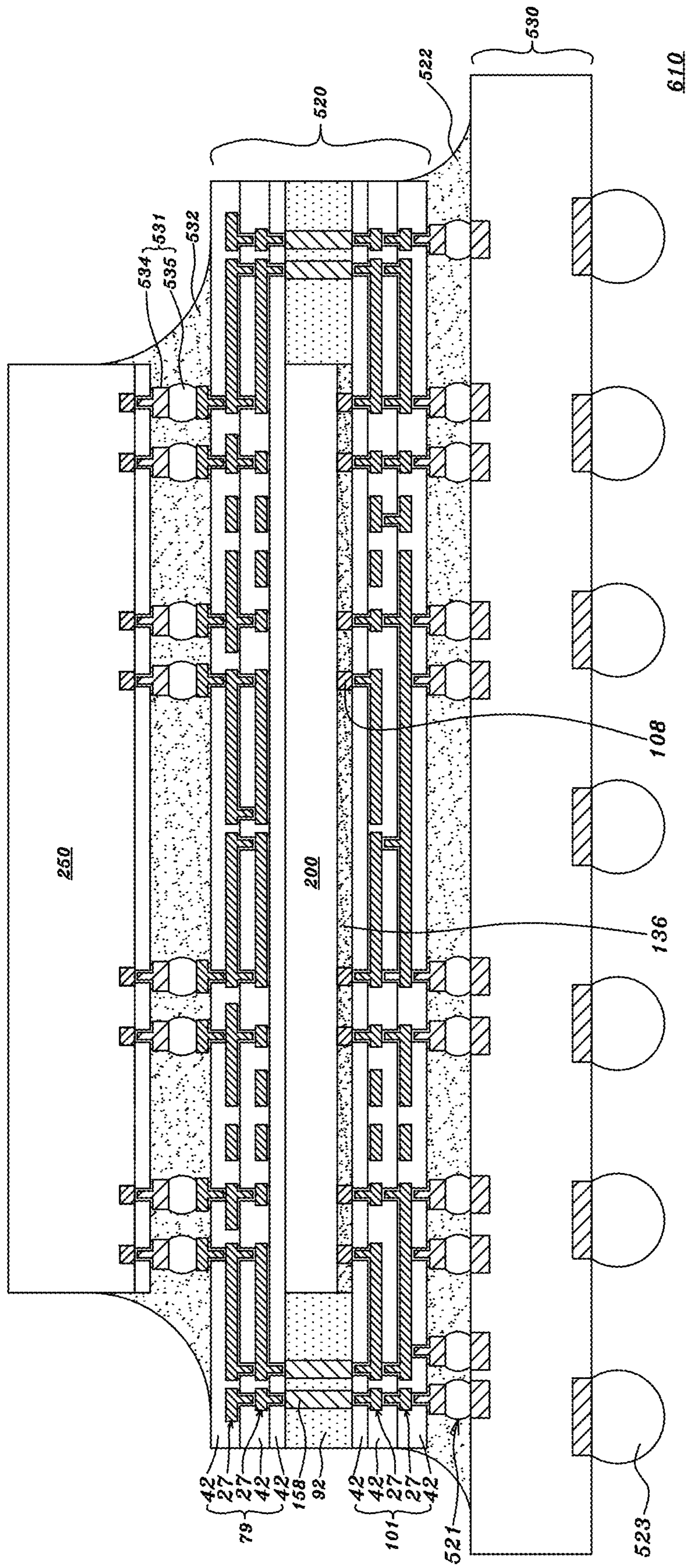

FIG. 29F is a schematically cross-sectional view showing a package-on-package (POP) assembly for a sixth type of non-volatile programmable logic drive in accordance with an embodiment of the present application. The package-on-package (POP) assembly 610 as seen in FIG. 29F may have a similar structure to that as illustrated in FIG. 29D. For an element indicated by the same reference number shown in FIGS. 29A, 29D and 29F, the specification of the element as seen in FIG. 29F may be referred to that of the element as illustrated in FIGS. 29A and 29D. The difference between the package-on-package (POP) assemblies 610 as illustrated in FIGS. 29D and 29F is that for forming a sixth type of non-volatile programmable logic drive 610 as seen in FIG. 29F, a non-volatile memory IC chip 250 such as NOR flash chip or NAND flash chip as illustrated in FIGS. 11A-11N may be provided to replace the non-volatile-memory (NVM) chip package 510 as seen in FIG. 29D. The non-volatile memory IC chip 250 may be provided with multiple metal bumps each to be attached to one of the metal pads or bumps 583 of a logic chip package 520, which may be the single-chip package or chiplet 550 as illustrated in FIG. 28K, into a bonded contact 531 therebetween, wherein each of the bonded contact 531 may include a copper bump 534 having a thickness between 10 and 100 micrometers between the non-volatile memory IC chip 250 and logic chip package 520 and a tin-containing layer 535 between its copper bump and the logic chip package 520. An underfill 532, such as polymer, may be formed between the non-volatile memory IC chip 250 and the logic chip package 520, enclosing the bonded contacts 531. Besides the FPGA IC chip 200, the semiconductor chip 100 of the single-chip package or chiplet 550 used for the logic chip package 520 may be a CPU chip, GPU chip, TPU chip, APU chip or DSP chip.

Figure 29G:
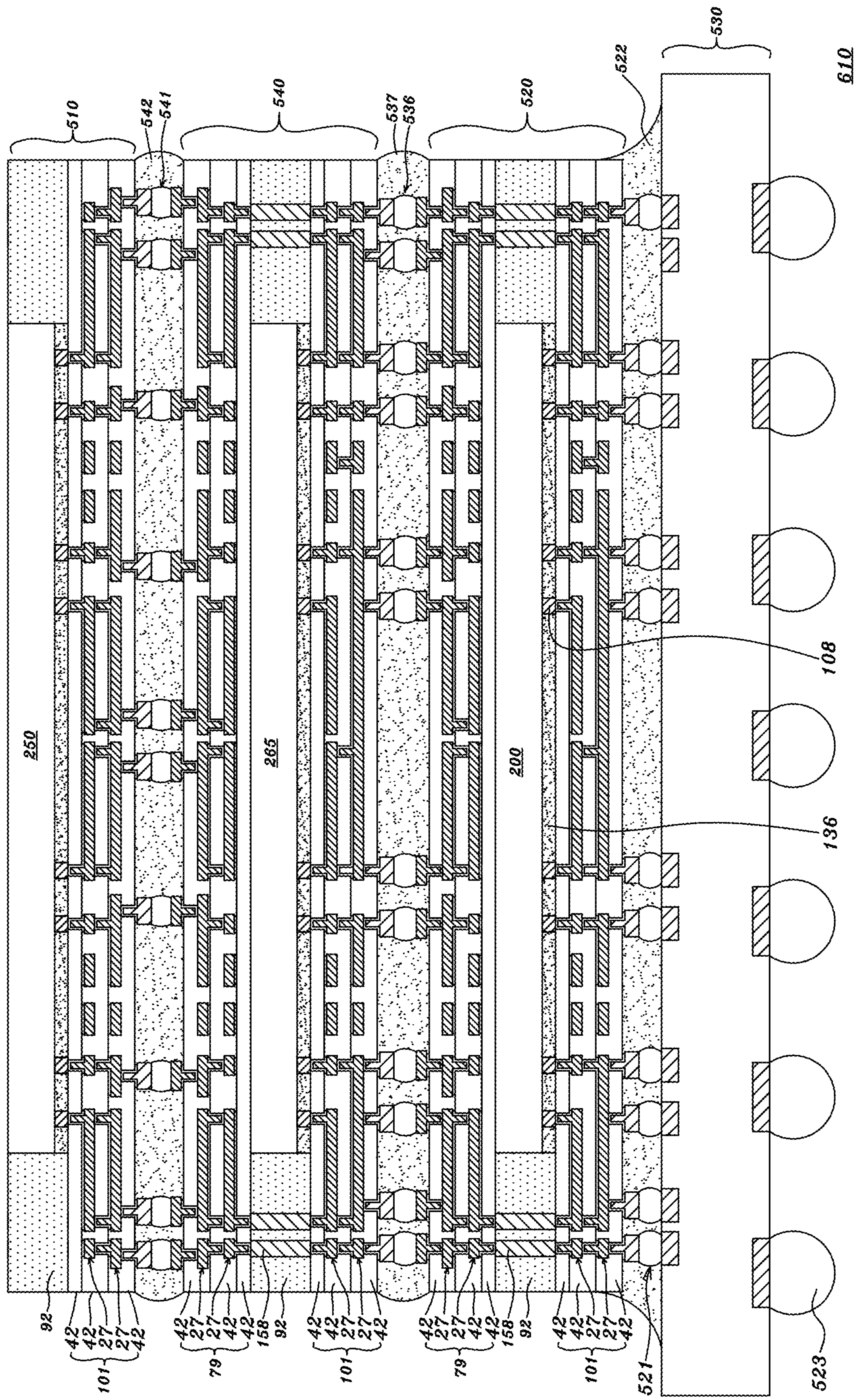

FIG. 29G is a schematically cross-sectional view showing a package-on-package (POP) assembly for a seventh type of non-volatile programmable logic drive in accordance with an embodiment of the present application. The package-on-package (POP) assembly 610 as seen in FIG. 29G may have a similar structure to that as illustrated in FIG. 29E. For an element indicated by the same reference number shown in FIGS. 29A, 29D, 29E and 29G, the specification of the element as seen in FIG. 29G may be referred to that of the element as illustrated in FIGS. 29A, 29D and 29E. The difference between the package-on-package (POP) assemblies 610 as illustrated in FIGS. 29E and 29G is that for forming a seventh type of non-volatile programmable logic drive 610 as seen in FIG. 29G, the single-chip package or chiplet 550 as illustrated in FIG. 28K may be provided as an I/O chip package 540 between the NVM and logic chip packages 510 and 520, wherein the semiconductor chip 100 of the single-chip package or chiplet 550 used for the I/O chip package 540 may be a dedicated I/O chip 265 as illustrated in FIGS. 11A-11N. The I/O chip package 540 may be provided with the metal bumps, pillars or pads 570 each to be attached to one of the metal pads or bumps 583 of the logic chip package 520, which may be the single-chip package or chiplet 550 as illustrated in FIG. 28G, into a solder joint 536 therebetween having a solder between 20 and 100 micrometers. An underfill 537, such as polymer, may be formed between the logic and I/O chip packages 520 and 540, enclosing the solder joints 536. The non-volatile-memory (NVM) chip package 510 may be provided with the metal bumps, pillars or pads 570 each to be attached to one of the metal pads or bumps 583 of the I/O chip package 540, which may be the single-chip package or chiplet 550 as illustrated in FIG. 28G, into a solder joint 541 therebetween having a solder between 20 and 100 micrometers. An underfill 542, such as polymer, may be formed between the NVM and I/O chip packages 510 and 540, enclosing the solder joints 541. Alternatively, the backside interconnection scheme for a logic drive or device (BISD) 79 of the I/O chip package 540 may be omitted such that the I/O chip package 540 may have the structure like the single-chip package or chiplet 550 as illustrated in FIG. 28G, and the non-volatile-memory (NVM) chip package 510 may be provided with the metal bumps, pillars or pads 570 each to be attached to one of the copper posts 158 of the I/O chip package 540 into a solder joint therebetween as one 516 in FIG. 29C. Alternatively, the I/O chip package 540 may have the structure like the single-chip package or chiplet 550 as illustrated in FIG. 28I, and the non-volatile-memory (NVM) chip package 510 may be provided with the metal bumps, pillars or pads 570 each to be attached to one of the metal pads or bumps 583 of the I/O chip package 540 into a solder joint therebetween as one 516 in FIG. 29B. It is noted that the metal pads or bumps 583 of the I/O chip package 540 may include the dummy pads or bumps **583*a* in a first group to be bonded with a first group of the metal bumps, pillars or pads 570 of the non-volatile-memory (NVM) chip package 510 respectively into a first group of solder joints as ones 516*a* in FIG. 29B at a voltage of ground reference and the dummy pads or bumps 583*a* in a second group to be bonded with a second group of the metal bumps, pillars or pads 570 of the non-volatile-memory (NVM) chip package 510 respectively into a second group of solder joints as ones 516*a* in FIG. 29B not for any electrical function, wherein the first and second groups of solder joints may be vertically over the dedicated I/O chip 265 of the I/O chip package 540. The dedicated I/O chip 265 of the I/O chip package 540 may include a small I/O circuit 203 coupling to a small I/O circuit 203 of the FPGA IC chip 200 of the logic chip package 520 through, in sequence, one of the metal pads, lines or traces 108 of the dedicated I/O chip 265, the interconnection metal layers 27 of the top or frontside interconnection scheme for a logic drive or device 101 (TISD or FISD) of the I/O chip package 540, one of the solder joints 536, the interconnection metal layers 27 of the backside interconnection scheme for a logic drive or device 79 (BISD) of the logic chip package 520, one of the copper posts 158 of the logic chip package 520, one or more of the interconnection metal layers 27 of the top or frontside interconnection scheme for a logic drive or device 101 (TISD or FISD) of the logic chip package 520, and one of the metal pads, lines or traces 108 of the FPGA IC chip 200; the dedicated I/O chip 265 of the I/O chip package 540 may include another small I/O circuit 203 coupling to a small I/O circuit 203 of the non-volatile memory IC chip 250 of the NVM chip package 510 through, in sequence, one of the metal pads, lines or traces 108 of the dedicated I/O chip 265, one or more of the interconnection metal layers 27 of the top or frontside interconnection scheme for a logic drive or device 101 (TISD or FISD) of the I/O chip package 540, one of the copper posts 158 of the I/O chip package 540, the interconnection metal layers 27 of the backside interconnection scheme for a logic drive or device 79 (BISD) of the I/O chip package 540, one of the solder joints 541, the interconnection metal layers 27 of the top or frontside interconnection scheme for a logic drive or device 101 (TISD or FISD) of the NVM chip package 510, and one of the metal pads, lines or traces 108 of the non-volatile memory IC chip 250, wherein the small I/O circuit 203 of each of the dedicated I/O chip 265, FPGA IC chip 200 and non-volatile memory IC chip 250 may be composed of a small driver 374, small receiver 375 and small ESD protection circuit 373 as illustrated in FIG. 5B all coupling to the I/O pad 372 provided by one of the metal pads, lines or traces 108 of said each of the dedicated I/O chip 265, FPGA IC chip 200 and non-volatile memory IC chip 250. The dedicated I/O chip 265 of the I/O chip package 540 may include a large I/O circuit 341 coupling to one of the solder bumps or balls 523 for external connection through, in sequence, one of the metal pads, lines or traces 108 of the dedicated I/O chip 265, the interconnection metal layers 27 of the top or frontside interconnection scheme for a logic drive or device 101 (TISD or FISD) of the I/O chip package 540, one of the solder joints 536, the interconnection metal layers 27 of the backside interconnection scheme for a logic drive or device 79 (BISD) of the logic chip package 520, one of the copper posts 158 of the logic chip package 520, the interconnection metal layers 27 of the top or frontside interconnection scheme for a logic drive or device 101 (TISD or FISD) of the logic chip package 520, one of the solder joints 521 and the circuit board 530, wherein the large I/O circuit 341 of the dedicated I/O chip 265 may be composed of a large driver 274, large receiver 275 and large ESD protection circuit 273 as illustrated in FIG. 5A all coupling to the I/O pad 272 provided by one of the metal pads, lines or traces 108 of the dedicated I/O chip 265. Besides the FPGA IC chip 200, the semiconductor chip 100 of the single-chip package or chiplet 550 used for the logic chip package 520** may be a CPU chip, GPU chip, TPU chip, APU chip or DSP chip.

Figure 29H:
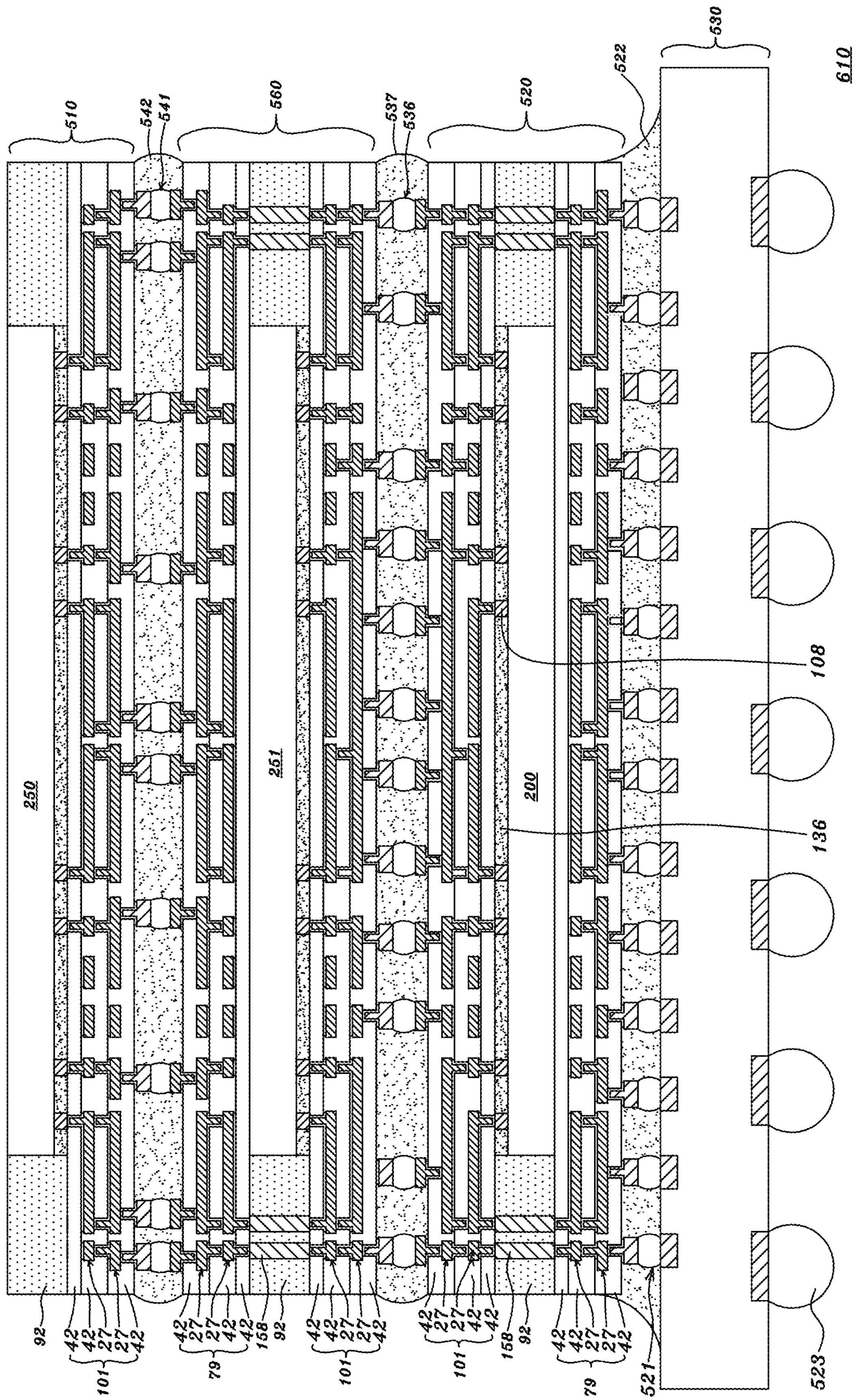

FIG. 29H is a schematically cross-sectional view showing a package-on-package (POP) assembly for an eighth type of non-volatile programmable logic drive in accordance with an embodiment of the present application. Referring to FIG. 29H, for forming an eighth type of non-volatile programmable logic drive 610, a high-bandwidth-memory (HBM) chip package 560, which may be the single-chip package or chiplet 550 as illustrated in FIG. 28K, may be provided with the metal bumps, pillars or pads 570 each to be attached to one of the metal bumps, pillars or pads 570 of a logic chip package 520, which may be the single-chip package or chiplet 550 as illustrated in FIG. 28K, into a solder joint 536 therebetween having a solder between 20 and 100 micrometers, wherein the semiconductor chip 100 of the single-chip package or chiplet 550 used for the logic chip package 520 may be a FPGA IC chip 200 as illustrated in FIGS. 8A-8J and the semiconductor chip 100 of the single-chip package or chiplet 550 used for the high-bandwidth-memory (HBM) chip package 560 may be a HBM IC chip 251 such as DRAM chip, SRAM chip, MRAM chip or RRAM chip. An underfill 537, such as polymer, may be formed between the logic and HBM chip packages 520 and 560, enclosing the solder joints 536. A non-volatile-memory (NVM) chip package 510, which may be the single-chip package or chiplet 550 as illustrated in FIG. 28G, may be provided with the metal bumps, pillars or pads 570 each to be attached to one of the metal bumps or pads or bumps 583 of the HBM chip package 560 into a solder joint 541 therebetween having a solder between 20 and 100 micrometers, wherein the semiconductor chip 100 of the single-chip package or chiplet 550 used for the non-volatile-memory (NVM) chip package 510 may be a NAND flash chip or NOR flash chip as illustrated in FIGS. 11A-11N and none of the copper posts 158 as seen in FIG. 28G is provided in the polymer layer 92 of the single-chip package or chiplet 550 used for the non-volatile-memory (NVM) chip package 510. An underfill 542, such as polymer, may be formed between the NVM and HBM chip packages 510 and 560, enclosing the solder joints 541. The logic chip package 520 may be provided with the metal pads or bumps 583 each to be attached to a circuit board 530 into a solder joint 521 therebetween having a solder between 20 and 100 micrometers. An underfill 522, such as polymer, may be formed between the logic chip package 520 and the circuit board 530, enclosing the solder joints 521. Multiple solder bumps or balls 523 may be provided in an array at a bottom of the circuit board 530. Alternatively, the backside interconnection scheme for a logic drive or device (BISD) 79 of the HBM chip package 560 may be omitted such that the HBM chip package 560 may have the structure like the single-chip package or chiplet 550 as illustrated in FIG. 28G, and the non-volatile-memory (NVM) chip package 510 may be provided with the metal bumps, pillars or pads 570 each to be attached to one of the copper posts 158 of the HBM chip package 560 into a solder joint therebetween as one 516 in FIG. 29C. Alternatively, the HBM chip package 560 may have the structure like the single-chip package or chiplet 550 as illustrated in FIG. 28I, and the non-volatile-memory (NVM) chip package 510 may be provided with the metal bumps, pillars or pads 570 each to be attached to one of the metal pads or bumps 583 of the HBM chip package 560 into a solder joint therebetween as one 516 in FIG. 29B. It is noted that the metal pads or bumps 583 of the HBM chip package 560 may include the dummy pads or bumps **583*a* in a first group to be bonded with a first group of the metal bumps, pillars or pads 570 of the non-volatile-memory (NVM) chip package 510 respectively into a first group of solder joints as ones 516*a* in FIG. 29B at a voltage of ground reference and the dummy pads or bumps 583*a* in a second group to be bonded with a second group of the metal bumps, pillars or pads 570 of the non-volatile-memory (NVM) chip package 510 respectively into a second group of solder joints as ones 516*a* in FIG. 29B not for any electrical function, wherein the first and second groups of solder joints may be vertically over the HBM IC chip 251 of the HBM chip package 560. The communication between the FPGA IC chips 200 and the HBM IC chip 251 may be provided by a set of small I/O circuits 203 of the HBM IC chip 251, a set of metal pads, lines or traces 108 of the HBM IC chip 251, the interconnection metal layers 27 of the top or frontside interconnection scheme for a logic drive or device 101 (TISD or FISD) of the HBM chip package 560, a set of solder joints 536, the interconnection metal layers 27 of the top or frontside interconnection scheme for a logic drive or device 79 (TISD or FISD) of the logic chip package 520, a set of metal pads, lines or traces 108 of the FPGA IC chip 251 and a set of small I/O circuits 203 of the FPGA IC chip 200 with a data bit width of equal to or greater than 64, 128, 256, 512, 1024, 2048, 4096, 8 K, or 16 K, wherein each of the small I/O circuits 203 of each of the HBM IC chip 251 and FPGA IC chip 200 may be composed of a small driver 374, small receiver 375 and small ESD protection circuit 373 as illustrated in FIG. 5B all coupling to the I/O pad 372 provided by one of the metal pads, lines or traces 108 of said each of the HBM IC chip 251 and FPGA IC chip 200. Besides the FPGA IC chip 200, the semiconductor chip 100 of the single-chip package or chiplet 550 used for the logic chip package 520** may be a CPU chip, GPU chip, TPU chip, APU chip or DSP chip.

Figure 29I:
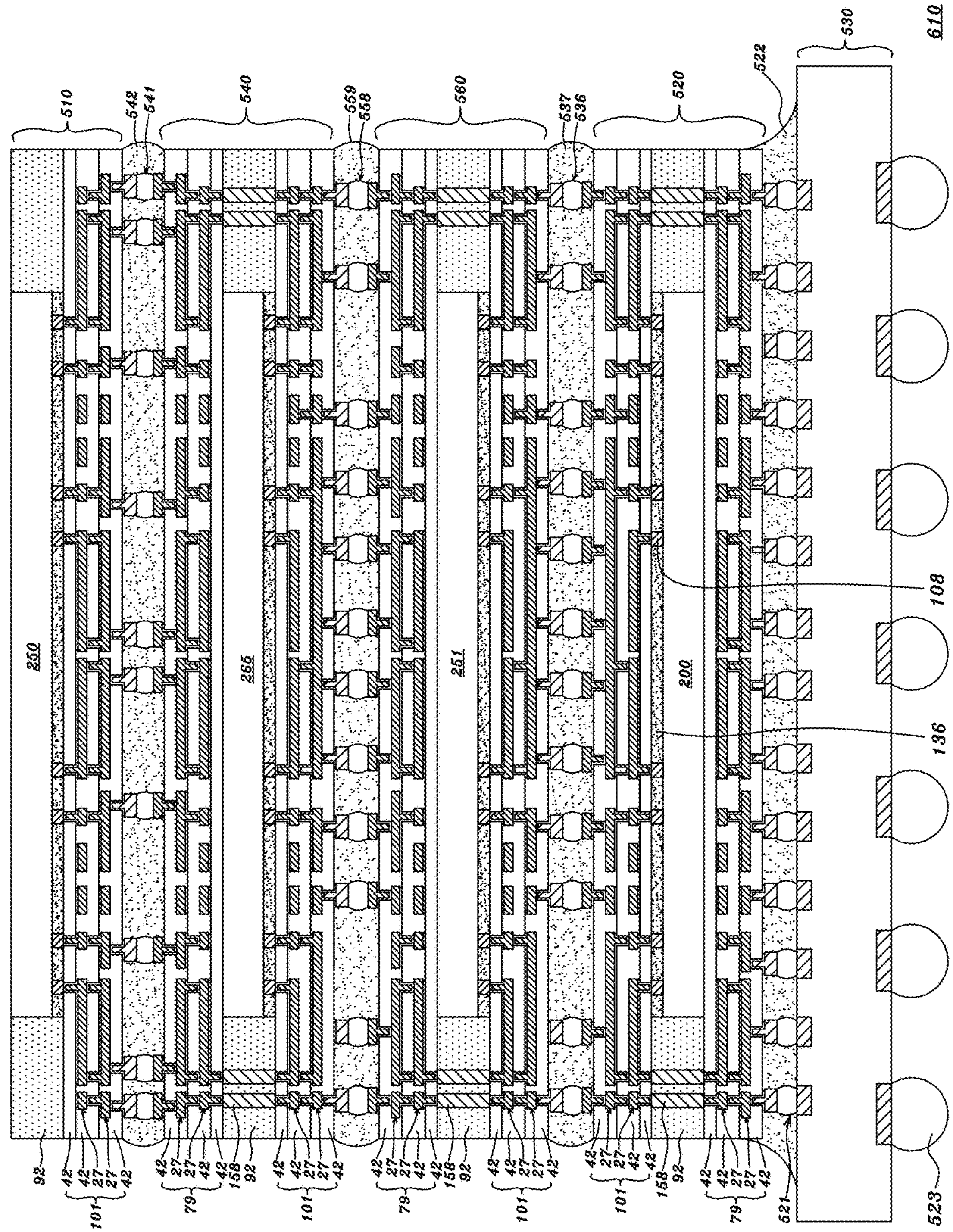

FIG. 29I is a schematically cross-sectional view showing a package-on-package (POP) assembly for a ninth type of non-volatile programmable logic drive in accordance with an embodiment of the present application. The package-on-package (POP) assembly 610 as seen in FIG. 29I may have a similar structure to that as illustrated in FIG. 29H. For an element indicated by the same reference number shown in FIGS. 29H and 29I, the specification of the element as seen in FIG. 29I may be referred to that of the element as illustrated in FIG. 29H. The difference between the package-on-package (POP) assemblies 610 as illustrated in FIGS. 29H and 29I is that for forming a ninth type of non-volatile programmable logic drive 610 as seen in FIG. 29I, the single-chip package or chiplet 550 as illustrated in FIG. 28K may be provided as an I/O chip package 540 between the NVM and HBM chip packages 510 and 560, wherein the semiconductor chip 100 of the single-chip package or chiplet 550 used for the I/O chip package 540 may be a dedicated I/O chip 265 as illustrated in FIGS. 11A-11N. The I/O chip package 540 may be provided with the metal bumps, pillars or pads 570 each to be attached to one of the metal pads or bumps 583 of the HBM chip package 560, which may be the single-chip package or chiplet 550 as illustrated in FIG. 28G, into a solder joint 558 therebetween having a solder between 20 and 100 micrometers. An underfill 559, such as polymer, may be formed between the logic and I/O chip packages 520 and 540, enclosing the solder joints 558. The non-volatile-memory (NVM) chip package 510 may be provided with the metal bumps, pillars or pads 570 each to be attached to one of the metal pads or bumps 583 of the I/O chip package 540, which may be the single-chip package or chiplet 550 as illustrated in FIG. 28G, into a solder joint 541 therebetween having a solder between 20 and 100 micrometers. An underfill 542, such as polymer, may be formed between the NVM and I/O chip packages 510 and 540, enclosing the solder joints 541. Alternatively, the backside interconnection scheme for a logic drive or device (BISD) 79 of each of the HBM chip packages 560 may be omitted such that each of the HBM chip packages 560 may have the structure like the single-chip package or chiplet 550 as illustrated in FIG. 28G, and each of the I/O chip packages 540 may be provided with the metal bumps, pillars or pads 570 each to be attached to one of the copper posts 158 of one of the HBM chip packages 560 into a solder joint therebetween as one 516 in FIG. 29C. Alternatively, the backside interconnection scheme for a logic drive or device (BISD) 79 of the I/O chip package 540 may be omitted such that the I/O chip package 540 may have the structure like the single-chip package or chiplet 550 as illustrated in FIG. 28G, and the non-volatile-memory (NVM) chip package 510 may be provided with the metal bumps, pillars or pads 570 each to be attached to one of the copper posts 158 of the I/O chip package 540 into a solder joint therebetween as one 516 in FIG. 29C. Alternatively, the I/O chip package 540 may have the structure like the single-chip package or chiplet 550 as illustrated in FIG. 28I, and the non-volatile-memory (NVM) chip package 510 may be provided with the metal bumps, pillars or pads 570 each to be attached to one of the metal pads or bumps 583 of the I/O chip package 540 into a solder joint therebetween as one 516 in FIG. 29B. It is noted that the metal pads or bumps 583 of the I/O chip package 540 may include the dummy pads or bumps 583*a* in a first group to be bonded with a first group of the metal bumps, pillars or pads 570 of the non-volatile-memory (NVM) chip package 510 respectively into a first group of solder joints as ones 516*a* in FIG. 29B at a voltage of ground reference and the dummy pads or bumps 583*a* in a second group to be bonded with a second group of the metal bumps, pillars or pads 570 of the non-volatile-memory (NVM) chip package 510 respectively into a second group of solder joints as ones 516*a* in FIG. 29B not for any electrical function, wherein the first and second groups of solder joints may be vertically over the dedicated I/O chip 265 of the I/O chip package 540. Alternatively, each of the HBM chip packages 560 may have the structure like the single-chip package or chiplet 550 as illustrated in FIG. 28I, and each of the I/O chip packages 540 may be provided with the metal bumps, pillars or pads 570 each to be attached to one of the metal pads or bumps 583 of one of the HBM chip packages 560 into a solder joint therebetween as one 516 in FIG. 29B. It is noted that the metal pads or bumps 583 of each of the HBM chip packages 560 may include the dummy pads or bumps 583*a* in a third group to be bonded with a third group of the metal bumps, pillars or pads 570 of one of the I/O chip packages 540 respectively into a third group of solder joints as ones 516*a* in FIG. 29B at a voltage of ground reference and the dummy pads or bumps 583*a* in a fourth group to be bonded with a fourth group of the metal bumps, pillars or pads 570 of said one of the I/O chip packages 510 respectively into a fourth group of solder joints as ones 516*a* in FIG. 29B not for any electrical function, wherein the third and fourth groups of solder joints may be vertically over the HBM IC chip 251 of said each of the HBM chip packages 560. The dedicated I/O chip 265 of the I/O chip package 540 may include a small I/O circuit 203 coupling to a small I/O circuit 203 of the FPGA IC chip 200 of the logic chip package 520 through, in sequence, one of the metal pads, lines or traces 108 of the dedicated I/O chip 265, the interconnection metal layers 27 of the top or frontside interconnection scheme for a logic drive or device 101 (TISD or FISD) of the I/O chip package 540, one of the solder joints 558, the interconnection metal layers 27 of the backside interconnection scheme for a logic drive or device 79 (BISD) of the HBM chip package 560, one of the copper posts 158 of the HBM chip package 560, the interconnection metal layers 27 of the top or frontside interconnection scheme for a logic drive or device 101 (TISD or FISD) of the HBM chip package 560, one of the solder joints 536, the interconnection metal layers 27 of the top or frontside interconnection scheme for a logic drive or device 101 (TISD or FISD) of the logic chip package 520 and one of the metal pads, lines or traces 108 of the FPGA IC chip 200; the dedicated I/O chip 265 of the I/O chip package 540 may include a small I/O circuit 203 coupling to a small I/O circuit 203 of the HBM IC chip 251 of the HBM chip package 560 through, in sequence, one of the metal pads, lines or traces 108 of the dedicated I/O chip 265, the interconnection metal layers 27 of the top or frontside interconnection scheme for a logic drive or device 101 (TISD or FISD) of the I/O chip package 540, one of the solder joints 558, the interconnection metal layers 27 of the backside interconnection scheme for a logic drive or device 79 (BISD) of the HBM chip package 560, one of the copper posts 158 of the HBM chip package 560, one or more of the interconnection metal layers 27 of the top or frontside interconnection scheme for a logic drive or device 101 (TISD or FISD) of the HBM chip package 560 and one of the metal pads, lines or traces 108 of the HBM IC chip 251; the dedicated I/O chip 265 of the I/O chip package 540 may include another small I/O circuit 203 coupling to a small I/O circuit 203 of the non-volatile memory IC chip 250 of the NVM chip package 510 through, in sequence, one of the metal pads, lines or traces 108 of the dedicated I/O chip 265, one or more of the interconnection metal layers 27 of the top or frontside interconnection scheme for a logic drive or device 101 (TISD or FISD) of the I/O chip package 540, one of the copper posts 158 of the I/O chip package 540, the interconnection metal layers 27 of the backside interconnection scheme for a logic drive or device 79 (BISD) of the I/O chip package 540, one of the solder joints 541, the interconnection metal layers 27 of the top or frontside interconnection scheme for a logic drive or device 101 (TISD or FISD) of the NVM chip package 510, and one of the metal pads, lines or traces 108 of the non-volatile memory IC chip 250, wherein the small I/O circuit 203 of each of the dedicated I/O chip 265, HBM IC chip 251, FPGA IC chip 200 and non-volatile memory IC chip 250 may be composed of a small driver 374, small receiver 375 and small ESD protection circuit 373 as illustrated in FIG. 5B all coupling to the I/O pad 372 provided by one of the metal pads, lines or traces 108 of said each of the dedicated I/O chip 265, HBM IC chip 251, FPGA IC chip 200 and non-volatile memory IC chip 250. The dedicated I/O chip 265 of the I/O chip package 540 may include a large I/O circuit 341 coupling to one of the solder bumps or balls 523 for external connection through, in sequence, one of the metal pads, lines or traces 108 of the dedicated I/O chip 265, the interconnection metal layers 27 of the top or frontside interconnection scheme for a logic drive or device 101 (TISD or FISD) of the I/O chip package 540, one of the solder joints 558, the interconnection metal layers 27 of the backside interconnection scheme for a logic drive or device 79 (BISD) of the HBM chip package 560, one of the copper posts 158 of the HBM chip package 560, the interconnection metal layers 27 of the top or frontside interconnection scheme for a logic drive or device 101 (TISD or FISD) of the HBM chip package 560, one of the solder joints 536, the interconnection metal layers 27 of the top or frontside interconnection scheme for a logic drive or device 101 (TISD or FISD) of the logic chip package 520, one of the copper posts 158 of the logic chip package 520, the interconnection metal layers 27 of the backside interconnection scheme for a logic drive or device 79 (BISD) of the logic chip package 520, one of the solder joints 521 and the circuit board 530, wherein the large I/O circuit 341 of the dedicated I/O chip 265 may be composed of a large driver 274, large receiver 275 and large ESD protection circuit 273 as illustrated in FIG. 5A all coupling to the I/O pad 272 provided by one of the metal pads, lines or traces 108 of the dedicated I/O chip 265. Besides the FPGA IC chip 200, the semiconductor chip 100 of the single-chip package or chiplet 550 used for the logic chip package 520 may be a CPU chip, GPU chip, TPU chip, APU chip or DSP chip.

Figure 29J:
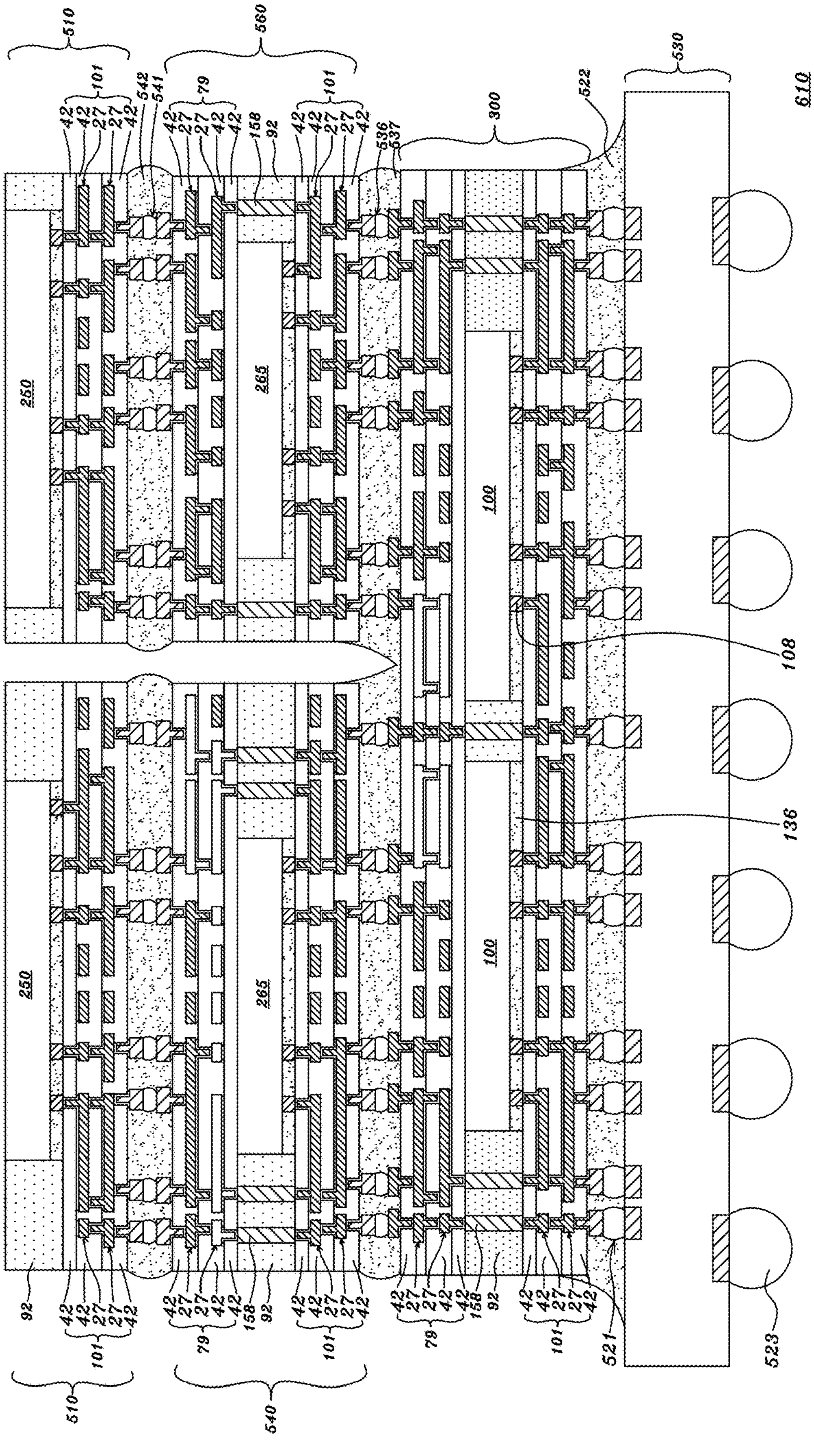

FIG. 29J is a schematically cross-sectional view showing a package-on-package (POP) assembly for a tenth type of non-volatile programmable logic drive in accordance with an embodiment of the present application. Referring to FIG. 29I, for forming a tenth type of non-volatile programmable logic drive 610, multiple I/O chip packages 540, each of which may be the single-chip package or chiplet 550 as illustrated in FIG. 28K, may be provided with the metal bumps, pillars or pads 570 each to be attached to one of the metal pads or bumps 583 of a logic drive 300, which may be multi-chip package 550 as illustrated in FIG. 28K, into a solder joint 536 therebetween having a solder between 20 and 100 micrometers, wherein each of the semiconductor chips 100 of the multi-chip package 550 used for the logic drive 300 may be provided for the standard commodity FPGA IC chip 200, DPIIC chip 410, NVMIC chip 250 (such as NAND or NOR flash chip), dedicated I/O chip 265, PCIC chip 269 (such as digital-signal-processing (DSP) chip, CPU chip, GPU chip, TPU chip or APU chip), high-bandwidth memory (HBM) chip (such as DRAM chip 321, SRAM chip, MRAM chip or RRAM chip), dedicated control chip 260, dedicated control and I/O chip 266, IAC chip 402 (such as analog IC chip, mixed mode IC chip or radio-frequency (RF) IC chip), DCIAC chip 267 or DCDI/OIAC chip 268 with an arrangement for one of the standard commodity logic drive 300 as illustrated in FIGS. 11A-11N, and the semiconductor chip 100 of the single-chip package or chiplet 550 used for the I/O chip package 540 may be a dedicated I/O chip 265. An underfill 537, such as polymer, may be formed between the logic drive 300 and each of the I/O chip packages 540, enclosing the solder joints 536. Multiple non-volatile-memory (NVM) chip package 510, each of which may be the single-chip package or chiplet 550 as illustrated in FIG. 28G, may be provided with the metal bumps, pillars or pads 570 each to be attached to one of the metal bumps or pads or bumps 583 of one of the I/O chip packages 540 into a solder joint 541 therebetween having a solder between 20 and 100 micrometers, wherein the semiconductor chip 100 of the single-chip package or chiplet 550 used for each of the non-volatile-memory (NVM) chip packages 510 may be a NAND flash chip or NOR flash chip as illustrated in FIGS. 11A-11N and none of the copper posts 158 as seen in FIG. 28G is provided in the polymer layer 92 of the single-chip package or chiplet 550 used for each of the non-volatile-memory (NVM) chip packages 510. An underfill 542, such as polymer, may be formed between each of the NVM chip packages 510 and one of the I/O chip packages 540, enclosing the solder joints 541. The logic drive 300 may be provided with the metal bumps, pillars or pads 570 each to be attached to a circuit board 530 into a solder joint 521 therebetween having a solder between 20 and 100 micrometers. An underfill 522, such as polymer, may be formed between the logic drive 300 and the circuit board 530, enclosing the solder joints 521. Multiple solder bumps or balls 523 may be provided in an array at a bottom of the circuit board 530. Alternatively, the backside interconnection scheme for a logic drive or device (BISD) 79 of each of the I/O chip packages 540 may be omitted such that each of the I/O chip packages 540 may have the structure like the single-chip package or chiplet 550 as illustrated in FIG. 28G, and each of the non-volatile-memory (NVM) chip packages 510 may be provided with the metal bumps, pillars or pads 570 each to be attached to one of the copper posts 158 of one of the I/O chip packages 540 into a solder joint therebetween as one 516 in FIG. 29C. Alternatively, each of the I/O chip packages 540 may have the structure like the single-chip package or chiplet 550 as illustrated in FIG. 28I, and each of the non-volatile-memory (NVM) chip packages 510 may be provided with the metal bumps, pillars or pads 570 each to be attached to one of the metal pads or bumps 583 of one of the I/O chip packages 540 into a solder joint therebetween as one 516 in FIG. 29B. It is noted that the metal pads or bumps 583 of each of the I/O chip packages 540 may include the dummy pads or bumps 583*a* in a first group to be bonded with a first group of the metal bumps, pillars or pads 570 of one of the non-volatile-memory (NVM) chip packages 510 respectively into a first group of solder joints as ones 516*a* in FIG. 29B at a voltage of ground reference and the dummy pads or bumps 583*a* in a second group to be bonded with a second group of the metal bumps, pillars or pads 570 of said one of the non-volatile-memory (NVM) chip packages 510 respectively into a second group of solder joints as ones 516*a* in FIG. 29B not for any electrical function, wherein the first and second groups of solder joints may be vertically over the dedicated I/O chip 265 of said each of the I/O chip packages 540. For each of the I/O chip packages 540, its dedicated I/O chip 265 may include a small I/O circuit 203 coupling to a small I/O circuit 203 of each of the FPGA IC chips 200 and/or PCIC chips 269 of the logic drive 300 through, in sequence, one of the metal pads, lines or traces 108 of its dedicated I/O chip 265, the interconnection metal layers 27 of its top or frontside interconnection scheme for a logic drive or device 101 (TISD or FISD), one of the solder joints 536 between the logic drive 300 and said each of the I/O chip packages 540, the interconnection metal layers 27 of the backside interconnection scheme for a logic drive or device 79 (BISD) of the logic drive 300, one of the copper posts 158 of the logic drive 300, one or more of the interconnection metal layers 27 of the top or frontside interconnection scheme for a logic drive or device 101 (TISD or FISD) of the logic drive 300, and one of the metal pads, lines or traces 108 of said each of the FPGA IC chips 200 and/or PCIC chips 269; its dedicated I/O chip 265 may include another small I/O circuit 203 coupling to a small I/O circuit 203 of the non-volatile memory IC chip 250 of one of the NVM chip packages 510 vertically over said each of the I/O chip packages 540 through, in sequence, one of the metal pads, lines or traces 108 of its dedicated I/O chip 265, one or more of the interconnection metal layers 27 of its top or frontside interconnection scheme for a logic drive or device 101 (TISD or FISD), one of its copper posts 158, the interconnection metal layers 27 of its backside interconnection scheme for a logic drive or device 79 (BISD), one of the solder joints 541 between said each of the I/O chip packages 540 and said one of the NVM chip packages 510, the interconnection metal layers 27 of the top or frontside interconnection scheme for a logic drive or device 101 (TISD or FISD) of said one of the NVM chip packages 510, and one of the metal pads, lines or traces 108 of the non-volatile memory IC chip 250 of said one of the NVM chip packages 510. For each of the above-mentioned dedicated I/O chips 265 of the I/O chip packages 540, non-volatile memory IC chips 250 of the NVM chip packages 510 and FPGA IC chips 200 and/or PCIC chips 269 of the logic drive 300, each of its small I/O circuit 203 may be composed of a small driver 374, small receiver 375 and small ESD protection circuit 373 as illustrated in FIG. 5B all coupling to the I/O pad 372 provided by one of its metal pads, lines or traces 108. For each of the I/O chip packages 540, its dedicated I/O chip 265 may include a large I/O circuit 341 coupling to one of the solder bumps or balls 523 for external connection through, in sequence, one of the metal pads, lines or traces 108 of its dedicated I/O chip 265, the interconnection metal layers 27 of its top or frontside interconnection scheme for a logic drive or device 101 (TISD or FISD), one of the solder joints 536 between the logic drive 300 and said each of the I/O chip packages 540, the interconnection metal layers 27 of the backside interconnection scheme for a logic drive or device 79 (BISD) of the logic drive 300, one of the copper posts 158 of the logic drive 300, the interconnection metal layers 27 of the top or frontside interconnection scheme for a logic drive or device 101 (TISD or FISD) of the logic drive 300, one of the solder joints 521 and the circuit board 530, wherein the large I/O circuit 341 of its dedicated I/O chip 265 may be composed of a large driver 274, large receiver 275 and large ESD protection circuit 273 as illustrated in FIG. 5A all coupling to the I/O pad 272 provided by one of the metal pads, lines or traces 108 of its dedicated I/O chip 265.

Figure 29K:
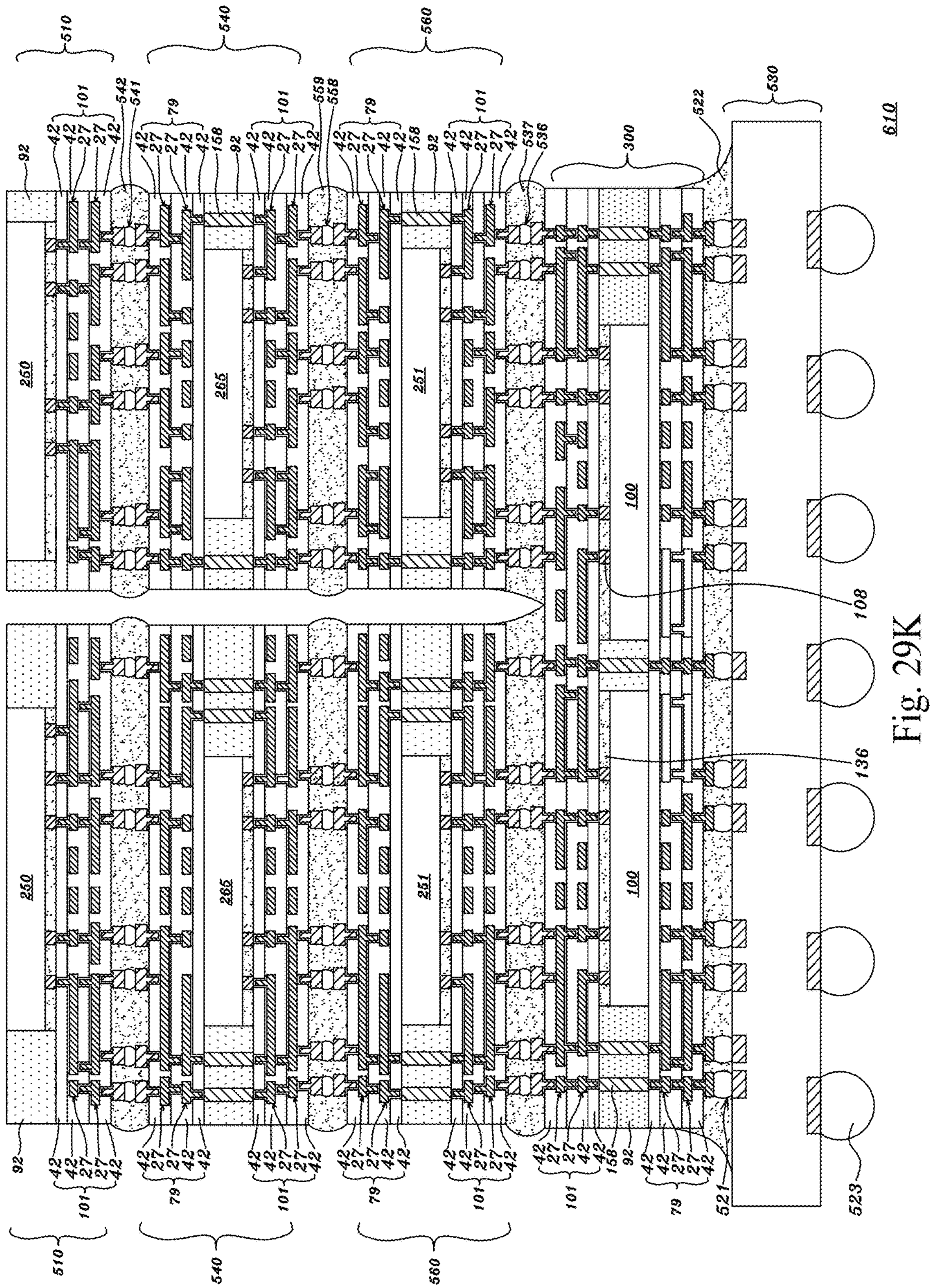

FIG. 29K is a schematically cross-sectional view showing a package-on-package (POP) assembly for an eleventh type of non-volatile programmable logic drive in accordance with an embodiment of the present application. The package-on-package (POP) assembly 610 as seen in FIG. 29K may have a similar structure to that as illustrated in FIG. 29J. For an element indicated by the same reference number shown in FIGS. 29J and 29K, the specification of the element as seen in FIG. 29K may be referred to that of the element as illustrated in FIG. 29J. The difference between the package-on-package (POP) assemblies 610 as illustrated in FIGS. 29J and 29K is that for forming an eleventh type of non-volatile programmable logic drive 610 as seen in FIG. 29K, multiple HBM chip packages 560, each of which may be the single-chip package or chiplet 550 as illustrated in FIG. 28K, may be provided with the metal bumps, pillars or pads 570 each to be attached to one of the metal bumps, pillars or pads 570 of a logic drive 300, which may be multi-chip package 550 as illustrated in FIG. 28K, into a solder joint 536 therebetween having a solder between 20 and 100 micrometers, wherein each of the semiconductor chips 100 of the multi-chip package 550 used for the logic drive 300 may be provided for the standard commodity FPGA IC chip 200, DPIIC chip 410, NVMIC chip 250 (such as NAND or NOR flash chip), dedicated I/O chip 265, PCIC chip 269 (such as digital-signal-processing (DSP) chip, CPU chip, GPU chip, TPU chip or APU chip), high-bandwidth memory (HBM) chip (such as DRAM chip 321, SRAM chip, MRAM chip or RRAM chip), dedicated control chip 260, dedicated control and I/O chip 266, IAC chip 402 (such as analog IC chip, mixed mode IC chip or radio-frequency (RF) IC chip), DCIAC chip 267 or DCDI/OIAC chip 268 with an arrangement for one of the standard commodity logic drive 300 as illustrated in FIGS. 11A-11N, and the semiconductor chip 100 of the single-chip package or chiplet 550 used for the HBM chip package 560 may be a HBM IC chip 251 such as DRAM chip, SRAM chip, MRAM chip or RRAM chip. An underfill 537, such as polymer, may be formed between the logic drive 300 and each of the HBM chip packages 560, enclosing the solder joints 536. Multiple I/O chip packages 540, each of which may be the single-chip package or chiplet 550 as illustrated in FIG. 28K, may be provided with the metal bumps, pillars or pads 570 each to be attached to one of the metal pads or bumps 583 of one of the HBM chip packages 560, into a solder joint 558 therebetween having a solder between 20 and 100 micrometers, wherein the semiconductor chip 100 of the single-chip package or chiplet 550 used for the I/O chip package 540 may be a dedicated I/O chip 265. An underfill 559, such as polymer, may be formed between each of the I/O chip packages 540 and one of the HBM chip packages 560, enclosing the solder joints 558. The logic drive 300 may be provided with the metal pads or bumps 583 each to be attached to a circuit board 530 into a solder joint 521 therebetween having a solder between 20 and 100 micrometers. An underfill 522, such as polymer, may be formed between the logic drive 300 and the circuit board 530, enclosing the solder joints 521. Alternatively, the backside interconnection scheme for a logic drive or device (BISD) 79 of each of the HBM chip packages 560 may be omitted such that each of the HBM chip packages 560 may have the structure like the single-chip package or chiplet 550 as illustrated in FIG. 28G, and each of the I/O chip packages 540 may be provided with the metal bumps, pillars or pads 570 each to be attached to one of the copper posts 158 of one of the HBM chip packages 560 into a solder joint therebetween as one 516 in FIG. 29C. Alternatively, each of the HBM chip packages 560 may have the structure like the single-chip package or chiplet 550 as illustrated in FIG. 28I, and each of the I/O chip packages 540 may be provided with the metal bumps, pillars or pads 570 each to be attached to one of the metal pads or bumps 583 of one of the HBM chip packages 560 into a solder joint therebetween as one 516 in FIG. 29B. It is noted that the metal pads or bumps 583 of each of the HBM chip packages 560 may include the dummy pads or bumps 583*a* in a third group to be bonded with a third group of the metal bumps, pillars or pads 570 of one of the I/O chip packages 540 respectively into a third group of solder joints as ones 516*a* in FIG. 29B at a voltage of ground reference and the dummy pads or bumps 583*a* in a fourth group to be bonded with a fourth group of the metal bumps, pillars or pads 570 of said one of the I/O chip packages 510 respectively into a fourth group of solder joints as ones 516*a* in FIG. 29B not for any electrical function, wherein the third and fourth groups of solder joints may be vertically over the HBM IC chip 251 of said each of the HBM chip packages 560. For each of the HBM chip packages 560, the communication between its HBM IC chip 251 and one of the FPGA IC chips 200 and/or PCIC chips 269 of the logic drive 300 vertically under its HBM IC chip 251 may be provided by a set of small I/O circuits 203 of its HBM IC chip 251, a set of metal pads, lines or traces 108 of its HBM IC chip 251, the interconnection metal layers 27 of the top or frontside interconnection scheme for a logic drive or device 101 (TISD or FISD) of said each of the HBM chip packages 560, a set of solder joints 536 between the logic drive 300 and said each of the HBM chip packages 560, the interconnection metal layers 27 of the top or frontside interconnection scheme for a logic drive or device 79 (TISD or FISD) of the logic drive 300, a set of metal pads, lines or traces 108 of said one of the FPGA IC chips 200 and/or PCIC chips 269 of the logic drive 300 and a set of small I/O circuits 203 of said one of the FPGA IC chips 200 and/or PCIC chips 269 of the logic drive 300 with a data bit width of equal to or greater than 64, 128, 256, 512, 1024, 2048, 4096, 8 K, or 16 K. For each of the HBM IC chips 251 of the HBM chip packages 560 and FPGA IC chips 200 and/or PCIC chips 269 of the logic drive 300, each of its small I/O circuit 203 may be composed of a small driver 374, small receiver 375 and small ESD protection circuit 373 as illustrated in FIG. 5B all coupling to the I/O pad 372 provided by one of its metal pads, lines or traces 108. For each of the I/O chip packages 540, its dedicated I/O chip 265 may include a small I/O circuit 203 coupling to a small I/O circuit 203 of each of the FPGA IC chips 200 and/or PCIC chips 269 of the logic drive 300 through, in sequence, one of the metal pads, lines or traces 108 of its dedicated I/O chip 265, the interconnection metal layers 27 of its top or frontside interconnection scheme for a logic drive or device 101 (TISD or FISD), one of the solder joints 536 between said each of the I/O chip packages 540 and one of the HBM chip packages 560, the interconnection metal layers 27 of the backside interconnection scheme for a logic drive or device 79 (BISD) of said one of the HBM chip packages 560, one of the copper posts 158 of said one of the HBM chip packages 560, the interconnection metal layers 27 of the top or frontside interconnection scheme for a logic drive or device 101 (TISD or FISD) of said one of the HBM chip packages 560, one of the solder joints 536 between the logic drive 300 and said one of the HBM chip packages 560, the interconnection metal layers 27 of the top or frontside interconnection scheme for a logic drive or device 101 (TISD or FISD) of the logic drive 300, and one of the metal pads, lines or traces 108 of said each of the FPGA IC chips 200 and/or PCIC chips 269; its dedicated I/O chip 265 may include another small I/O circuit 203 coupling to a small I/O circuit 203 of the HBM IC chip 251 of said one of the HBM chip packages 560 vertically under said each of the I/O chip packages 540 through, in sequence, one of the metal pads, lines or traces 108 of its dedicated I/O chip 265, the interconnection metal layers 27 of its top or frontside interconnection scheme for a logic drive or device 101 (TISD or FISD), one of the solder joints 536 between said each of the I/O chip packages 540 and said one of the HBM chip packages 560, the interconnection metal layers 27 of the backside interconnection scheme for a logic drive or device 79 (BISD) of said one of the HBM chip packages 560, one of the copper posts 158 of said one of the HBM chip packages 560, one or more of the interconnection metal layers 27 of the top or frontside interconnection scheme for a logic drive or device 101 (TISD or FISD) of said one of the HBM chip packages 560, and one of the metal pads, lines or traces 108 of the HBM IC chip 251 of said one of the HBM chip packages 560. For each of the above-mentioned dedicated I/O chips 265 of the I/O chip packages 540, HBM IC chips 251 of the HBM chip packages 560 and FPGA IC chips 200 and/or PCIC chips 269 of the logic drive 300, each of its small I/O circuit 203 may be composed of a small driver 374, small receiver 375 and small ESD protection circuit 373 as illustrated in FIG. 5B all coupling to the I/O pad 372 provided by one of its metal pads, lines or traces 108. For said each of the I/O chip packages 540, its dedicated I/O chip 265 may include a large I/O circuit 341 coupling to one of the solder bumps or balls 523 for external connection through, in sequence, one of the metal pads, lines or traces 108 of its dedicated I/O chip 265, the interconnection metal layers 27 of its top or frontside interconnection scheme for a logic drive or device 101 (TISD or FISD), one of the solder joints 536 between said each of the I/O chip packages 540 and said one of the HBM chip packages 560, the interconnection metal layers 27 of the backside interconnection scheme for a logic drive or device 79 (BISD) of said one of the HBM chip packages 560, one of the copper posts 158 of said one of the HBM chip packages 560, the interconnection metal layers 27 of the top or frontside interconnection scheme for a logic drive or device 101 (TISD or FISD) of said one of the HBM chip packages 560, one of the solder joints 536 between the logic drive 300 and said one of the HBM chip packages 560, the interconnection metal layers 27 of the top or frontside interconnection scheme for a logic drive or device 101 (TISD or FISD) of the logic drive 300, one of the copper posts 158 of the logic drive 300, the interconnection metal layers 27 of the backside interconnection scheme for a logic drive or device 101 (BISD) of the logic drive 300, one of the solder joints 521 and the circuit board 530, wherein the large I/O circuit 341 of its dedicated I/O chip 265 may be composed of a large driver 274, large receiver 275 and large ESD protection circuit 273 as illustrated in FIG. 5A all coupling to the I/O pad 272 provided by one of the metal pads, lines or traces 108 of its dedicated I/O chip 265.

For each of the first, second and fourth types of non-volatile programmable logic drives 610 as seen in FIGS. 29A, 29B and 29D, one or each of the non-volatile memory IC chips 250 of its NVM chip package 510 arranged vertically over its logic chip package 520 may be used for storing data or information for configuring the FPGA IC chip 200 of its logic chip package 520. One or each of the non-volatile memory IC chips 250 of its NVM chip package 510 may be used (1) for storing the resulting values for a look-up table (LUT) 210, each to be loaded through, in sequence, one of the wirebonded wires 514 of its NVM chip package 510, the circuit board 513 of its NVM chip package 510, one of its solder joints 516, each of the interconnection metal layers 27 of the BISD 79 of its logic chip package 520 optionally but particularly for the fourth type of non-volatile programmable logic drive 610, one of the copper posts 158 of its logic chip package 520 and one, more or each of the interconnection metal layers 27 of the TISD or FISD 101 of its logic chip package 520, or for the first alternative through, in sequence, one of the wirebonded wires 514 of its NVM chip package 510, the leadframe of its NVM chip package 510, each of the interconnection metal layers 27 of the BISD 79 of its logic chip package 520 optionally but particularly for the fourth type of non-volatile programmable logic drive 610, one of the copper posts 158 of its logic chip package 520 and one, more or each of the interconnection metal layers 27 of the TISD or FISD 101 of its logic chip package 520, to the memory cells 490 of the FPGA IC chip 200 of its logic chip package 520, which are associated with the second input data set of the multiplexer 211 of the programmable logic block 201 of the FPGA IC chip 200, as illustrated in FIG. 6A, of its logic chip package 520, and/or storing programing codes for a pass/no-pass switch 258 or cross-point switch 379, each to be loaded through, in sequence, one of the wirebonded wires 514 of its NVM chip package 510, the circuit board 513, one of its solder joints 516, each of the interconnection metal layers 27 of the BISD 79 of its logic chip package 520 optionally but particularly for the fourth type of non-volatile programmable logic drive 610, one of the copper posts 158 of its logic chip package 520 and one, more or each of the interconnection metal layers 27 of the TISD or FISD 101 of its logic chip package 520, or for the first alternative through, in sequence, one of the wirebonded wires 514 of its NVM chip package 510, the leadframe, each of the interconnection metal layers 27 of the BISD 79 of its logic chip package 520 optionally but particularly for the fourth type of non-volatile programmable logic drive 610, one of the copper posts 158 of its logic chip package 520 and one, more or each of the interconnection metal layers 27 of the TISD or FISD 101 of its logic chip package 520, to the memory cells 362 of the FPGA IC chip 200, as illustrated in FIGS. 7A-7C, of its logic chip package 520 to control the pass/no-pass switch 258 or cross-point switch 379 of the FPGA IC chip 200 of its logic chip package 520 to or not to couple two of the programmable interconnects 361 each provided by one or more of the copper posts 158 of its logic chip package 520 and/or one or more of the interconnection metal layers 27 of the TISD or FISD 101 and/or BISD 79 of its logic chip package 520; and (2) for storing data or information for operation of the FPGA IC chip 200 of its logic chip package 520 having been configured for given operations or functions by the resulting values for the look-up table (LUT) 210 and the programing codes for the pass/no-pass switch 258 or cross-point switch 379.

In an example, for each of the first, second and fourth types of non-volatile programmable logic drives 610 as illustrated in FIGS. 29A, 29B and 29D, an upper one of the non-volatile memory IC chips 250 of its NVN chip package 510 may be a NOR flash memory chip for storing the resulting values for a look-up table (LUT) 210 to be loaded through the path as mentioned in the above paragraph to the memory cells 490 of the FPGA IC chip 200 of its logic chip package 520, which are associated with the second input data set of the multiplexer 211 of the programmable logic block 201 of the FPGA IC chip 200, as illustrated in FIGS. 6A-6E, of its logic chip package 520, and/or storing programing codes for a pass/no-pass switch 258 or cross-point switch 379 to be loaded through the path as mentioned in the above paragraph to the memory cells 362 of the FPGA IC chip 200, as illustrated in FIGS. 7A-7C, of its logic chip package 520 to control the pass/no-pass switch 258 or cross-point switch 379 of the FPGA IC chip 200 of its logic chip package 520 to or not to couple two of the programmable interconnects 361 each provided by one or more of the copper posts 158 of its logic chip package 520 and/or one or more of the interconnection metal layers 27 of the TISD or FISD 101 and/or BISD 79 of its logic chip package 520. However, a lower one of the non-volatile memory IC chips 250 of its NVN chip package 510 may be a NAND flash memory chip for storing data or information for operation of the FPGA IC chip 200 of its logic chip package 520 having been configured for given operations or functions by the resulting values for the look-up table (LUT) 210 and the programing codes for the pass/no-pass switch 258 or cross-point switch 379.

For each of the third and fifth types of non-volatile programmable logic drives 610 as seen in FIGS. 29C and 29E, the non-volatile memory IC chip 250 of its NVM chip package 510 arranged vertically over its logic chip package 520 may be used for storing data or information for configuring the FPGA IC chip 200 of its logic chip package 520. The non-volatile memory IC chip 250 of its NVM chip package 510 may be used (1) for storing the resulting values for a look-up table (LUT) 210, each to be loaded through, in sequence, each of the interconnection metal layers 27 of the TISD or FISD 101 of its NVM chip package 510, one of its solder joints 516, each of the interconnection metal layers 27 of the BISD 79 of its logic chip package 520 optionally but particularly for the fifth type of non-volatile programmable logic drive 610, one of the copper posts 158 of its logic chip package 520 and one, more or each of the interconnection metal layers 27 of the TISD or FISD 101 of its logic chip package 520 to the memory cells 490 of the FPGA IC chip 200 of its logic chip package 520, which are associated with the second input data set of the multiplexer 211 of the programmable logic block 201 of the FPGA IC chip 200, as illustrated in FIG. 6A, of its logic chip package 520, and/or storing programing codes for a pass/no-pass switch 258 or cross-point switch 379, each to be loaded through, in sequence, each of the interconnection metal layers 27 of the TISD or FISD 101 of its NVM chip package 510, one of its solder joints 516, each of the interconnection metal layers 27 of the BISD 79 of its logic chip package 520 optionally but particularly for the fifth type of non-volatile programmable logic drive 610, one of the copper posts 158 of its logic chip package 520 and one, more or each of the interconnection metal layers 27 of the TISD or FISD 101 of its logic chip package 520 to the memory cells 362 of the FPGA IC chip 200, as illustrated in FIGS. 7A-7C, of its logic chip package 520 to control the pass/no-pass switch 258 or cross-point switch 379 of the FPGA IC chip 200 of its logic chip package 520 to or not to couple two of the programmable interconnects 361 each provided by one or more of the copper posts 158 of its logic chip package 520 and/or one or more of the interconnection metal layers 27 of the TISD or FISD 101 and/or BISD 79 of its logic chip package 520; and (2) for storing data or information for operation of the FPGA IC chip 200 of its logic chip package 520 having been configured for given operations or functions by the resulting values for the look-up table (LUT) 210 and the programing codes for the pass/no-pass switch 258 or cross-point switch 379.

For the sixth type of non-volatile programmable logic drives 610 as seen in FIG. 29F, its non-volatile memory IC chip 250 arranged vertically over its logic chip package 520 may be used for storing data or information for configuring the FPGA IC chip 200 of its logic chip package 520. Its non-volatile memory IC chip 250 of its NVM chip package 510 may be used (1) for storing the resulting values for a look-up table (LUT) 210, each to be loaded through, in sequence, one of its bonded contacts 531, each of the interconnection metal layers 27 of the BISD 79 of its logic chip package 520, one of the copper posts 158 of its logic chip package 520 and one, more or each of the interconnection metal layers 27 of the TISD or FISD 101 of its logic chip package 520 to the memory cells 490 of the FPGA IC chip 200 of its logic chip package 520, which are associated with the second input data set of the multiplexer 211 of the programmable logic block 201 of the FPGA IC chip 200, as illustrated in FIG. 6A, of its logic chip package 520, and/or storing programing codes for a pass/no-pass switch 258 or cross-point switch 379, each to be loaded through, in sequence, one of its bonded contacts 531, each of the interconnection metal layers 27 of the BISD 79 of its logic chip package 520, one of the copper posts 158 of its logic chip package 520 and one, more or each of the interconnection metal layers 27 of the TISD or FISD 101 of its logic chip package 520 to the memory cells 362 of the FPGA IC chip 200, as illustrated in FIGS. 7A-7C, of its logic chip package 520 to control the pass/no-pass switch 258 or cross-point switch 379 of the FPGA IC chip 200 of its logic chip package 520 to or not to couple two of the programmable interconnects 361 each provided by one or more of the copper posts 158 of its logic chip package 520 and/or one or more of the interconnection metal layers 27 of the TISD or FISD 101 and/or BISD 79 of its logic chip package 520; and (2) for storing data or information for operation of the FPGA IC chip 200 of its logic chip package 520 having been configured for given operations or functions by the resulting values for the look-up table (LUT) 210 and the programing codes for the pass/no-pass switch 258 or cross-point switch 379.

For the seventh type of non-volatile programmable logic drives 610 as seen in FIG. 29G, the non-volatile memory IC chip 250 of its NVM chip package 510 arranged vertically over its logic chip package 520 may be used for storing data or information for configuring the FPGA IC chip 200 of its logic chip package 520. The non-volatile memory IC chip 250 of its NVM chip package 510 may be used (1) for storing the resulting values for a look-up table (LUT) 210, each to be loaded through, in sequence, each of the interconnection metal layers 27 of the TISD or FISD 101 of its NVM chip package 510, one of its solder joints 541, each of the interconnection metal layers 27 of the BISD 79 of its I/O chip package 540 (optionally), one of the copper posts 158 of its I/O chip package 540, each of the interconnection metal layers 27 of the TISD or FISD 101 of its I/O chip package 540, one of its solder joints 536, each of the interconnection metal layers 27 of the BISD 79 of its logic chip package 520, one of the copper posts 158 of its logic chip package 520 and one, more or each of the interconnection metal layers 27 of the TISD or FISD 101 of its logic chip package 520 to the memory cells 490 of the FPGA IC chip 200 of its logic chip package 520, which are associated with the second input data set of the multiplexer 211 of the programmable logic block 201 of the FPGA IC chip 200, as illustrated in FIG. 6A, of its logic chip package 520, and/or storing programing codes for a pass/no-pass switch 258 or cross-point switch 379, each to be loaded through, in sequence, each of the interconnection metal layers 27 of the TISD or FISD 101 of its NVM chip package 510, one of its solder joints 541, each of the interconnection metal layers 27 of the BISD 79 of its I/O chip package 540 (optionally), one of the copper posts 158 of its I/O chip package 540, each of the interconnection metal layers 27 of the TISD or FISD 101 of its I/O chip package 540, one of its solder joints 536, each of the interconnection metal layers 27 of the BISD 79 of its logic chip package 520, one of the copper posts 158 of its logic chip package 520 and one, more or each of the interconnection metal layers 27 of the TISD or FISD 101 of its logic chip package 520 to the memory cells 362 of the FPGA IC chip 200, as illustrated in FIGS. 7A-7C, of its logic chip package 520 to control the pass/no-pass switch 258 or cross-point switch 379 of the FPGA IC chip 200 of its logic chip package 520 to or not to couple two of the programmable interconnects 361 each provided by one or more of the copper posts 158 of its logic chip package 520 and/or one or more of the interconnection metal layers 27 of the TISD or FISD 101 and/or BISD 79 of its logic chip package 520; and (2) for storing data or information for operation of the FPGA IC chip 200 of its logic chip package 520 having been configured for given operations or functions by the resulting values for the look-up table (LUT) 210 and the programing codes for the pass/no-pass switch 258 or cross-point switch 379.

For the eighth type of non-volatile programmable logic drives 610 as seen in FIG. 29H, the non-volatile memory IC chip 250 of its NVM chip package 510 arranged vertically over its logic chip package 520 may be used for storing data or information for configuring the FPGA IC chip 200 of its logic chip package 520. The non-volatile memory IC chip 250 of its NVM chip package 510 may be used (1) for storing the resulting values for a look-up table (LUT) 210, each to be loaded through, in sequence, each of the interconnection metal layers 27 of the TISD or FISD 101 of its NVM chip package 510, one of its solder joints 541, each of the interconnection metal layers 27 of the BISD 79 of its HBM chip package 560 (optionally), one of the copper posts 158 of its HBM chip package 560, each of the interconnection metal layers 27 of the TISD or FISD 101 of its HBM chip package 560, one of its solder joints 536 and each of the interconnection metal layers 27 of the TISD or FISD 101 of its logic chip package 520 to the memory cells 490 of the FPGA IC chip 200 of its logic chip package 520, which are associated with the second input data set of the multiplexer 211 of the programmable logic block 201 of the FPGA IC chip 200, as illustrated in FIG. 6A, of its logic chip package 520, and/or storing programing codes for a pass/no-pass switch 258 or cross-point switch 379, each to be loaded through, in sequence, each of the interconnection metal layers 27 of the TISD or FISD 101 of its NVM chip package 510, one of its solder joints 541, each of the interconnection metal layers 27 of the BISD 79 of its HBM chip package 560 (optionally), one of the copper posts 158 of its HBM chip package 560, each of the interconnection metal layers 27 of the TISD or FISD 101 of its HBM chip package 560, one of its solder joints 536 and each of the interconnection metal layers 27 of the TISD or FISD 101 of its logic chip package 520 to the memory cells 362 of the FPGA IC chip 200, as illustrated in FIGS. 7A-7C, of its logic chip package 520 to control the pass/no-pass switch 258 or cross-point switch 379 of the FPGA IC chip 200 of its logic chip package 520 to or not to couple two of the programmable interconnects 361 each provided by one or more of the copper posts 158 of its logic chip package 520 and/or one or more of the interconnection metal layers 27 of the TISD or FISD 101 and/or BISD 79 of its logic chip package 520; and (2) for storing data or information for operation of the FPGA IC chip 200 of its logic chip package 520 having been configured for given operations or functions by the resulting values for the look-up table (LUT) 210 and the programing codes for the pass/no-pass switch 258 or cross-point switch 379.

For the ninth type of non-volatile programmable logic drives 610 as seen in FIG. 29I, the non-volatile memory IC chip 250 of its NVM chip package 510 arranged vertically over its logic chip package 520 may be used for storing data or information for configuring the FPGA IC chip 200 of its logic chip package 520. The non-volatile memory IC chip 250 of its NVM chip package 510 may be used (1) for storing the resulting values for a look-up table (LUT) 210, each to be loaded through, in sequence, each of the interconnection metal layers 27 of the TISD or FISD 101 of its NVM chip package 510, one of its solder joints 541, each of the interconnection metal layers 27 of the BISD 79 of its I/O chip package 540 (optionally), one of the copper posts 158 of its I/O chip package 540, each of the interconnection metal layers 27 of the TISD or FISD 101 of its I/O chip package 540, one of its solder joints 558, each of the interconnection metal layers 27 of the BISD 79 of its HBM chip package 560 (optionally), one of the copper posts 158 of its HBM chip package 560, each of the interconnection metal layers 27 of the TISD or FISD 101 of its HBM chip package 560, one of its solder joints 536 and each of the interconnection metal layers 27 of the TISD or FISD 101 of its logic chip package 520 to the memory cells 490 of the FPGA IC chip 200 of its logic chip package 520, which are associated with the second input data set of the multiplexer 211 of the programmable logic block 201 of the FPGA IC chip 200, as illustrated in FIG. 6A, of its logic chip package 520, and/or storing programing codes for a pass/no-pass switch 258 or cross-point switch 379, each to be loaded through, in sequence, each of the interconnection metal layers 27 of the TISD or FISD 101 of its NVM chip package 510, one of its solder joints 541, each of the interconnection metal layers 27 of the BISD 79 of its I/O chip package 540 (optionally), one of the copper posts 158 of its I/O chip package 540, each of the interconnection metal layers 27 of the TISD or FISD 101 of its I/O chip package 540, one of its solder joints 558, each of the interconnection metal layers 27 of the BISD 79 of its HBM chip package 560 (optionally), one of the copper posts 158 of its HBM chip package 560, each of the interconnection metal layers 27 of the TISD or FISD 101 of its HBM chip package 560, one of its solder joints 536 and each of the interconnection metal layers 27 of the TISD or FISD 101 of its logic chip package 520 to the memory cells 362 of the FPGA IC chip 200, as illustrated in FIGS. 7A-7C, of its logic chip package 520 to control the pass/no-pass switch 258 or cross-point switch 379 of the FPGA IC chip 200 of its logic chip package 520 to or not to couple two of the programmable interconnects 361 each provided by one or more of the copper posts 158 of its logic chip package 520 and/or one or more of the interconnection metal layers 27 of the TISD or FISD 101 and/or BISD 79 of its logic chip package 520; and (2) for storing data or information for operation of the FPGA IC chip 200 of its logic chip package 520 having been configured for given operations or functions by the resulting values for the look-up table (LUT) 210 and the programing codes for the pass/no-pass switch 258 or cross-point switch 379.

For the tenth type of non-volatile programmable logic drive 610 as illustrated in FIG. 29J, the non-volatile memory IC chip 250 of each of its NVM chip packages 510 arranged vertically over its logic drive 300 may be used for storing data or information for configuring one of the FPGA IC chips 200 of its logic chip package 520. The non-volatile memory IC chip 250 of said each of its NVM chip packages 510 may be used (1) for storing the resulting values for a look-up table (LUT) 210, each to be loaded through, in sequence, each of the interconnection metal layers 27 of the TISD or FISD 101 of said each of its NVM chip packages 510, one of its solder joints 541 under said each of its NVM chip packages 510, each of the interconnection metal layers 27 of the BISD 79 of one of its I/O chip packages 540 under said each of its NVM chip packages 510 (optionally), one of the copper posts 158 of said one of its I/O chip packages 540, each of the interconnection metal layers 27 of the TISD or FISD 101 of said one of its I/O chip packages 540, one of its solder joints 536 under said one of its I/O chip packages 540, each of the interconnection metal layers 27 of the BISD 79 of its logic drive 300, one of the copper posts 158 of its logic drive 300 and one, more or each of the interconnection metal layers 27 of the TISD or FISD 101 of its logic drive 300 to the memory cells 490 of said one of the FPGA IC chips 200 of its logic drive 300, which are associated with the second input data set of the multiplexer 211 of the programmable logic block 201 of said one of the FPGA IC chips 200, as illustrated in FIG. 6A, of its logic drive 300, and/or storing programing codes for a pass/no-pass switch 258 or cross-point switch 379, each to be loaded through, in sequence, each of the interconnection metal layers 27 of the TISD or FISD 101 of said each of its NVM chip packages 510, one of its solder joints 541 under said each of its NVM chip packages 510, each of the interconnection metal layers 27 of the BISD 79 of said one of its I/O chip packages 540 (optionally), one of the copper posts 158 of said one of its I/O chip packages 540, each of the interconnection metal layers 27 of the TISD or FISD 101 of said one of its I/O chip packages 540, one of its solder joints 536 under said one of its I/O chip packages 540, each of the interconnection metal layers 27 of the BISD 79 of its logic drive 300, one of the copper posts 158 of its logic drive 300 and one, more or each of the interconnection metal layers 27 of the TISD or FISD 101 of its logic drive 300 to the memory cells 362 of said one of the FPGA IC chips 200, as illustrated in FIGS. 7A-7C, of its logic drive 300 to control the pass/no-pass switch 258 or cross-point switch 379 of said one of the FPGA IC chips 200 of its logic drive 300 to or not to couple two of the programmable interconnects 361 each provided by one or more of the copper posts 158 of its logic drive 300 and/or one or more of the interconnection metal layers 27 of the TISD or FISD 101 and/or BISD 79 of its logic drive 300; and (2) for storing data or information for operation of said one of the FPGA IC chips 200 of its logic drive 300 having been configured for given operations or functions by the resulting values for the look-up table (LUT) 210 and the programing codes for the pass/no-pass switch 258 or cross-point switch 379.

In an example, for the tenth type of non-volatile programmable logic drives 610 as illustrated in FIG. 29J, the non-volatile memory IC chip 250 of a left one of its NVN chip packages 510 may be a NOR flash memory chip for storing the resulting values for a look-up table (LUT) 210 to be loaded through the path as mentioned in the above paragraph to the memory cells 490 of said one of the FPGA IC chips 200 of its logic drive 300, which are associated with the second input data set of the multiplexer 211 of the programmable logic block 201 of said one of the FPGA IC chips 200, as illustrated in FIG. 6A, of its logic drive 300, and/or storing programing codes for a pass/no-pass switch 258 or cross-point switch 379 to be loaded through the path as mentioned in the above paragraph to the memory cells 362 of said one of the FPGA IC chips 200, as illustrated in FIGS. 7A-7C, of its logic drive 300 to control the pass/no-pass switch 258 or cross-point switch 379 of said one of the FPGA IC chips 200 of its logic drive 300 to or not to couple two of the programmable interconnects 361 each provided by one or more of the copper posts 158 of its logic drive 300 and/or one or more of the interconnection metal layers 27 of the TISD or FISD 101 and/or BISD 79 of its logic drive 300. However, the non-volatile memory IC chip 250 of a right one of its NVN chip packages 510 may be a NAND flash memory chip for storing data or information for operation of said one of the FPGA IC chips 200 of its logic drive 300 having been configured for given operations or functions by the resulting values for the look-up table (LUT) 210 and the programing codes for the pass/no-pass switch 258 or cross-point switch 379.

For the eleventh type of non-volatile programmable logic drives 610 as seen in FIG. 29K, the non-volatile memory IC chip 250 of each of its NVM chip packages 510 arranged vertically over its logic drive 300 may be used for storing data or information for configuring one of the FPGA IC chips 200 of its logic drive 300. The non-volatile memory IC chip 250 of said each of its NVM chip packages 510 may be used (1) for storing the resulting values for a look-up table (LUT) 210, each to be loaded through, in sequence, each of the interconnection metal layers 27 of the TISD or FISD 101 of said one of its NVM chip packages 510, one of its solder joints 541 under said each of its NVM chip packages 510, each of the interconnection metal layers 27 of the BISD 79 of one of its I/O chip packages 540 under said each of its NVM chip packages 510 (optionally), one of the copper posts 158 of said one of its I/O chip packages 540, each of the interconnection metal layers 27 of the TISD or FISD 101 of said one of its I/O chip packages 540, one of its solder joints 558 under said one of its I/O chip packages 540, each of the interconnection metal layers 27 of the BISD 79 of one of its HBM chip packages 560 under said one of its I/O chip packages 540 (optionally), one of the copper posts 158 of said one of its HBM chip packages 560, each of the interconnection metal layers 27 of the TISD or FISD 101 of said one of its HBM chip packages 560, one of its solder joints 536 under said one of its HBM chip packages 560 and each of the interconnection metal layers 27 of the TISD or FISD 101 of its logic drive 300 to the memory cells 490 of said one of the FPGA IC chips 200 of its logic drive 300, which are associated with the second input data set of the multiplexer 211 of the programmable logic block 201 of said one of the FPGA IC chips 200, as illustrated in FIG. 6A, of its logic chip package 520, and/or storing programing codes for a pass/no-pass switch 258 or cross-point switch 379, each to be loaded through, in sequence, each of the interconnection metal layers 27 of the TISD or FISD 101 of said one of its NVM chip packages 510, one of its solder joints 541 under said each of its NVM chip packages 510, each of the interconnection metal layers 27 of the BISD 79 of said one of its I/O chip packages 540 (optionally), one of the copper posts 158 of said one of its I/O chip packages 540, each of the interconnection metal layers 27 of the TISD or FISD 101 of said one of its I/O chip packages 540, one of its solder joints 558 under said one of its I/O chip packages 540, each of the interconnection metal layers 27 of the BISD 79 of said one of its HBM chip packages 560 (optionally), one of the copper posts 158 of said one of its HBM chip packages 560, each of the interconnection metal layers 27 of the TISD or FISD 101 of said one of its HBM chip packages 560, one of its solder joints 536 under said one of its HBM chip packages 560 and each of the interconnection metal layers 27 of the TISD or FISD 101 of its logic drive 300 to the memory cells 362 of said one of the FPGA IC chips 200, as illustrated in FIGS. 7A-7C, of its logic drive 300 to control the pass/no-pass switch 258 or cross-point switch 379 of said one of the FPGA IC chips 200 of its logic drive 300 to or not to couple two of the programmable interconnects 361 each provided by one or more of the copper posts 158 of its logic drive 300 and/or one or more of the interconnection metal layers 27 of the TISD or FISD 101 and/or BISD 79 of its logic drive 300; and (2) for storing data or information for operation of said one of the FPGA IC chips 200 of its logic drive 300 having been configured for given operations or functions by the resulting values for the look-up table (LUT) 210 and the programing codes for the pass/no-pass switch 258 or cross-point switch 379.

In an example, for the eleventh type of non-volatile programmable logic drives 610 as illustrated in FIG. 29K, the non-volatile memory IC chip 250 of a left one of its NVN chip packages 510 may be a NOR flash memory chip for storing the resulting values for a look-up table (LUT) 210 to be loaded through the path as mentioned in the above paragraph to the memory cells 490 of said one of the FPGA IC chips 200 of its logic drive 300, which are associated with the second input data set of the multiplexer 211 of the programmable logic block 201 of said one of the FPGA IC chips 200, as illustrated in FIG. 6A, of its logic drive 300, and/or storing programing codes for a pass/no-pass switch 258 or cross-point switch 379 to be loaded through the path as mentioned in the above paragraph to the memory cells 362 of said one of the FPGA IC chips 200, as illustrated in FIGS. 7A-7C, of its logic drive 300 to control the pass/no-pass switch 258 or cross-point switch 379 of said one of the FPGA IC chips 200 of its logic drive 300 to or not to couple two of the programmable interconnects 361 each provided by one or more of the copper posts 158 of its logic drive 300 and/or one or more of the interconnection metal layers 27 of the TISD or FISD 101 and/or BISD 79 of its logic drive 300. However, the non-volatile memory IC chip 250 of a right one of its NVN chip packages 510 may be a NAND flash memory chip for storing data or information for operation of said one of the FPGA IC chips 200 of its logic drive 300 having been configured for given operations or functions by the resulting values for the look-up table (LUT) 210 and the programing codes for the pass/no-pass switch 258 or cross-point switch 379.

Accordingly, a user or developer with innovation or application concept or idea may purchase any of the first through eleventh types of nonvolatile programmable logic drives or devices 610 as seen in FIGS. 29A-29K, and develop or write software codes, data or programs, i.e., resulting values for look-up tables (LUTs) and/or programming codes for pass/no-pass switches or cross-point switches, to load into the non-volatile memory IC chip 250 of its NVM chip package 510 for implementing his/her innovation or application concept or idea. The developed software codes, data or programs may be downloaded from the non-volatile memory IC chip 250 of its NVM chip package 510 to the memory cells 362 for the programmable interconnection and/or the memory cells 490 for the programmable logic circuits, cells or blocks 201 in the FPGA IC chip 200 of its logic chip package 520 through the interconnection metal layers 27 of the TISD or FISD 101 of its logic chip package 520.

Figure 30A:
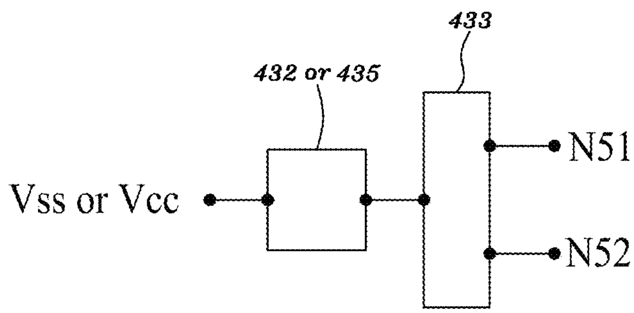
FIG. 30A is a block diagram showing an operation for a fuse in accordance with an embodiment of the present application.
Figure 30B:
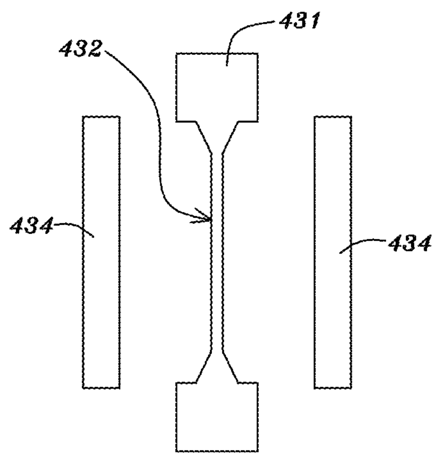
FIG. 30B is a schematically top view showing a structure of an electrical fuse (e-fuse) in accordance with an embodiment of the present application.
Figure 30C:
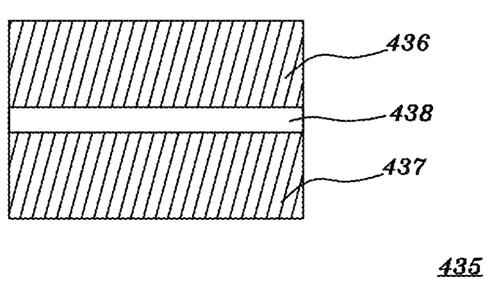
FIG. 30C is a schematically cross-sectional view showing a structure of an anti-fuse in accordance with an embodiment of the present application.

For the logic chip package 520 of each of the first through ninth types of non-volatile programmable logic drives 610 as illustrated in FIGS. 29A-29I or the logic drive 300 of each of the tenth and eleventh types of non-volatile programmable logic drives 610 as illustrated in FIGS. 29J and 29K, its FPGA IC chip(s) 200 may include an on-chip security circuit for design security. The on-chip security circuit is used for preventing the resulting values for a look-up table (LUT) 210 for its FPGA IC chip(s) 200 and the programing codes for a pass/no-pass switch 258 or cross-point switch 379 of its FPGA IC chip(s) 200 from being copied or reverse engineered. Its FPGA IC chip(s) 200 (each) may include multiple dedicated non-volatile memory elements configured to store a 128, 256, 512 or 1024-bit decryption key, in accordance with which the on-chip security circuit may provide on-chip bitstream decryption by decrypting encrypted data associated with the resulting values for the look-up table (LUT) 210 for (said each of) its FPGA IC chip(s) 200 and the programing codes for the pass/no-pass switch 258 or cross-point switch 379 of (said each of) its FPGA IC chip(s) 200, which are loaded from non-volatile memory cells of the non-volatile memory IC chip 250 of (one of) the NVM chip package(s) 510 of said each of the first through tenth types of non-volatile programmable logic drives 610 as illustrated in FIGS. 29A-29I, as decrypted data. The decrypted data associated with the resulting values for the look-up table (LUT) 210 for (said each of) the FPGA IC chip(s) 200 may be passed to and stored in the memory cells 490 of (said each of) the FPGA IC chip(s) 200 as illustrated in FIG. 6A, and the decrypted data associated with the programing codes for the pass/no-pass switch 258 or cross-point switch 379 of the FPGA IC chip 200 may be passed to and stored in the memory cells 362 of (said each of) the FPGA IC chip(s) 200 as illustrated in FIGS. 7A-7C. Thereby, the programmable logic block or circuits 201 and programmable interconnects 361 of (said each of) the FPGA IC chip(s) 200 may be configured. The decryption key may be created from a truly random source. Each of the dedicated non-volatile memory elements of (said each of) the FPGA IC chip(s) 200 may include a MRAM cell or RRAM cell configured to store the decryption key. Alternatively, each of the dedicated non-volatile memory elements may include a MOS transistor having a gate terminal, which is electrically floating, configured to store the decryption key. Alternatively, (said each of) the FPGA IC chip(s) 200 may include multiple metal traces 431 each having a narrow neck 432 configured as an electrical fuse, i.e., e-fuse, as seen in FIGS. 30A and 30B for one of the dedicated non-volatile memory elements, wherein FIG. 30A is a block diagram showing an operation for a fuse in accordance with an embodiment of the present application; FIG. 30B is a schematically top view showing a structure of an electrical fuse (e-fuse) in accordance with an embodiment of the present application. A pair dam bars 434 may be formed of a metal at two opposite sides of the electrical fuse 432, extending along the electrical fuse 432 to protect the electrical fuse 432 from been damaged. In programming for the electrical fuse 432 to be in a non-volatile state, the electrical fuse 432 may have an end to be switched via a switch 433 of (said each of) the FPGA IC chip(s) 200 to couple to a node N51 at a voltage of power supply or ground reference, and thus a high current may be selectively generated to flow through the electrical fuse 432 to cut or break the electrical fuse 432. After programming for the electrical fuse 432, the end of the electrical fuse 432 may be switched via the switch 433 to couple to a node N52 coupling to the on-chip security circuit. Alternatively, (said each of) the FPGA IC chip(s) 200 may include multiple anti-fuses 435 each configured as one of the dedicated non-volatile memory elements, wherein each of the anti-fuses 435 may be composed of two electrodes 436 and 437 and an oxide window 438 between the two electrodes 436 and 437 as seen in FIGS. 30A and 30C, wherein FIG. 30C is a schematically cross-sectional view showing a structure of an anti-fuse in accordance with an embodiment of the present application. In programming for one of the anti-fuses 435 to be in a non-volatile state, one of its two electrodes 436 and 437 may be switched via the switch 433 to couple to the node N51 at a voltage of power supply or ground reference, and thus a high voltage may be applied between its two electrodes 436 and 437 to break down oxide of its oxide window 438. After programming for said one of the anti-fuses 435, said one of its two electrodes 436 and 437 may be switched via the switch 433 to couple to the node N52 coupling to the on-chip security circuit. Both of its two electrodes 436 and 437 may be made of a metal or polysilicon; alternatively, one of its two electrodes 436 and 437 is made of a metal, and the other of its two electrodes 436 and 437 is made of polysilicon. Alternatively, said each of the dedicated non-volatile memory elements may be replaced with a dedicated random-access-memory (RAM) cell configured to store the decryption key, wherein the dedicated random-access-memory (RAM) cell may be backed up by an externally connected battery. The decryption key may only be programmed into (said one of) the FPGA IC chip(s) 200 through a special port of (said one of) the FPGA IC chip(s) 200.

Figure 29L:
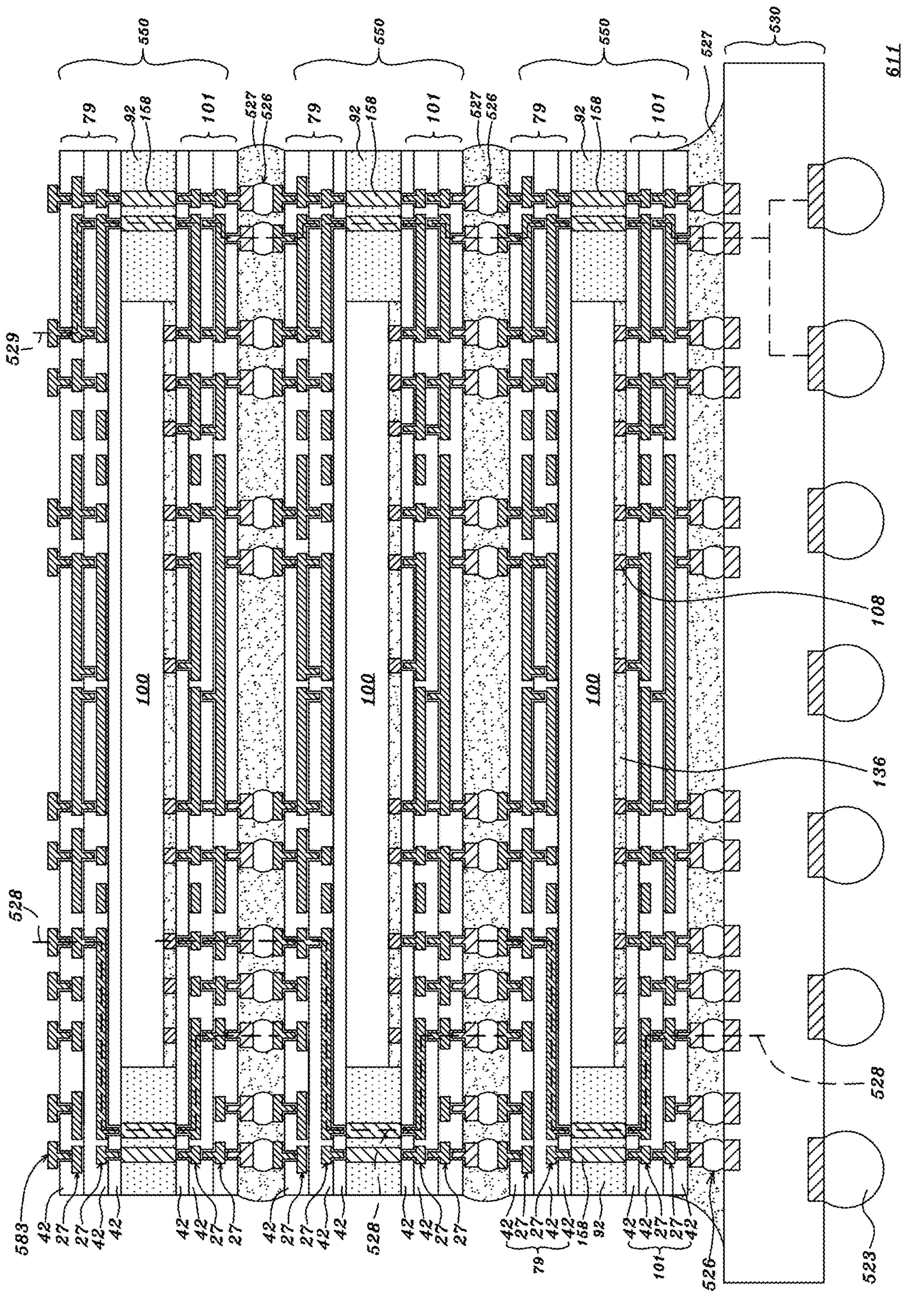
FIG. 29L is a schematically cross-sectional view showing a package-on-package (POP) assembly in accordance with an embodiment of the present application.

FIG. 29L is a schematically cross-sectional view showing a package-on-package (POP) assembly in accordance with an embodiment of the present application. Referring to FIG. 29L, for forming a package-on-package (POP) assembly 611, a plurality of single-chip packages or chiplets 550 each as illustrated in FIG. 28K may be provided with the same circuit layout for the interconnection metal layers 27 of their TISDs or FISDs 101 and BISDs 79 and their copper posts 158, and the semiconductor chips 100 of its all single-chip packages or chiplets 550 may be the same. An upper one of its single-chip packages or chiplets 550 may be provided with the metal bumps, pillars or pads 570 each to be attached to one of the metal pads or bumps 583 of a lower one of its single-chip packages or chiplets 550 into a solder joint 526 therebetween having a solder between 20 and 100 micrometers. An underfill 527, such as polymer, may be formed between the upper and lower ones of its single-chip packages or chiplets 550, enclosing the solder joints 526. A bottommost one of its single-chip packages or chiplets 550 may be provided with the metal bumps, pillars or pads 570 each to be attached to its circuit board 530 into a solder joint 526 therebetween. An underfill 527, such as polymer, may be formed between its circuit board 530 and the bottommost one of its single-chip packages or chiplets 550, enclosing the solder joints 526. Each of its semiconductor chips 100 may be a FPGA IC chip, DPIIC chip, NVMIC chip (such as NAND or NOR flash chip), dedicated I/O chip 265, PCIC chip (such as digital-signal-processing (DSP) chip, CPU chip, GPU chip, TPU chip or APU chip), high-bandwidth memory (HBM) chip (such as DRAM chip, SRAM chip, MRAM chip or RRAM chip), dedicated control chip, dedicated control and I/O chip, IAC chip (such as analog IC chip, mixed mode IC chip or radio-frequency (RF) IC chip), DCIAC chip or DCDI/OIAC chip.

Figure 28L:
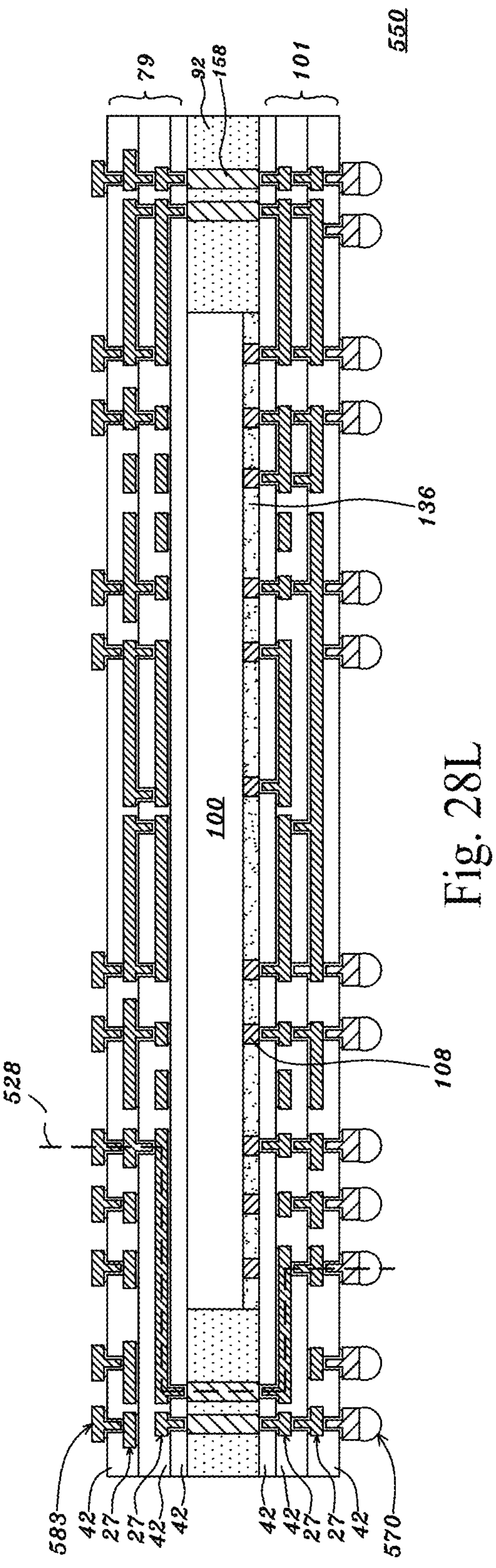
FIG. 28L is a schematically view showing a process for forming a chip package with BISD and TPVs in accordance with an embodiment of the present application.

Referring to FIG. 29L, each of its single-chip packages or chiplets 550 may include a bypass interconnect 528 as seen in FIG. 28L for coupling the semiconductor chip 100 of a first one of its single-chip packages or chiplets 550 above said each of its single-chip packages or chiplets 550 to the semiconductor chip 100 of a second one of its single-chip packages or chiplets 550 under said each of its single-chip packages or chiplets 550 or to its circuit board 530 under said each of its single-chip packages or chiplets 550 without coupling to the semiconductor chip 100 of said each of its single-chip packages or chiplets 550. The bypass interconnect 528 of said each of its single-chip packages or chiplets 550 may have an upper end at one of the metal pads or bumps 583 of said each of its single-chip packages or chiplets 550 and a lower end at one of the metal bumps, pillars or pads 570 of said each of its single-chip packages or chiplets 550, wherein a horizontal distance between the upper and lower ends may be greater than or equal to a largest transverse dimension of said one of the metal bumps, pillars or pads 570 or greater than or equal to a pitch of neighboring two of the metal bumps, pillars or pads 570 of said each of its single-chip packages or chiplets 550, wherein the upper end may couple to the lower end through, in sequence, each of the interconnection metal layers 27 of BISD 79 of said each of its single-chip packages or chiplets 550, one of the copper posts 158 of said each of its single-chip packages or chiplets 550 and each of the interconnection metal layers 27 of TISD or FISD 101 of said each of its single-chip packages or chiplets 550, wherein the semiconductor chip 100 of the first one of its single-chip packages or chiplets 550 may couple to the semiconductor chip 100 of the second one of its single-chip packages or chiplets 550 through, in sequence, each of the interconnection metal layers 27 of TISD or FISD 101 of the first one of its single-chip packages or chiplets 550, one of the solder joints 526 between the first one of its single-chip packages or chiplets 550 and said each of its single-chip packages or chiplets 550, the bypass interconnect 528 of said each of its single-chip packages or chiplets 550, one of the solder joints 526 between the second one of its single-chip packages or chiplets 550 and said each of its single-chip packages or chiplets 550, each of the interconnection metal layers 27 of BISD 79 of the second of its single-chip packages or chiplets 550, one of the copper posts 158 of the second one of its single-chip packages or chiplets 550 and one or more of the interconnection metal layers 27 of TISD or FISD 101 of the second one of its single-chip packages or chiplets 550, or the semiconductor chip 100 of the first one of its single-chip packages or chiplets 550 may couple to its circuit board 530 through, in sequence, each of the interconnection metal layers 27 of TISD or FISD 101 of the first one of its single-chip packages or chiplets 550, one of the solder joints 526 between the first one of its single-chip packages or chiplets 550 and said each of its single-chip packages or chiplets 550, the bypass interconnect 528 of said each of its single-chip packages or chiplets 550 and one of the solder joints 526 between its circuit board 530 and said each of its single-chip packages or chiplets 550, wherein a horizontal distance from said one of the solder joints 526 between the first one of its single-chip packages or chiplets 550 and said each of its single-chip packages or chiplets 550 to said one of the solder joints 526 between the second one of its single-chip packages or chiplets 550 and said each of its single-chip packages or chiplets 550 or between its circuit board 530 and said each of its single-chip packages or chiplets 550 may be greater than or equal to a largest transverse dimension of said one of the solder joints 526 between the second one of its single-chip packages or chiplets 550 and said each of its single-chip packages or chiplets 550 or between its circuit board 530 and said each of its single-chip packages or chiplets 550 or greater than or equal to a pitch of neighboring two of the solder joints 526 between the second one of its single-chip packages or chiplets 550 and said each of its single-chip packages or chiplets 550 or between its circuit board 530 and said each of its single-chip packages or chiplets 550. Furthermore, the package-on-package (POP) assembly 611 may include a power or ground bus 529 coupling to the semiconductor chip 100 of each of its single-chip packages or chiplets 550 and to one or more of the solder bumps or balls 523 under the circuit board 530. Each of the interconnection metal layers 27 of BISD 79, one or more of the copper posts 158 and each of the interconnection metal layers 27 of TISD or FISD 101 of each of its single-chip packages or chiplets 550 may be provided for its power or ground bus 529 to deliver a voltage of power supply or ground reference to the semiconductor chip 100 of each of its single-chip packages or chiplets 550.

Fin Field Effect Transistor (FinFET)

FIG. 31A is a schematically perspective view showing a structure of a fin field effect transistor in accordance with an embodiment of the present application. FIG. 31B is a cross-sectional view showing a structure of a fin field effect transistor along a cross-sectional line B-B of FIG. 31A in accordance with an embodiment of the present application. Referring to FIGS. 31A and 31B, a fin field effect transistor 4 may be formed on a P-type or N-type semiconductor substrate 2, e.g., silicon substrate. In this case, a P-type silicon substrate 2 coupling to the voltage Vss of ground reference is provided for the fin field effect transistor 4. The fin field effect transistor 4 may include:

(1) a P-type stripe 731 formed with a P-type well 732 in the P-type silicon substrate 2 and a P-type fin 733 vertically protruding from a top surface of the P-type well 732 and extending in a first direction, wherein the P-type well 732 may have a depth $d1_{wP}$ between 0.3 and 5 micrometers and a width $w1_{wP}$ between 50 nanometers and 1 micrometer, wherein the P-type fin 733 may have a height $h1_{fP}$ between 10 and 200 nanometers and a width $w1_{fP}$ between 1 and 100 nanometers;

(2) a field oxide 729, such as silicon oxide, on the P-type well 732 and over the P-type silicon substrate 2, wherein the field oxide 729 may have a thickness $tox_1$ between 20 and 500 nanometers, wherein the field oxide 729 may be used for shallow trench isolation;

(3) a gate 737 transversely extending in a second direction substantially vertical to the first direction, from a sidewall of the P-type fin 733 to the other sidewall of the P-type fin 733 and over the field oxide 729, wherein the gate 737 may have a gate length $Lg_{N1}$ over the P-type fin 733 and the gate length $Lg_{N1}$ may be smaller than or equal to 10 nanometers, wherein the gate 737 may include a working function metal layer 738 over a top of the P-type fin 733, at opposite sidewalls of the P-type fin 733 and over the field oxide 729, wherein the working function metal layer 738 may be a layer of titanium, tantalum, titanium nitride or tantalum nitride having a thickness between 2 and 20 nanometers, and a conductive metal layer 739 on the working function metal layer 738, over the top of the P-type fin 733, at the opposite sidewalls of the P-type fin 733 and over the field oxide 729, wherein the conductive metal layer 739 may be an aluminum-containing layer having a thickness between 10 and 100 nanometers; and (4) a gate oxide 740 transversely extending in the second direction, from a sidewall of the P-type fin 733 to the other sidewall of the P-type fin 733 and on the field oxide 729 to be provided on each of a top and opposite sidewalls of the P-type fin 733, between the gate 737 and each of the top and opposite sidewalls of the P-type fin 733, and between the gate 737 and the field oxide 729, wherein the gate oxide 740 may be a layer of hafnium oxide (HfO) of tantalum oxide (TaO) having a physical thickness smaller than 4.5 nanometers, 4 nanometers, 3 nanometers or 2 nanometers or between 1 and 3.5 nanometers.

Gate-All-Around Field-Effect-Transistor (GAAFET)

FIG. 32A is a schematically perspective view showing a structure of a gate-all-around field effect transistor in accordance with an embodiment of the present application. FIG. 32B is a cross-sectional view showing a structure of a gate-all-around field effect transistor along a cross-sectional line C-C of FIG. 32A in accordance with an embodiment of the present application. Referring to FIGS. 32A and 32B, a gate-all-around field effect transistor 4 may be formed on a P-type or N-type semiconductor substrate 2, e.g., silicon substrate. In this case, a P-type silicon substrate 2 coupling to the voltage Vss of ground reference is provided for the gate-all-around field effect transistor 4. The gate-all-around field effect transistor 4 may include:

(1) a P-type stripe 831 formed with a P-type well 832 in the P-type silicon substrate 2 and a P-type fin 833 vertically protruding from a top surface of the P-type well 832 and extending in a first direction, wherein the P-type well 832 may have a depth $d2_{wP}$ between 0.3 and 5 micrometers and a width $w2_{wP}$ between 50 nanometers and 1 micrometer, wherein the P-type fin 833 may have a height $h2_{fP}$ between 10 and 200 nanometers and a width $w2_{fP}$ between 1 and 100 nanometers, wherein multiple longitudinal openings 833*a* may be formed in the P-type fin 833, each extending in the first direction and in parallel with each other or one another to form multiple longitudinal portions 833*b* of the P-type fin 833 extending in parallel with each other or one another, wherein each of the longitudinal openings 833*a* may be between neighboring two of the longitudinal portions 833*b* of the P-type fin 833, wherein each of the longitudinal openings 833*a* may have a width $sg_1$, i.e., space between neighboring two of the longitudinal portions 833*b* of the P-type fin 833, between 5 and 20 nanometers, wherein each of the longitudinal portions 833*b* may have a height $hg_1$ between 5 and 100 nanometers and a width $wg_1$ between 10 and 200 nanometers or between 1 and 100 nanometers;

(2) a field oxide 829, such as silicon oxide, on the P-type well 832 and over the P-type silicon substrate 2, wherein the field oxide 829 may have a thickness $tox_2$ between 20 and 500 nanometers, wherein the field oxide 829 may be used for shallow trench isolation;

(3) a gate 837 including a working function metal layer 838 over a top of the P-type fin 833, at opposite sidewalls of the P-type fin 833, in each of the longitudinal openings 833*a* in the P-type fin 833 and over the field oxide 829, wherein the working function metal layer 838 may be a layer of titanium, tantalum, titanium nitride or tantalum nitride having a thickness between 2 and 20 nanometers, and a conductive metal layer 839 on the working function metal layer 838, over the top of the P-type fin 833, at the opposite sidewalls of the P-type fin 833, in said each of the longitudinal openings 833*a* in the P-type fin 833 and over the field oxide 829, wherein the conductive metal layer 839 may be an aluminum-containing layer having a thickness between 10 and 100 nanometers, wherein the gate 837 may have a gate length $Lg_{N2}$ over the P-type fin 833 and the gate length $Lg_{N2}$ may be smaller than or equal to 10 nanometers, wherein the gate 837 may; and (4) a gate oxide 840 on the top of the P-type fin 833, at the opposite sidewalls of the P-type fin 833, in each of the longitudinal openings 833*a* in the P-type fin 833 and on the field oxide 829 to be provided between the gate 837 and the P-type fin 833, and between the gate 837 and the field oxide 829, wherein the gate oxide 840 may be a layer of hafnium oxide (HfO) of tantalum oxide (TaO) having a physical thickness smaller than 4.5 nanometers, 4 nanometers, 3 nanometers or 2 nanometers or between 1 and 3.5 nanometers.

Accordingly, referring to FIGS. 32A and 32B, each of the longitudinal portions 833*b* of the P-type fin 833 may be all surrounded by the gate oxide 840, the working function metal layer 838 of the gate 837 and the conductive metal layer 839 of the gate 837.

Programmable Logic Block

Figure 33:
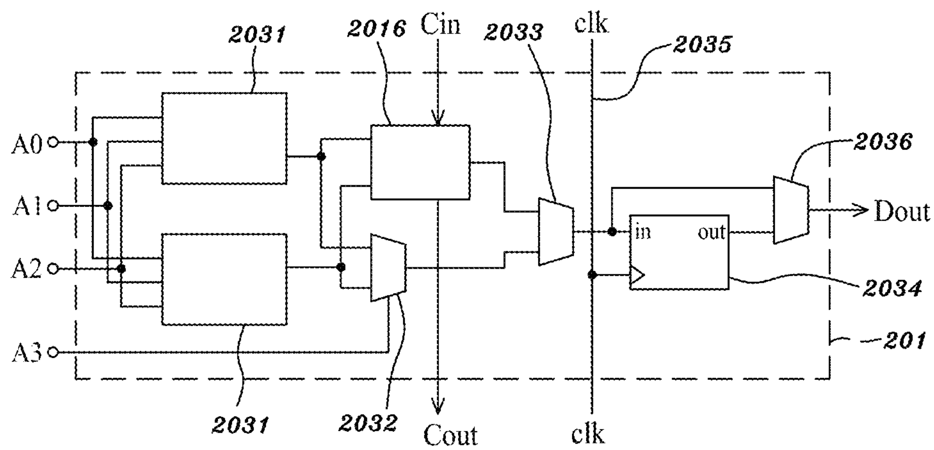
FIG. 33 is a schematic view showing a block diagram of a programmable logic block (LB) in accordance with another embodiment of the present application.

FIG. 33 is a schematic view showing a block diagram of a programmable logic block (LB) in accordance with another embodiment of the present application. For a first type, the programmable logic block (LB) 201 may have the structure as illustrated in FIG. 6A. Alternatively, for each embodiment in this paper, the first type of programmable logic block (LB) 201 may be replaced with a second type of programmable logic block (LB) 201 as illustrated in FIG. 33. Referring to FIG. 33, the second type of programmable block (LB) 201 may include (1) two logic gate or circuits 2031, each of which may be referred to one as illustrated in FIG. 6A and have three data inputs in a first data set thereof coupling respectively to three data inputs A0-A2 of the second type of programmable logic block (LB) 201, wherein each of its two logic gate or circuits 2031 may select, in accordance with the first data set thereof, input data from multiple resulting values in a second data set thereof, which are stored in the memory cells 490 thereof, as a data output, (2) a fixed-wired adding unit 2016, i.e., full adder, having two-bit data inputs each coupling to a data output of one of its logic gate or circuits 2031, wherein the adding unit 2016 may be configured to take a carry-in data input thereof coupling to a data input Cin of the second type of programmable logic block (LB) 201 and passing from a carry-out data output of another adding unit 2016 of the previous stage into account to add the two-bit data inputs thereof as two data outputs thereof, one of which may be configured to be a first data output for a sum of addition and the other of which may be configured to be a second data output for a carry of addition coupling to a data output Cout of the second type of programmable logic block (LB) 201 and passing to a carry-in data input of another adding unit 2016 of the next stage, (3) a multiplexer 2032, i.e., LUT selection multiplexer, having a data input in a first input data set thereof coupling to a data input A3 of the second type of programmable logic block (LB) 201 and two data inputs in a second input data set thereof each coupling to the data output of one of its logic gate or circuits 2031, wherein its multiplexer 2032 may select, in accordance with the first input data set thereof, an input data from the second input data set thereof as a data output thereof, (4) a multiplexer 2033, i.e., addition-selection multiplexer, having a data input in a first input data set thereof coupling to a programming code stored in a memory cell (not shown) of the second type of programmable logic block (LB) 201 and two data inputs in a second input data set thereof, one of which may couple to the first data output of its fixed-wired adding unit 2016 and the other of which may couple to the data output of its multiplexer 2032, wherein its multiplexer 2033 may select, in accordance with the first input data set thereof, an input data from the second input data set thereof as a data output thereof that may be asynchronous, (5) a D-type flip-flop circuit 2034 having a first data input coupling to the data output of its multiplexer 2033 to be registered or stored therein and a second data input coupling to a clock signal clk on a clock bus 2035, wherein its D-type flip-flop circuit 2034 may synchronously generate, in accordance with the second data input thereof, a data output associated with the first data input thereof and the data output of its D-type flip-flop circuit 2034 may be synchronous with the clock signal clk, and (6) a multiplexer 2036, i.e., synchronization-selection multiplexer, having a data input in a first input data set thereof coupling to a memory cell (not shown) of the second type of programmable logic block (LB) 201 and two data inputs in a second input data set thereof, one of which may couple to the data output of its multiplexer 2033 and the other of which may couple to the data output of its D-type flip-flop circuit 2034, wherein its multiplexer 2036 may select, in accordance with the first input data set thereof, an input data from the second input data set thereof as a data output thereof, which may act as a data output Dout of the second type of programmable logic block (LB) 201. The memory cell for each of the multiplexers 2033 and 2036 may be an on-chip volatile memory cell referred to the memory cell 398 as illustrated in FIG. 1A or 1B or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell, configured to save or store the programming code for said each of the multiplexers 2033 and 2036. Each of the multiplexers 2033 and 2036 may have the data input in the first input data set thereof, which is associated with a data output, i.e., configuration-programming-memory (CPM) data, of the memory cell for said each of the multiplexers 2033 and 2036, e.g., one of the first and second data outputs Out1 and Out2 of the memory cell 398 as illustrated in FIG. 1A or 1B. When each of the FPGA IC chips 200 in each of the chip packages 550 and logic drives 300 and 610 in this paper may be provided with the second type of programmable logic block (LB) 201, the data stored in the memory cell for said each of the multiplexers 2033 and 2036 may be passed from data stored in multiple non-volatile memory cells of the non-volatile memory chip(s) 250 in said each of the chip packages 550 and logic drives 300 and 610.

Figure 34:
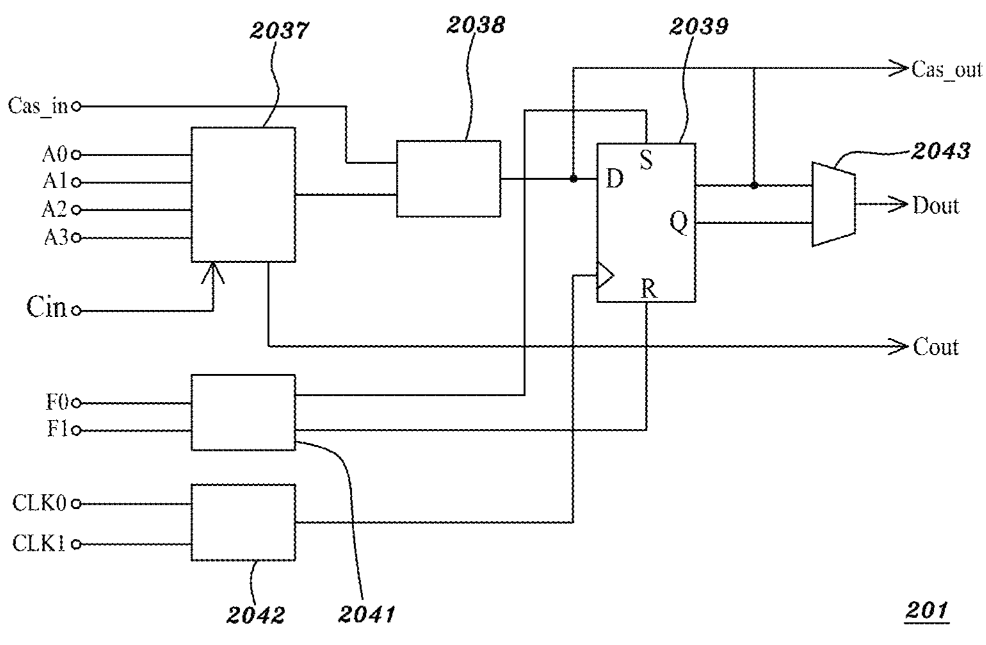
FIG. 34 is a schematic view showing a block diagram of a programmable logic cell or element in accordance with another embodiment of the present application.

FIG. 34 is a schematic view showing a block diagram of a programmable logic cell or element in accordance with another embodiment of the present application. Alternatively, for each embodiment in this paper, the first type of programmable logic block (LB) 201 may be replaced with a third type of programmable logic block (LB) 201 as illustrated in FIG. 34. Referring to FIG. 34, the third type of programmable logic block (LB) 201 may include a logic operator or circuit 2037 having four-bit data inputs in a first input data set thereof coupling respectively to four data inputs A0-A3 of the third type of programmable logic block (LB) 201 and a carry-in data input in the first input data set thereof coupling to a data input Cin of the third type of programmable logic block (LB) 201, wherein the logic operator or circuit 2037 is configured to select, in accordance with the first input data set thereof, a first data input from multiple resulting values in a second input data set thereof, which are stored in multiple first memory cells (not shown) thereof, as a first data output thereof and select, in accordance with the first input data set thereof, a second data input from multiple resulting values in a third input data set thereof, which are stored in multiple second memory cells (not shown) thereof, as a second data output thereof. In an example, when the logic operator or circuit 2037 performs an addition operation, the logic operator or circuit 2037 may be configured to take the carry-in data input thereof from a carry-out data output of another logic operator or circuit 2037 of the previous stage into account to add two of the four-bit data inputs thereof as the first data output thereof for a sum of addition and the second data output thereof for a carry of addition at a data output Cout of the third type of programmable logic block (LB) 201, which may be associated with a carry-in data input of another logic operator or circuit 2037 of the next stage. In another example, when the logic operator or circuit 2037 performs a logic operation, the logic operator or circuit 2037 may be configured to select, in accordance with the first input data set thereof, a data input from multiple resulting values in the second input data set thereof as the first data output thereof for the logic operation. Each of the first and second memory cells for the logic operator or circuit 2037 may be an on-chip volatile memory cell referred to one 398 as illustrated in FIG. 1A or 1B or an on-chip non-volatile memory cell such as floating-gate non-volatile memory cell, resistive random-access-memory (RRAM) cell, magnetoresistive random-access-memory (MRAM) cell or ferroelectric random-access-memory (FRAM) cell, configured to save or store the resulting values for the logic operator or circuit 2037. When each of the FPGA IC chips 200 in each of the chip packages 550 and logic drives 300 and 610 in this paper is provided with the third type of programmable logic block (LB) 201, the resulting values stored in the first and second memory cells for the logic operator or circuit 2037 may be passed from data stored in multiple non-volatile memory cells of the non-volatile memory chip(s) 250 in said each of the chip packages 550 and logic drives. 300 and 610.

Referring to FIG. 34, the third type of programmable logic block (LB) 201 may further include (1) a cascade circuit 2038 provided with a logic gate having a first data input associated with a data input Cas_in of the third type of programmable logic block (LB) 201 for cascade data passed through one or more hard wires from a data output Cas_out of another third type of programmable logic block (LB) 201 in a previous stage, which may have the same structure as illustrated in FIG. 34, and a second data input associated with the first data output of its logic operator or circuit 2037, wherein the logic gate of its cascade circuit 2033 may perform AND or OR logic operation on the first and second data inputs thereof as a data output of its cascade circuit 2033, wherein the data output of its cascade circuit 2033 may be asynchronous, (2) a D-type flip-flop circuit 2039 having a first data input coupling to the data output of its cascade circuit 2038 to be registered or stored therein and a second data input coupling to a clock signal on a clock bus 2040 of the third type of programmable logic block (LB) 201, wherein its D-type flip-flop circuit 2039 may synchronously generate, in accordance with the second data input thereof, a data output associated with the first data input thereof and the data output of its D-type flip-flop circuit 2039 may be synchronous with the clock signal, (3) a set-reset control circuit 2041 coupling to its D-type flip-flop circuit 2039 to set, reset or unchange its D-type flip-flop circuit 2039 in accordance with two data inputs thereof coupling respectively to two data inputs F0 and F1 of the third type of programmable logic block (LB) 201, and (4) a clock control circuit 2042 coupling to its D-type flip-flop circuit 2039 through its clock bus 2040, wherein its clock control circuit 2042 is configured to generate, in accordance with two data inputs thereof coupling respectively to two data inputs CLK0 and CLK1 of the third type of programmable logic block (LB) 201, the clock signal in one of various modes. For example, its clock control circuit 2042 may be controlled to be enabled or disabled in accordance with the data input CLK0 thereof, and in a mode the clock signal may be controlled to be the same as a reference clock in accordance with the data input CLK1 of the third type of programmable logic block (LB) 201; in another mode the clock signal may be controlled to be inverted to the reference clock in accordance with the data input CLK1 of the third type of programmable logic block (LB) 201.

Referring to FIG. 34, the third type of programmable logic block (LB) 201 may further include a multiplexer 2043, i.e., synchronization-selection multiplexer, having a data input in a first input data set thereof coupling to a memory cell (not shown) of the third type of programmable logic block (LB) 201 and two data inputs in a second input data set thereof, one of which may couple to the data output of its cascade circuit 2038 and the other of which may couple to the data output of its D-type flip-flop circuit 2039, wherein its multiplexer 2043 may select, in accordance with the first input data set thereof, an input data from the second input data set thereof as a data output thereof, which may act as a data output Dout of the third type of programmable logic block (LB) 201. The third type of programmable logic block (LB) 201 may further include a data output Cas_out for cascade data coupling to the data output of its cascade circuit 2038 and the data output Cas_out of the third type of programmable logic block (LB) 201 may further include a data output Cas_out may be passed through one or more hard wires to the data input Cas_in of another third type of programmable logic block (LB) 201 in a next stage, which may have the same structure as illustrated in FIG. 34.

Coarse-Grained Reconfigurable Architecture (CGRA)

Figure 35:
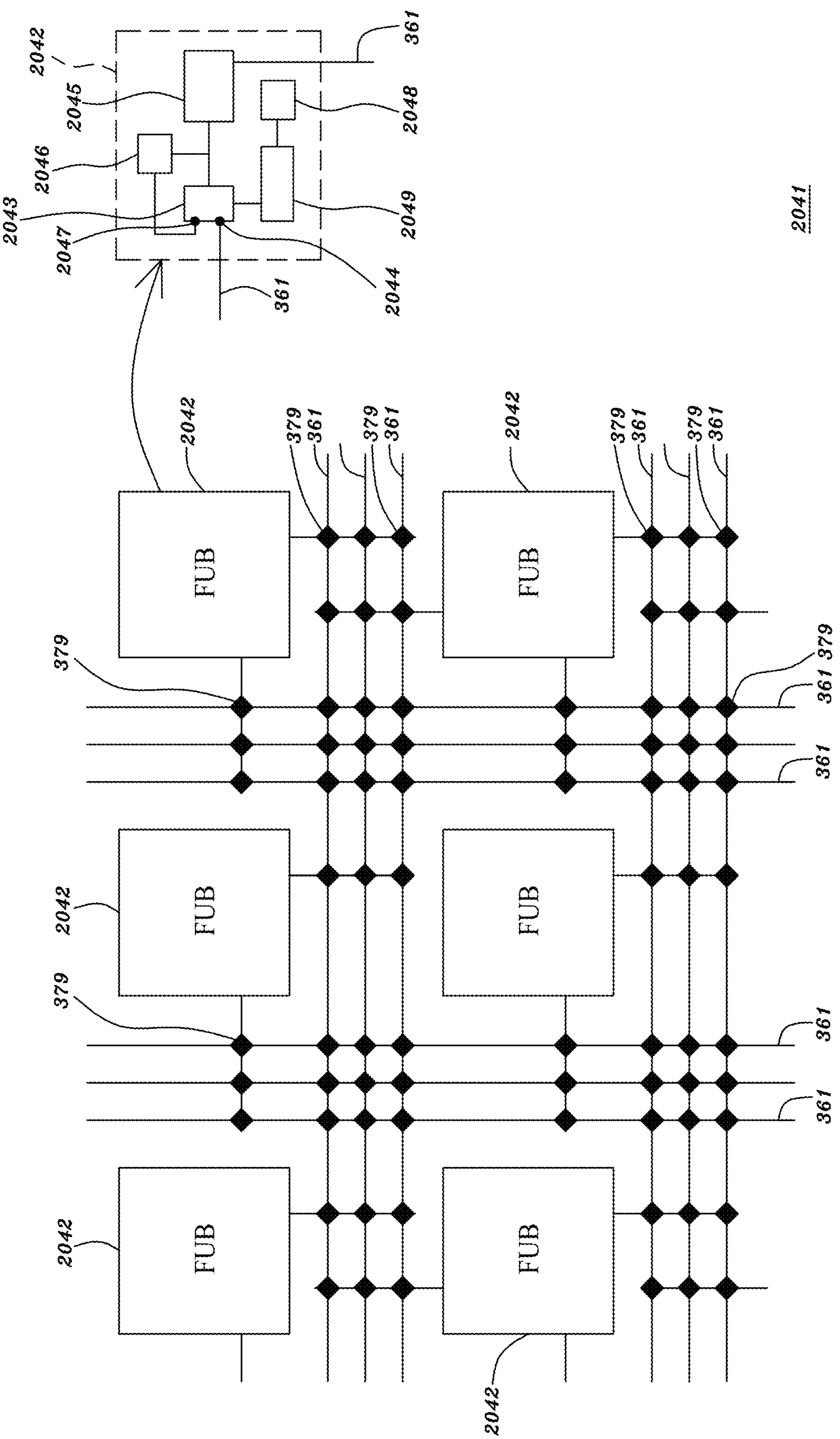
FIG. 35 is a schematic view showing a plurality of coarse-grained reconfigurable architecture (CGRA) in an array in accordance with another embodiment of the present application.
Figure 36:
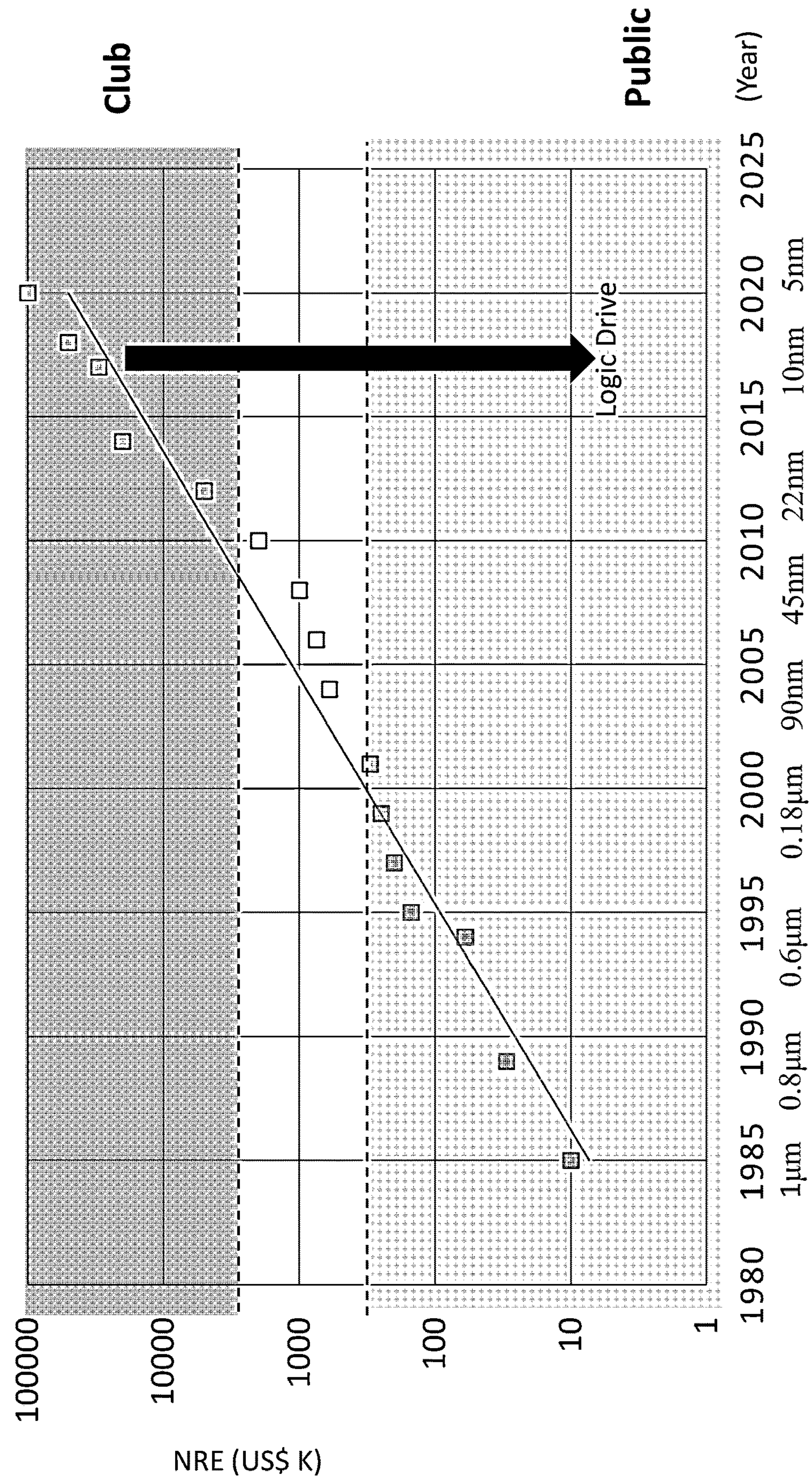
FIG. 36 is a chart showing a trend of relationship between non-recurring engineering (NRE) costs and technology nodes.

FIG. 35 is a schematic view showing a plurality of coarse-grained reconfigurable architecture (CGRA) in an array in accordance with another embodiment of the present application. For each embodiment in this paper, the first type of programmable logic blocks (LB) 201 may be replaced with a coarse-grained reconfigurable architecture (CGRA) 2041 as seen in FIG. 35 provided with a plurality of coarse-grained reconfigurable (CGR) units 2042, i.e., functional unit blocks (FUBs), cell or element, arranged in an array, a plurality of programmable interconnect 361 each between neighboring two of the coarse-grained reconfigurable (CGR) units 2042 and a plurality of cross-point switches 379 each having the same specification as illustrated in FIG. 7B and having top, left, bottom and right terminals coupling to four of the programmable interconnects 361 at top, left, bottom and right sides thereof. Referring to FIG. 35, each of the coarse-grained reconfigurable (CGR) units 2042 may include (1) a functional unit (FU) 2043 including a plurality of hard macros such as digital signal process DSP slices, graphic process GPU macros, microcontroller (MCU) macros, multiplexer macros, adder macros, multiplier macros, arithmetic logic unit (ALU) macros, shift circuit macros, comparison circuit macros, floating-point computing macros, register or flip-flops macros, and/or I/O interfacing macros, wherein each of the hard macros is designed, compiled and implemented with fixed hard wires (metal lines or traces) for circuits, wherein its functional unit 2043 may have a first set of input points 2044 each coupling to one of its cross-point switches 379 through one of its programmable interconnects 361, (2) a registering block 2045 having multiple registers or D-type flip-flop circuits each for registering or temporally storing data therein associated with a data output of the functional unit 2043 and passing, in accordance with a clock signal, the data stored in said each of the registers or D-type flip-flop circuits to one or more of the cross-point switches 379 through one or more of the programmable interconnects 361 to be distributed to or accessed by another one or more of the coarse-grained reconfigurable (CGR) units 2042 in the next stage, wherein the first set of input points 2044 of its functional unit 2043 may receive data from the registering block(s) 2045 of another one of more of the coarse-grained reconfigurable (CGR) units 2042 in the previous stage through one or more of the cross-point switches 379 coupled by one or more of the programmable interconnects 361, (3) a register-file memory block 2046 having multiple memory cells, each of which may be a static random-access memory (SRAM) cell having the same specification as illustrated in FIG. 1A or 1B for temporally storing register files therein associated with a data output of the functional unit 2043 within one of time periods and passing, in accordance with the clock signal, the data stored in the static random-access memory (SRAM) cell to one of a second set of input points 2047 of its functional unit 2043, (4) a program counter (PC) 2048, i.e., instruction pointer, having multiple first memory cells such as instruction address registers for temporally storing multiple instruction addresses therein to point one or more of the arithmetic logic cells of its functional unit 2043 in a program sequence, and (5) an instruction memory block or section 2049 having multiple second memory cells, each of which may be a static random-access memory (SRAM) cell having the same specification as illustrated in FIG. 1A or 1B, for temporally storing multiple instruction sets, which is a kind of machine language or code in binary digits which may be translated from an assembly language such as MOV, ADD or SUB, therein each to be fetched by its functional unit 2043 to instruct, in accordance with data associated with the instruction addresses stored in the program counter (PC) 2048, one or more of the arithmetic logic cells in its functional unit 2043 to perform specific one or more of the operation or logic functions on the data at the first and second sets of input points 2044 and 2047. When each of the FPGA IC chips 200 in each of the chip packages 550 and logic drives 300 and 610 in this paper is provided with the coarse-grained reconfigurable architecture (CGRA) 2041, the instruction addresses stored in the first memory cells of the program counter (PC) 2048 and the instruction set stored in the second memory cells of the instruction memory block or section 2049 may be passed from data stored in multiple non-volatile memory cells of the non-volatile memory chip(s) 250 in said each of the chip packages 550 and logic drives. 300 and 610.

Miscellaneous

Accordingly, each of the FPGA IC chips 200 in this paper may be regarded as a configurable, reconfigurable and programmable IC chip. Each of the standard commodity logic drives 300 and chip packages 550 in this paper may be regarded as a non-volatile configurable, reconfigurable and programmable device. Each of the standard commodity FPGA IC chips 200 in this paper may have standard common features, counts or specifications: (1) its programmable logic blocks, cells or elements 201 including (i) multiple system gates with the count greater than or equal to 2 M, 10 M, 20 M, 50 M or 100 M, (ii) multiple programmable logic cells or elements with the count greater than or equal to 64 K, 128 K, 512 K, 1 M, 4 M or 8 M, (iii) multiple hard macros including, for example, digital signal process (DSP) slices, graphic process unit (GPU) macros, microcontroller unit (MCU) macros, multiplexer macros, adder macros, multiplier macros, arithmetic logic unit (ALU) macros, shift circuit macros, comparison circuit macros, floating-point computing macros, register or flip-flop macros, and/or I/O interfacing macros, wherein each of the hard macros is designed, compiled and implemented with fixed hard wires for circuit, and/or (iv) multiple blocks of memory with the bit count equal to or greater than 1 M, 10 M, 50 M, 100 M, 200 M or 500 M bits; (2) the number of inputs to each of its programmable logic blocks 201 or operators: greater or equal to 4, 8, 16, 32, 64, 128, or 256; (3) its power supply voltage: between 0.1V and 8V, 0.1V and 6V, 0.1V and 2.5V, 0.1V and 2V, 0.1V and 1.5V, or 0.1V and 1V; (4) its I/O pads, in terms of layout, location, number and function.

CONCLUSION AND ADVANTAGES

Accordingly, the current logic ASIC or COT IC chip business may be changed into a commodity logic IC chip business, like the current commodity DRAM, or commodity flash memory IC chip business, by using the standardized commodity logic drive 300. Since the performance, power consumption, and engineering and manufacturing costs of the standardized commodity logic drive 300 may be better or equal to that of the ASIC or COT IC chip for a same innovation or application, the standardized commodity logic drive 300 may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies. The current logic ASIC or COT IC chip design and/or manufacturing companies (including fabless IC design and product companies, IC foundry or contracted manufactures (may be product-less), vertically-integrated IC design, manufacturing and product companies) may become companies in the following business models: (1) designing, manufacturing, and/or selling the standard commodity FPGA IC chips 200; and/or (2) designing, manufacture, and/or selling the standard commodity logic drives 300. A person, user, customer, or software developer, or application developer may purchase the standardized commodity logic drive 300 and write software codes to program it for his/her desired applications, for example, in applications of Artificial Intelligence (AI), machine learning, deep learning, big data, Internet Of Things (JOT), Virtual Reality (VR), Augmented Reality (AR), car electronics, Graphic Processing (GP), Digital Signal Processing (DSP), Micro Controlling (MC), and/or Central Processing (CP). The logic drive 300 may be programed to perform functions like a graphic chip, or a baseband chip, or an Ethernet chip, or a wireless (for example, 802.11ac) chip, or an A1 chip. The logic drive 300 may be alternatively programmed to perform functions of all or any combinations of functions of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

The disclosure provides the standardized commodity logic drive in a multi-chip package comprising plural FPGA IC chips and one or more non-volatile memory IC chips for use in different applications requiring logic, computing and/or processing functions by field programming. Uses of the standardized commodity logic drive is analogues to uses of a standardized commodity data storage solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

For another aspect, in accordance with the disclosure, the standard commodity logic drive may be arranged in a hot-pluggable device to be inserted into and couple to a host device in a power-on mode such that the logic drive in the hot-pluggable device may operate with the host device.

For another aspect, the disclosure provides the method to reduce Non-Recurring Engineering (NRE) expenses for implementing an innovation or an application in semiconductor IC chips by using the standardized commodity logic drive. A person, user, or developer with an innovation or an application concept or idea needs to purchase the standardized commodity logic drive and develops or writes software codes or programs to load into the standardized commodity logic drive to implement his/her innovation or application concept or idea. Compared to the implementation by developing a logic ASIC or COT IC chip, the NRE cost may be reduced by a factor of larger than 2, 5, or 10. For advanced semiconductor technology nodes or generations (for example more advanced than or below 30 nm or 20 nm), the NRE cost for designing an ASIC or COT chip increases greatly, more than US $5 M, US $10 M or even exceeding US $20 M, US $50 M, or US $100 M. The cost of a photo mask set for an ASIC or COT chip at the 16 nm technology node or generation may be over US $2 M, US$5 M, or US $10 M. Implementing the same or similar innovation or application using the logic drive may reduce the NRE cost down to smaller than US $10 M or even less than US $7 M, US $5 M, US $3 M or US $1 M. The aspect of the disclosure inspires the innovation and lowers the barrier for implementing the innovation in IC chips designed and fabricated using an advanced IC technology node or generation, for example, a technology node or generation more advanced than or below 30 nm, 20 nm or 10 nm.

For another aspect, the disclosure provides the method to change the logic ASIC or COT IC chip hardware business into a software business by using the standardized commodity logic drive. Since the performance, power consumption, and engineering and manufacturing costs of the standardized commodity logic drive may be better or equal to that of the ASIC or COT IC chip for a same innovation or application, the current ASIC or COT IC chip design companies or suppliers may become software developers or suppliers; they may adapt the following business models: (1) become software companies to develop and sell software for their innovation or application, and let their customers to install software in the customers' own standard commodity logic drive; and/or (2) still hardware companies by selling hardware without performing ASIC or COT IC chip design and production. They may install their in-house developed software for the innovation or application in the non-volatile memory chips in the purchased standard commodity logic drive; and sell the program-installed logic drive to their customers. They may write software codes into the standard commodity logic drive (that is, loading the software codes in the non-volatile memory IC chip or chips in or of the standardized commodity logic drive) for their desired applications, for example, in applications of Artificial Intelligence (AI), machine learning, Internet Of Things (IOT), Virtual Reality (VR), Augmented Reality (AR), Graphic Processing, Digital Signal Processing, micro controlling, and/or Central Processing. A design, manufacturing, and/or product companies for a system, computer, processor, smart-phone, or electronic equipment or device may become companies to (1) design, manufacture and/or sell the standard commodity hardware comprising the memory drive and the logic drive; in this case, the companies are still hardware companies; (2) develop system and application software for users to install in the users' own standard commodity hardware; in this case, the companies become software companies; (3) install the third party's developed system and application software or programs in the standard commodity hardware and sell the software-loaded hardware; and in this case, the companies are still hardware companies.

For another aspect, the disclosure provides a development kit or tool for a user or developer to implement an innovation or an application using the standard commodity logic drive. The user or developer with innovation or application concept or idea may purchase the standard commodity logic drive and use the corresponding development kit or tool to develop or to write software codes or programs to load into the non-volatile memory of the standard commodity logic drive for implementing his/her innovation or application concept or idea.

For a first scenario, a multi-chip package comprises: a first chip package comprising a first semiconductor integrated-circuit (IC) chip, a first polymer layer in a space beyond and extending from a sidewall of the first semiconductor integrated-circuit (IC) chip, a first metal post in the first polymer layer, and a first interconnection scheme under the first semiconductor integrated-circuit (IC) chip, first polymer layer and first metal post, wherein a top surface of the first polymer layer, a top surface of the first semiconductor integrated-circuit (IC) chip and a top surface of the first metal post are coplanar, wherein the first interconnection scheme comprises a first interconnection metal layer under the first semiconductor integrated-circuit (IC) chip, first polymer layer and first metal post, wherein the first interconnection metal layer comprises a metal interconnect across under an edge of the first semiconductor integrated-circuit (IC) chip, a second interconnection metal layer under the first interconnection metal layer and a first insulating dielectric layer between the first and second interconnection metal layers, wherein the first semiconductor integrated-circuit (IC) chip couples to the first metal post through the first interconnection metal layer, wherein the first semiconductor integrated-circuit (IC) chip comprises a plurality of volatile memory cells configured to store first data associated with a plurality of resulting values for a look-up table (LUT) and a multiplexer comprising a first set of input points for a first input data set for a logic operation and a second set of input points for a second input data set associated with the first data stored in the plurality of volatile memory cells, wherein the multiplexer is configured to select, in accordance with the first input data set, a data from the second input data set as an output data for the logic operation; a first metal bump under the first chip package, wherein the first metal bump couples to the second interconnection metal layer; and a non-volatile memory integrated-circuit (IC) chip over the first chip package, wherein the non-volatile memory integrated-circuit (IC) chip couples to the first semiconductor integrated-circuit (IC) chip through, in sequence, the first metal post and the first interconnection metal layer, wherein the non-volatile memory integrated-circuit (IC) chip comprises a plurality of first non-volatile memory cells configured to store second data associated with the plurality of resulting values for the look-up table (LUT), wherein the first data are associated with the second data.

For the first scenario: in a first aspect, the multi-chip package is configured for a non-volatile programmable logic device for use as an application specific integrated circuit (ASIC).

For the first scenario: in a second aspect, the first semiconductor integrated-circuit (IC) chip comprises a plurality of on-chip dedicated non-volatile memory elements configured to store third data and an on-chip security circuit configured, in accordance with the third data, to decrypt encrypted data associated with the second data from the non-volatile memory IC chip. The first semiconductor integrated-circuit (IC) chip comprises a metal trace having a narrow neck configured as a fuse for one of the plurality of on-chip dedicated non-volatile memory elements. The first semiconductor integrated-circuit (IC) chip comprises two electrodes and an oxide window between the two electrodes, wherein the oxide window and two electrodes are configured as an anti-fuse for one of the plurality of on-chip dedicated non-volatile memory elements. The first semiconductor integrated-circuit (IC) chip comprises a plurality of second non-volatile memory cells configured as the on-chip dedicated non-volatile memory elements.

For the first scenario: in a third aspect, the first metal bump comprises a solder having a thickness between 20 and 100 micrometers. The first metal post comprises a copper layer having a thickness between 10 and 100 micrometers. The first chip package further comprises a metal pad on the top surface of the first metal post, wherein the metal pad couples to the non-volatile memory integrated-circuit (IC) chip and has a thickness between 1 and 10 micrometers. The metal pad comprises a copper layer having a thickness between 1 and 10 micrometers.

For the first scenario: in a fourth aspect, the first chip package further comprises a metal pad vertically over the first semiconductor integrated-circuit (IC) chip, wherein the metal pad comprises a copper layer having a thickness between 1 and 10 micrometers.

For the first scenario: in a fifth aspect, the non-volatile memory integrated-circuit (IC) chip is provided by a second chip package of the multi-chip package, wherein the second chip package is over the first chip package, wherein the multi-chip package further comprises a second metal bump under the second chip package, wherein the second chip package couples to the first chip package through the second metal bump. The multi-chip package of claim 12, wherein the second chip package comprises a second polymer layer in a space beyond and extending from a sidewall of the non-volatile memory integrated-circuit (IC) chip, wherein a top surface of the second polymer layer and a top surface of the non-volatile memory integrated-circuit (IC) chip are coplanar, and a second interconnection scheme under the non-volatile memory integrated-circuit (IC) chip and second polymer layer, wherein the second interconnection scheme comprises a third interconnection metal layer under the non-volatile memory integrated-circuit (IC) chip and second polymer layer, wherein the third interconnection metal layer comprises a metal interconnect across under an edge of the non-volatile memory integrated-circuit (IC) chip, a fourth interconnection metal layer under the third interconnection metal layer and a second insulating dielectric layer between the third and fourth interconnection metal layers, wherein the non-volatile memory integrated-circuit (IC) chip couples to the first semiconductor integrated-circuit (IC) chip through, in sequence, the third interconnection metal layer, fourth interconnection metal layer, second metal bump, first metal post and first interconnection metal layer.

For the first scenario: in a sixth aspect, the non-volatile memory integrated-circuit (IC) chip is provided by a second chip package of the multi-chip package, wherein the second chip package is over the first chip package, wherein the multi-chip package further comprises a second metal bump under the second chip package, wherein the second chip package couples to the first chip package through the second metal bump. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein the second metal bump couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The second metal post comprises a copper layer having a thickness between 10 and 100 micrometers. The non-volatile memory integrated-circuit (IC) chip couples to the first semiconductor integrated-circuit (IC) chip through, in sequence, the second metal bump, second metal post, third metal bump, first metal post and first interconnection metal layer. The third metal bump comprises a solder having a thickness between 20 and 100 micrometers. The second metal post comprises a copper layer having a thickness between 10 and 100 micrometers. The third chip package further comprises a metal pad on the top surface of the second metal post, wherein the metal pad joins the second metal bump and has a thickness between 1 and 10 micrometers. The metal pad on the top surface of the second metal post comprises a copper layer having a thickness between 1 and 10 micrometers.

For the first scenario: in a seventh aspect, the non-volatile memory integrated-circuit (IC) chip is provided by a second chip package of the multi-chip package, wherein the second chip package is over the first chip package, wherein the multi-chip package further comprises a second metal bump under the second chip package, wherein the second chip package couples to the first chip package through the second metal bump. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein the second metal bump couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The multi-chip package further comprising a fourth metal bump between the first and third chip packages and vertically over the second semiconductor integrated-circuit (IC) chip, and the third chip package further comprises a metal pad vertically over the second semiconductor integrated-circuit (IC) chip, wherein the metal pad vertically over the second semiconductor integrated-circuit (IC) chip joins one of the fourth metal bumps and has a thickness between 1 and 10 micrometers. The metal pad vertically over the second semiconductor integrated-circuit (IC) chip comprises a copper layer having a thickness between 1 and 10 micrometers.

For the first scenario: in an eighth aspect, the non-volatile memory integrated-circuit (IC) chip is provided by a second chip package of the multi-chip package, wherein the second chip package is over the first chip package, wherein the multi-chip package further comprises a second metal bump under the second chip package, wherein the second chip package couples to the first chip package through the second metal bump. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein the second metal bump couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The multi-chip package further comprises a fourth metal bump between the first and third chip packages, wherein the first chip package further comprises a third metal post in the first polymer layer, wherein the top surface of the first polymer layer, the top surface of the first semiconductor integrated-circuit (IC) chip, the top surface of the first metal post and a top surface of the third metal post are coplanar, wherein the second semiconductor integrated-circuit (IC) chip couples to the first semiconductor integrated-circuit (IC) chip through, in sequence, the third interconnection metal layer, fourth interconnection metal layer, fourth metal bump, third metal post and first interconnection metal layer.

For the first scenario: in a ninth aspect, the non-volatile memory integrated-circuit (IC) chip is provided by a second chip package of the multi-chip package, wherein the second chip package is over the first chip package, wherein the multi-chip package further comprises a second metal bump under the second chip package, wherein the second chip package couples to the first chip package through the second metal bump. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein the second metal bump couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The second semiconductor integrated-circuit (IC) chip is a dedicated I/O chip. The multi-chip package further comprises a fourth metal bump between the first and third chip packages, wherein the first chip package further comprises a third metal post in the first polymer layer, wherein the top surface of the first polymer layer, the top surface of the first semiconductor integrated-circuit (IC) chip, the top surface of the first metal post and a top surface of the third metal post are coplanar, wherein the dedicated I/O chip comprises a driver coupling to the first semiconductor integrated-circuit (IC) chip through, in sequence, the third interconnection metal layer, fourth interconnection metal layer, fourth metal bump, third metal post and first interconnection metal layer, wherein the driver has a driving capability between 0.1 and 2 pF. The multi-chip package further comprises a fourth metal bump between the second and third chip packages, wherein the plurality of second metal bumps are between the second and third chip packages, wherein the third chip package further comprises a third metal post in the second polymer layer, wherein the top surface of the second polymer layer, the top surface of the dedicated I/O chip, the top surface of the second metal post and a top surface of the third metal post are coplanar, wherein the dedicated I/O chip comprises a driver coupling to the non-volatile memory integrated-circuit (IC) chip through, in sequence, the third interconnection metal layer, the third metal post and one of the fourth metal bumps, wherein the driver has a driving capability between 0.1 and 2 pF. The multi-chip package further comprises a fourth metal bump between the first and third chip packages, wherein the first chip package further comprises a third metal post in the first polymer layer, wherein the top surface of the first polymer layer, the top surface of the first semiconductor integrated-circuit (IC) chip, the top surface of the first metal post and a top surface of the third metal post are coplanar, wherein the dedicated I/O chip comprises a driver coupling to the first metal bump through, in sequence, the third interconnection metal layer, fourth interconnection metal layer, fourth metal bump, third metal post, first interconnection metal layer and second interconnection metal layer, wherein the driver has a driving capability greater than 2 pF.

For the first scenario: in a tenth aspect, the non-volatile memory integrated-circuit (IC) chip is provided by a second chip package of the multi-chip package, wherein the second chip package is over the first chip package, wherein the multi-chip package further comprises a second metal bump under the second chip package, wherein the second chip package couples to the first chip package through the second metal bump. The second chip package is a ball-grid array (BGA) package comprising a circuit board, wherein the non-volatile memory integrated-circuit (IC) chip couples to the second metal bump through the circuit boards, wherein the second metal bumps bump is one of a plurality of metal bumps under the second chip package, wherein the plurality of metal bumps are arranged in an area array.

For the first scenario: in an eleventh aspect, the non-volatile memory integrated-circuit (IC) chip is provided by a second chip package of the multi-chip package, wherein the second chip package is over the first chip package, wherein the second chip package is a thin-small-outline-package (TSOP) comprising a leadframe having the non-volatile memory integrated-circuit (IC) chip mounted bonded thereon thereto and a molding compound enclosing the leadframe and non-volatile memory integrated-circuit (IC) chip, wherein the non-volatile memory integrated-circuit (IC) chip couples to the first chip package through the leadframe.

For the first scenario: in a twelfth aspect, the non-volatile memory integrated-circuit (IC) chip is provided by a second chip package of the multi-chip package, wherein the second chip package is over the first chip package, wherein the second chip package is a chip scale package (CSP), wherein an area ratio between the chip scale package and the non-volatile memory integrated-circuit (IC) chip is equal to or smaller than 1.5.

For the first scenario: in a thirteenth aspect, the first chip package further comprises a second interconnection scheme over the first semiconductor integrated-circuit (IC) chip, first polymer layer and first metal post, wherein the second interconnection scheme comprises a third interconnection metal layer over the first semiconductor integrated-circuit (IC) chip, first polymer layer and first metal post, and a second insulating dielectric layer over the third interconnection metal layer, wherein the third interconnection metal layer comprises a metal interconnect across over an edge of the first semiconductor integrated-circuit (IC) chip, wherein the non-volatile memory integrated-circuit (IC) chip couples to the first semiconductor integrated-circuit (IC) chip through, in sequence, the third interconnection metal layer, first metal post and the first interconnection metal layer.

For the first scenario: in a fourteenth aspect, the first semiconductor integrated-circuit (IC) chip is a FPGA IC chip. The non-volatile memory integrated-circuit (IC) chip is a NAND flash chip or NOR flash chip.

For a second scenario, a multi-chip package comprises: a first chip package comprising a first semiconductor integrated-circuit (IC) chip, a first polymer layer in a space beyond and extending from a sidewall of the first semiconductor integrated-circuit (IC) chip, a first metal post in the first polymer layer, and a first interconnection scheme under the first semiconductor integrated-circuit (IC) chip, first polymer layer and first metal post, wherein a top surface of the first polymer layer, a top surface of the first semiconductor integrated-circuit (IC) chip and a top surface of the first metal post are coplanar, wherein the first interconnection scheme comprises a first interconnection metal layer under the first semiconductor integrated-circuit (IC) chip, first polymer layer and first metal post, wherein the first interconnection metal layer comprises a metal interconnect across under an edge of the first semiconductor integrated-circuit (IC) chip, a second interconnection metal layer under the first interconnection metal layer and a first insulating dielectric layer between the first and second interconnection metal layers, wherein the first semiconductor integrated-circuit (IC) chip couples to the first metal post through the first interconnection metal layer, wherein the first semiconductor integrated-circuit (IC) chip comprises a plurality of volatile memory cells configured to store first data associated with a plurality of programming codes, a switch, a first programmable interconnection line coupling to the switch and a second programmable interconnection line coupling to the switch, wherein the switch is configured, in accordance with the first data, to control a connection between the first and second programmable interconnection lines; a first metal bump under the first chip package, wherein the first metal bump couples to the second interconnection metal layer; and a non-volatile memory integrated-circuit (IC) chip over the first chip package, wherein the non-volatile memory integrated-circuit (IC) chip couples to the first semiconductor integrated-circuit (IC) chip through, in sequence, the first metal post and the first interconnection metal layer, wherein the non-volatile memory integrated-circuit (IC) chip comprises a plurality of first non-volatile memory cells configured to store second data associated with the plurality of programming codes, wherein the first data are associated with the second data.

For the second scenario: in a first aspect, the multi-chip package is configured for a non-volatile programmable logic device for use as an application specific integrated circuit (ASIC).

For the second scenario: in a second aspect, the first semiconductor integrated-circuit (IC) chip comprises a plurality of on-chip dedicated non-volatile memory elements configured to store third data and an on-chip security circuit configured, in accordance with the third data, to decrypt encrypted data associated with the second data from the non-volatile memory IC chip. The first semiconductor integrated-circuit (IC) chip comprises a metal trace having a narrow neck configured as a fuse for one of the plurality of on-chip dedicated non-volatile memory elements.

For the second scenario: in a third aspect, the first semiconductor integrated-circuit (IC) chip comprises a plurality of on-chip dedicated non-volatile memory elements configured to store third data and an on-chip security circuit configured, in accordance with the third data, to decrypt encrypted data associated with the second data from the non-volatile memory IC chip. The first semiconductor integrated-circuit (IC) chip comprises two electrodes and an oxide window between the two electrodes, wherein the oxide window and two electrodes are configured as an anti-fuse for one of the plurality of on-chip dedicated non-volatile memory elements.

For the second scenario: in a fourth aspect, the first semiconductor integrated-circuit (IC) chip comprises a plurality of on-chip dedicated non-volatile memory elements configured to store third data and an on-chip security circuit configured, in accordance with the third data, to decrypt encrypted data associated with the second data from the non-volatile memory IC chip. The first semiconductor integrated-circuit (IC) chip comprises a plurality of second non-volatile memory cells configured as the on-chip dedicated non-volatile memory elements.

For the second scenario: in a fifth aspect, the first metal bump comprises a solder having a thickness between 20 and 100 micrometers. The first metal post comprises a copper layer having a thickness between 10 and 100 micrometers. The first chip package comprises a metal pad on the top surface of the first metal post, wherein the metal pad couples to the non-volatile memory integrated-circuit (IC) chip and has a thickness between 1 and 10 micrometers. The metal pad comprises a copper layer having a thickness between 1 and 10 micrometers.

For the second scenario: in a sixth aspect, the first chip package further comprises a metal pad vertically over the first semiconductor integrated-circuit (IC) chip, wherein the metal pad comprises a copper layer having a thickness between 1 and 10 micrometers.

For the second scenario: in a seventh aspect, the non-volatile memory integrated-circuit (IC) chip is provided by a second chip package of the multi-chip package, wherein the second chip package is over the first chip package, wherein the multi-chip package further comprises a plurality of second metal bumps under the second chip package, wherein the second chip package couples to the first chip package through the plurality of second metal bumps. The second chip package comprises a second polymer layer in a space beyond and extending from a sidewall of the non-volatile memory integrated-circuit (IC) chip, wherein a top surface of the second polymer layer and a top surface of the non-volatile memory integrated-circuit (IC) chip are coplanar, and a second interconnection scheme under the non-volatile memory integrated-circuit (IC) chip and second polymer layer, wherein the second interconnection scheme comprises a third interconnection metal layer under the non-volatile memory integrated-circuit (IC) chip and second polymer layer, wherein the third interconnection metal layer comprises a metal interconnect across under an edge of the non-volatile memory integrated-circuit (IC) chip, a fourth interconnection metal layer under the third interconnection metal layer and a second insulating dielectric layer between the third and fourth interconnection metal layers, wherein the non-volatile memory integrated-circuit (IC) chip couples to the first semiconductor integrated-circuit (IC) chip through, in sequence, the third interconnection metal layer, fourth interconnection metal layer, first metal post and first interconnection metal layer.

For the second scenario: in an eighth aspect, the non-volatile memory integrated-circuit (IC) chip is provided by a second chip package of the multi-chip package, wherein the second chip package is over the first chip package, wherein the multi-chip package further comprises a plurality of second metal bumps under the second chip package, wherein the second chip package couples to the first chip package through the plurality of second metal bumps. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein each of the plurality of second metal bumps couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The second metal post comprises a copper layer having a thickness between 10 and 100 micrometers. The non-volatile memory integrated-circuit (IC) chip couples to the first semiconductor integrated-circuit (IC) chip through, in sequence, the second metal bump, second metal post, third metal bump, first metal post and first interconnection metal layer. The third metal bump comprises a solder having a thickness between 20 and 100 micrometers. The second metal post comprises a copper layer having a thickness between 10 and 100 micrometers. The third chip package comprises a metal pad on the top surface of the second metal post, wherein the metal pad joins one of the second metal bumps and has a thickness between 1 and 10 micrometers. The metal pad comprises a copper layer having a thickness between 1 and 10 micrometers.

For the second scenario: in a ninth aspect, the non-volatile memory integrated-circuit (IC) chip is provided by a second chip package of the multi-chip package, wherein the second chip package is over the first chip package, wherein the multi-chip package further comprises a plurality of second metal bumps under the second chip package, wherein the second chip package couples to the first chip package through the plurality of second metal bumps. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein each of the plurality of second metal bumps couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The third chip package further comprises a metal pad vertically over the second semiconductor integrated-circuit (IC) chip, wherein the metal pad joins one of the second metal bumps and has a thickness between 1 and 10 micrometers. The metal pad comprises a copper layer having a thickness between 1 and 10 micrometers.

For the second scenario: in a tenth aspect, the non-volatile memory integrated-circuit (IC) chip is provided by a second chip package of the multi-chip package, wherein the second chip package is over the first chip package, wherein the multi-chip package further comprises a plurality of second metal bumps under the second chip package, wherein the second chip package couples to the first chip package through the plurality of second metal bumps. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein each of the plurality of second metal bumps couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The multi-chip package further comprises a fourth metal bump between the first and third chip packages, wherein the first chip package further comprises a third metal post in the first polymer layer, wherein the top surface of the first polymer layer, the top surface of the first semiconductor integrated-circuit (IC) chip, the top surface of the first metal post and a top surface of the third metal post are coplanar, wherein the second semiconductor integrated-circuit (IC) chip couples to the first semiconductor integrated-circuit (IC) chip through, in sequence, the third interconnection metal layer, fourth interconnection metal layer, fourth metal bump, third metal post and first interconnection metal layer.

For the second scenario: in an eleventh aspect, the non-volatile memory integrated-circuit (IC) chip is provided by a second chip package of the multi-chip package, wherein the second chip package is over the first chip package, wherein the multi-chip package further comprises a plurality of second metal bumps under the second chip package, wherein the second chip package couples to the first chip package through the plurality of second metal bumps. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein each of the plurality of second metal bumps couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The second semiconductor integrated-circuit (IC) chip is a dedicated I/O chip. The multi-chip package further comprises a fourth metal bump between the first and third chip packages, wherein the first chip package further comprises a third metal post in the first polymer layer, wherein the top surface of the first polymer layer, the top surface of the first semiconductor integrated-circuit (IC) chip, the top surface of the first metal post and a top surface of the third metal post are coplanar, wherein the dedicated I/O chip comprises a driver coupling to the first semiconductor integrated-circuit (IC) chip through, in sequence, the third interconnection metal layer, fourth interconnection metal layer, fourth metal bump, third metal post and first interconnection metal layer, wherein the driver has a driving capability between 0.1 and 2 pF. The plurality of second metal bumps are between the second and third chip packages, wherein the third chip package further comprises a third metal post in the second polymer layer, wherein the top surface of the second polymer layer, the top surface of the dedicated I/O chip, the top surface of the second metal post and a top surface of the third metal post are coplanar, wherein the dedicated I/O chip comprises a driver coupling to the non-volatile memory integrated-circuit (IC) chip through, in sequence, the third interconnection metal layer, the third metal post and one of the second metal bumps, wherein the driver has a driving capability between 0.1 and 2 pF.

For the second scenario: in a twelfth aspect, the non-volatile memory integrated-circuit (IC) chip is provided by a second chip package of the multi-chip package, wherein the second chip package is over the first chip package, wherein the multi-chip package further comprises a plurality of second metal bumps under the second chip package, wherein the second chip package couples to the first chip package through the plurality of second metal bumps. The multi-chip package further comprises a third chip package between the first and second chip packages, wherein the second chip package couples to the first chip package through the third chip package, and a third metal bump between the first and third chip packages, wherein the third metal bump couples the third chip package to the first chip package, wherein each of the plurality of second metal bumps couples the second chip package to the third chip package. The third chip package comprises a second semiconductor integrated-circuit (IC) chip, a second polymer layer in a space beyond and extending from a sidewall of the second semiconductor integrated-circuit (IC) chip, a second metal post in the second polymer layer, wherein a top surface of the second polymer layer, a top surface of the second semiconductor integrated-circuit (IC) chip and a top surface of the second metal post are coplanar, and a second interconnection scheme under the second semiconductor integrated-circuit (IC) chip, second polymer layer and second metal post, wherein the second interconnection scheme comprises a third interconnection metal layer under the second semiconductor integrated-circuit (IC) chip, second polymer layer and second metal post, wherein the third interconnection metal layer comprises a metal interconnect across under an edge of the second semiconductor integrated-circuit (IC) chip, a fourth interconnection metal layer under the third interconnection metal layer and a second insulating dielectric layer between the third and fourth interconnection metal layers, wherein the third metal bump couples to the fourth interconnection metal layer. The second semiconductor integrated-circuit (IC) chip is a dedicated I/O chip. The multi-chip package further comprises a fourth metal bump between the first and third chip packages, wherein the first chip package further comprises a third metal post in the first polymer layer, wherein the top surface of the first polymer layer, the top surface of the first semiconductor integrated-circuit (IC) chip, the top surface of the first metal post and a top surface of the third metal post are coplanar, wherein the dedicated I/O chip comprises a driver coupling to the first metal bump through, in sequence, the third interconnection metal layer, fourth interconnection metal layer, fourth metal bump, third metal post, first interconnection metal layer and second interconnection metal layer, wherein the driver has a driving capability greater than 2 pF.

For the second scenario: in a thirteenth aspect, the non-volatile memory integrated-circuit (IC) chip is provided by a second chip package of the multi-chip package, wherein the second chip package is over the first chip package, wherein the multi-chip package further comprises a plurality of second metal bumps under the second chip package, wherein the second chip package couples to the first chip package through the plurality of second metal bumps. The second chip package is a ball-grid array (BGA) package comprising a circuit board coupling the non-volatile memory integrated-circuit (IC) chip to the second metal bumps, wherein the second metal bumps are arranged in an array.

For the second scenario: in a fourteenth aspect, the non-volatile memory integrated-circuit (IC) chip is provided by a second chip package of the multi-chip package, wherein the second chip package is over the first chip package, wherein the second chip package is a thin-small-outline-package (TSOP) comprising a leadframe having the non-volatile memory integrated-circuit (IC) chip mounted thereon and a molding compound enclosing the leadframe and non-volatile memory integrated-circuit (IC) chip, wherein the non-volatile memory integrated-circuit (IC) chip couples to the first chip package through the leadframe.

For the second scenario: in a fifteenth aspect, the non-volatile memory integrated-circuit (IC) chip is provided by a second chip package of the multi-chip package, wherein the second chip package is over the first chip package, wherein the second chip package is a chip scale package (CSP), wherein an area ratio between the chip scale package and the non-volatile memory integrated-circuit (IC) chip is equal to or smaller than 1.5.

For the second scenario: in a sixteenth aspect, the first chip package further comprises a second interconnection scheme over the first semiconductor integrated-circuit (IC) chip, first polymer layer and first metal post, wherein the second interconnection scheme comprises a third interconnection metal layer over the first semiconductor integrated-circuit (IC) chip, first polymer layer and first metal post, and a second insulating dielectric layer over the third interconnection metal layer, wherein the third interconnection metal layer comprises a metal interconnect across over an edge of the first semiconductor integrated-circuit (IC) chip, wherein the non-volatile memory integrated-circuit (IC) chip couples to the first semiconductor integrated-circuit (IC) chip through, in sequence, the third interconnection metal layer, first metal post and the first interconnection metal layer.

For the second scenario: in a seventeenth aspect, the first semiconductor integrated-circuit (IC) chip is a FPGA IC chip. The non-volatile memory integrated-circuit (IC) chip is a NAND flash chip or NOR flash chip.

For a third scenario, a chip package, comprises: a semiconductor integrated-circuit (IC) chip; a first polymer layer in a space beyond and extending from a sidewall of the semiconductor integrated-circuit (IC) chip; a first metal post in the first polymer layer, wherein a top surface of the first polymer layer, a top surface of the semiconductor integrated-circuit (IC) chip and a top surface of the first metal post are coplanar; an interconnection scheme under the semiconductor integrated-circuit (IC) chip, first polymer layer and first metal post, wherein the interconnection scheme comprises a first interconnection metal layer under the semiconductor integrated-circuit (IC) chip, first polymer layer and first metal post, wherein the interconnection metal layer comprises a metal interconnect across under an edge of the semiconductor integrated-circuit (IC) chip, a second interconnection metal layer under the first interconnection metal layer and an insulating dielectric layer between the first and second interconnection metal layers; a first metal bump under the interconnection scheme, wherein the first metal bump comprises solder and has a height between 20 and 100 micrometers; a second polymer layer over the semiconductor integrated-circuit (IC) chip, first polymer layer and first metal post, wherein a first opening in the second polymer layer is over the first metal post; and a first metal pad on a top surface of the first metal post, wherein the top surface of the first metal post is at a bottom of the first opening, wherein the first metal pad comprises a copper layer having a thickness between 1 and 10 micrometers, wherein the first metal pad couples to the semiconductor integrated-circuit (IC) chip through, in sequence, the first metal post and first interconnection metal layer.

For the third scenario: in a first aspect, the first metal pad further couples to the first metal bump through, in sequence, the first metal post, the first interconnection metal layer and the second interconnection metal layer. The first metal bump couples to the semiconductor integrated-circuit (IC) chip through, in sequence, the second interconnection metal layer and first interconnection metal layer.

For the third scenario: in a second aspect, the chip package further comprises a second metal post in the first polymer layer, wherein the top surface of the first polymer layer, the top surface of the semiconductor integrated-circuit (IC) chip, the top surface of the first metal post and a top surface of the second metal post are coplanar, a second metal bump under the interconnection scheme, wherein the second metal bump comprises solder and has a height between 20 and 100 micrometers, and a second metal pad on a top surface of the second metal post, wherein the top surface of the second metal post is at a bottom of a second opening in the in the second polymer layer, wherein the second metal pad comprises a copper layer having a thickness between 1 and 10 micrometers, wherein the second metal pad couples to the second metal bump through, in sequence, the second metal post, the first interconnection metal layer and the second interconnection metal layer, wherein the second metal pad is not connected to any semiconductor integrated-circuit (IC) chip in the chip package.

For the third scenario: in a third aspect, the semiconductor integrated-circuit (IC) chip comprises a standard commodity FPGA chip, a dedicated control chip, a dedicated I/O chip, a dedicated control and I/O chip, a CPU chip, a GPU chip, a DSP chip, an APU chip, a TPU chip, an IAC chip, an ASIC chip, a NAND or NOR flash non-volatile memory chip, a High-Bandwidth Memory (HBM) chip comprising a DRAM Memory chip, a SRAM Memory chip, a MRAM Memory chip or a RRAM Memory chip, an analog IC chip, a mixed mode IC chip or an RF IC chip.

For a fourth scenario, a chip package comprises: a semiconductor integrated-circuit (IC) chip; a polymer layer in a space beyond and extending from a sidewall of the semiconductor integrated-circuit (IC) chip; a first metal post in the polymer layer, wherein a top surface of the polymer layer, a top surface of the semiconductor integrated-circuit (IC) chip and a top surface of the first metal post are coplanar; a first interconnection scheme under the semiconductor integrated-circuit (IC) chip, polymer layer and first metal post, wherein the first interconnection scheme comprises a first interconnection metal layer under the semiconductor integrated-circuit (IC) chip, polymer layer and first metal post, wherein the first interconnection metal layer comprises a metal interconnect across under an edge of the semiconductor integrated-circuit (IC) chip, a second interconnection metal layer under the first interconnection metal layer and a first insulating dielectric layer between the first and second interconnection metal layers; a first metal bump under the interconnection scheme, wherein the first metal bump comprises solder and has a height between 20 and 100 micrometers; a second interconnection scheme over the semiconductor integrated-circuit (IC) chip, polymer layer and first metal post, wherein the second interconnection scheme comprises a second insulating dielectric layer on the semiconductor integrated-circuit (IC) chip and polymer layer, a third interconnection metal layer over the second insulating dielectric layer and a third insulating dielectric layer on the third interconnection metal layer, wherein the third interconnection metal layer comprises a metal interconnect across over an edge of the semiconductor integrated-circuit (IC) chip, wherein a first opening in the third insulating dielectric layer is over the third interconnection metal layer; and a first metal pad on the third interconnection metal layer at a bottom of the first opening, wherein the first metal pad comprises a copper layer having a thickness between 1 and 10 micrometers, wherein the first metal pad couples to the semiconductor integrated-circuit (IC) chip through, in sequence, the third interconnection metal layer, first metal post and first interconnection metal layer.

For the fourth scenario: in a first aspect, the first metal pad further couples to the first metal bump through, in sequence, the third interconnection metal layer, the first metal post, the first interconnection metal layer and the second interconnection metal layer.

For the fourth scenario: in a second aspect, the first metal bump couples to the semiconductor integrated-circuit (IC) chip through, in sequence, the second interconnection metal layer and first interconnection metal layer.

For the fourth scenario: in a third aspect, the chip package further comprises a second metal post in the polymer layer, wherein the top surface of the polymer layer, the top surface of the semiconductor integrated-circuit (IC) chip, the top surface of the first metal post and a top surface of the second metal post are coplanar, a second metal bump under the first interconnection scheme, wherein the second metal bump comprises solder and has a height between 20 and 100 micrometers, and a second metal pad on the third interconnection metal layer at a bottom of a second opening in the third insulating dielectric layer, wherein the second metal pad comprises a copper layer having a thickness between 1 and 10 micrometers, wherein the second metal pad couples to the second metal bump through, in sequence, the third interconnection metal layer, the second metal post, the first interconnection metal layer and the second interconnection metal layer, wherein the second metal pad is not connected to any semiconductor integrated-circuit (IC) chip in the chip package.

For the fourth scenario: in a fourth aspect, the semiconductor integrated-circuit (IC) chip comprises a standard commodity FPGA chip, a dedicated control chip, a dedicated I/O chip, a dedicated control and I/O chip, a CPU chip, a GPU chip, a DSP chip, an APU chip, a TPU chip, an IAC chip, an ASIC chip, a NAND or NOR flash non-volatile memory chip, a High-Bandwidth Memory (HBM) chip comprising a DRAM Memory chip, a SRAM Memory chip, a MRAM Memory chip or a RRAM Memory chip, an analog IC chip, a mixed mode IC chip or an RF IC chip.

For a fifth scenario, a chip package comprises: a semiconductor integrated-circuit (IC) chip; a polymer layer in a space beyond and extending from a sidewall of the semiconductor integrated-circuit (IC) chip; a first metal post in the polymer layer, wherein a top surface of the polymer layer, a top surface of the semiconductor integrated-circuit (IC) chip and a top surface of the first metal post are coplanar; a first interconnection scheme under the semiconductor integrated-circuit (IC) chip, polymer layer and first metal post, wherein the first interconnection scheme comprises a first interconnection metal layer under the semiconductor integrated-circuit (IC) chip, polymer layer and first metal post, wherein the first interconnection metal layer comprises a metal interconnect across under an edge of the semiconductor integrated-circuit (IC) chip, a second interconnection metal layer under the first interconnection metal layer and a first insulating dielectric layer between the first and second interconnection metal layers; and a first metal bump under the first interconnection scheme, wherein the first metal bump comprises solder and has a height between 20 and 100 micrometers, wherein the first metal post couples to the first metal bump through, in sequence, the first interconnection metal layer and the second interconnection metal layer, wherein the first metal post is not connected to any semiconductor integrated-circuit (IC) chip in the chip package.

For the fifth scenario: in a first aspect, the first metal bump is vertically under the first metal post.

For the fifth scenario: in a second aspect, the first metal bump is vertically under the semiconductor integrated-circuit (IC) chip.

For the fifth scenario: in a third aspect, the first metal bump is not vertically under the first metal post.

For the fifth scenario: in a fourth aspect, the chip package further comprises a second interconnection scheme over the semiconductor integrated-circuit (IC) chip, polymer layer and first metal post, wherein the second interconnection scheme comprises a second insulating dielectric layer on the semiconductor integrated-circuit (IC) chip and polymer layer, a third interconnection metal layer over the second insulating dielectric layer and a third insulating dielectric layer on the third interconnection metal layer, wherein the third interconnection metal layer comprises a metal interconnect across over an edge of the semiconductor integrated-circuit (IC) chip, wherein an opening in the third insulating dielectric layer is over the third interconnection metal layer, and a metal pad on the third interconnection metal layer at a bottom of the opening, wherein the metal pad comprises a copper layer having a thickness between 1 and 10 micrometers, wherein the metal pad couples to the first metal post through the third interconnection metal layer. The metal pad is vertically over the first metal post.

For the fifth scenario: in a fifth aspect, the chip package further comprises a second interconnection scheme over the semiconductor integrated-circuit (IC) chip, polymer layer and first metal post, wherein the second interconnection scheme comprises a second insulating dielectric layer on the semiconductor integrated-circuit (IC) chip and polymer layer, a third interconnection metal layer over the second insulating dielectric layer and a third insulating dielectric layer on the third interconnection metal layer, wherein the third interconnection metal layer comprises a metal interconnect across over an edge of the semiconductor integrated-circuit (IC) chip, wherein an opening in the third insulating dielectric layer is over the third interconnection metal layer, and a metal pad on the third interconnection metal layer at a bottom of the opening, wherein the metal pad comprises a copper layer having a thickness between 1 and 10 micrometers, wherein the metal pad couples to the first metal post through the third interconnection metal layer. The metal pad is vertically over the semiconductor integrated-circuit (IC) chip.

For the fifth scenario: in a sixth aspect, the chip package further comprises a second interconnection scheme over the semiconductor integrated-circuit (IC) chip, polymer layer and first metal post, wherein the second interconnection scheme comprises a second insulating dielectric layer on the semiconductor integrated-circuit (IC) chip and polymer layer, a third interconnection metal layer over the second insulating dielectric layer and a third insulating dielectric layer on the third interconnection metal layer, wherein the third interconnection metal layer comprises a metal interconnect across over an edge of the semiconductor integrated-circuit (IC) chip, wherein an opening in the third insulating dielectric layer is over the third interconnection metal layer, and a metal pad on the third interconnection metal layer at a bottom of the opening, wherein the metal pad comprises a copper layer having a thickness between 1 and 10 micrometers, wherein the metal pad couples to the first metal post through the third interconnection metal layer. The metal pad is not vertically over the first metal post.

For the fifth scenario: in a seventh aspect, the chip package further comprises a second interconnection scheme over the semiconductor integrated-circuit (IC) chip, polymer layer and first metal post, wherein the second interconnection scheme comprises a second insulating dielectric layer on the semiconductor integrated-circuit (IC) chip and polymer layer, a third interconnection metal layer over the second insulating dielectric layer and a third insulating dielectric layer on the third interconnection metal layer, wherein the third interconnection metal layer comprises a metal interconnect across over an edge of the semiconductor integrated-circuit (IC) chip, wherein an opening in the third insulating dielectric layer is over the third interconnection metal layer, and a metal pad on the third interconnection metal layer at a bottom of the opening, wherein the metal pad comprises a copper layer having a thickness between 1 and 10 micrometers, wherein the metal pad couples to the first metal post through the third interconnection metal layer. A horizontal distance between the metal pad and first metal bump is greater than a largest transverse dimension of the first metal bump.

For the fifth scenario: in an eighth aspect, the chip package further comprises a second metal post in the polymer layer, wherein the top surface of the polymer layer, the top surface of the semiconductor integrated-circuit (IC) chip, the top surface of the first metal post and a top surface of the second metal post are coplanar, wherein the second metal post couples to the semiconductor integrated-circuit (IC) chip through the first interconnection metal layer.

For the fifth scenario: in a ninth aspect, the semiconductor integrated-circuit (IC) chip comprises a standard commodity FPGA chip, a dedicated control chip, a dedicated I/O chip, a dedicated control and I/O chip, a CPU chip, a GPU chip, a DSP chip, an APU chip, a TPU chip, an IAC chip, an ASIC chip, a NAND or NOR flash non-volatile memory chip, a High-Bandwidth Memory (HBM) chip comprising a DRAM Memory chip, a SRAM Memory chip, a MRAM Memory chip or a RRAM Memory chip, an analog IC chip, a mixed mode IC chip or an RF IC chip.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A multichip package comprising:

a first interconnection scheme comprising a first interconnection metal layer, a second interconnection metal layer over the first interconnection metal layer and a first insulating dielectric layer between the first and second interconnection metal layers;

a field-programmable-gate-array (FPGA) integrated-circuit (IC) chip over the first interconnection scheme, wherein the field-programmable-gate-array (FPGA) integrated-circuit (IC) chip couples to the second interconnection metal layer, wherein the first interconnection scheme comprises a metal interconnect under the field-programmable-gate-array (FPGA) integrated-circuit (IC) chip and across an edge of the field-programmable-gate-array (FPGA) integrated-circuit (IC) chip;

a metal via over the first interconnection scheme and at a same horizontal level as the field-programmable-gate-array (FPGA) integrated-circuit (IC) chip, wherein the metal via is in a space beyond and extending from, in a horizontal direction, a sidewall of the field-programmable-gate-array (FPGA) integrated-circuit (IC) chip, wherein the metal via provides connection in a vertical direction perpendicular to the horizontal direction, wherein the metal via couples to the field-programmable-gate-array (FPGA) integrated-circuit (IC) chip through the second interconnection metal layer, wherein the metal via comprises a copper layer having a thickness between 5 and 300 micrometers; and a non-volatile memory integrated-circuit (IC) chip over the field-programmable-gate-array (FPGA) integrated-circuit (IC) chip, wherein the non-volatile memory integrated-circuit (IC) chip couples to the field-programmable-gate-array (FPGA) integrated-circuit (IC) chip through, in sequence, the metal via and the second interconnection metal layer.

2. The multichip package of claim 1, wherein the field-programmable-gate-array (FPGA) integrated-circuit (IC) chip comprises a configurable circuit and a volatile memory cell for storing first data therein, wherein the first data is used for configuring the configurable circuit, wherein the non-volatile memory integrated-circuit (IC) chip comprises a non-volatile memory cell for storing second data therein, wherein the first data is associated with the second data.

3. The multichip package of claim 2, wherein the configurable circuit is reconfigurable.

4. The multichip package of claim 2, wherein the volatile memory cell comprises a static random-access-memory (SRAM) cell.

5. The multichip package of claim 1, wherein the field-programmable-gate-array (FPGA) integrated-circuit (IC) chip comprises a configurable logic circuit and a volatile memory cell for storing first data therein, wherein the first data is used for configuring the configurable logic circuit, wherein the non-volatile memory integrated-circuit (IC) chip comprises a non-volatile memory cell for storing second data therein, wherein the first data is associated with the second data.

6. The multichip package of claim 5, wherein the configurable logic circuit is reconfigurable.

7. The multichip package of claim 5, wherein the configurable logic circuit comprises a selection circuit having a first set of input points for a first input data set for a logic operation and a second set of input points for a second input data set having data associated with the first data, wherein the first data is associated with a resulting value for a look-up table (LUT), wherein the selection circuit is configured to select, in accordance with the first input data set, input data from the second input data set as output data for the logic operation.

8. The multichip package of claim 5, wherein the volatile memory cell comprises a static random-access-memory (SRAM) cell.

9. The multichip package of claim 1, wherein the field-programmable-gate-array (FPGA) integrated-circuit (IC) chip comprises a configurable interconnection circuit and a first volatile memory cell for storing first data therein, wherein the first data is used for configuring the configurable interconnection circuit, wherein the non-volatile memory integrated-circuit (IC) chip comprises a first non-volatile memory cell for storing second data therein, wherein the first data is associated with the second data.

10. The multichip package of claim 9, wherein the configurable interconnection circuit is reconfigurable.

11. The multichip package of claim 9, wherein the configurable interconnection circuit comprises first and second conductive interconnects and a configurable switch circuit having a first input point coupling to the first conductive interconnect, a first output point coupling to the second conductive interconnect, and a second input point for input data associated with the first data, wherein the configurable switch circuit is configured to control, in accordance with the input data at the second input point, coupling between the first and second conductive interconnects.

12. The multichip package of claim 11, wherein the field-programmable-gate-array (FPGA) integrated-circuit (IC) chip further comprises a second volatile memory cell for storing third data therein, wherein the configurable interconnection circuit further comprises a configurable selection circuit coupling to the configurable switch circuit through the first conductive interconnect, wherein the configurable selection circuit comprises third and fourth conductive interconnects, a third input point coupling to the third conductive interconnect, a fourth input point coupling to the fourth conductive interconnect, a second output point coupling to the first conductive interconnect, and a fifth input point for input data associated with the third data, wherein the configurable selection circuit is configured to select, in accordance with the input data at the fifth input point, one of the third and fourth conductive interconnects to couple to the second output point, wherein the non-volatile memory integrated-circuit (IC) chip further comprises a second non-volatile memory cell for storing fourth data therein, wherein the third data is associated with the fourth data.

13. The multichip package of claim 9, wherein the first volatile memory cell comprises a static random-access-memory (SRAM) cell.

14. The multichip package of claim 1 further comprising a polymer layer in the space and over the first interconnection scheme, wherein the polymer layer is at the same horizontal level as the field-programmable-gate-array (FPGA) integrated-circuit (IC) chip and the metal via, wherein the metal via vertically extends in the polymer layer.

15. The multichip package of claim 1, wherein the first interconnection scheme, the field-programmable-gate-array (FPGA) integrated-circuit (IC) chip and the metal via are provided by a chip package of the multichip package, wherein the chip package is under the non-volatile memory integrated-circuit (IC) chip, wherein the multichip package further comprises a metal bump at a bottom of the chip package, wherein the metal bump is at a bottom of the first interconnection scheme and couples to the first interconnection metal layer.

16. The multichip package of claim 15, wherein the metal bump comprises a solder having a thickness between 20 and 100 micrometers.

17. The multichip package of claim 1, wherein the metal via comprises a copper layer having a thickness between 10 and 100 micrometers.

18. The multichip package of claim 1, wherein the non-volatile memory integrated-circuit (IC) chip is provided by a chip package of the multichip package, wherein the chip package is over the first interconnection scheme, the field-programmable-gate-array (FPGA) integrated-circuit (IC) chip and the metal via, wherein the chip package couples to the field-programmable-gate-array (FPGA) integrated-circuit (IC) chip through the metal via.

19. The multichip package of claim 18, wherein the multichip package further comprises a metal bump at a bottom of the chip package, wherein the chip package couples to the metal via through the metal bump.

20. The multichip package of claim 19, wherein the chip package comprises a polymer layer in a space beyond and extending from a sidewall of the non-volatile memory integrated-circuit (IC) chip, and a second interconnection scheme under the non-volatile memory integrated-circuit (IC) chip and polymer layer, wherein the second interconnection scheme comprises a third interconnection metal layer under the non-volatile memory integrated-circuit (IC) chip and polymer layer, a fourth interconnection metal layer under the third interconnection metal layer and a second insulating dielectric layer between the third and fourth interconnection metal layers, wherein the second interconnection scheme comprises a metal interconnect under the non-volatile memory integrated-circuit (IC) chip and across an edge of the non-volatile memory integrated-circuit (IC) chip, wherein the metal bump is at a bottom of the second interconnection scheme and couples to the fourth interconnection metal layer, wherein the non-volatile memory integrated-circuit (IC) chip couples to the field-programmable-gate-array (FPGA) integrated-circuit (IC) chip through, in sequence, the third interconnection metal layer, the fourth interconnection metal layer, the metal bump, the metal via and the second interconnection metal layer.

21. The multichip package of claim 1 further comprising a second interconnection scheme over the field-programmable-gate-array (FPGA) integrated-circuit (IC) chip, the polymer layer and the metal via, wherein the second interconnection scheme comprises a third interconnection metal layer over the field-programmable-gate-array (FPGA) integrated-circuit (IC) chip, the polymer layer and the metal via, and a second insulating dielectric layer over the third interconnection metal layer, wherein the second interconnection scheme comprises a metal interconnect over the field-programmable-gate-array (FPGA) integrated-circuit (IC) chip and across an edge of the field-programmable-gate-array (FPGA) integrated-circuit (IC) chip, wherein the non-volatile memory integrated-circuit (IC) chip is over the second interconnection scheme and couples to the field-programmable-gate-array (FPGA) integrated-circuit (IC)

chip through, in sequence, the third interconnection metal layer, the metal via and the second interconnection metal layer.

22. The multichip package of claim 1, wherein the non-volatile memory integrated-circuit (IC) chip is a NAND flash chip.

23. The multichip package of claim 1, wherein the non-volatile memory integrated-circuit (IC) chip is a NOR flash chip.

24. The multichip package of claim 1, wherein the field-programmable-gate-array (FPGA) integrated-circuit (IC) chip is implemented in a semiconductor technology node more advanced than or equal to 10 nm.

25. The multichip package of claim 24, wherein the field-programmable-gate-array (FPGA) integrated-circuit (IC) chip comprises a transistor having a gate length smaller than or equal to 10 nm.

26. The multichip package of claim 24, wherein the field-programmable-gate-array (FPGA) integrated-circuit (IC) chip comprises a transistor having a gate oxide with a physical thickness smaller than or equal to 4 nm.

27. The multichip package of claim 24, wherein the non-volatile memory integrated-circuit (IC) chip comprises a plurality of non-volatile memory cells for storing data therein to configure the field-programmable-gate-array (FPGA) integrated-circuit (IC) chip for a specific application, wherein the multichip package is configured for use as a non-volatile filed programmable application-specific device.

28. The multichip package of claim 1, wherein the field-programmable-gate-array (FPGA) integrated-circuit (IC) chip is implemented in a semiconductor technology node more advanced than or equal to 10 nm, wherein the multichip package provides a non-volatile reconfigurable device for an innovator to implement his innovation in the semiconductor technology node.

* * * * *